US011569458B2

(12) United States Patent
Stoessel et al.

(10) Patent No.: US 11,569,458 B2
(45) Date of Patent: Jan. 31, 2023

(54) METAL COMPLEXES

(71) Applicant: Merck Patent GmbH, Darmstadt (DE)

(72) Inventors: Philipp Stoessel, Frankfurt am Main (DE); Armin Auch, Darmstadt (DE); Falk May, Mainz (DE); Jochen Pfister, Seeheim-Jugenheim (DE)

(73) Assignee: MERCK PATENT GMBH, Darmstadt (DE)

( * ) Notice: Subject to any disclaimer, the term of this patent is extended or adjusted under 35 U.S.C. 154(b) by 134 days.

(21) Appl. No.: 16/499,710

(22) PCT Filed: Mar. 26, 2018

(86) PCT No.: PCT/EP2018/057621
§ 371 (c)(1),
(2) Date: Sep. 30, 2019

(87) PCT Pub. No.: WO2018/178001
PCT Pub. Date: Oct. 4, 2018

(65) Prior Publication Data

US 2020/0083463 A1 Mar. 12, 2020

(30) Foreign Application Priority Data

Mar. 29, 2017 (EP) .................................... 17163531
Dec. 4, 2017 (EP) .................................... 17205103

(51) Int. Cl.

| | |
|---|---|
| ***H01L 51/00*** | (2006.01) |
| ***C07F 15/00*** | (2006.01) |
| ***C09K 11/06*** | (2006.01) |
| *H01L 51/50* | (2006.01) |

(52) U.S. Cl.
CPC ...... *H01L 51/0085* (2013.01); *C07F 15/0033* (2013.01); *C09K 11/06* (2013.01); *C09K 2211/1029* (2013.01); *C09K 2211/1033* (2013.01); *C09K 2211/1037* (2013.01); *C09K 2211/1044* (2013.01); *C09K 2211/1048* (2013.01); *C09K 2211/1059* (2013.01); *C09K 2211/1074* (2013.01); *C09K 2211/185* (2013.01); *H01L 51/5016* (2013.01); *H01L 2251/5384* (2013.01)

(58) Field of Classification Search
CPC ............. H01L 51/0085; H01L 51/5016; C07F 15/0033; C09K 11/06; C09K 2211/1029; C09K 2211/1033; C09K 2211/1037; C09K 2211/1044; C09K 2211/1048; C09K 2211/1059; C09K 2211/1074; C09K 2211/185
See application file for complete search history.

(56) References Cited

U.S. PATENT DOCUMENTS

| | | | | |
|---|---|---|---|---|
| 9,793,497 | B2 | 10/2017 | Herron et al. | |
| 11,024,815 | B2 | 6/2021 | Stoessel et al. | |
| 2015/0171348 | A1 | 6/2015 | Stoessel et al. | |
| 2018/0026209 | A1* | 1/2018 | Stoessel ................ | C07F 15/008 252/519.2 |
| 2019/0157578 | A1 | 5/2019 | Stoessel et al. | |
| 2019/0161510 | A1 | 5/2019 | Stoessel et al. | |
| 2019/0241591 | A1* | 8/2019 | Stoessel .............. | C07F 15/0033 |
| 2020/0039903 | A1 | 2/2020 | Stoessel et al. | |

FOREIGN PATENT DOCUMENTS

| | | | |
|---|---|---|---|
| CN | 109476691 | A | 3/2019 |
| CN | 110446703 | A | 11/2019 |
| JP | 2009-185017 | A | 8/2009 |
| JP | 2015-515463 | A1 | 5/2015 |
| JP | 2015-530982 | A | 10/2015 |
| JP | 2019-523262 | A | 8/2019 |
| JP | 2019-529349 | A | 10/2019 |
| TW | 201700489 | A | 1/2017 |
| WO | 2013/142634 | A1 | 9/2013 |
| WO | 2014/023377 | A2 | 2/2014 |
| WO | 2016124304 | A1 | 8/2016 |
| WO | 2017/032439 | A1 | 3/2017 |
| WO | 2018019687 | A1 | 2/2018 |
| WO | 2018019688 | A1 | 2/2018 |
| WO | 2018/177981 | A1 | 10/2018 |

OTHER PUBLICATIONS

International Search Report dated May 11, 2018 in International Application No. PCT/EP2018/057621.
Schmidt et al., "Emitter Orientation as a Key Parameter in Organic Light-Emitting Diodes", Physical Review Applied, vol. 8, 037001, 2017, 28 pages.

* cited by examiner

*Primary Examiner* — Alexander C Kollias
(74) *Attorney, Agent, or Firm* — Faegre Drinker Biddle & Reath LLP

(57) ABSTRACT

The present invention relates to iridium complexes suitable for use in organic electroluminescent devices, especially as emitters.

10 Claims, No Drawings

METAL COMPLEXES

RELATED APPLICATIONS

This application is a national stage entry, filed pursuant to 35 U.S.C. § 371, of PCT/EP2018/057621, filed Mar. 26, 2018, which claims the benefit of European Patent Application No. 17163531.1, filed Mar. 29, 2017, and European Patent Application No. 17205103.9, filed Dec. 4, 2017, both of which are incorporated herein by reference in their entireties.

The present invention relates to iridium complexes suitable for use in organic electroluminescent devices, especially as emitters.

According to the prior art, triplet emitters used in phosphorescent organic electroluminescent devices (OLEDs) are iridium complexes in particular, especially bis- or tris-ortho-metallated complexes having aromatic ligands, where the ligands bind to the metal via a negatively charged carbon atom and an uncharged nitrogen atom or via a negatively charged carbon atom and an uncharged carbene carbon atom. Examples of such complexes are tris(phenylpyridyl) iridium(III) and derivatives thereof, and a multitude of related complexes, for example with 1- or 3-phenylisoquinoline ligands or with 2-phenylquinoline ligands. Complexes of this kind are also known with polypodal ligands, as described, for example, in WO 2016/124304. Even though these complexes having polypodal ligands show advantages over the complexes which otherwise have the same ligand structure except that the individual ligands therein do not have polypodal bridging, there is still need for improvement. This lies more particularly in the efficiency of the luminescence of the compounds, by means of which it is also possible to achieve a longer lifetime.

The problem addressed by the present invention is therefore that of providing improved metal complexes suitable as emitters for use in OLEDs. More particularly, the problem addressed by the invention is that of providing metal complexes which, when used as emitters in an OLED, lead to an improved EQE and an improved power efficiency and hence as a result additionally also lead to an improved lifetime.

It has been found that, surprisingly, this problem is solved by metal complexes with a hexadentate tripodal ligand which have the structure described below, which are of very good suitability for use in an organic electroluminescent device. The present invention therefore provides these metal complexes and organic electroluminescent devices comprising these complexes.

The invention thus provides a compound of the formula (1)

Formula (1)

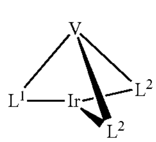

where the symbols used are as follows:

$L^1$ is a sub-ligand of the following formula (2) which coordinates to the iridium via the two D groups and which is bonded to V via the dotted bond, Formula (2)

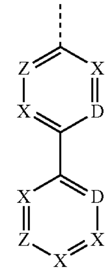

where:

D is C or N, with the proviso that one D is C and the other D is N;

X is the same or different at each instance and is CR or N;

Z is CR', CR or N, with the proviso that exactly one Z is CR' and the other Z is CR or N;

where a maximum of one symbol X or Z per cycle is N;

R' is a group of the following formula (3) or (4):

Formula (3)

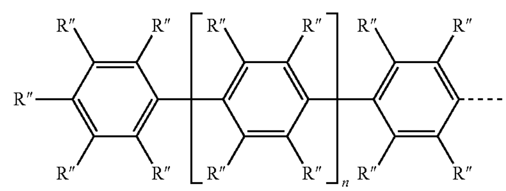

Formula (4)

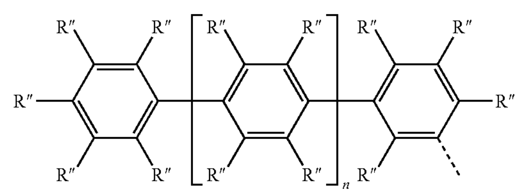

where the dotted bond indicates the linkage of the group;

R" is the same or different at each instance and is H, D, F, CN, a straight chain alkyl group having 1 to 10 carbon atoms in which one or more hydrogen atoms may also be replaced by D or F, or a branched or cyclic alkyl group having 3 to 10 carbon atoms in which one or more hydrogen atoms may also be replaced by D or F, or an alkenyl group having 2 to 10 carbon atoms in which one or more hydrogen atoms may also be replaced by D or F; at the same time, two adjacent R" radicals or two R" radicals on adjacent phenyl groups together may also form a ring system; or two R" on adjacent phenyl groups together are a group selected from O and S, such that the two phenyl rings together with the bridging group are a dibenzofuran or dibenzothiophene, and the further R" are as defined above;

n is 0, 1, 2, 3, 4 or 5;

$L^2$ is the same or different at each instance and is a bidentate monoanionic sub-ligand which coordinates to the iridium via one carbon atom and one nitrogen atom or via two carbon atoms or via two nitrogen atoms and which may be substituted by one or more R radicals;

V is a group of the formula (5), where the dotted bonds represent the position of the linkage of the sub-ligands $L^1$ and $L^2$, Formula (5)

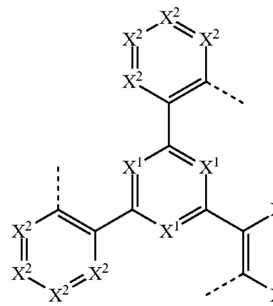

where:

$X^1$ is the same or different at each instance and is CR or N;

$X^2$ is the same or different at each instance and is CR or N;

R is the same or different at each instance and is H, D, F, Cl, Br, I, $N(R^1)_2$, $OR^1$, $SR^1$, CN, $NO_2$, COOH, C(=O)$N(R^1)_2$, $Si(R^1)_3$, $B(OR^1)_2$, C(=O)$R^1$, P(=O)$(R^1)_2$, S(=O)$R^1$, S(=O)$_2R^1$, $OSO_2R^1$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals and where one or more nonadjacent $CH_2$ groups may be replaced by $Si(R^1)_2$, C=O, $NR^1$, O, S or $CONR^1$, or an aryl or heteroaryl group which has 5 to 10 aromatic ring atoms and may be substituted in each case by one or more nonaromatic $R^1$ radicals; at the same time, two R radicals together may also form a ring system;

$R^1$ is the same or different at each instance and is H, D, F, Cl, Br, I, $N(R^2)_2$, $OR^2$, $SR^2$, CN, $NO_2$, $Si(R^2)_3$, $B(OR^2)_2$, C(=O)$R^2$, P(=O)$(R^2)_2$, S(=O)$R^2$, S(=O)$_2R^2$, $OSO_2R^2$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^2$ radicals and where one or more nonadjacent $CH_2$ groups may be replaced by $Si(R^2)_2$, C=O, $NR^2$, O, S or $CONR^2$, or an aryl or heteroaryl group which has 5 to 10 aromatic ring atoms and may be substituted in each case by one or more $R^2$ radicals; at the same time, two or more $R^1$ radicals together may form a ring system;

$R^2$ is the same or different at each instance and is H, D, F or an aliphatic organic radical, especially a hydrocarbyl radical, having 1 to 20 carbon atoms, in which one or more hydrogen atoms may also be replaced by F;

at the same time, the three bidentate sub-ligands $L^1$ and $L^2$, apart from by the bridge V, may also be closed by a further bridge to form a cryptate.

According to the invention, the ligand is thus a hexadentate tripodal ligand having one bidentate sub-ligand $L^1$ and two bidentate sub-ligands $L^2$. "Bidentate" means that the particular sub-ligand in the complex coordinates or binds to the iridium via two coordination sites. "Tripodal" means that the ligand has three sub-ligands bonded to the bridge V or the bridge of the formula (5). Since the ligand has three bidentate sub-ligands, the overall result is a hexadentate ligand, i.e. a ligand which coordinates or binds to the iridium via six coordination sites. The expression "bidentate sub-ligand" in the context of this application means that $L^1$ or $L^2$ would in each case be a bidentate ligand if the bridge V or the bridge of the formula (5) were not present. However, as a result of the formal abstraction of a hydrogen atom from this bidentate ligand and the attachment to the bridge V or the bridge of the formula (5), it is no longer a separate ligand but a portion of the hexadentate ligand which thus arises, and so the term "sub-ligand" is used therefor.

The ligand of the compound of the invention thus has the following structure:

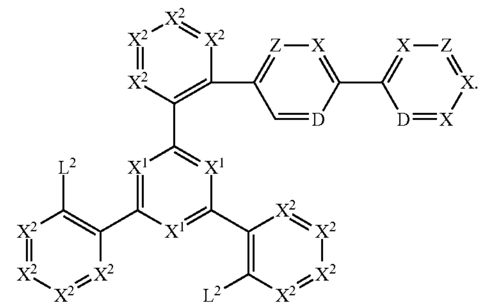

When it is said in the present application that the ligand or a sub-ligand coordinates or binds to the iridium, this refers in the context of the present application to any kind of bond from the ligand or sub-ligand to the iridium, irrespective of the covalent component of the bond.

When two R or $R^1$ radicals together form a ring system, it may be mono- or polycyclic, and aliphatic, heteroaliphatic, aromatic or heteroaromatic. In this case, these radicals which together form a ring system may be adjacent, meaning that these radicals are bonded to the same carbon atom or to carbon atoms directly bonded to one another, or they may be further removed from one another. Preference is given to this kind of ring formation in radicals bonded to carbon atoms directly bonded to one another. When two R" radicals in formula (3) or formula (4) form a ring system with one another, this is an aliphatic ring system. In the case of ring formation by two substituents R" on adjacent phenyl groups, the result is a fluorene or a phenanthrene or a triphenylene. It is likewise possible, as described above, for two R" on adjacent phenyl groups together to be a group selected from O and S, such that the two phenyl rings together with the bridging group are a dibenzofuran or dibenzothiophene.

The wording that two or more radicals together may form a ring, in the context of the present description, shall be understood to mean, inter alia, that the two radicals are joined to one another by a chemical bond with formal elimination of two hydrogen atoms. This is illustrated by the following scheme:

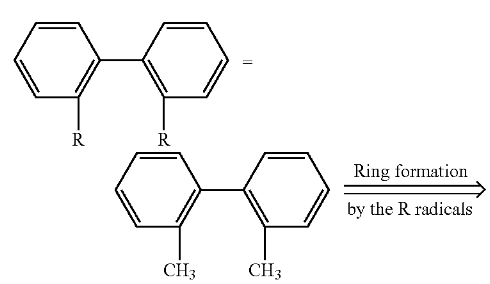

-continued

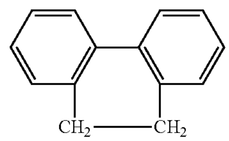

In addition, the abovementioned wording shall also be understood to mean that, if one of the two radicals is hydrogen, the second radical binds to the position to which the hydrogen atom was bonded, forming a ring. This shall be illustrated by the following scheme:

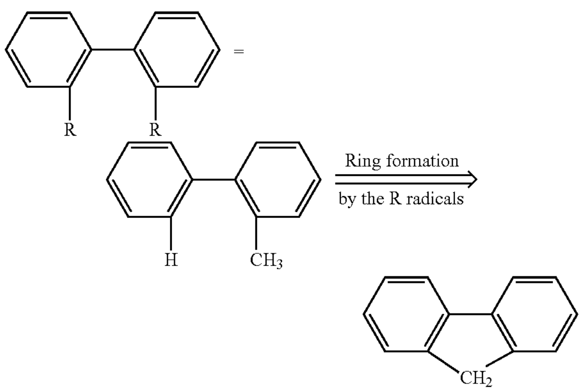

In addition, the abovementioned wording shall also be understood to mean that, if the two radicals are alkenyl groups, the radicals together form a ring, forming a fused-on aryl group. Analogously, the formation of a fused-on benzofuran group is possible in the case of an aryloxy substituent, and the formation of a fused-on indole group in the case of an arylamino substituent. This shall be illustrated by the following schemes:

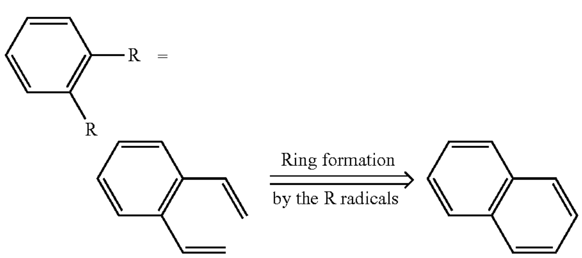

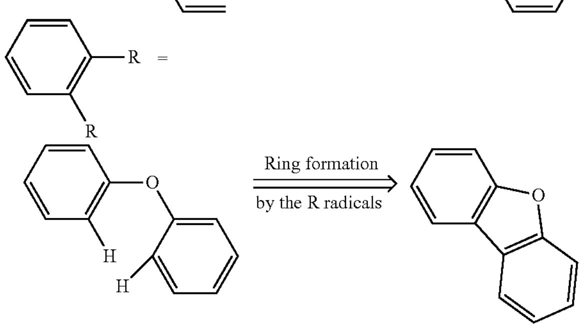

A cyclic alkyl, alkoxy or thioalkoxy group in the context of this invention is understood to mean a monocyclic, bicyclic or polycyclic group.

In the context of the present invention, a $C_1$- to $C_{20}$-alkyl group in which individual hydrogen atoms or $CH_2$ groups may also be substituted by the abovementioned groups is understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. An $OR^1$ group is understood to mean, for example, methoxy, trifluoromethoxy, ethoxy, n-propoxy, i-propoxy, n-butoxy, i-butoxy, s-butoxy, t-butoxy or 2-methylbutoxy.

An aryl group in the context of this invention contains 6 to 10 carbon atoms; a heteroaryl group in the context of this invention contains 2 to 10 carbon atoms and at least one heteroatom, with the proviso that the sum total of carbon atoms and heteroatoms is at least 5. The heteroatoms are preferably selected from N, O and/or S. The heteroaryl group in this case preferably contains not more than three heteroatoms. An aryl group or heteroaryl group is understood to mean either a simple aromatic cycle or a simple heteroaromatic cycle, or a fused aryl or heteroaryl group. Examples of aryl or heteroaryl groups of the invention are groups derived from benzene, naphthalene, furan, benzofuran, thiophene, benzothiophene, pyrrole, indole, pyridine, pyridazine, pyrimidine, pyrazine, quinoline, isoquinoline, quinazoline, quinoxaline, pyrazole, imidazole, benzimidazole, pyridimidazole, pyrazinimidazole, oxazole, benzoxazole, 1,2-thiazole, 1,3-thiazole and benzothiazole.

Stated hereinafter are preferred embodiments of the bridgehead V, i.e. the structure of the formula (5). Preferred embodiments of the group of the formula (5) are the structures of the following formulae (6) and (7):

Formula (6)

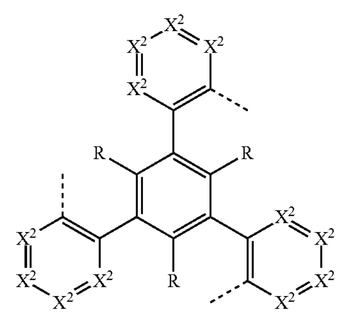

-continued

Formula (7)

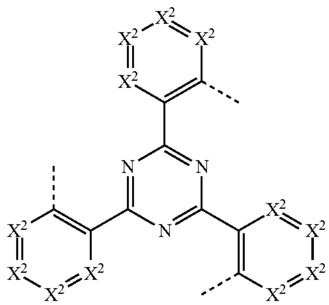

where the symbols used have the definitions given above.

In a preferred embodiment of the invention, all $X^1$ groups in the group of the formula (5) are CR, and so the central trivalent cycle of the formula (5) is a benzene.

Preferred R radicals on the trivalent central benzene ring of the formula (6) are as follows:

R is the same or different at each instance and is H, D, F, CN, $OR^1$, a straight-chain alkyl group having 1 to 10 carbon atoms, preferably having 1 to 4 carbon atoms, or an alkenyl group having 2 to 10 carbon atoms, preferably having 2 to 4 carbon atoms, or a branched or cyclic alkyl group having 3 to 10 carbon atoms, preferably having 3 to 6 carbon atoms, where the alkyl or alkenyl group may in each case be substituted by one or more $R^1$ radicals, but is preferably unsubstituted, or a phenyl group which may be substituted by one or more nonaromatic $R^1$ radicals, or a heteroaryl group which has 5 or 6 aromatic ring atoms and may be substituted by one or more nonaromatic $R^1$ radicals;

$R^1$ is the same or different at each instance and is H, D, F, CN, $OR^2$, a straight-chain alkyl group having 1 to 10 carbon atoms, preferably having 1 to 4 carbon atoms, or an alkenyl group having 2 to 10 carbon atoms, preferably having 2 to 4 carbon atoms, or a branched or cyclic alkyl group having 3 to 10 carbon atoms, preferably having 3 to 6 carbon atoms, where the alkyl or alkenyl group may in each case be substituted by one or more $R^2$ radicals, but is preferably unsubstituted, or a phenyl group which may be substituted by one or more $R^2$ radicals, or a heteroaryl group which has 5 or 6 aromatic ring atoms and may be substituted by one or more $R^2$ radicals; at the same time, two or more adjacent $R^1$ radicals together may form a ring system;

$R^2$ is the same or different at each instance and is H, D, F or an aliphatic organic radical having 1 to 10 carbon atoms, preferably an aliphatic hydrocarbyl radical having 1 to 4 carbon atoms, in which one or more hydrogen atoms may also be replaced by F.

More preferably, all substituents R in the central ring of the formula (6) are H. More preferably, the group of the formula (6) is therefore a structure of the following formula (6'):

Formula (6')

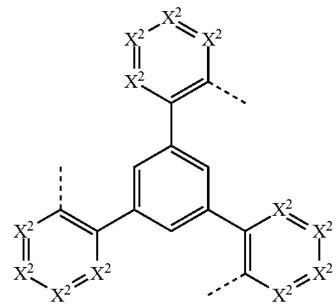

where the symbols used have the definitions given above.

There follows a description of preferred bivalent arylene or heteroarylene units as occur in the group of the formulae (5), (6) and (7). As apparent from structures of the formulae (5) to (7), these structures contain three ortho-bonded bivalent arylene or heteroarylene units.

The group of the formula (5) can be formally represented by the following formula (5'), where the formulae (5) and (5') represent the same structure:

Formula (5')

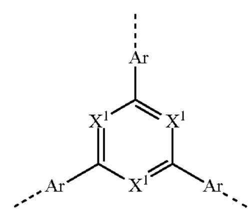

where Ar is the same or different in each case and is a group of the following formula (8):

Formula (8)

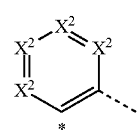

where the dotted bond in each case represents the position of the bond of the bidentate sub-ligands $L^1$ or $L^2$ to this structure, * represents the position of the linkage of the unit of the formula (8) to the central trivalent aryl or heteroaryl group and $X^2$ has the definitions given above. Preferred substituents in the group of the formula (8) when $X^2$=CR are selected from the above-described substituents R.

The group of the formula (8) is an aromatic or heteroaromatic six-membered ring. In a preferred embodiment of the invention, the group of the formula (8) contains not more than one heteroatom in the aryl or heteroaryl group. This does not mean that any substituents bonded to this group cannot also contain heteroatoms. In addition, this definition does not mean that formation of rings by substituents cannot give rise to fused aromatic or heteroaromatic structures, for example naphthalene, benzimidazole, etc. The group of the formula (8) is preferably selected from benzene, pyridine, pyrimidine, pyrazine and pyridazine.

Preferred embodiments of the group of the formula (8) are the structures of the following formulae (9) to (16):

Formula (9)

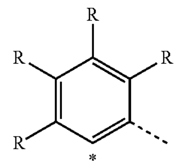

Formula (10)

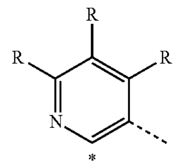

Formula (11)

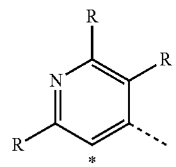

Formula (12)

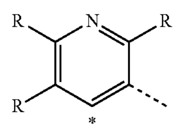

Formula (13)

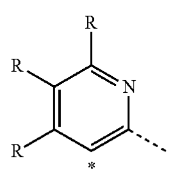

Formula (14)

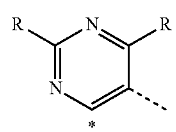

Formula (15)

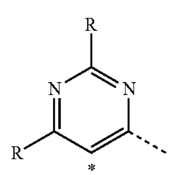

Formula (16)

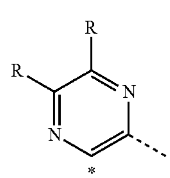

where the symbols used have the definitions given above.

Particular preference is given to the optionally substituted six-membered aromatic rings and six-membered heteroaromatic rings of the formulae (9) to (13). Very particular preference is given to ortho-phenylene, i.e. a group of the formula (9).

At the same time, as also detailed above in the description of the substituent, it is also possible for adjacent substituents together to form a ring system, such that fused structures, including fused aryl and heteroaryl groups, for example naphthalene, quinoline, benzimidazole, carbazole, dibenzofuran or dibenzothiophene, can form.

In this case, the three groups of the formula (8) present in the group of the formulae (5), (6) and (7) or formula (5') may be the same or different. In a preferred embodiment of the invention, all three groups in the formula (8) are the same and also have the same substitution.

More preferably, the structures of the formulae (6) and (7) are selected from the structures of the following formulae (6a) and (7a):

Formula (6a)

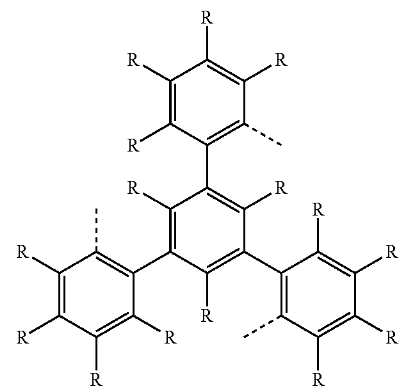

Formula (7a)

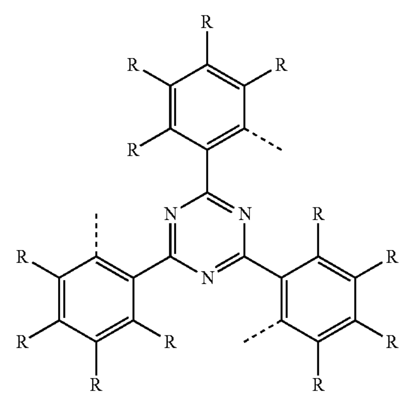

where the symbols used have the definitions given above.

A preferred embodiment of the formula (6a) is the structure of the following formula (6a'):

Formula (6a')

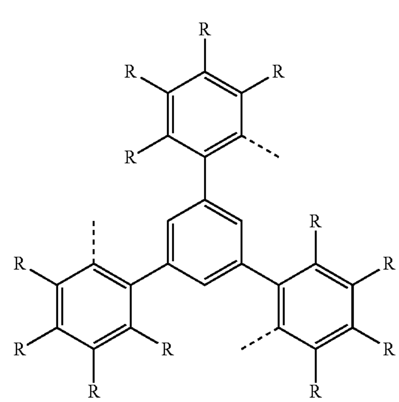

where the symbols used have the definitions given above.

More preferably, the R groups in the formulae (6), (6a), (6a'), (7) and (7a) are the same or different at each instance and are H, D or an alkyl group having 1 to 4 carbon atoms. Most preferably, R═H. Very particular preference is thus given to the structures of the following formulae (6b) and (7b):

Formula (6b)

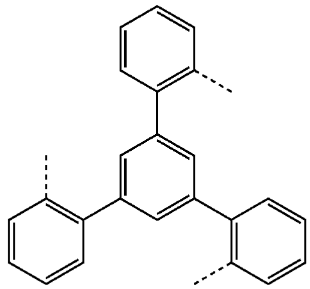

Formula (7b)

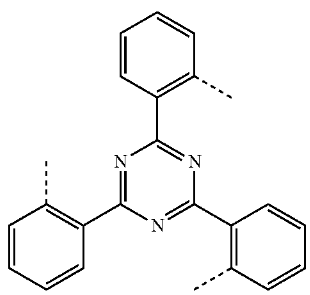

where the symbols used have the definitions given above.

There follows a description of the bidentate sub-ligands $L^1$. As described above, the sub-ligand $L^1$ has a structure of the formula (2) and is substituted by exactly one group of the formula (3) or (4).

In a preferred embodiment of the invention, X is the same or different at each instance and is CR. Further preferably, one Z group is CR and the other Z group is CR'. More preferably, in the sub-ligand of the formula (2), the X groups are the same or different at each instance and are CR, and at the same time one Z group is CR and the other Z group is CR'. The sub-ligand $L^1$ thus preferably has a structure of one of the following formulae (2a) to (2d):

Formula (2a)

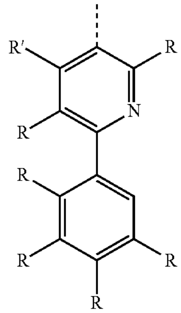

-continued

Formula (2b)

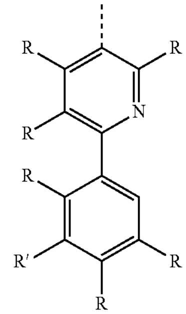

Formula (2c)

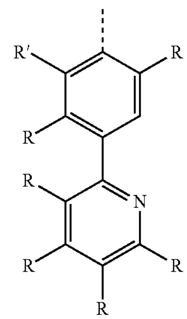

Formula (2d)

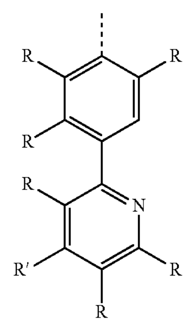

where the symbols used have the definitions given above.

More preferably, the sub-ligand of the formula (2) has a structure of one of the following formulae (2a') to (2d'):

Formula (2a')

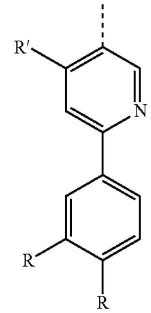

-continued

Formula (2b')

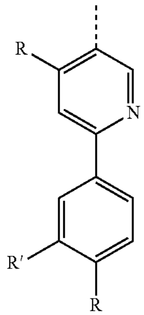

Formula (2c')

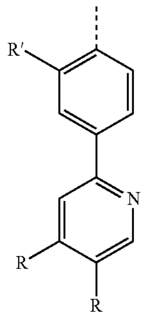

Formula (2d')

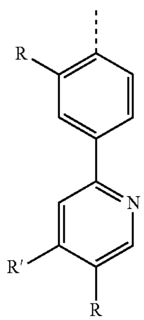

where the symbols used have the definitions given above.

The R radicals in the sub-ligand $L^1$ of the formula (2) or formulae (2a) to (2d) or formulae (2a') to (2d') are preferably selected from the group consisting of H, D, CN, $OR^1$, a straight-chain alkyl group having 1 to 6 carbon atoms, preferably having 1 to 3 carbon atoms, or a branched or cyclic alkyl group having 3 to 6 carbon atoms or an alkenyl group having 2 to 6 carbon atoms, preferably 2 to 4 carbon atoms, each of which may be substituted by one or more $R^1$ radicals, or a phenyl group which may be substituted by one or more nonaromatic $R^1$ radicals. It is also possible here for two or more adjacent R radicals together to form a ring system.

In this case, the substituent R bonded in the ortho position both to the coordinating atom and to the linkage to V or to the group of the formula (5) is preferably selected from the group consisting of H, D, F and methyl, more preferably H, D and methyl and especially H and D.

In addition, it is preferable when all substituents R that are in the ortho position to R' are H or D.

When the R radicals in the sub-ligand $L^1$ together form a ring system, it is preferably an aliphatic, heteroaliphatic or heteroaromatic ring system. In addition, preference is given to ring formation between two R radicals on the two rings of the sub-ligand $L^1$, preferably forming a phenanthridine, or a phenanthridine which may contain still further nitrogen atoms. When R radicals together form a heteroaromatic ring system, this preferably forms a structure selected from the group consisting of quinoline, isoquinoline, dibenzofuran, dibenzothiophene and carbazole, each of which may be substituted by one or more $R^1$ radicals, and where individual carbon atoms in the dibenzofuran, dibenzothiophene and carbazole may also be replaced by N. Particular preference is given to quinoline, isoquinoline, dibenzofuran and azadibenzofuran. It is possible here for the fused-on structures to be bonded in any possible position. Preferred sub-ligands $L^1$ with fused-on benzo groups are the structures of the formulae (2e) to (2l) shown below:

Formula (2e)

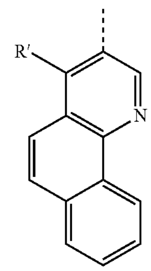

Formula (2f)

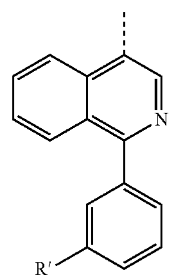

Formula (2g)

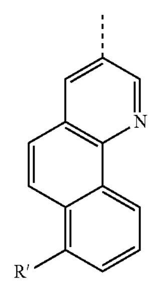

Formula (2h)

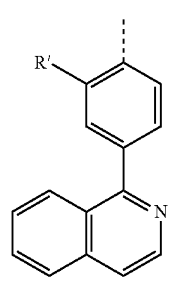

-continued

Formula (2i)

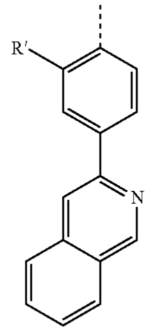

Formula (2j)

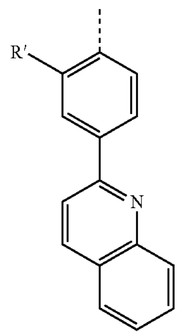

Formula (2k)

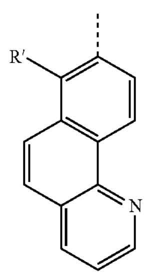

Formula (2l)

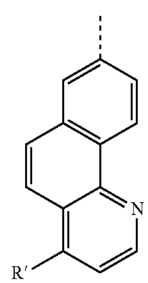

where the ligands may each also be substituted by one or more further R radicals and the fused-on structure may be substituted by one or more $R^1$ radicals. Preferably, there are no further R or $R^1$ radicals present.

Preferred sub-ligands $L^1$ with fused-on benzofuran or azabenzofuran groups are the structures of the formulae (2m) to (2bb) shown below:

Formula (2m)

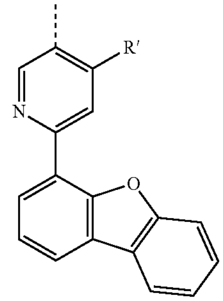

Formula (2n)

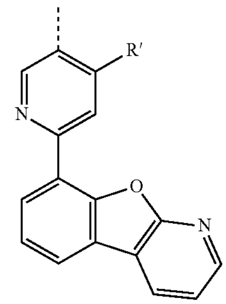

Formula (2o)

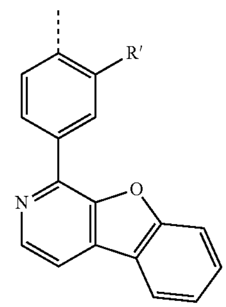

Formula (2p)

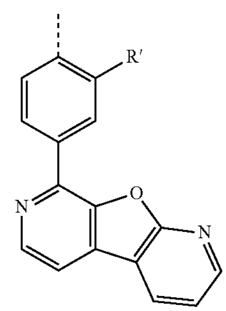

Formula (2q)

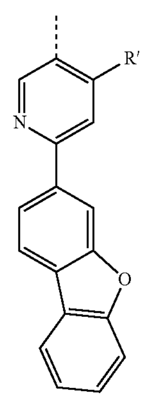

-continued
Formula (2r)
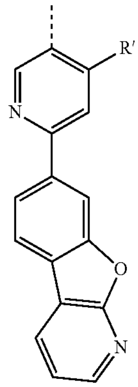
Formula (2s)
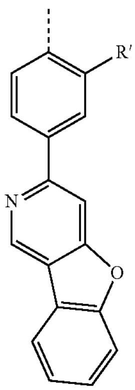
Formula (2t)
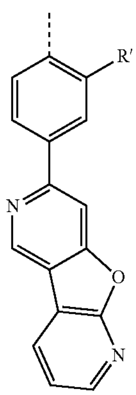
Formula (2u)
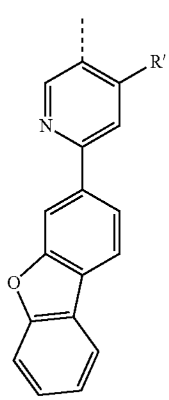
-continued
Formula (2v)
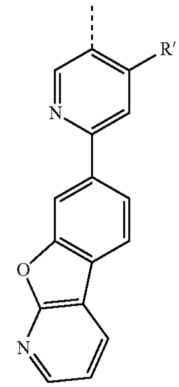
Formula (2w)
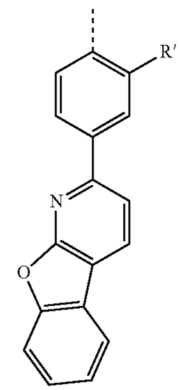
Formula (2x)
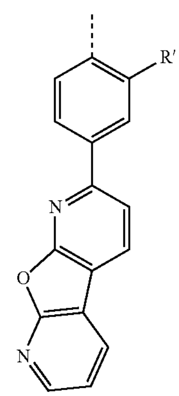
Formula (2y)
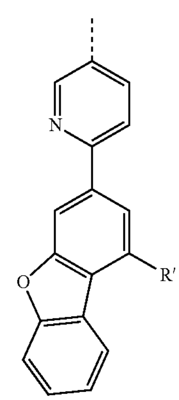

-continued

Formula (2z)

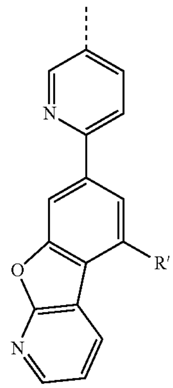

Formula (2aa)

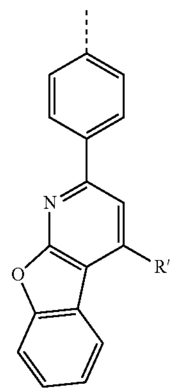

Formula (2bb)

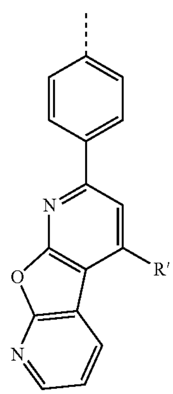

where the ligands may each also be substituted by one or more further R radicals and the fused-on structure may be substituted by one or more $R^1$ radicals. Preferably, there are no further R or $R^1$ radicals present. It is likewise possible for O in these structures to be replaced by S or $NR^1$.

As described above, R' is a group of the formula (3) or (4). The two groups here differ merely in that the group of the formula (3) is bonded to the sub-ligand $L^1$ in the para position and the group of the formula (4) in the meta position.

In a preferred embodiment of the invention, n=0, 1 or 2, preferably 0 or 1 and most preferably 0.

In a further preferred embodiment of the invention, both substituents R" bonded in the ortho positions to the carbon atom by which the group of the formula (3) or (4) is bonded to the phenylpyridine ligands are the same or different and are H or D.

Preferred embodiments of the structure of the formula (3) are the structures of the formulae (3a) to (3n), and preferred embodiments of the structure of the formula (4) are the structures of the formulae (4a) to (4n):

Formula (3a)

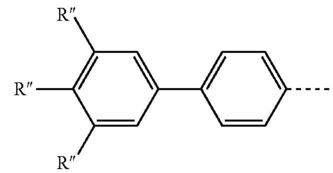

Formula (3b)

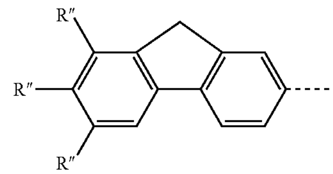

Formula (3c)

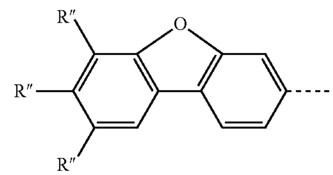

Formula (3d)

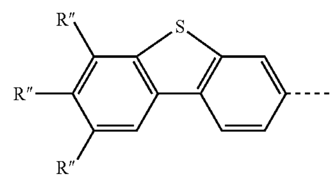

Formula (3e)

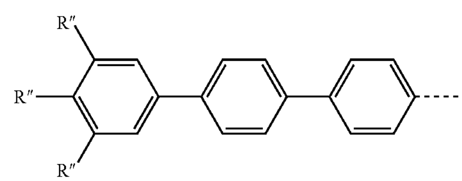

Formula (3f)

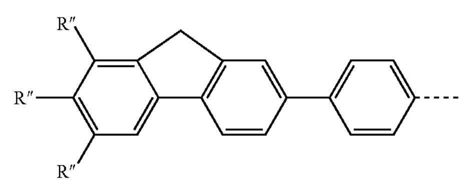

Formula (3g)

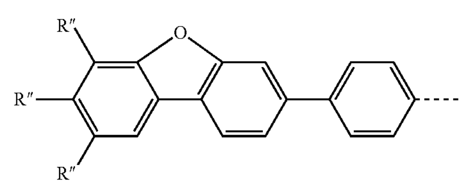

Formula (3h)

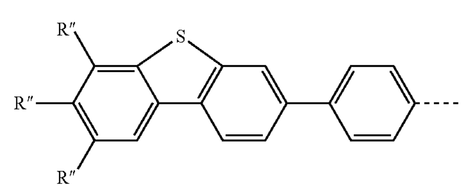

-continued
Formula (3i)
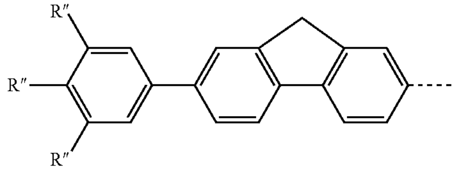
Formula (3j)
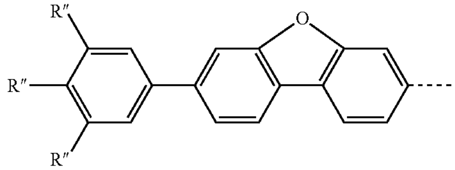
Formula (3k)
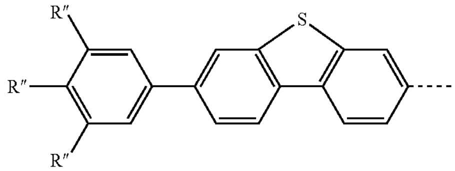
Formula (3l)
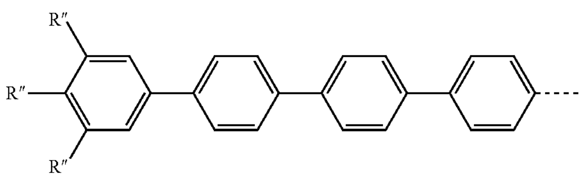
Formula (3m)
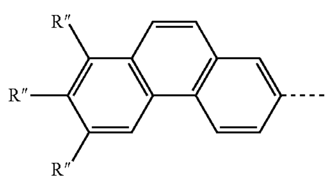
Formula (3n)
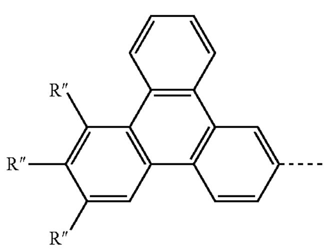
Formula (4a)
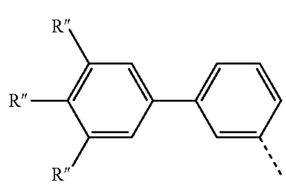
Formula (4b)
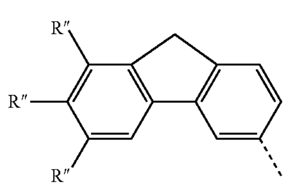
-continued
Formula (4c)
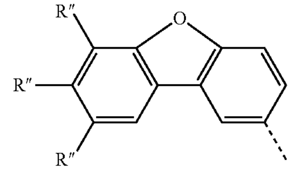
Formula (4d)
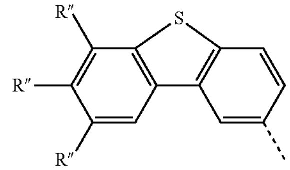
Formula (4e)
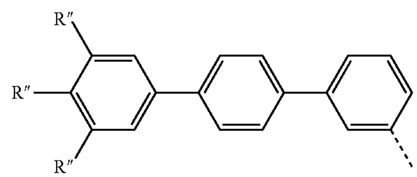
Formula (4f)
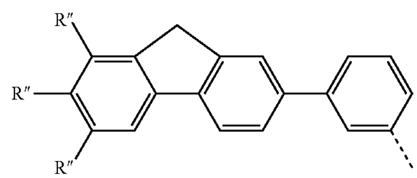
Formula (4g)
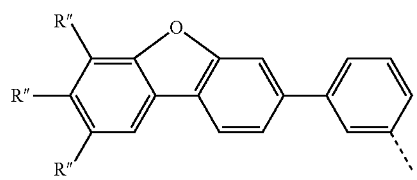
Formula (4h)
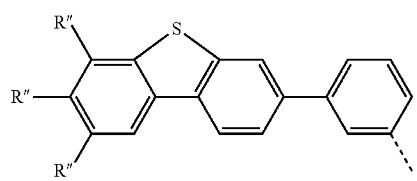
Formula (4i)
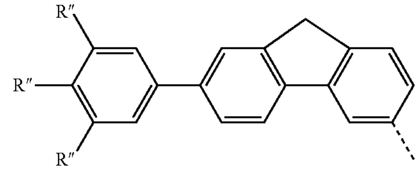
Formula (4j)
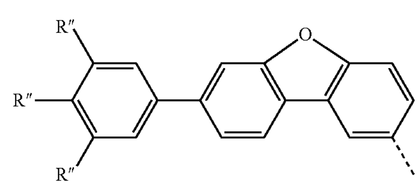

-continued

Formula (4k)

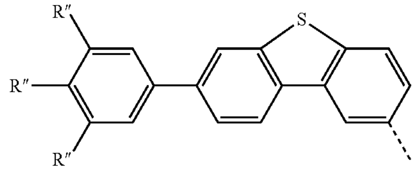

Formula (4l)

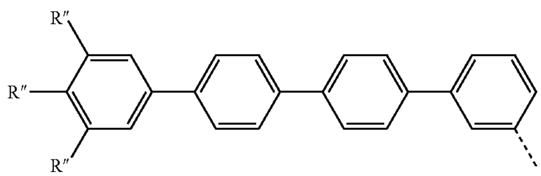

Formula (4m)

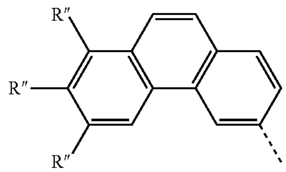

Formula (4n)

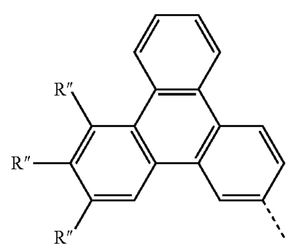

where the symbols used have the definitions given above and where the fluorene group in the 9 position may also be substituted by one or two alkyl groups each having 1 to 6 carbon atoms, preferably having 1 to 4 carbon atoms, more preferably by two methyl groups.

Preferred substituents R" in the groups of the formula (3) or (4) or the preferred embodiments are selected from the group consisting of H, D, CN and an alkyl group having 1 to 4 carbon atoms, more preferably H, D or methyl.

There follows a description of the bidentate sub-ligands $L^2$. As described above, the sub-ligands $L^2$ coordinate to the iridium via one carbon atom and one nitrogen atom or via two carbon atoms or via two nitrogen atoms. When $L^2$ coordinates to the iridium via two carbon atoms, one of the two carbon atoms is a carbene carbon atom. When $L^2$ coordinates to the iridium via two nitrogen atoms, one of the two nitrogen atoms is uncharged and the other is anionic. In addition, $L^2$ is different from $L^1$, since $L^1$ has a substituent of the formula (3) or (4), while $L^2$ can be substituted only by a relatively small aryl or heteroaryl group, and not by a biphenyl group or an oligophenylene group. In a preferred embodiment of the invention, the two sub-ligands $L^2$ are identical.

Preferably, at least one of the sub-ligands $L^2$ has one carbon atom and one nitrogen atom or two carbon atoms as coordinating atoms. More preferably, both sub-ligands $L^2$ have one carbon atom and one nitrogen atom or two carbon atoms as coordinating atoms. Most preferably, both sub-ligands $L^2$ each have one carbon atom and one nitrogen atom as coordinating atoms.

It is further preferable when the metallacycle which is formed from the iridium and the sub-ligand $L^2$ is a five-membered ring. This is shown schematically hereinafter:

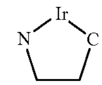

Five-membered ring where N is a coordinating nitrogen atom and C is a coordinating carbon atom, and the carbon atoms shown are atoms of the sub-ligand $L^2$.

In a preferred embodiment of the invention, the structure fragment $Ir(L^2)$ has a higher triplet energy than the structure fragment $Ir(L^1)$. This achieves the effect that the emission from the complex comes predominantly from the structure fragment $Ir(L^1)$, which leads to a higher efficiency. The triplet energy is determined by quantum-chemical calculation, as described in general terms in the examples section hereinafter. It is preferable here when the triplet energy of the structure fragment $Ir(L^2)$ is at least 0.025 eV greater than that of the structure fragment $Ir(L^1)$, more preferably at least 0.05 eV greater, even more preferably at least 0.1 eV and yet more preferably at least 0.2 eV.

In a preferred embodiment of the invention, the sub-ligands $L^2$ are the same or different at each instance, preferably the same, and are a structure of the following formula (L-1), (L-2) or (L-3):

Formula (L-1)

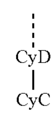

Formula (L-2)

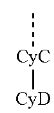

Formula (L-3)

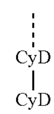

where the dotted bond represents the bond of the sub-ligand to the bridge V, i.e. the bridge of the formula (5), and the other symbols used are as follows:

CyC is the same or different at each instance and is a substituted or unsubstituted aryl or heteroaryl group which has 5 to 14 aromatic ring atoms and coordinates in each case to the metal via a carbon atom and which is bonded to CyD via a covalent bond;

CyD is the same or different at each instance and is a substituted or unsubstituted heteroaryl group which has 5 to 14 aromatic ring atoms and coordinates to the metal via a nitrogen atom or via a carbene carbon atom and which is bonded to CyC via a covalent bond;

at the same time, two or more of the optional substituents together may form a ring system; the optional radicals are preferably selected from the abovementioned R radicals.

CyD coordinates in (L-1) and (L-2) via an uncharged nitrogen atom or via a carbene carbon atom, and in (L-3) via one uncharged and one anionic nitrogen atom. In addition, CyC coordinates via an anionic carbon atom.

When two or more of the substituents, especially two or more R radicals, together form a ring system, it is possible for a ring system to be formed from substituents bonded to directly adjacent carbon atoms. In addition, it is also possible that the substituents on CyC and CyD or on the two CyD groups together form a ring, as a result of which CyC and CyD may also together form a single fused aryl or heteroaryl group as bidentate ligand.

Preferably, both sub-ligands $L^2$ have a structure of the formula (L-1), or both sub-ligands $L^2$ have a structure of the formula (L-2), or one of the sub-ligands $L^2$ has a structure of the formula (L-1) and the other of the sub-ligands has a structure of the formula (L-2), or both sub-ligands $L^2$ have a structure of the formula (L-3). Preferably, the two sub-ligands $L^2$ are the same.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, which coordinates to the metal via a carbon atom, which may be substituted by one or more R radicals and which is bonded to CyD via a covalent bond.

Preferred embodiments of the CyC group are the structures of the following formulae (CyC-1) to (CyC-19) where the CyC group binds in each case at the position signified by # to CyD and at the position signified by * to the iridium, (CyC-1)

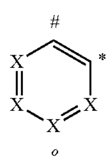

(CyC-2)

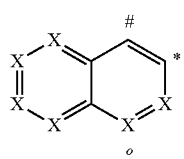

(CyC-3)

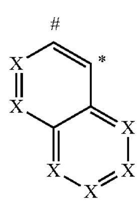

(CyC-4)

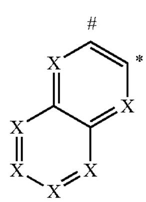

(CyC-5)

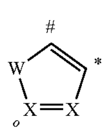

(CyC-6)

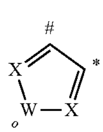

-continued (CyC-7)

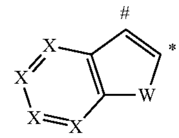

(CyC-8)

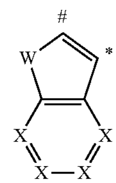

(CyC-9)

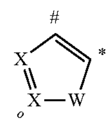

(CyC-10)

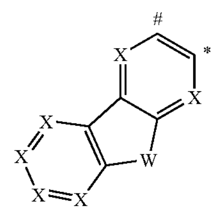

(CyC-11)

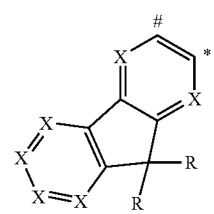

(CyC-12)

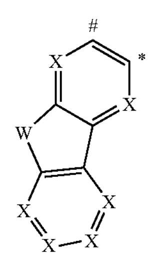

(CyC-13)

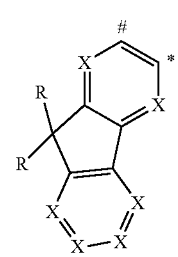

-continued (CyC-14)

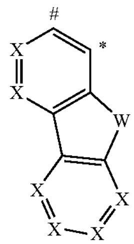

(CyC-15)

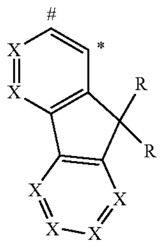

(CyC-16)

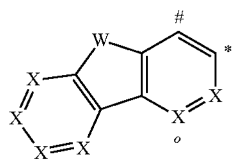

(CyC-17)

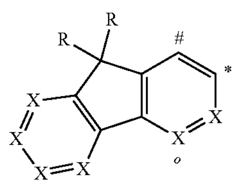

(CyC-18)

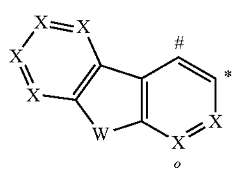

(CyC-19)

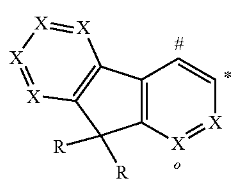

(CyC-20)

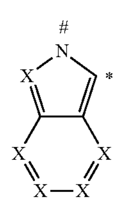

where R has the definitions given above and the other symbols used are as follows:

X is the same or different at each instance and is CR or N, with the proviso that not more than two symbols X per cycle are N;

W is the same or different at each instance and is NR, O or S;

with the proviso that, when the bridge V or the bridge of the formula (5) is bonded to CyC, one symbol X is C and the bridge of the formula (5) is bonded to this carbon atom. When the CyC group is bonded to the bridge of the formula (5), the bond is preferably via the position marked by "o" in the formulae depicted above, and so the symbol X marked by "o" in that case is preferably C. The above-depicted structures which do not contain any symbol X marked by "o" are preferably not bonded directly to the bridge V or the bridge of the formula (5), since such a bond to the bridge is not advantageous for steric reasons.

Preferably, a total of not more than two symbols X in CyC are N, more preferably not more than one symbol X in CyC is N, and most preferably all symbols X are CR, with the proviso that, when the bridge V or the bridge of the formula (5) is bonded to CyC, one symbol X is C and the bridge V or the bridge of the formula (5) is bonded to this carbon atom.

Particularly preferred CyC groups are the groups of the following formulae (CyC-1a) to (CyC-20a):

(CyC-1a)

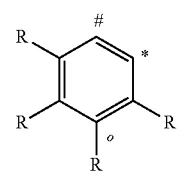

(CyC-1b)

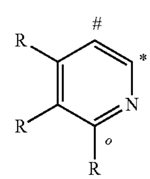

(CyC-1c)

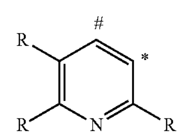

(CyC-1d)

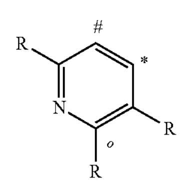

(CyC-1e)

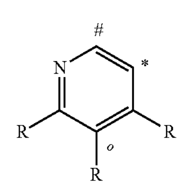

(CyC-1f)

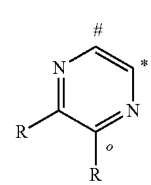

-continued
(CyC-1g)
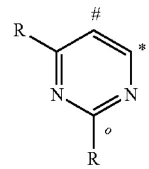
(CyC-1h)
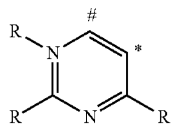
(CyC-2a)
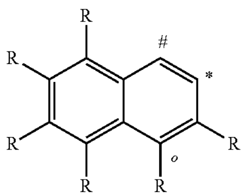
(CyC-2b)
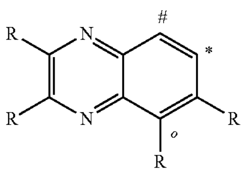
(CyC-3a)
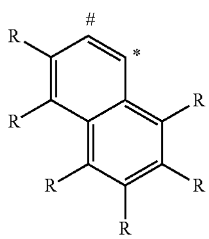
(CyC-3b)
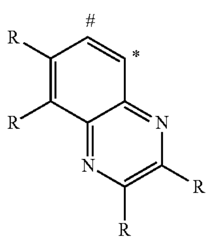
(CyC-4a)
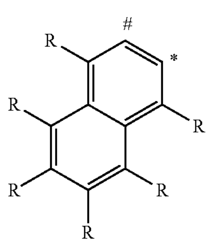
-continued
(CyC-4b)
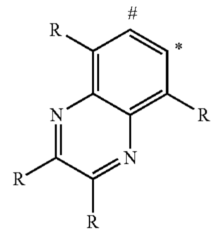
(CyC-5a)
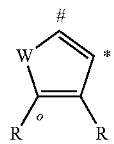
(CyC-6a)
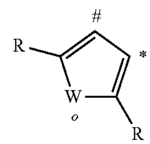
(CyC-7a)
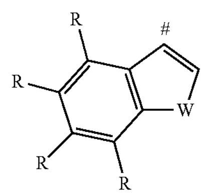
(CyC-8a)
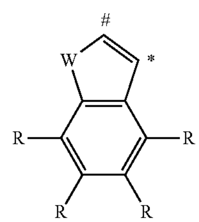
(CyC-9a)
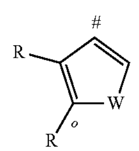
(CyC-10a)
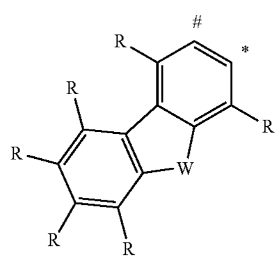

-continued (CyC-11a)

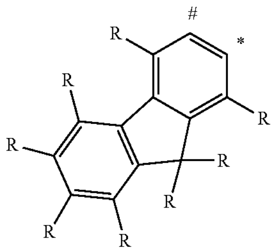

(CyC-12a)

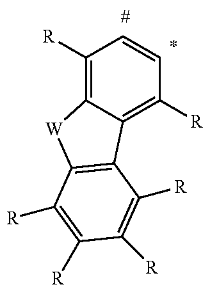

(CyC-13a)

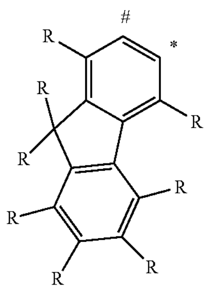

(CyC-14a)

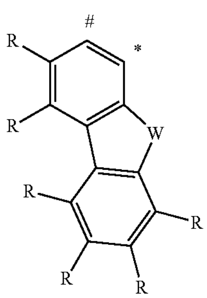

(CyC-15a)

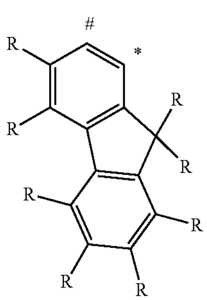

-continued (CyC-16a)

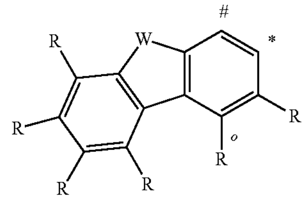

(CyC-17a)

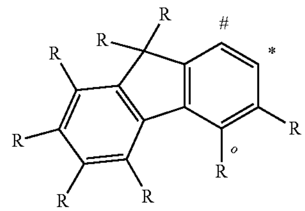

(CyC-18a)

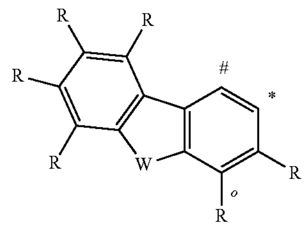

(CyC-19a)

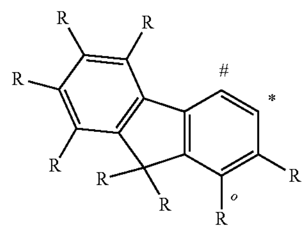

(CyC-20a)

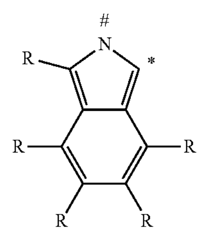

where the symbols used have the definitions given above and, when the bridge V or the bridge of the formula (5) is bonded to CyC, one R radical is not present and the bridge of the formula (5) is bonded to the corresponding carbon atom. When the CyC group is bonded to the bridge of the formula (5), the bond is preferably via the position marked by "o" in the formulae depicted above, and so the R radical in this position in that case is preferably absent. The above-depicted structures which do not contain any carbon atom marked by "o" are preferably not bonded directly to the bridge V or the bridge of the formula (5).

Preferred groups among the (CyC-1) to (CyC-19) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group having 5 to 13 aromatic ring atoms, more preferably having 6 to 10 aromatic ring atoms, which coordinates to the metal via an uncharged nitrogen atom or via a carbene carbon atom and which may be substituted by one or more R radicals and which is bonded via a covalent bond to CyC.

Preferred embodiments of the CyD group are the structures of the following formulae (CyD-1) to (CyD-14) where the CyD group binds in each case at the position signified by # to CyC and coordinates at the position signified by * to the iridium, (CyD-1)

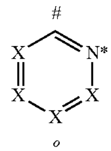

(CyD-2)

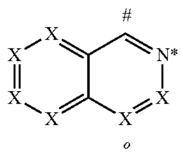

(CyD-3)

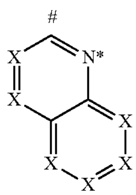

(CyD-4)

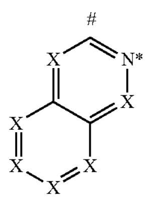

(CyD-5)

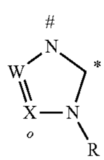

(CyD-6)

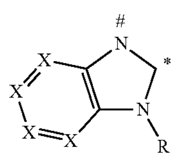

(CyD-7)

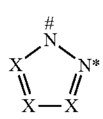

(CyD-8)

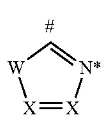

-continued (CyD-9)

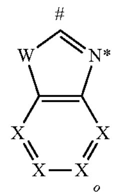

(CyD-10)

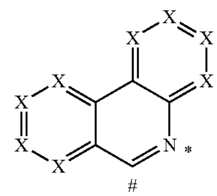

(CyD-11)

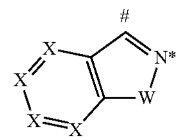

(CyD-12)

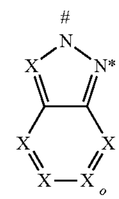

(CyD-13)

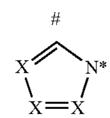

(CyD-14)

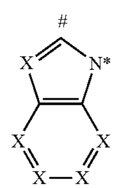

where X, W and R have the definitions given above, with the proviso that, when the bridge V or the bridge of the formula (5) is bonded to CyD, one symbol X is C and the bridge V or the bridge of the formula (5) is bonded to this carbon atom. When the CyD group is bonded to the bridge V or the bridge of the formula (5), the bond is preferably via the position marked by "o" in the formulae depicted above, and so the symbol X marked by "o" in that case is preferably C. The above-depicted structures which do not contain any symbol X marked by "o" are preferably not bonded directly to the bridge of the formula (5), since such a bond to the bridge is not advantageous for steric reasons.

In this case, the (CyD-1) to (CyD-4) and (CyD-7) to (CyD-12) groups coordinate to the iridium via an uncharged nitrogen atom, and (CyD-5) and (CyD-6) groups via a carbene carbon atom. The (CyD-13) and (CyD-14) groups coordinate to the iridium via an anionic nitrogen atom.

Preferably, a total of not more than two symbols X in CyD are N, more preferably not more than one symbol X in CyD is N, and especially preferably all symbols X are CR, with the proviso that, when the bridge of the formula (5) is bonded to CyD, one symbol X is C and the bridge of the formula (5) is bonded to this carbon atom.
Particularly preferred CyD groups are the groups of the following formulae (CyD-1a) to (CyD-14b):
(CyD-1a)
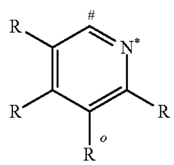
(CyD-2a)
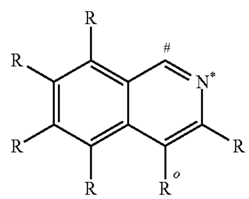
(CyD-3a)
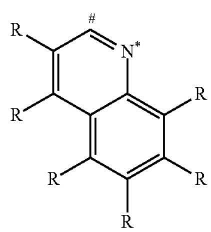
(CyD-3b)
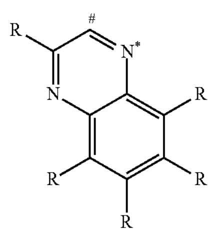
(CyD-4a)
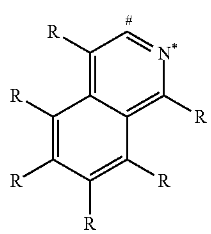
(CyD-5a)
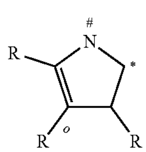
(CyD-6a)
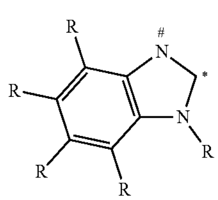
-continued
(CyD-7a)
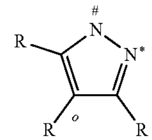
(CyD-8a)
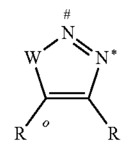
(CyD-9a)
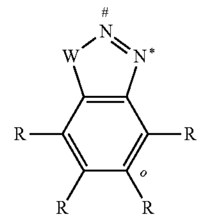
(CyD-10a)
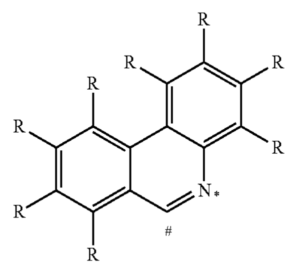
(CyD-11a)
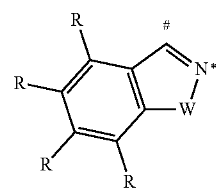
(CyD-12a)
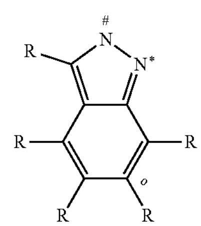
(CyD-12b)
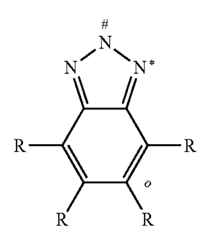
(CyD-13a)
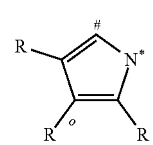

-continued (CyD-13b)

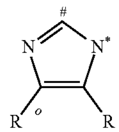

(CyD-13c)

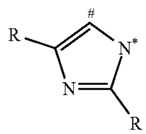

(CyD-13d)

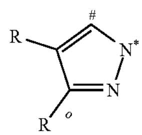

(CyD-14a)

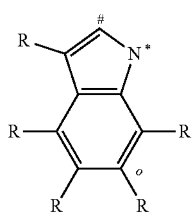

(CyD-14b)

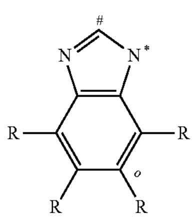

where the symbols used have the definitions given above and, when the bridge V or the bridge of the formula (5) is bonded to CyD, one R radical is not present and the bridge of the formula (5) is bonded to the corresponding carbon atom. When the CyD group is bonded to the bridge V or the bridge of the formula (5), the bond is preferably via the position marked by “o” in the formulae depicted above, and so the R radical in this position in that case is preferably absent. The above-depicted structures which do not contain any carbon atom marked by “o” are preferably not bonded directly to the bridge of the formula (5).

Preferred groups among the (CyD-1) to (CyD-12) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the present invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, and CyD is a heteroaryl group having 6 to 10 aromatic ring atoms. At the same time, CyC and CyD may be substituted by one or more R radicals.

The abovementioned preferred (CyC-1) to (CyC-20) and (CyD-1) to (CyD-12) groups may be combined with one another as desired, provided that at least one of the CyC or CyD groups has a suitable attachment site to the bridge V or the bridge of the formula (5), suitable attachment sites being signified by “o” in the formulae given above.

It is especially preferable when the CyC and CyD groups specified above as particularly preferred, i.e. the groups of the formulae (CyC-1a) to (CyC-20a) and the groups of the formulae (CyD1-a) to (CyD-14b), are combined with one another, provided that at least one of the preferred CyC or CyD groups has a suitable attachment site to the bridge V or the bridge of the formula (5), suitable attachment sites being signified by “o” in the formulae given above.

Combinations in which neither CyC nor CyD has such a suitable attachment site for the bridge of the formula (5) are therefore not preferred.

It is very particularly preferable when one of the (CyC-1), (CyC-3), (CyC-8), (CyC-10), (CyC-12), (CyC-13) and (CyC-16) groups, especially the (CyC-1a), (CyC-3a), (CyC-8a), (CyC-10a), (CyC-12a), (CyC-13a) and (CyC-16a) groups, is combined with one of the (CyD-1), (CyD-2) and (CyD-3) groups, especially with one of the (CyD-1a), (CyD-2a) and (CyD-3a) groups.

Preferred sub-ligands (L-1) are the structures of the formulae (L-1-1) and (L-1-2), and preferred sub-ligands (L-2) are the structures of the formulae (L-2-1) to (L-2-4):

(L-1-1)

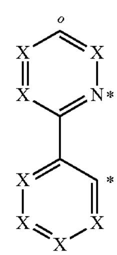

(L-1-2)

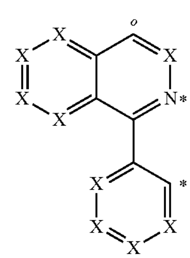

(L-2-1)

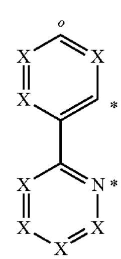

-continued
(L-2-2)
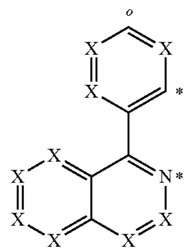
(L-2-3)
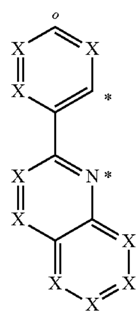
(L-2-4)
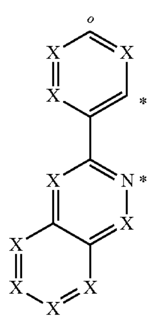
where the symbols used have the definitions given above and “o” represents the position of the bond to the bridge V or the bridge of the formula (5).
Particularly preferred sub-ligands (L-1) are the structures of the formulae (L-1-1a) and (L-1-2b), and particularly preferred sub-ligands (L-2) are the structures of the formulae (L-2-1a) to (L-2-4a)
(L-1-1a)
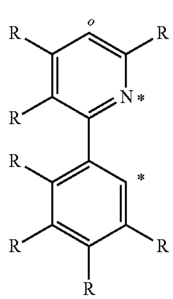
-continued
(L-1-2a)
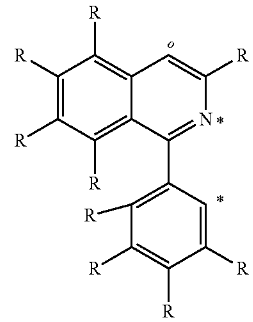
(L-2-1a)
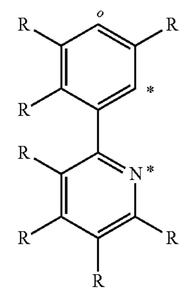
(L-2-2a)
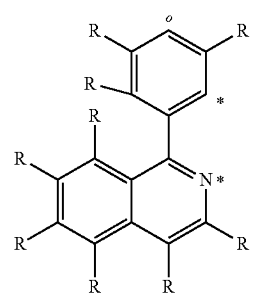
(L-2-3a)
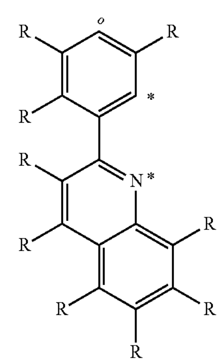

-continued (L-2-4a)

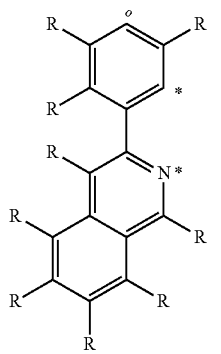

where the symbols used have the definitions given above and "o" represents the position of the bond to the bridge V or the bridge of the formula (5).

When two R radicals of which one is bonded to CyC and the other to CyD together form an aromatic ring system, this can result in bridged sub-ligands, in which case some of these bridged sub-ligands overall form a single larger heteroaryl group, for example benzo[h]quinoline, etc. The ring between the substituents on CyC and CyD is preferably formed by a group of one of the following formulae (17) to (26):

Formula (17)

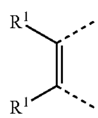

Formula (18)

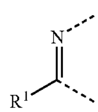

Formula (19)

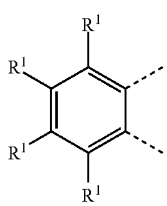

Formula (20)

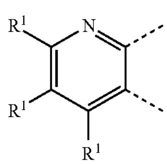

Formula (21)

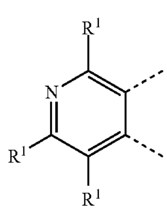

-continued

Formula (22)

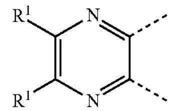

Formula (23)

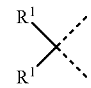

Formula (24)

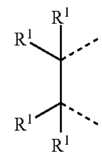

Formula (25)

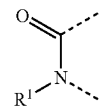

Formula (26)

where $R^1$ has the definitions given above and the dotted bonds signify the bonds to CyC or CyD. It is possible here for the unsymmetric groups among those mentioned above to be incorporated in either of the two ways. For example, in the case of the group of the formula (26), the oxygen atom may bind to the CyC group and the carbonyl group to the CyD group, or the oxygen atom may bind to the CyD group and the carbonyl group to the CyC group.

At the same time, the group of the formula (23) is preferred particularly when this results in ring formation to give a six-membered ring, as shown below, for example, by the formulae (L-21) and (L-22).

Preferred ligands which arise through ring formation between two R radicals in the different cycles are the structures of the formulae (L-3) to (L-30) shown below:

(L-3)

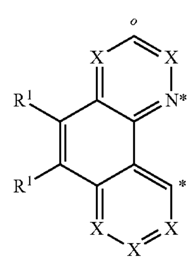

(L-4)

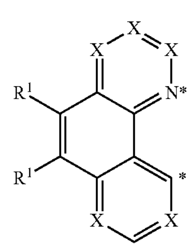

(L-5)
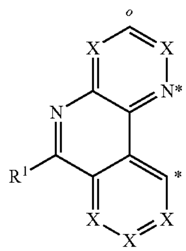
(L-6)
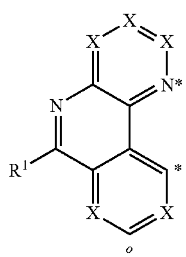
(L-7)
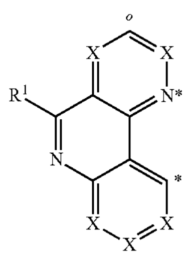
(L-8)
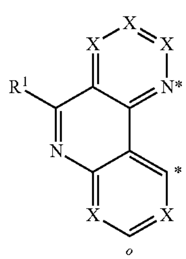
(L-9)
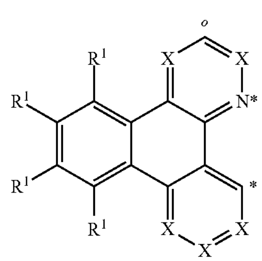
(L-10)
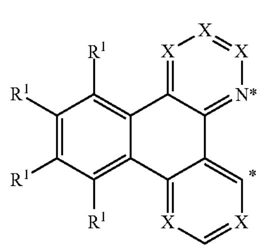
(L-11)
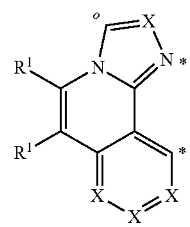
(L-12)
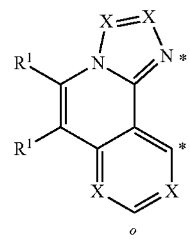
(L-13)
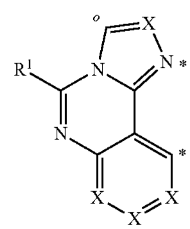
(L-14)
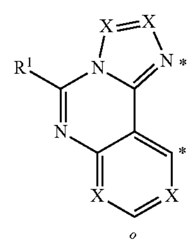
(L-15)
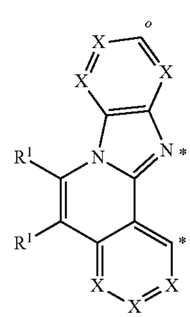
(L-16)
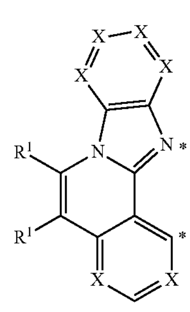

-continued
(L-17)
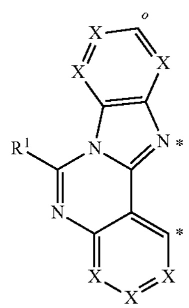
(L-18)
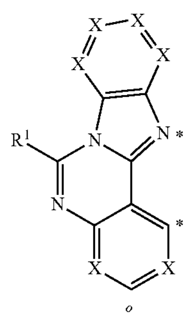
(L-19)
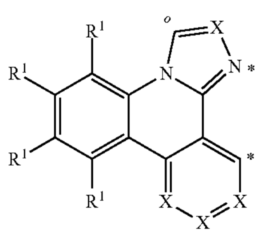
(L-20)
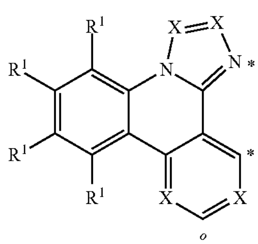
(L-21)
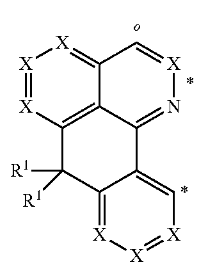
-continued
(L-22)
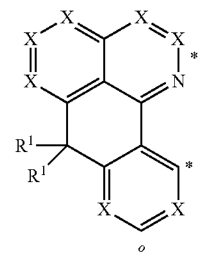
(L-23)
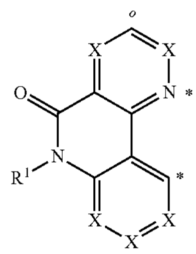
(L-24)
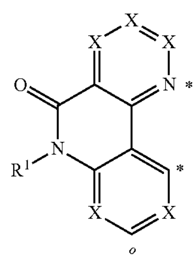
(L-25)
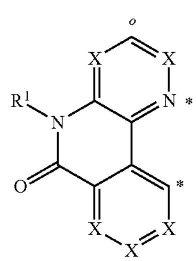
(L-26)
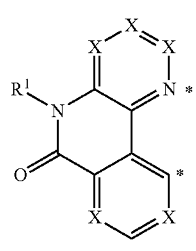
(L-27)
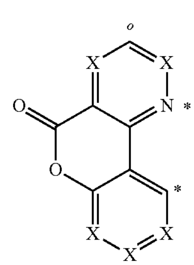

-continued (L-28)

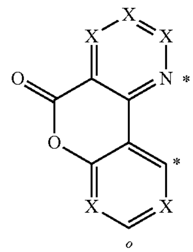

(L-29)

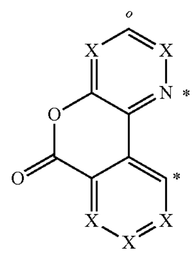

(L-30)

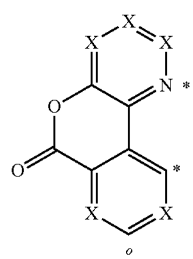

where the symbols used have the definitions given above and "o" indicates the position at which this sub-ligand is joined to the group of the formula (5).

In a preferred embodiment of the sub-ligands of the formulae (L-3) to (L-30), a total of one symbol X is N, and the other symbols X are CR, or all symbols X are CR.

In a further embodiment of the invention, it is preferable if, in the groups (CyC-1) to (CyC-20) or (CyD-1) to (CyD-14) or in the sub-ligands (L-3) to (L-30), one of the atoms X is N when an R group bonded as a substituent adjacent to this nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium.

In this case, this substituent R is preferably a group selected from $CF_3$, $OCF_3$, alkyl groups having 1 to 10 carbon atoms, especially branched or cyclic alkyl groups having 3 to 10 carbon atoms, $OR^1$ where $R^1$ is an alkyl group having 1 to 10 carbon atoms, especially a branched or cyclic alkyl group having 3 to 10 carbon atoms, dialkylamino groups having 2 to 10 carbon atoms or aryl or heteroaryl groups having 5 to 10 aromatic ring atoms. These groups are sterically demanding groups. Further preferably, this R radical may also form a cycle with an adjacent R radical.

A further suitable bidentate sub-ligand is a sub-ligand of the following formula (L-31) or (L-32):

(L-31)

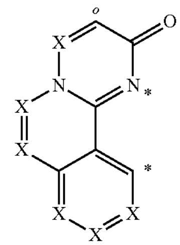

(L-32)

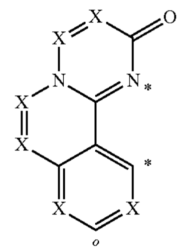

where R has the definitions given above, * represents the position of coordination to the iridium, "o" represents the position of linkage of the sub-ligand to V or the group of the formula (5) and the other symbols used are as follows:

X is the same or different at each instance and is CR or N, with the proviso that not more than one X symbol per cycle is N.

When two R radicals bonded to adjacent carbon atoms in the sub-ligands (L-31) and (L-32) form an aromatic cycle with one another, this cycle together with the two adjacent carbon atoms is preferably a structure of the following formula:

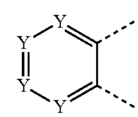

where the dotted bonds symbolize the linkage of this group within the sub-ligand and Y is the same or different at each instance and is $CR^1$ or N and preferably not more than one symbol Y is N.

In a preferred embodiment of the sub-ligand (L-31) or (L-32), not more than one such fused-on group is present. The sub-ligands are thus preferably sub-ligands of the following formulae (L-33) to (L-38):

(L-33)

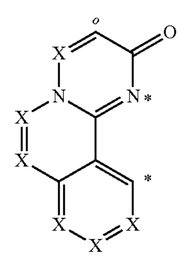

-continued (L-34)

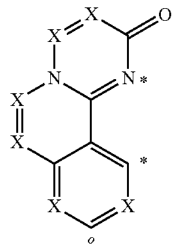

(L-35)

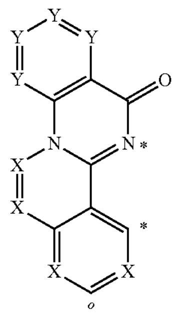

(L-36)

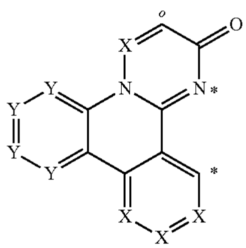

(L-37)

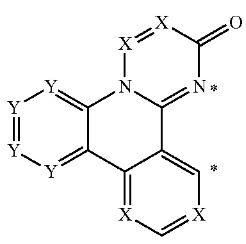

(L-38)

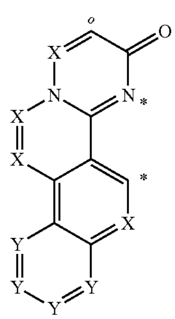

where X is the same or different at each instance and is CR or N, but the R radicals together do not form an aromatic or heteroaromatic ring system and the further symbols have the definitions given above.

In a preferred embodiment of the invention, in the sub-ligand of the formulae (L-31) to (L-38), a total of 0, 1 or 2 of the symbols X and, if present, Y are N. More preferably, a total of 0 or 1 of the symbols X and, if present, Y are N.

Preferred embodiments of the formulae (L-33) to (L-38) are the structures of the following formulae (L-33a) to (L-38f):

(L-33a)

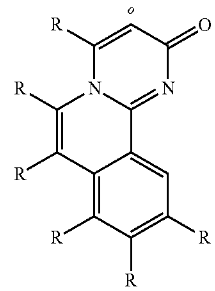

(L-33b)

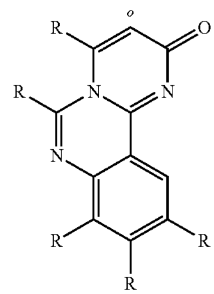

(L-33c)

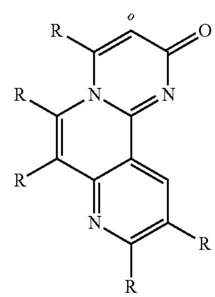

(L-33d)

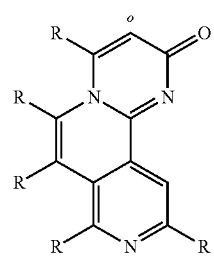

(L-34a)

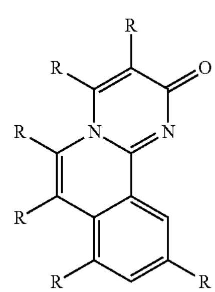

-continued
(L-34b)
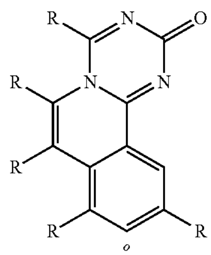
(L-34c)
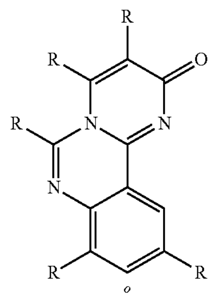
(L-34d)
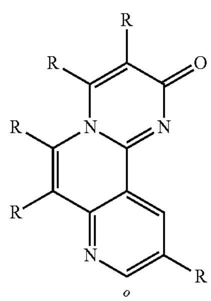
(L-35a)
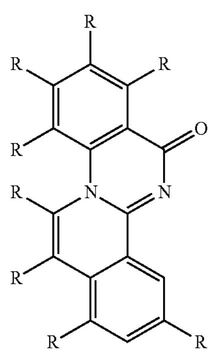
(L-35b)
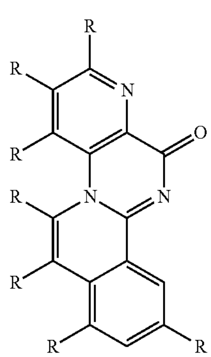
-continued
(L-35c)
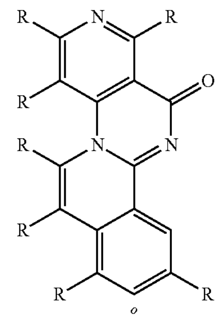
(L-35d)
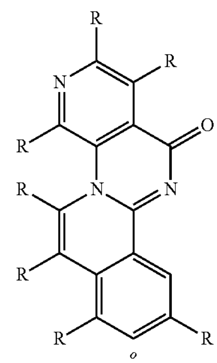
(L-35e)
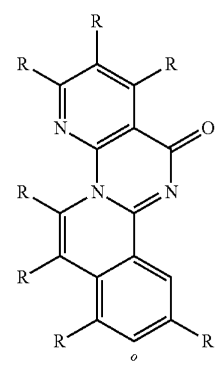
(L-35f)
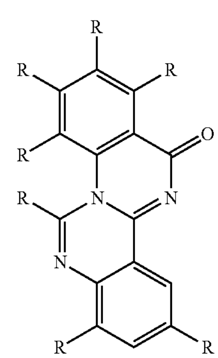

(L-35g)
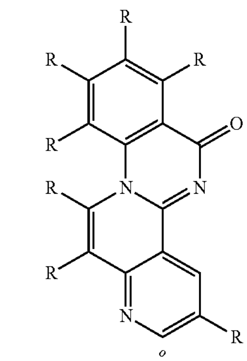
(L-36a)
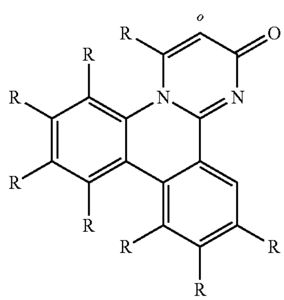
(L-36b)
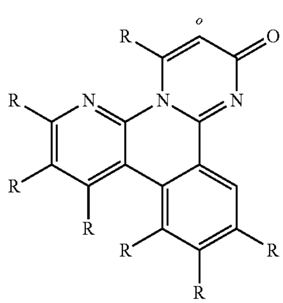
(L-36c)
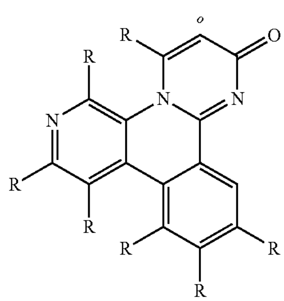
(L-36d)
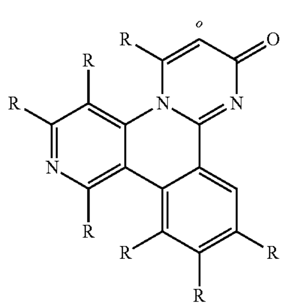
(L-36e)
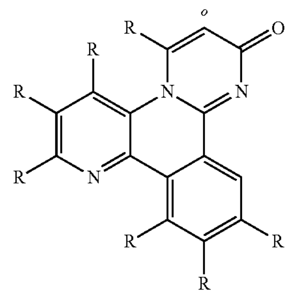
(L-36f)
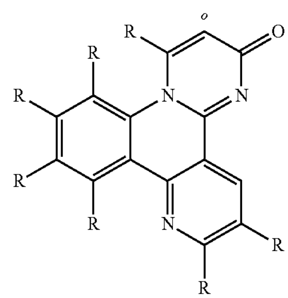
(L-36g)
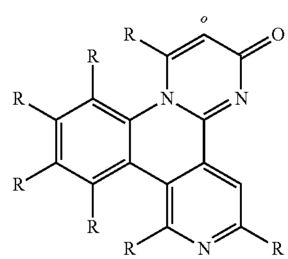
(L-37a)
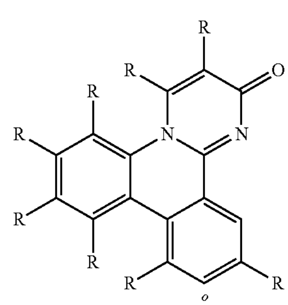
(L-37b)
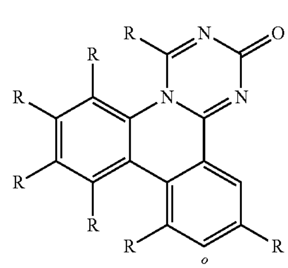

-continued
(L-37c)
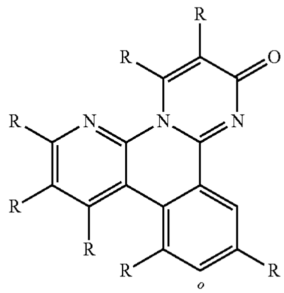
(L-37d)
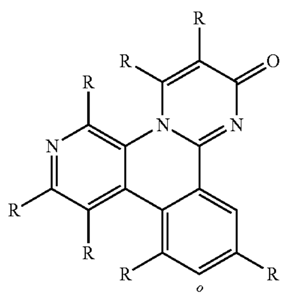
(L-37e)
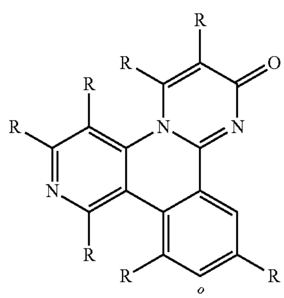
(L-37f)
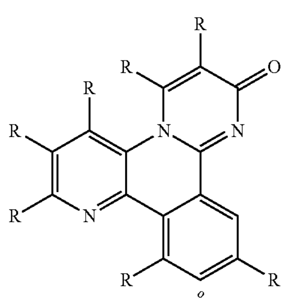
(L-37g)
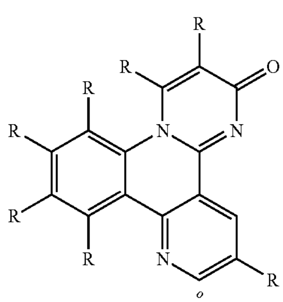
-continued
(L-38a)
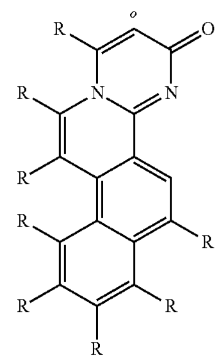
(L-38b)
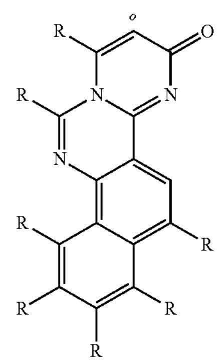
(L-38c)
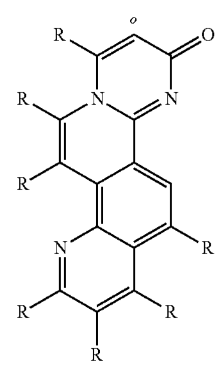
(L-38d)
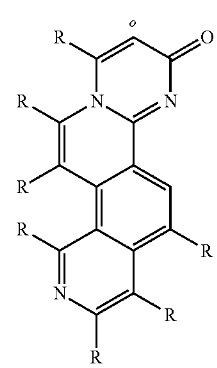

-continued (L-38e)

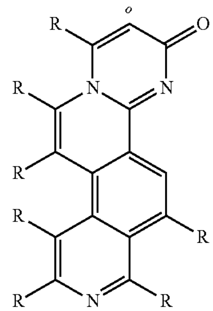

(L-38f)

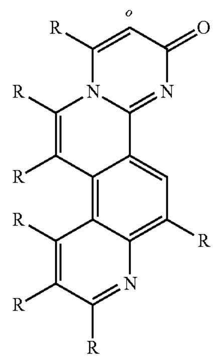

where the symbols used have the definitions given above and "o" indicates the position of the linkage to the group of the formula (5).

In a preferred embodiment of the invention, the X group in the ortho position to the coordination to the metal is CR. In this radical, R bonded in the ortho position to the coordination to the metal is preferably selected from the group consisting of H, D, F and methyl.

In a further embodiment of the invention, it is preferable, if one of the atoms X or, if present, Y is N, when a substituent bonded adjacent to this nitrogen atom is an R group which is not H or D. In this case, this substituent R is preferably a group selected from $CF_3$, $OCF_3$, alkyl groups having 1 to 10 carbon atoms, especially branched or cyclic alkyl groups having 3 to 10 carbon atoms, $OR^1$ where $R^1$ is an alkyl group having 1 to 10 carbon atoms, especially a branched or cyclic alkyl group having 3 to 10 carbon atoms, dialkylamino groups having 2 to 10 carbon atoms or aryl or heteroaryl groups having 5 to 10 aromatic ring atoms. These groups are sterically demanding groups. Further preferably, this R radical may also form a cycle with an adjacent R radical.

There follows a description of preferred substituents as may be present on the above-described sub-ligands $L^1$ and/or $L^2$, but also on the bivalent arylene or heteroarylene group in the structure of the formulae (5) to (7), i.e. in the structure of the formula (8).

In a further embodiment of the invention, the metal complex of the invention contains two R substituents or two $R^1$ substituents which are bonded to adjacent carbon atoms and together form an aliphatic ring according to one of the formulae described hereinafter. In this case, the two R substituents which form this aliphatic ring may be present on the bridge of the formula (5) and/or on one or more of the bidentate sub-ligands. The aliphatic ring which is formed by the ring formation by two R substituents together or by two $R^1$ substituents together is preferably described by one of the following formulae (27) to (33):

Formula (27)

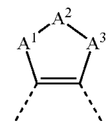

Formula (28)

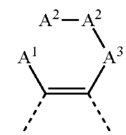

Formula (29)

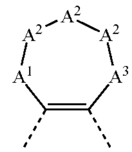

Formula (30)

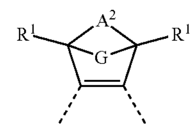

Formula (31)

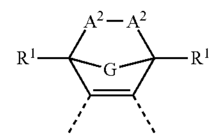

Formula (32)

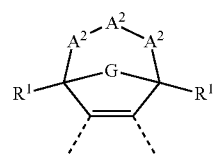

Formula (33)

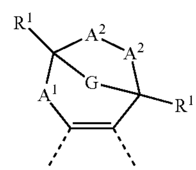

where $R^1$ and $R^2$ have the definitions given above, the dotted bonds signify the linkage of the two carbon atoms in the ligand and, in addition:

$A^1$, $A^3$ is the same or different at each instance and is $C(R^3)_2$, O, S, $NR^3$ or C(═O);

$A^2$ is $C(R^1)_2$, O, S, $NR^3$ or C(═O);

G is an alkylene group which has 1, 2 or 3 carbon atoms and may be substituted by one or more $R^2$ radicals, —$CR^2$═$CR^2$— or an ortho-bonded arylene or heteroarylene group which has 5 or 6 aromatic ring atoms and may be substituted by one or more $R^2$ radicals;

$R^3$ is the same or different at each instance and is H, F, $OR^2$, a straight chain alkyl group having 1 to 10 carbon atoms, a branched or cyclic alkyl group having 3 to 10 carbon atoms, where the alkyl group in each case may be substituted by one or more $R^2$ radicals, where one or more nonadjacent $CH_2$ groups may be replaced by $R^2C$═$CR^2$, C≡C, $Si(R^2)_2$, C═O, $NR^2$, O, S or $CONR^2$, or an aryl or heteroaryl group which has 5 or 6 aromatic ring atoms and may be substituted in each case by one or more $R^2$ radicals; at the same time, two $R^3$ radicals which are bonded to the same carbon atom may together form an aliphatic ring system and thus form a spiro system; in addition, $R^3$ with an adjacent R or $R^1$ radical may form an aliphatic ring system; with the proviso that no two heteroatoms in these groups are bonded directly to one another and no two C═O groups are bonded directly to one another.

In the above-depicted structures of the formulae (27) to (33) and the further embodiments of these structures specified as preferred, a double bond is depicted in a formal sense between the two carbon atoms. This is a simplification of the chemical structure when these two carbon atoms are incorporated into an aromatic or heteroaromatic system and hence the bond between these two carbon atoms is formally between the bonding level of a single bond and that of a double bond. The drawing of the formal double bond should thus not be interpreted so as to limit the structure; instead, it will be apparent to the person skilled in the art that this is an aromatic bond.

When adjacent radicals in the structures of the invention form an aliphatic ring system, it is preferable when the latter does not have any acidic benzylic protons. Benzylic protons are understood to mean protons which bind to a carbon atom bonded directly to the ligand. This can be achieved by virtue of the carbon atoms in the aliphatic ring system which bind directly to an aryl or heteroaryl group being fully substituted and not containing any bonded hydrogen atoms. Thus, the absence of acidic benzylic protons in the formulae (27) to (29) is achieved by virtue of $A^1$ and $A^3$, when they are $C(R^3)_2$, being defined such that $R^3$ is not hydrogen. This can additionally also be achieved by virtue of the carbon atoms in the aliphatic ring system which bind directly to an aryl or heteroaryl group being the bridgeheads in a bi- or polycyclic structure. The protons bonded to bridgehead carbon atoms, because of the spatial structure of the bi- or polycycle, are significantly less acidic than benzylic protons on carbon atoms which are not bonded within a bi- or polycyclic structure, and are regarded as non-acidic protons in the context of the present invention. Thus, the absence of acidic benzylic protons in formulae (30) to (33) is achieved by virtue of this being a bicyclic structure, as a result of which $R^1$, when it is H, is much less acidic than benzylic protons since the corresponding anion of the bicyclic structure is not mesomerically stabilized. Even when $R^1$ in formulae (30) to (33) is H, this is therefore a non-acidic proton in the context of the present application.

In a preferred embodiment of the invention, $R^3$ is not H.

In a preferred embodiment of the structure of the formulae (27) to (33), not more than one of the $A^1$, $A^2$ and $A^3$ groups is a heteroatom, especially O or $NR^3$, and the other groups are $C(R^3)_2$ or $C(R^1)_2$, or $A^1$ and $A^3$ are the same or different at each instance and are O or $NR^3$ and $A^2$ is $C(R^1)_2$. In a particularly preferred embodiment of the invention, $A^1$ and $A^3$ are the same or different at each instance and are $C(R^3)_2$, and $A^2$ is $C(R^1)_2$ and more preferably $C(R^3)_2$ or $CH_2$.

Preferred embodiments of the formula (27) are thus the structures of the formulae (27-A), (27-B), (27-C) and (27-D), and a particularly preferred embodiment of the formula (27-A) is the structures of the formulae (27-E) and (27-F):

Formula (27-A)

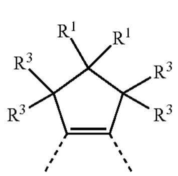

-continued

Formula (27-B)

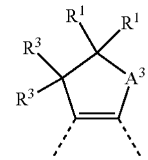

Formula (27-C)

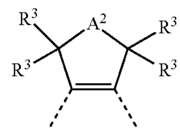

Formula (27-D)

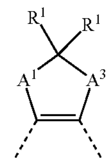

Formula (27-E)

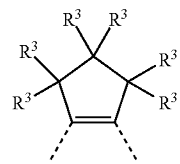

Formula (27-F)

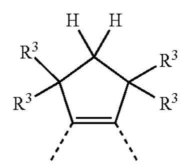

where $R^1$ and $R^3$ have the definitions given above and $A^1$, $A^2$ and $A^3$ are the same or different at each instance and are O or $NR^3$.

Preferred embodiments of the formula (28) are the structures of the following formulae (28-A) to (28-F):

Formula (28-A)

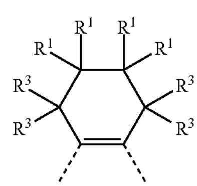

Formula (28-B)

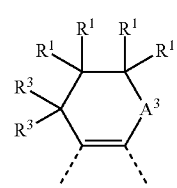

Formula (28-C)

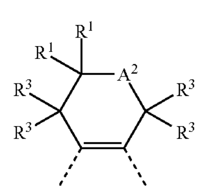

-continued

Formula (28-D)

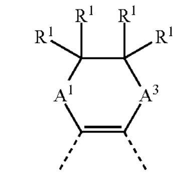

Formula (28-E)

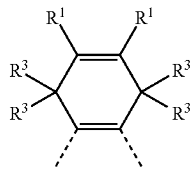

Formula (28-F)

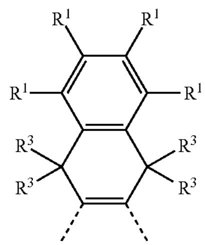

where $R^1$ and $R^3$ have the definitions given above and $A^1$, $A^2$ and $A^3$ are the same or different at each instance and are O or $NR^3$.

Preferred embodiments of the formula (29) are the structures of the following formulae (29-A) to (29-E):

Formula (29-A)

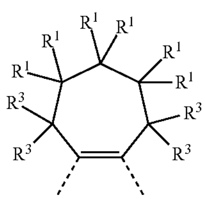

Formula (29-B)

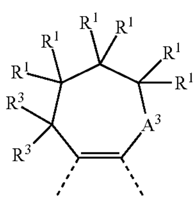

Formula (29-C)

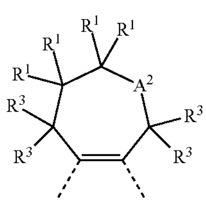

Formula (29-D)

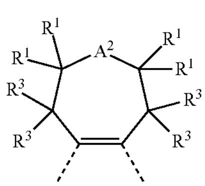

-continued

Formula (29-E)

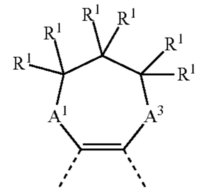

where $R^1$ and $R^3$ have the definitions given above and $A^1$, $A^2$ and $A^3$ are the same or different at each instance and are O or $NR^3$.

In a preferred embodiment of the structure of formula (30), the $R^1$ radicals bonded to the bridgehead are H, D, F or $CH_3$. Further preferably, $A^2$ is $C(R^1)_2$ or O, and more preferably $C(R^3)_2$. Preferred embodiments of the formula (48) are thus structures of the formulae (30-A) and (30-B), and a particularly preferred embodiment of the formula (30-A) is a structure of the formula (30-C):

Formula (30-A)

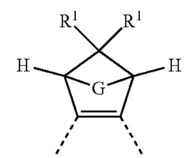

Formula (30-B)

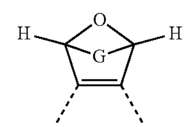

Formula (30-C)

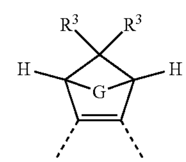

where the symbols used have the definitions given above.

In a preferred embodiment of the structure of formulae (31), (32) and (33), the $R^1$ radicals bonded to the bridgehead are H, D, F or $CH_3$. Further preferably, $A^2$ is $C(R^1)_2$. Preferred embodiments of the formulae (31), (32) and (33) are thus the structures of the formulae (31-A), (32-A) and (33-A):

Formula (31-A)

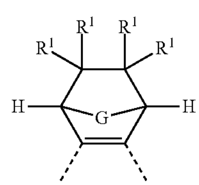

Formula (32-A)

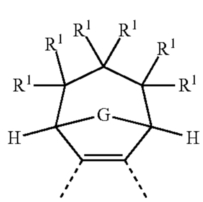

-continued

Formula (33-A)

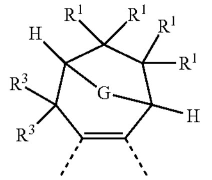

where the symbols used have the definitions given above.

Further preferably, the G group in the formulae (30), (30-A), (30-B), (30-C), (31), (31-A), (32), (32-A), (33) and (33-A) is a 1,2-ethylene group which may be substituted by one or more $R^2$ radicals, where $R^2$ is preferably the same or different at each instance and is H or an alkyl group having 1 to 4 carbon atoms, or an ortho-arylene group which has 6 to 10 carbon atoms and may be substituted by one or more $R^2$ radicals, but is preferably unsubstituted, especially an ortho-phenylene group which may be substituted by one or more $R^2$ radicals, but is preferably unsubstituted.

In a further preferred embodiment of the invention, $R^3$ in the groups of the formulae (27) to (33) and in the preferred embodiments is the same or different at each instance and is F, a straight-chain alkyl group having 1 to 10 carbon atoms or a branched or cyclic alkyl group having 3 to 20 carbon atoms, where one or more nonadjacent $CH_2$ groups in each case may be replaced by $R^2C{=}CR^2$ and one or more hydrogen atoms may be replaced by D or F, or a phenyl group which may be substituted by one or more $R^2$ radicals; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

In a particularly preferred embodiment of the invention, $R^3$ in the groups of the formulae (27) to (33) and in the preferred embodiments is the same or different at each instance and is F, a straight-chain alkyl group having 1 to 3 carbon atoms, especially methyl, or a phenyl group which may be substituted by one or more $R^2$ radicals, but is preferably unsubstituted; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

Examples of particularly suitable groups of the formula (27) are the structures listed below:

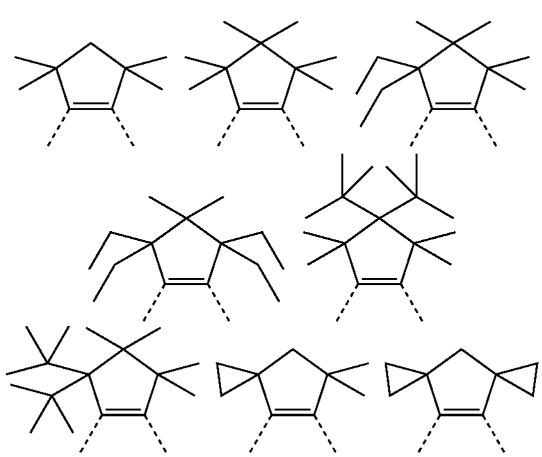

-continued

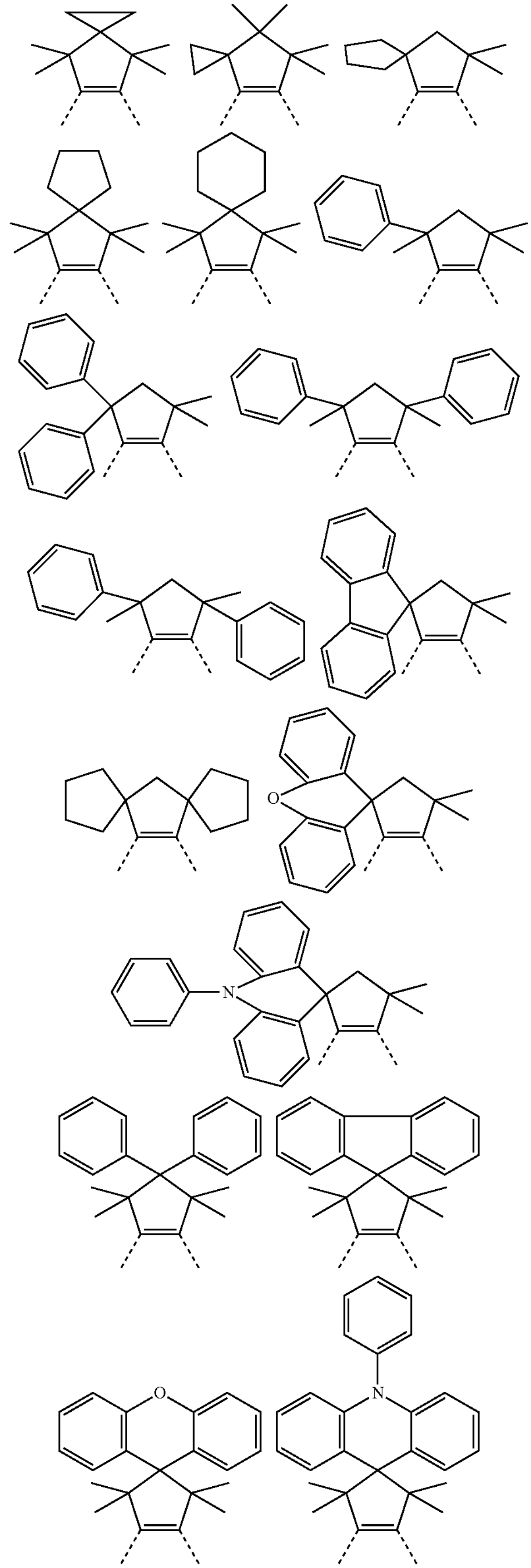

-continued
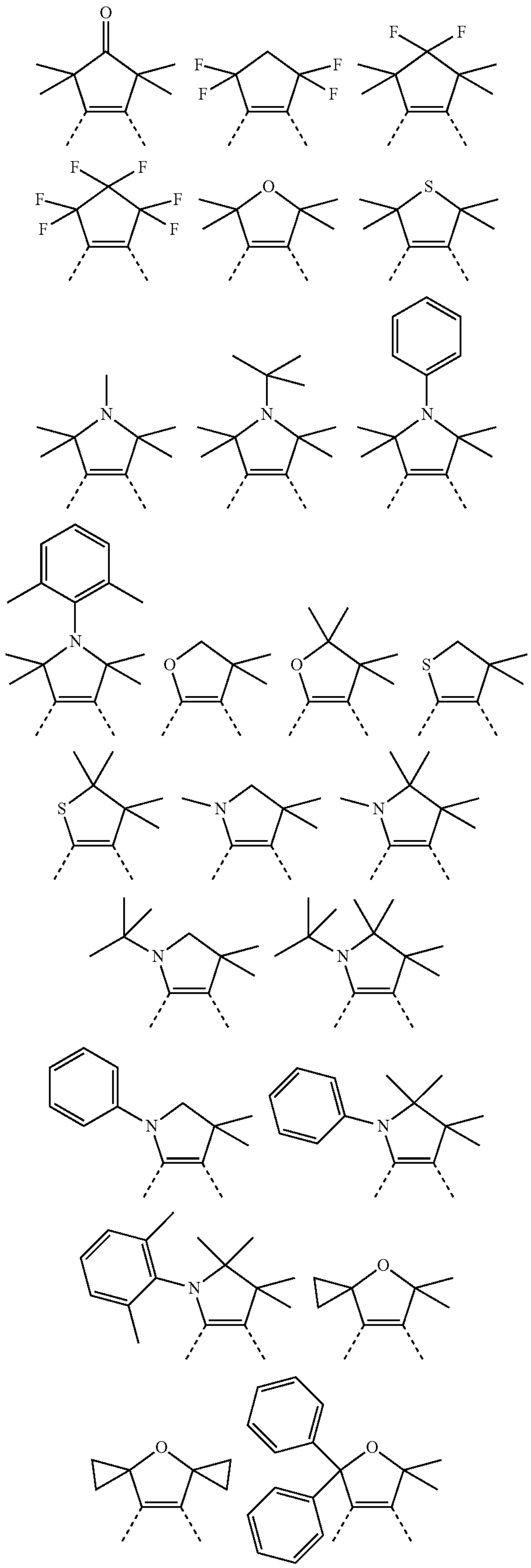
-continued
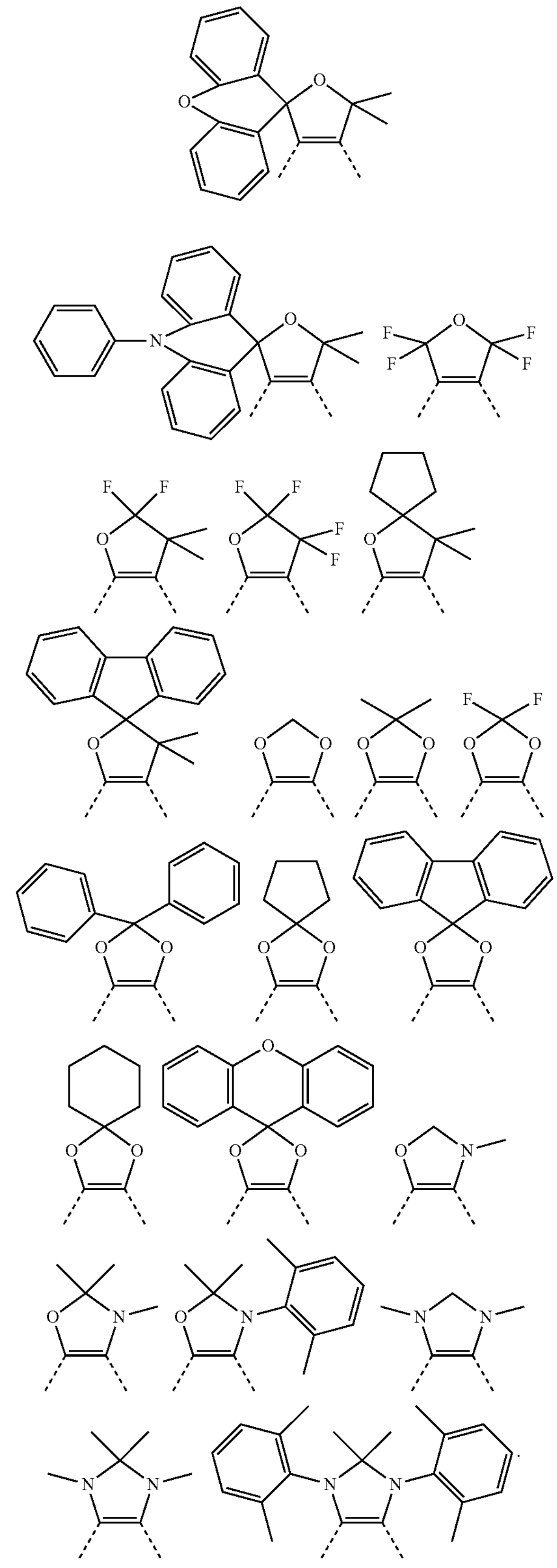
Examples of particularly suitable groups of the formula (28) are the structures listed below:

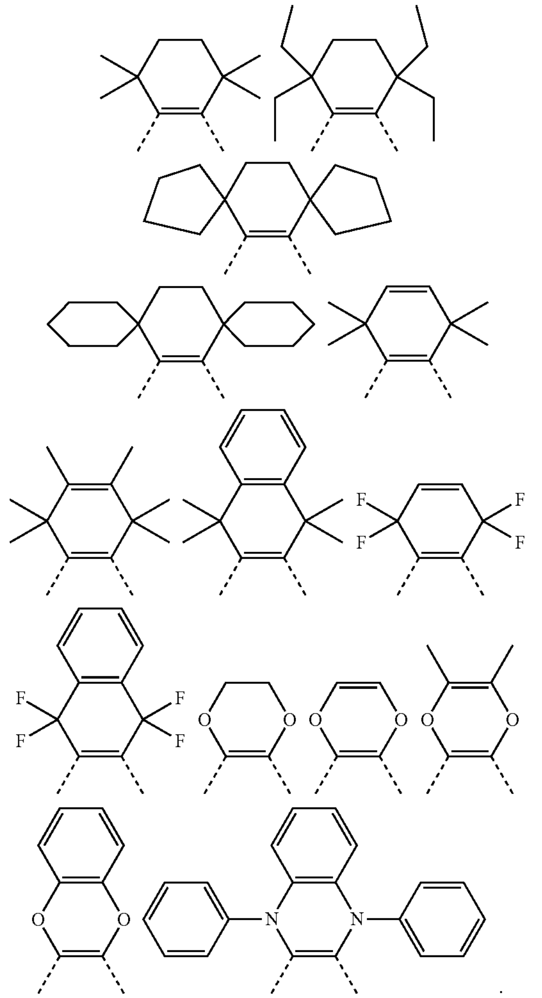

Examples of particularly suitable groups of the formulae (29), (32) and (33) are the structures listed below:

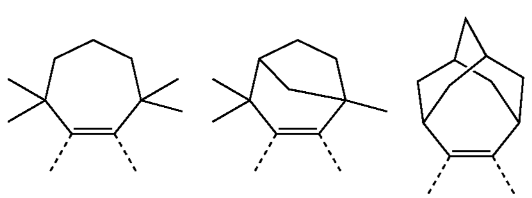

Examples of particularly suitable groups of the formula (30) are the structures listed below:

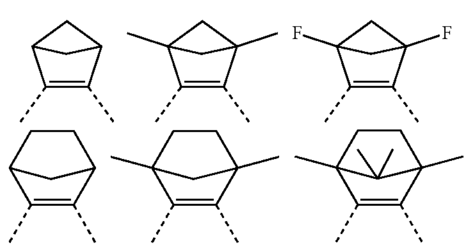

-continued

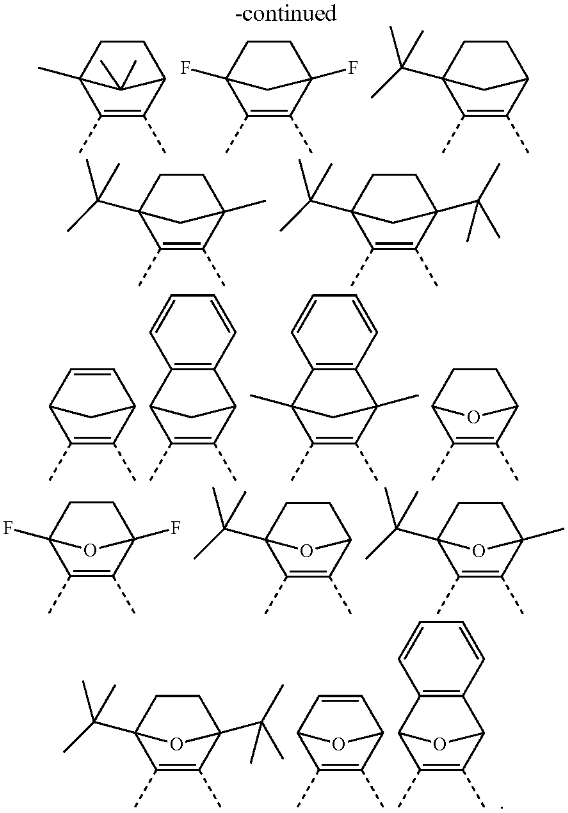

Examples of particularly suitable groups of the formula (31) are the structures listed below:

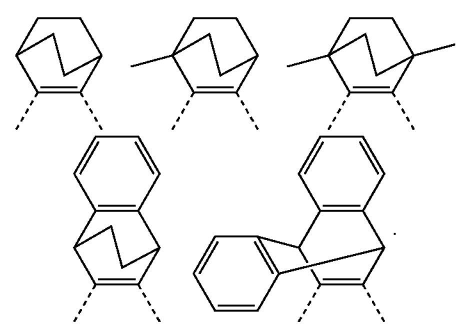

When R radicals are bonded within the bidentate subligands $L^1$ or $L^2$ or within the bivalent arylene or heteroarylene groups of the formula (8) bonded within the formulae (5) to (7) or the preferred embodiments, these R radicals are the same or different at each instance and are preferably selected from the group consisting of H, D, F, Br, I, $N(R^1)_2$, CN, $Si(R^1)_3$, $B(OR^1)_2$, $C({=}O)R^1$, a straight-chain alkyl group having 1 to 10 carbon atoms or an alkenyl group having 2 to 10 carbon atoms or a branched or cyclic alkyl group having 3 to 10 carbon atoms, where the alkyl or alkenyl group may be substituted in each case by one or more $R^1$ radicals, or a phenyl group which may be substituted by one or more nonaromatic $R^1$ radicals, or a heteroaryl group which has 5 or 6 aromatic ring atoms and may be substituted by one or more nonaromatic $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or a phenyl group which may be substituted by one or more nonaromatic $R^1$ radicals, or a heteroaryl group which has 6 aromatic ring atoms and may be substituted by one or more nonaromatic $R^1$ radicals; at the same time, two adjacent R radicals together or R together with $R^1$ may also form a mono- or polycyclic, aliphatic or aromatic ring system.

Preferred $R^1$ radicals bonded to R are the same or different at each instance and are H, D, F, $N(R^2)_2$, CN, a straight-chain alkyl group having 1 to 10 carbon atoms or an alkenyl group having 2 to 10 carbon atoms or a branched or cyclic alkyl group having 3 to 10 carbon atoms, where the alkyl group may be substituted in each case by one or more $R^2$ radicals, or a phenyl group which may be substituted by one or more $R^2$ radicals, or a heteroaryl group which has 5 or 6 aromatic ring atoms and may be substituted by one or more $R^2$ radicals; at the same time, two or more adjacent $R^1$ radicals together may form a mono- or polycyclic aliphatic ring system. Particularly preferred $R^1$ radicals bonded to R are the same or different at each instance and are H, F, CN, a straight-chain alkyl group having 1 to 5 carbon atoms or a branched or cyclic alkyl group having 3 to 5 carbon atoms, each of which may be substituted by one or more $R^2$ radicals, or a phenyl group which may be substituted by one or more $R^2$ radicals, or a heteroaryl group which has 5 or 6 aromatic ring atoms and may be substituted by one or more $R^2$ radicals; at the same time, two or more adjacent $R^1$ radicals together may form a mono- or polycyclic aliphatic ring system.

Preferred $R^2$ radicals are the same or different at each instance and are H, F or an aliphatic hydrocarbyl radical having 1 to 5 carbon atoms or an aromatic hydrocarbyl radical having 6 to 12 carbon atoms; at the same time, two or more $R^2$ substituents together may also form a mono- or polycyclic aliphatic ring system.

The abovementioned preferred embodiments are combinable with one another as desired within the limits of claim 1. In a particularly preferred embodiment of the invention, the abovementioned preferred embodiments apply simultaneously.

Examples of suitable structures of the invention are the compounds depicted below.

1

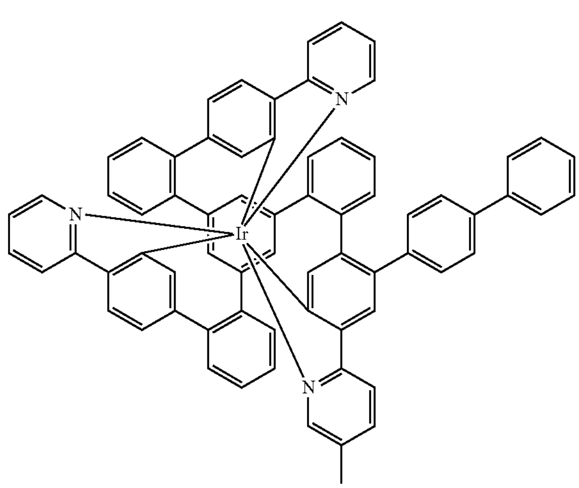

-continued

2

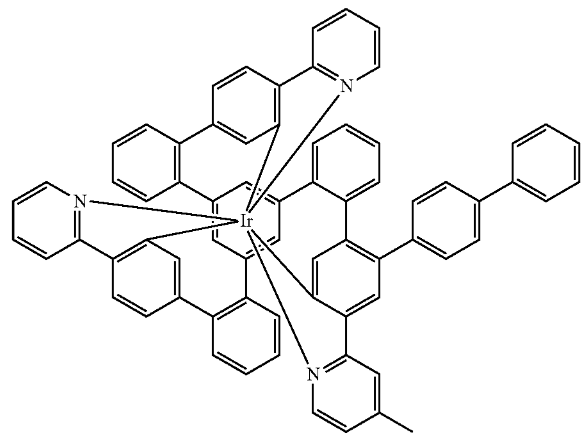

3

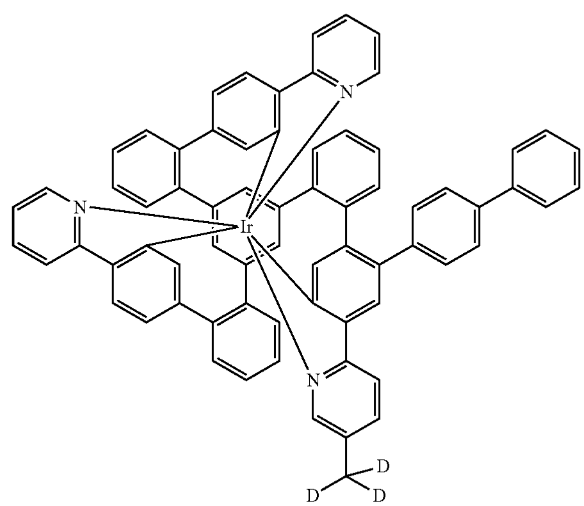

4

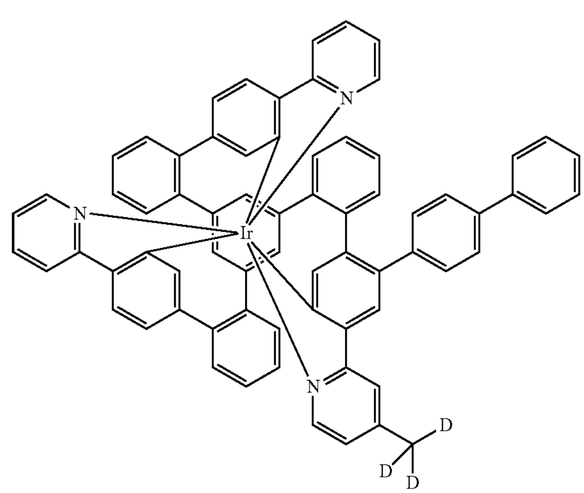

-continued
5
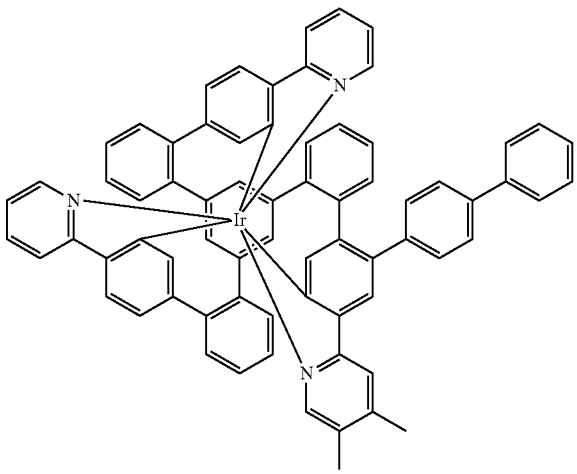
6
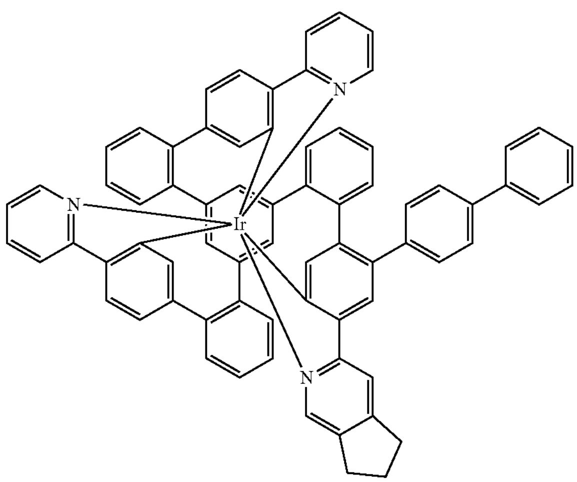
7
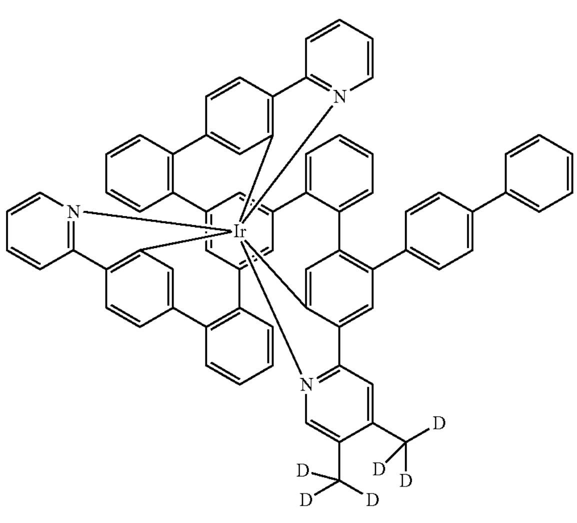
-continued
8
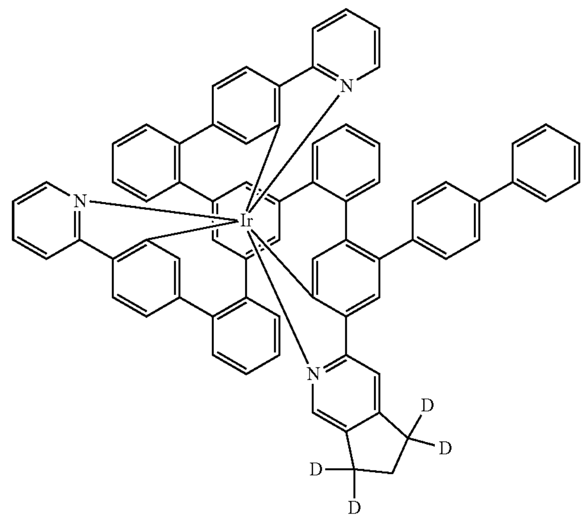
9
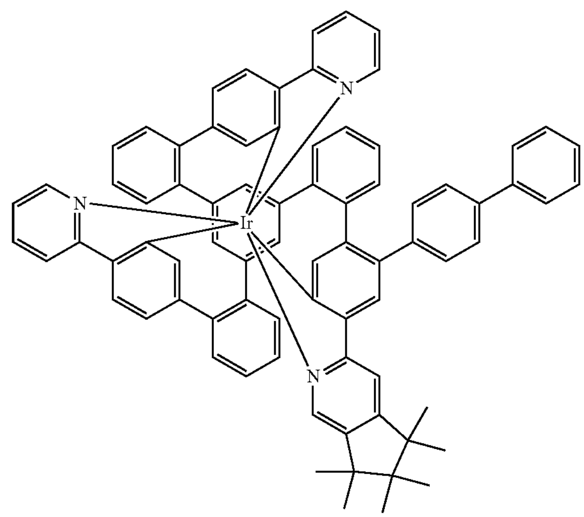
10
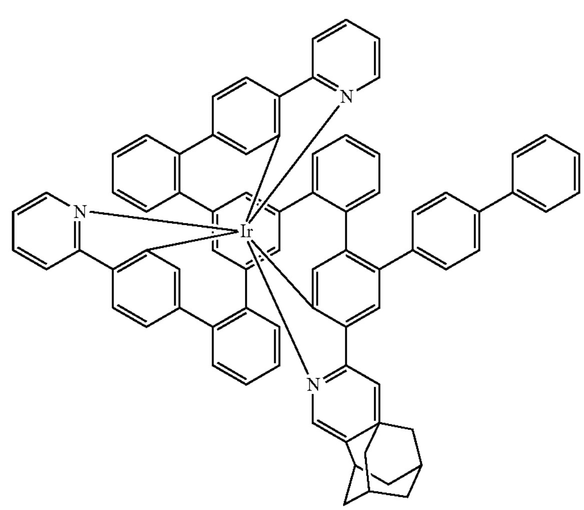

-continued
11
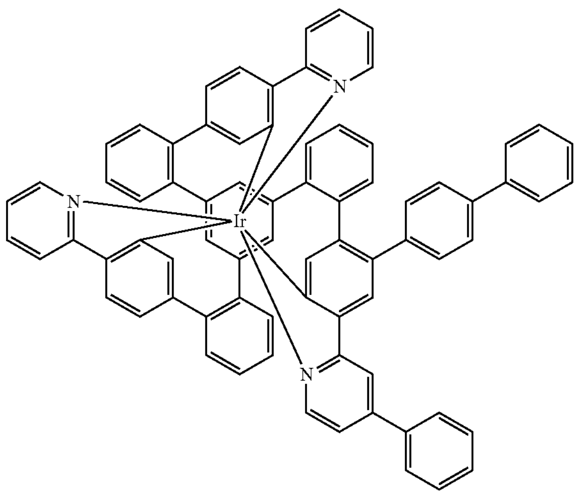
12
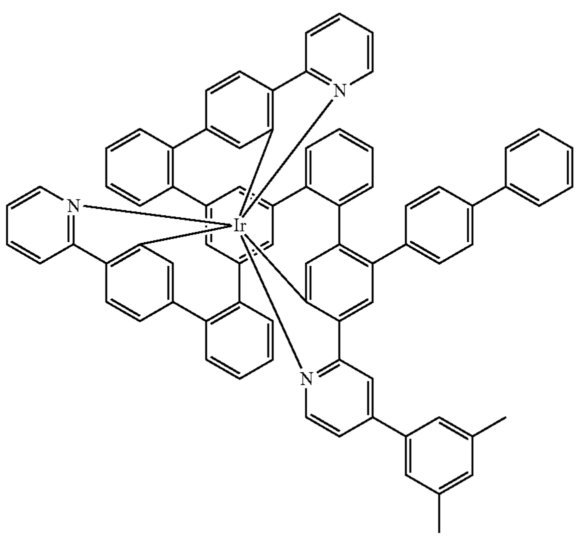
13
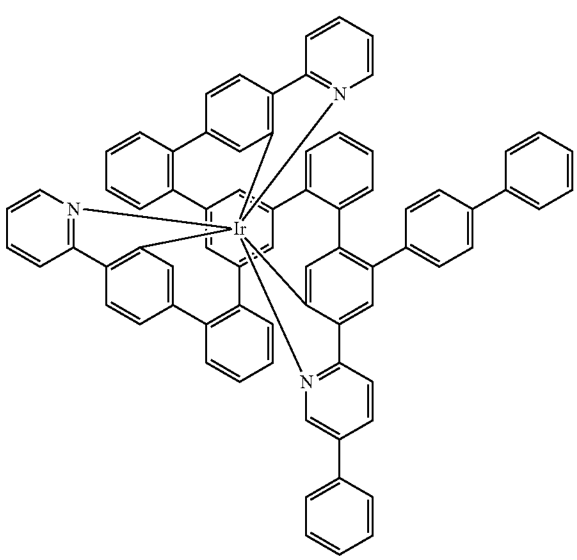
-continued
14
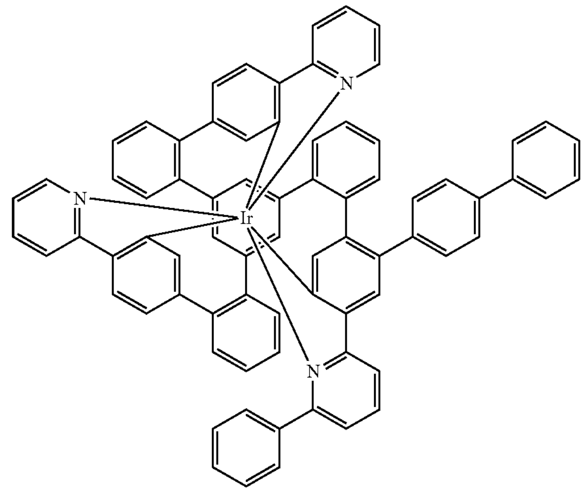
15
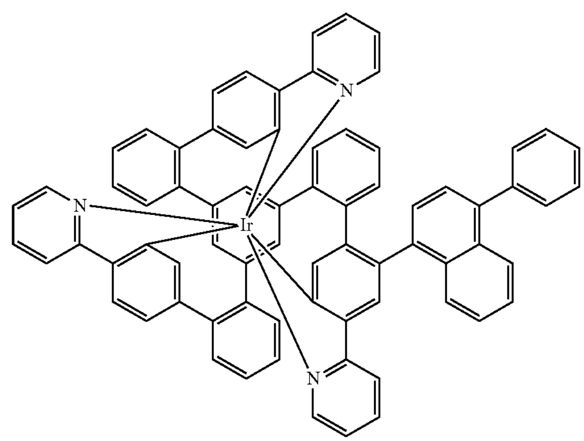
16
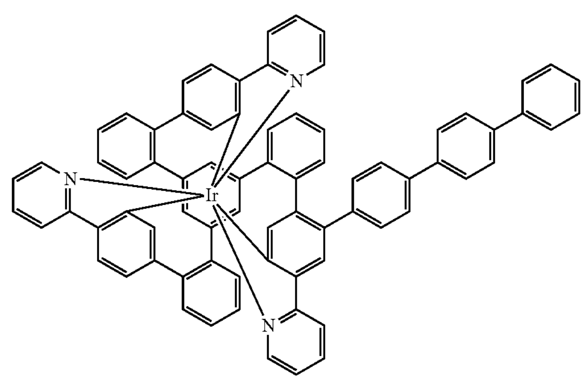

-continued
17
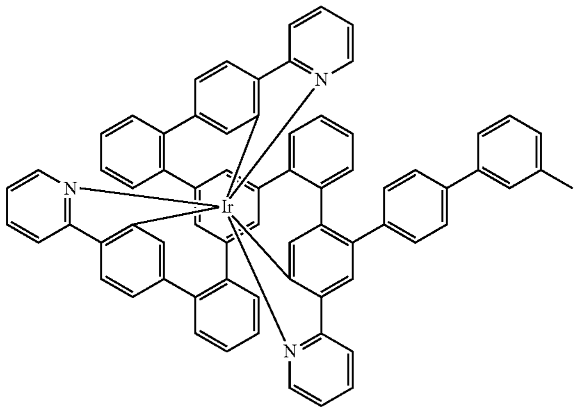
18
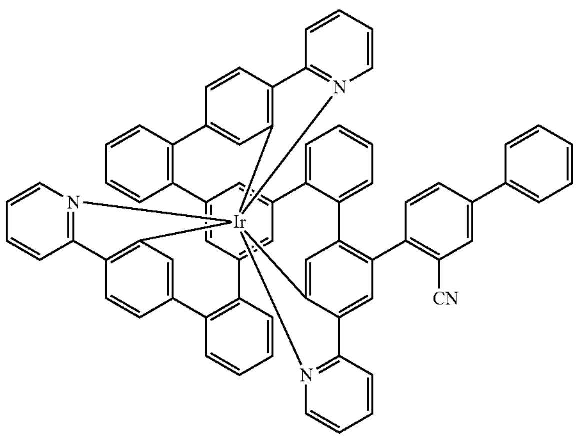
19
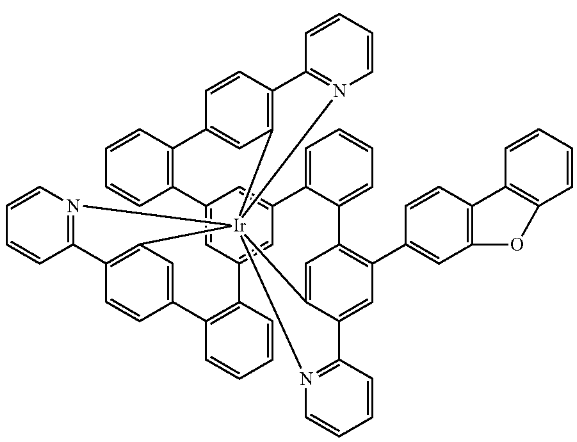
-continued
20
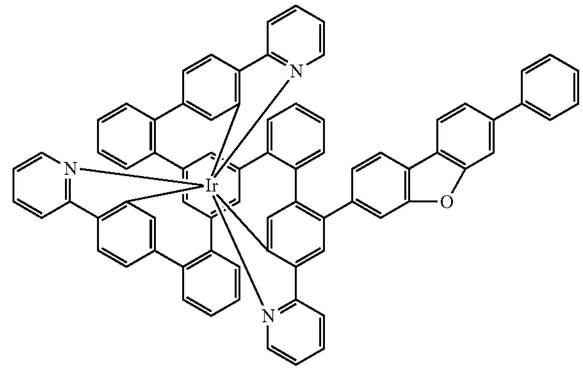
21
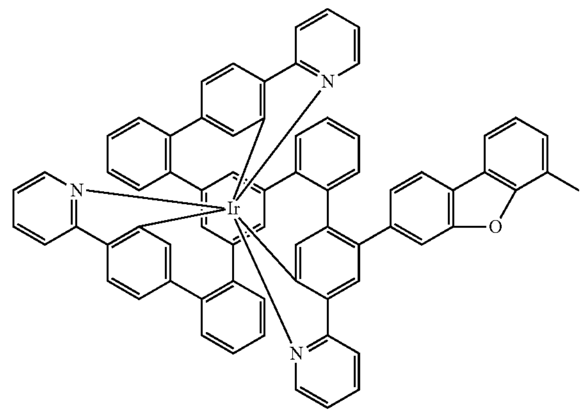
22
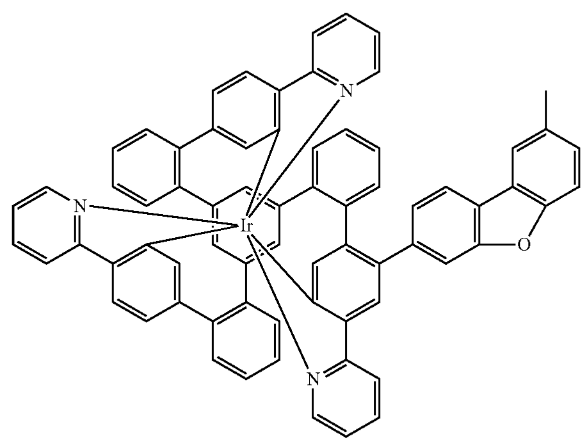

-continued
23
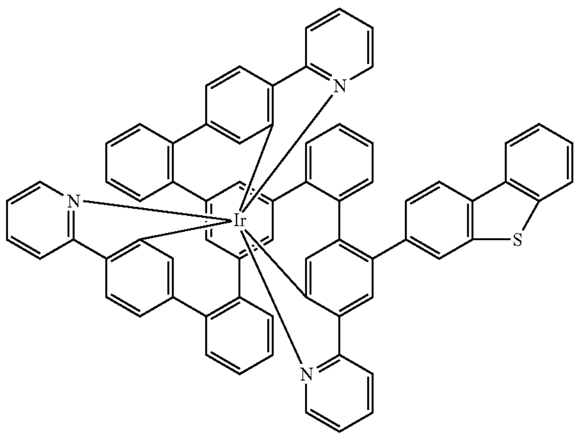
24
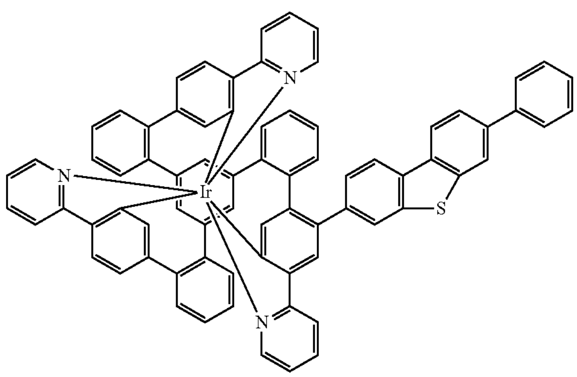
25
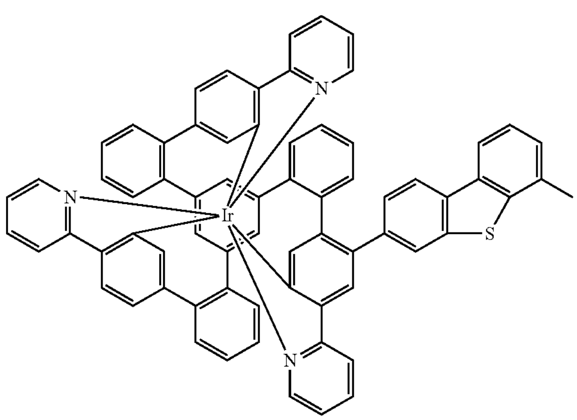
-continued
26
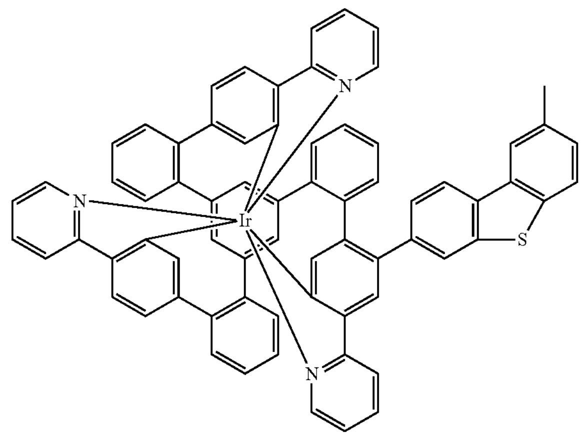
27
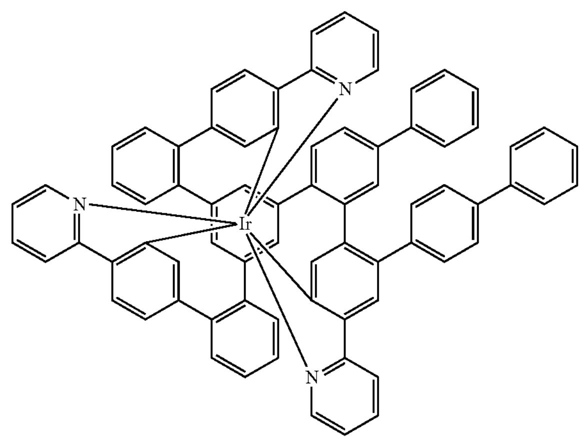
28
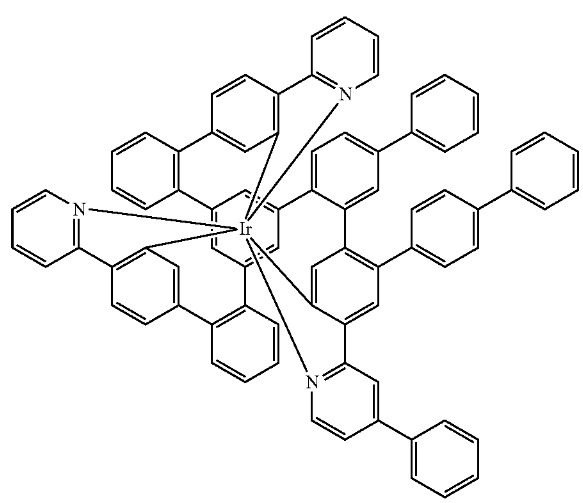

-continued
29
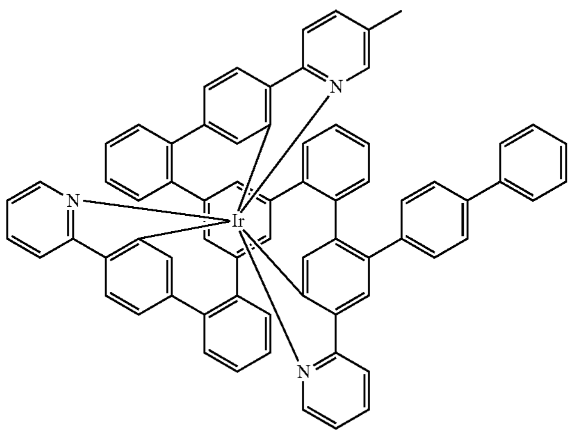
30
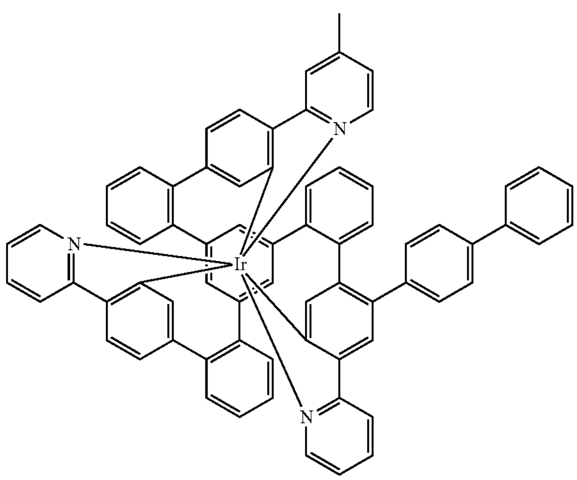
31
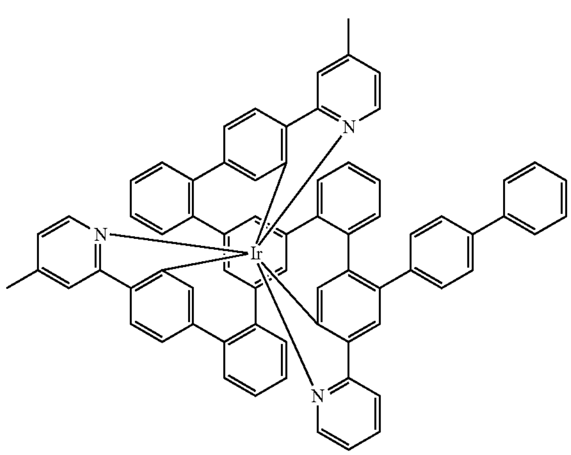
32
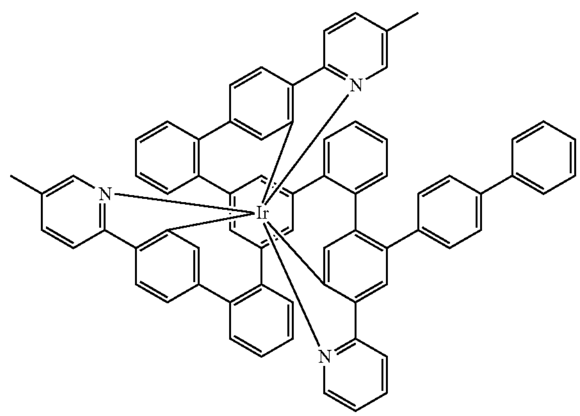
33
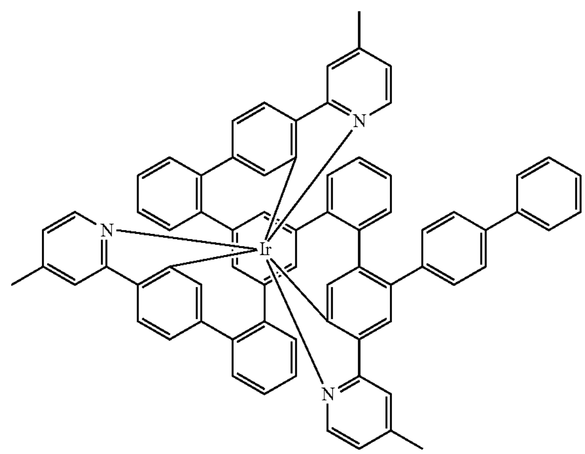
34
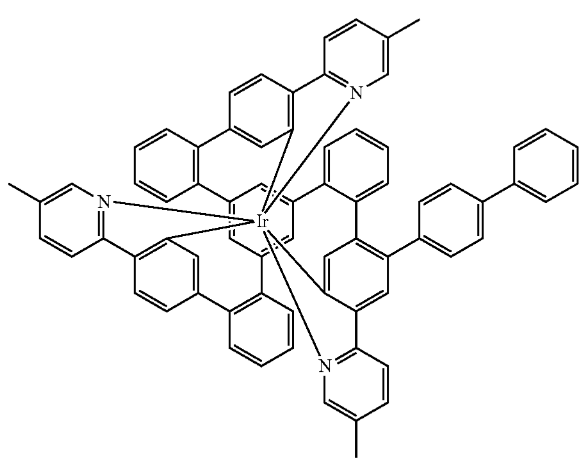

-continued
35
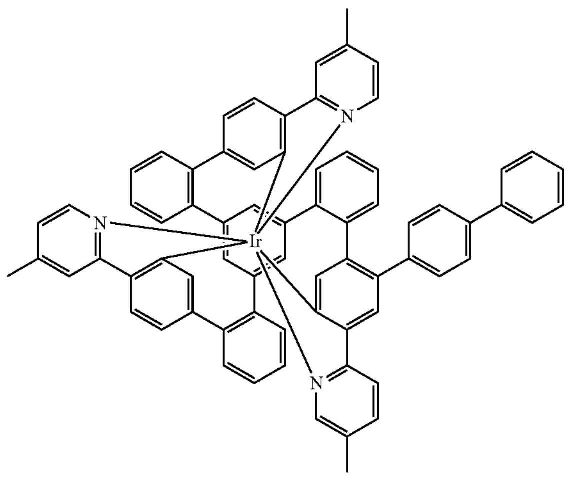
36
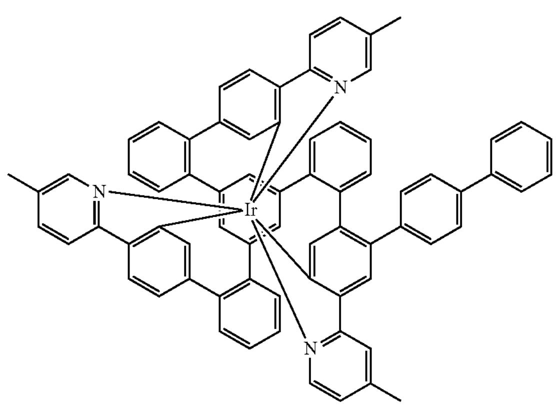
37
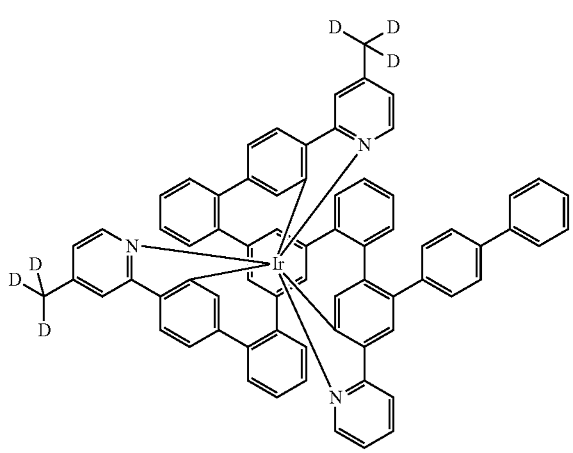
-continued
38
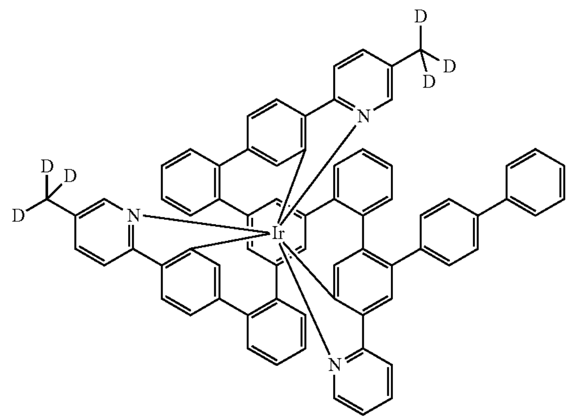
39
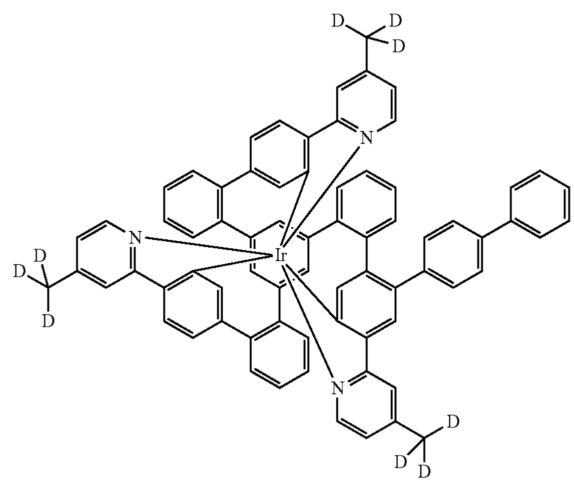
40
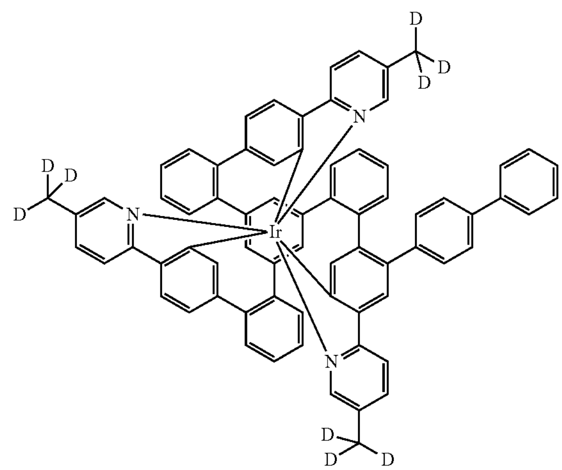

41
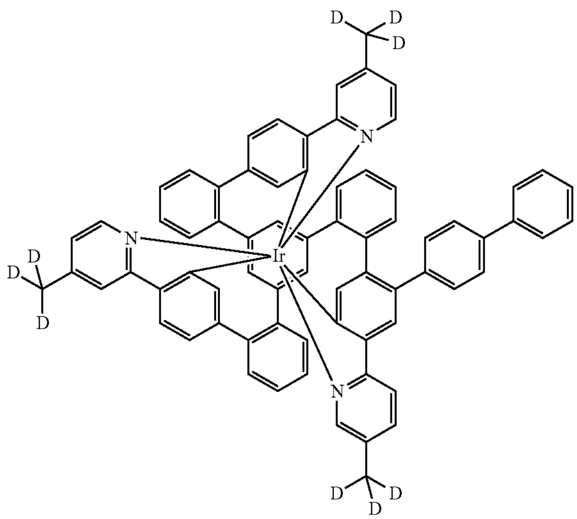
42
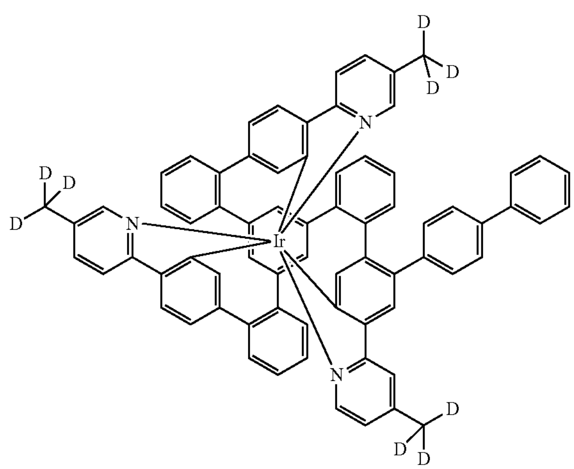
43
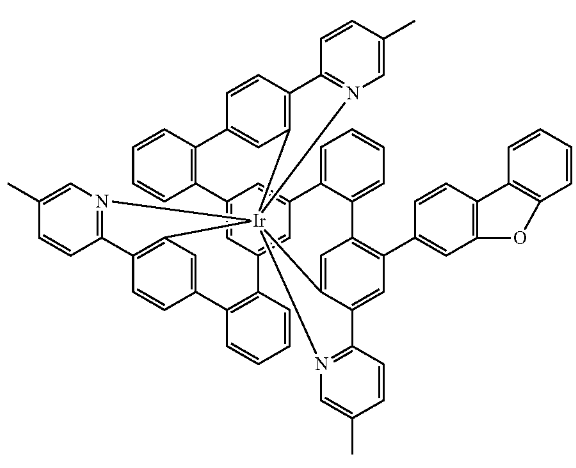
44
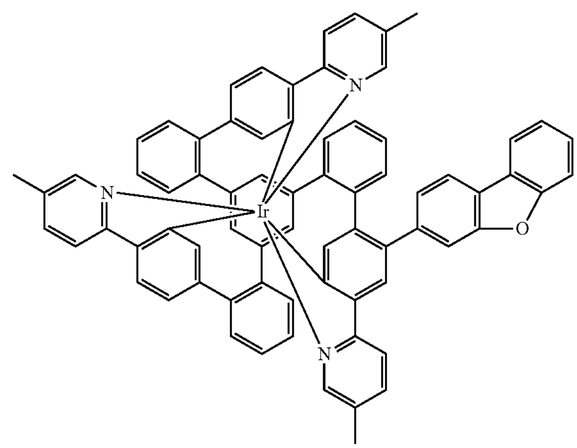
45
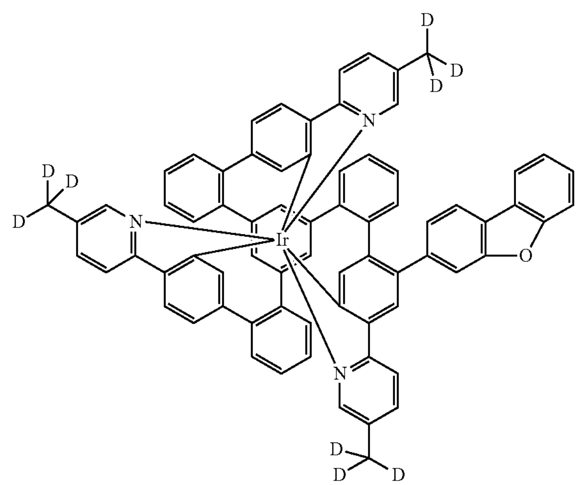
46
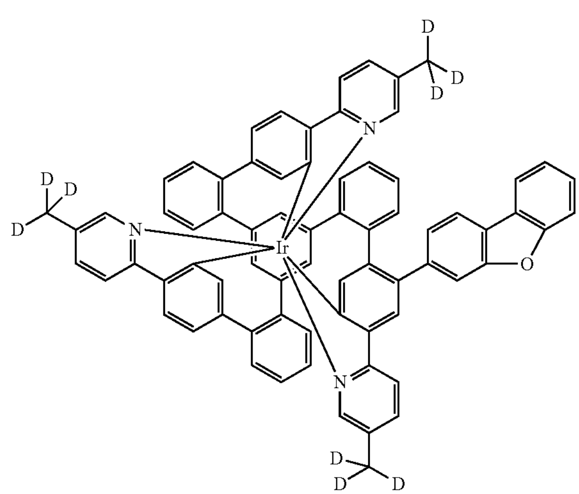

-continued
47
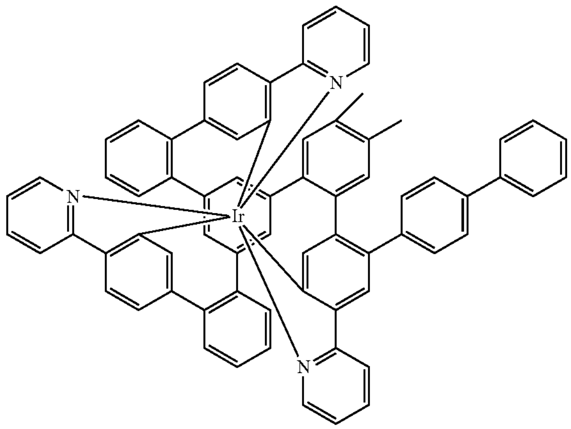
48
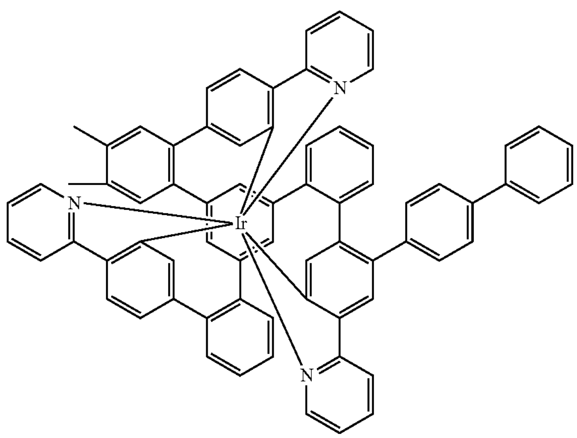
49
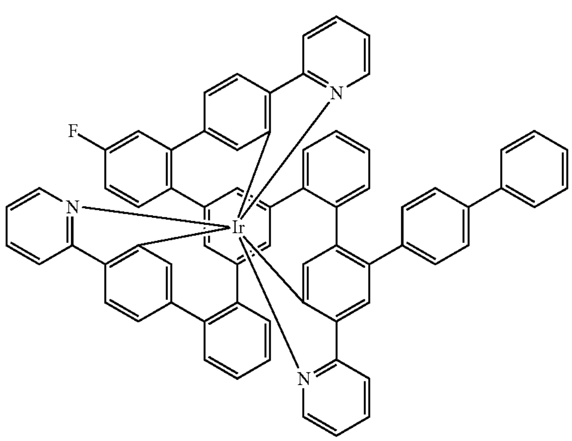
-continued
50
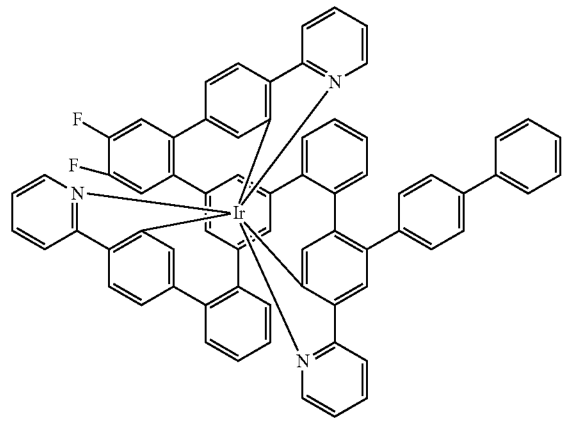
51
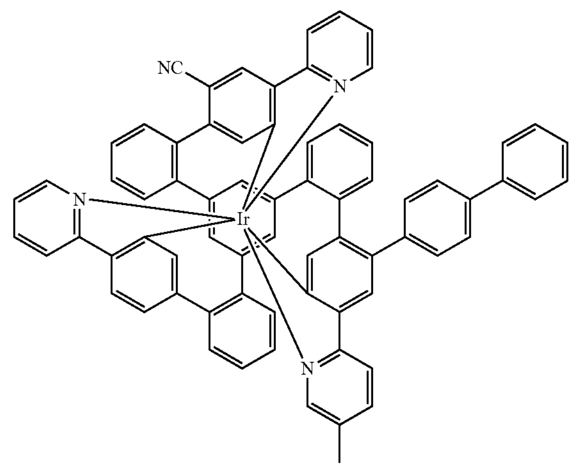
52
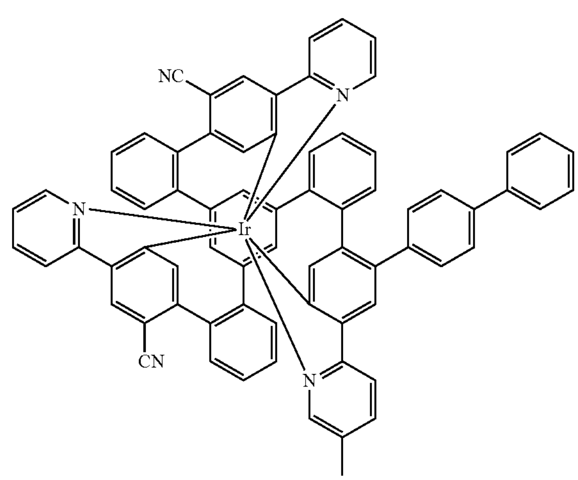

-continued
53
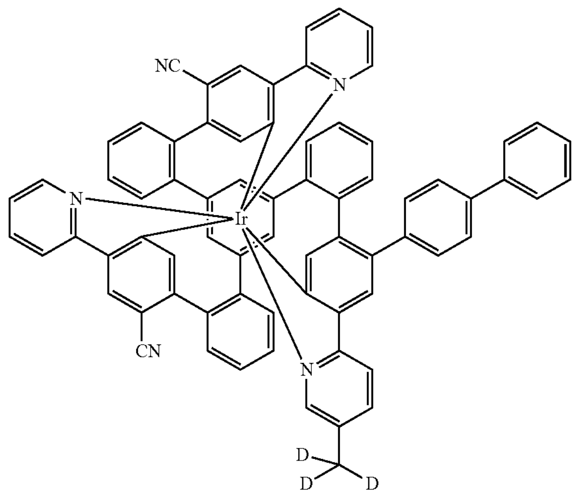
54
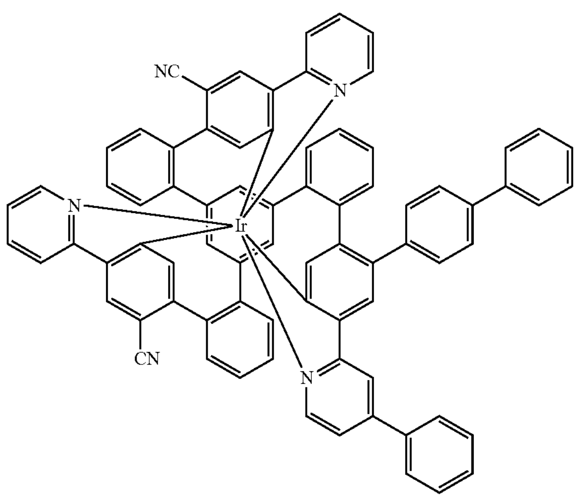
55
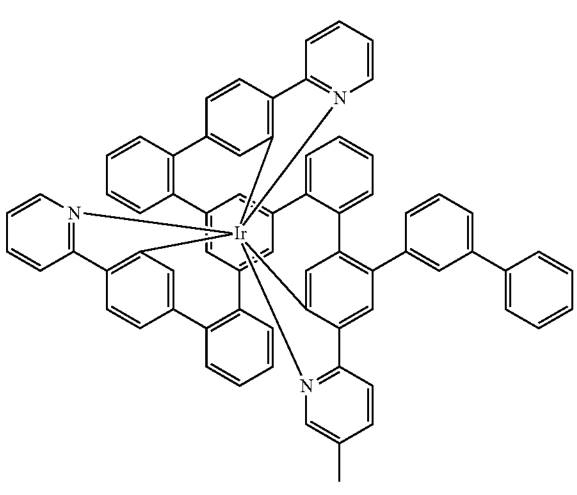
-continued
56
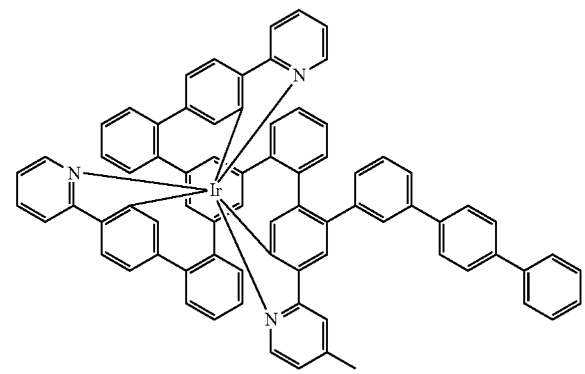
57
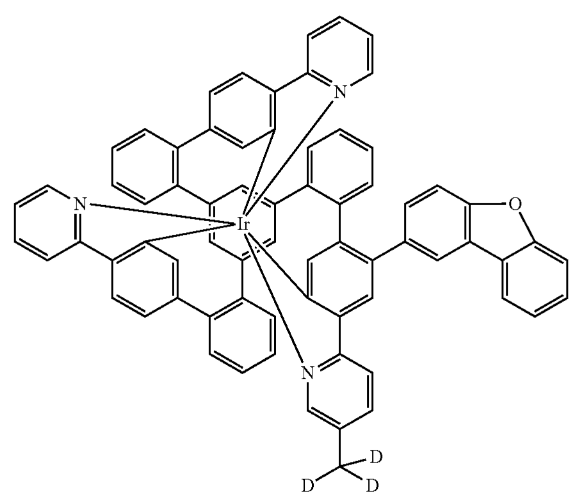
58
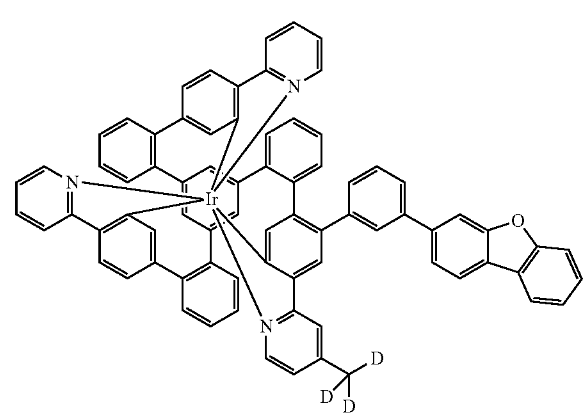

-continued
59
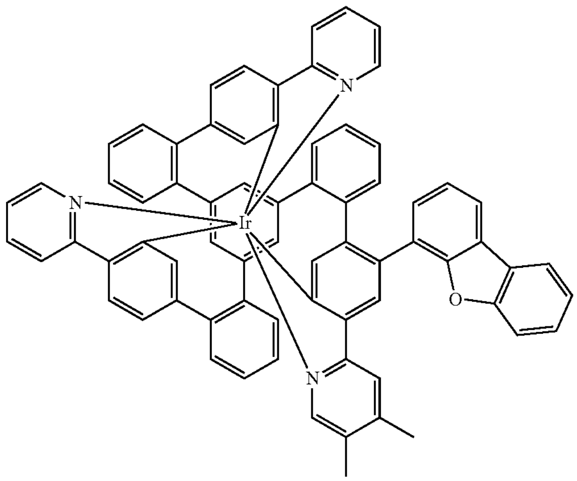
60
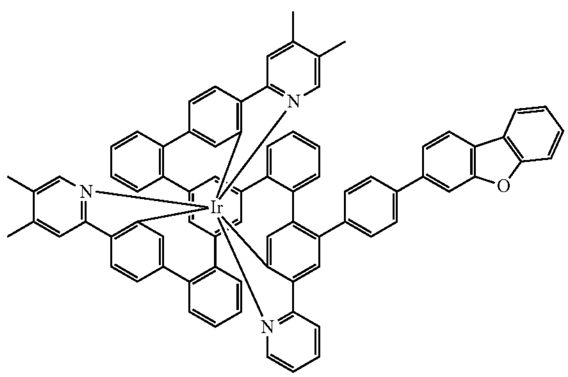
61
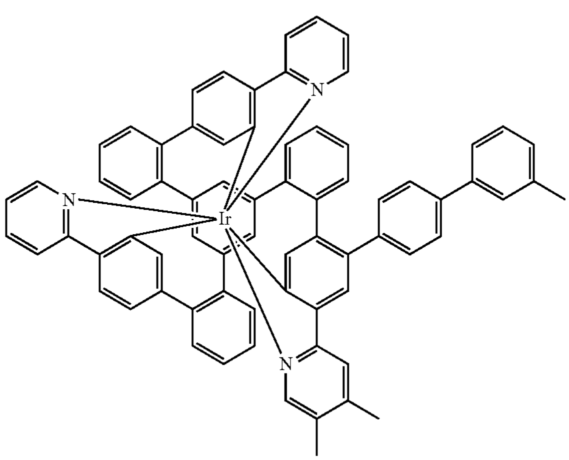
-continued
62
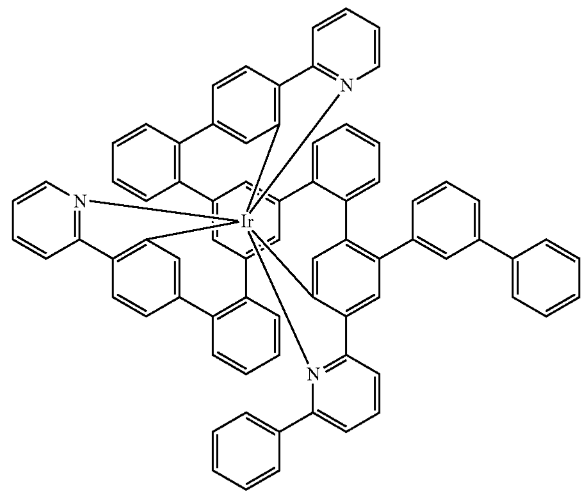
63
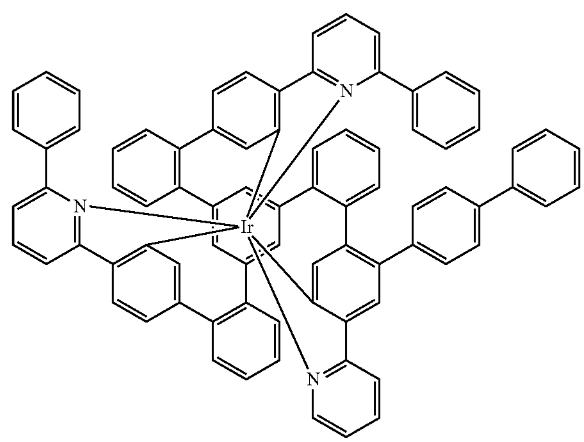
64
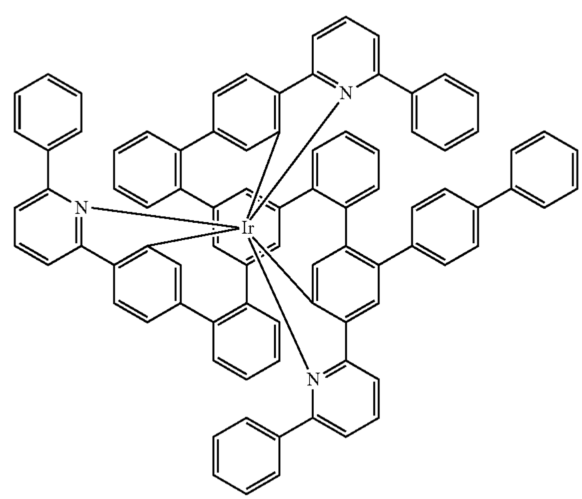

-continued
65
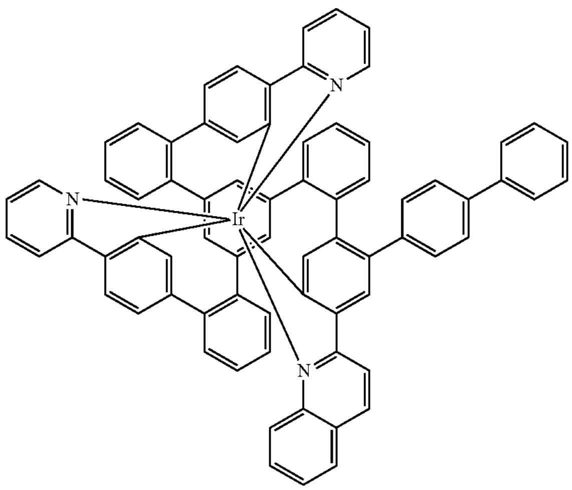
66
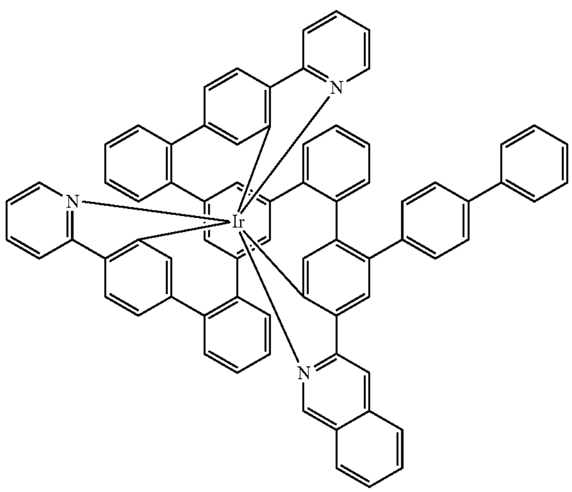
67
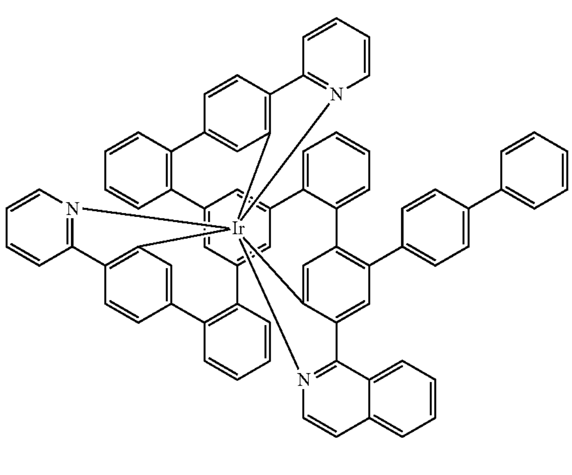
-continued
68
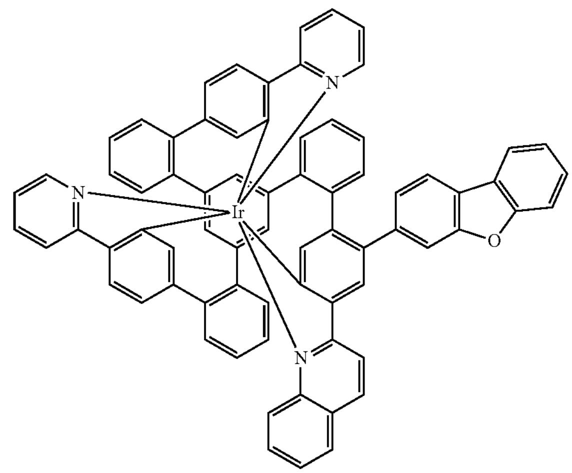
69
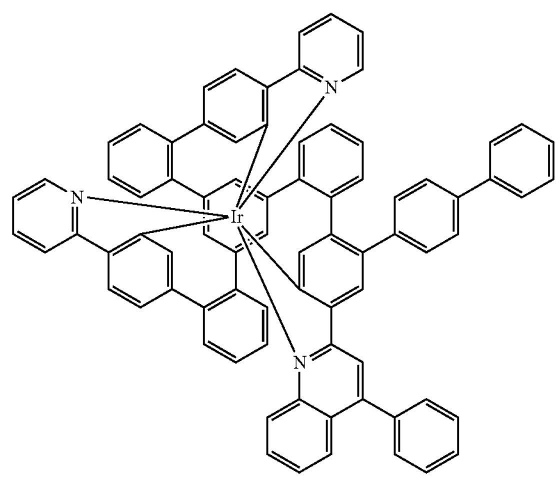
70
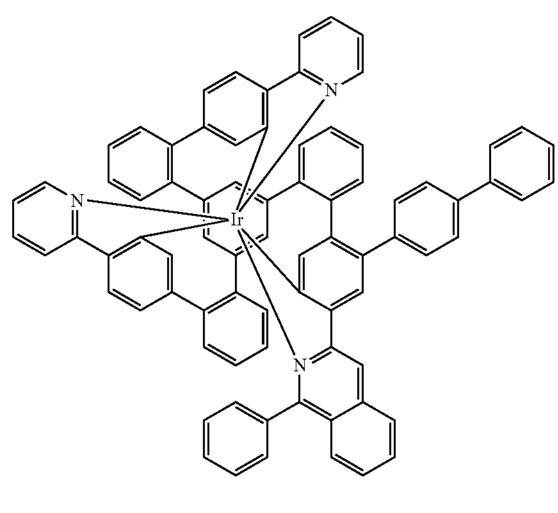

-continued
71
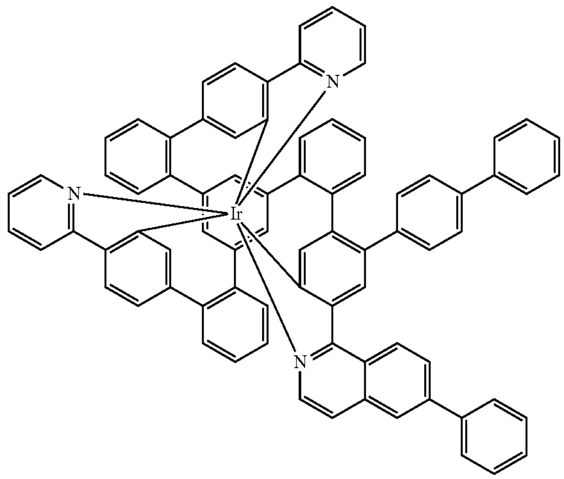
72
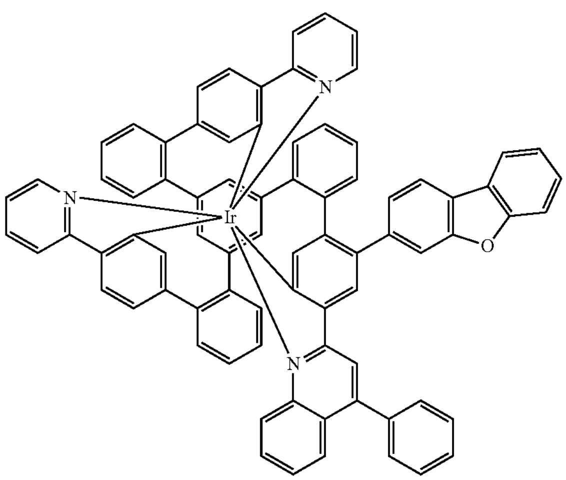
73
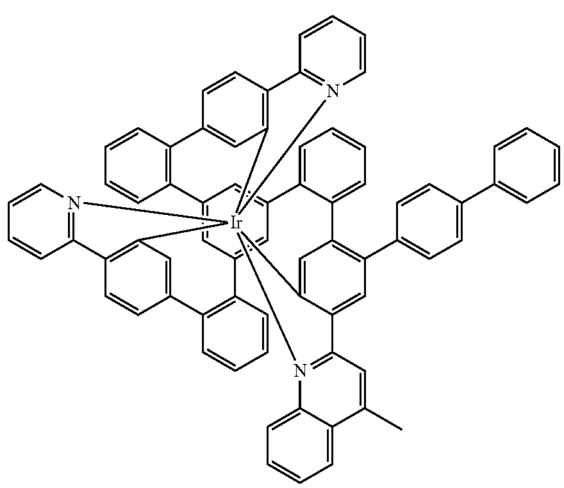
-continued
74
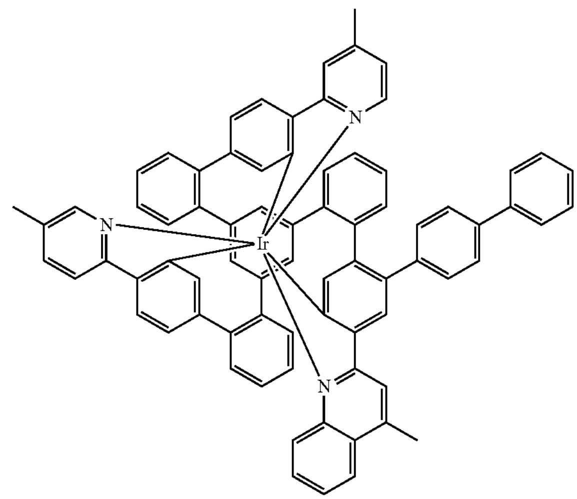
75
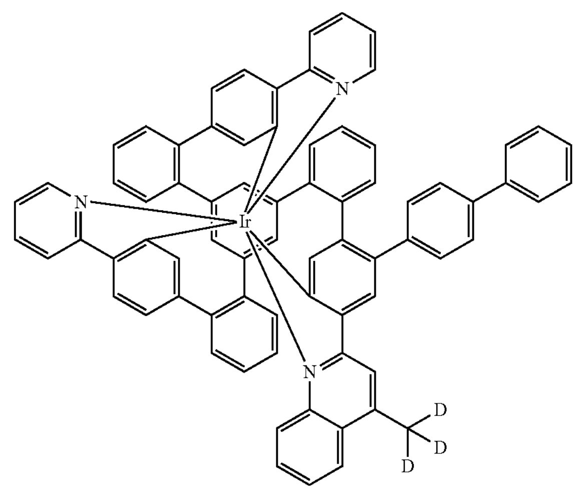
76
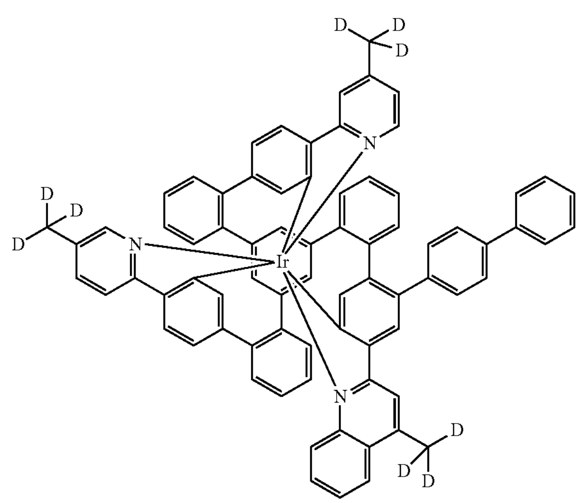

-continued
77
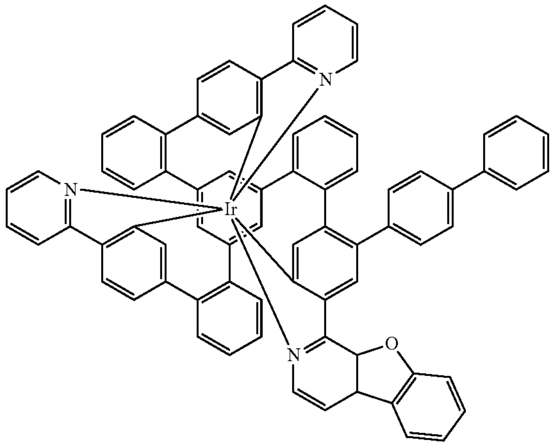
78
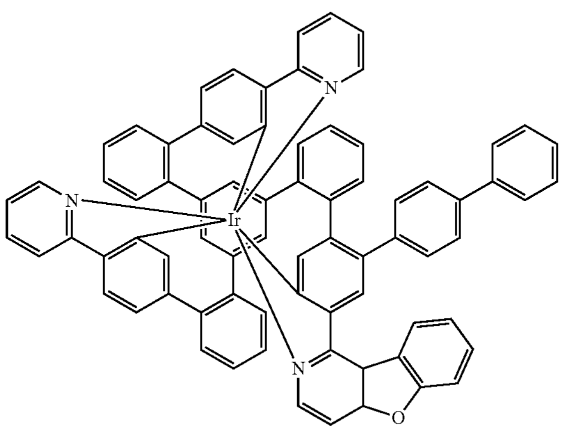
79
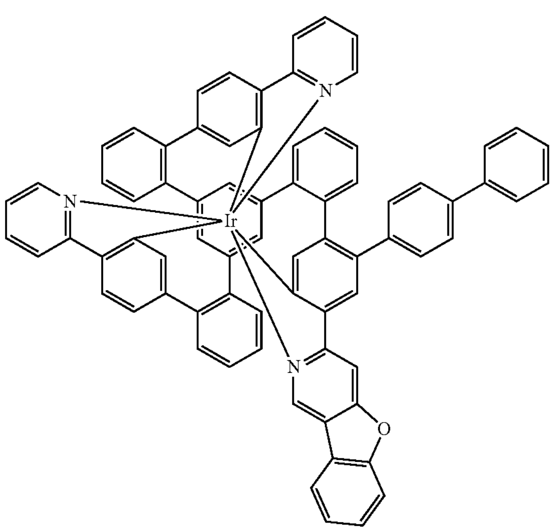
-continued
80
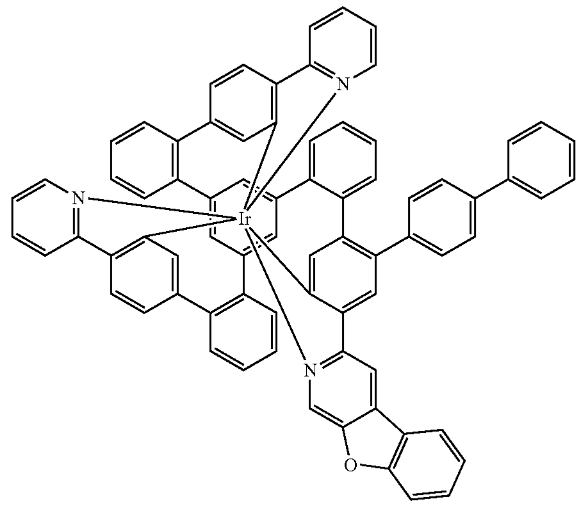
81
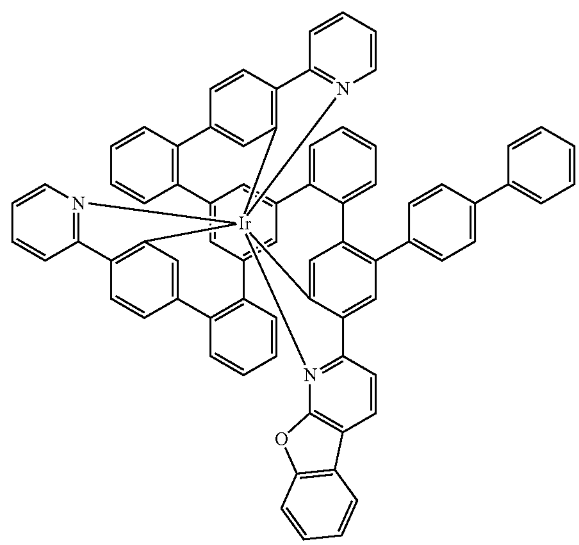
82
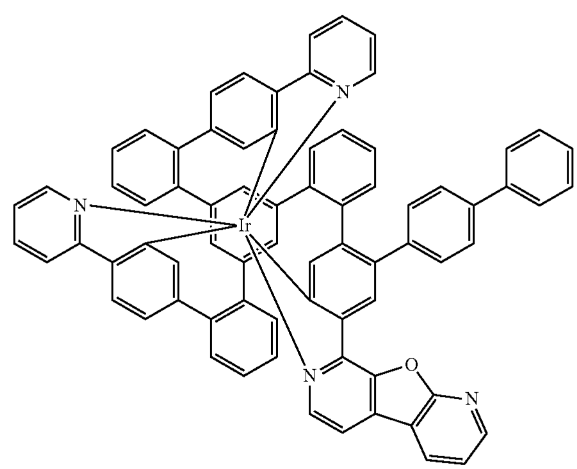

-continued
83
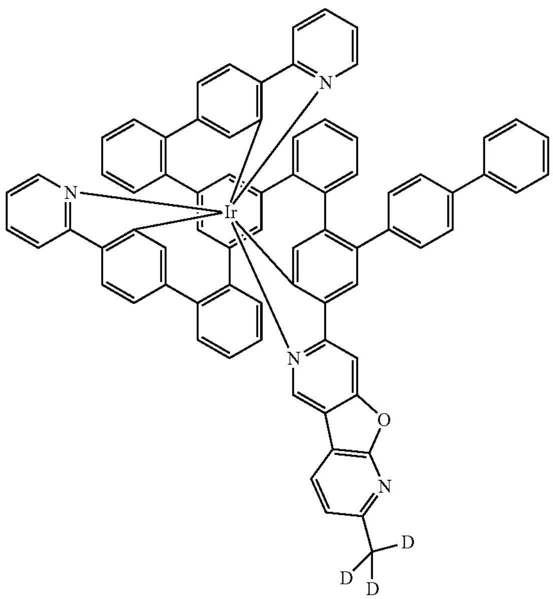
84
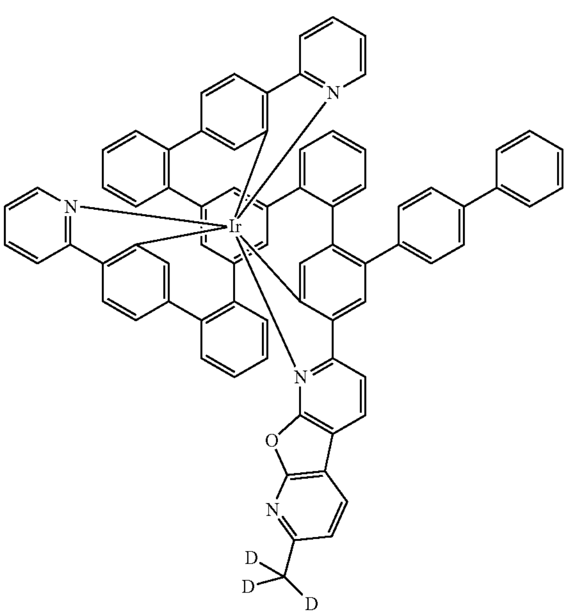
-continued
84
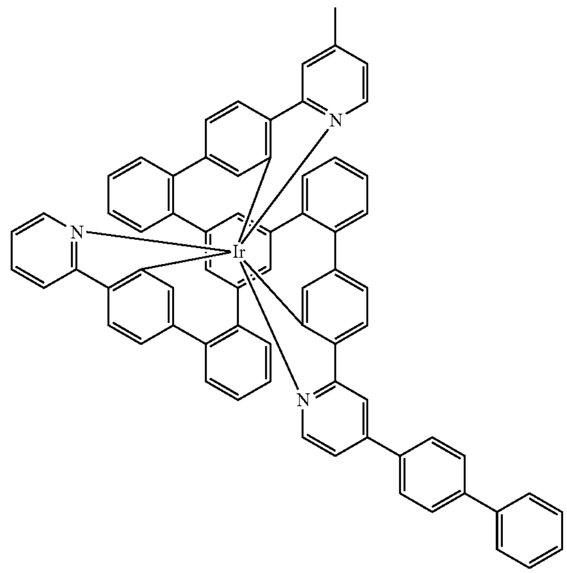
86
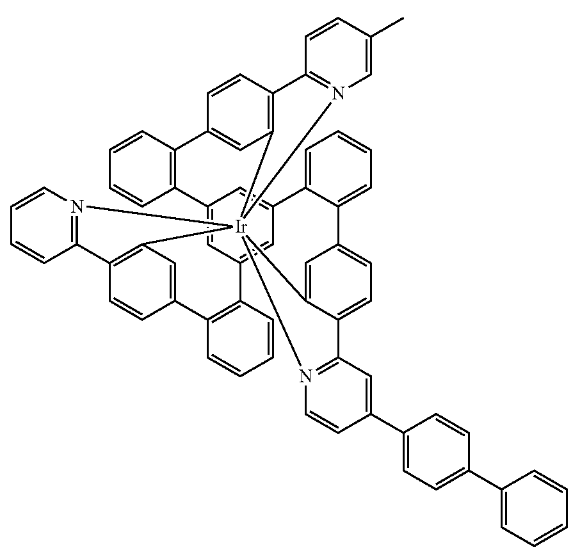

87
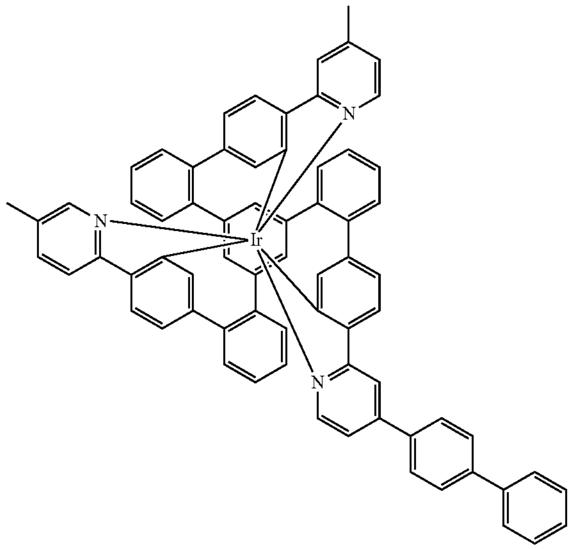
88
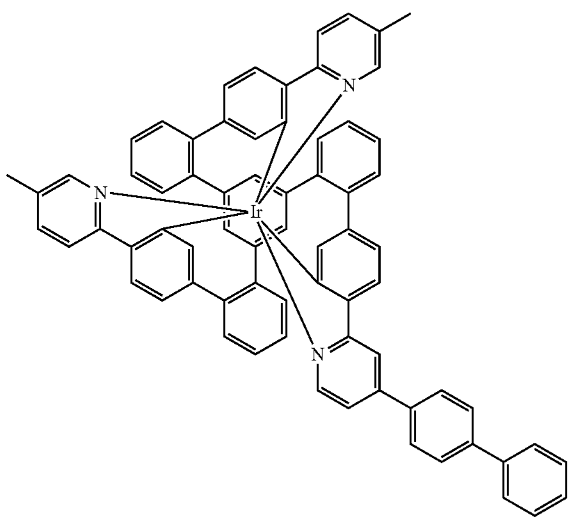
89
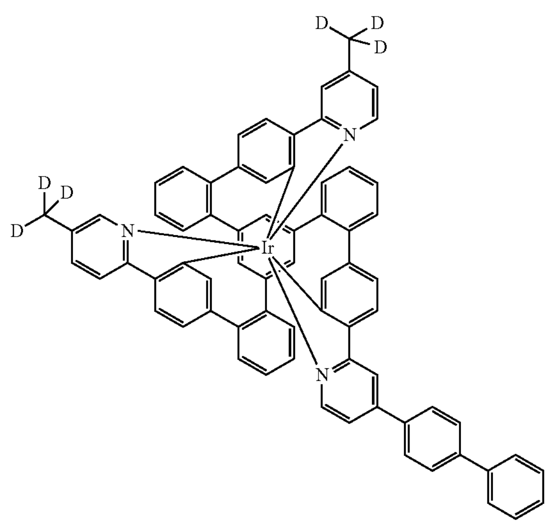
90
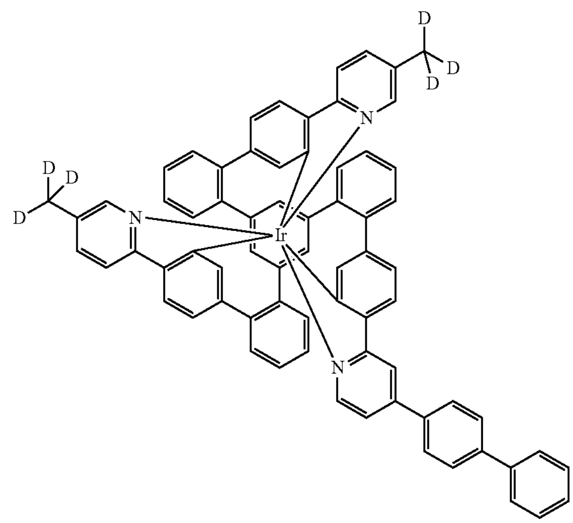
91
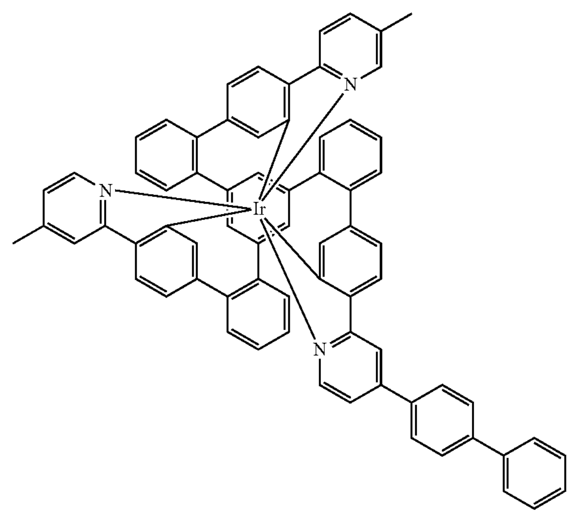
92
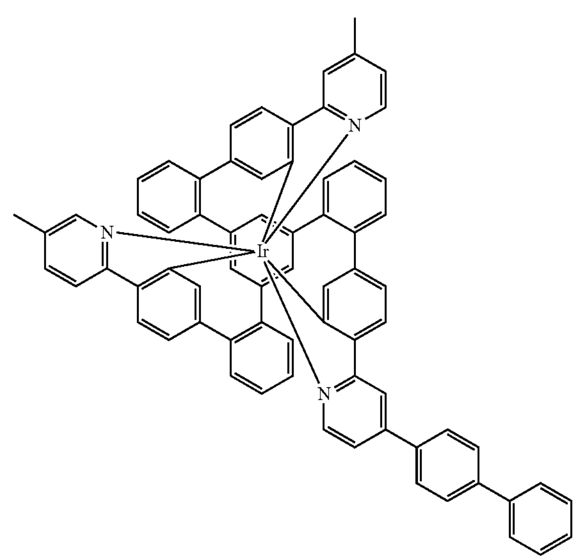

93
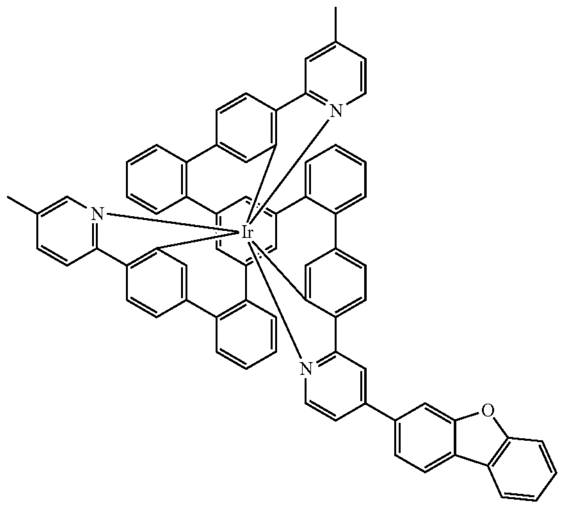
94
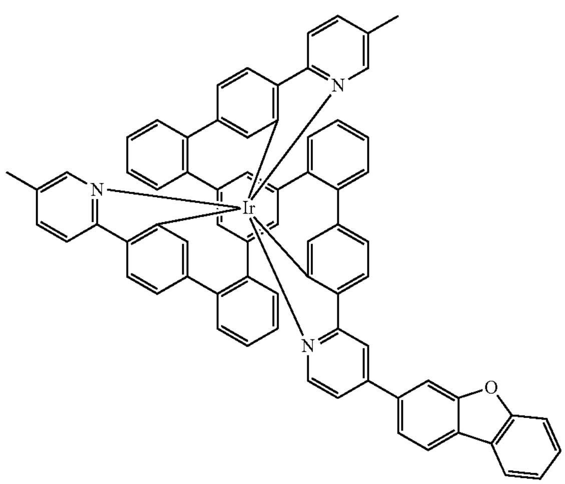
95
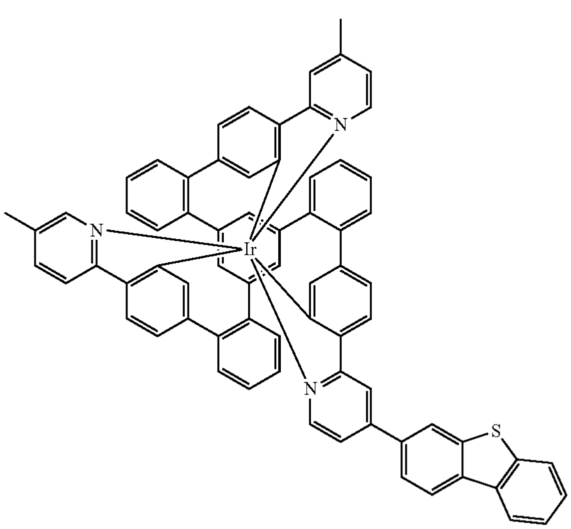
96
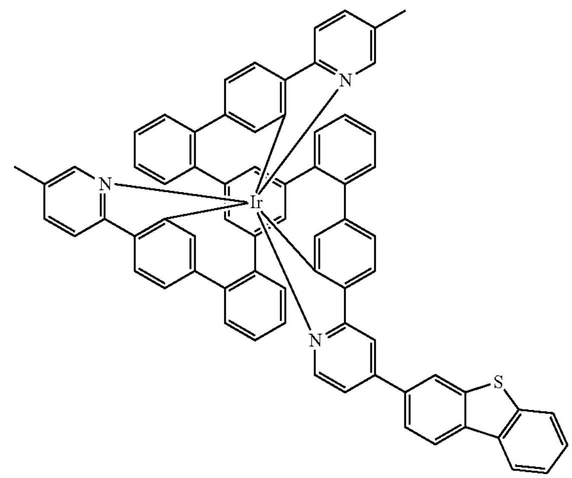
97
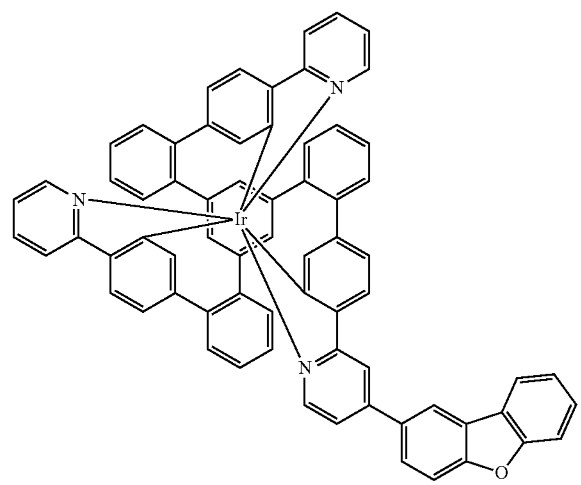
98
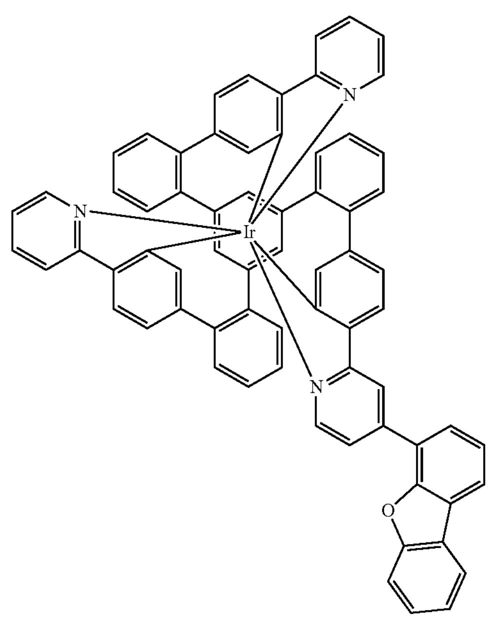

99
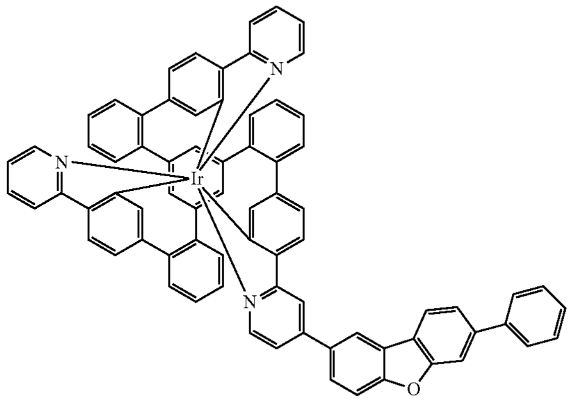
100
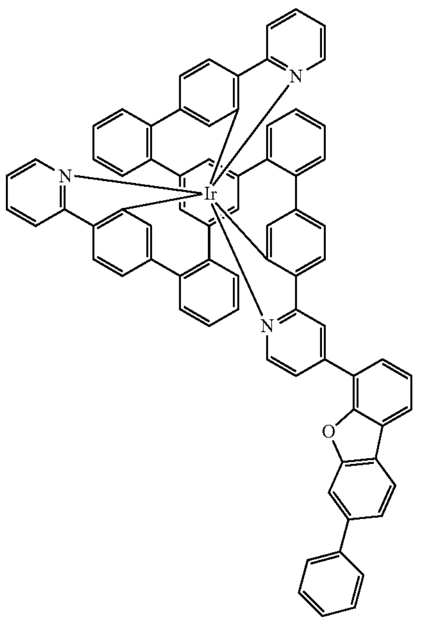
101
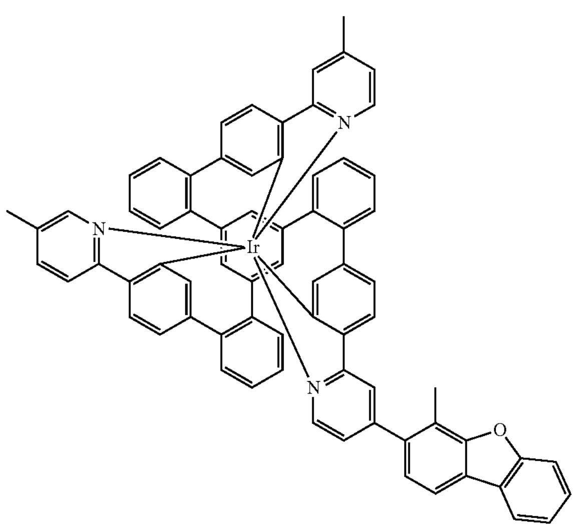
102
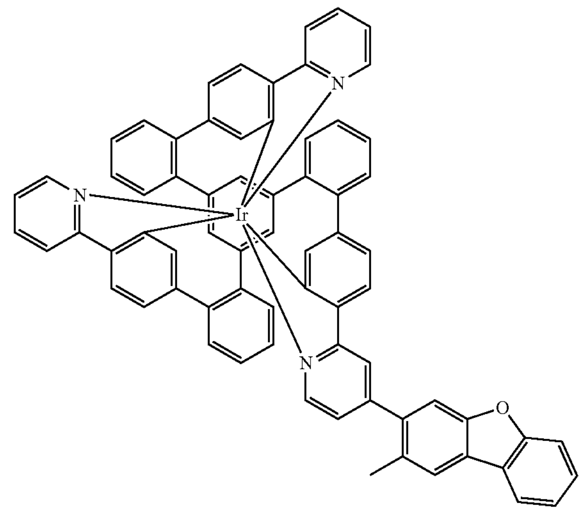
103
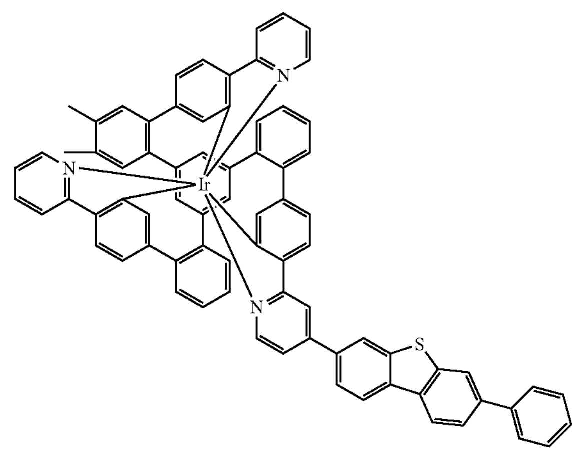
104
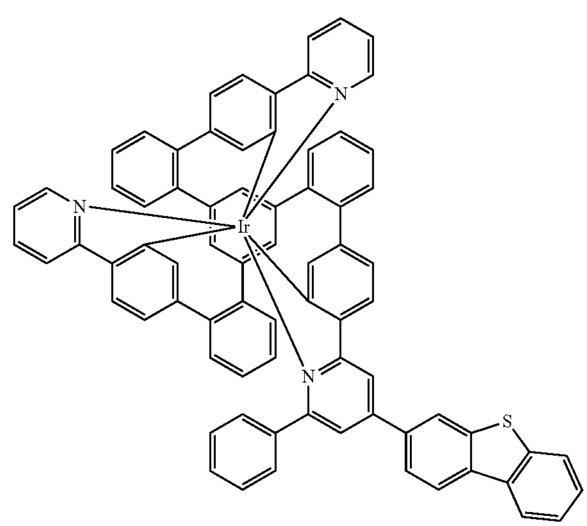

105
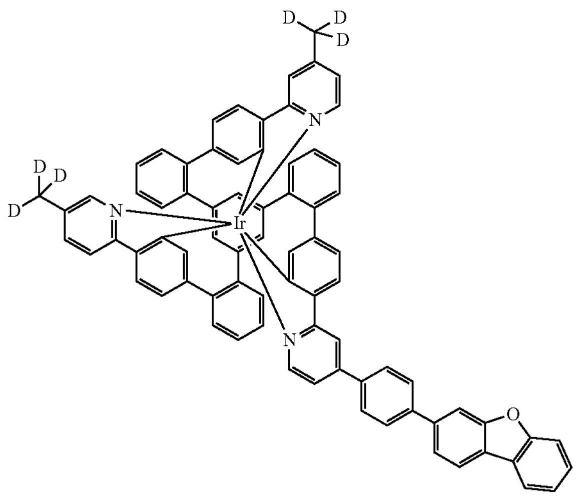
106
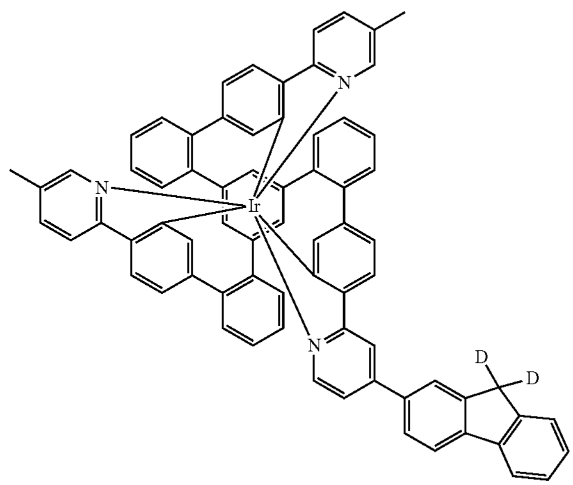
107
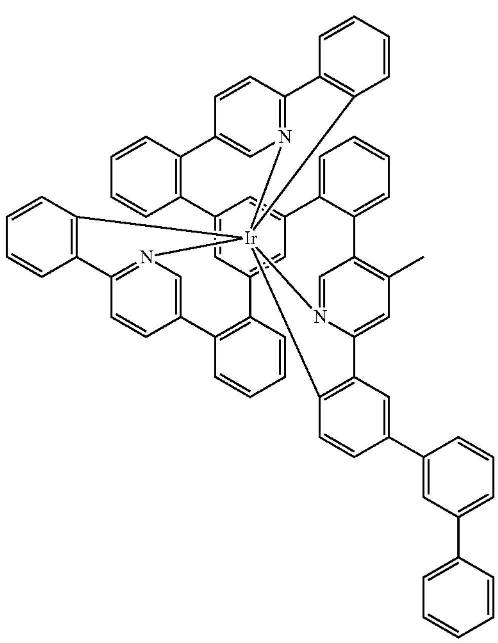
108
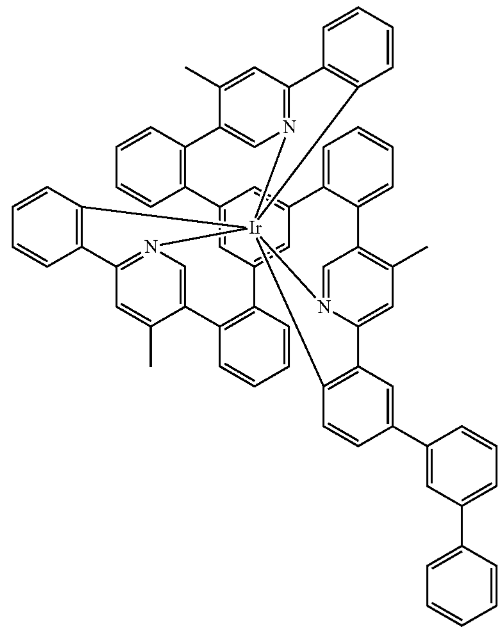
109
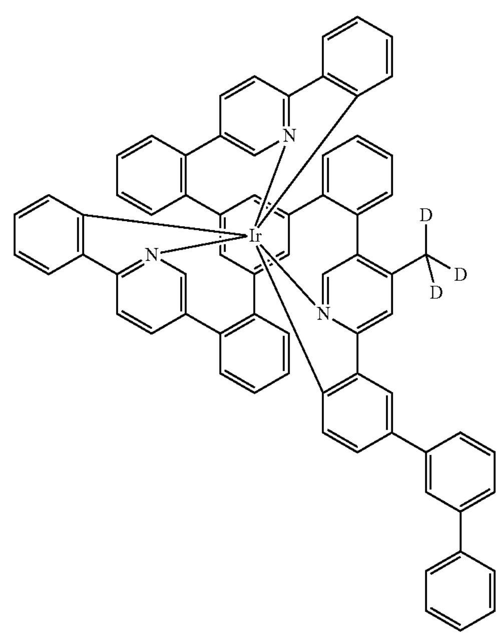

-continued
110
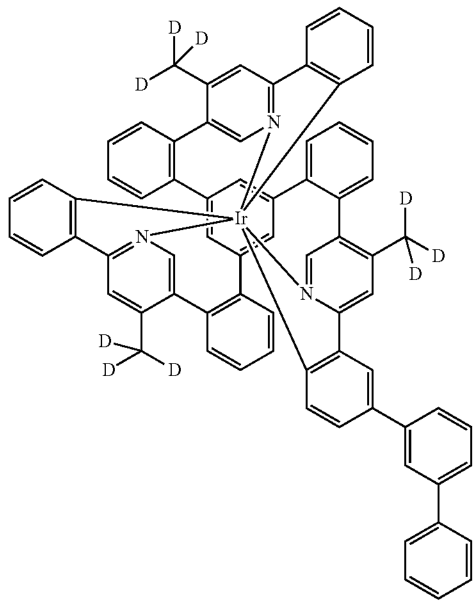
111
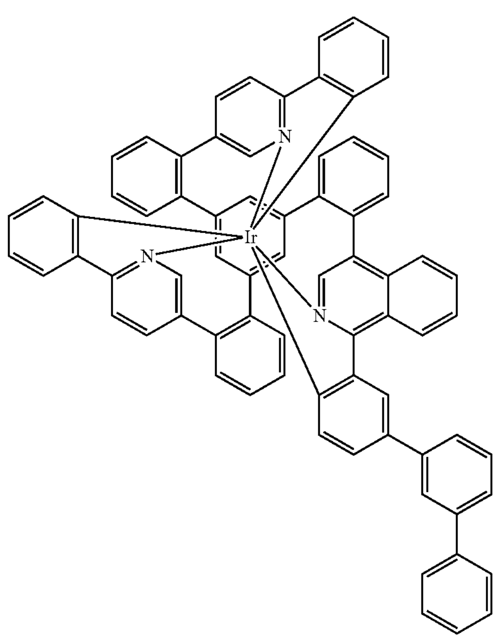
-continued
112
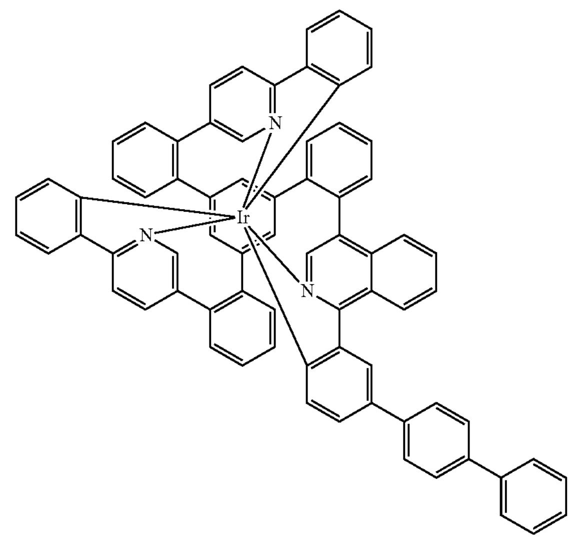
113
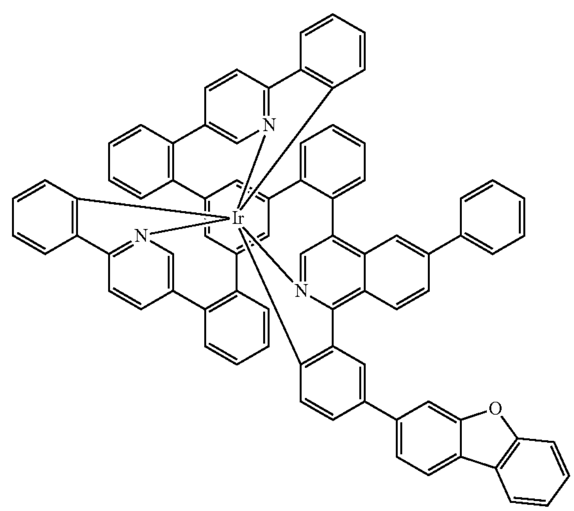
114
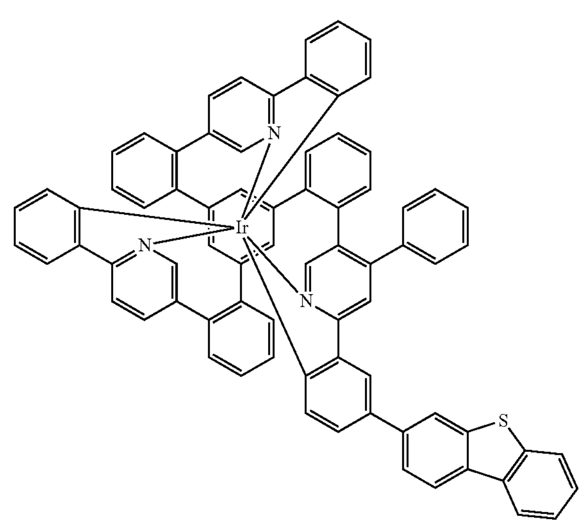

-continued
115
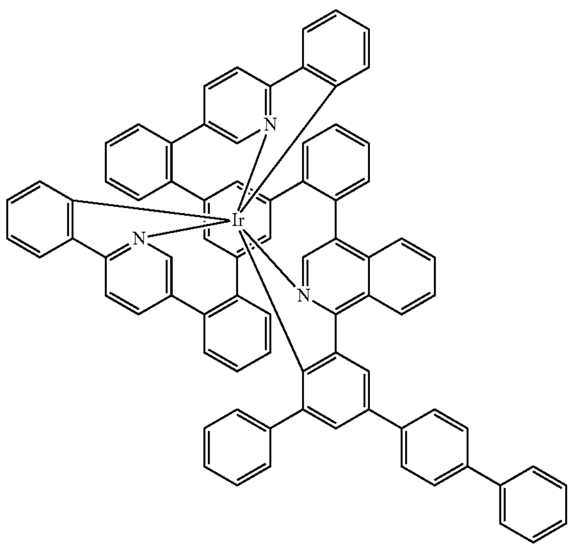
116
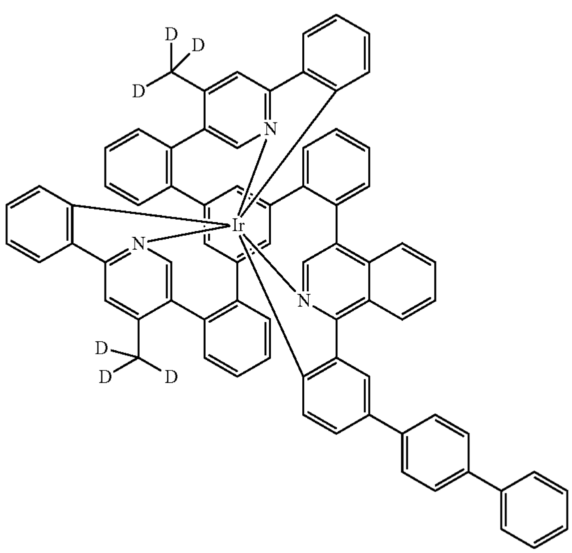
-continued
117
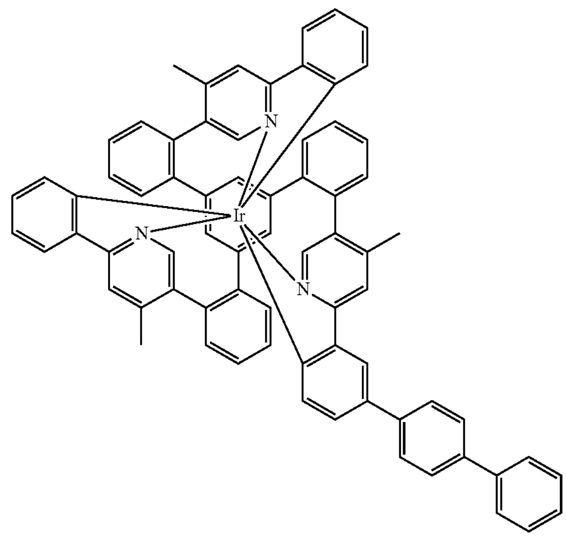
118
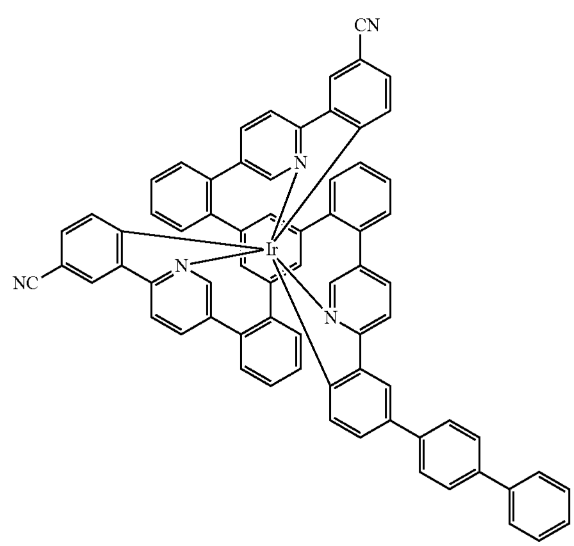

-continued
119
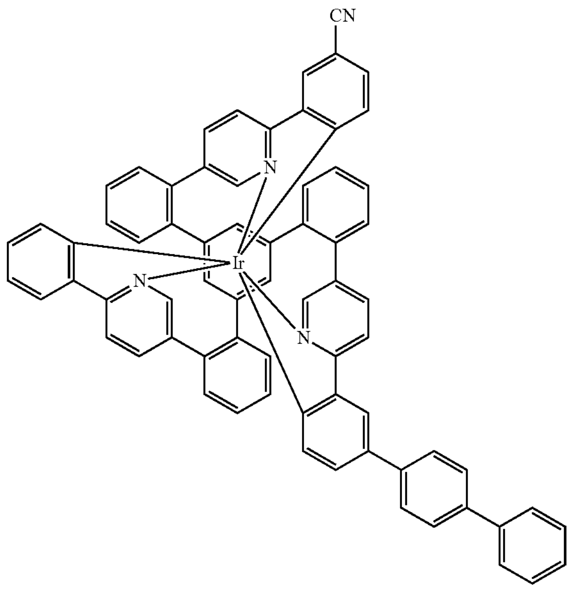
120
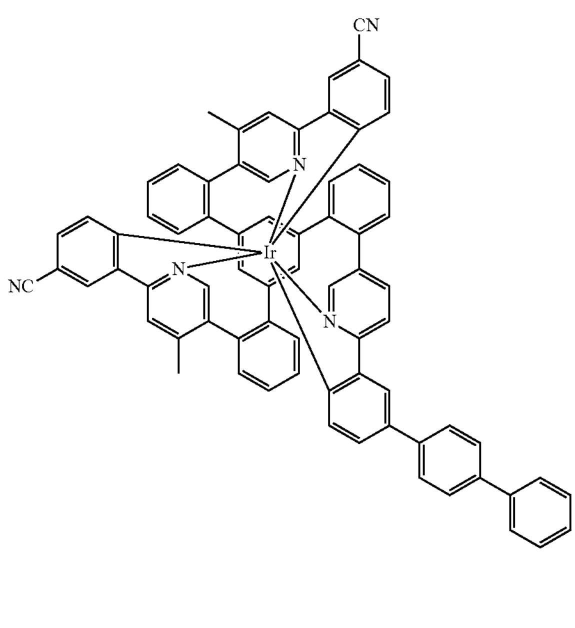
-continued
121
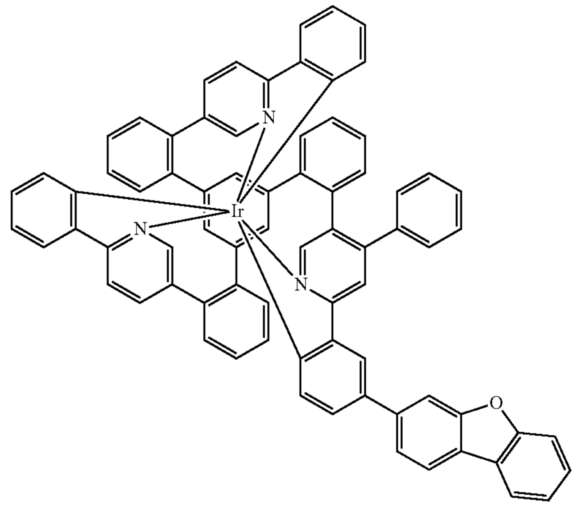
122
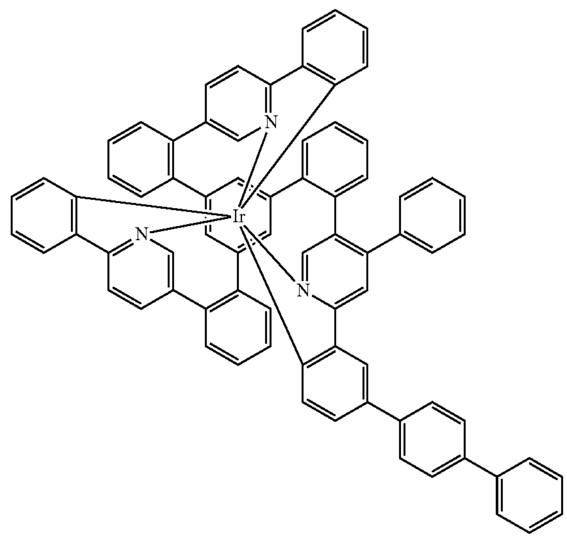
123
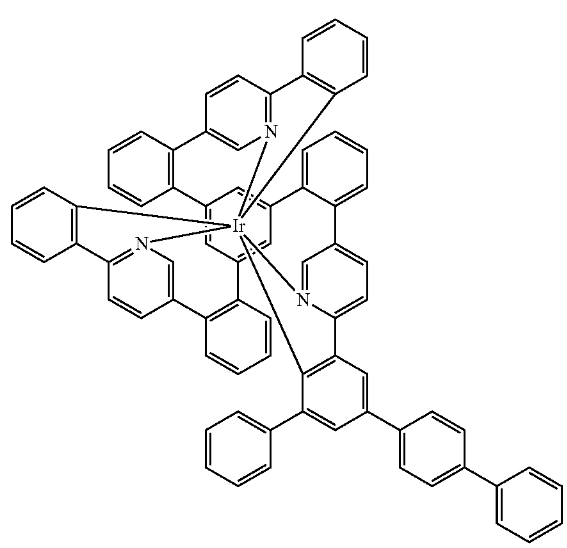

-continued
124
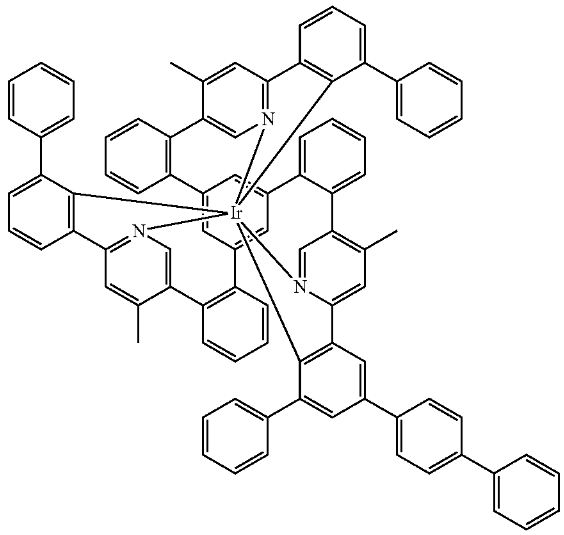
125
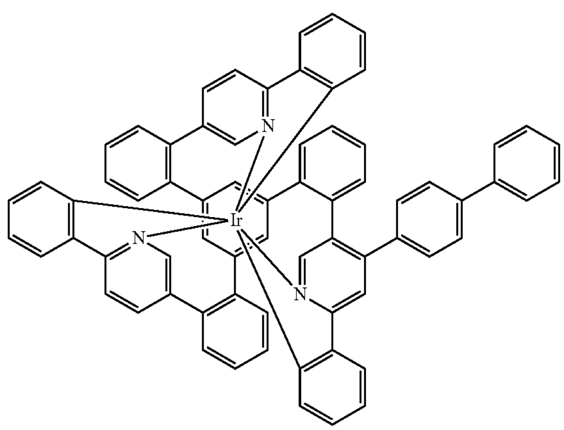
126
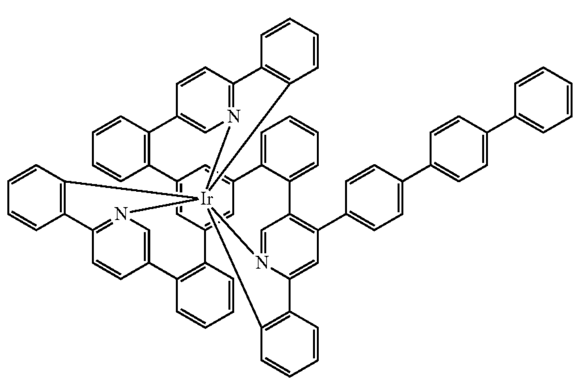
-continued
127
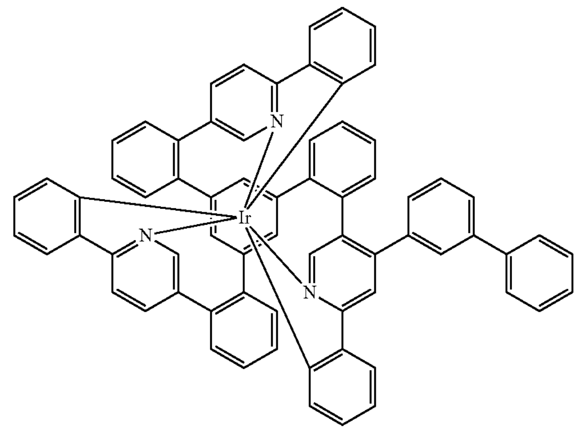
128
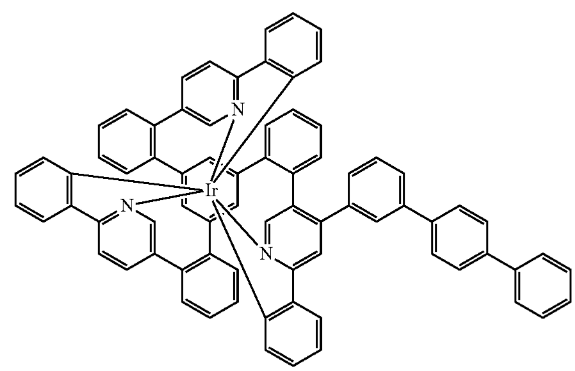
129
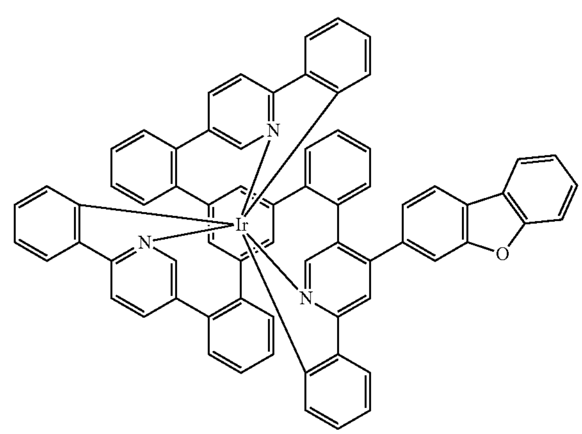

-continued
130
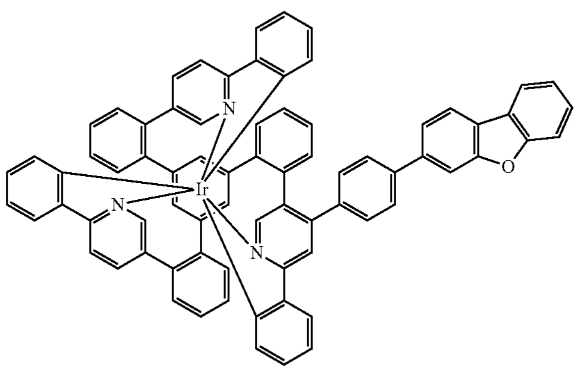
131
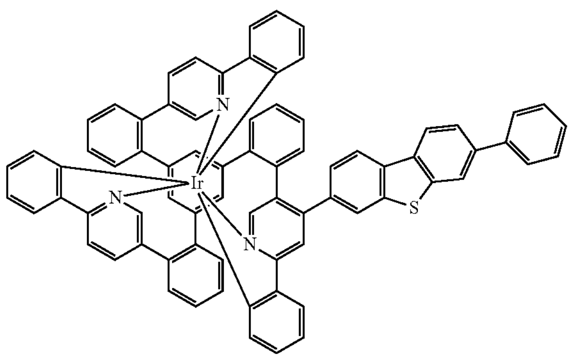
132
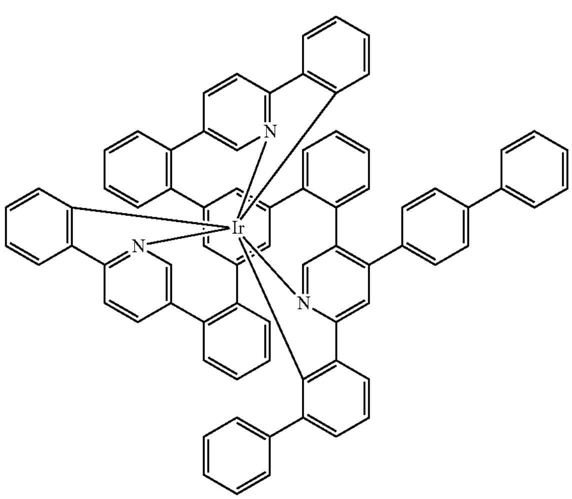
-continued
133
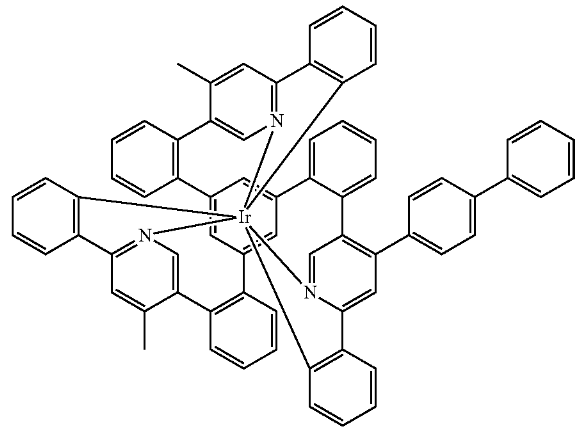
134
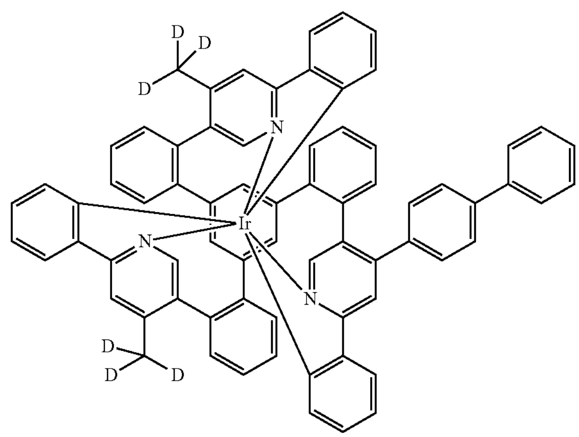
135
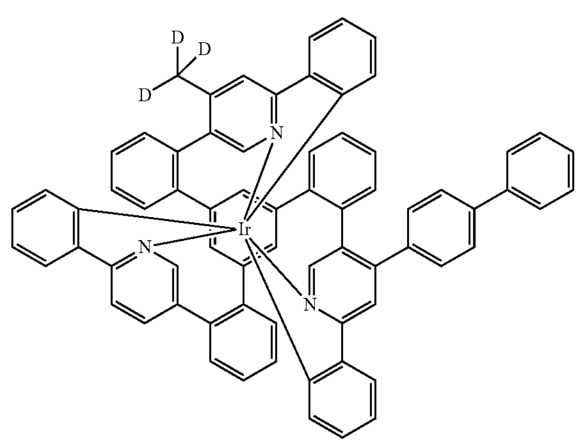

-continued
136
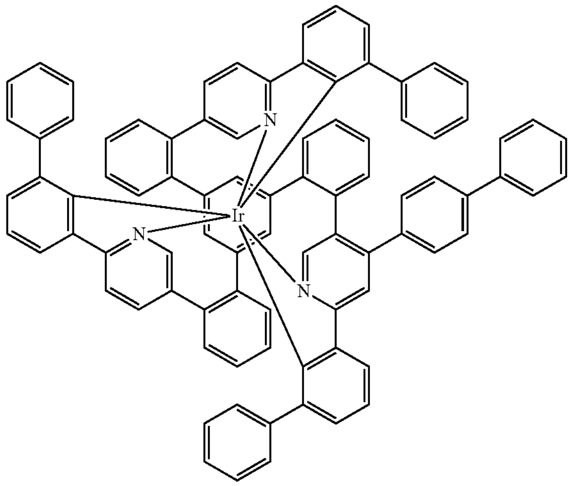
137
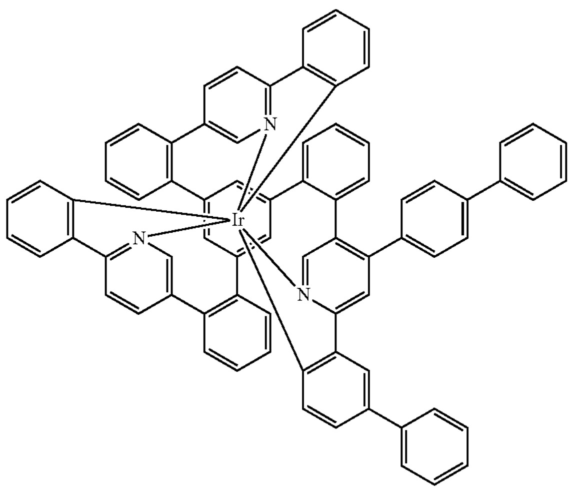
138
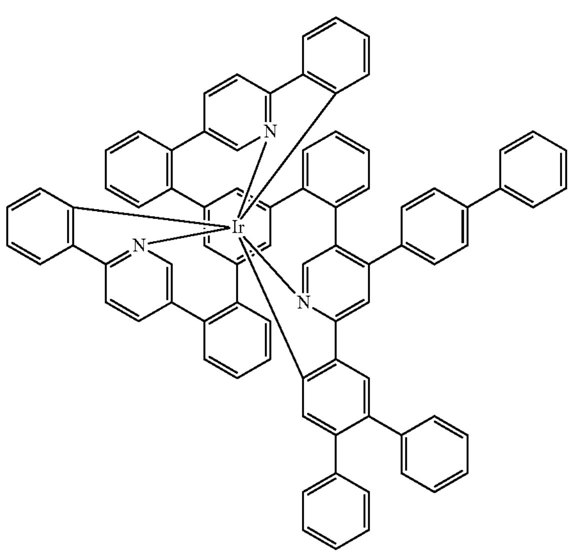
-continued
139
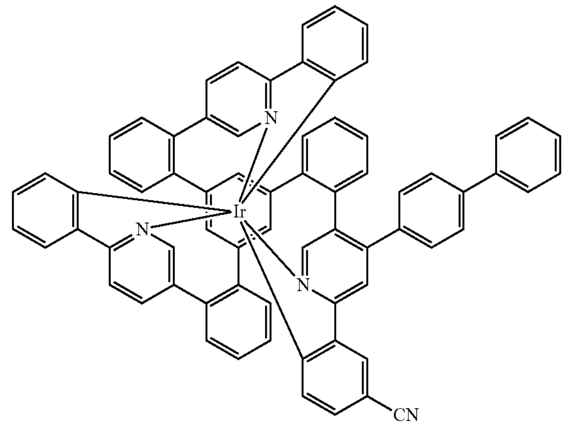
140
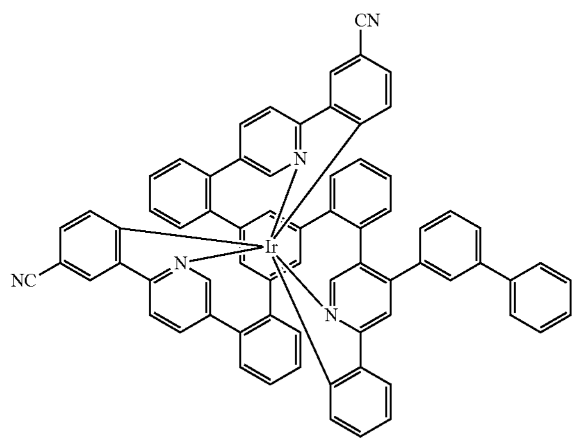
141
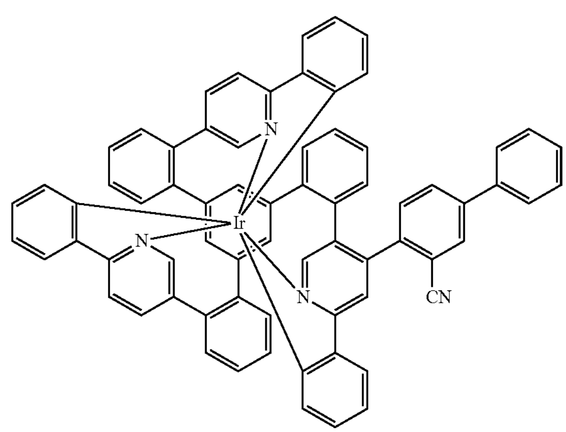

-continued
142
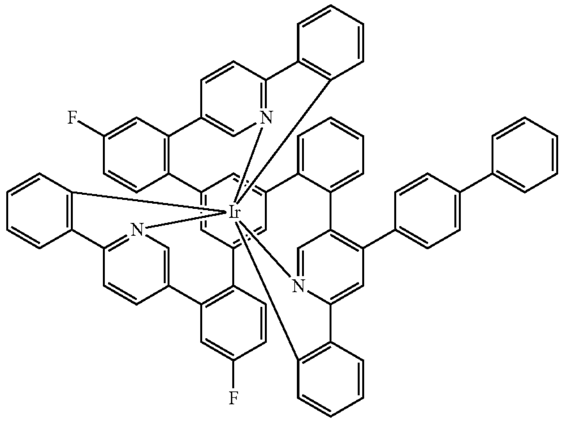
143
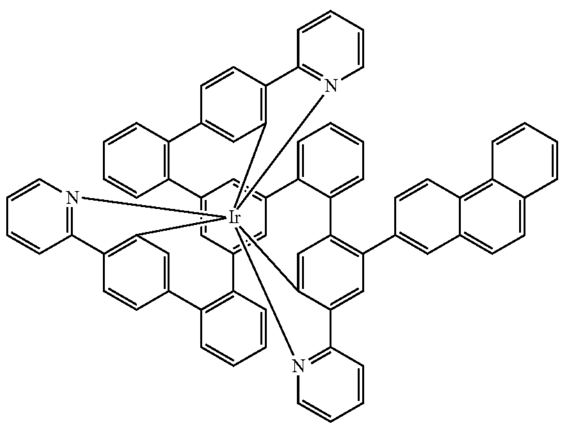
144
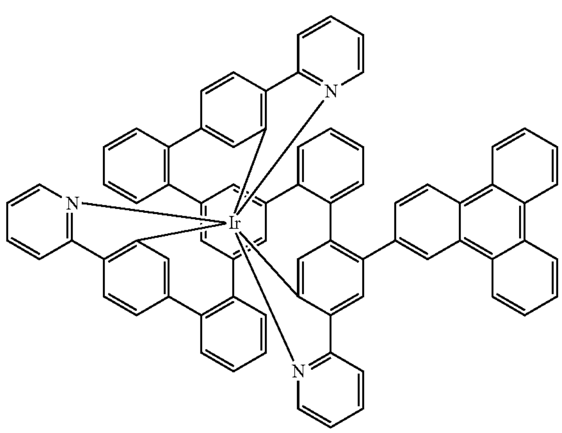
-continued
145
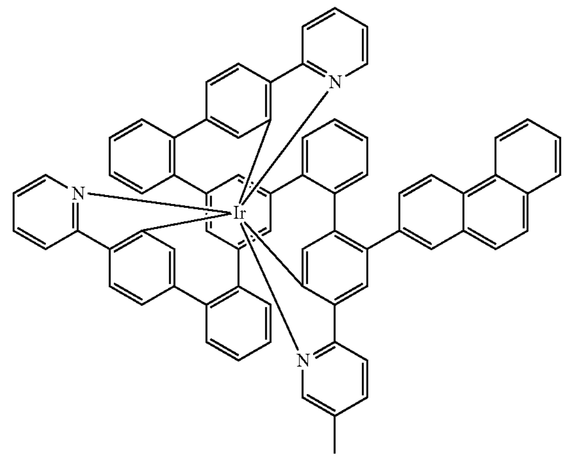
146
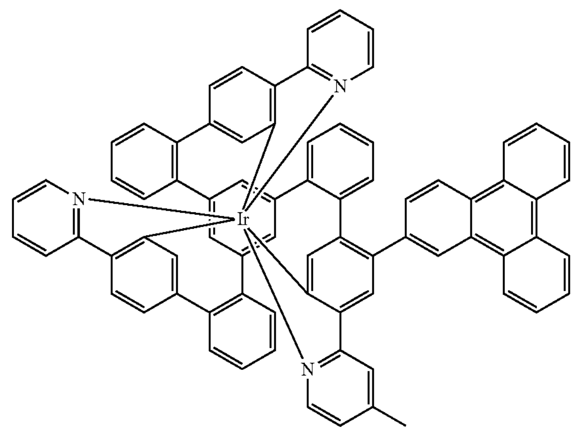
147
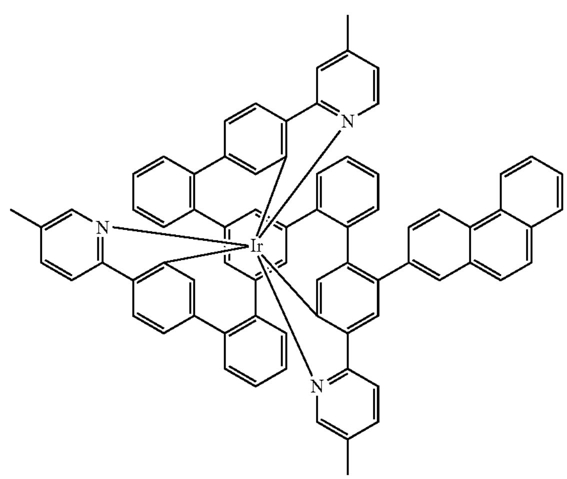

148
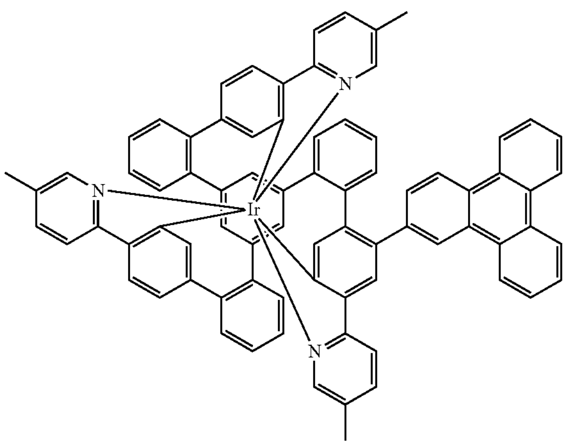
149
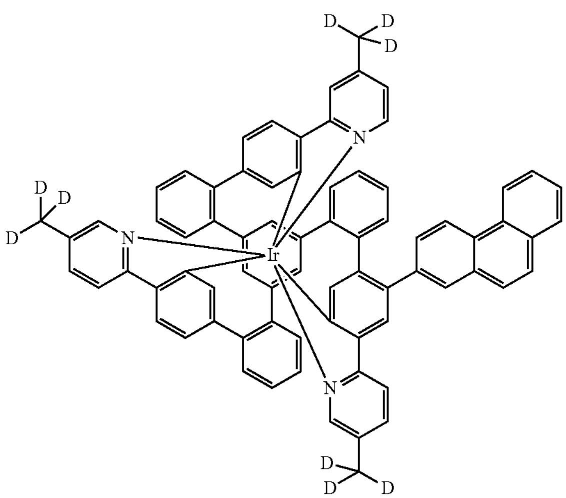
150
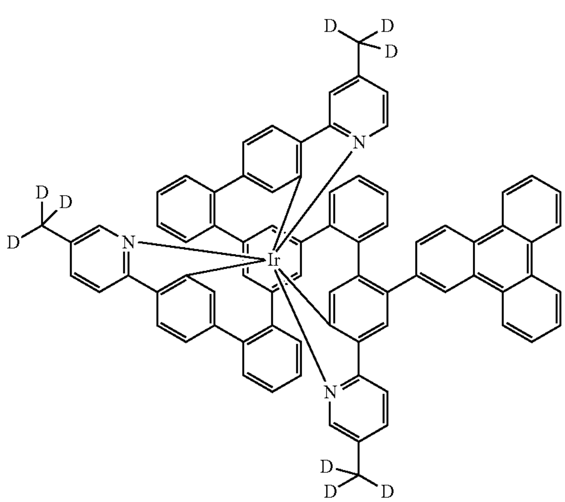
151
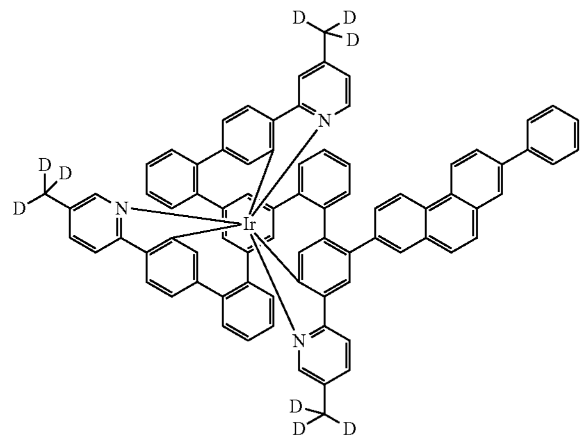
152
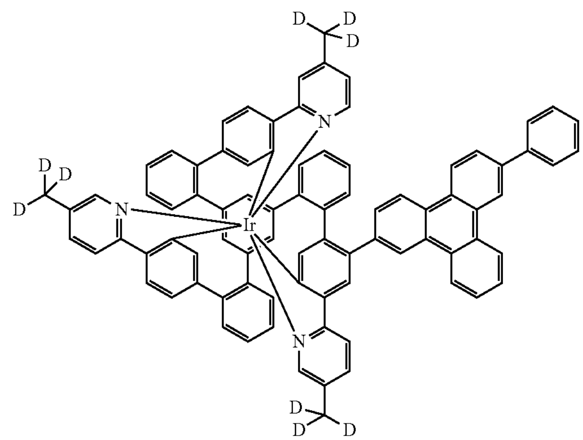
153
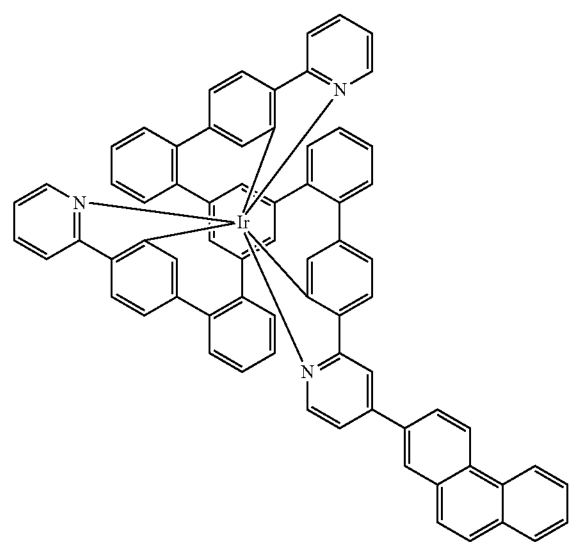

-continued
154
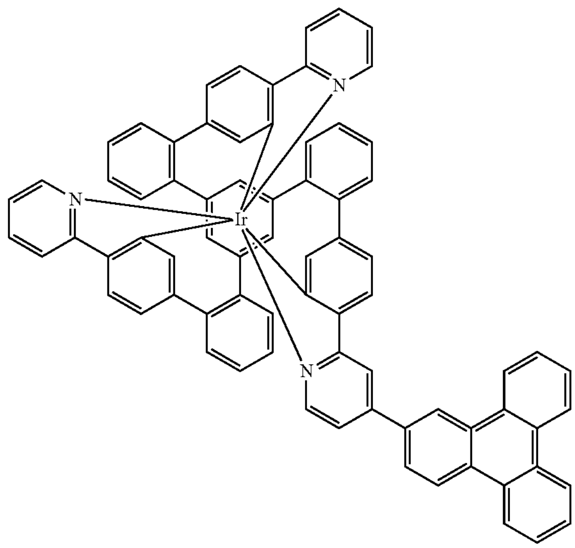
155
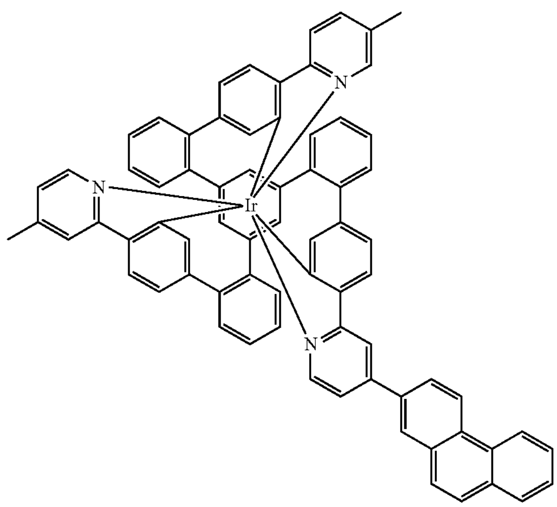
156
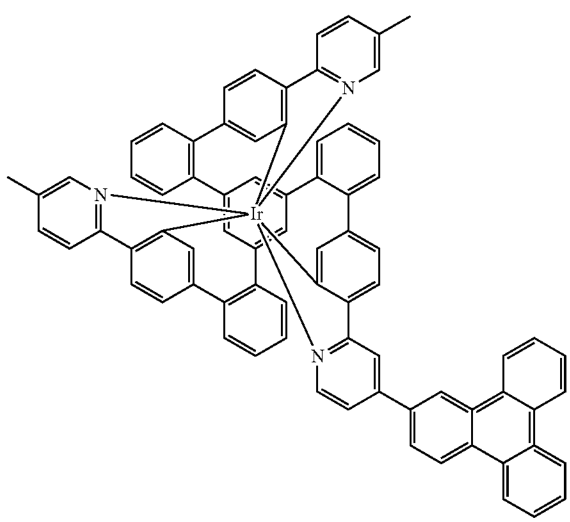
-continued
157
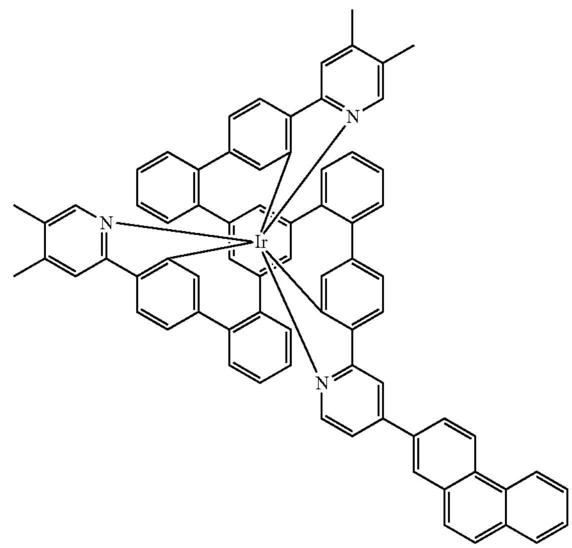
158
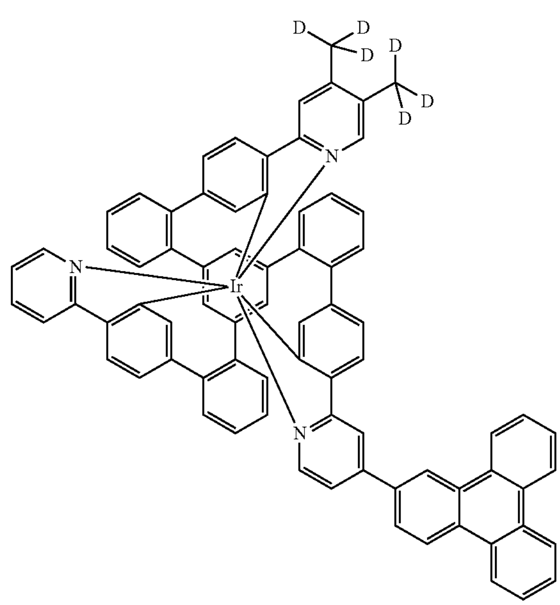

-continued
159
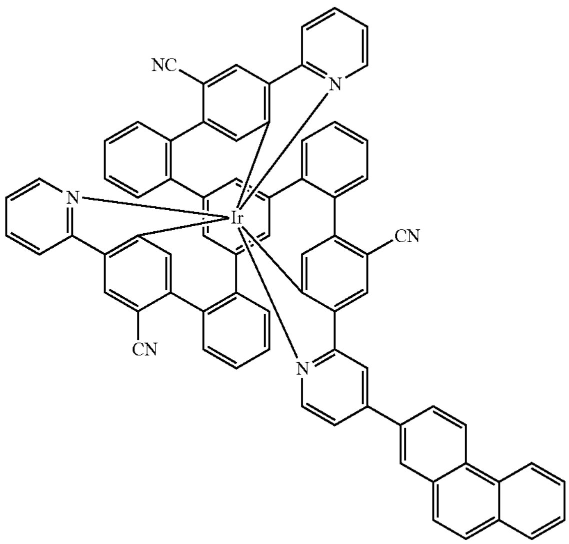
160
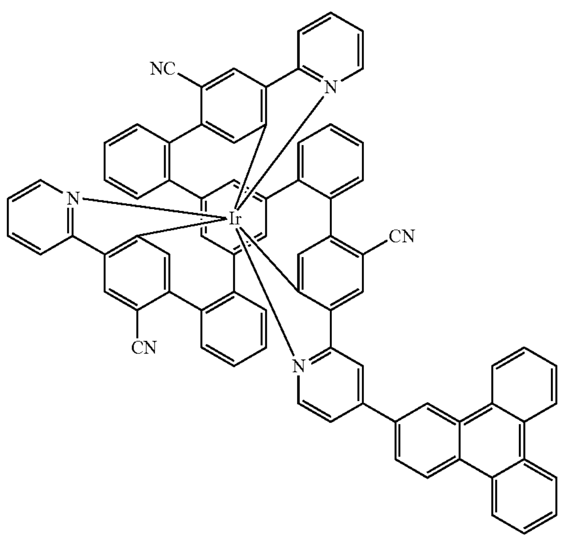
161
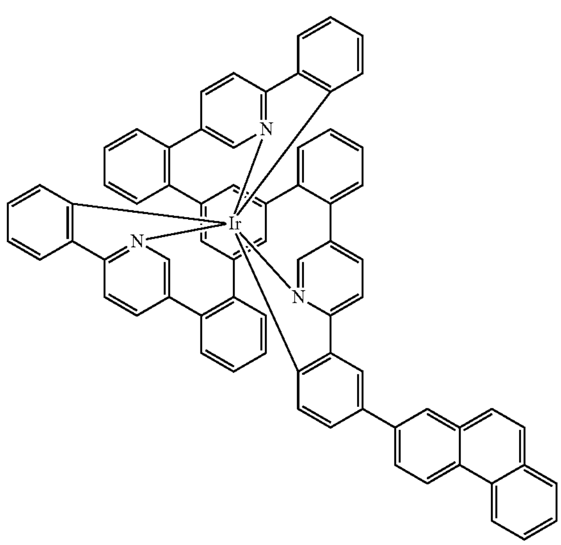
-continued
162
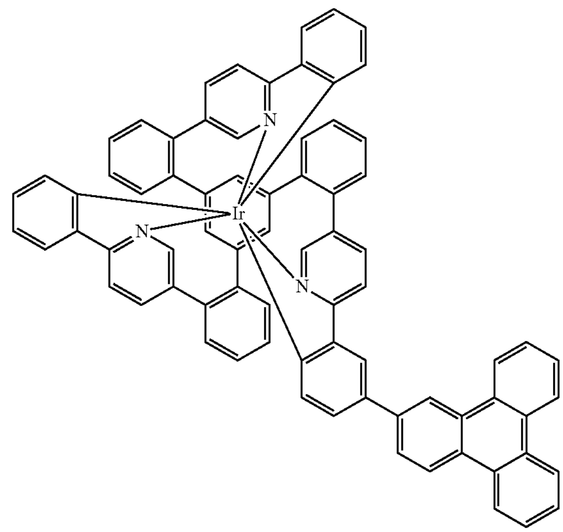
163
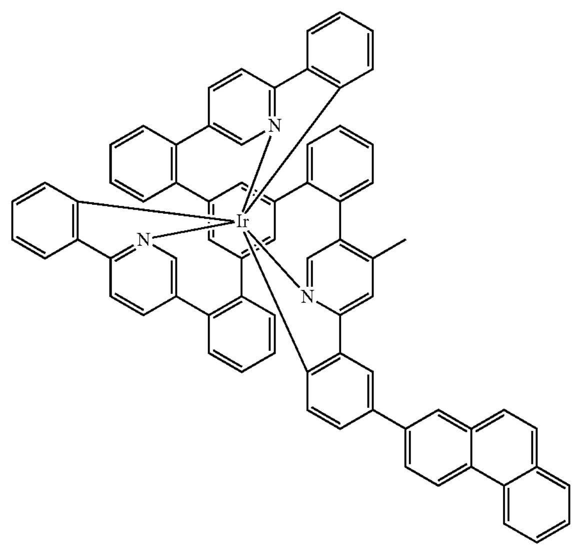
164
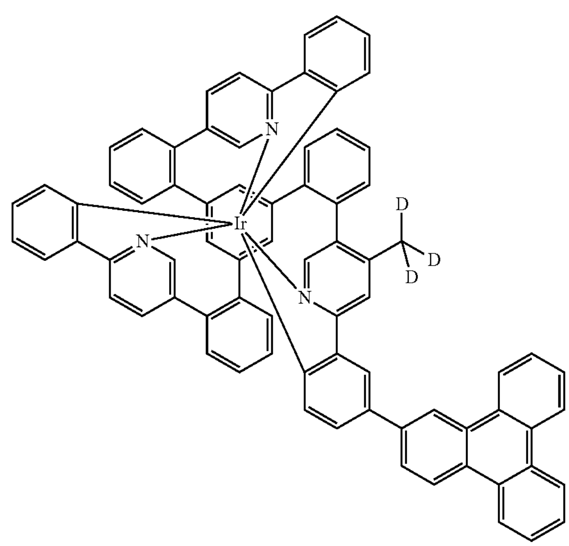

165
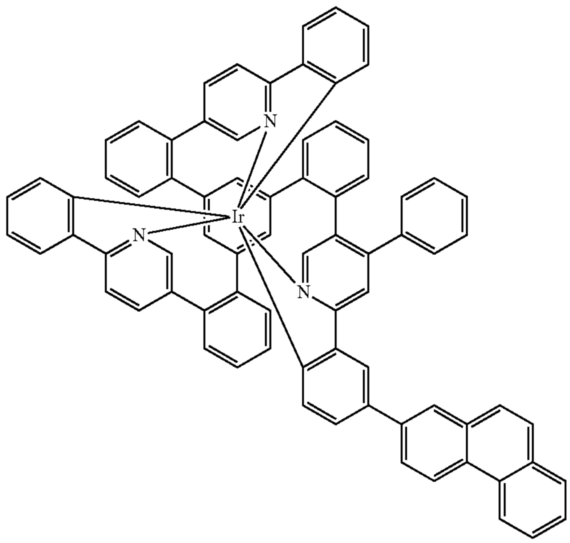
166
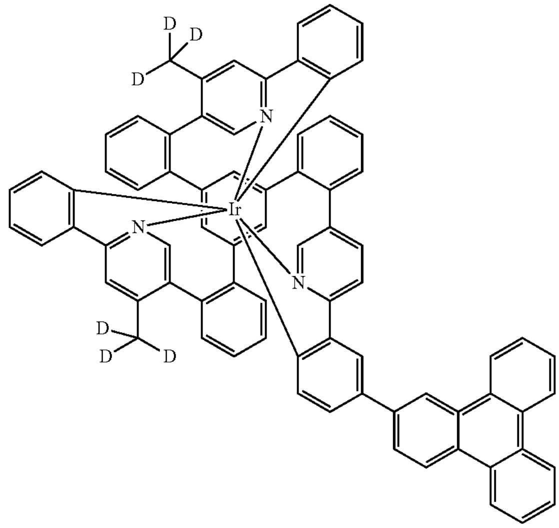
167
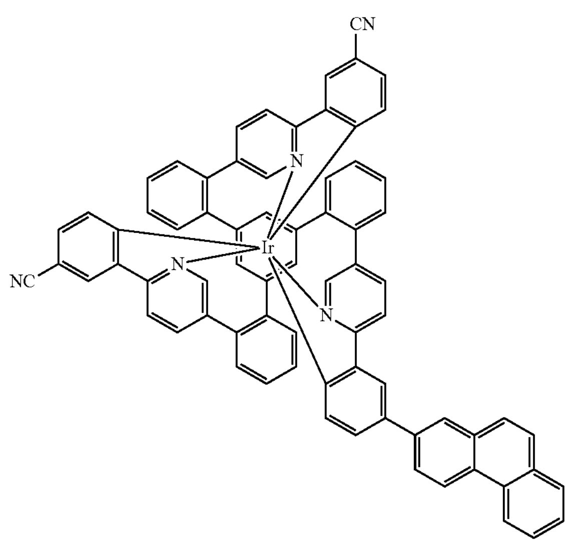
168
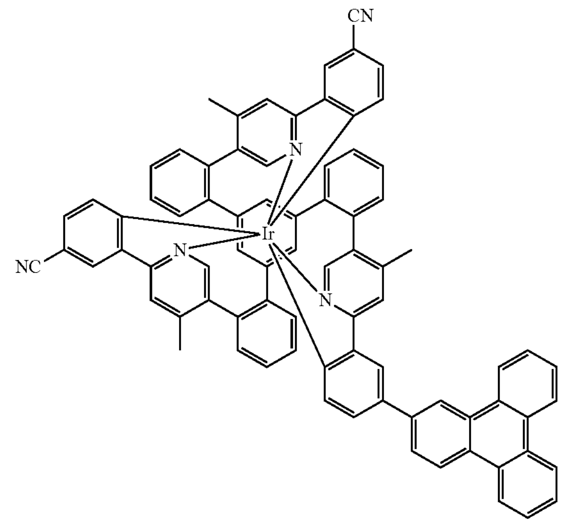
169
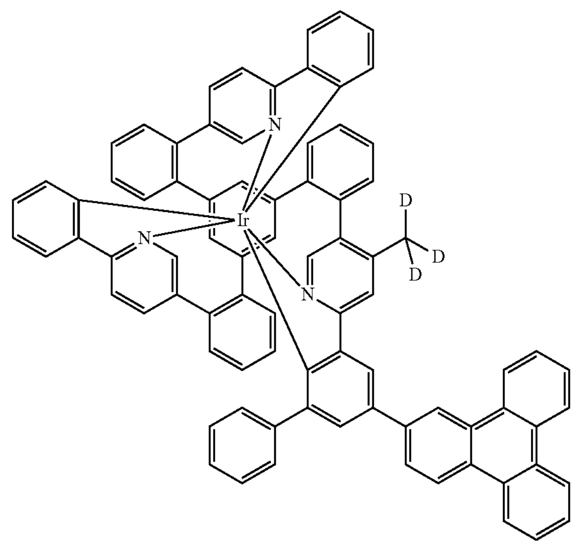
170
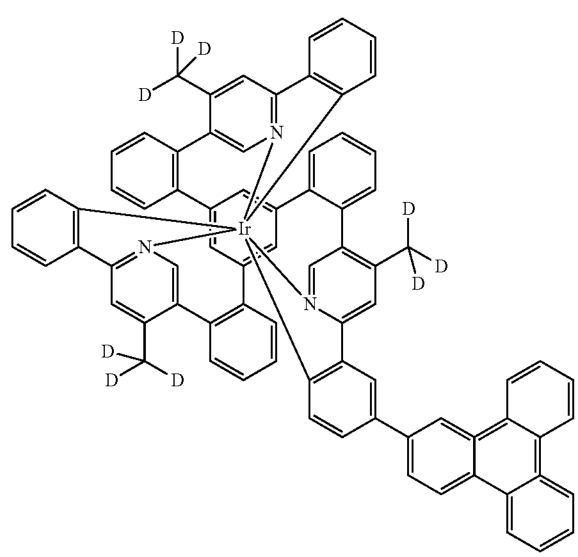

171
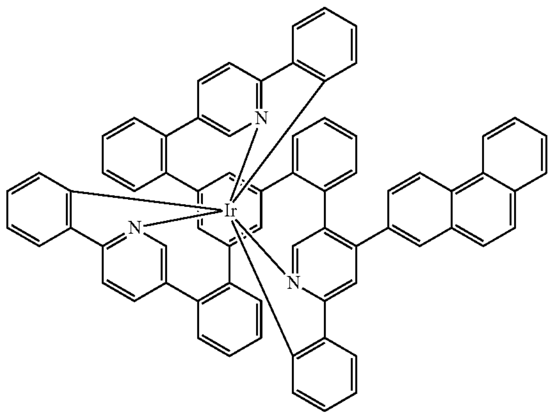
172
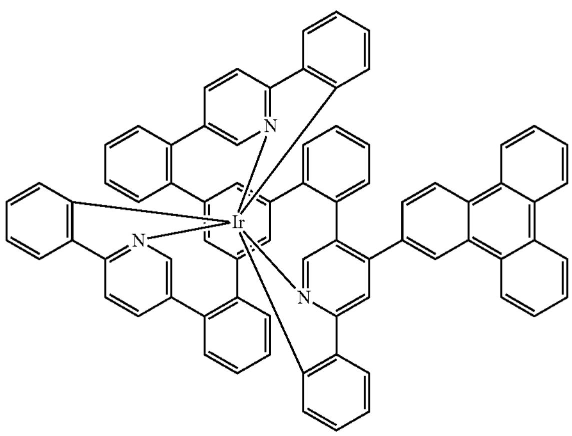
173
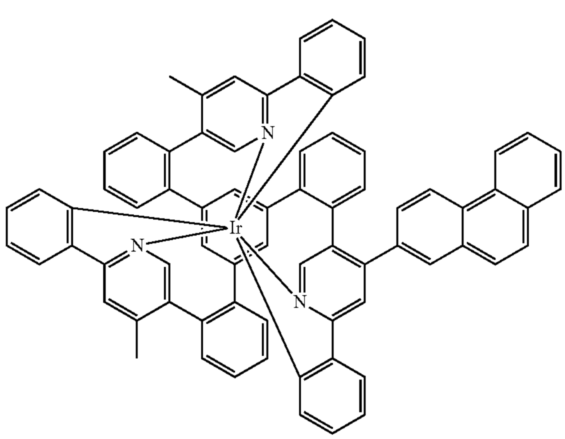
174
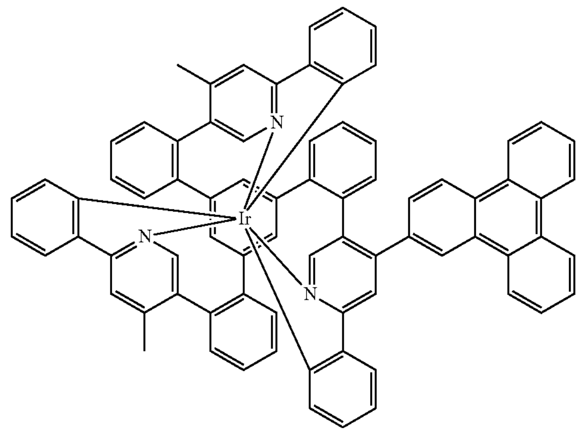
175
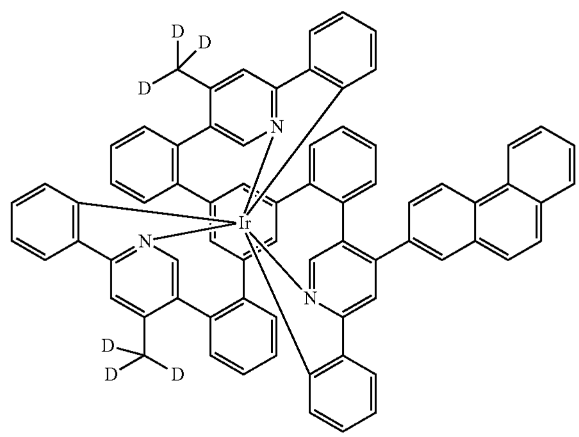
176
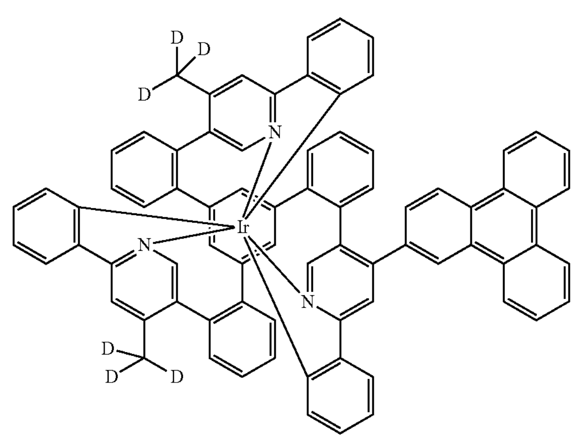

-continued
177
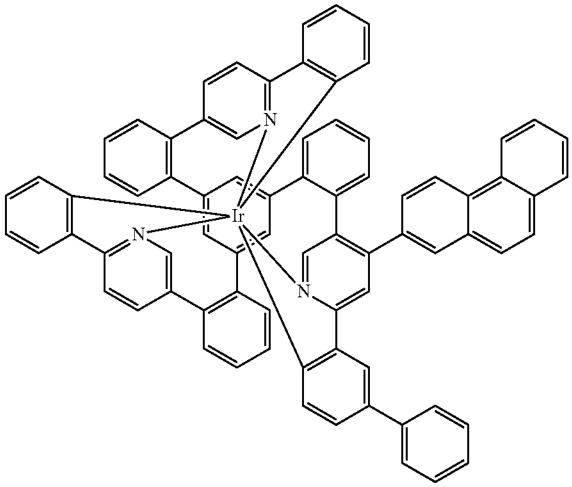
178
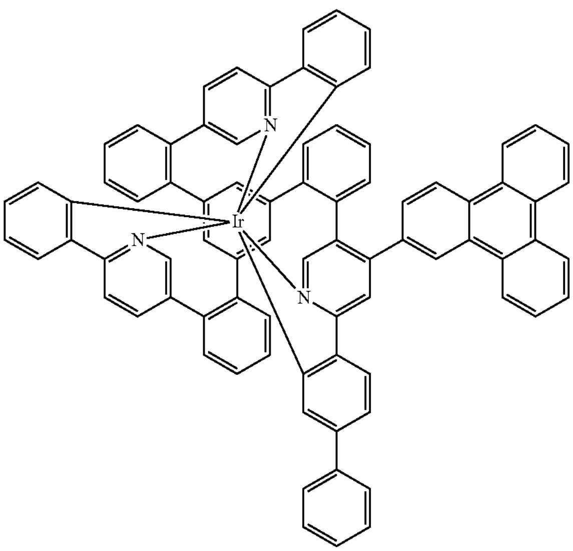
179
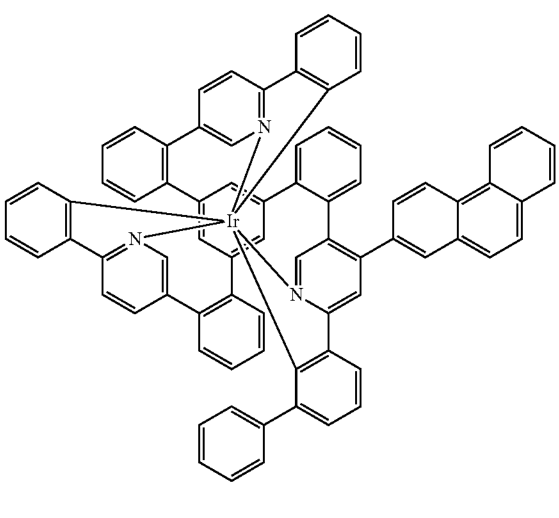
-continued
180
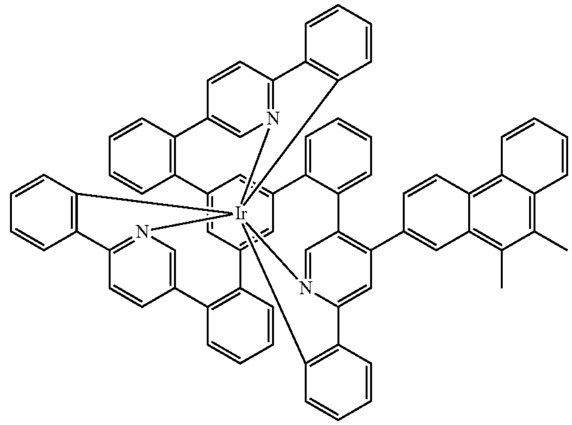
181
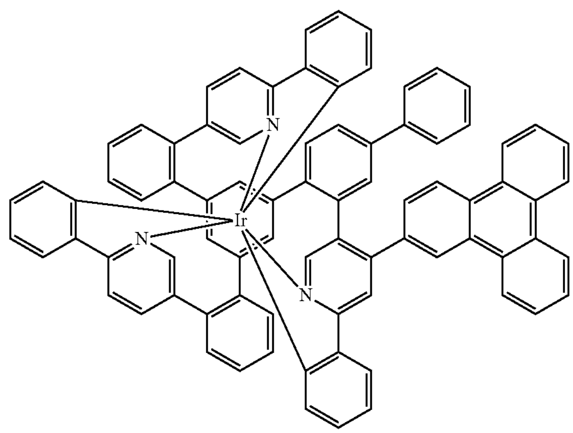
182
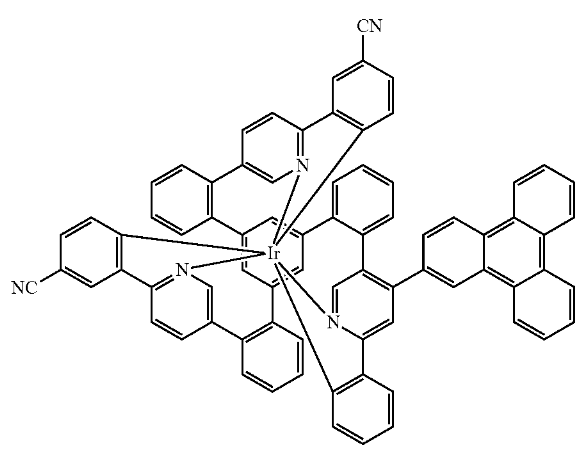

183
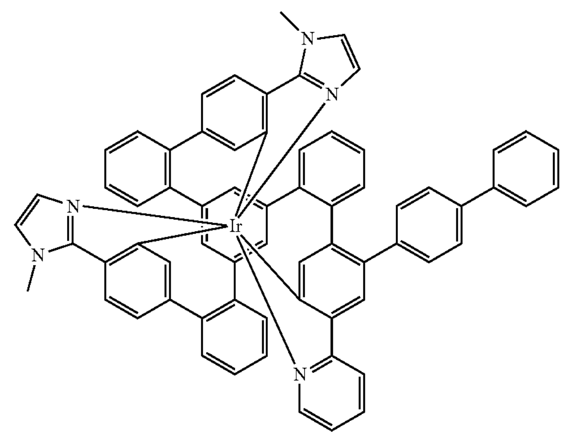
184
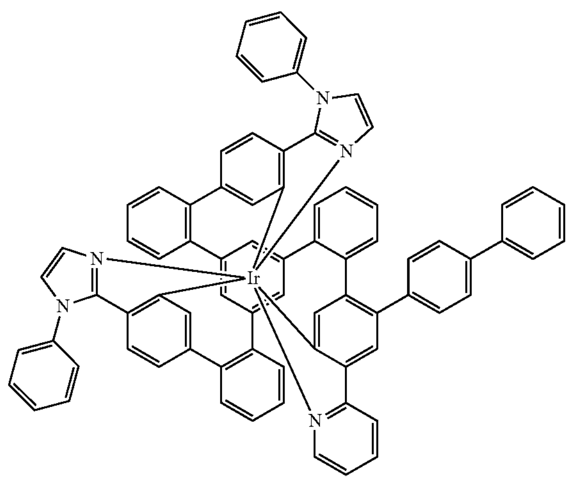
185
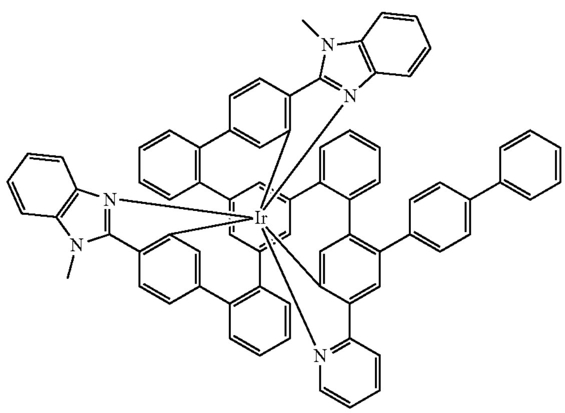
186
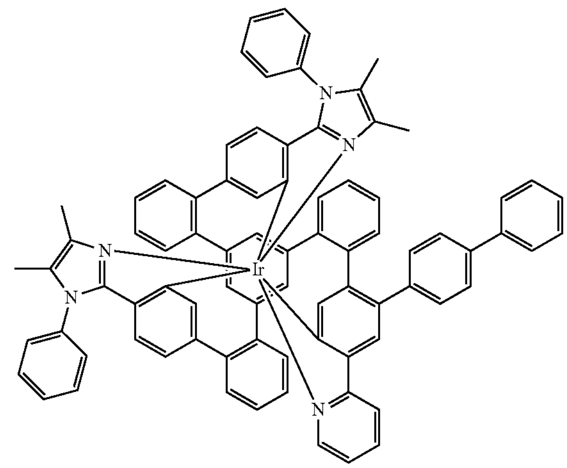
187
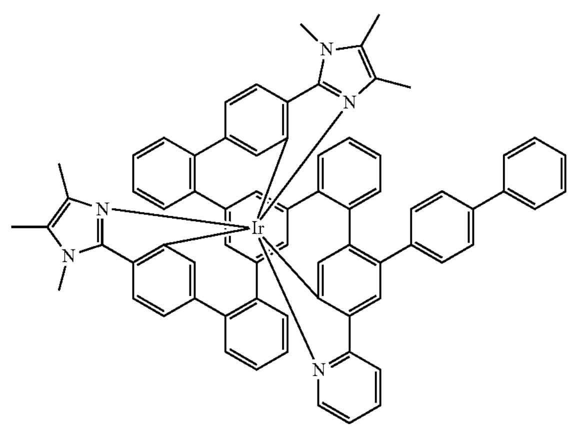
188
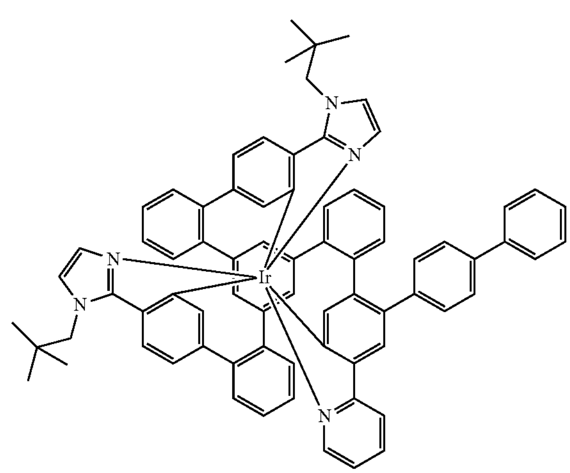

-continued
189
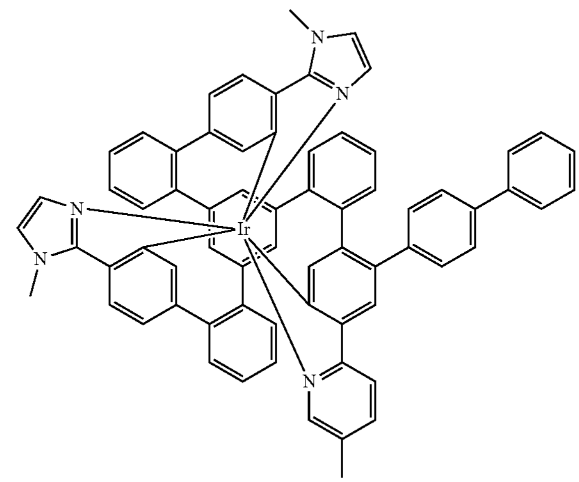
190
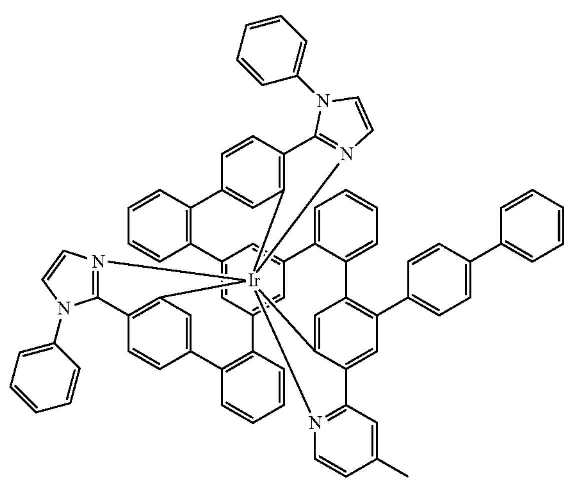
192
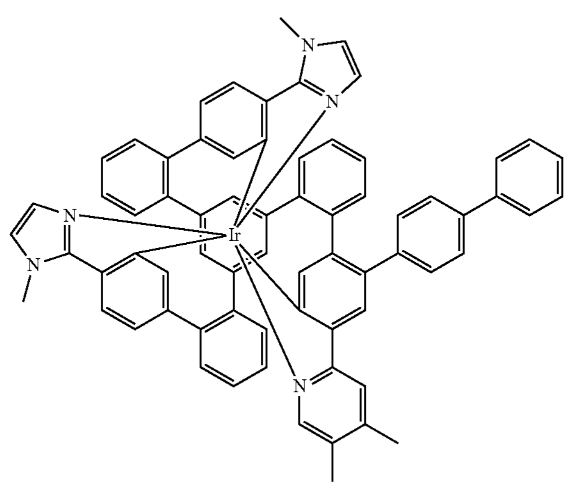
-continued
192
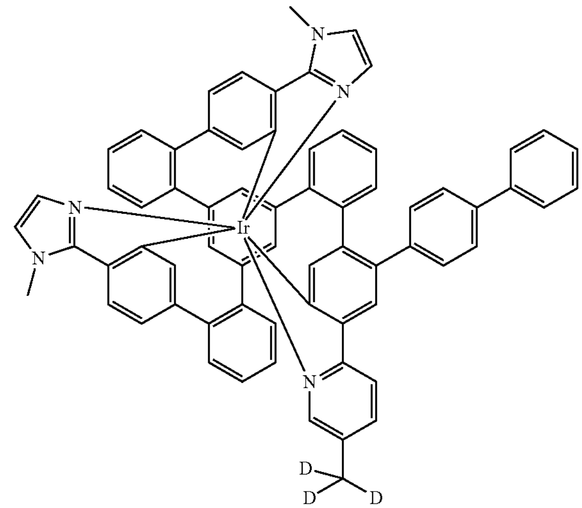
193
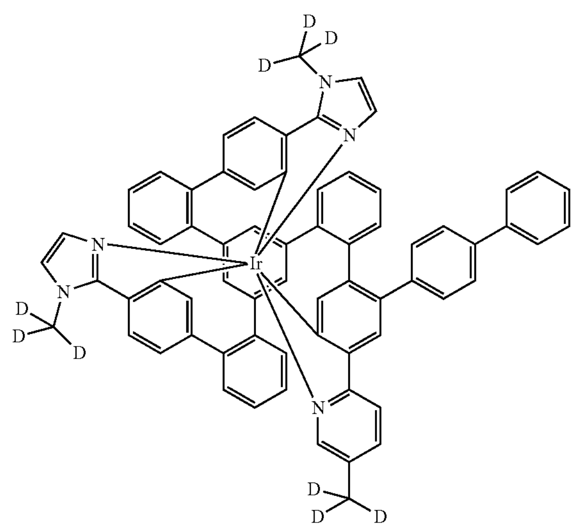
194
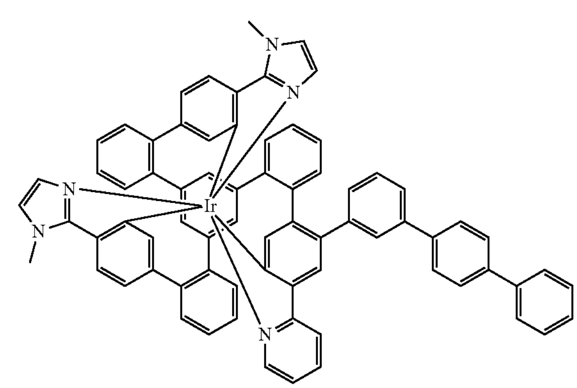

-continued
194
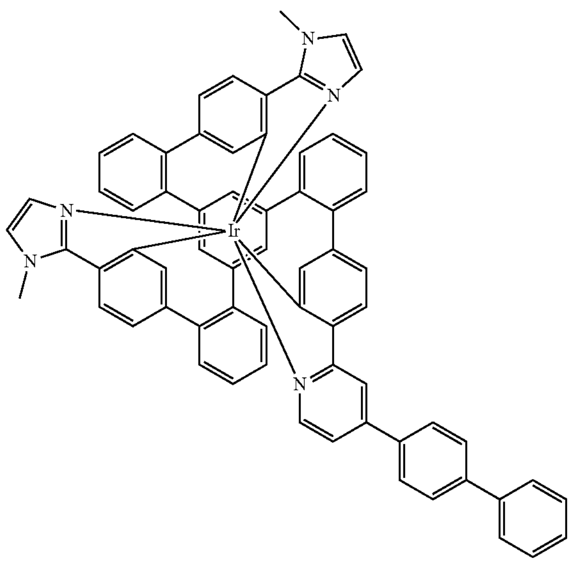
196
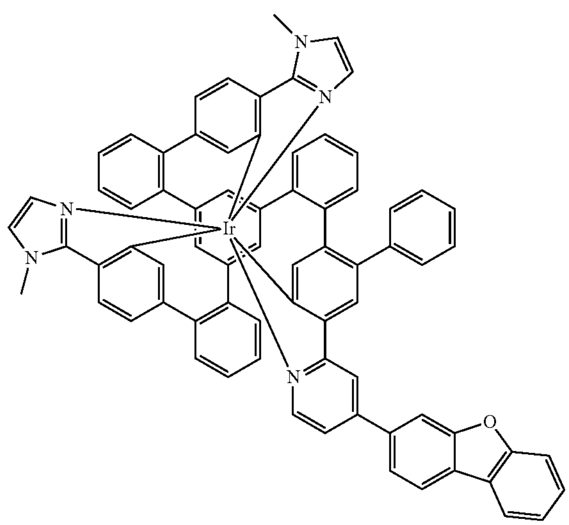
197
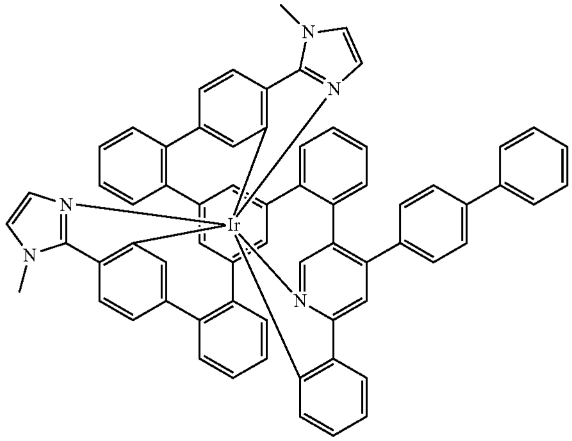
-continued
198
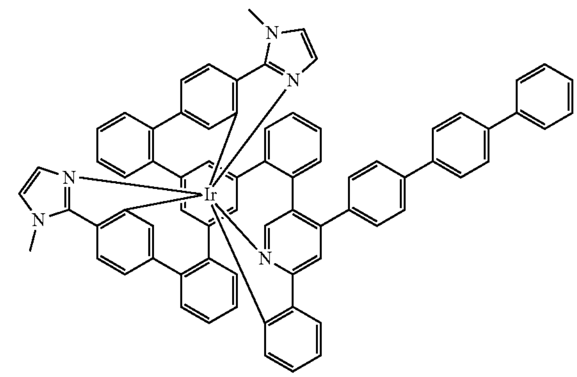
199
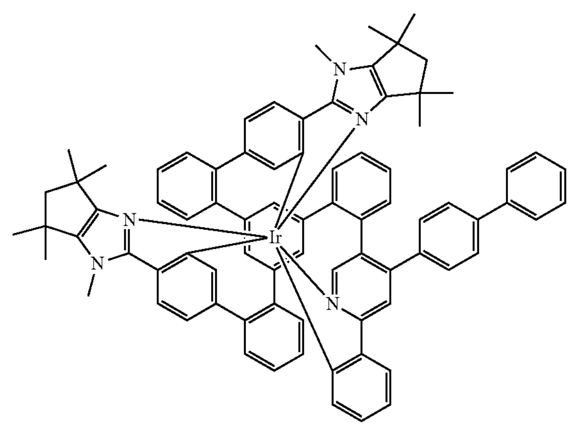
200
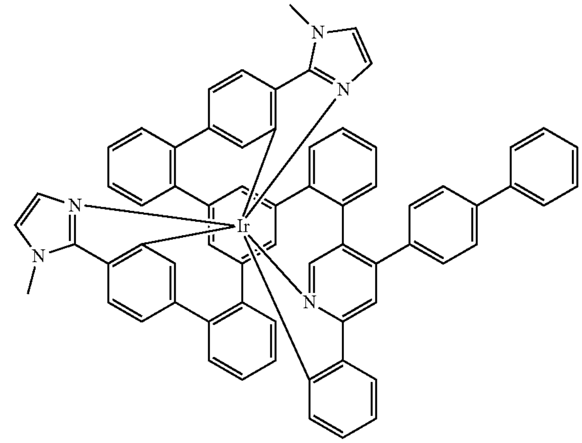

-continued
201
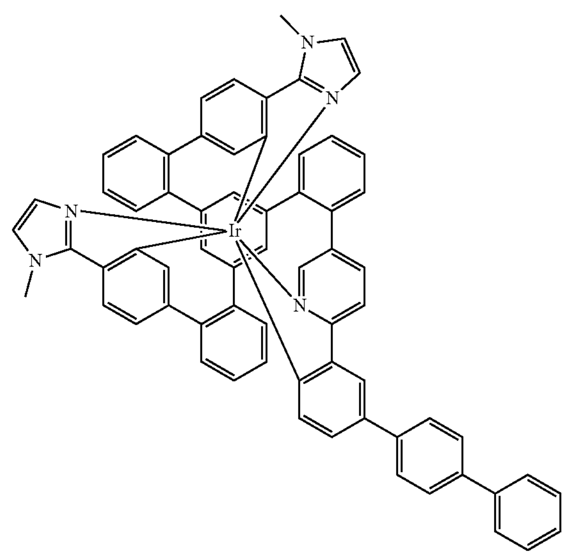
202
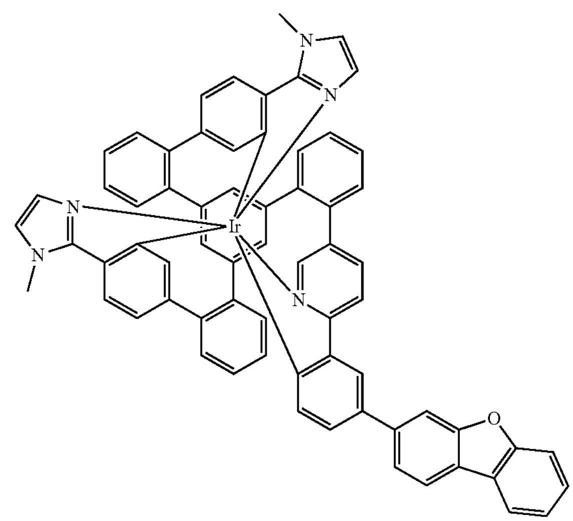
203
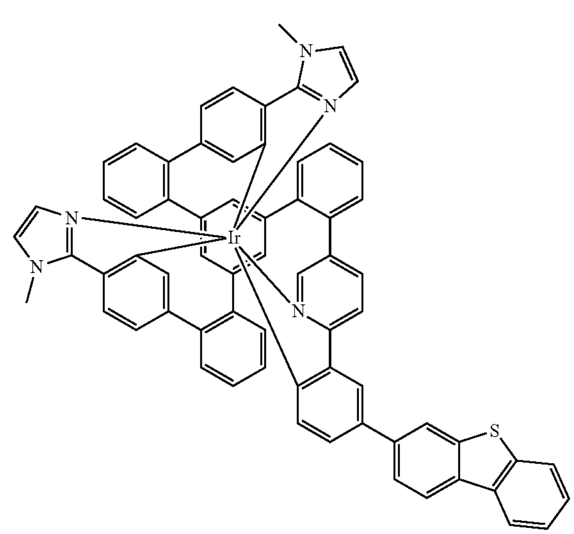
-continued
204
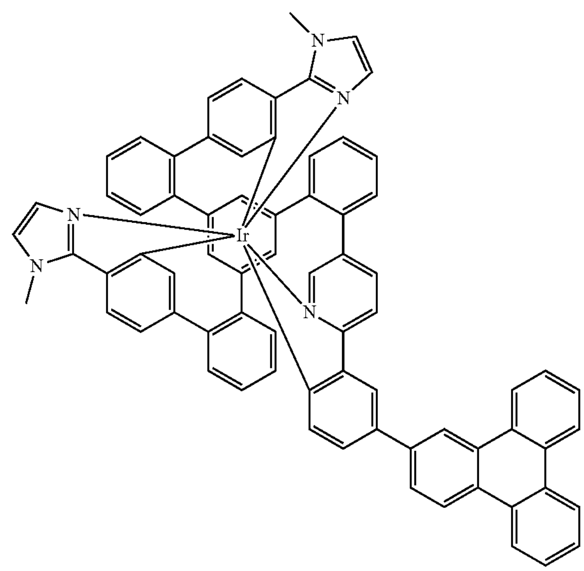
205
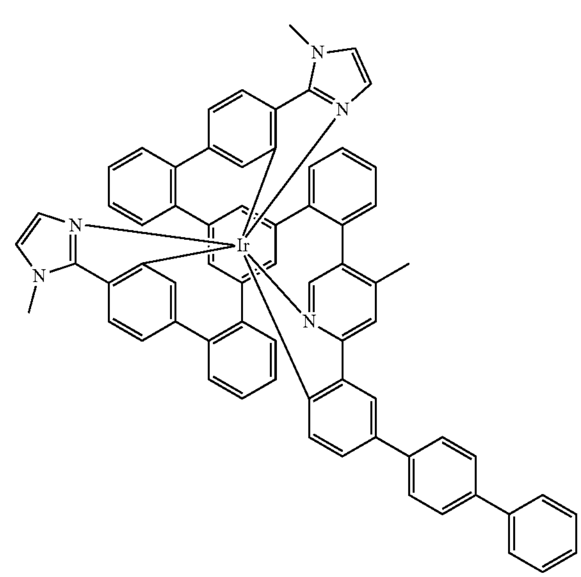

-continued
206
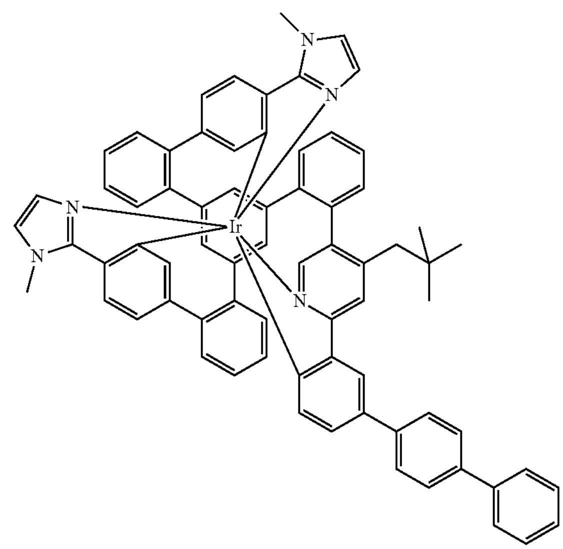
207
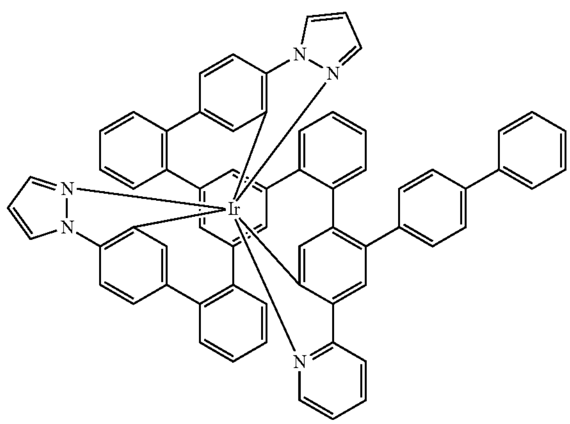
208
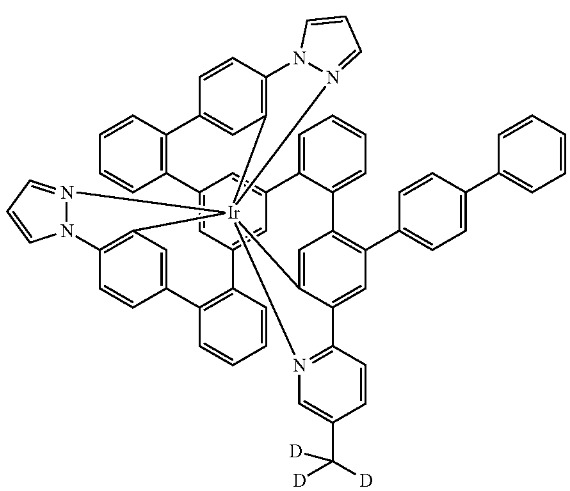
-continued
209
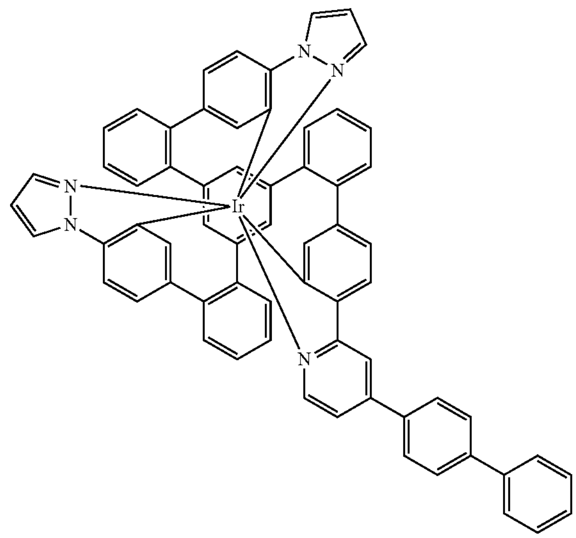
210
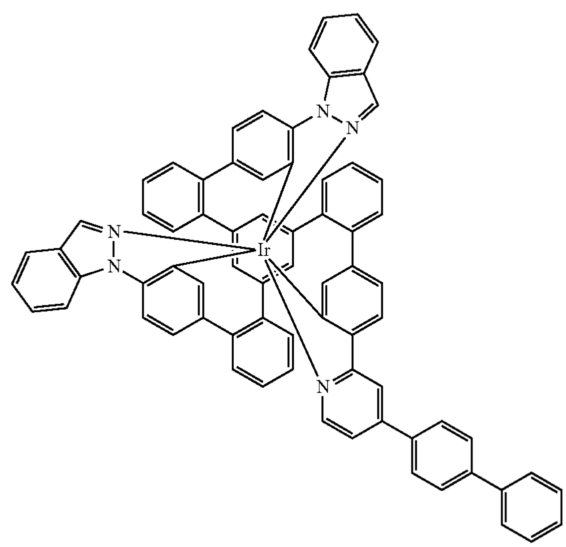
211
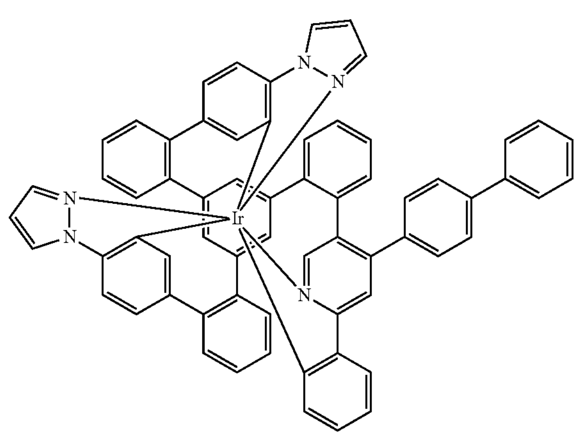

212
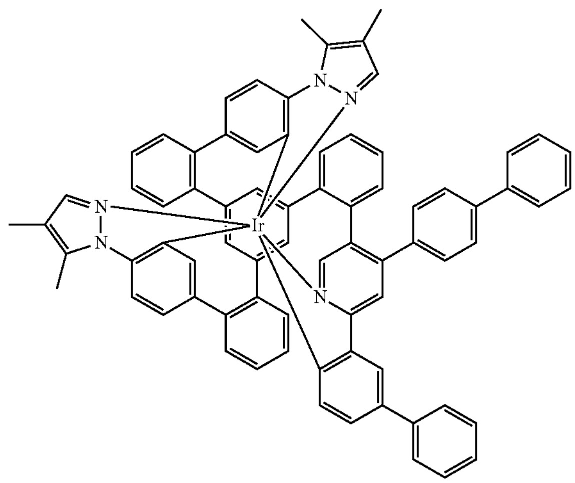
213
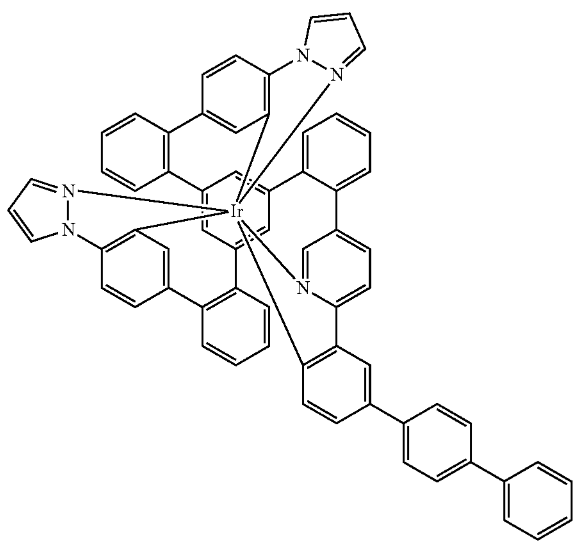
214
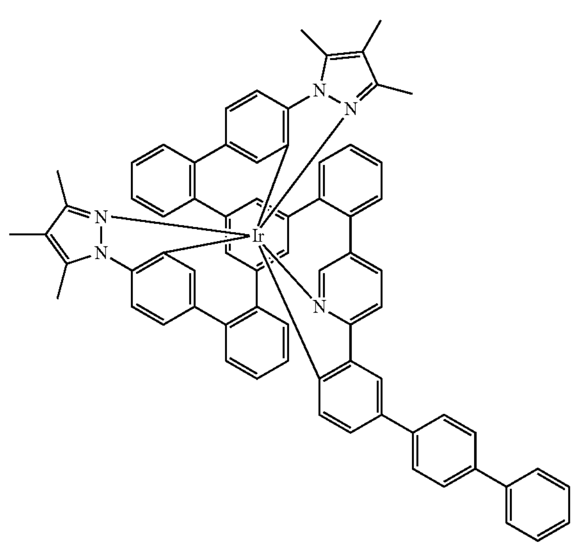
215
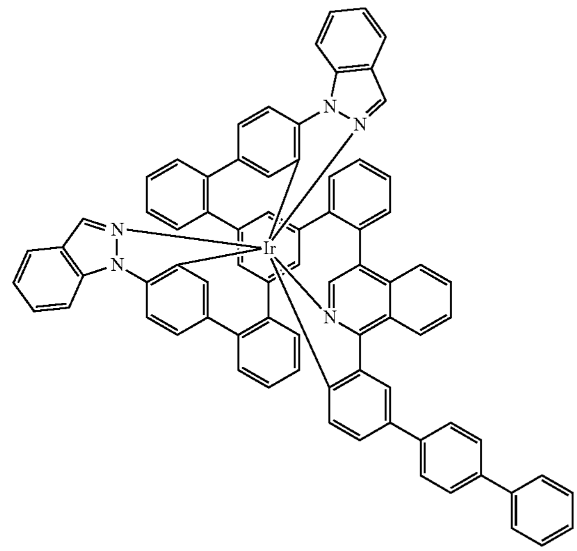
216
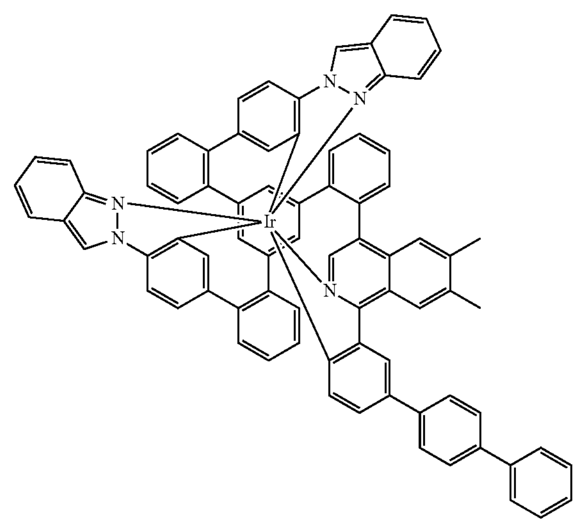
217
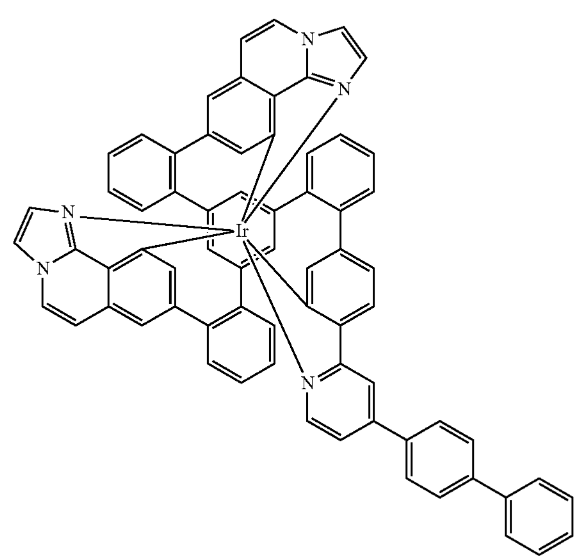

-continued
218
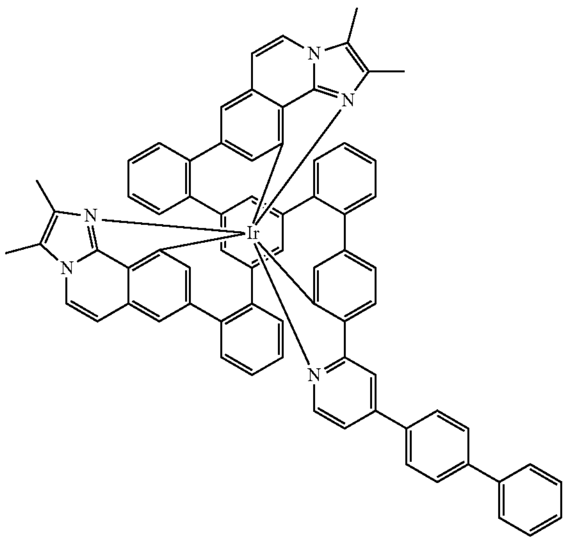
219
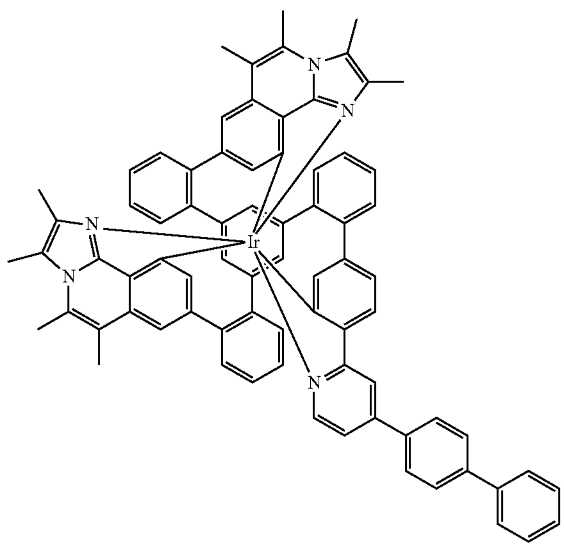
220
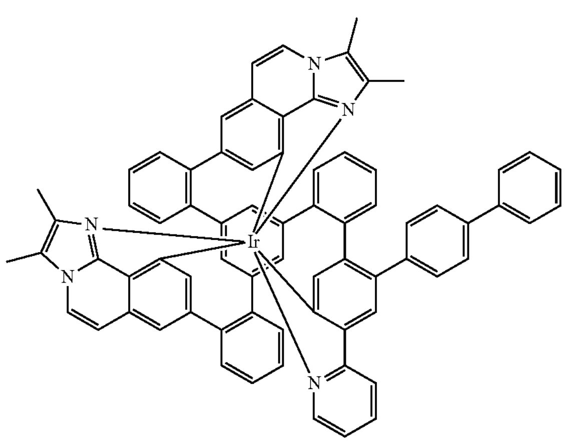
-continued
221
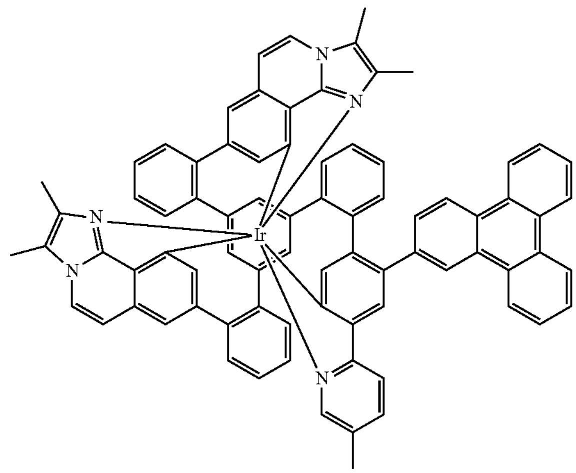
222
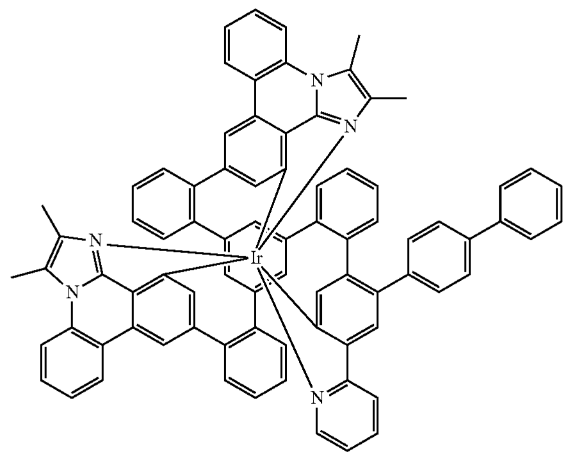
223
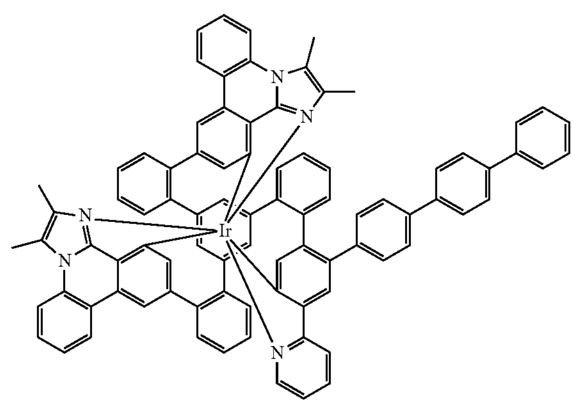

-continued
224
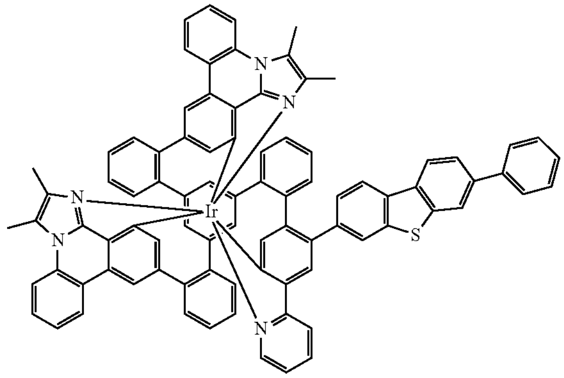
225
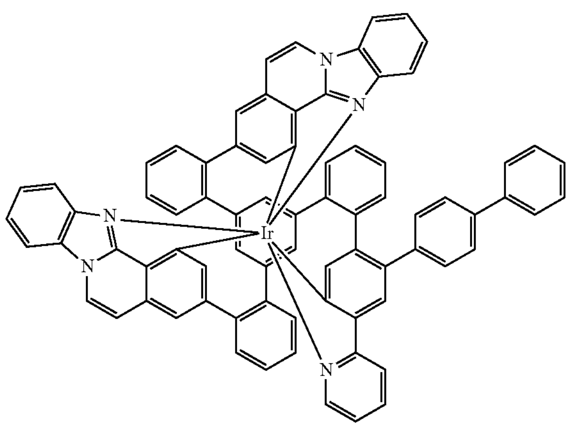
226
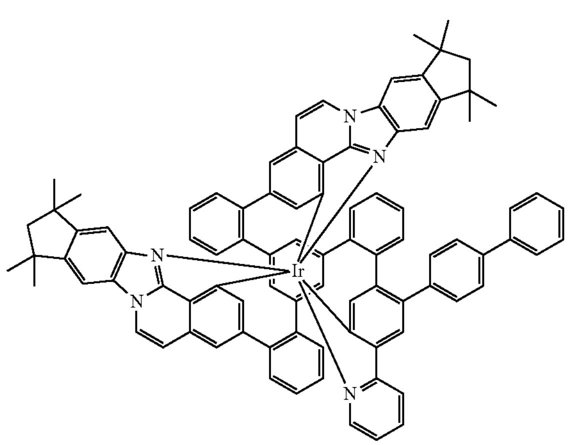
-continued
227
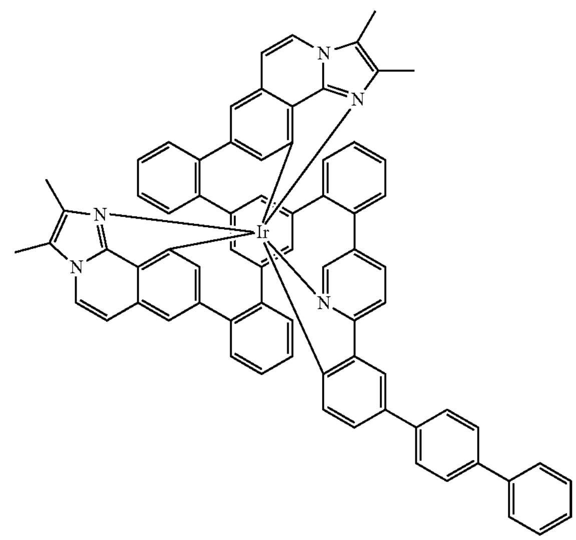
228
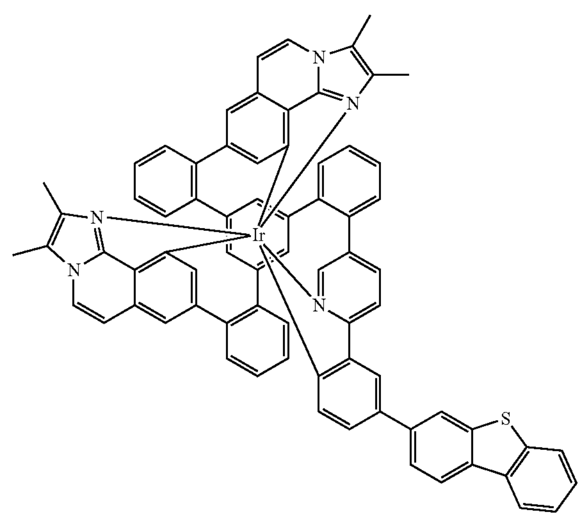
229
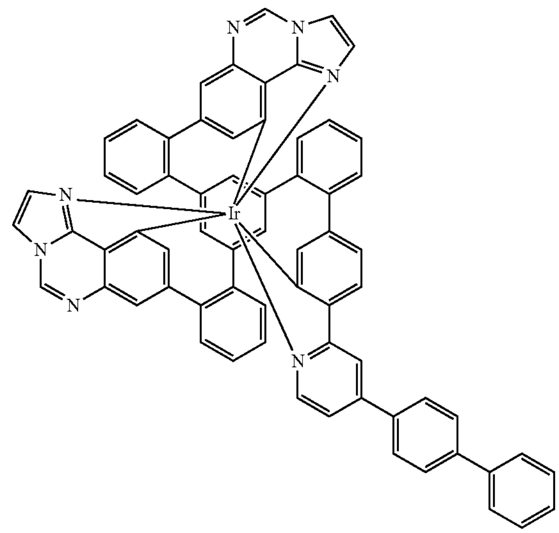

230
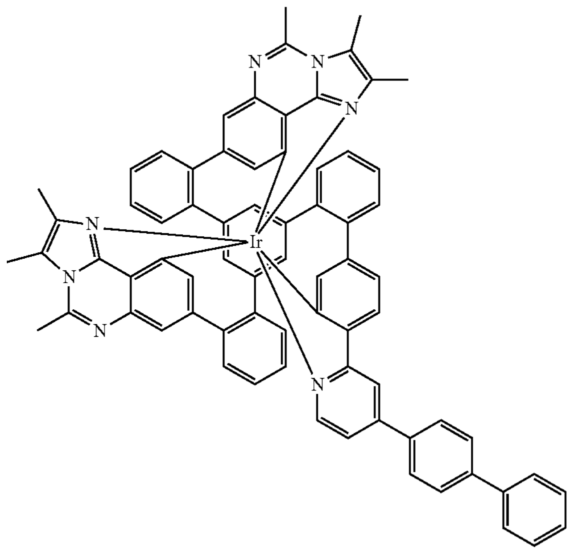
231
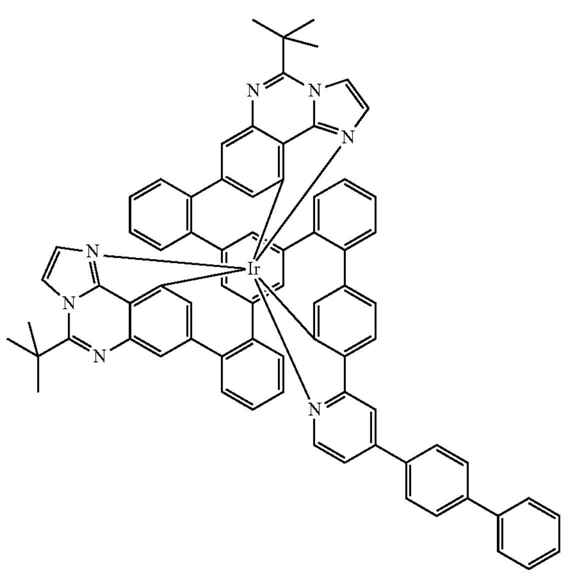
232
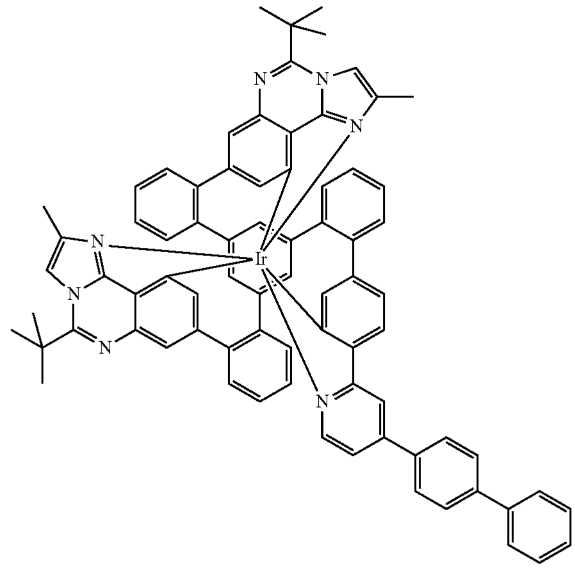
233
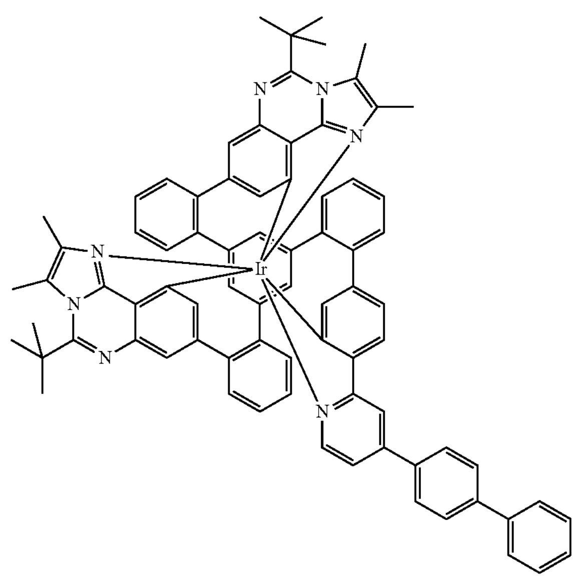

-continued
234
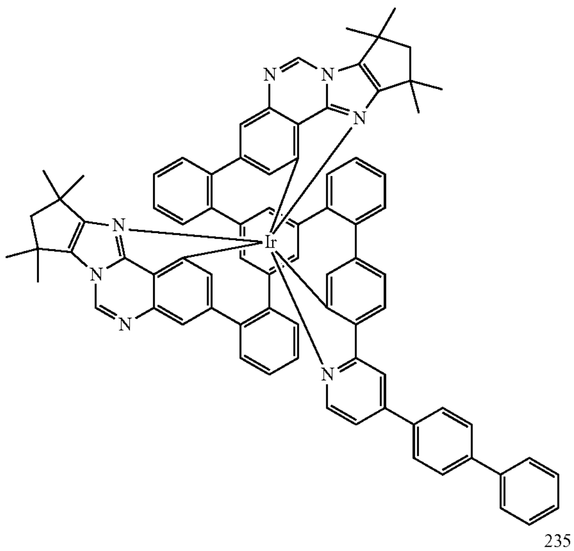
235
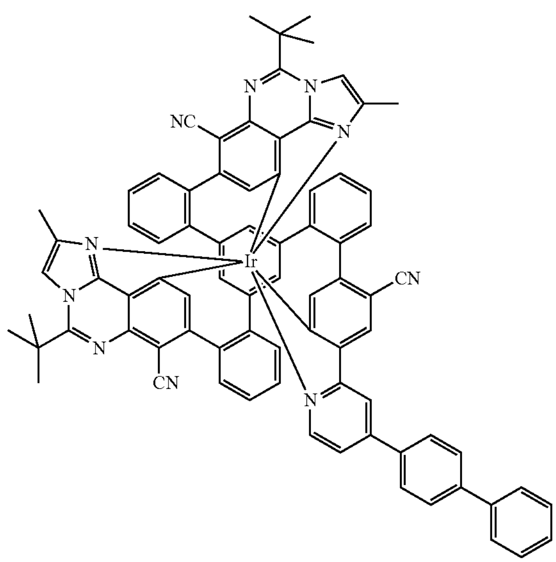
236
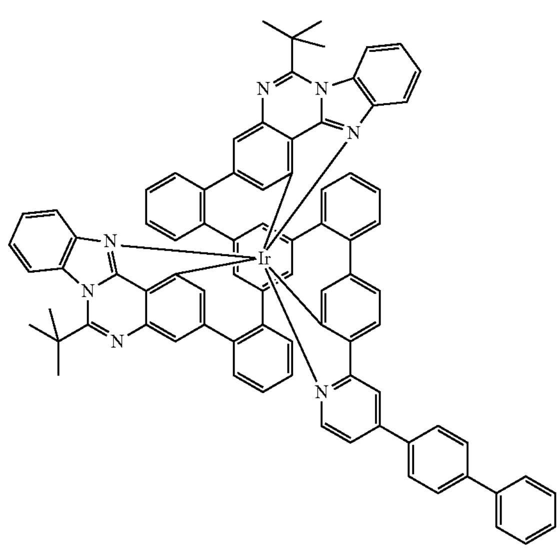
-continued
237
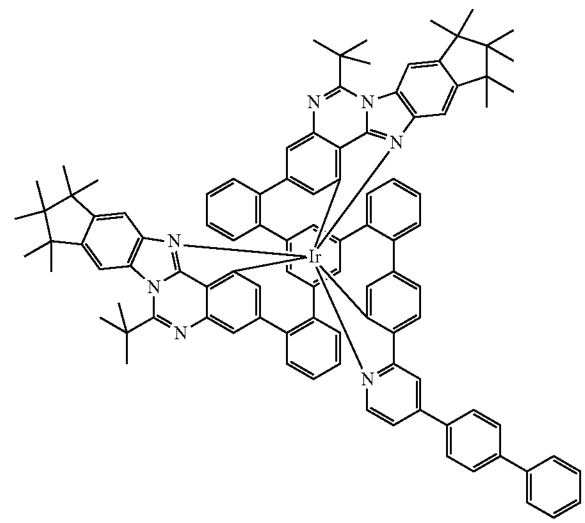
238
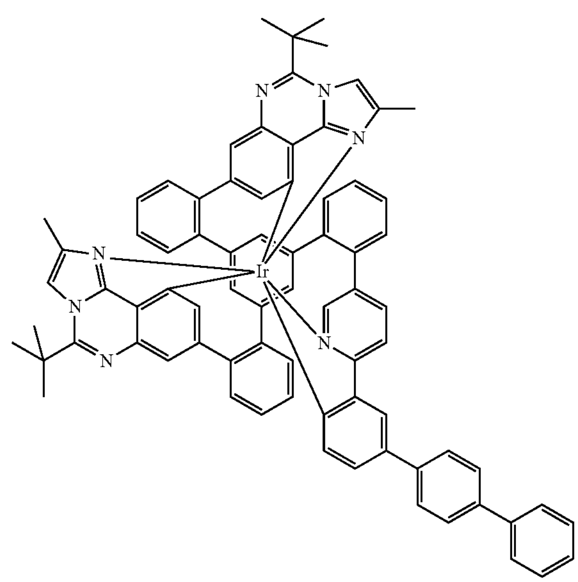

-continued
239
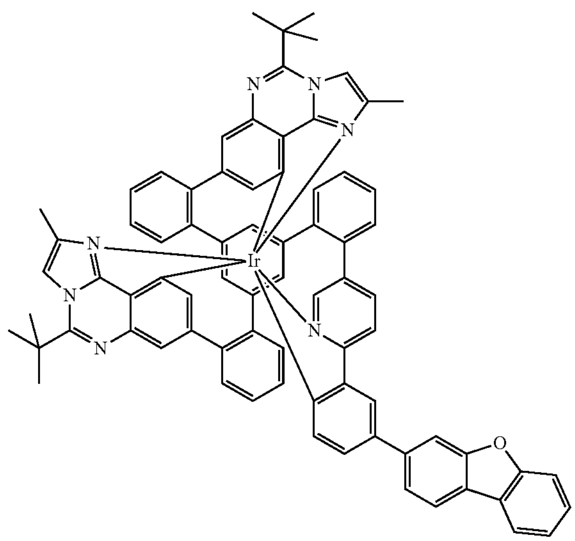
240
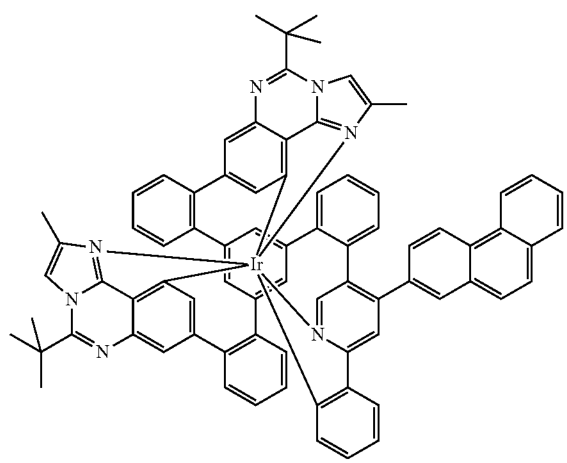
241
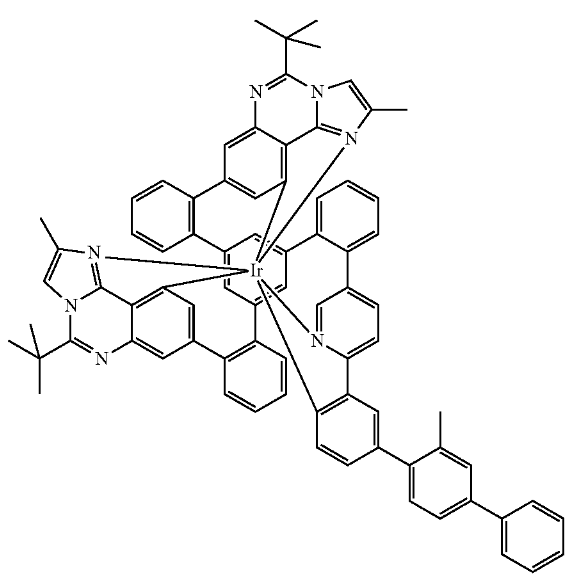
-continued
242
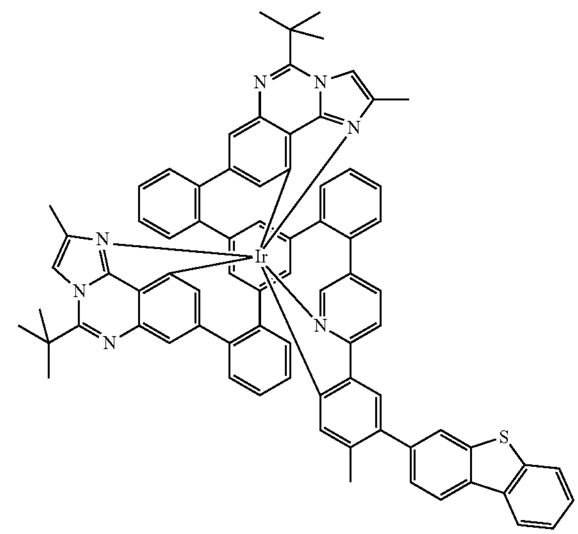
243
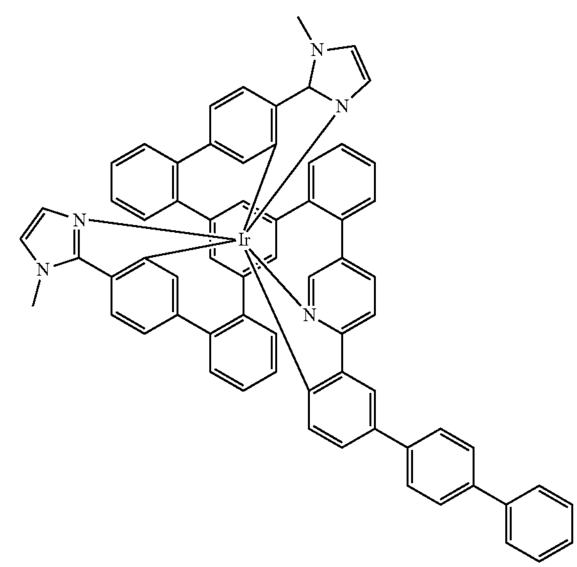
244
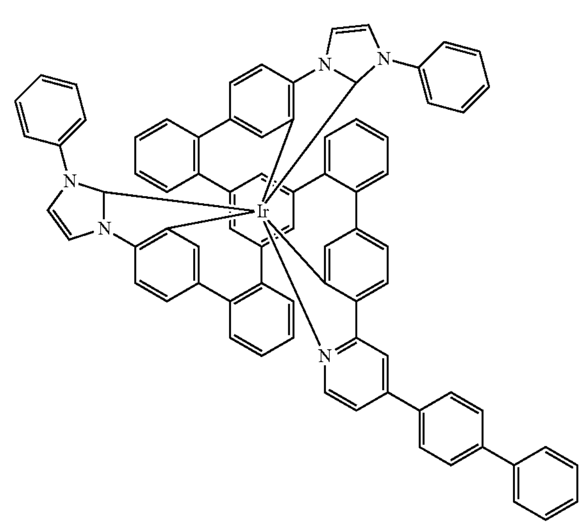

-continued
245
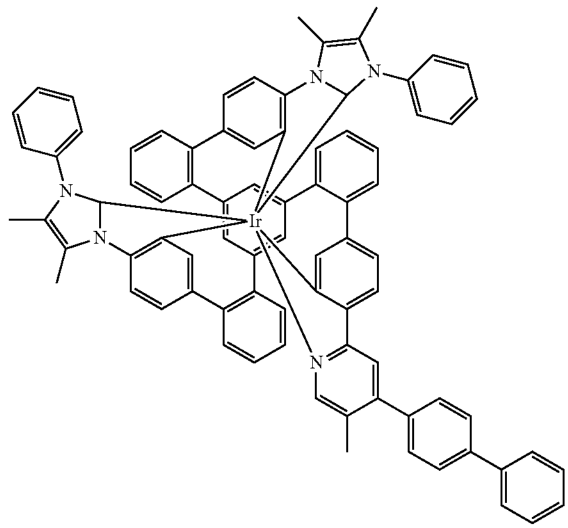
246
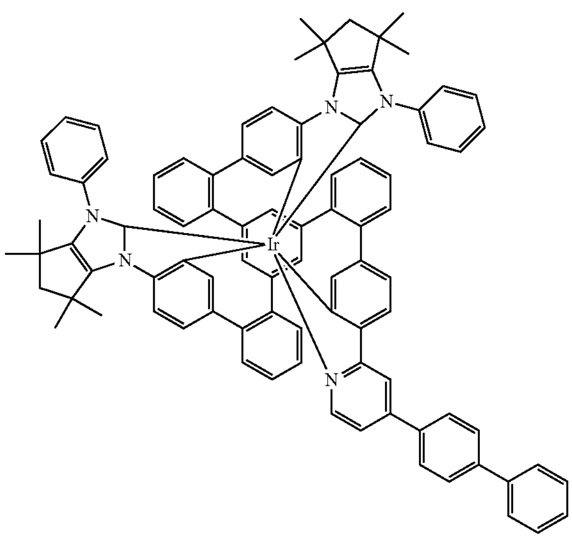
247
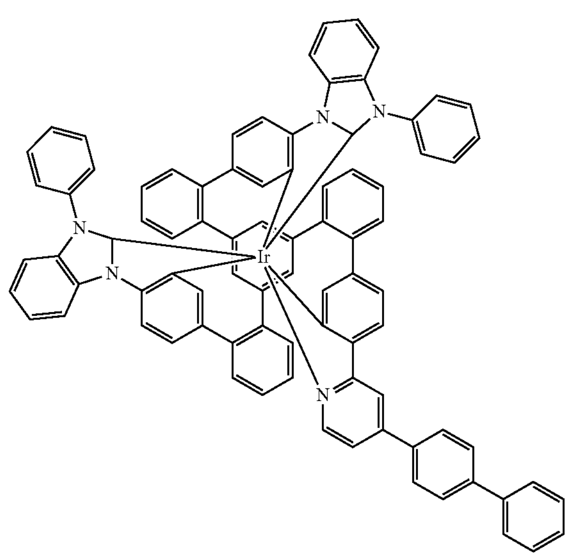
-continued
248
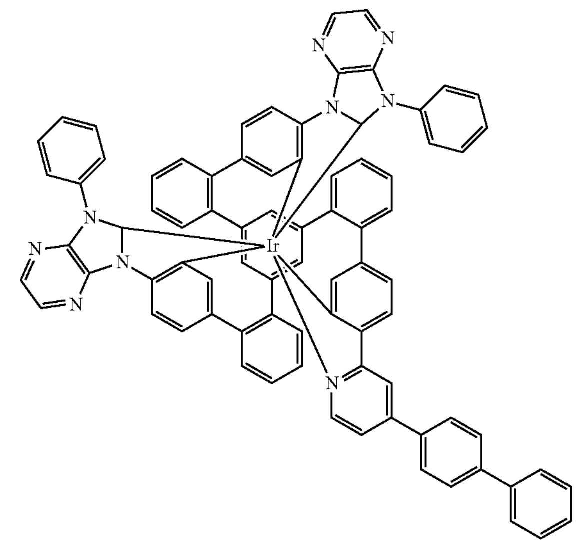
249
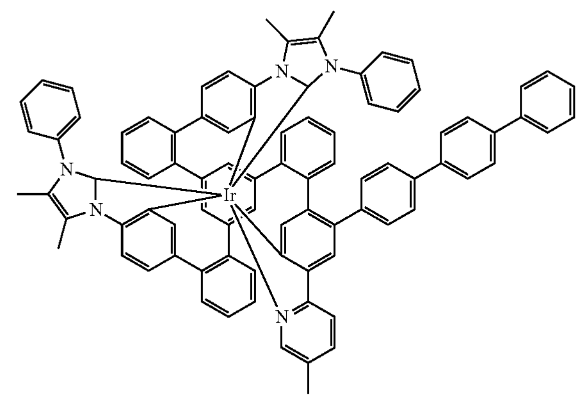
250
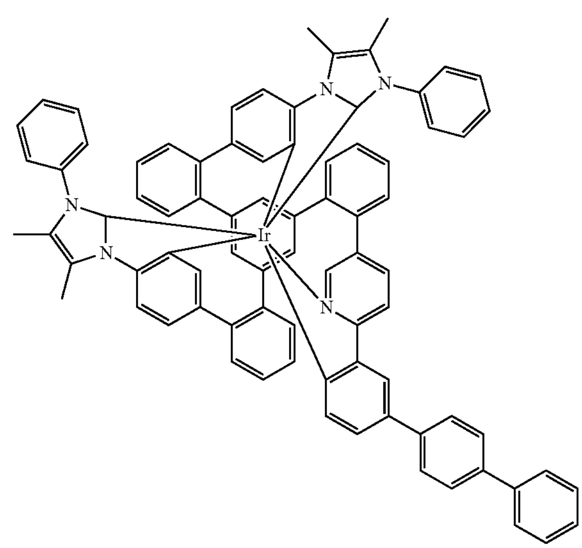

-continued
251
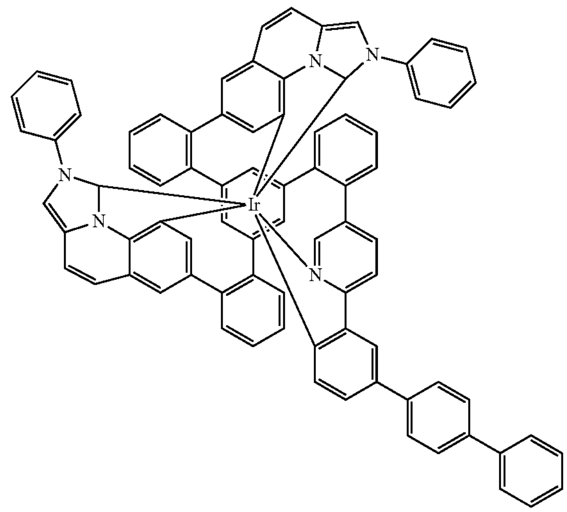
252
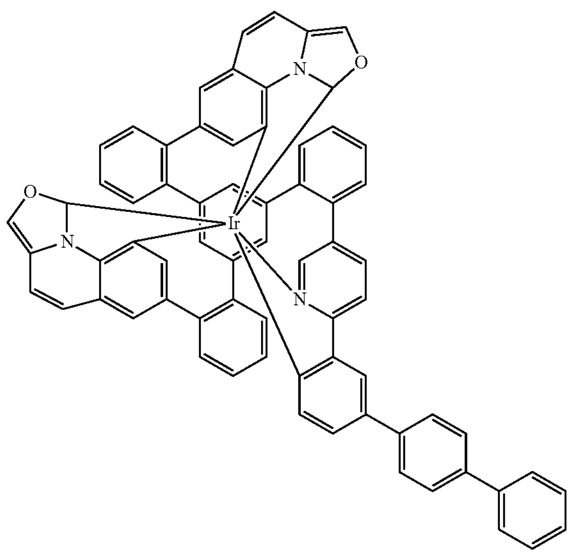
253
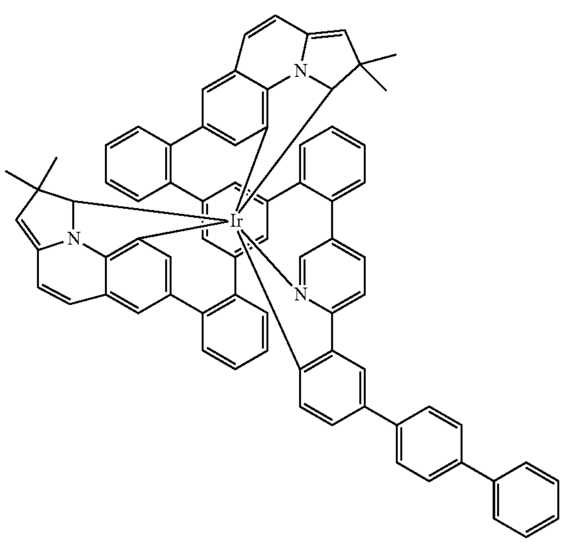
-continued
254
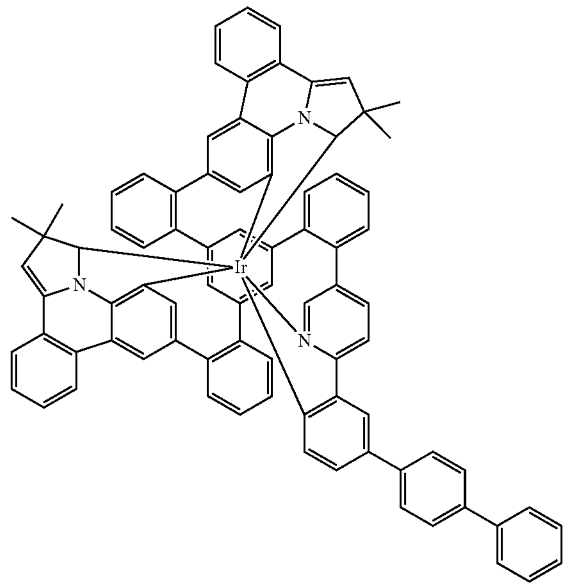
255
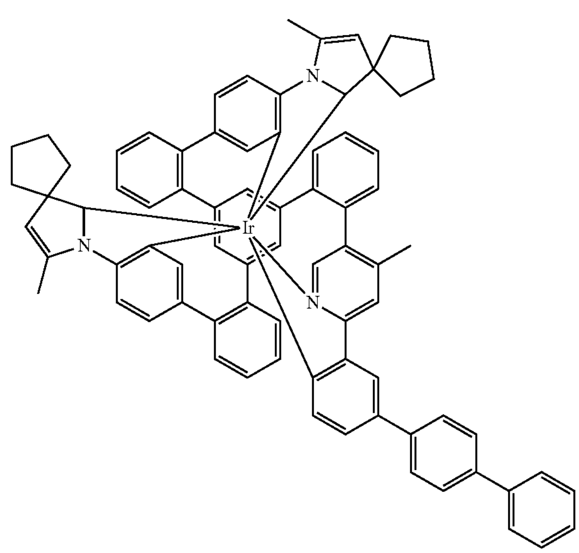

-continued
256
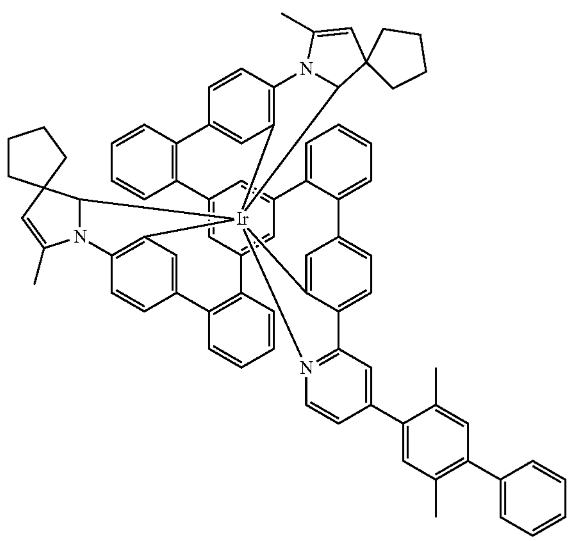
257
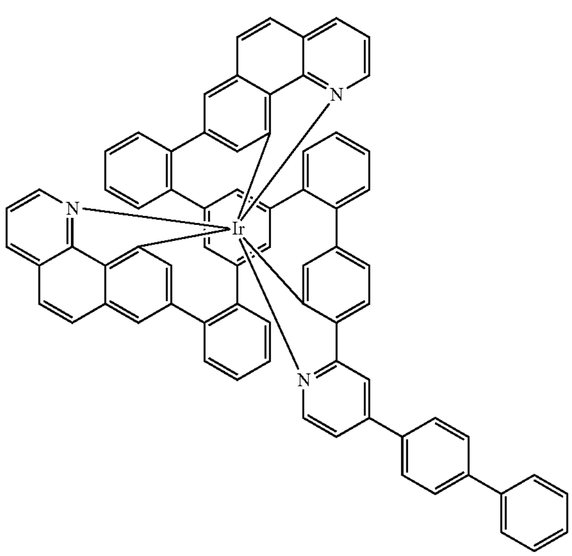
-continued
258
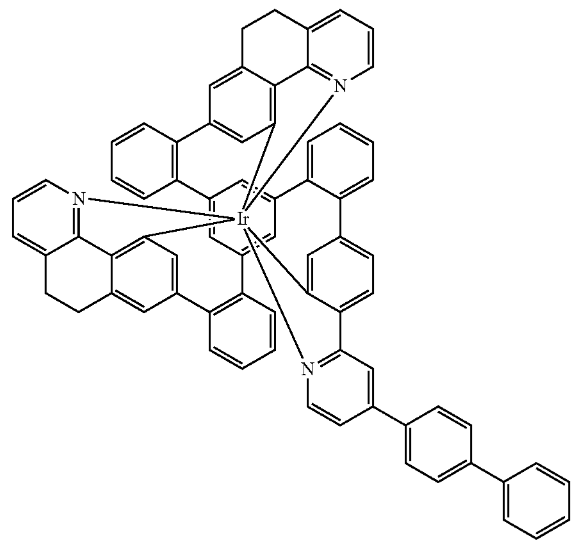
259
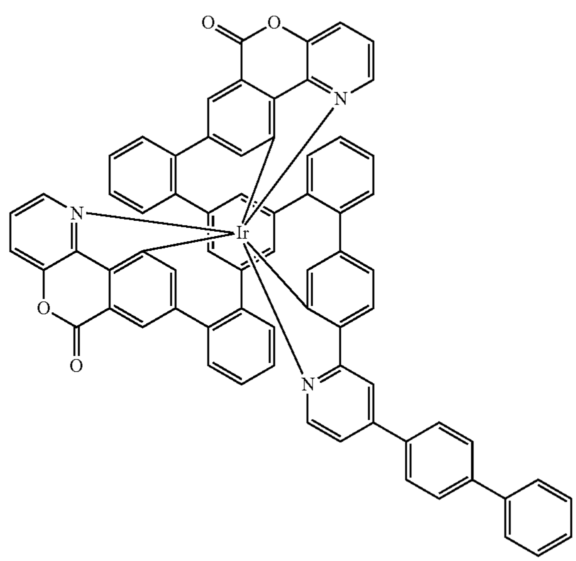

-continued
260
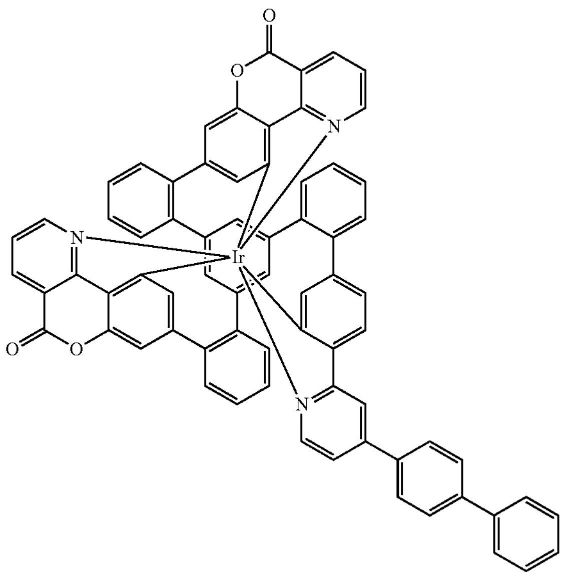
261
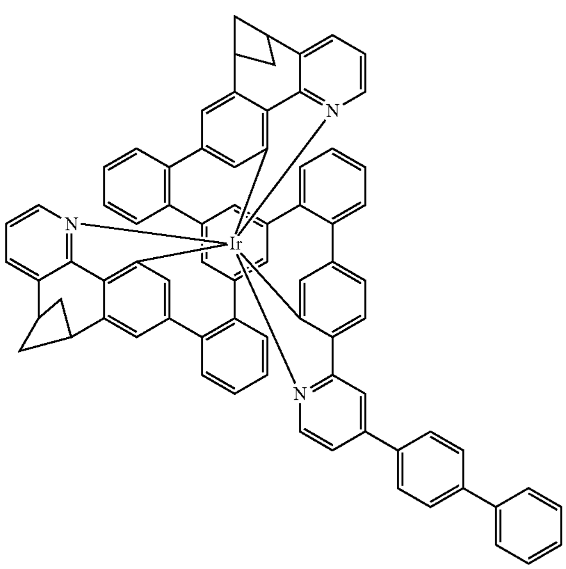
-continued
262
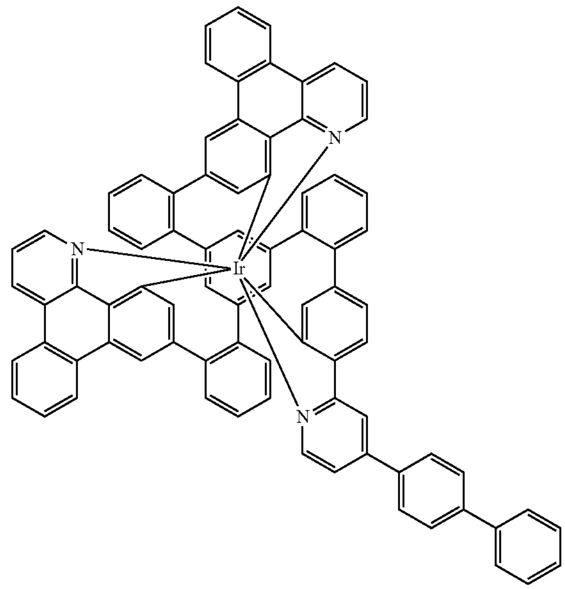
263
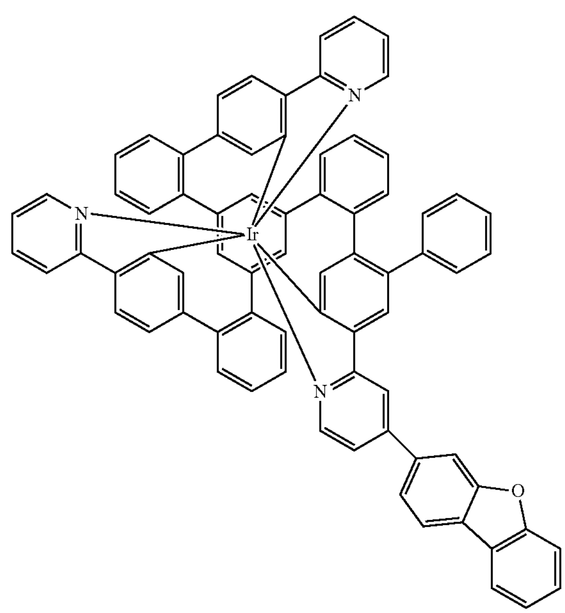

-continued
264
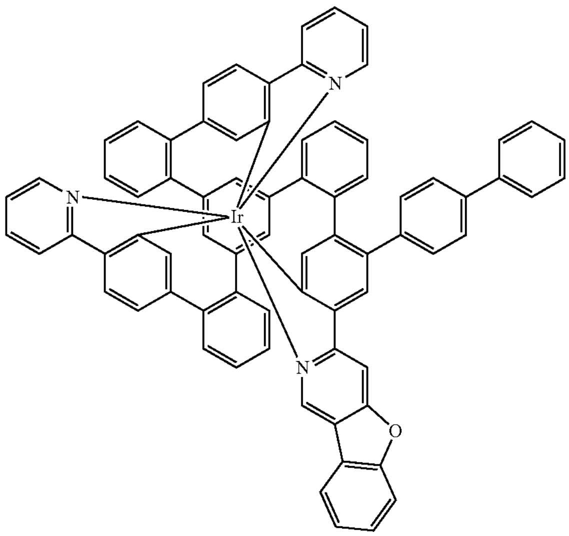
265
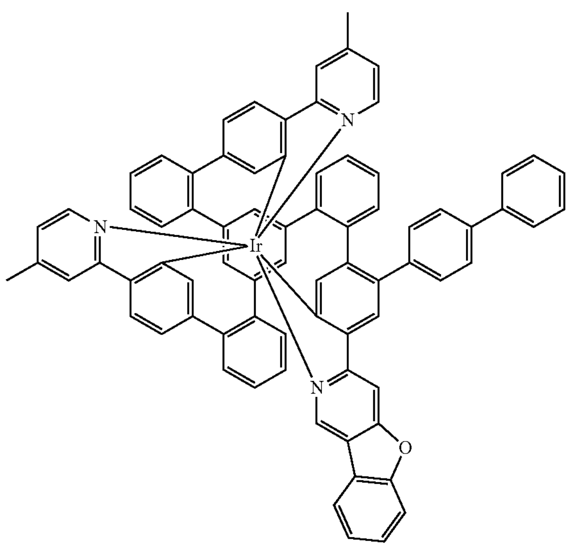
266
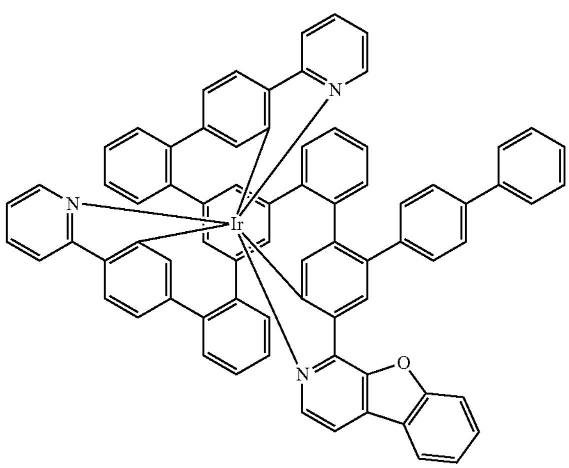
267
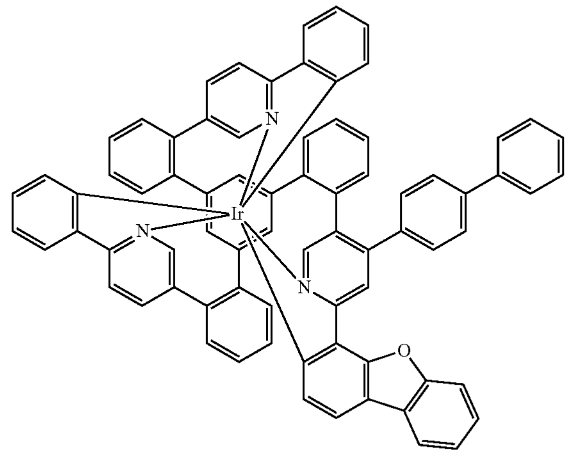
268
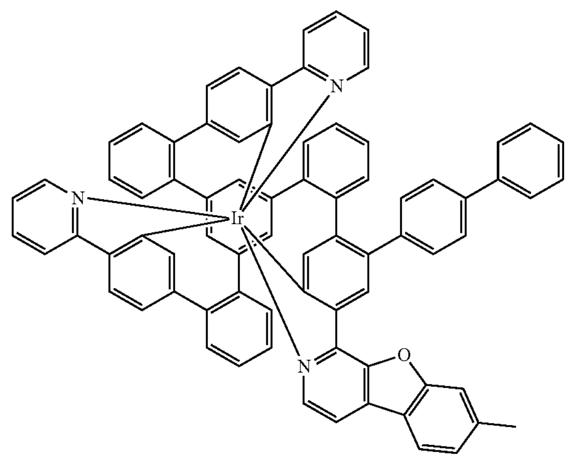
269
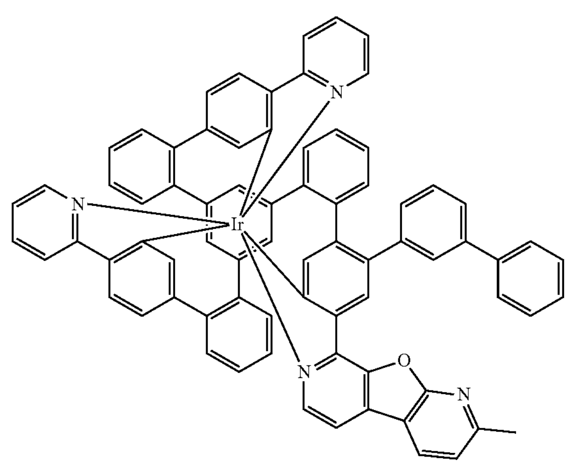

-continued
270
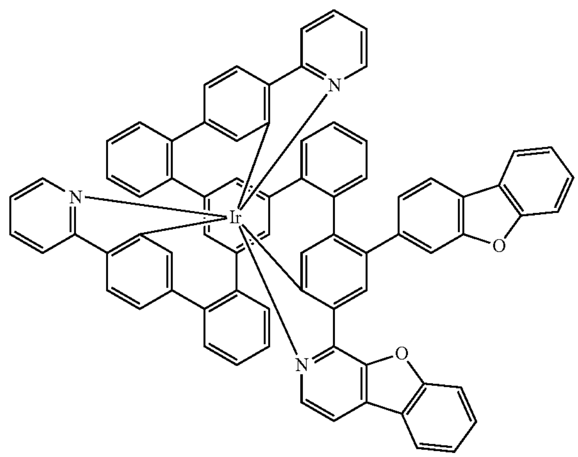
271
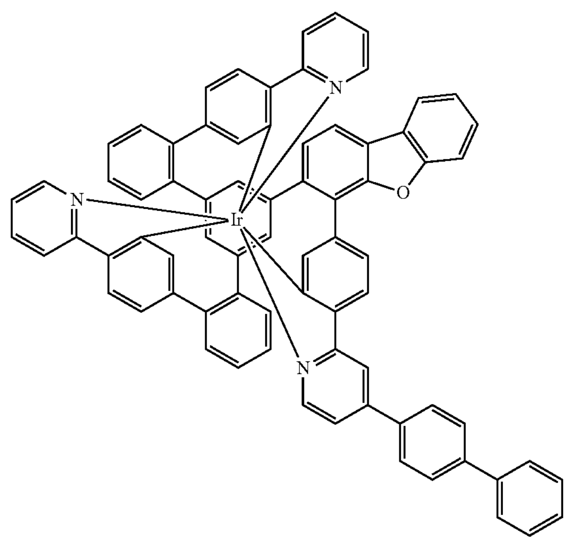
272
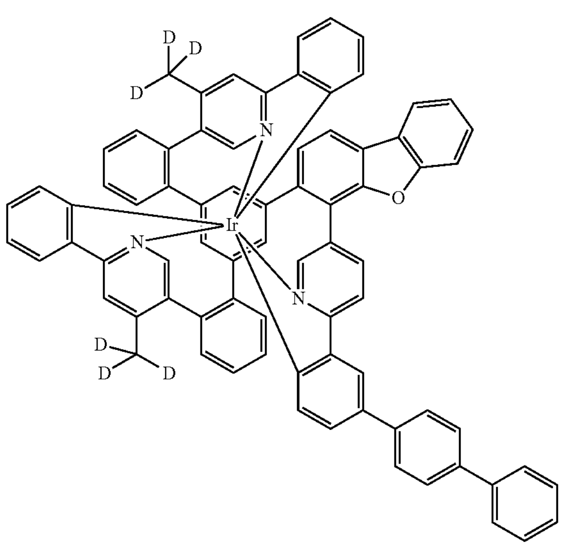
-continued
273
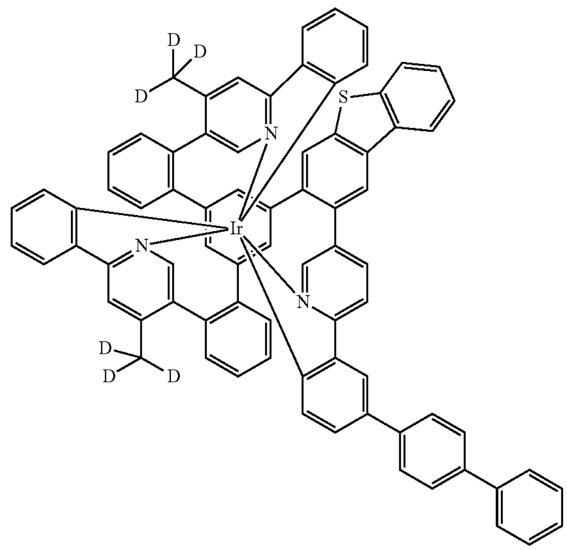
274
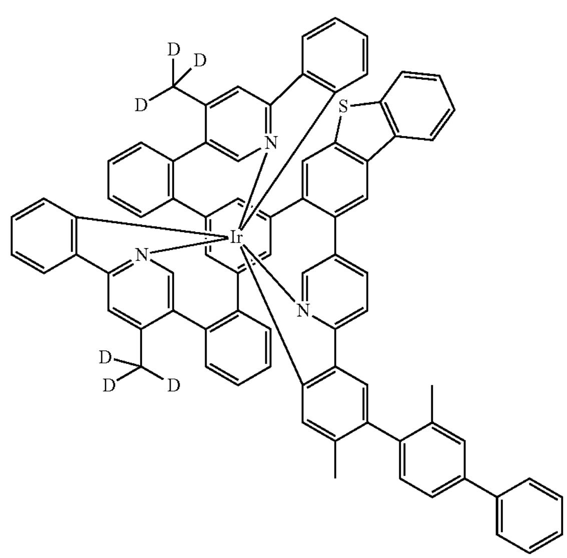

-continued
275
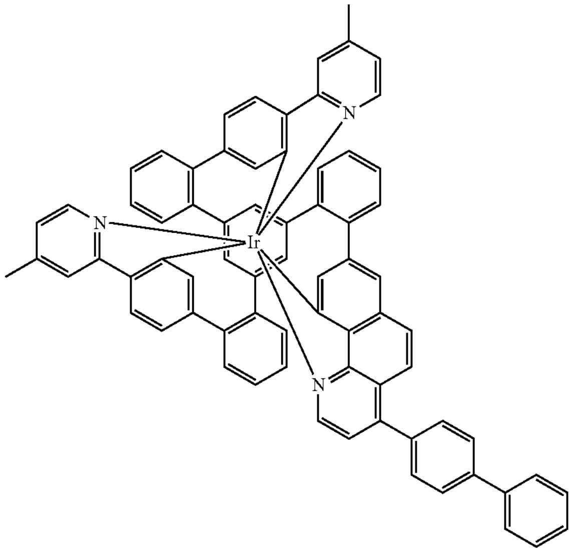
276
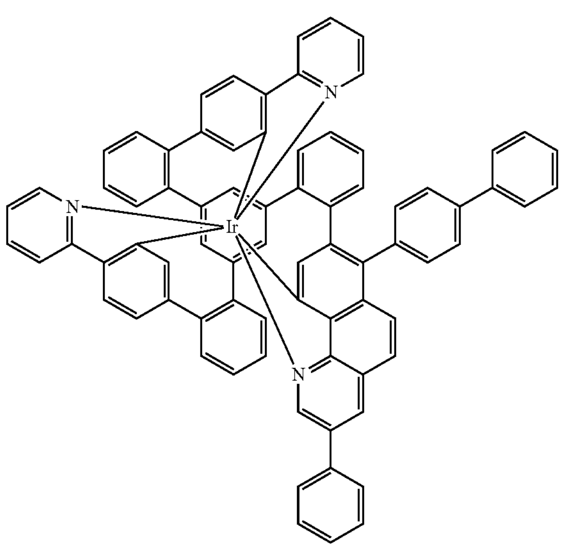
-continued
277
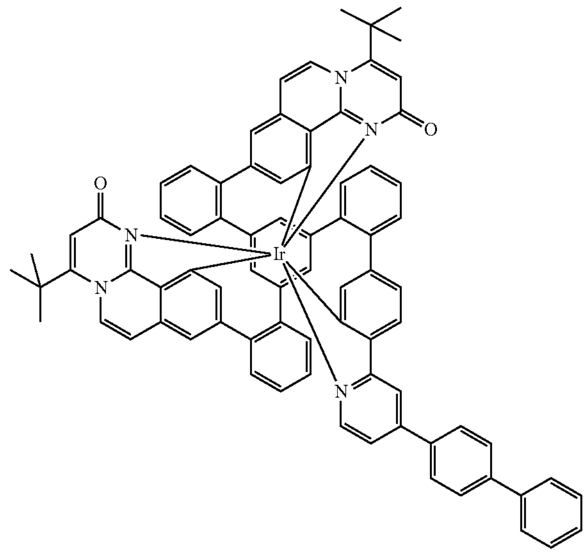
278
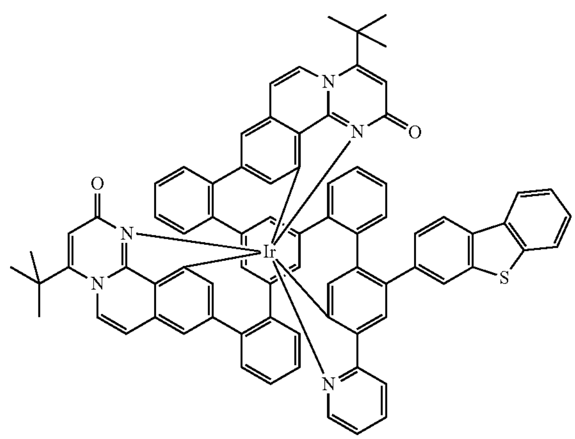
279
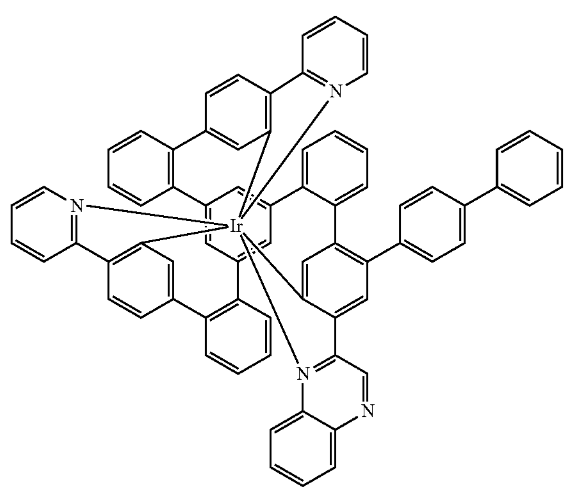

-continued
280
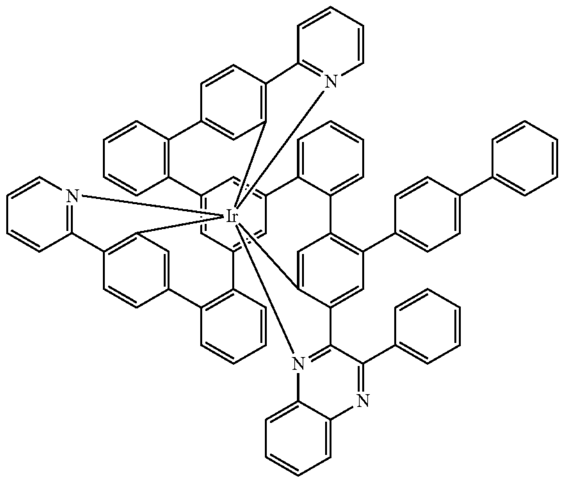
281
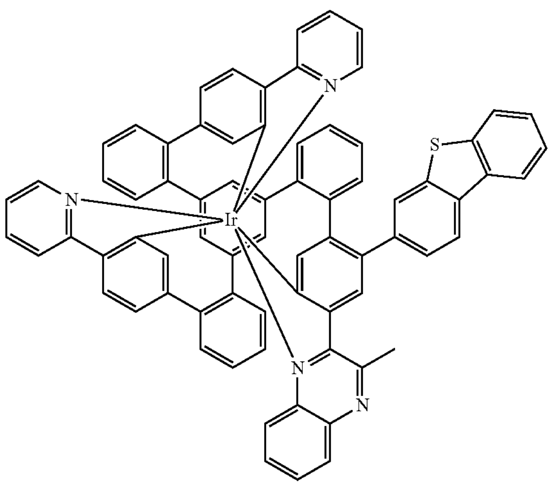
282
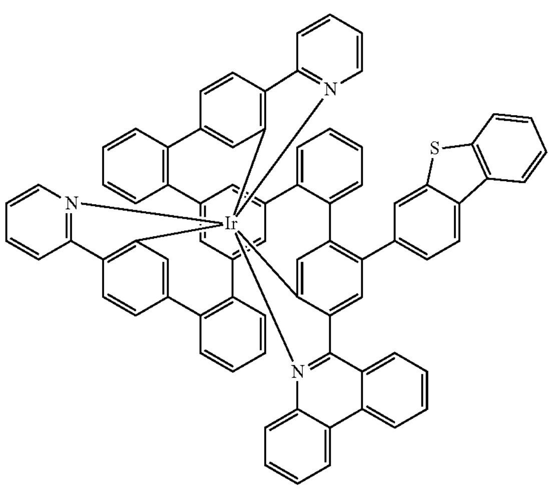
-continued
283
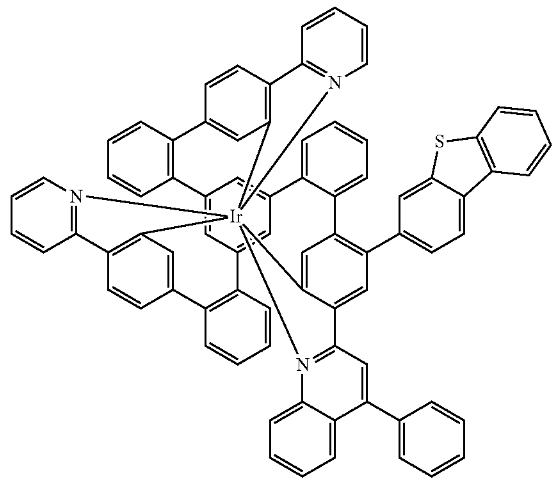
284
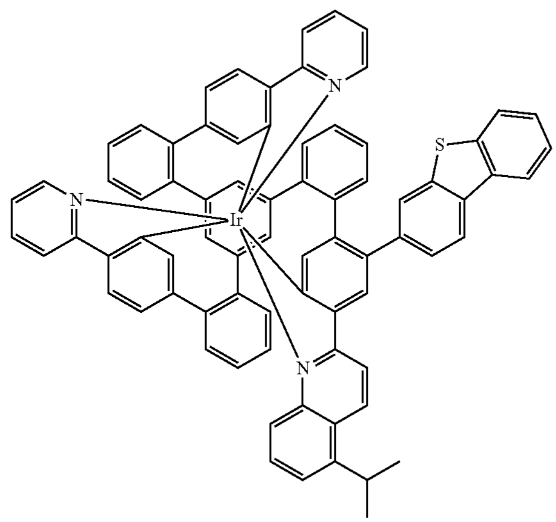
285
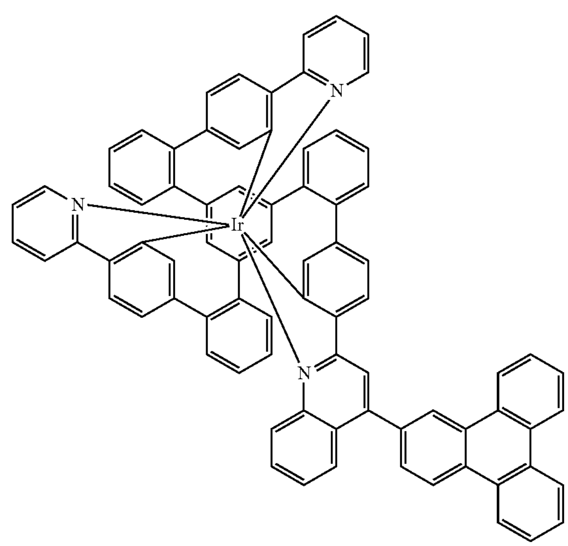

286
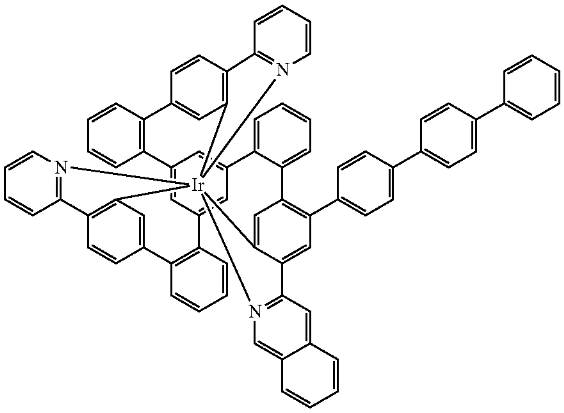
287
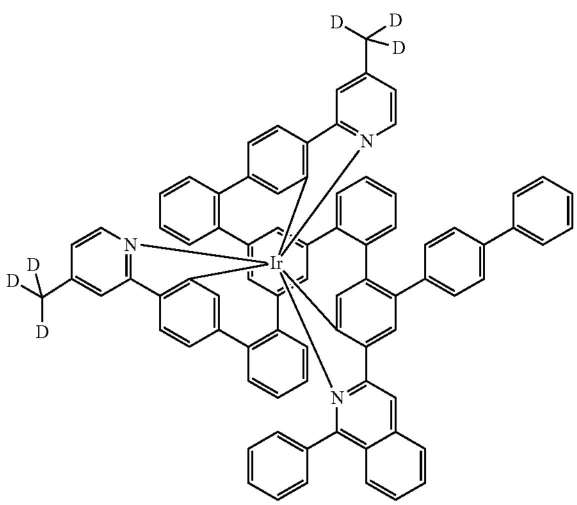
288
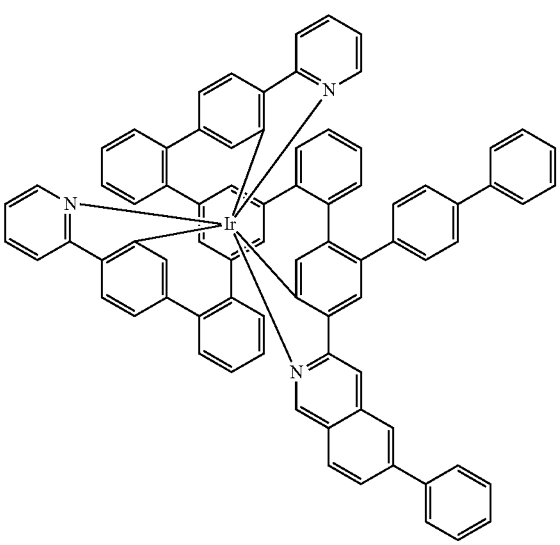
289
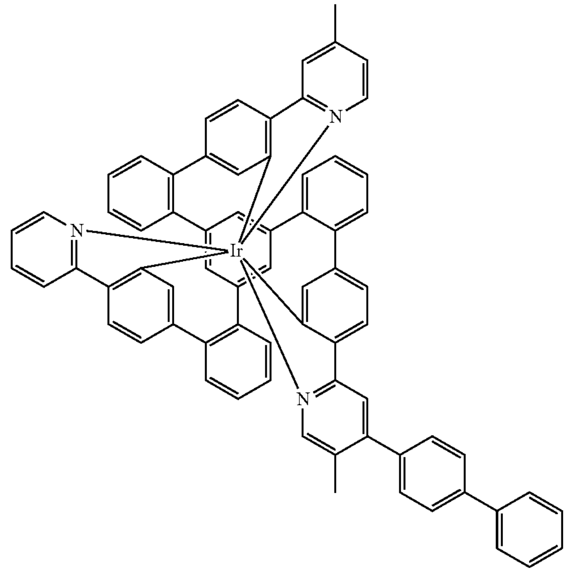
290
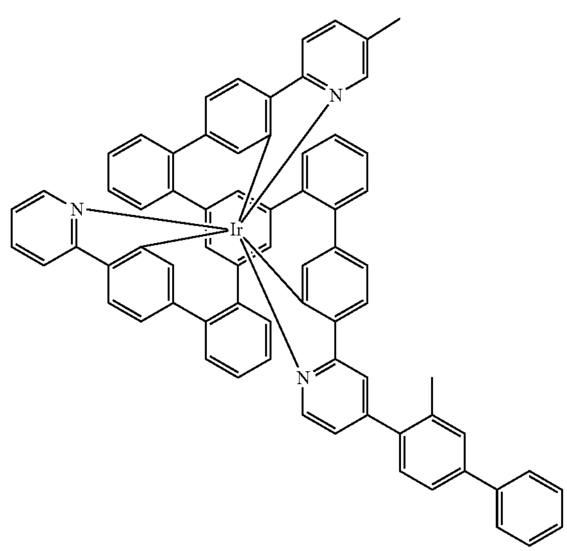

-continued
291
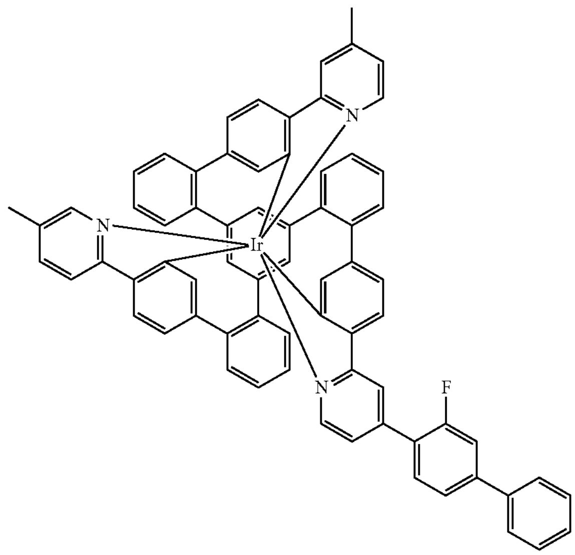
292
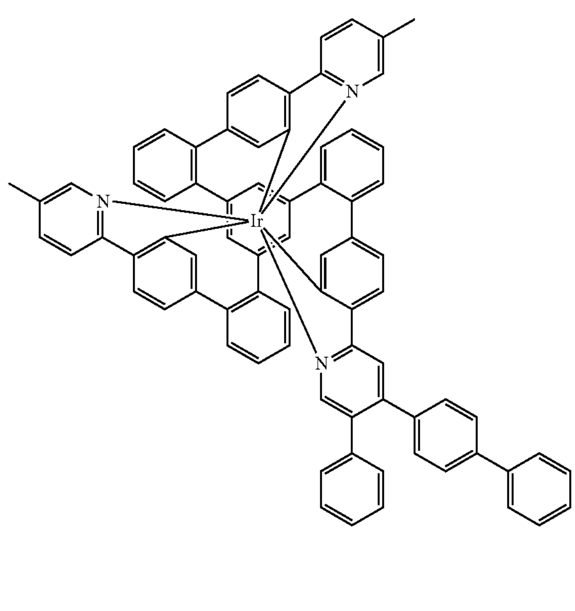
-continued
293
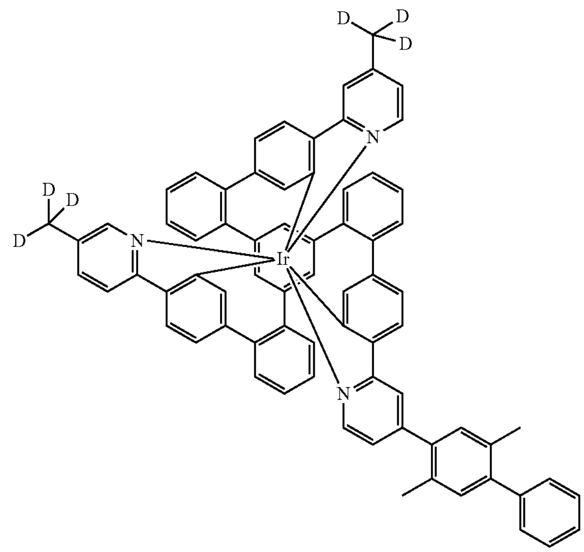
294
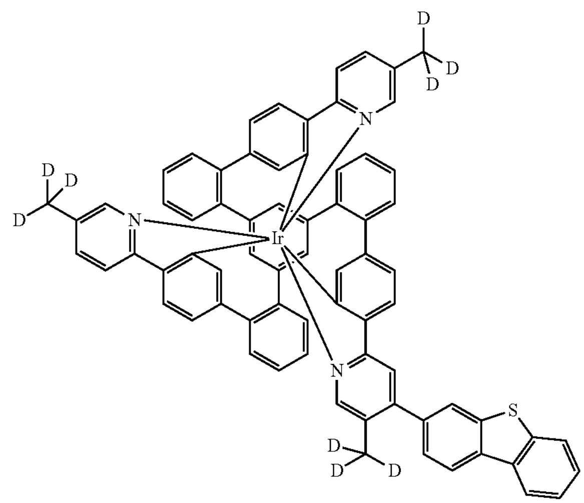
295
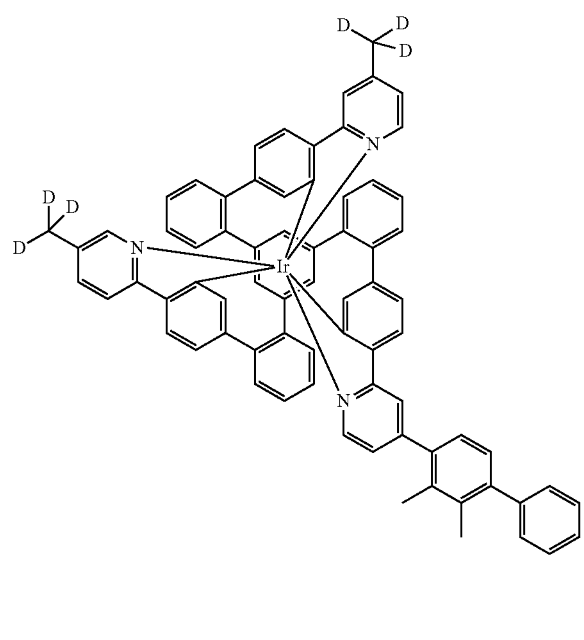

296
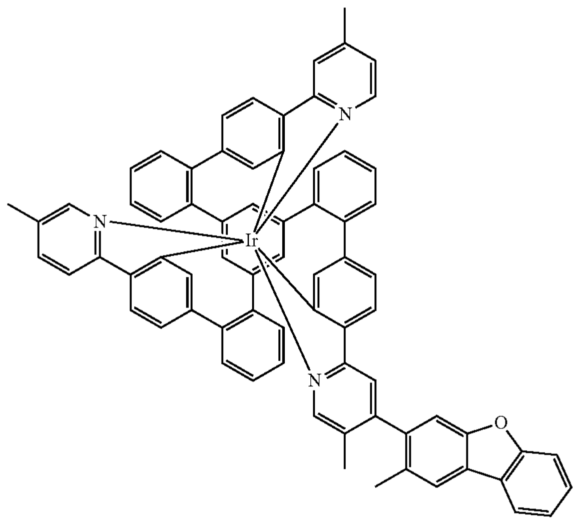
297
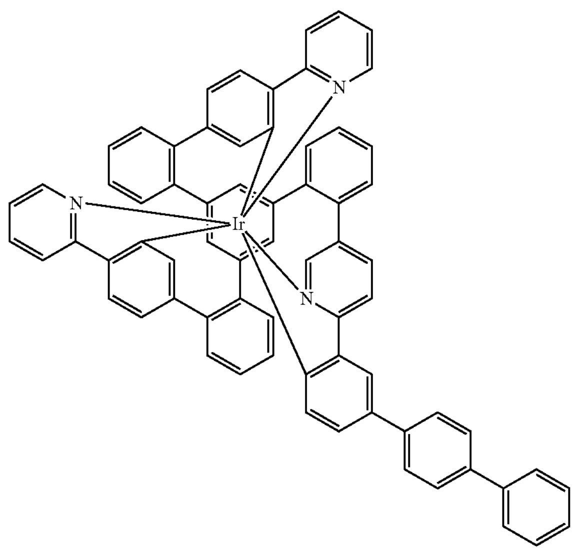
298
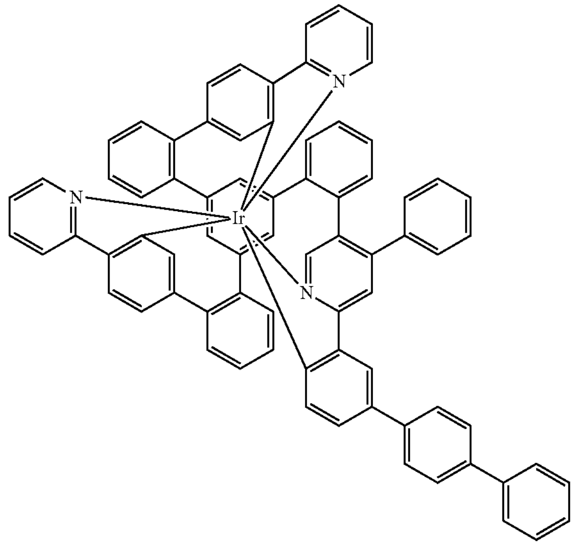
299
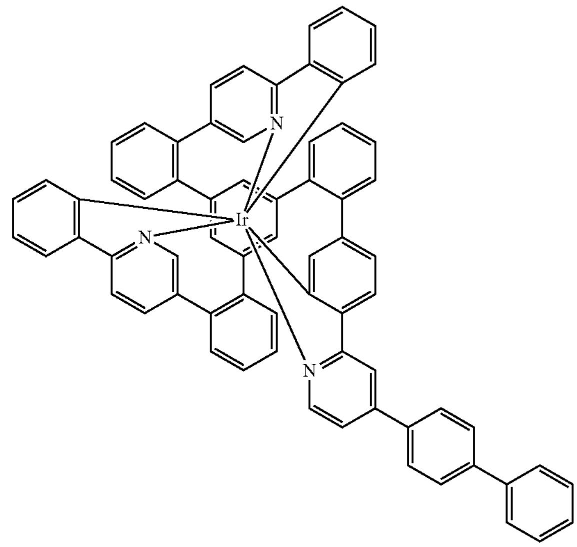
300
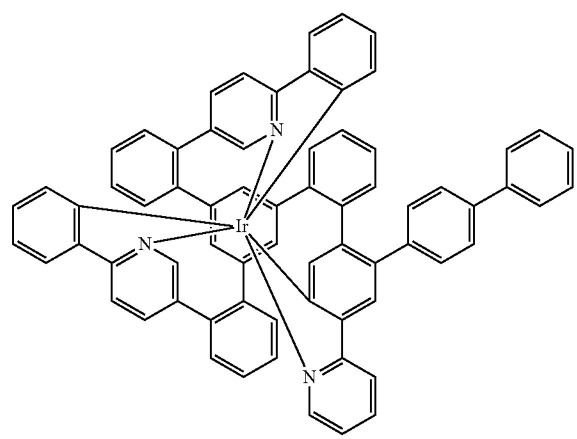
301
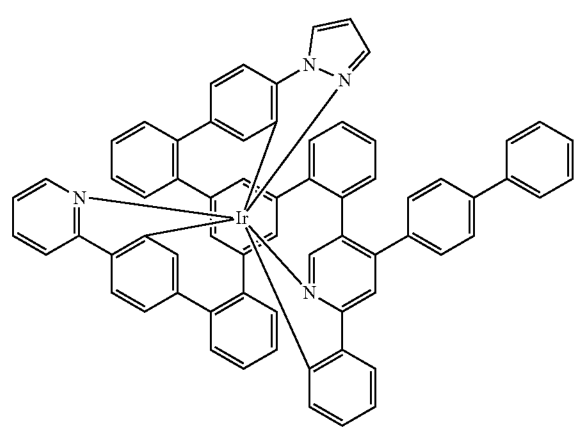

302
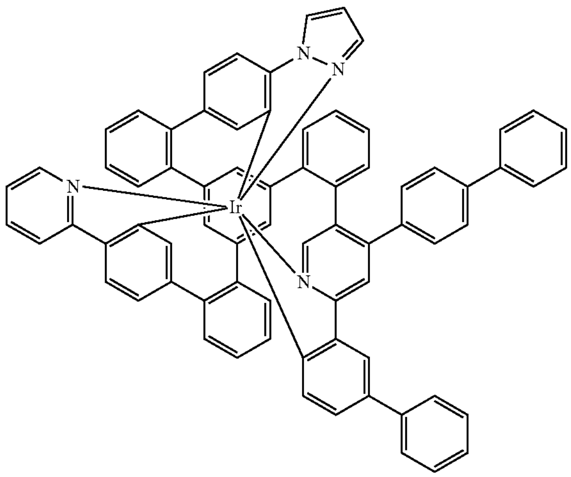
303
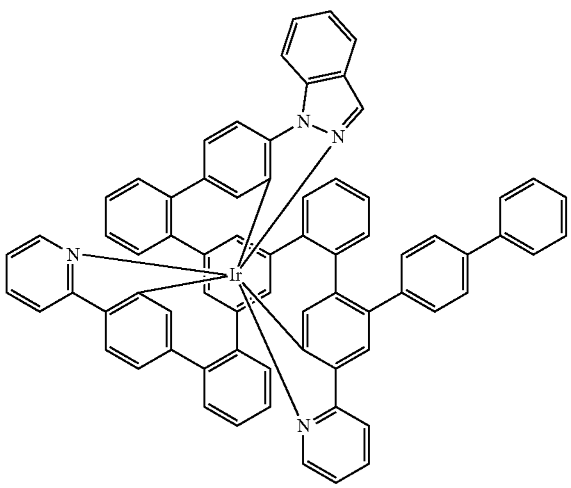
304
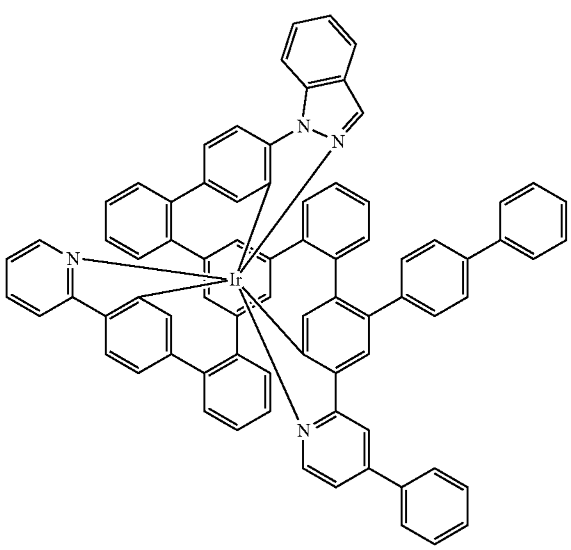
305
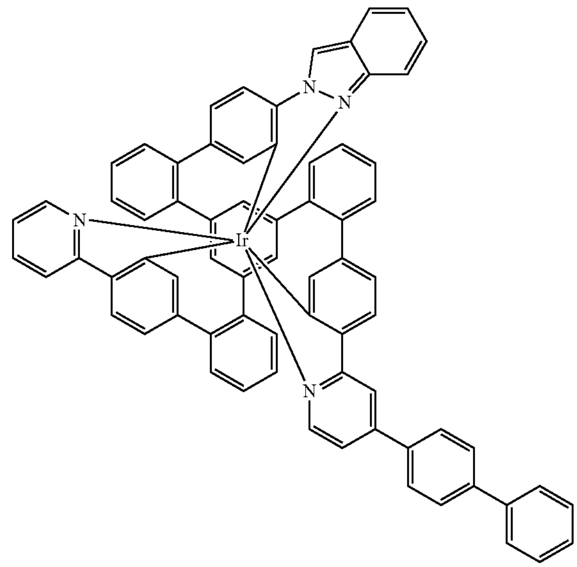
306
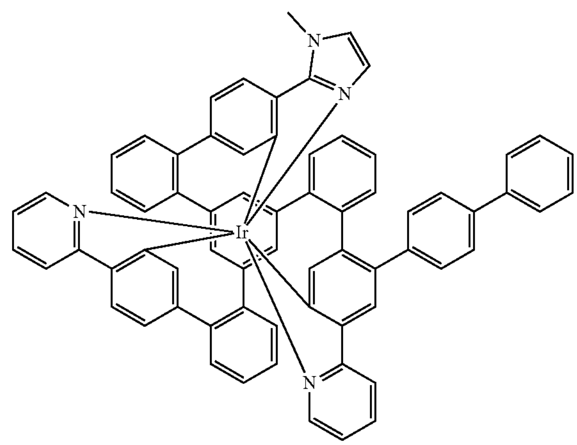
307
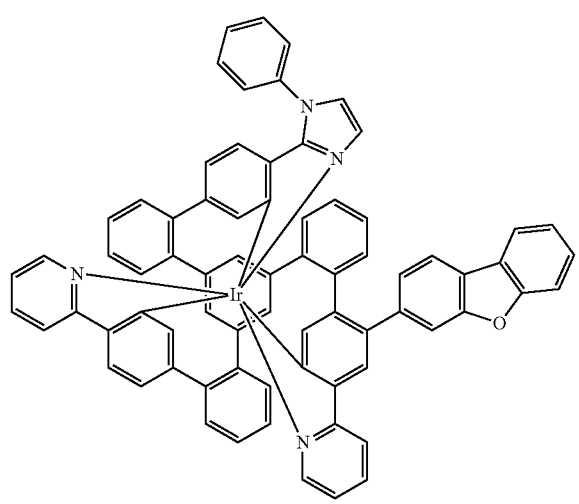

308
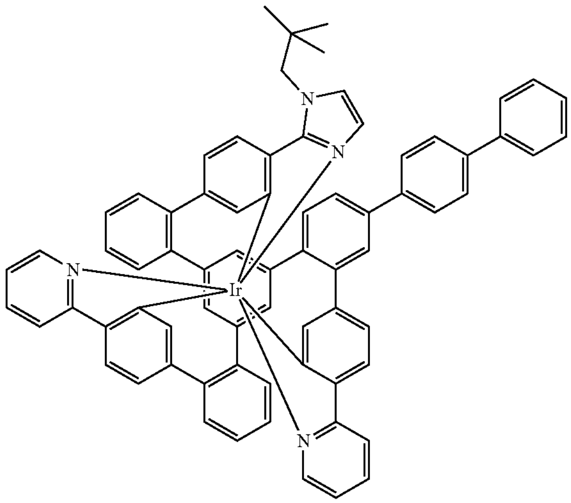
309
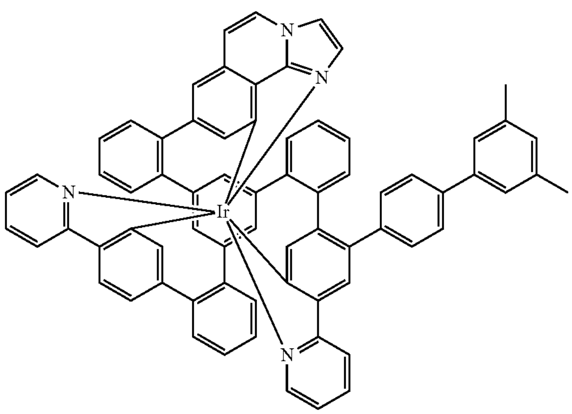
310
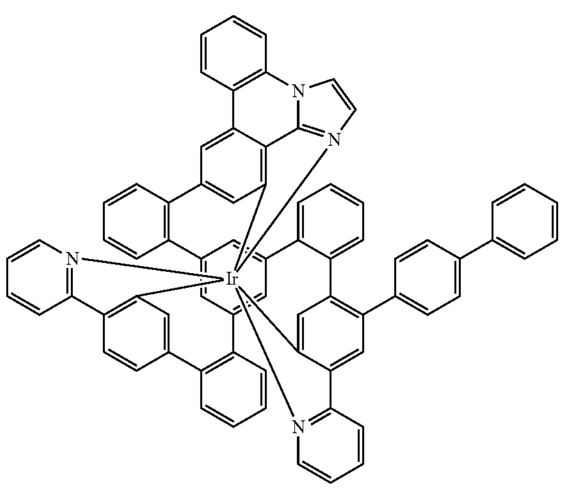
311
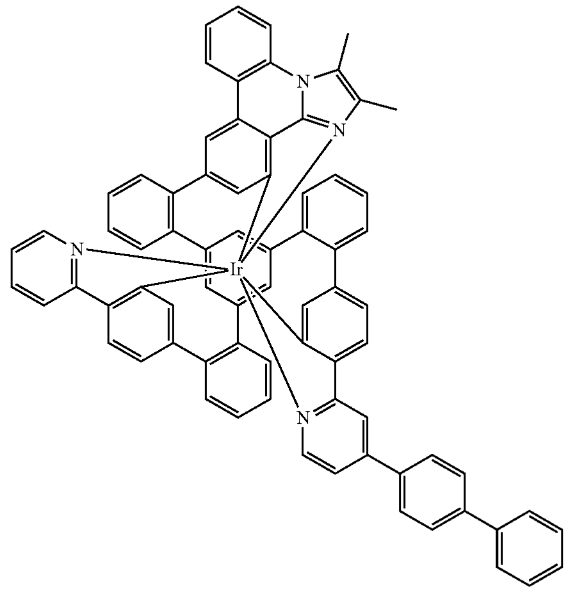
312
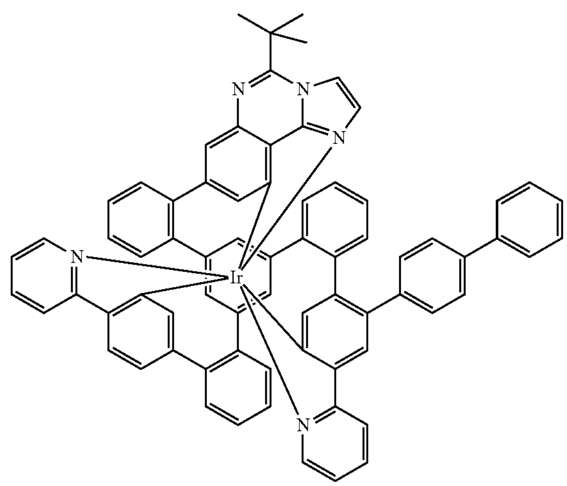
313
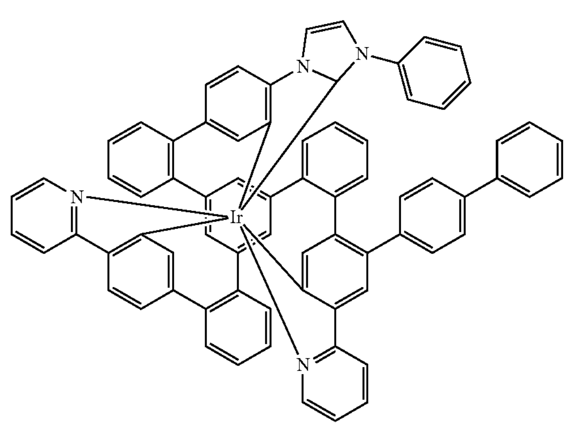

-continued
314
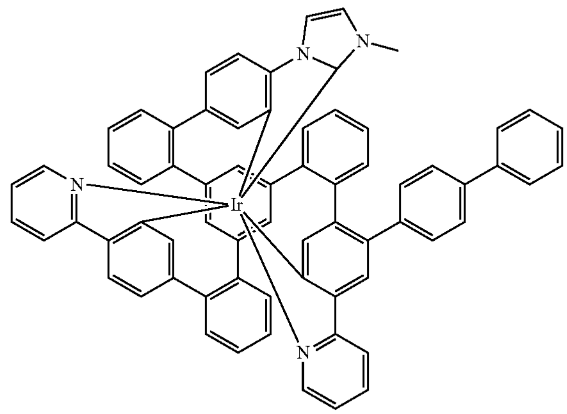
315
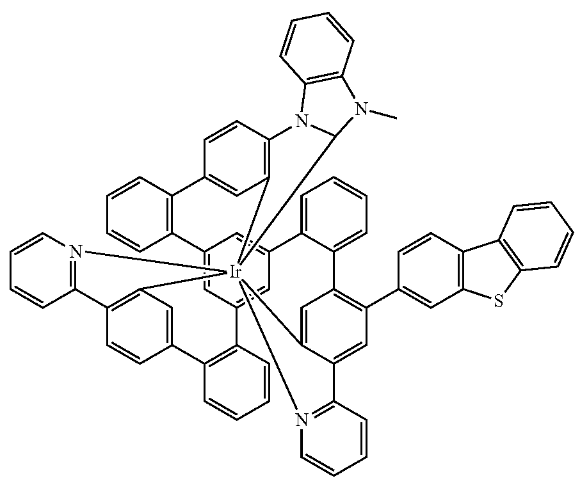
316
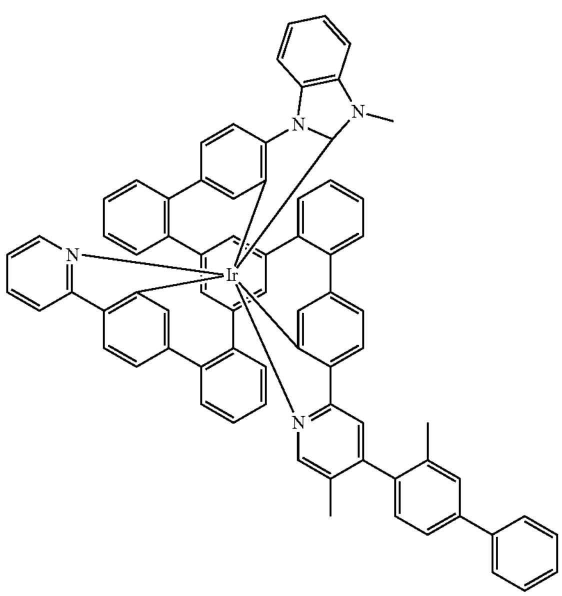
-continued
317
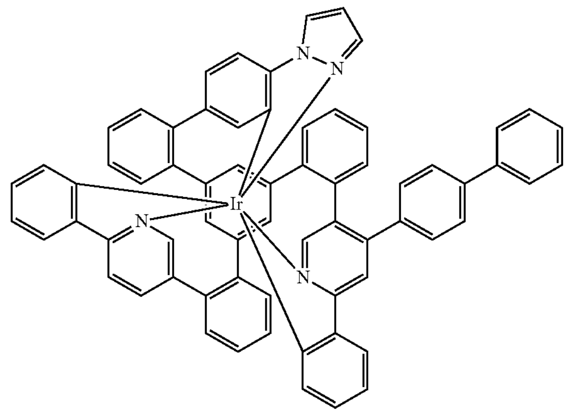
318
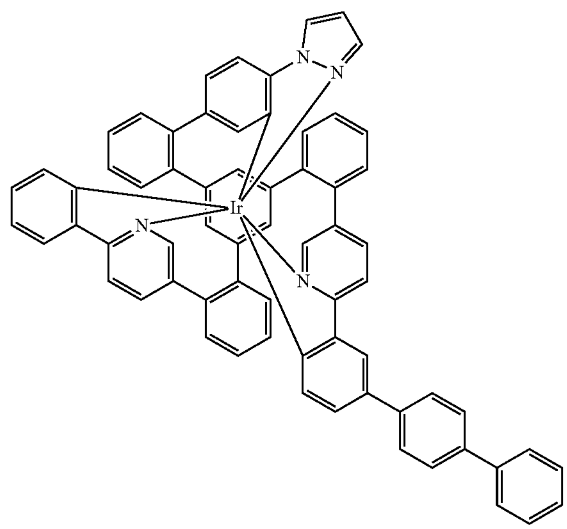
319
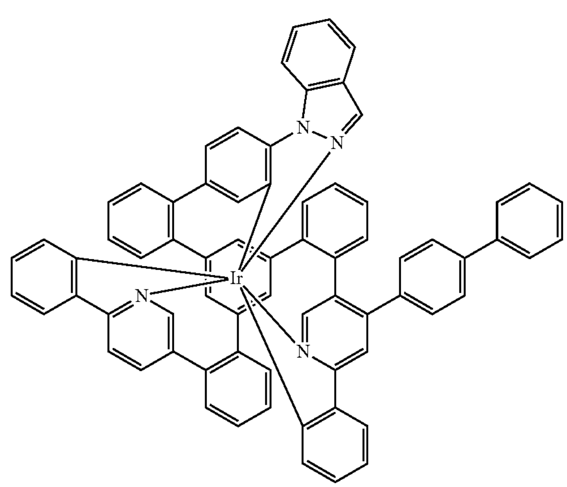

-continued
320
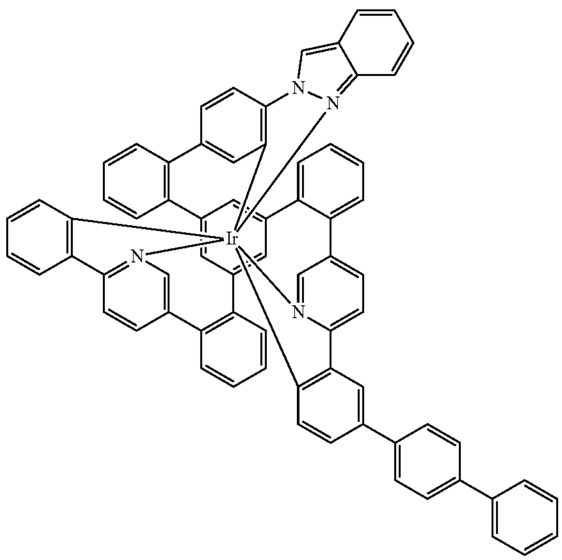
321
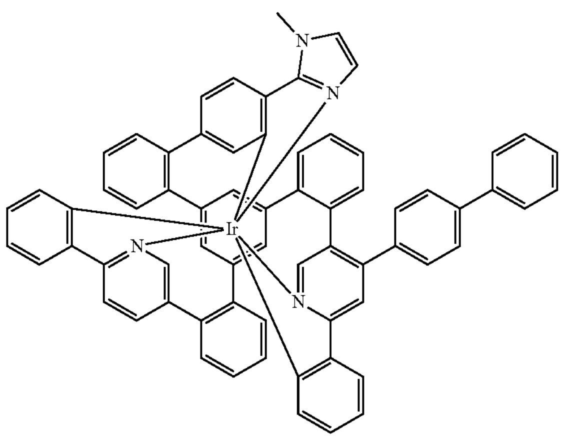
322
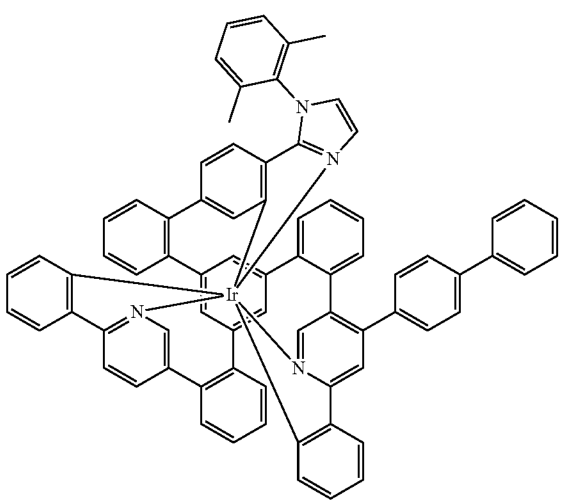
-continued
323
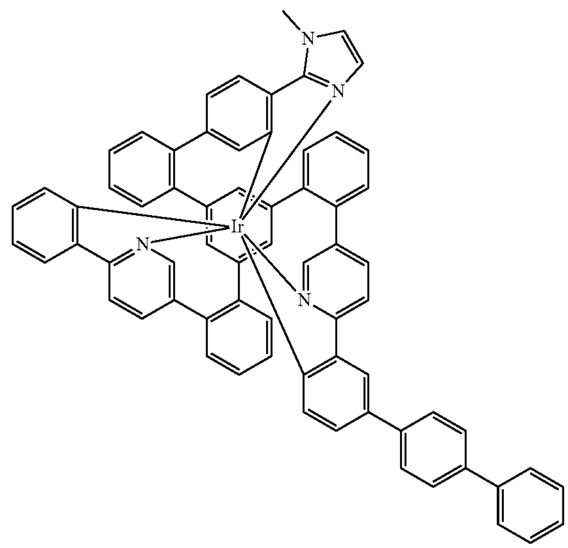
324
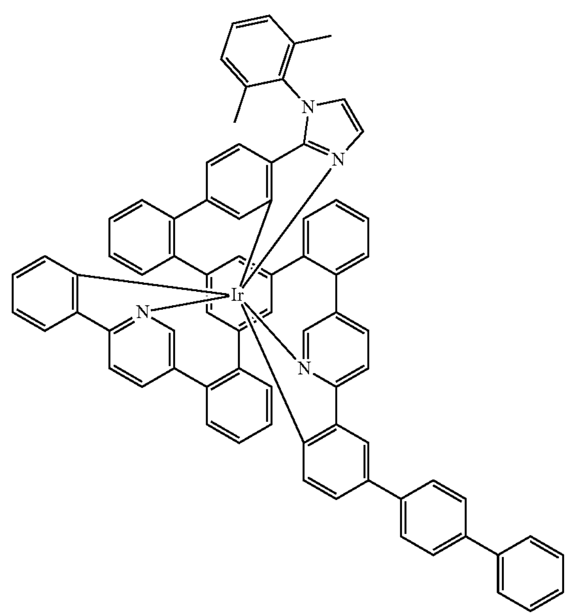

325
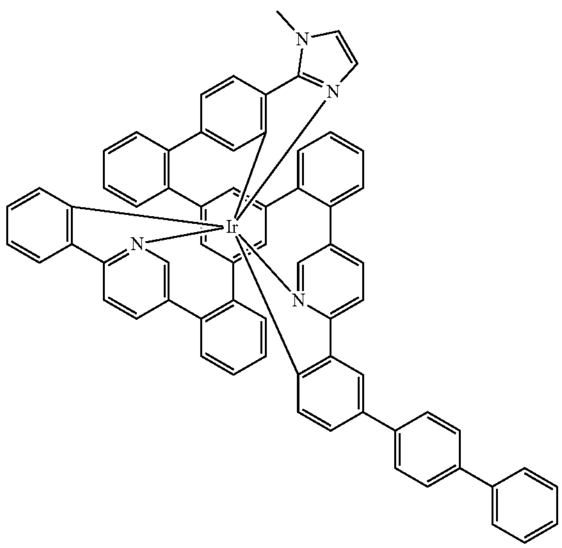
326
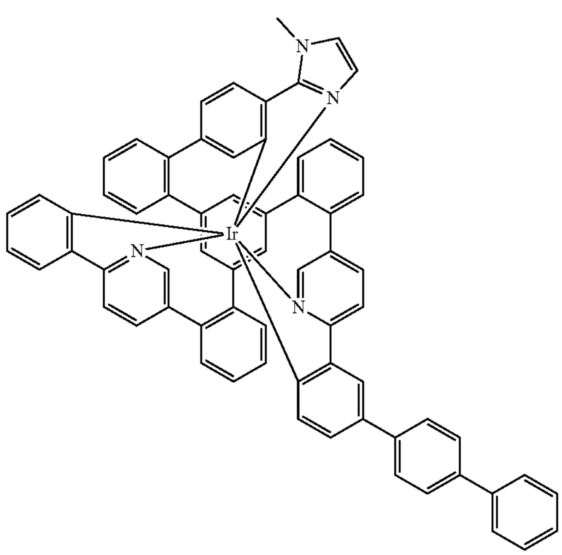
327
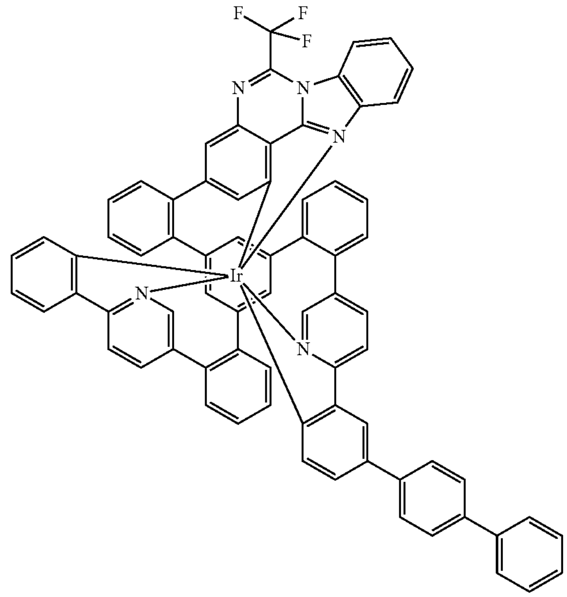
328
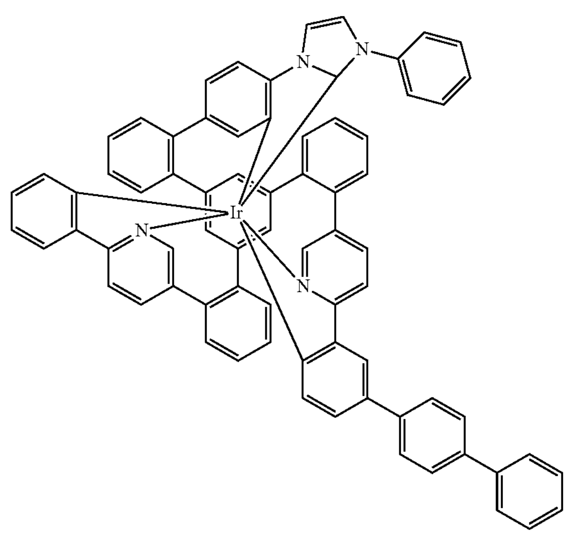

-continued
329
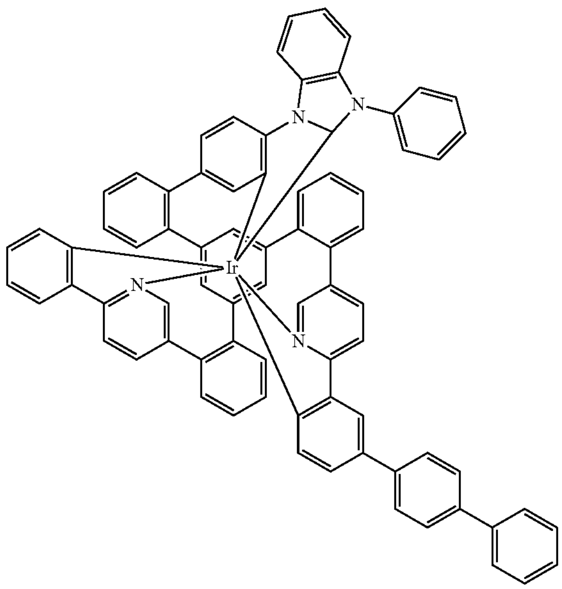
330
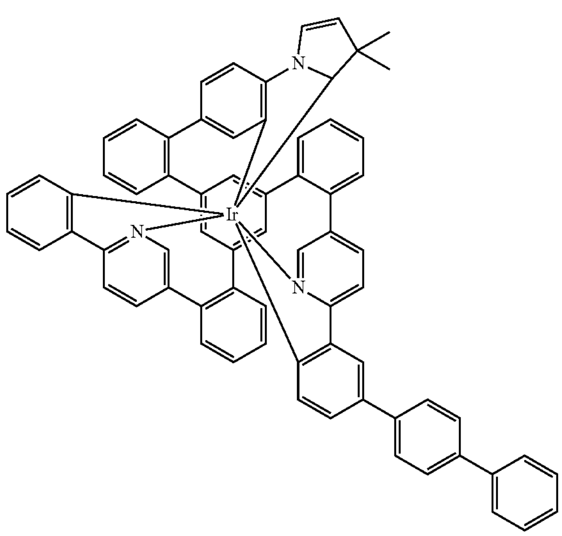
-continued
331
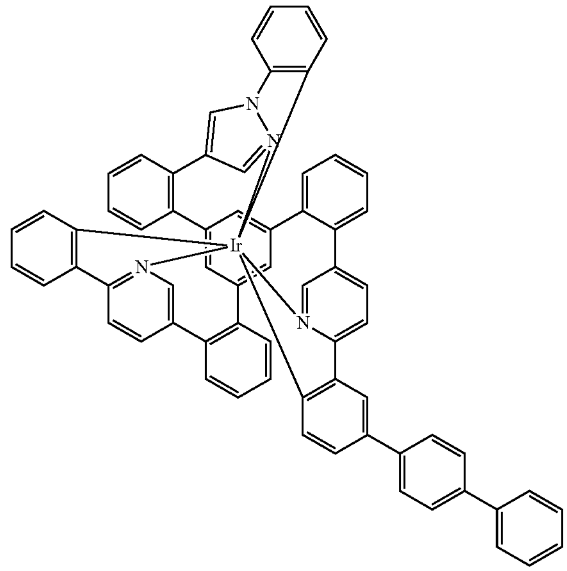
332
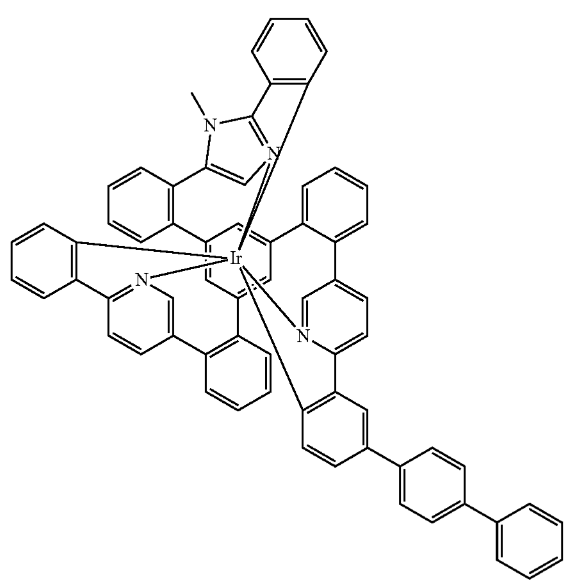

-continued
333
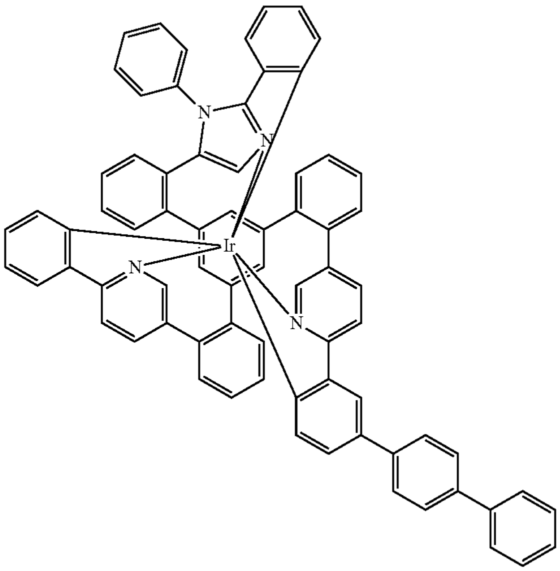
335
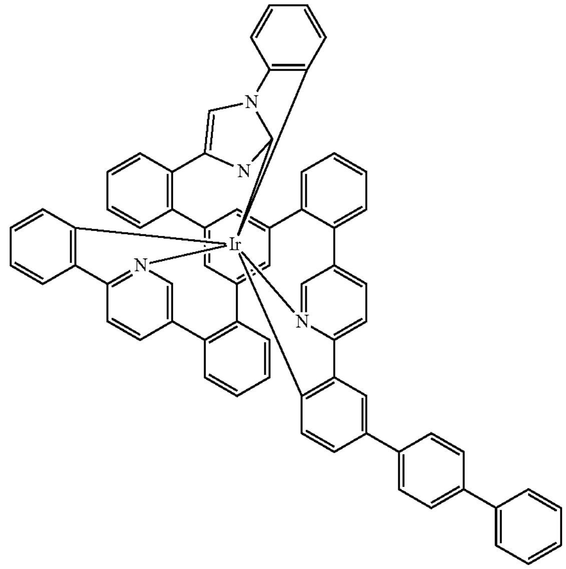
334
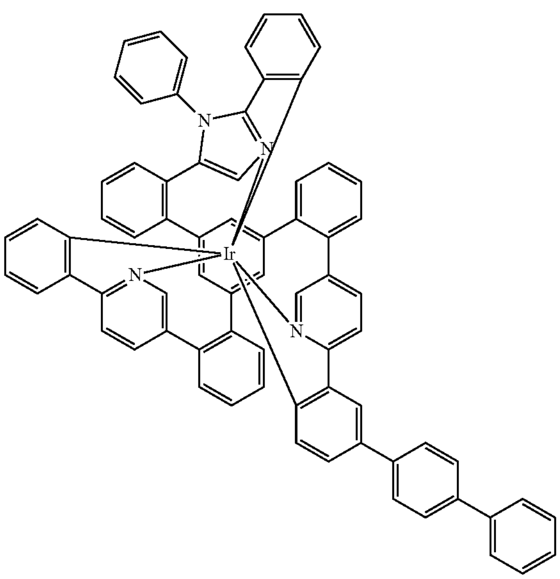
336
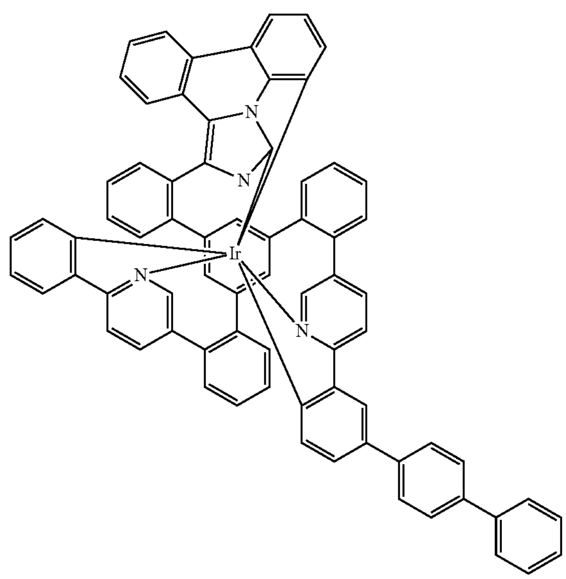

-continued
337
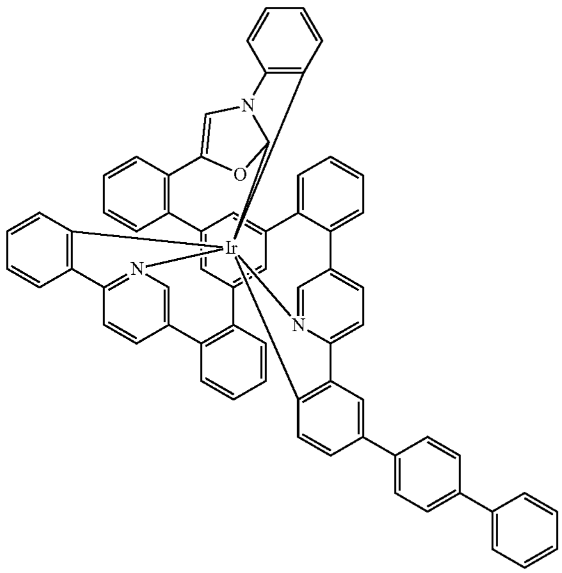
338
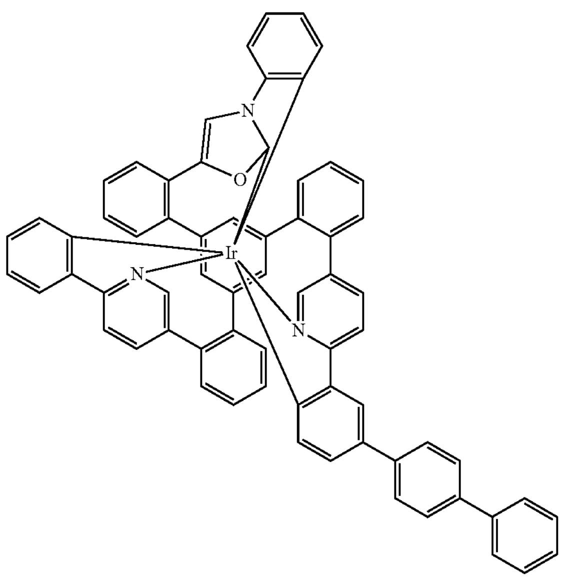
339
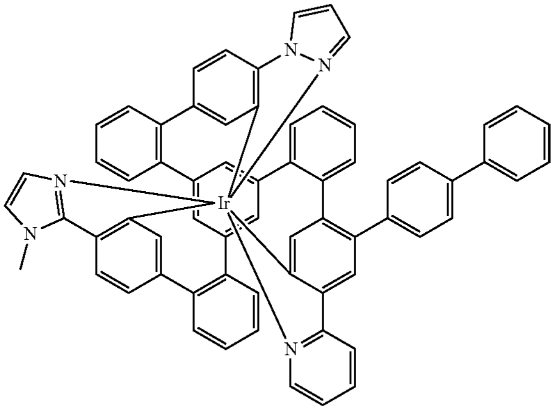
-continued
340
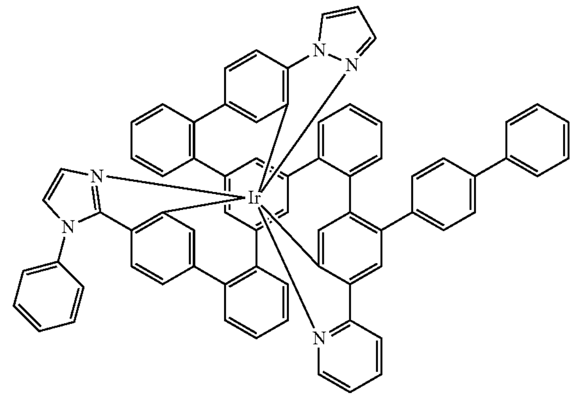
341
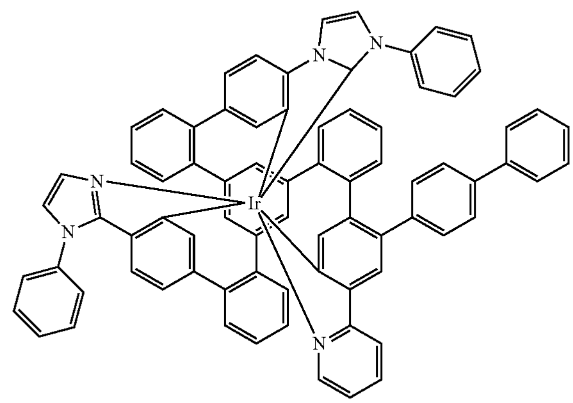
342
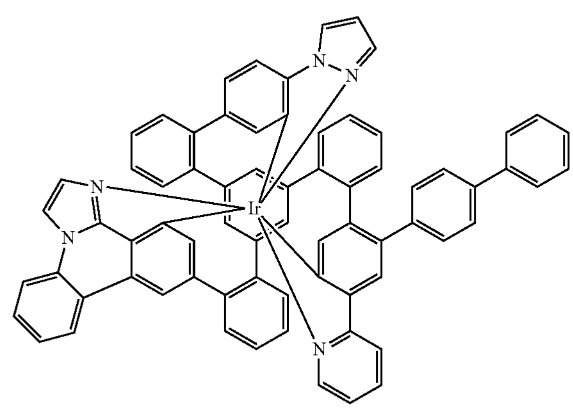
343
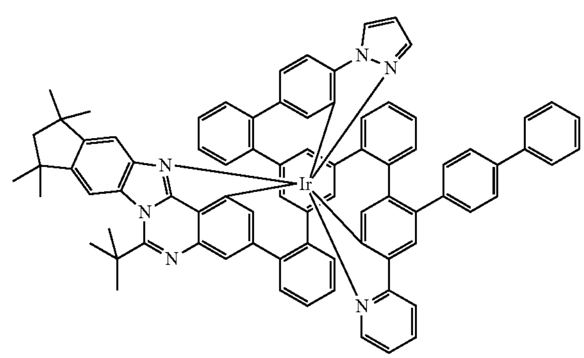

-continued
344
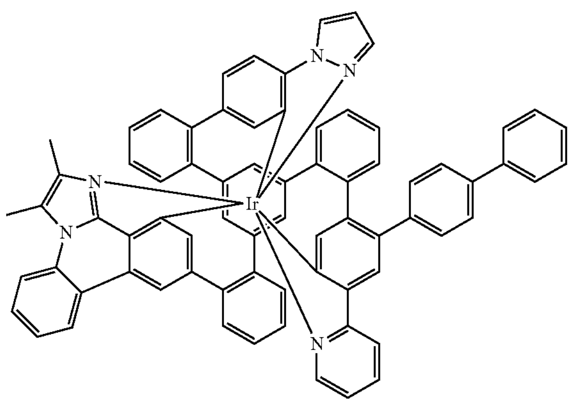
345
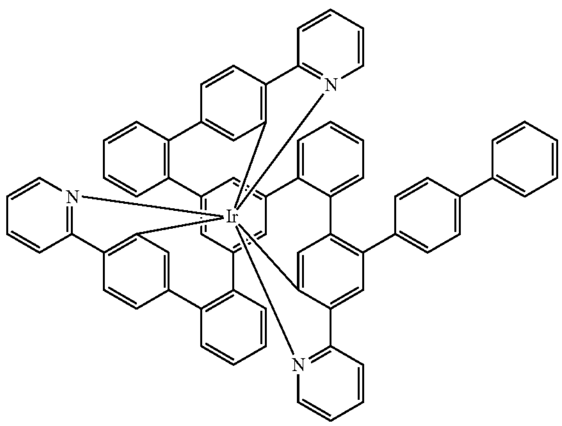
346
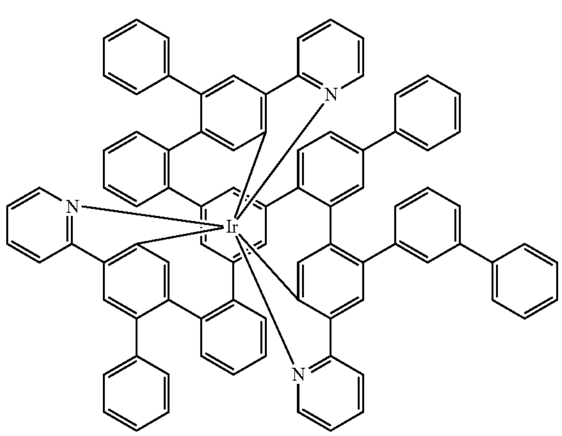
-continued
347
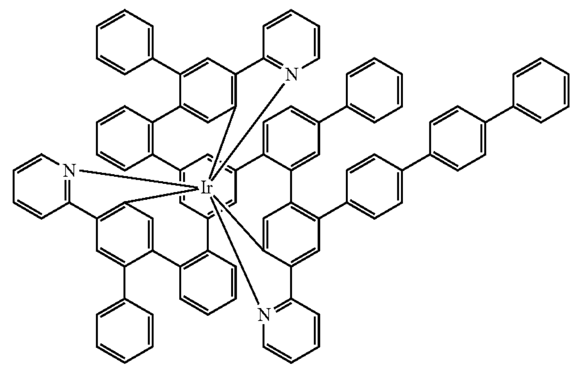
348
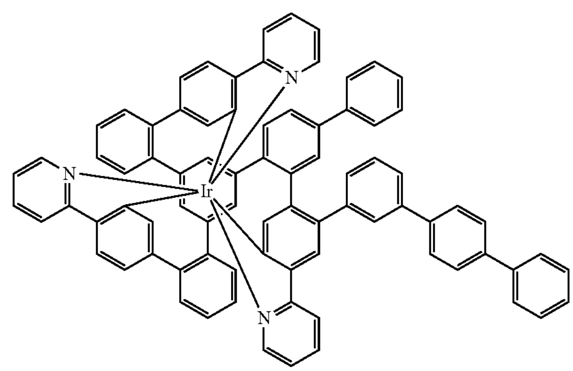
349
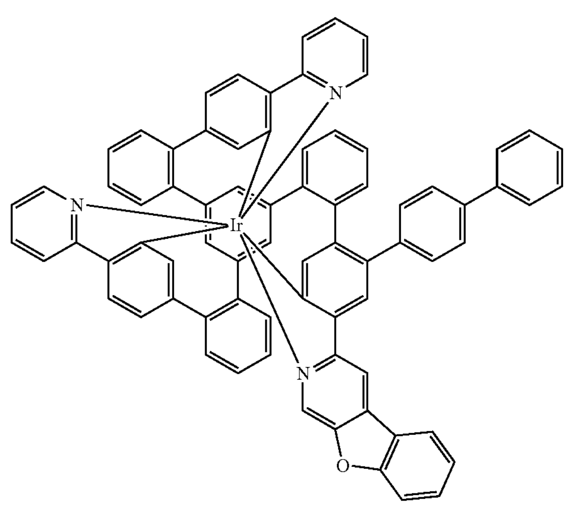

-continued
350
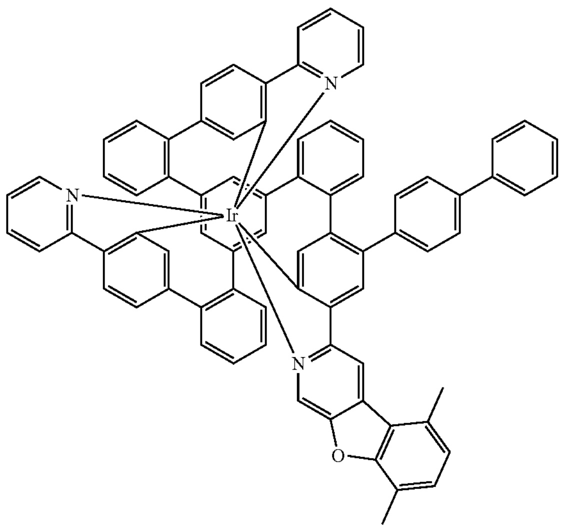
351
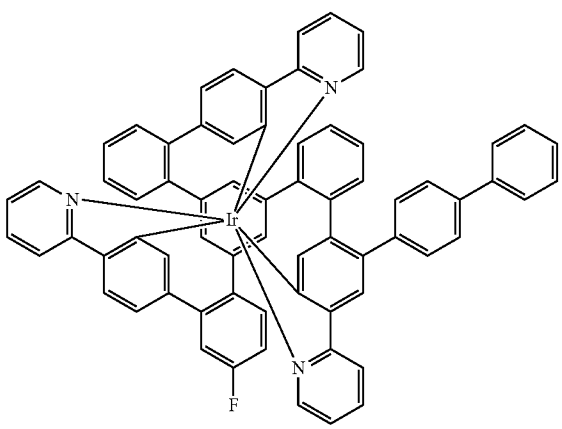
352
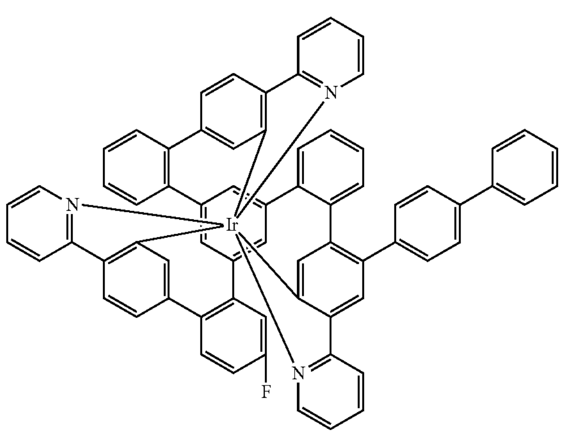
-continued
353
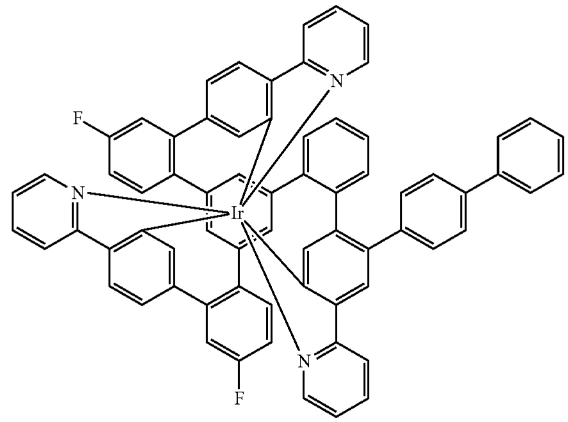
354
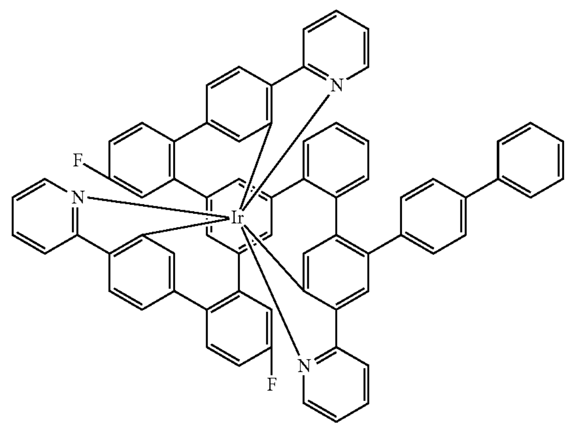
355
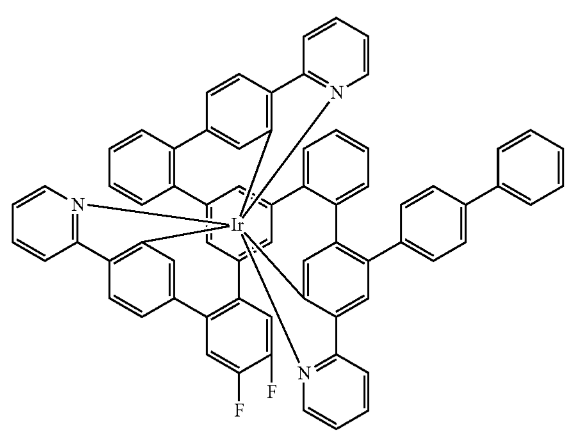

-continued
356
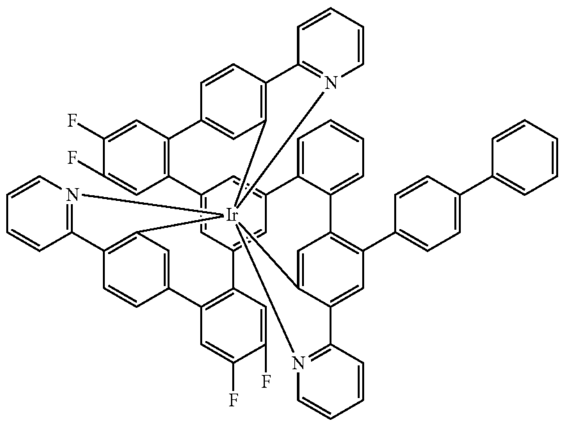
357
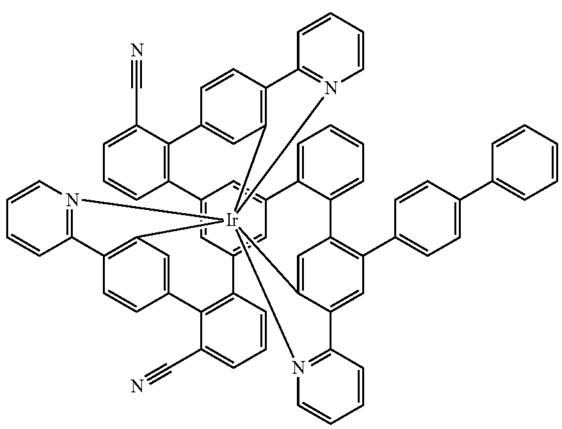
358
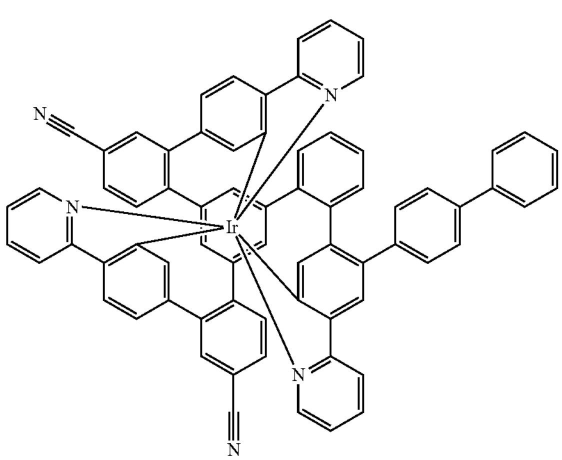
-continued
359
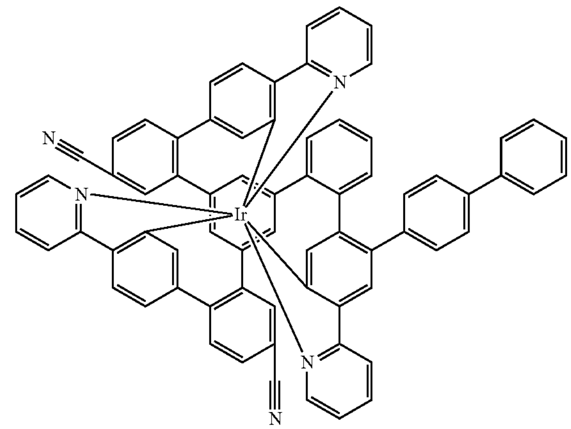
360
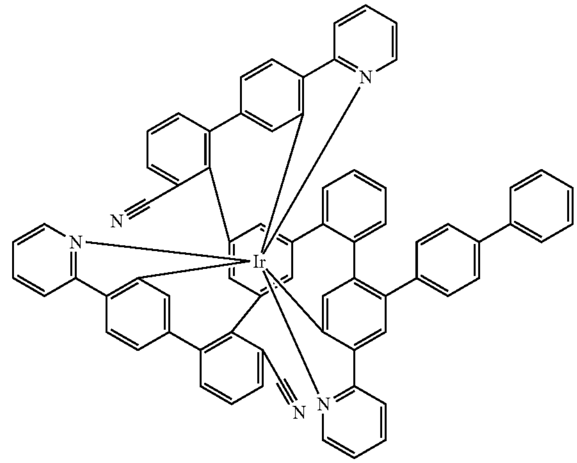
361
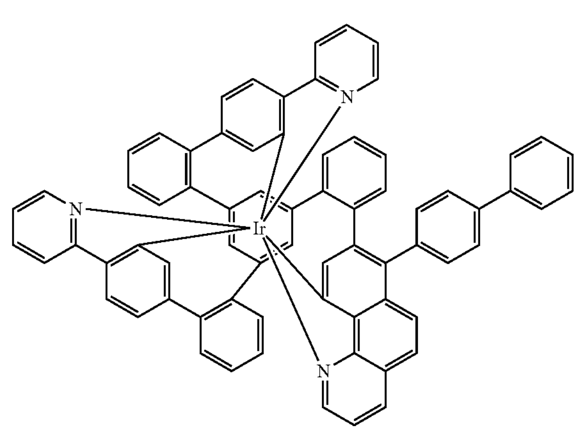

-continued
362
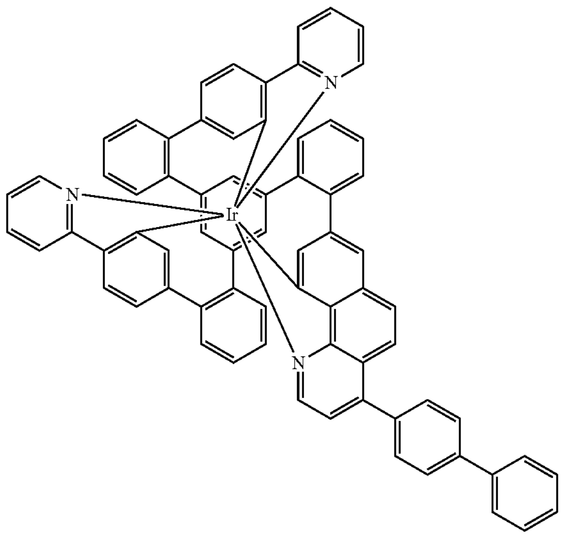
363
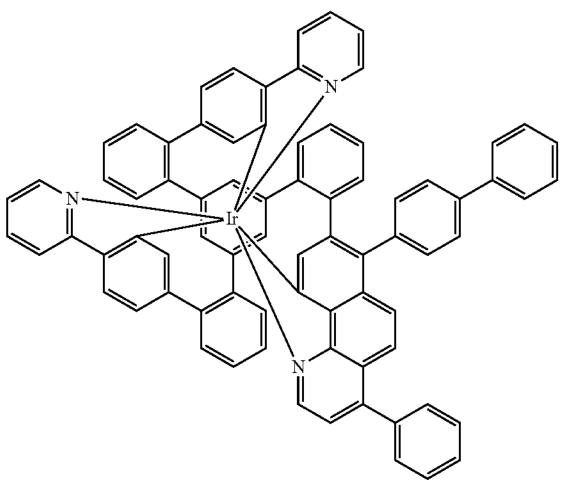
364
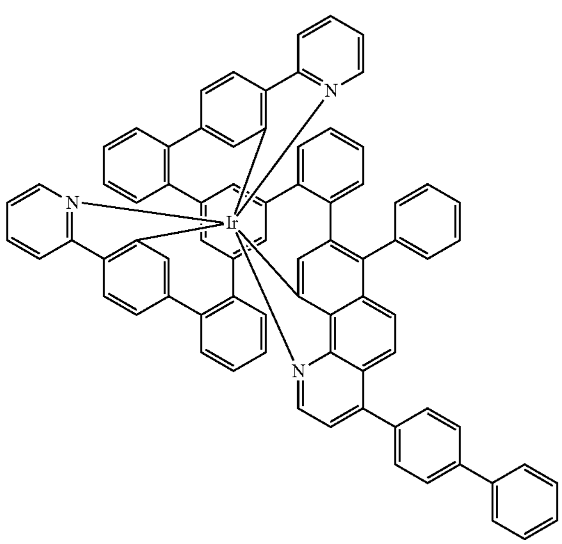
-continued
365
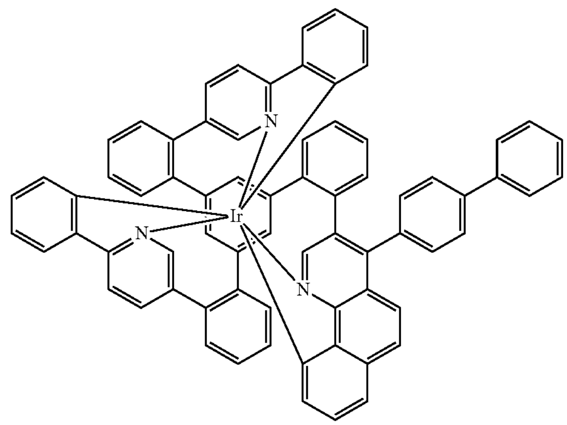
366
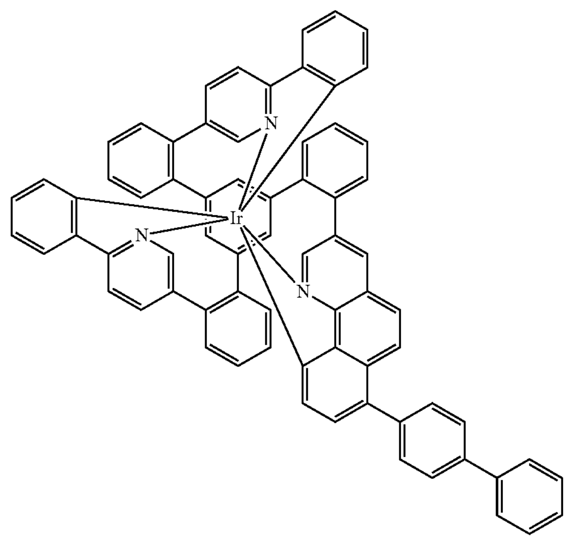
367
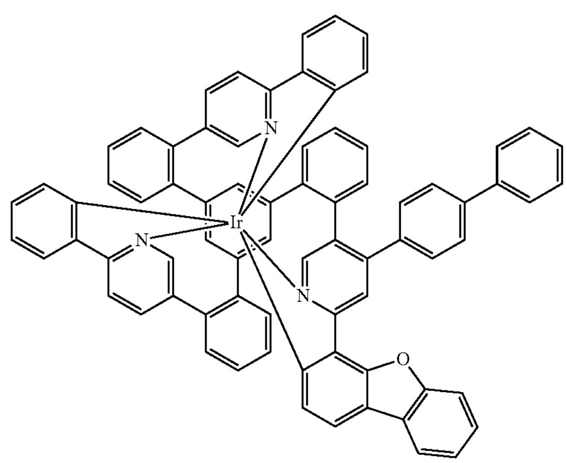

-continued
368
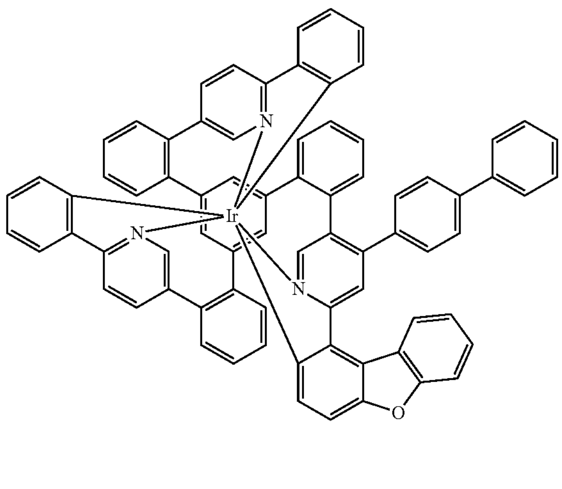
369
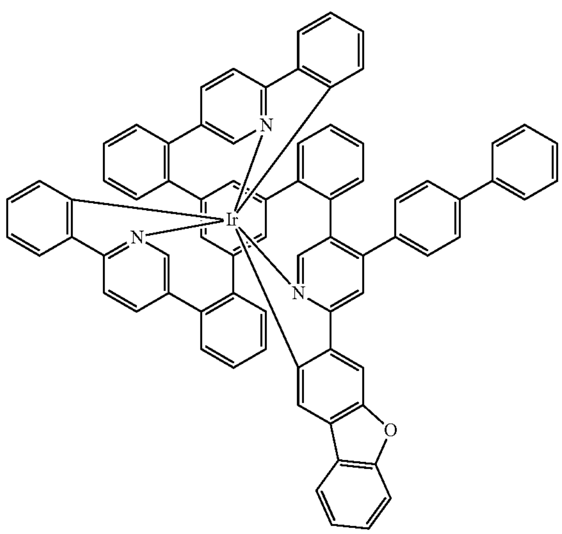
370
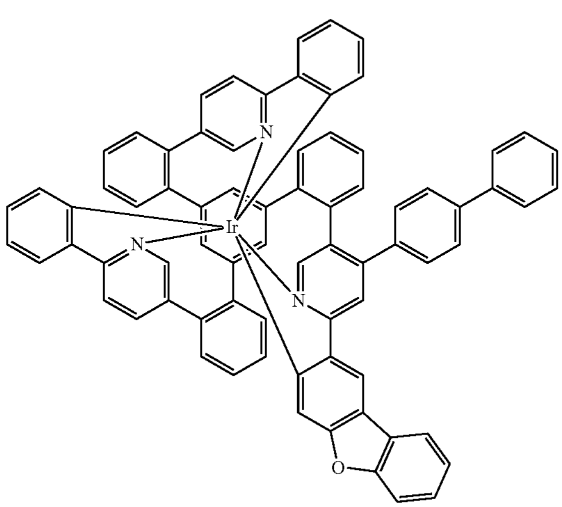
-continued
371
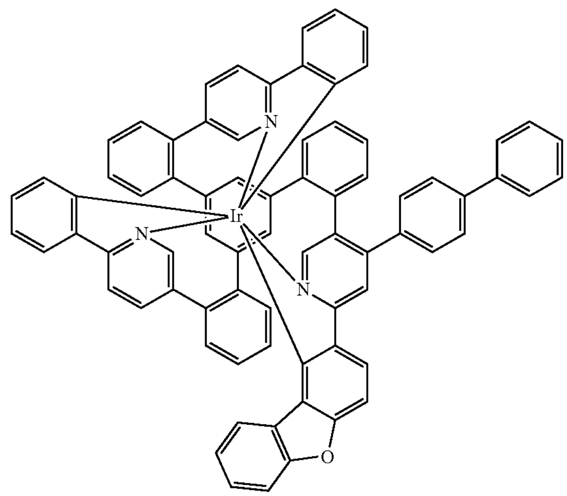
372
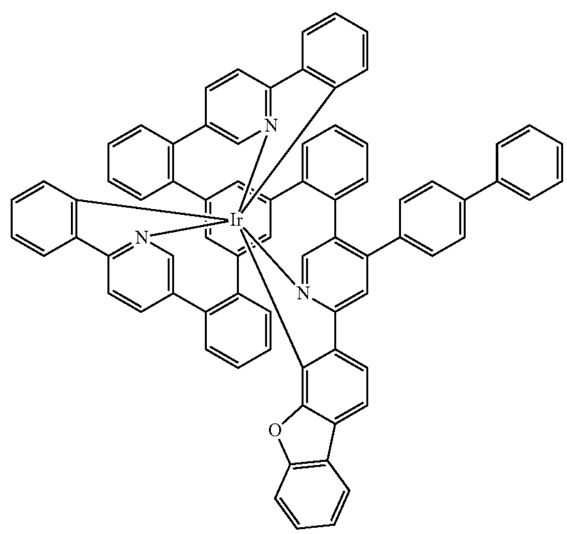
373
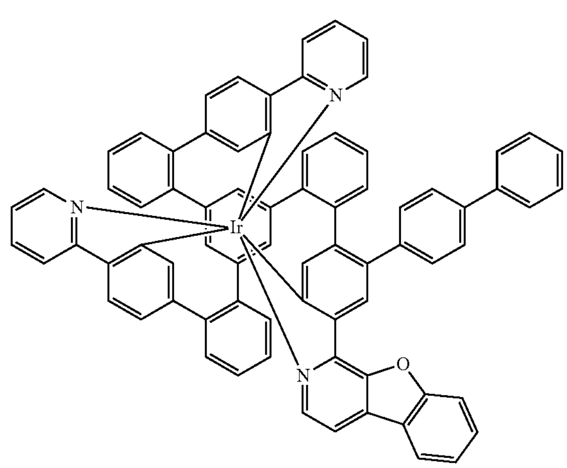

-continued
374
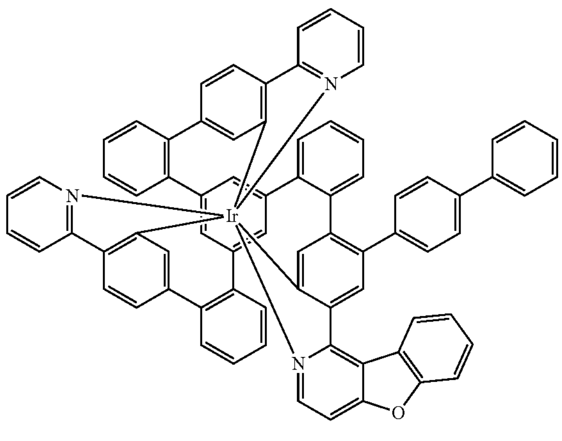
375
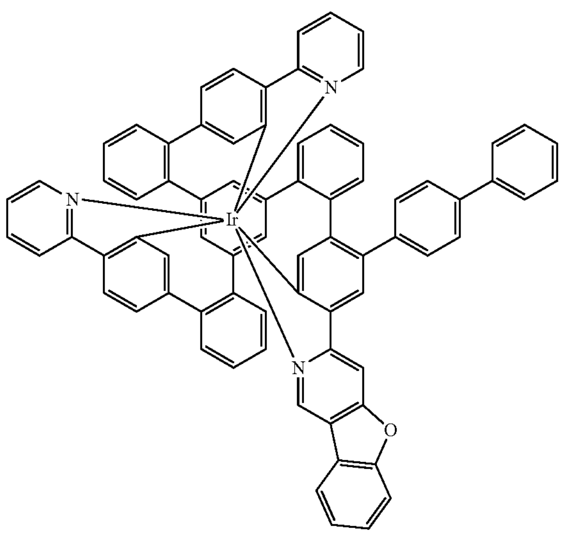
376
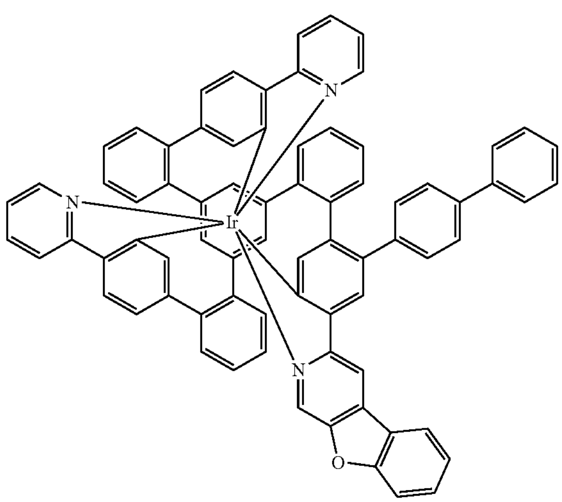
-continued
377
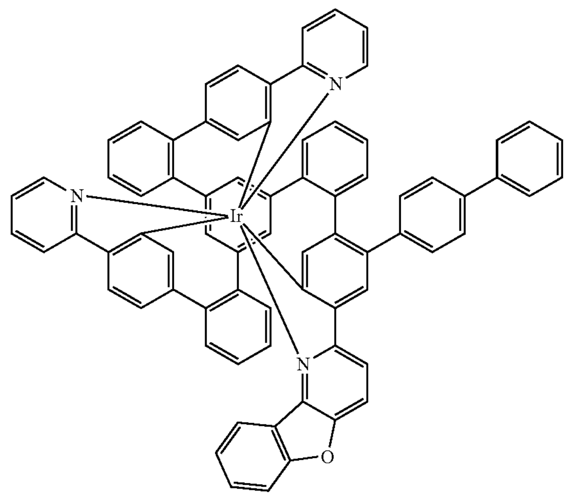
378
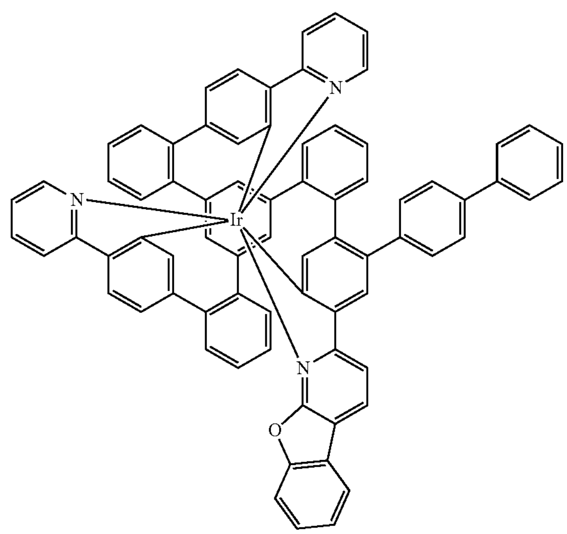
379
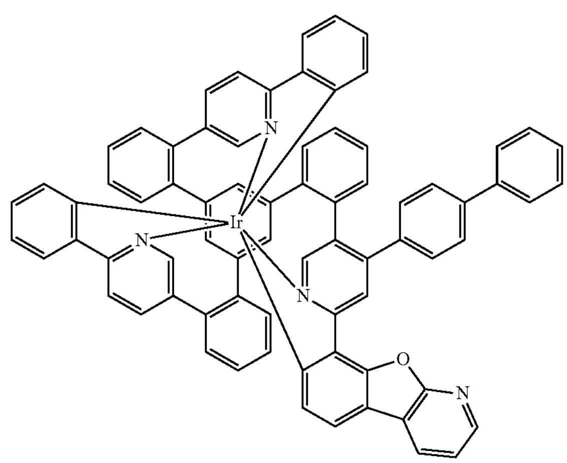

380
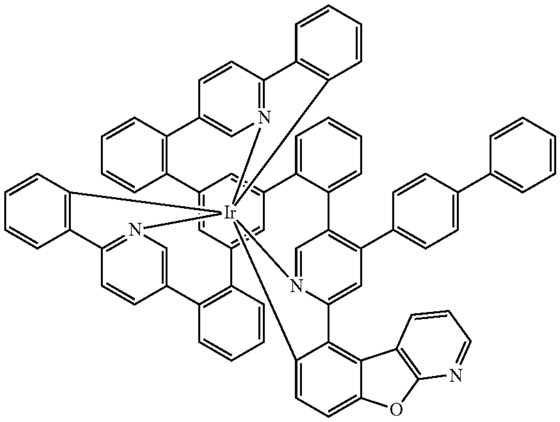
381
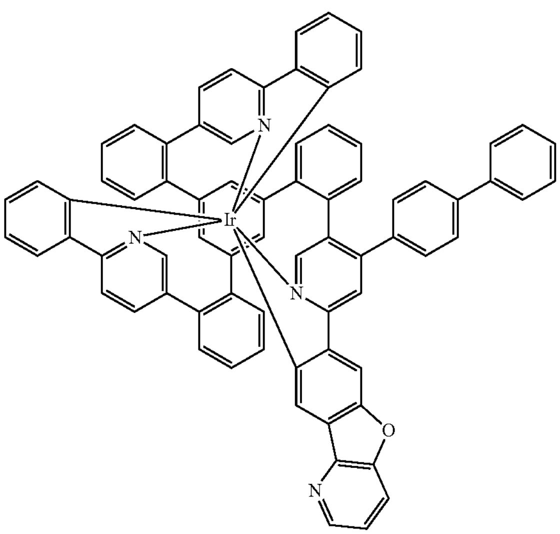
382
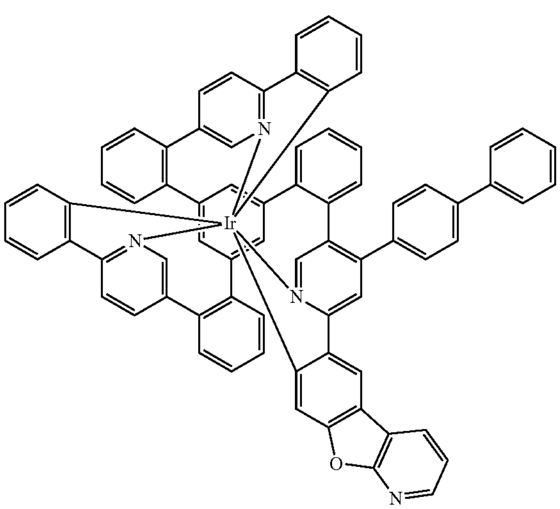
383
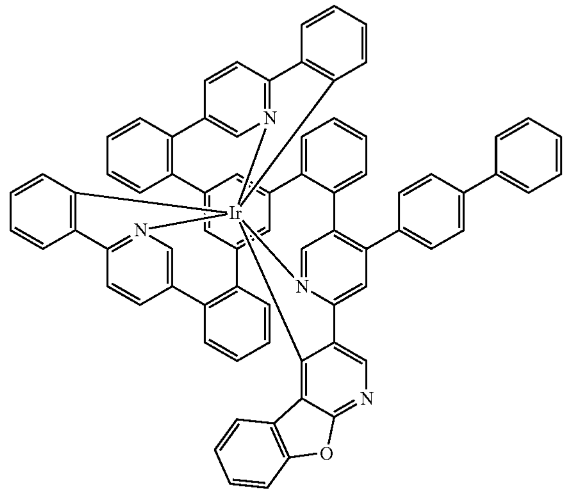
384
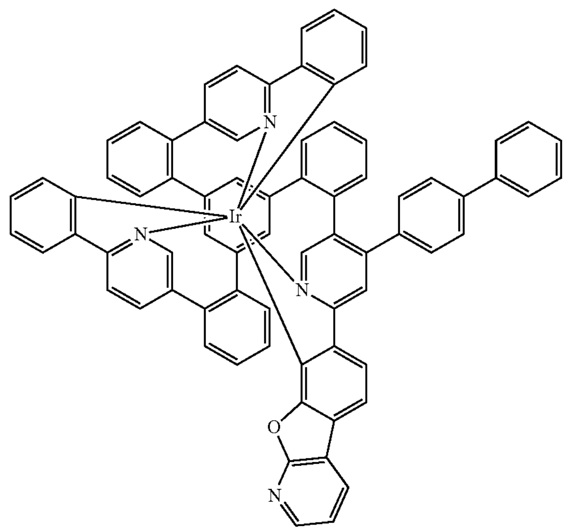
385
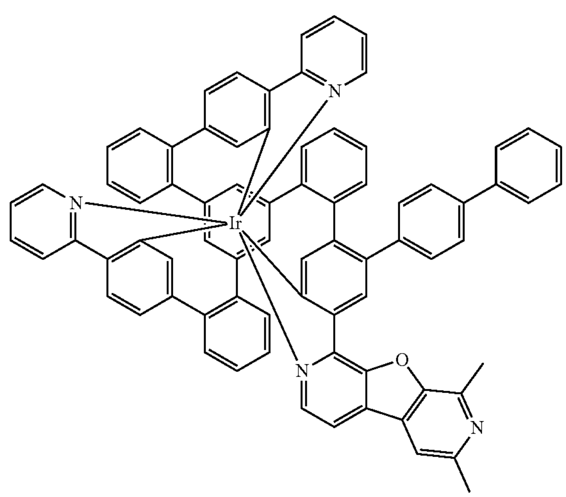

-continued
386
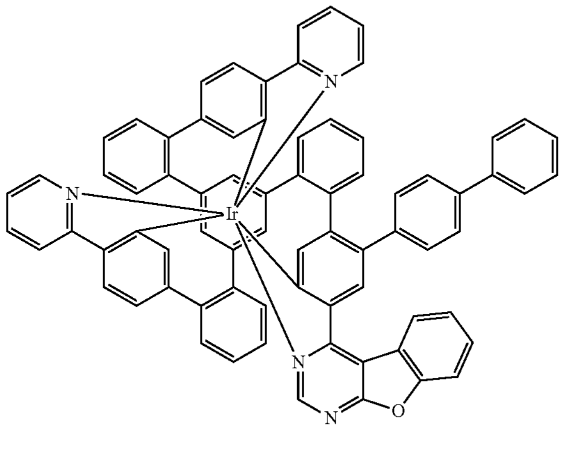
387
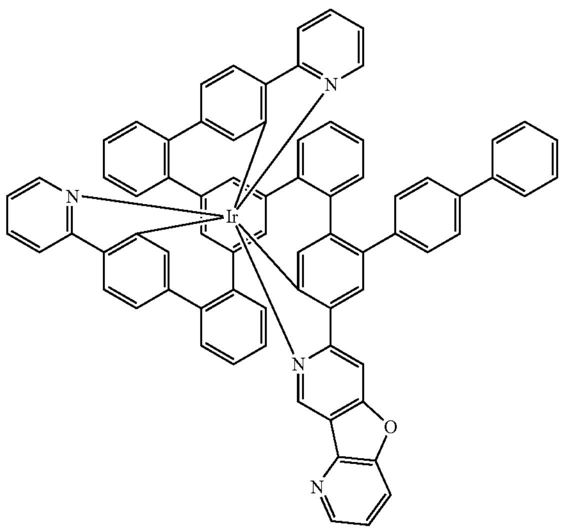
388
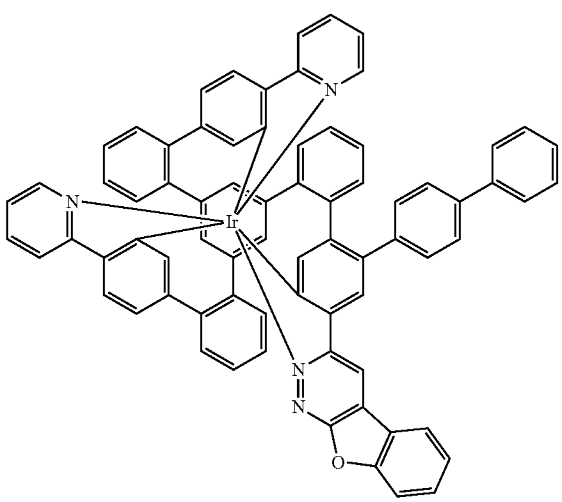
-continued
389
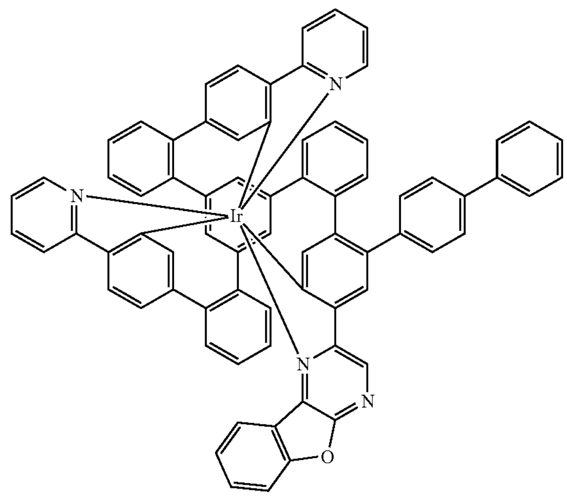
390
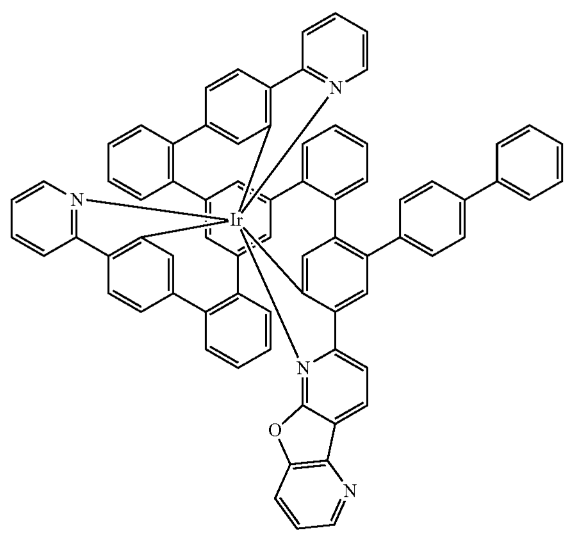
391
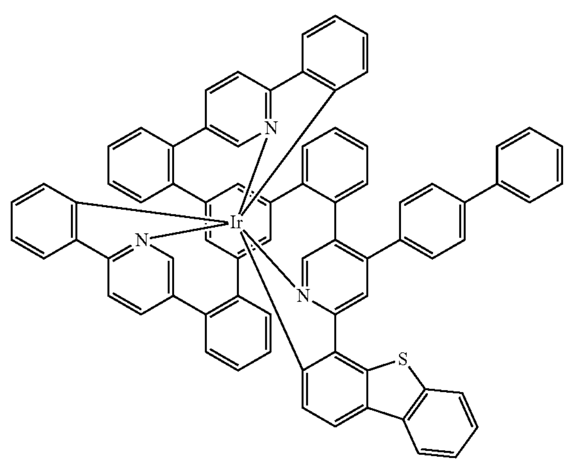

-continued
392
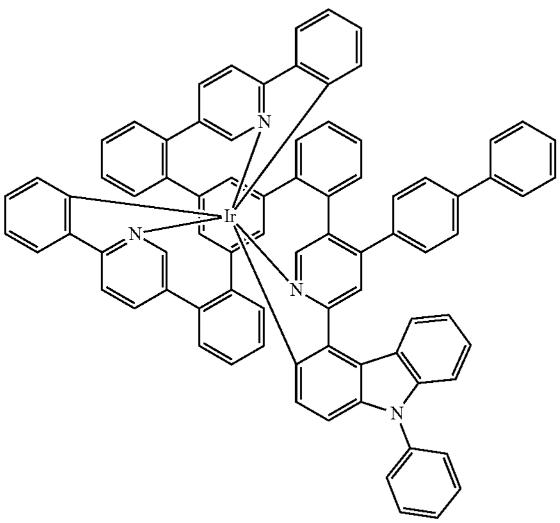
393
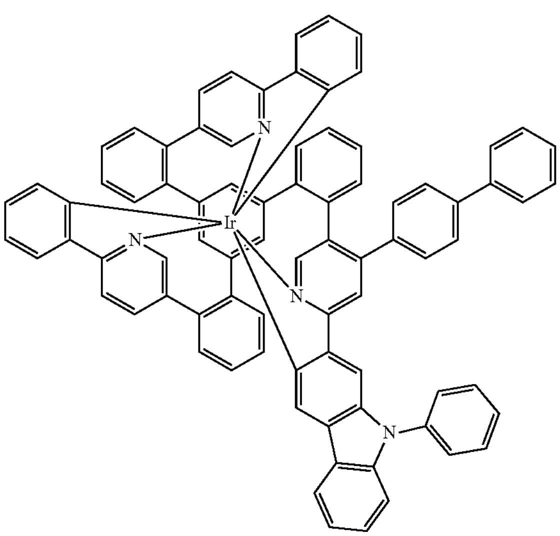
394
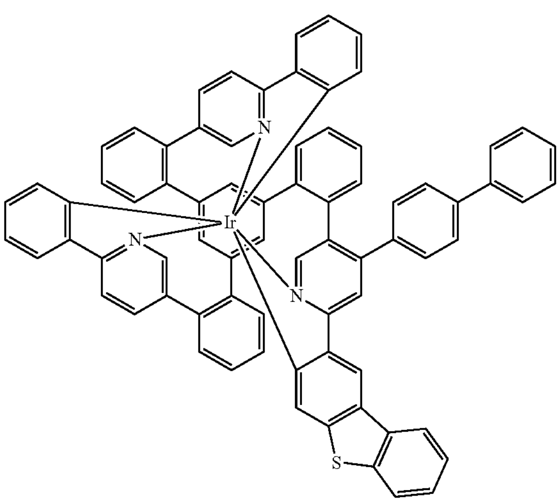
-continued
395
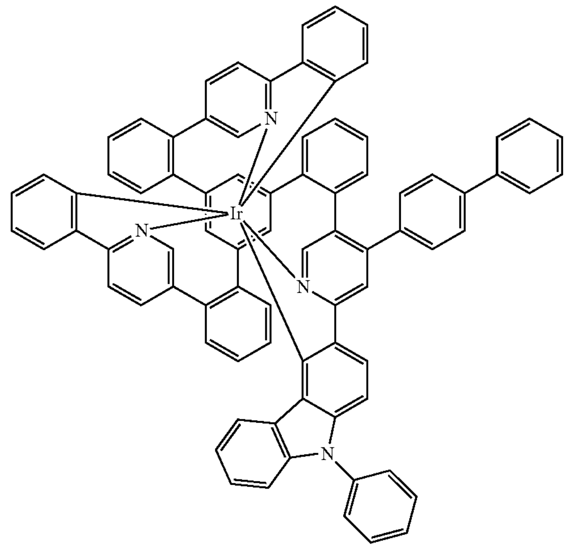
396
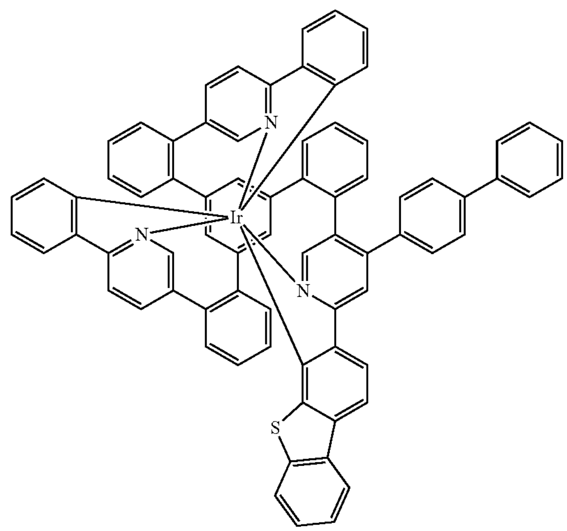
397
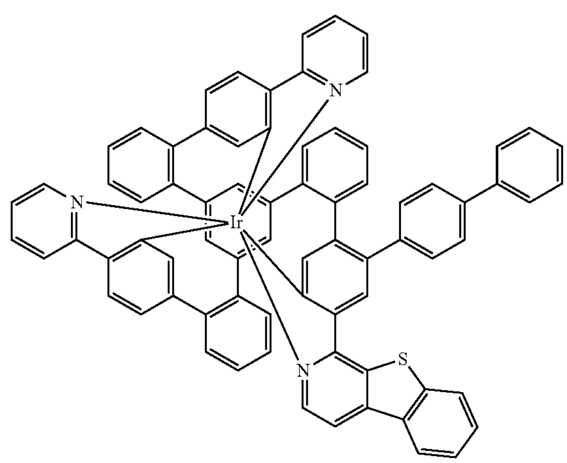

-continued
398
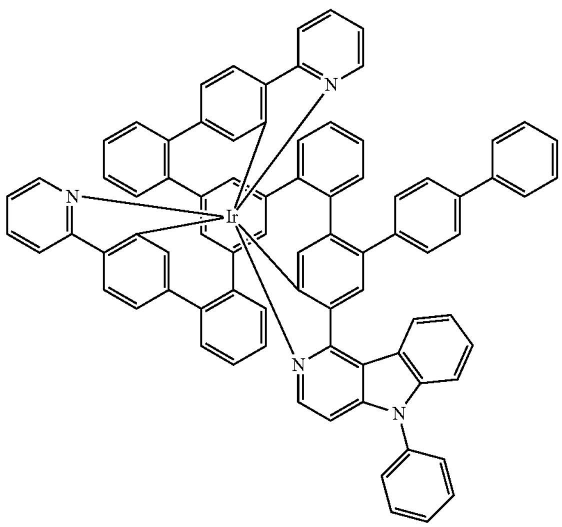
399
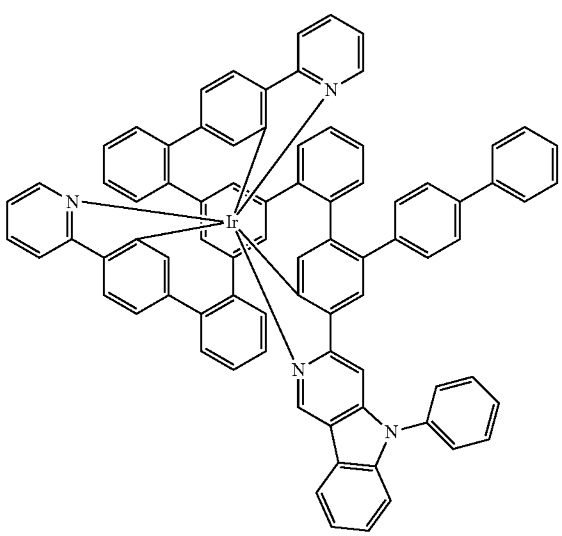
400
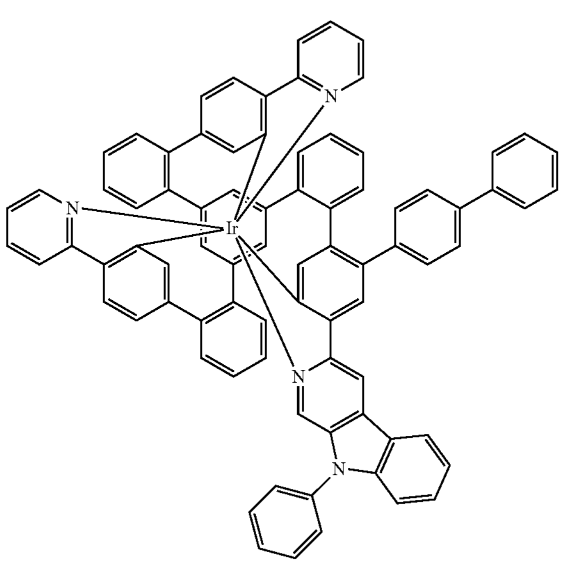
-continued
401
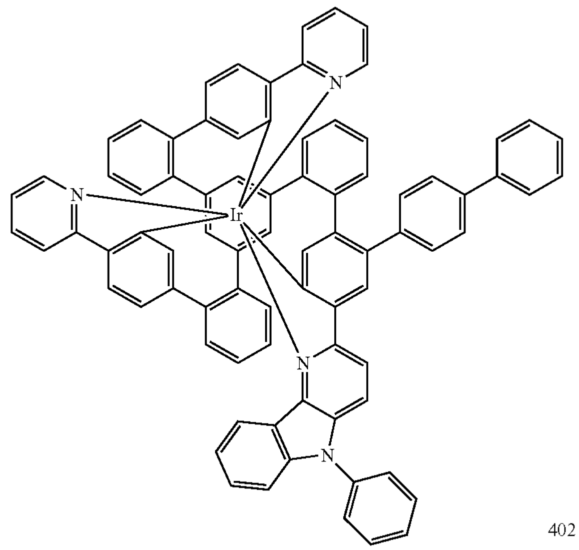
402
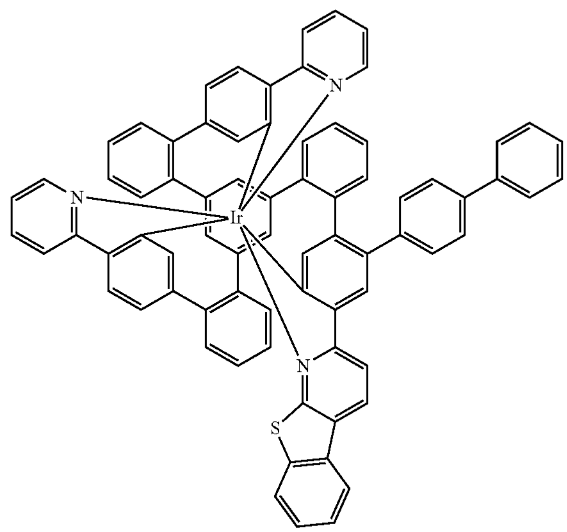
403
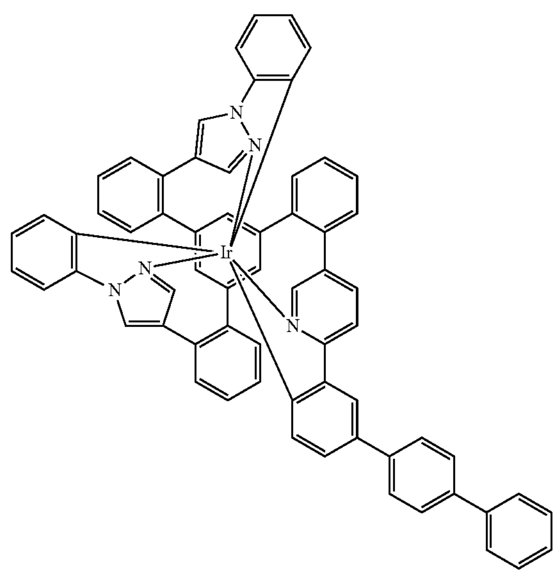

-continued
404
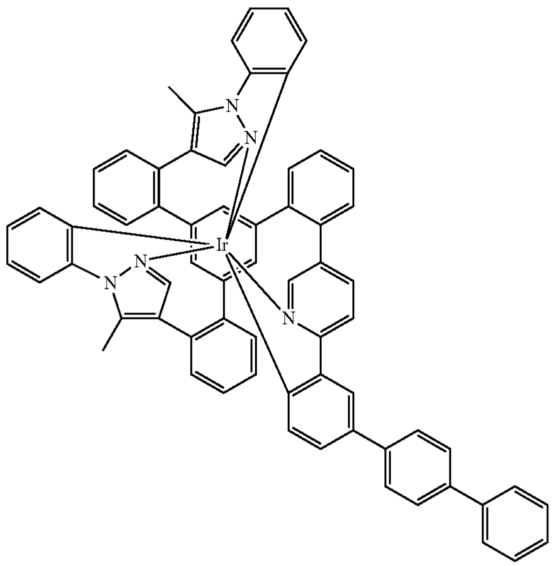
405
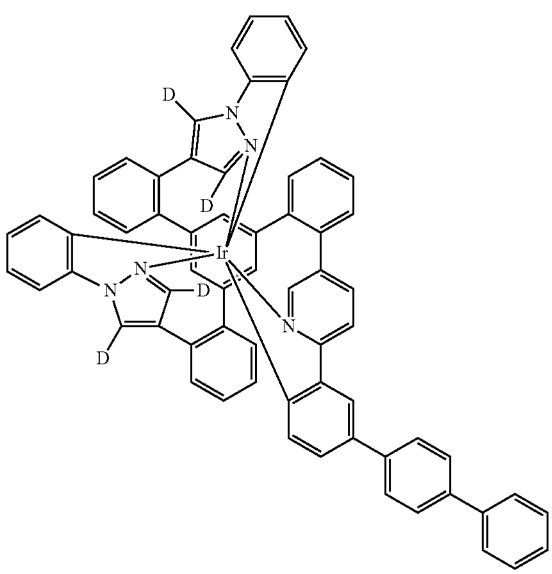
-continued
406
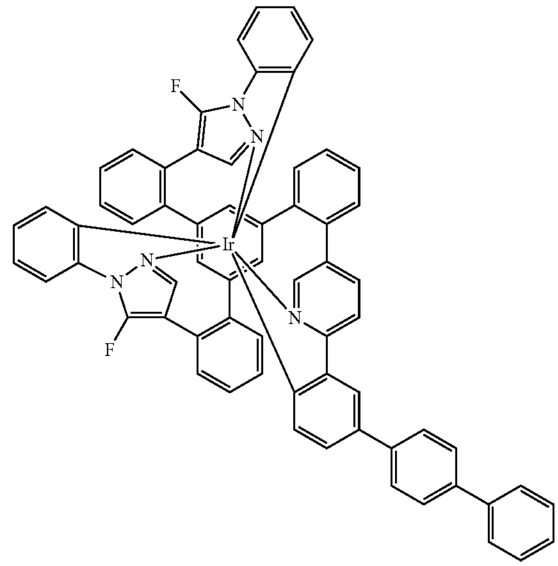
407
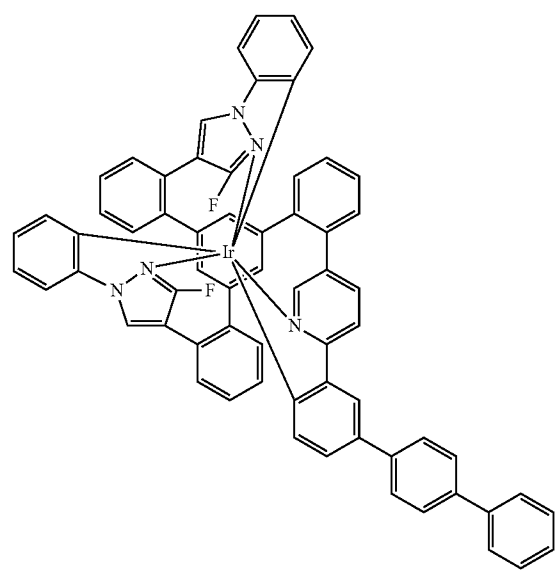

-continued
408
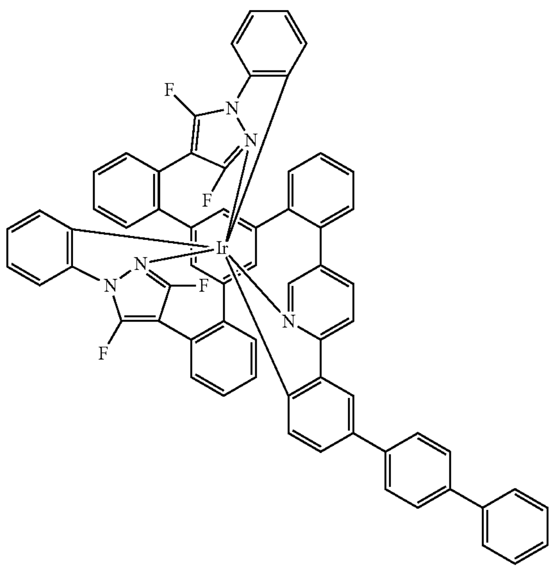
409
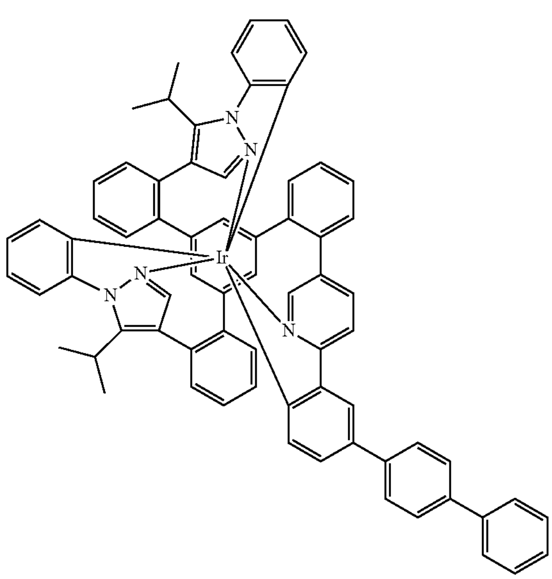
-continued
410
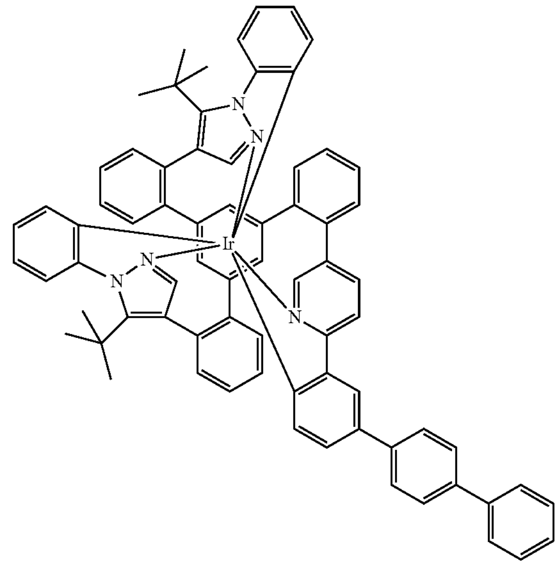
411
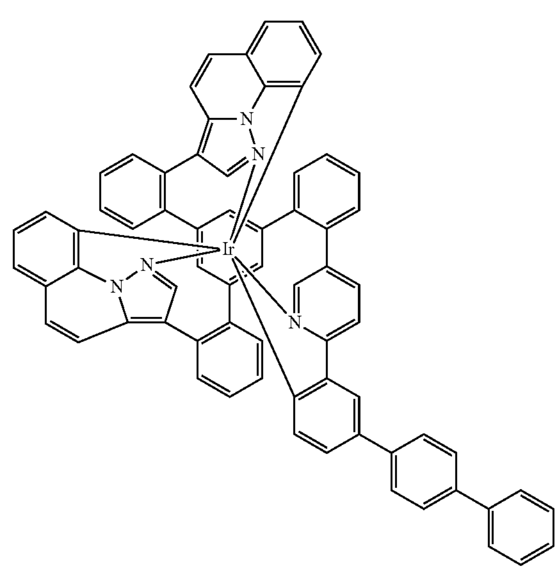

-continued
412
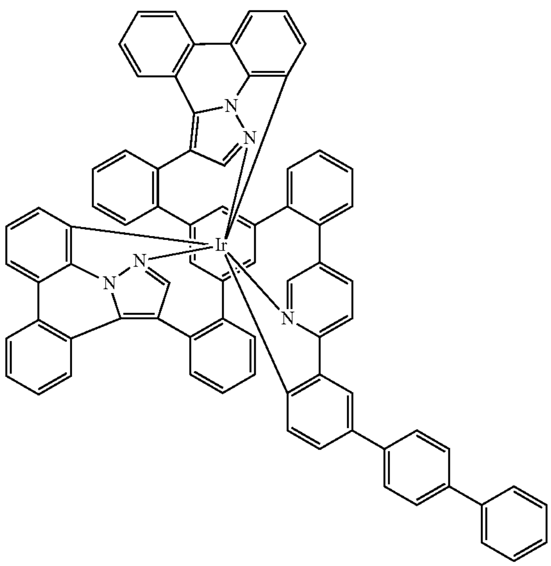
413
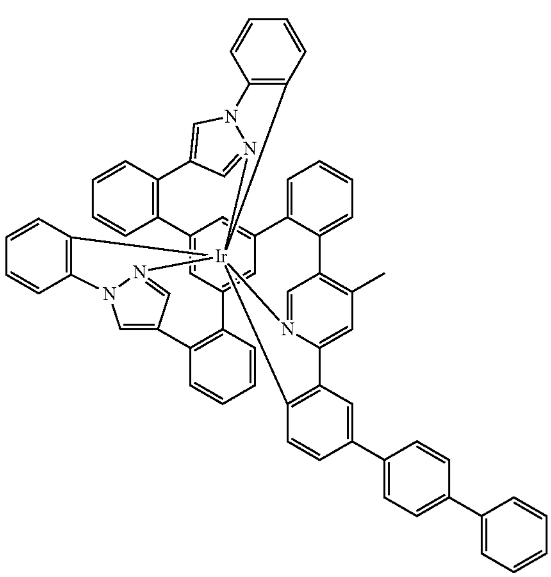
-continued
414
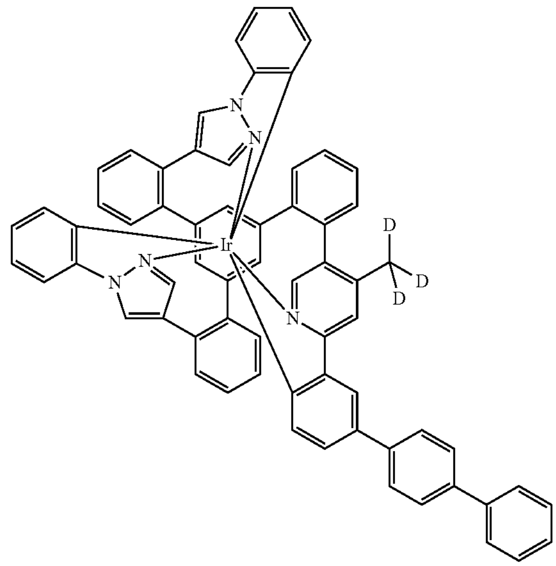
415
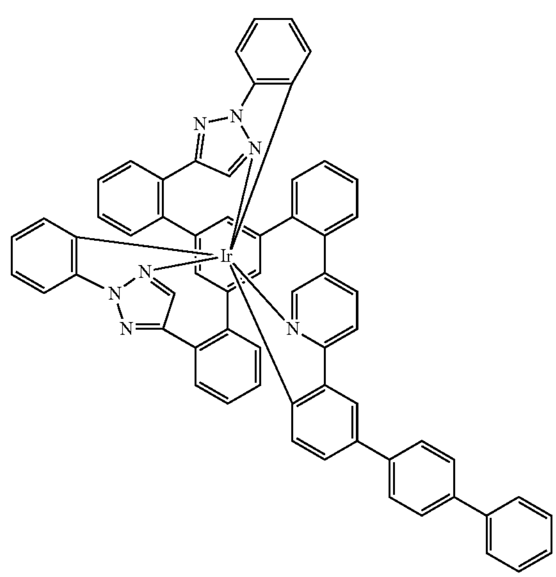

416
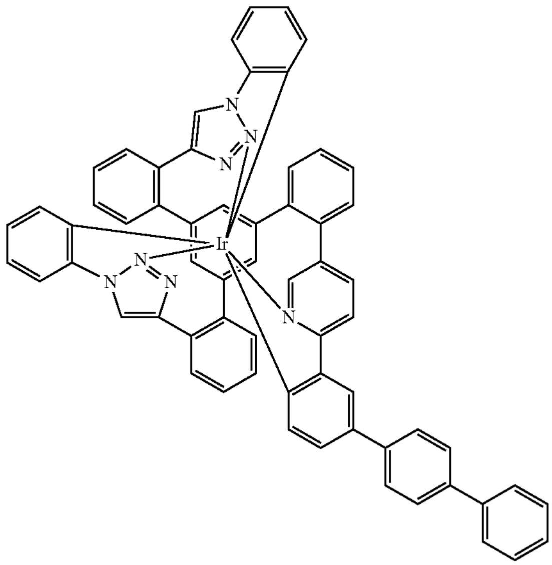
417
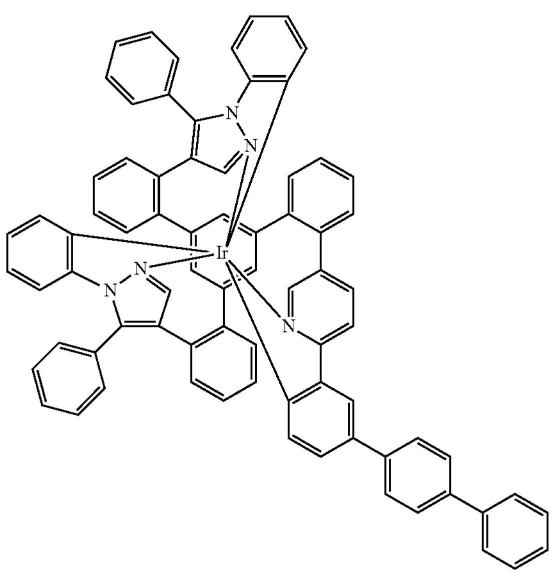
418
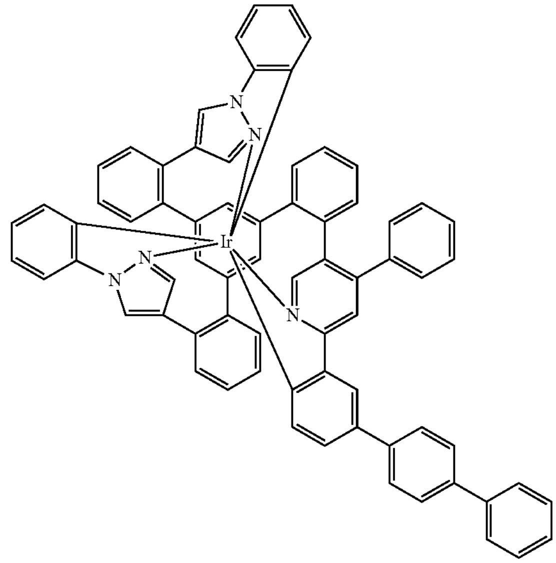
419
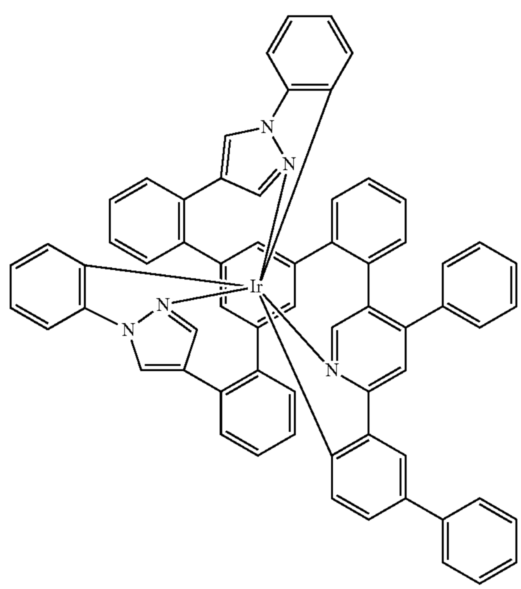

420
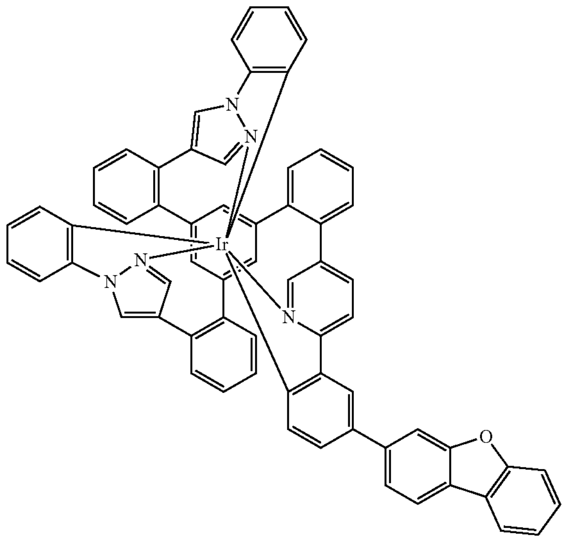
421
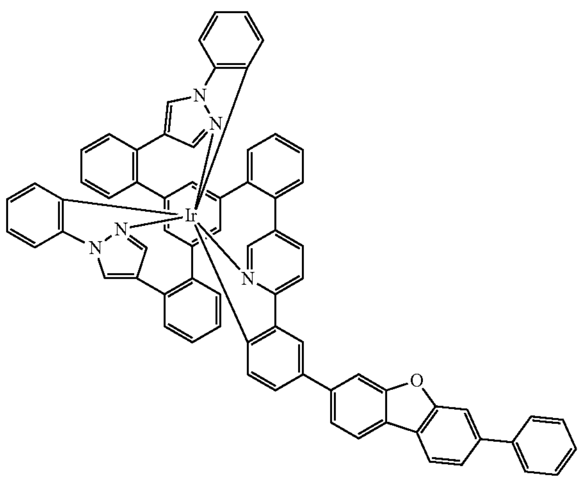
422
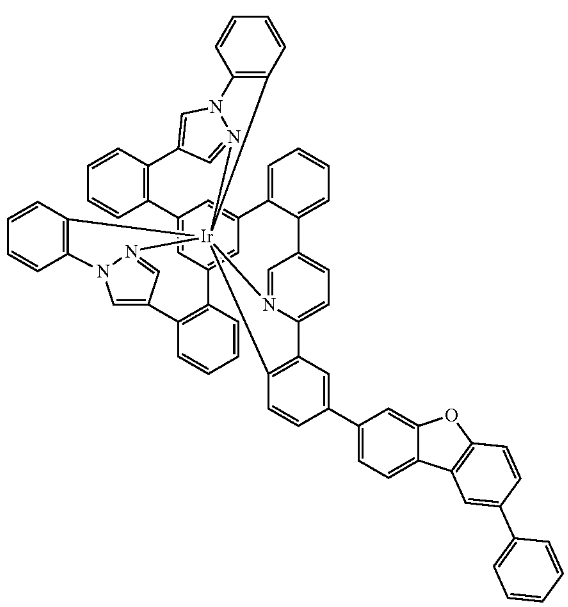
423
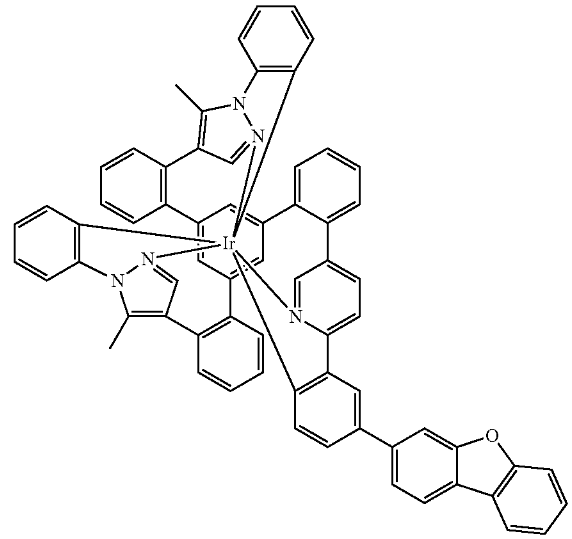
424
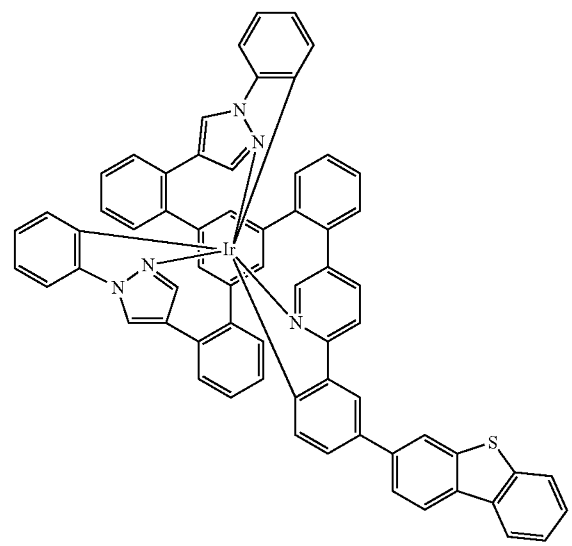
425
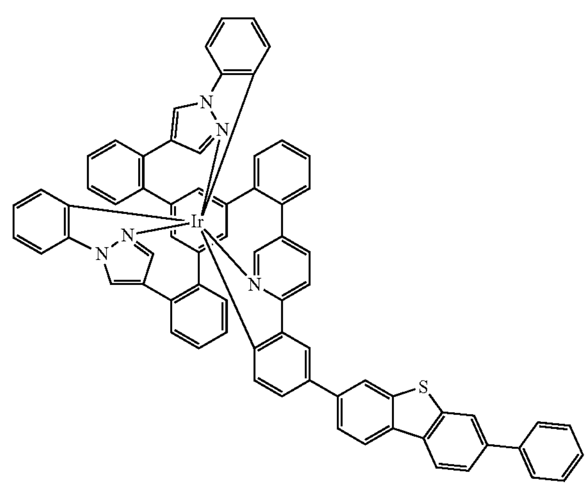

-continued
426
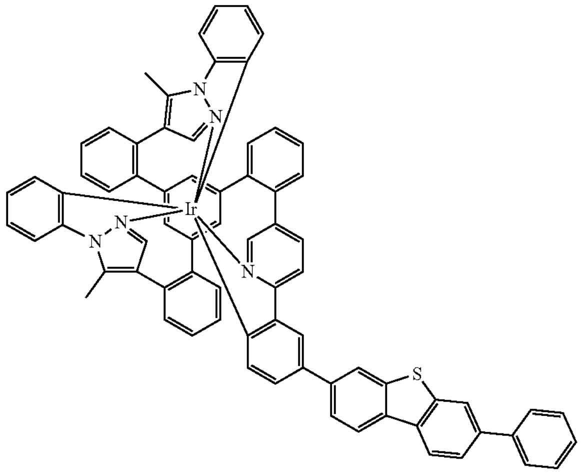
427
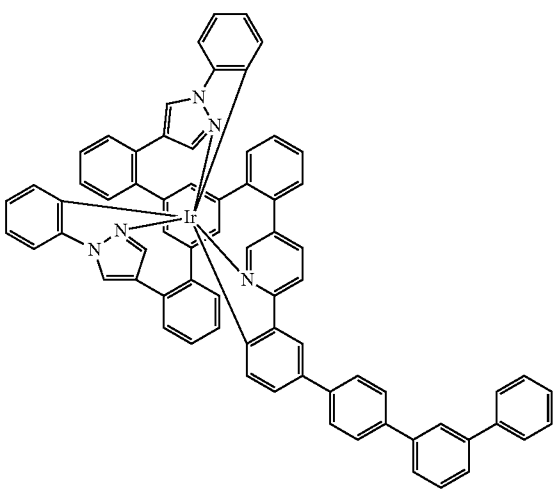
428
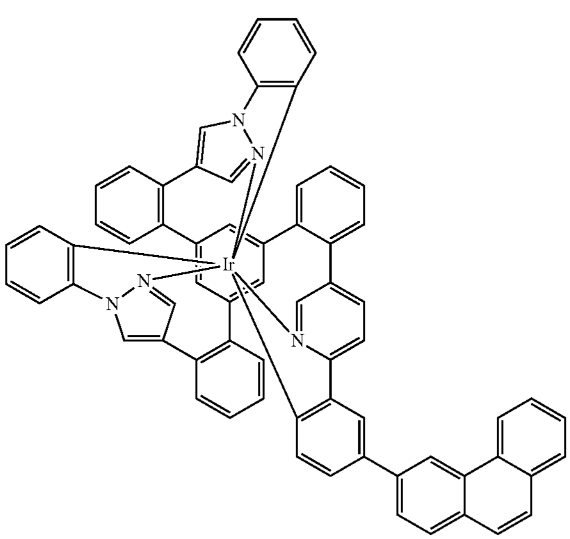
-continued
429
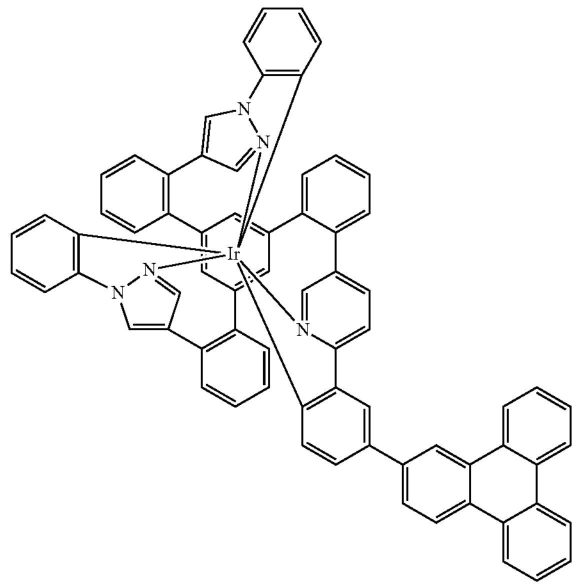
430
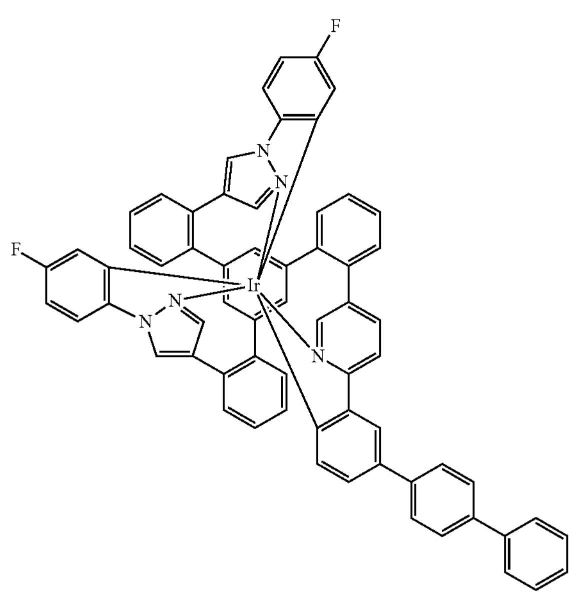

-continued
431
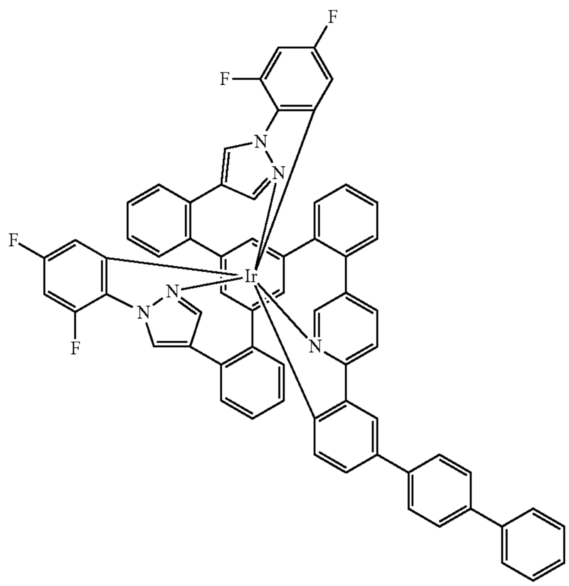
432
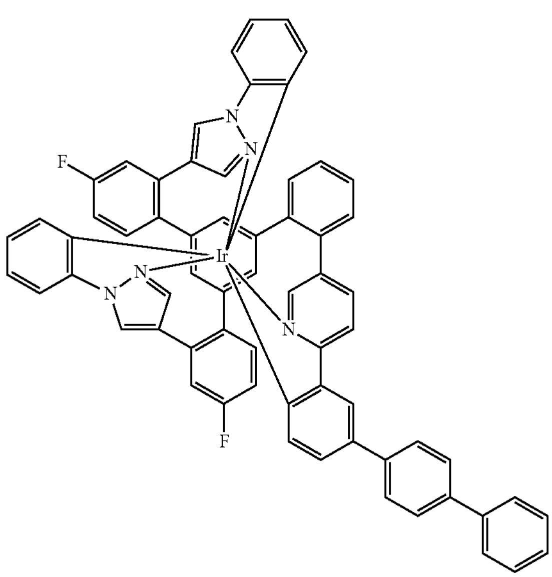
-continued
433
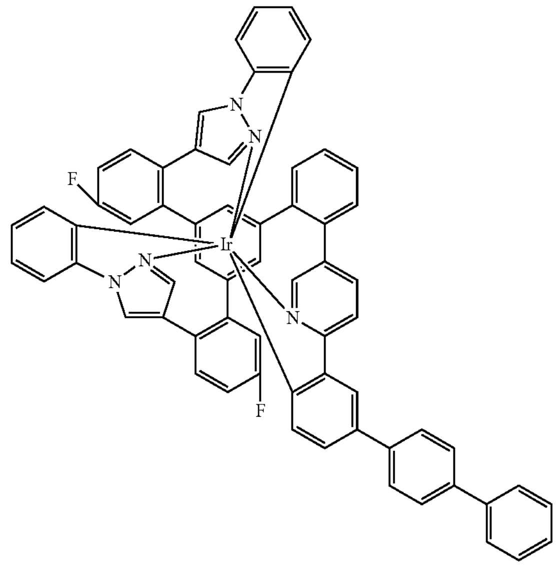
434
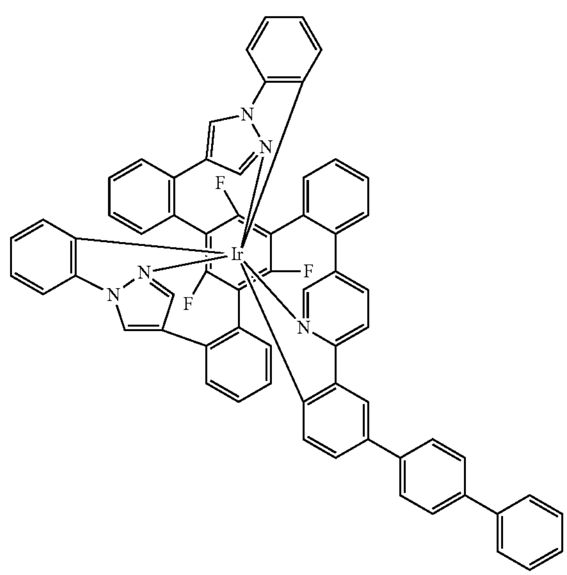

435
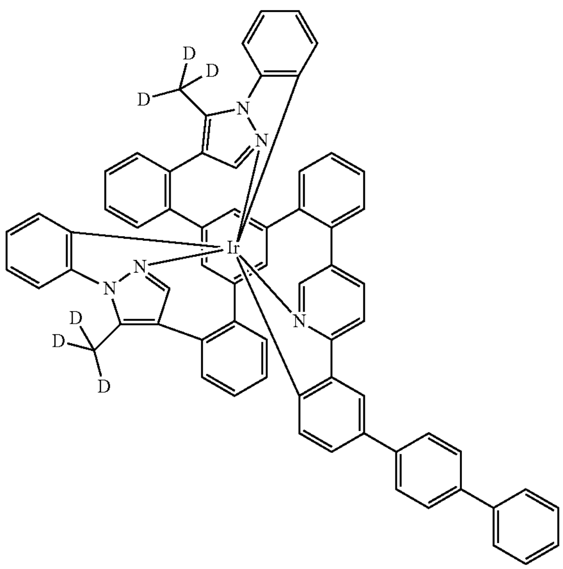
436
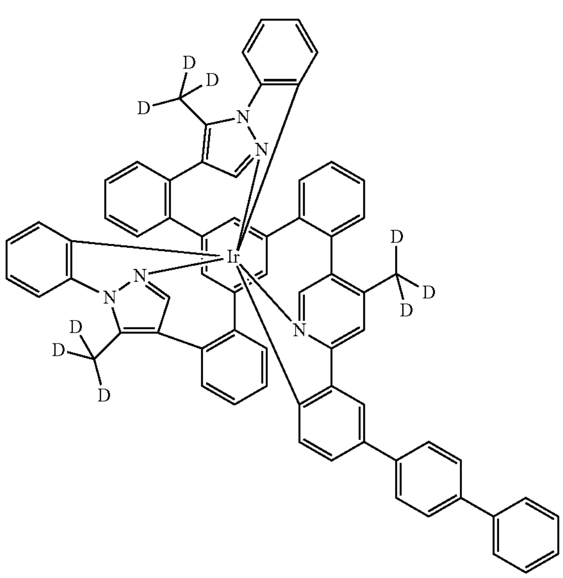
437
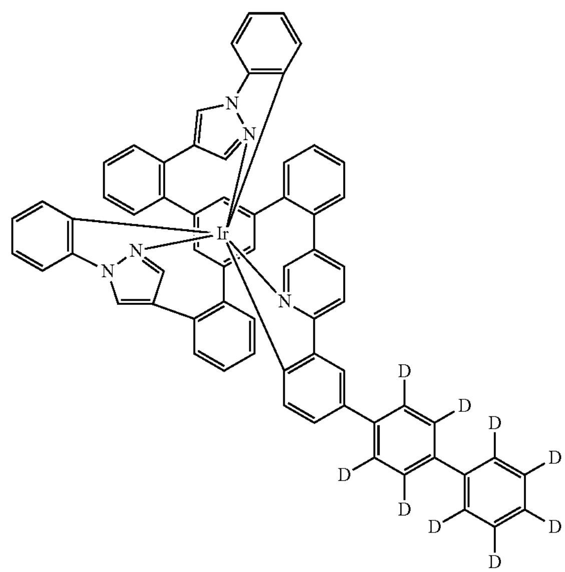
438
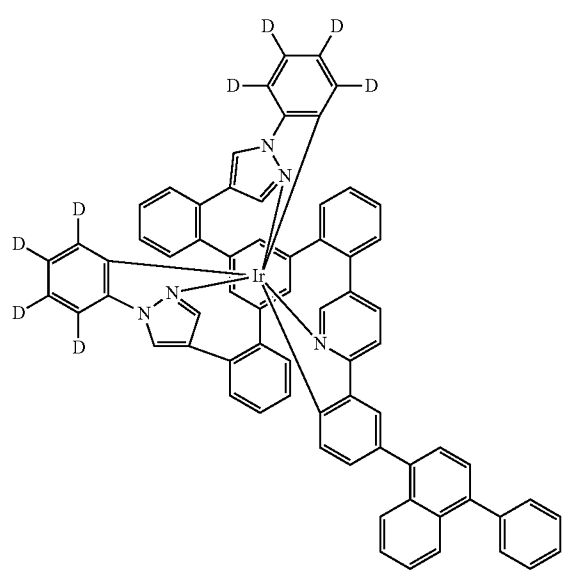

-continued
439
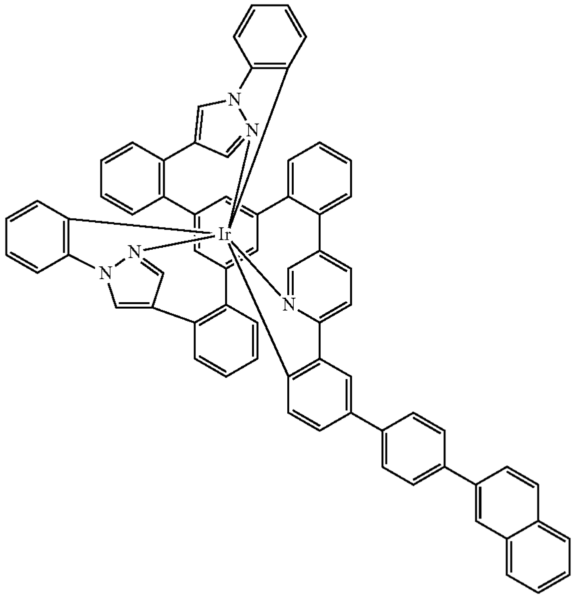
440
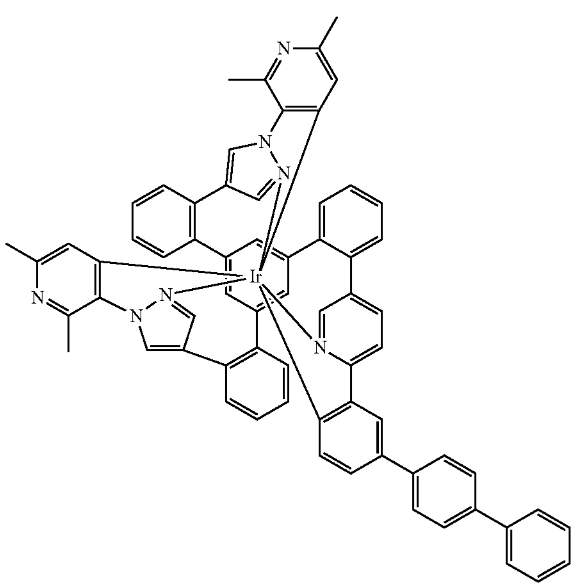
-continued
441
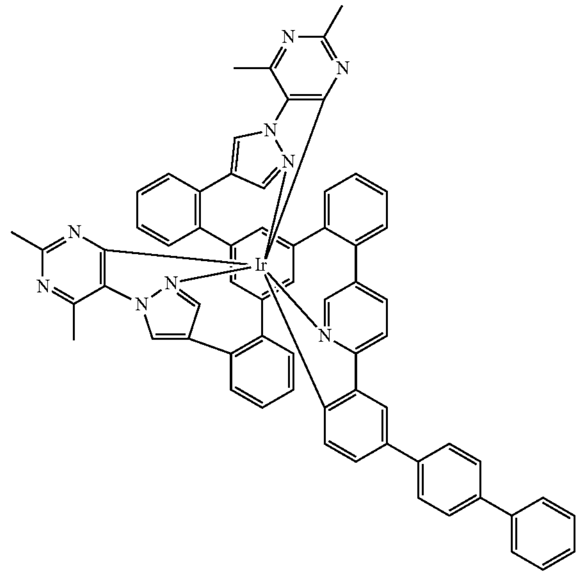
442
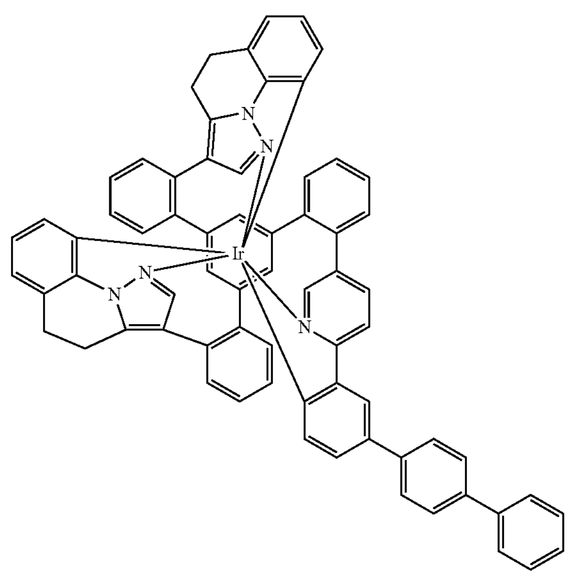

443
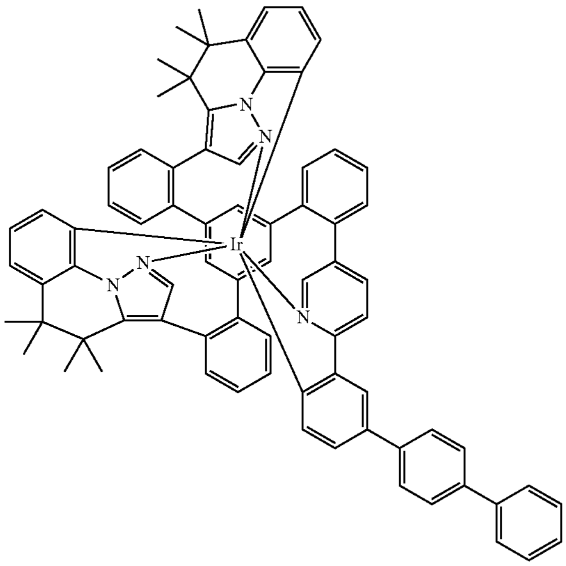
444
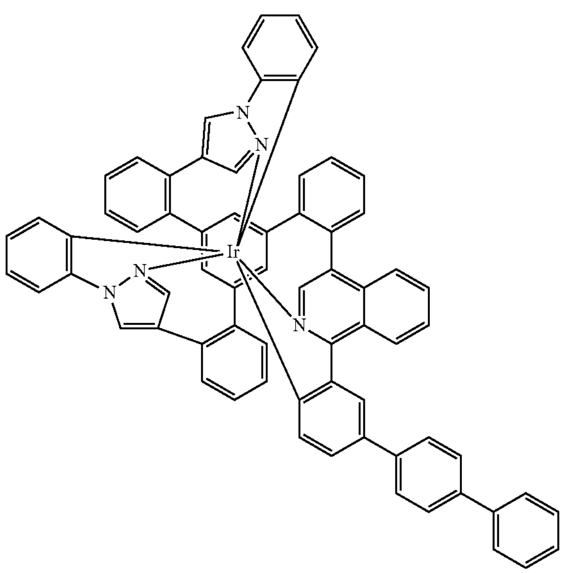
445
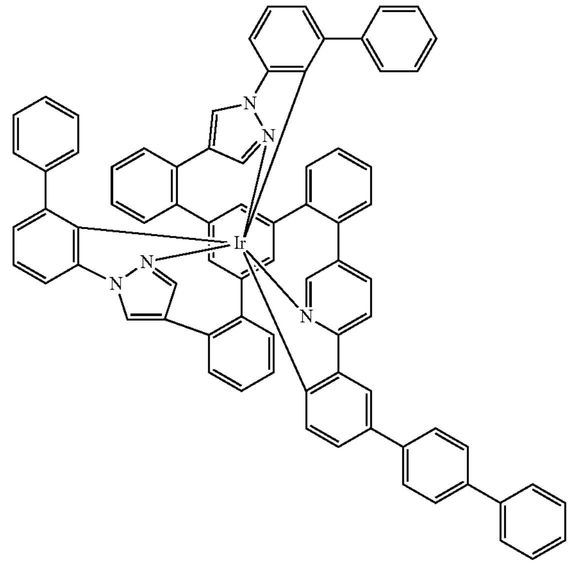
446
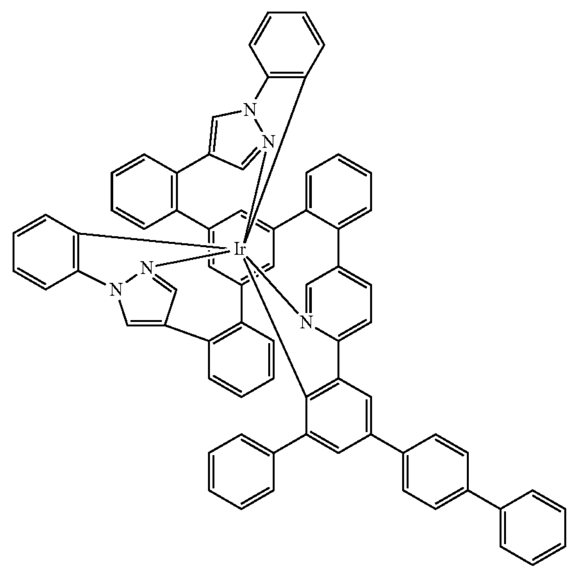
447
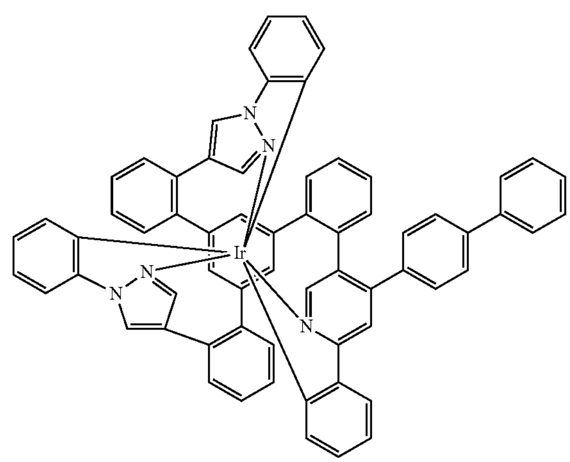

448
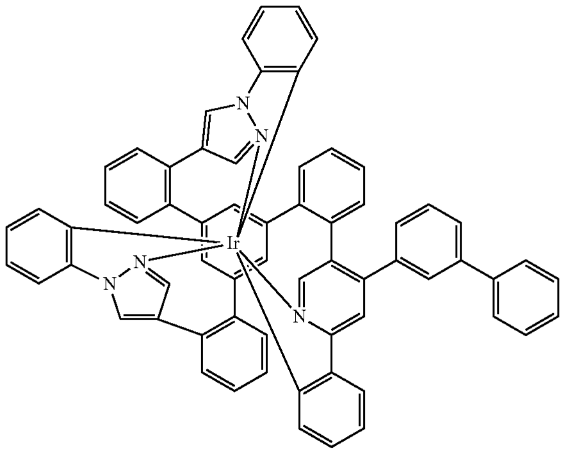
449
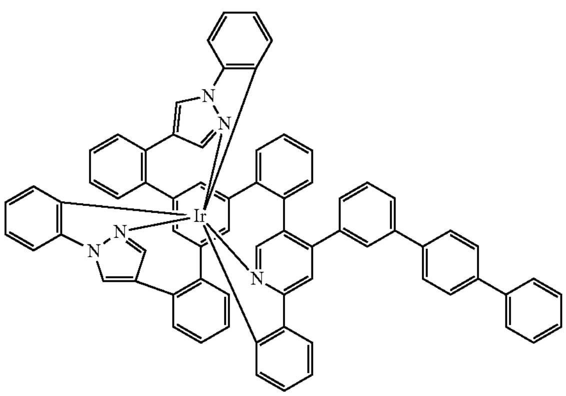
450
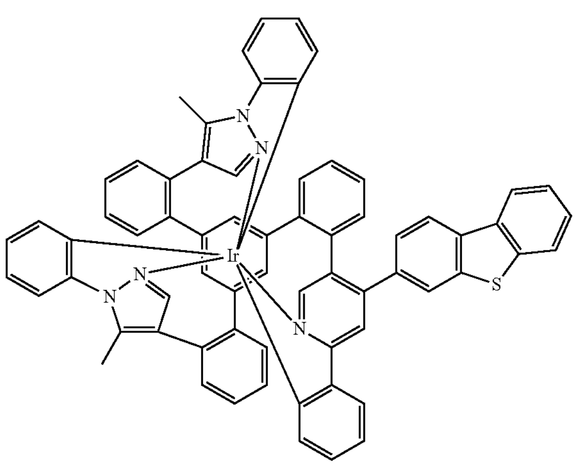
451
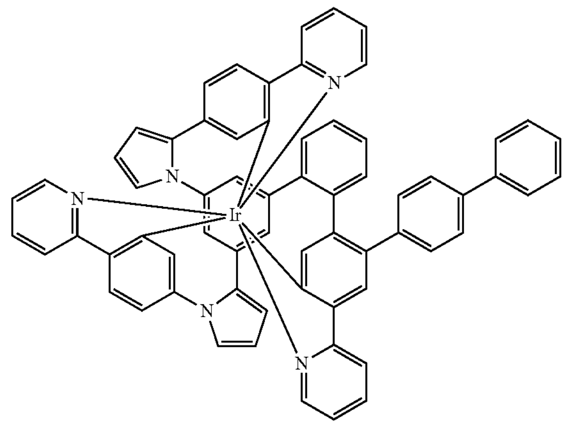
452
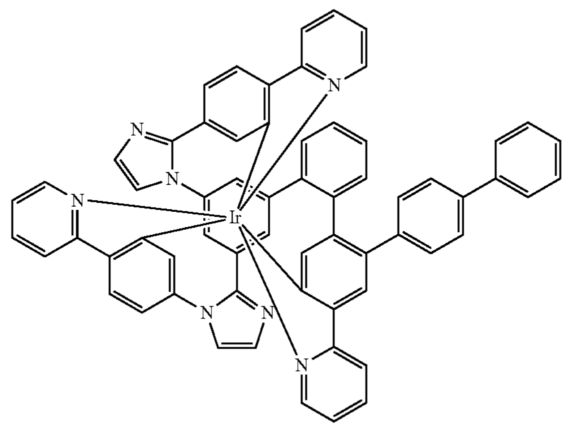
453
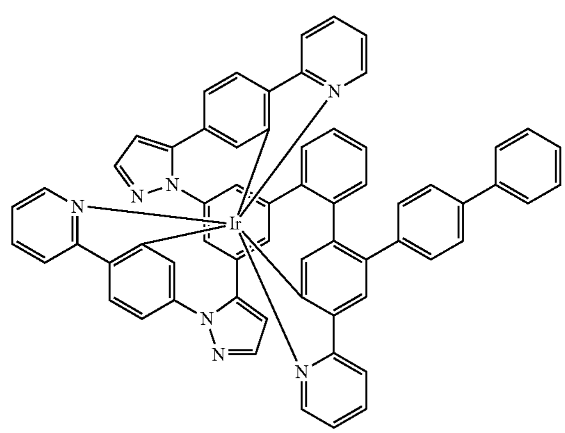

454
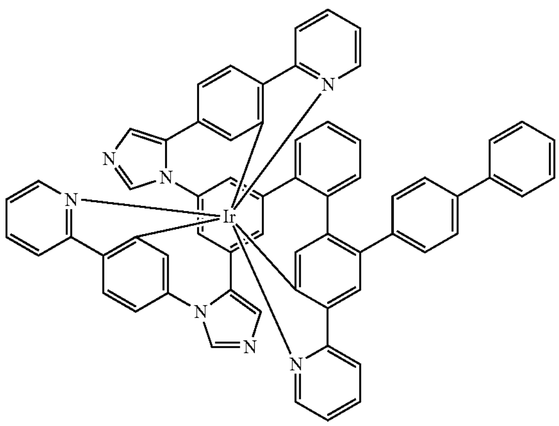
455
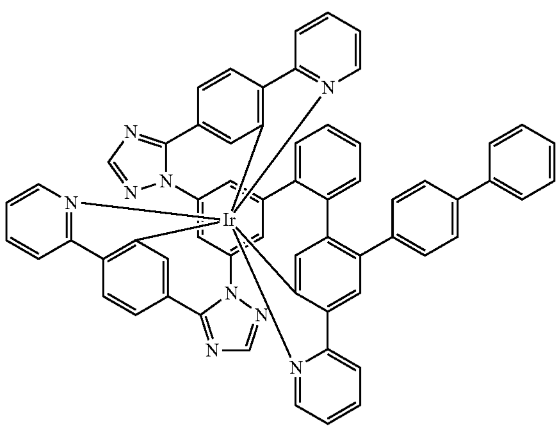
456
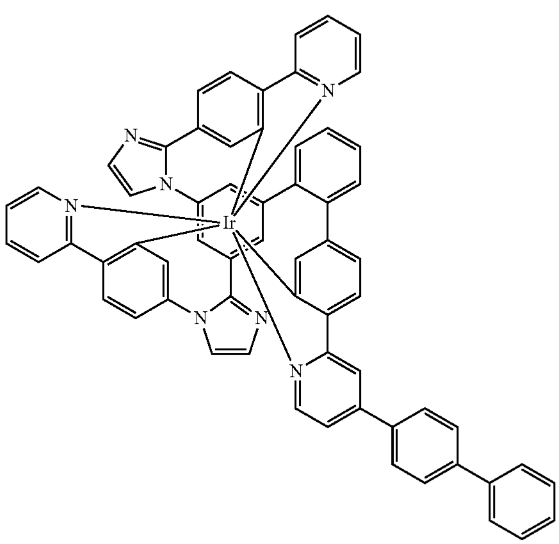
457
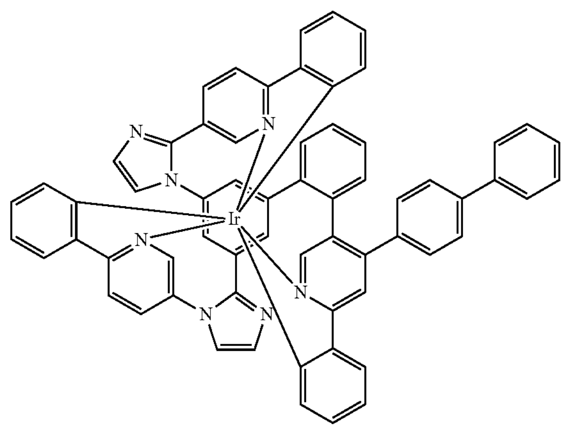
458
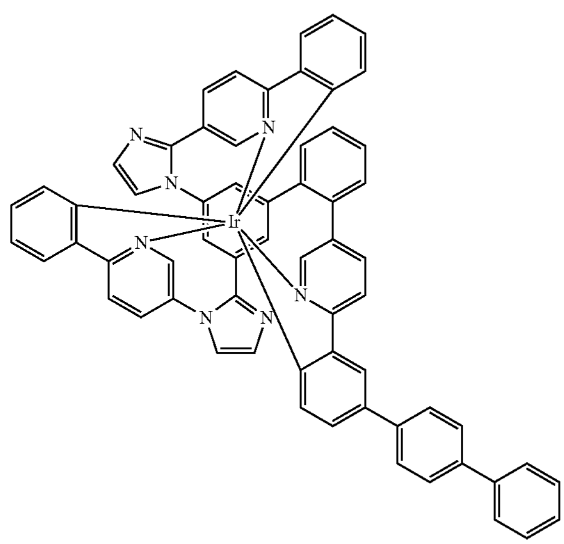
459
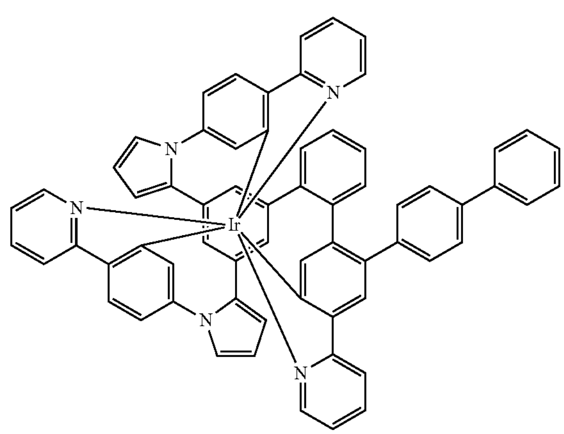

-continued
460
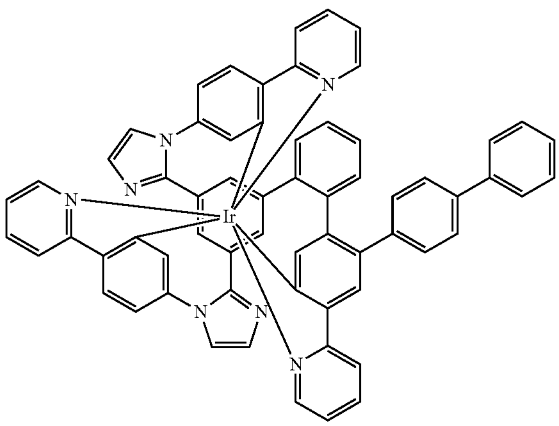
461
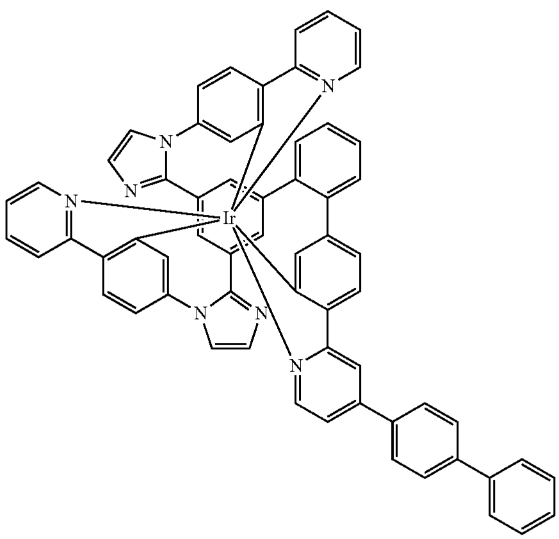
462
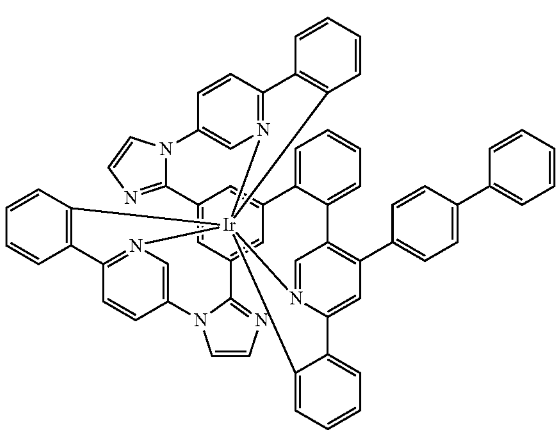
-continued
463
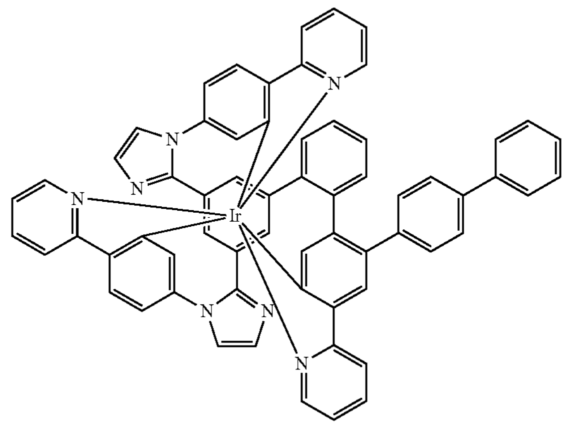
464
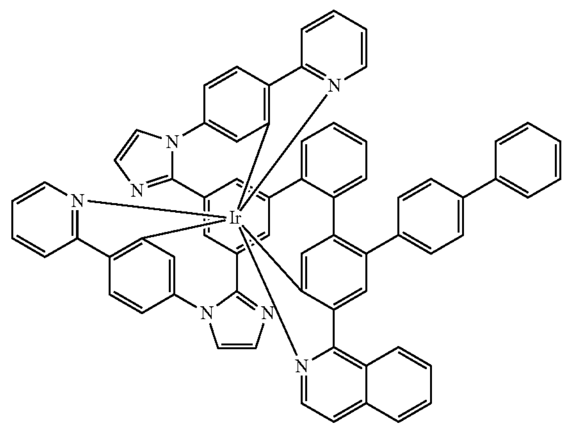
465
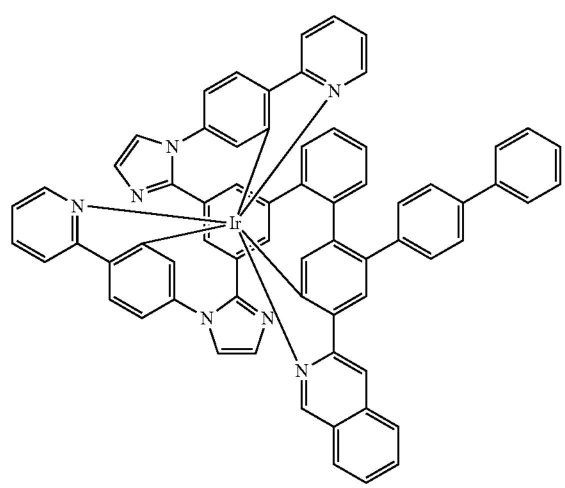

-continued
466
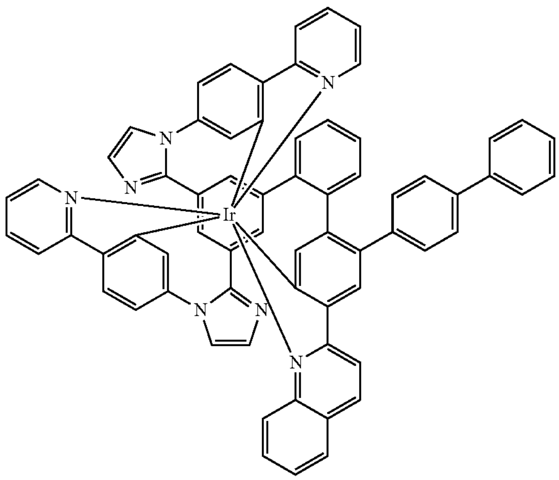
467
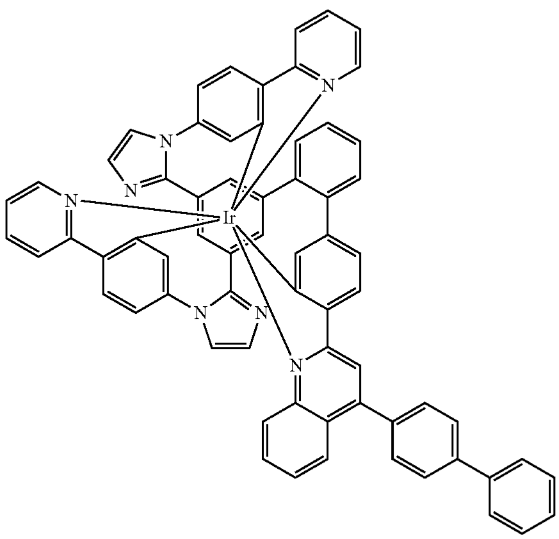
468
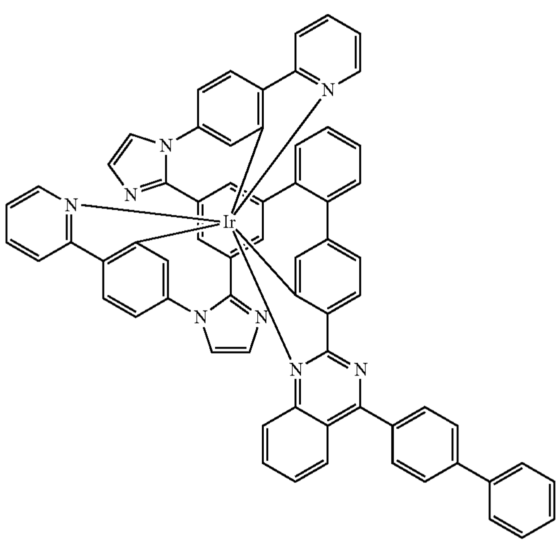
-continued
469
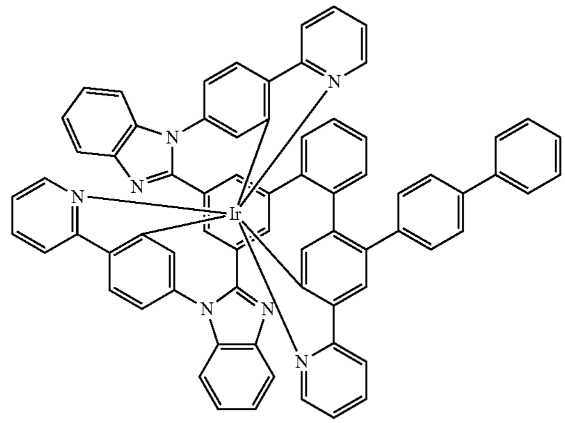
470
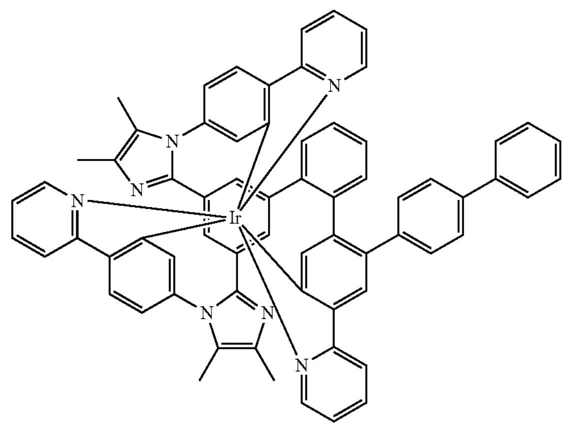
471
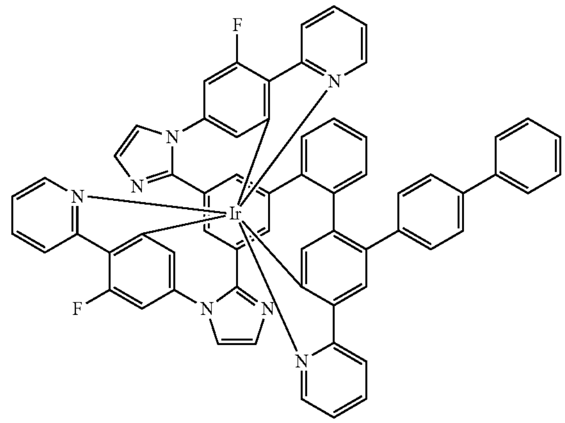

-continued
472
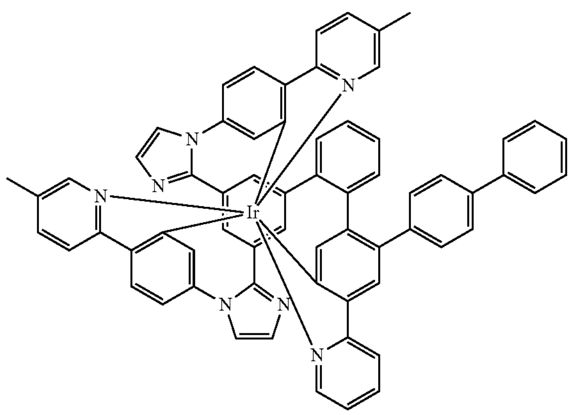
473
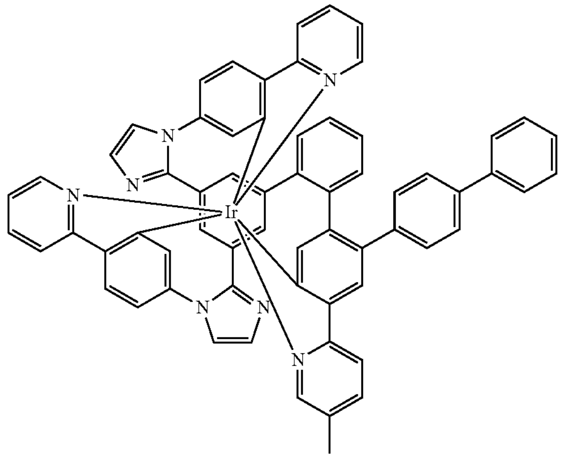
474
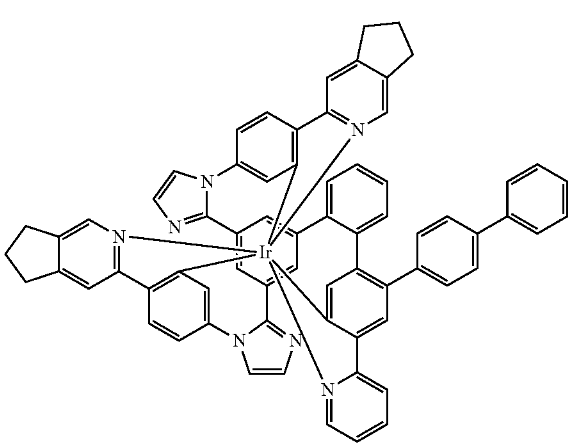
-continued
475
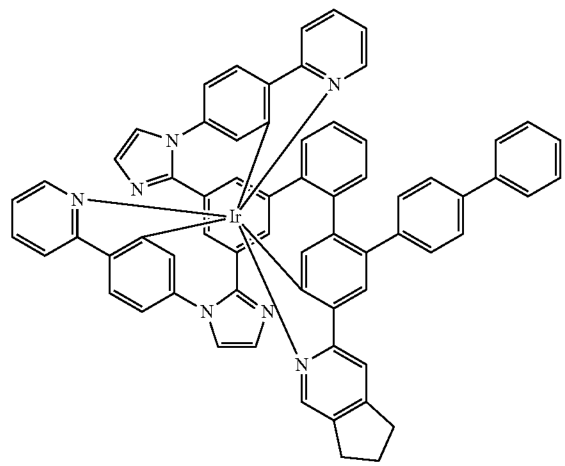
476
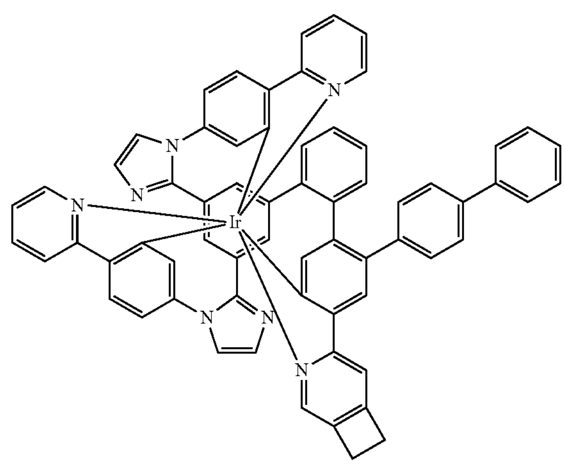
477
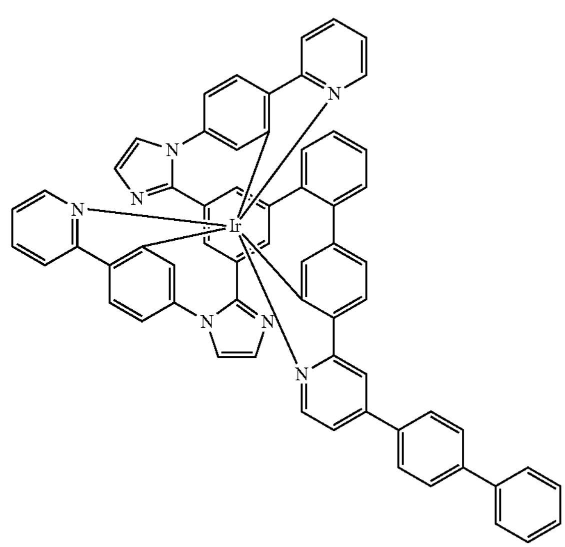

-continued
478
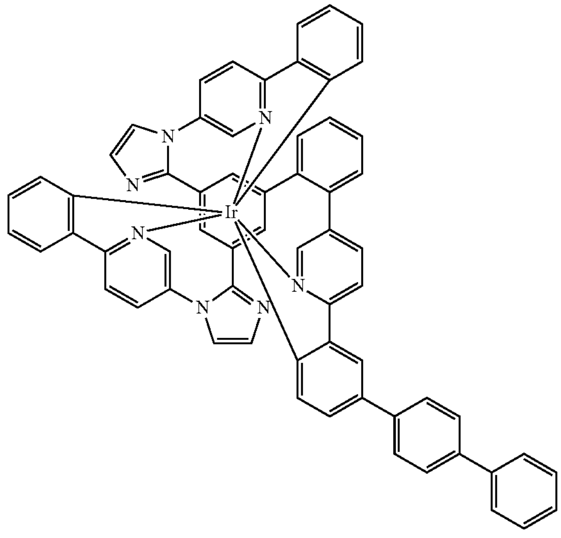
479
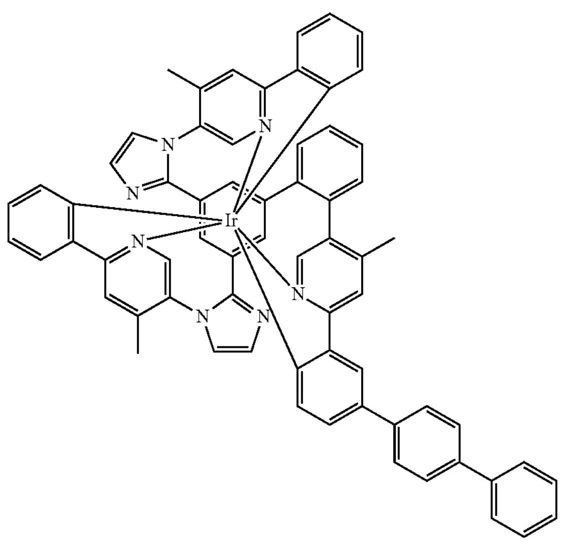
480
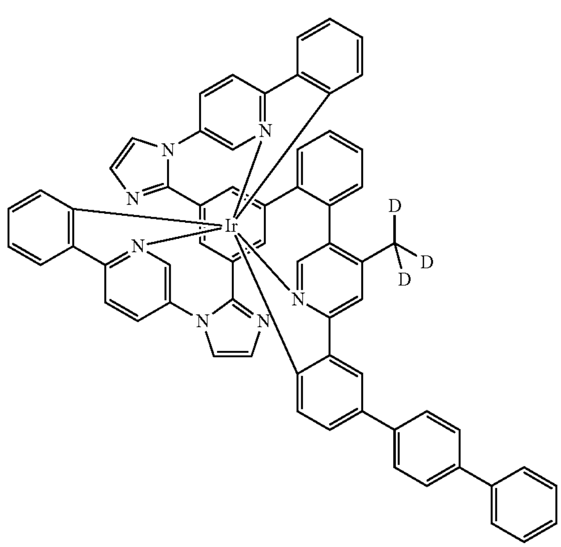
-continued
481
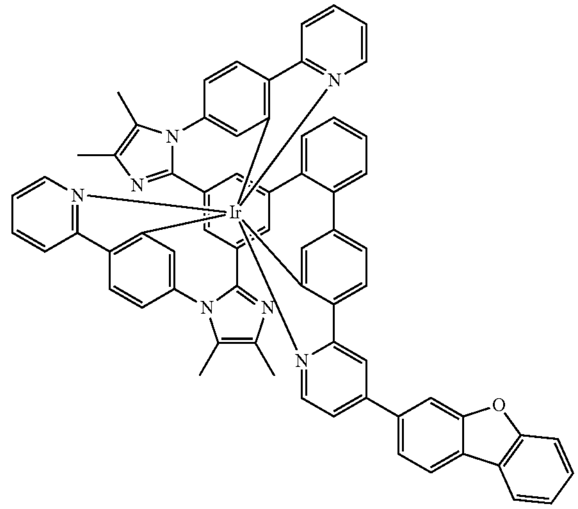
482
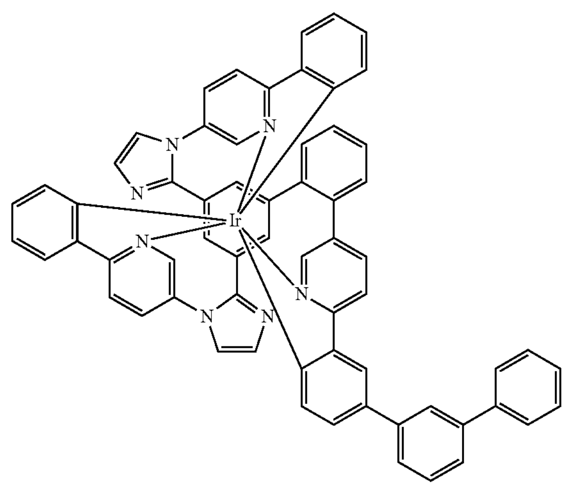
483
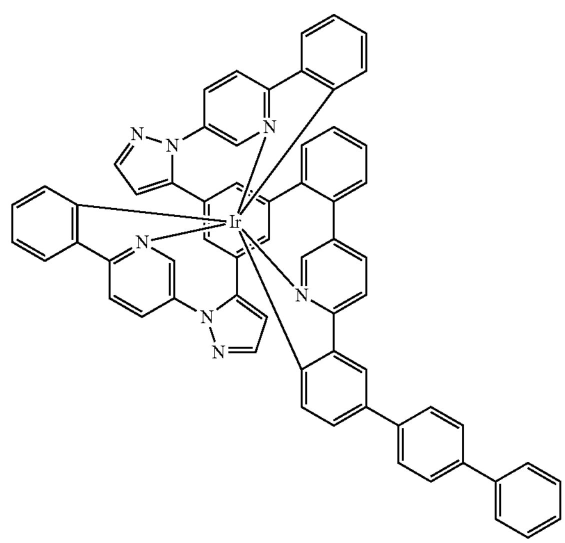

-continued

484

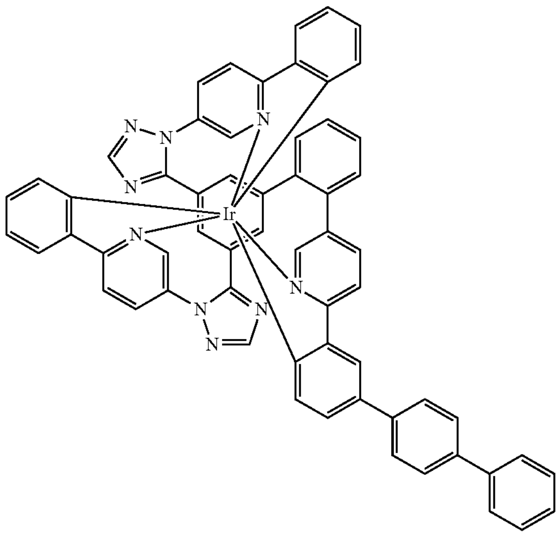

485

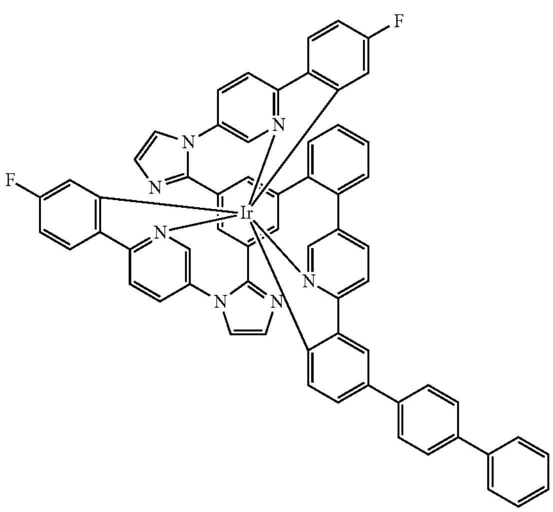

486

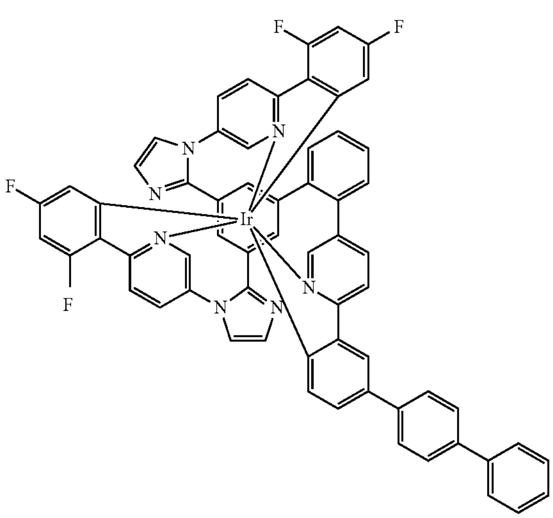

-continued

487

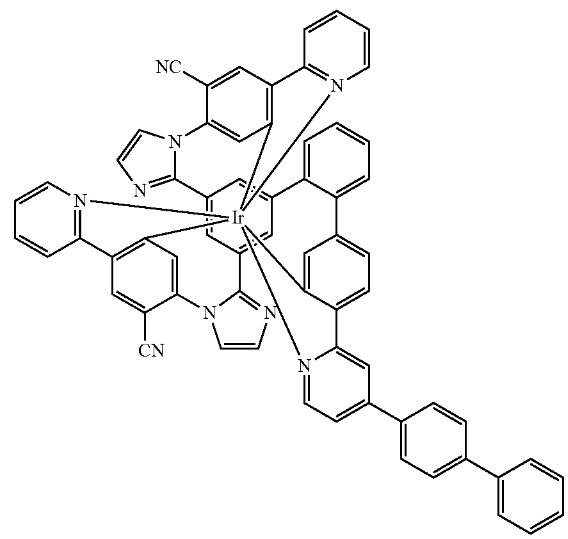

488

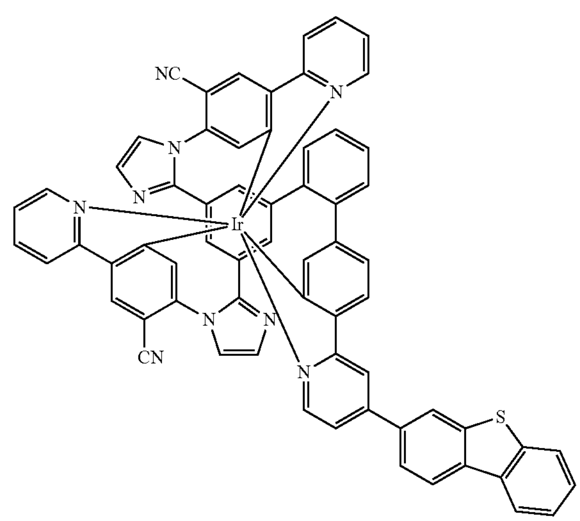

The metal complexes of the invention are chiral structures. If the tripodal ligand of the complex is additionally also chiral, the formation of diastereomers and multiple enantiomer pairs is possible. In that case, the complexes of the invention include both the mixtures of the different diastereomers or the corresponding racemates and the individual isolated diastereomers or enantiomers.

If ligands having two identical sub-ligands $L^2$ are used in the ortho-metallation, what is obtained is typically a racemic mixture of the $C_1$-symmetric complexes, i.e. of the $\Delta$ and $\Lambda$ enantiomers. These can be separated by standard methods (chromatography on chiral materials/columns or optical resolution by crystallization), as shown in Scheme 1, where R is a group of the formula (3) or (4).

Scheme 1:

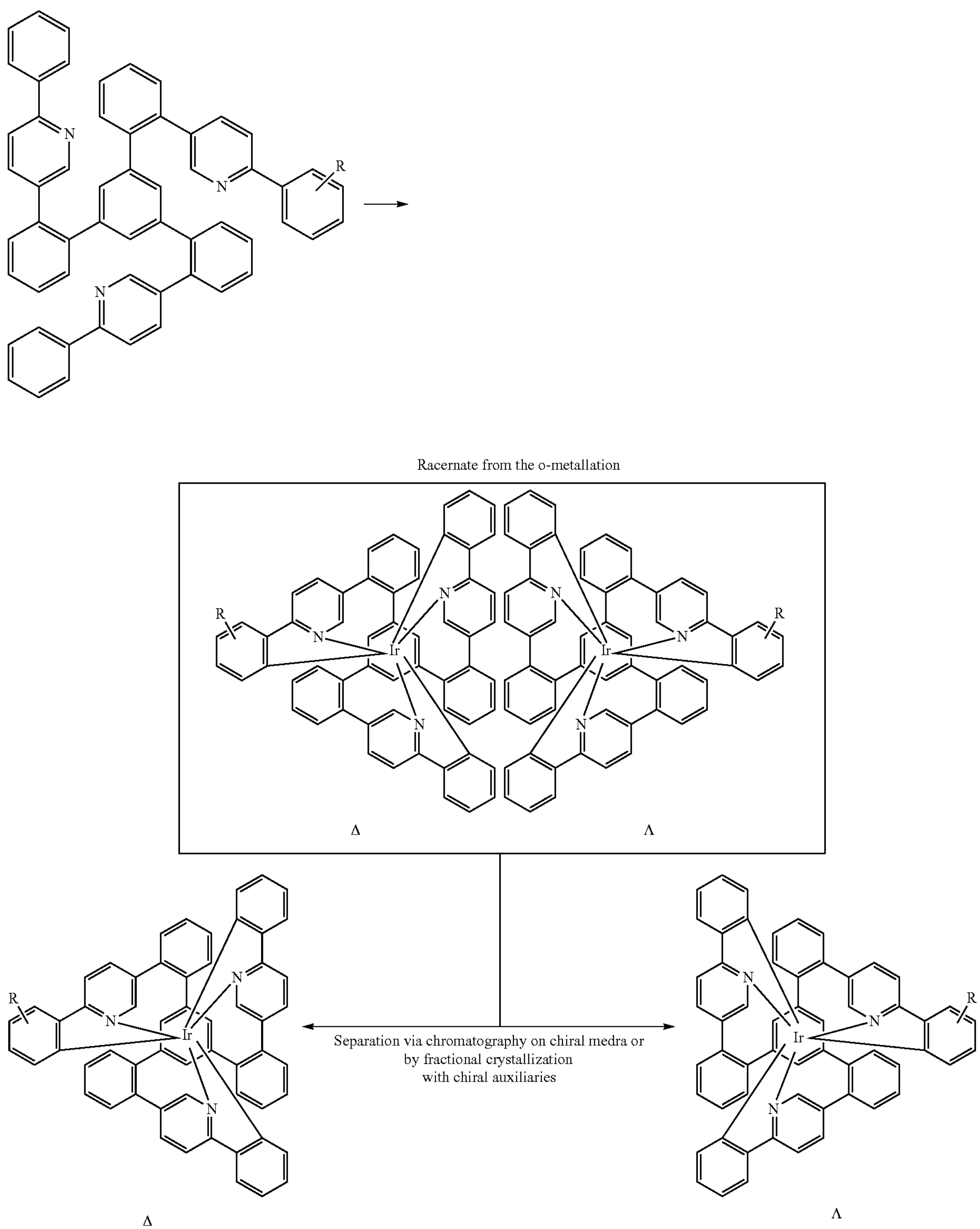

Optical resolution via fractional crystallization of diastereomeric salt pairs can be effected by customary methods. One option for this purpose is to oxidize the uncharged Ir(III) complexes (for example with peroxides or $H_2O_2$ or by electrochemical means), add the salt of an enantiomerically pure monoanionic base (chiral base) to the cationic Ir(IV) complexes thus produced, separate the diastereomeric salts thus produced by fractional crystallization, and then reduce them with the aid of a reducing agent (e.g. zinc, hydrazine hydrate, ascorbic acid, etc.) to give the enantiomerically pure uncharged complex, as shown in Scheme 2.

Scheme 2

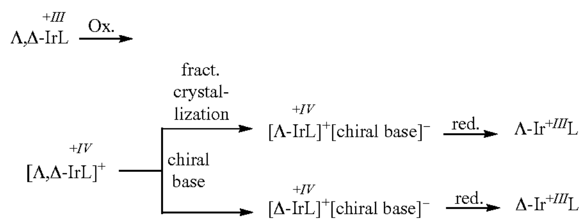

In addition, an enantiomerically pure or enantiomerically enriching synthesis is possible by complexation in a chiral medium (e.g. R- or S-1,1-binaphthol).

If ligands having three different sub-ligands $L^1$ and $L^2$ are used in the complexation, what is typically obtained is a diastereomer mixture of the complexes which can be separated by standard methods (chromatography, crystallization, etc.).

Enantiomerically pure $C_1$-symmetric complexes can also be synthesized selectively, as shown in Scheme 3. For this purpose, an enantiomerically pure $C_1$-symmetric ligand is prepared and complexed, the diastereomer mixture obtained is separated and then the chiral group is detached.

Scheme 3

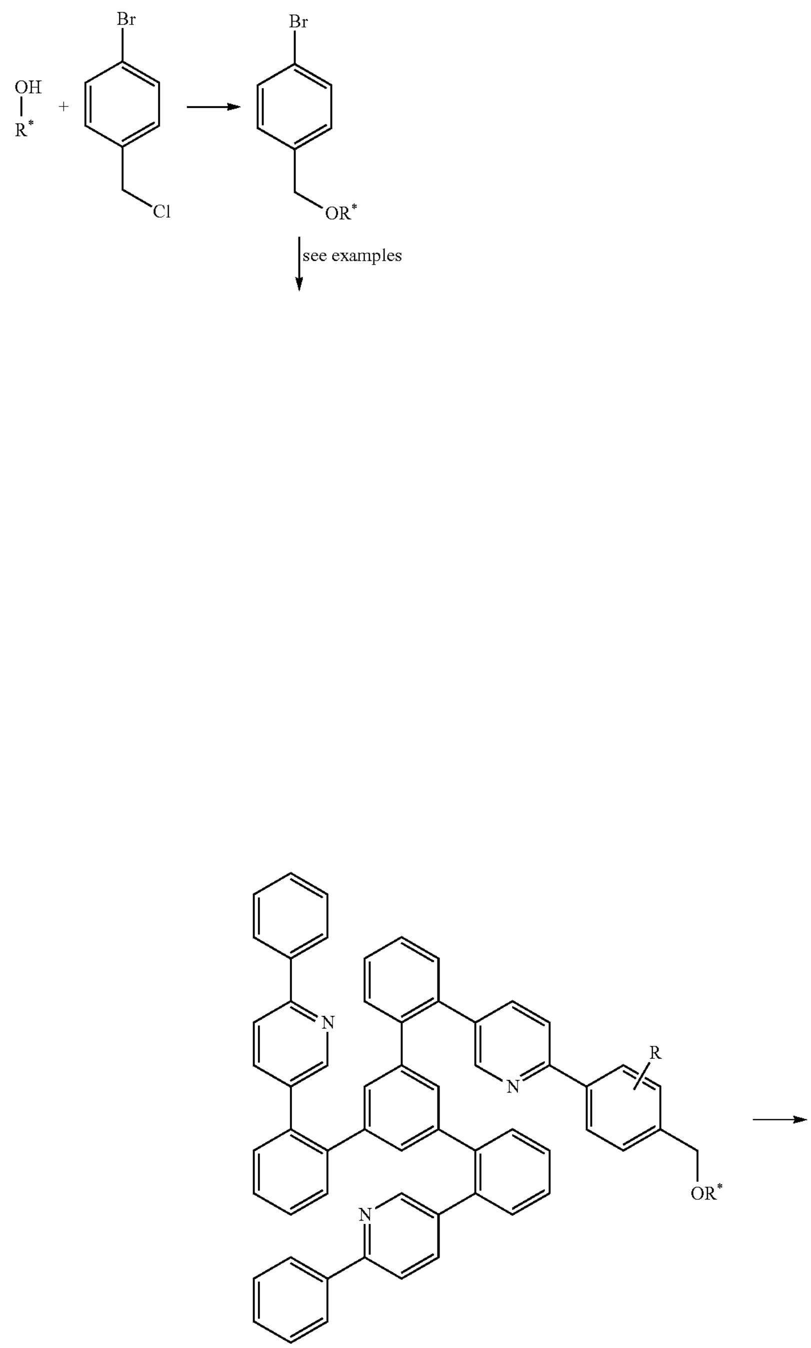

-continued

Diastereomer mixture from the o-metallation

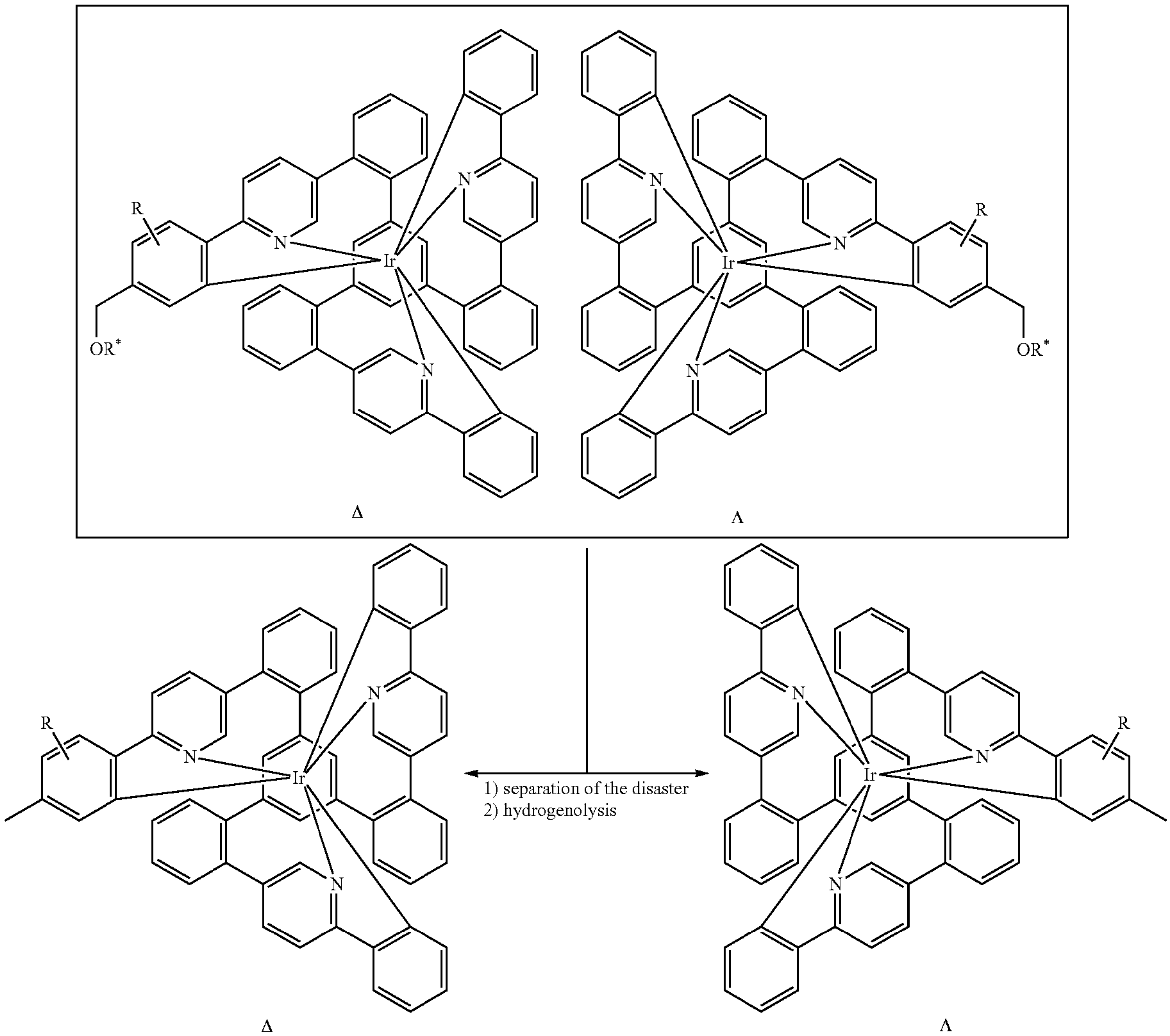

R*: anantiomerically, pure radical

The compounds of the invention are preparable in principle by various processes. In general, for this purpose, an iridium salt is reacted with the corresponding free ligand.

Therefore, the present invention further provides a process for preparing the compounds of the invention by reacting the appropriate free ligands with iridium alkoxides of the formula (34), with iridium ketoketonates of the formula (35), with iridium halides of the formula (36) or with iridium carboxylates of the formula (37)

Formula (34)

$Ir(OR)_8$

Formula (35)

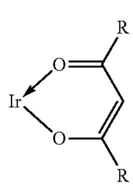

-continued

Formula (36)

$IrHal_3$

Formula (37)

$Ir(OOCR)_8$ where R has the definitions given above, Hal=F, Cl, Br or I and the iridium reactant may also be in the form of the corresponding hydrate. R here is preferably an alkyl group having 1 to 4 carbon atoms.

It is likewise possible to use iridium compounds bearing both alkoxide and/or halide and/or hydroxyl and ketoketonate radicals. These compounds may also be charged. Corresponding iridium compounds of particular suitability as reactants are disclosed in WO 2004/085449. Particularly suitable are $[IrCl_2(acac)_2]^-$, for example $Na[IrCl_2(acac)_2]$, metal complexes with acetylacetonate derivatives as ligand, for example $Ir(acac)_3$ or tris(2,2,6,6-tetramethylheptane-3,5-dionato)iridium, and $IrCl_3 \cdot xH_2O$ where x is typically a number from 2 to 4.

The synthesis of the complexes is preferably conducted as described in WO 2002/060910 and in WO 2004/085449. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be o-metallated. It is optionally also possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, R- or S-binaphthol or else the corresponding racemate, 1,2-, 1,3- or 1,4-bisphenoxybenzene, triphenylphosphine oxide, 18-crown-6, phenol, 1-naphthol, hydroquinone, etc. Particular preference is given here to the use of hydroquinone.

It is possible by these processes, if necessary followed by purification, for example recrystallization or sublimation, to obtain the inventive compounds of formula (1) in high purity, preferably more than 99% (determined by means of $^{1}$H NMR and/or HPLC).

The compounds of the invention may also be rendered soluble by suitable substitution, for example by comparatively long alkyl groups (about 4 to 20 carbon atoms), especially branched alkyl groups. Another particular method that leads to a distinct improvement in the solubility of the metal complexes is the use of fused-on aliphatic groups, as shown, for example, by the formulae (27) to (33) disclosed above. Such compounds are then soluble in sufficient concentration at room temperature in standard organic solvents, for example toluene or xylene, to be able to process the complexes from solution. These soluble compounds are of particularly good suitability for processing from solution, for example by printing methods.

For the processing of the iridium complexes of the invention from a liquid phase, for example by spin-coating or by printing methods, formulations of the iridium complexes of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane, 2-methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore further provides a formulation comprising at least one compound of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The compound of the invention can be used in the electronic device as active component, preferably as emitter in the emissive layer or as hole or electron transport material in a hole- or electron-transporting layer, or as oxygen sensitizers or as photoinitiator or photocatalyst. The present invention thus further provides for the use of a compound of the invention in an electronic device or as oxygen sensitizer or as photoinitiator or photocatalyst. Enantiomerically pure iridium complexes of the invention are suitable as photocatalysts for chiral photoinduced syntheses.

The present invention still further provides an electronic device comprising at least one compound of the invention.

An electronic device is understood to mean any device comprising anode, cathode and at least one layer, said layer comprising at least one organic or organometallic compound. The electronic device of the invention thus comprises anode, cathode and at least one layer containing at least one iridium complex of the invention. Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), the latter being understood to mean both purely organic solar cells and dye-sensitized solar cells, organic optical detectors, organic photoreceptors, organic field-quench devices (O-FQDs), light-emitting electrochemical cells (LECs), oxygen sensors and organic laser diodes (O-lasers), comprising at least one compound of the invention in at least one layer. Compounds that emit in the infrared are suitable for use in organic infrared electroluminescent devices and infrared sensors. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis.

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. In this case, it is possible that one or more hole transport layers are p-doped, for example with metal oxides such as $MoO_3$ or $WO_3$, or with (per)fluorinated electron-deficient aromatics or with electron-deficient cyano-substituted heteroaromatics (for example according to JP 4747558, JP 2006-135145, US 2006/0289882, WO 2012/095143), or with quinoid systems (for example according to EP1336208) or with Lewis acids, or with boranes (for example according to US 2003/0006411, WO 2002/051850, WO 2015/049030) or with carboxylates of the elements of main group 3, 4 or 5 (WO 2015/018539), and/or that one or more electron transport layers are n-doped.

It is likewise possible for interlayers to be introduced between two emitting layers, which have, for example, an exciton-blocking function and/or control charge balance in the electroluminescent device and/or generate charges (charge generation layer, for example in layer systems having two or more emitting layers, for example in white-emitting OLED components). However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce. A preferred embodiment is tandem OLEDs. White-emitting organic electroluminescent devices may be used for lighting applications or else with colour filters for full-colour displays.

In a preferred embodiment of the invention, the organic electroluminescent device comprises the iridium complex of the invention as emitting compound in one or more emitting layers.

When the iridium complex of the invention is used as emitting compound in an emitting layer, it is preferably used in combination with one or more matrix materials. The mixture of the iridium complex of the invention and the matrix material contains between 0.1% and 99% by volume, preferably between 1% and 90% by volume, more preferably between 3% and 40% by volume and especially between 5% and 15% by volume of the iridium complex of the invention, based on the overall mixture of emitter and matrix material. Correspondingly, the mixture contains between 99.9% and 1% by volume, preferably between 99% and 10% by volume, more preferably between 97% and 60% by volume and especially between 95% and 85% by volume of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulfoxides and sulfones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, biscarbazole derivatives, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015, WO 2015/169412, WO 2017/148564 or WO 2017/148565, or bridged carbazole derivatives, for example according to US 2009/0136779, WO 2010/050778, WO 2011/042107 or WO 2011/088877.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material (called a “wide bandgap host”) having no significant involvement, if any, in the charge transport, as described, for example, in WO 2010/108579 or WO 2016/184540. Preference is likewise given to the use of two electron-transporting matrix materials, for example triazine derivatives and lactam derivatives, as described, for example, in WO 2014/094964.

Depicted below are examples of compounds that are suitable as matrix materials for the compounds of the invention.

Examples of triazines and pyrimidines which can be used as electron-transporting matrix materials are the following structures:

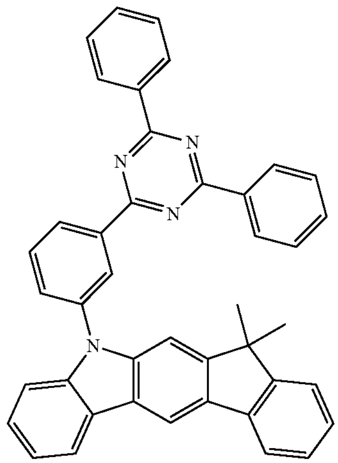
N
N
N
N
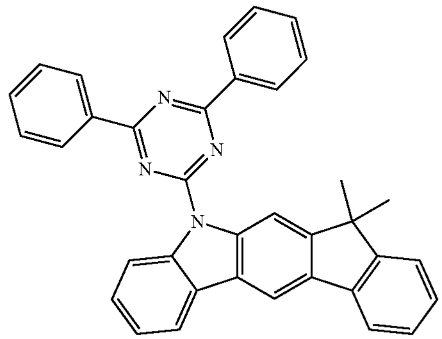
N
N
N
N
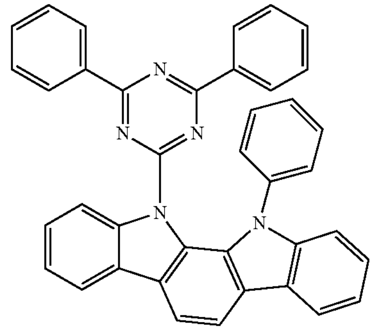
N
N
N
N
N
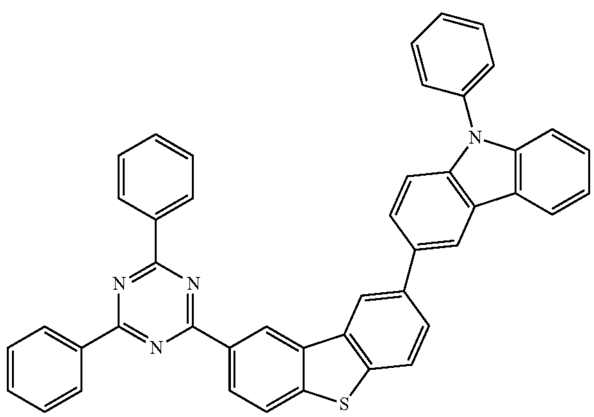
N
N
N
N
S
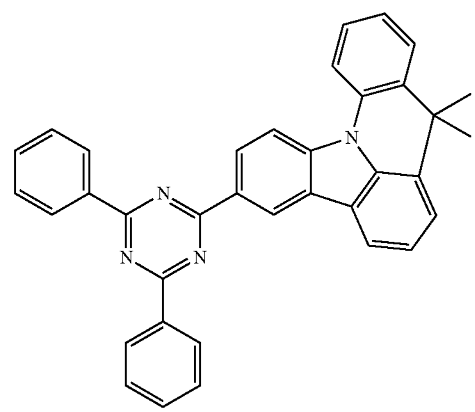
N
N
N
N
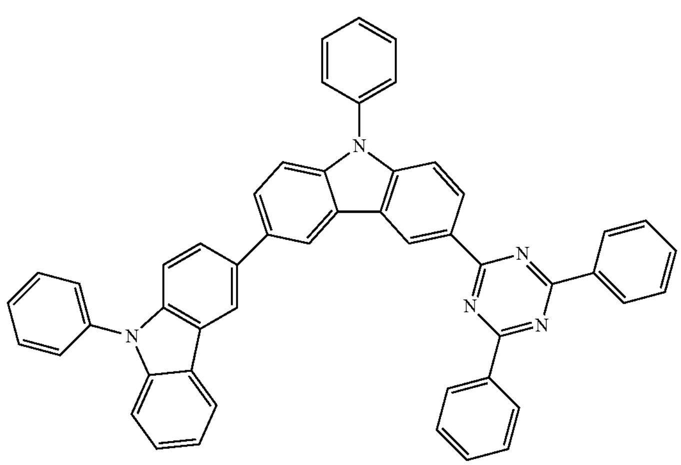
N
N
N
N
N -continued
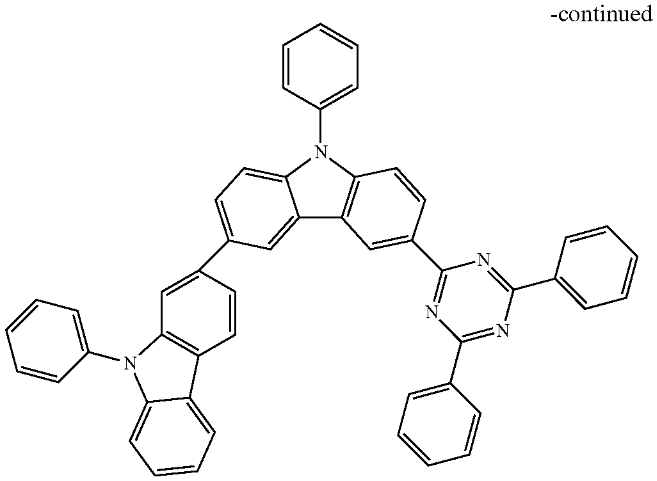
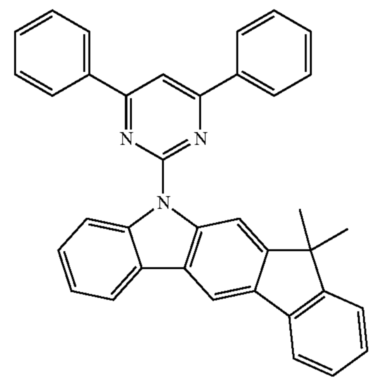
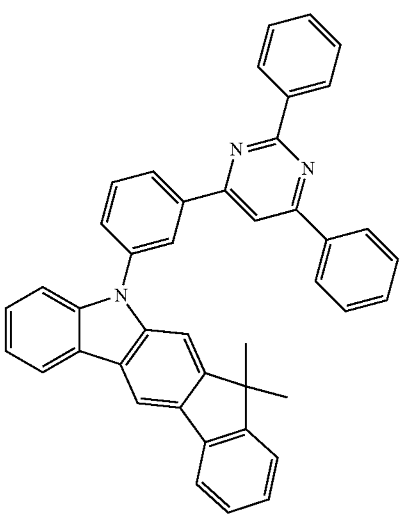
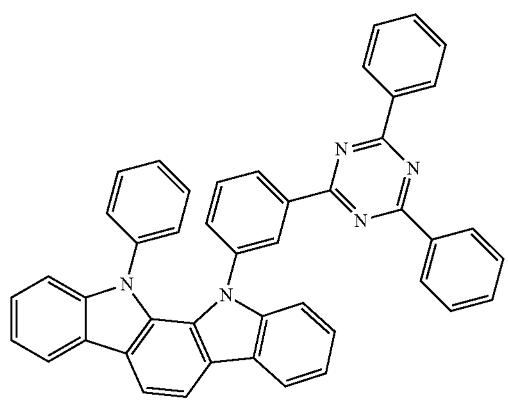
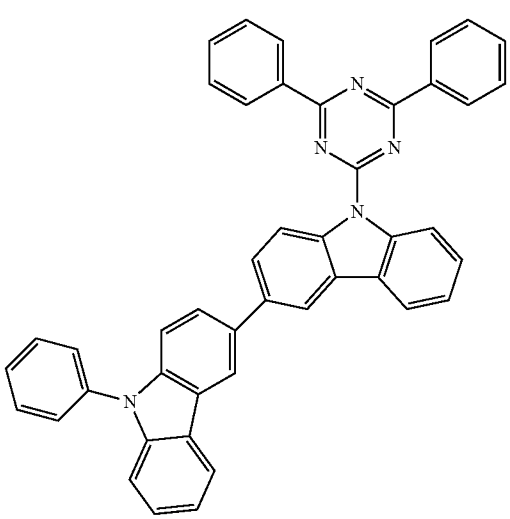
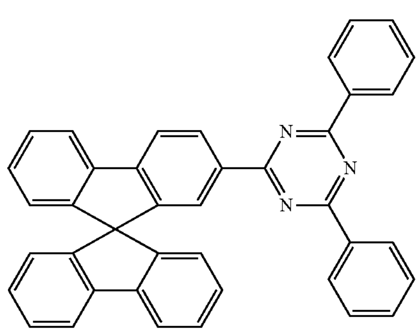

-continued
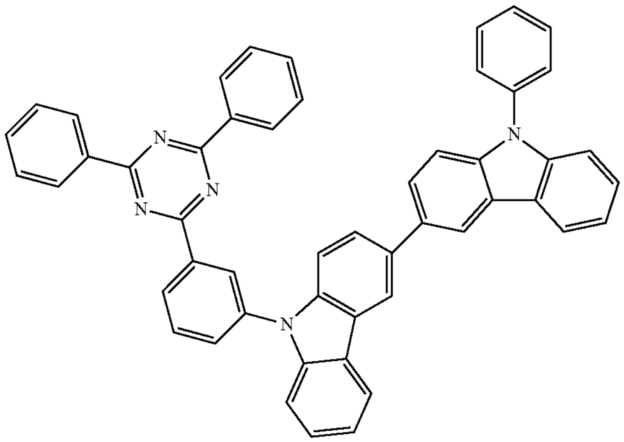
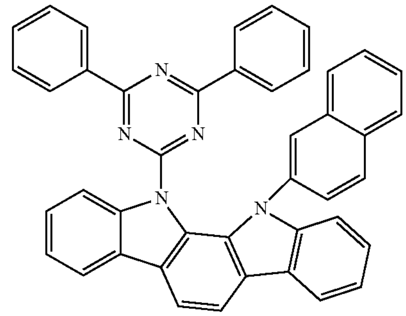
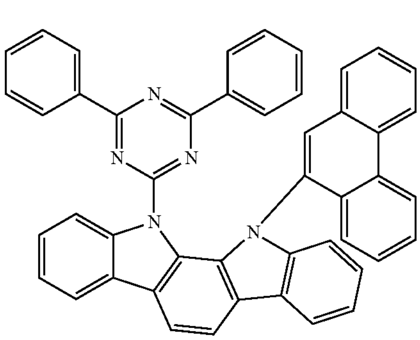
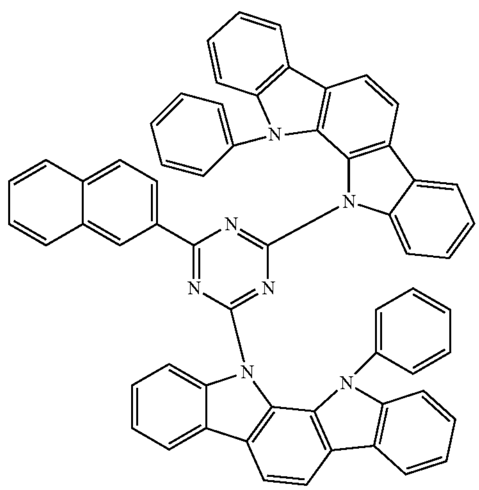
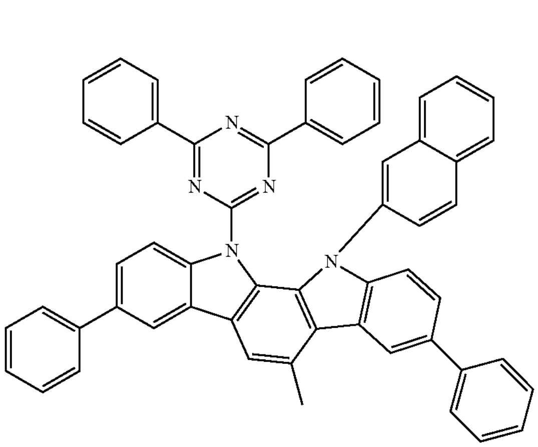
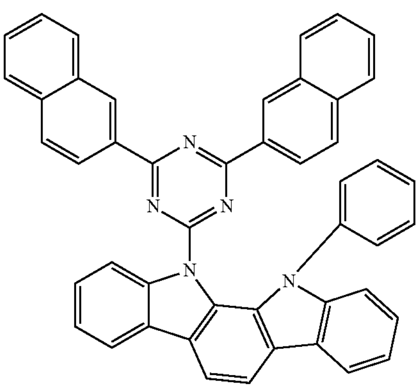

-continued
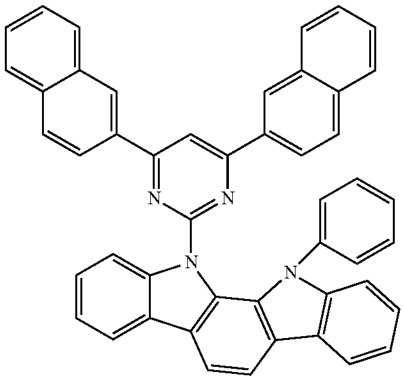
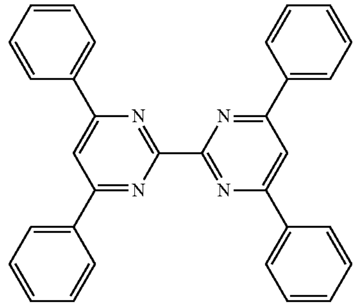
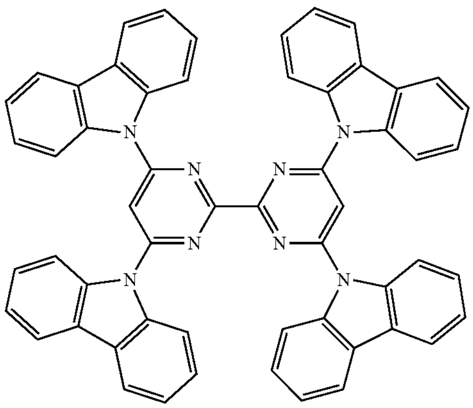
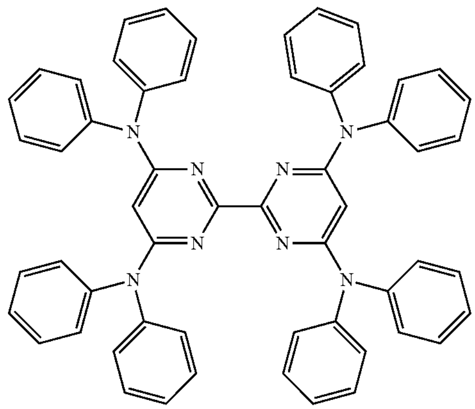
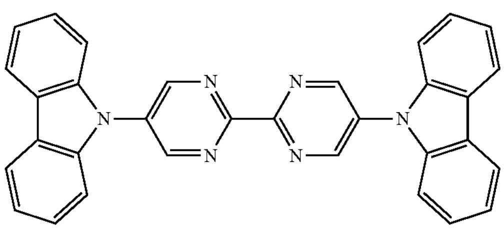
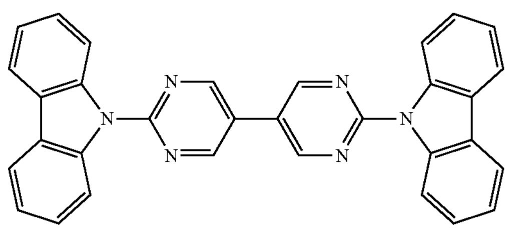
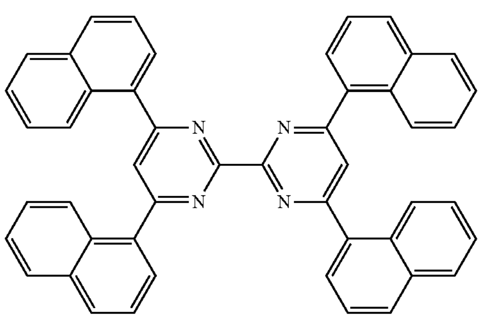
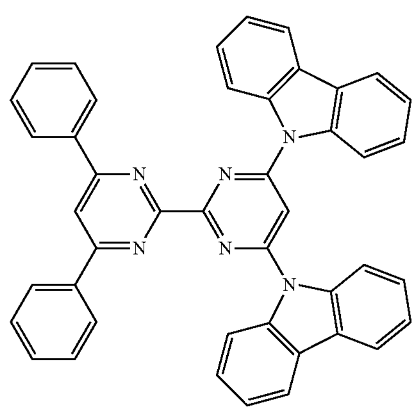

-continued
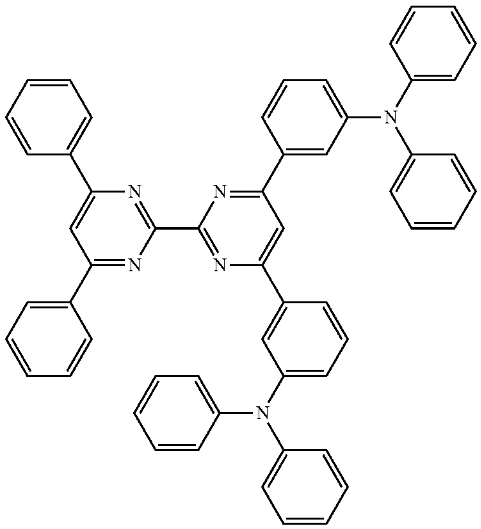
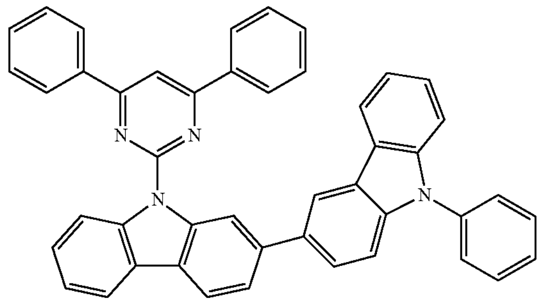
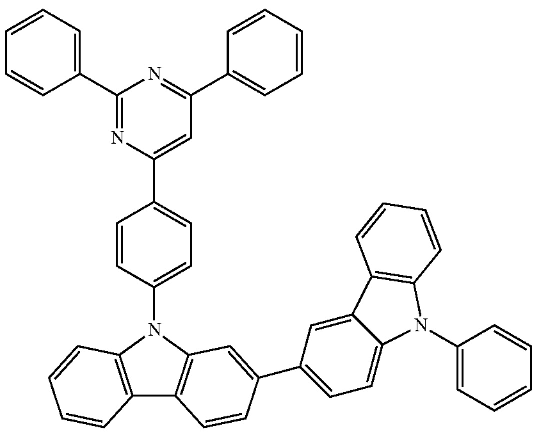
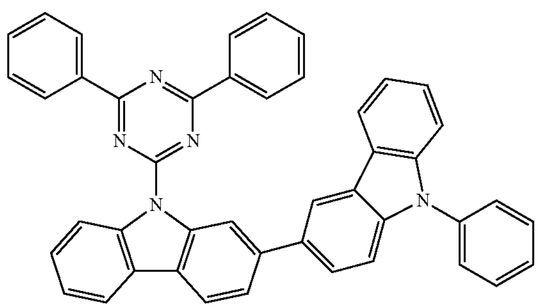
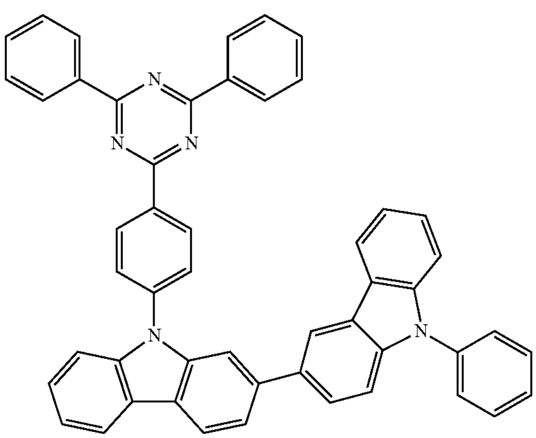
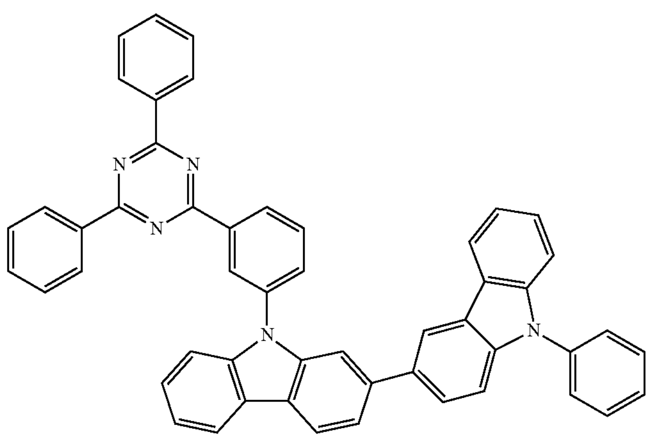

-continued
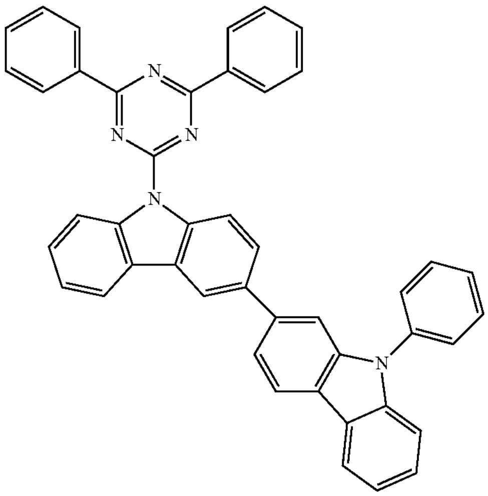
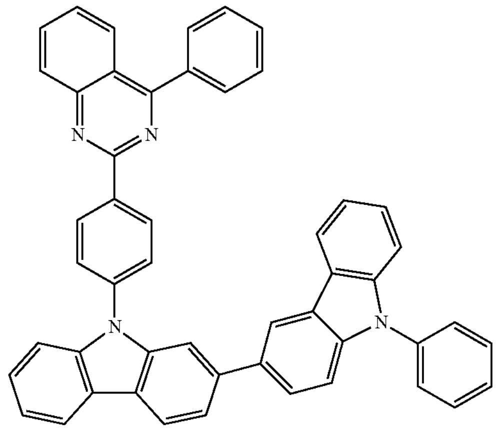
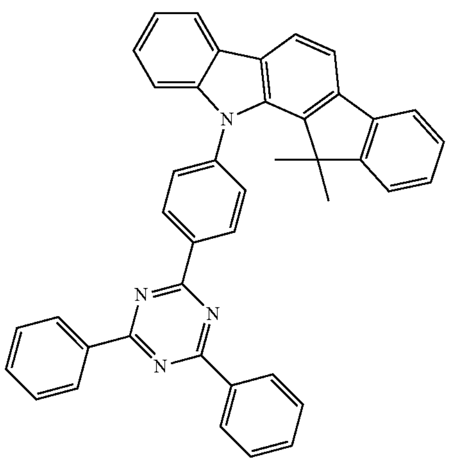
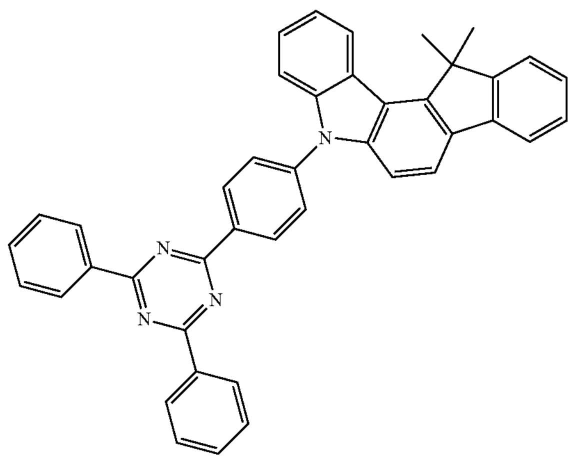
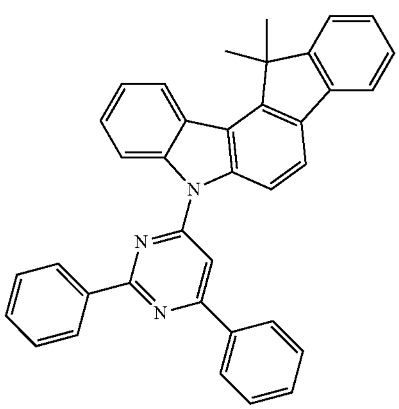
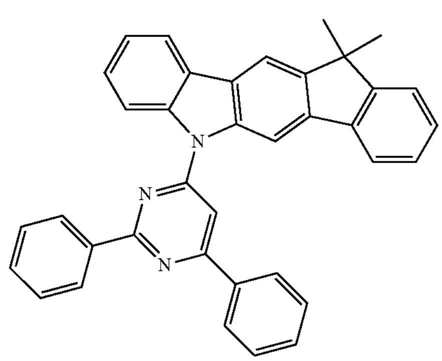

-continued
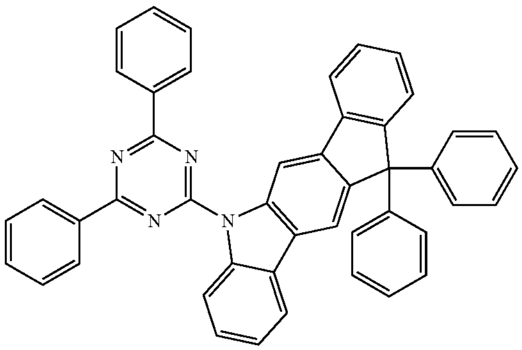
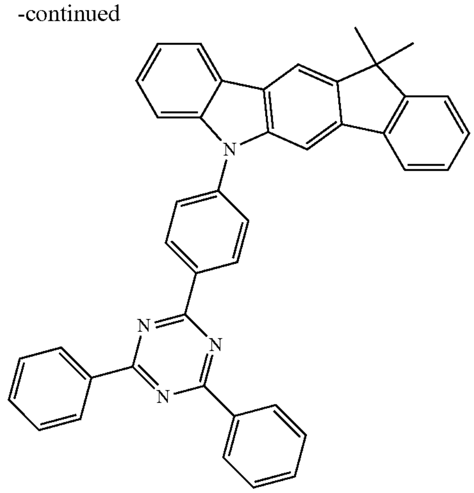
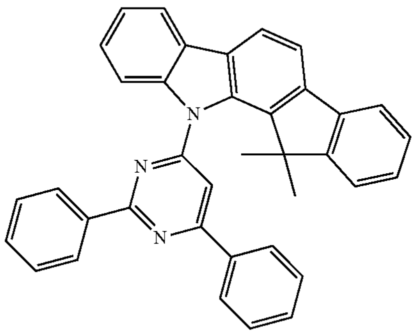
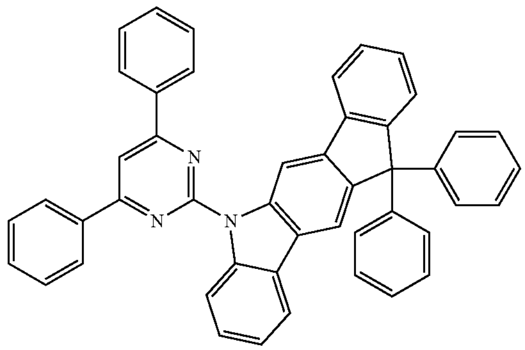
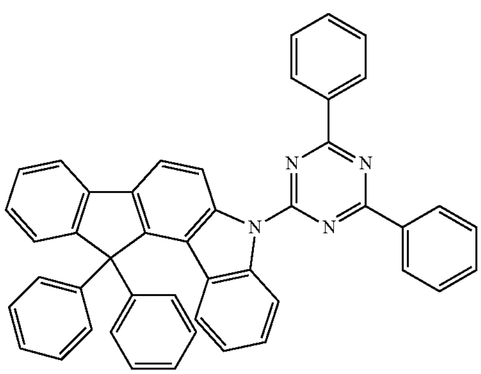
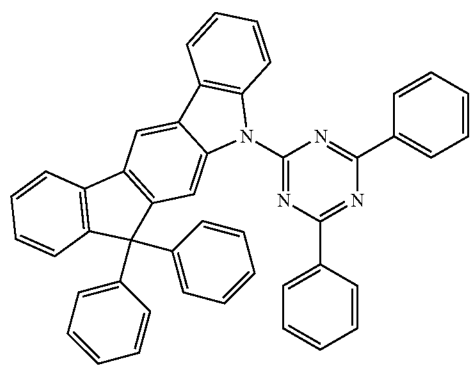
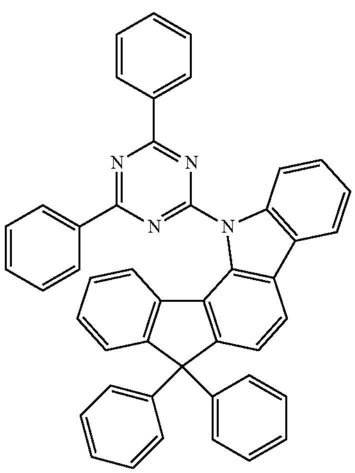
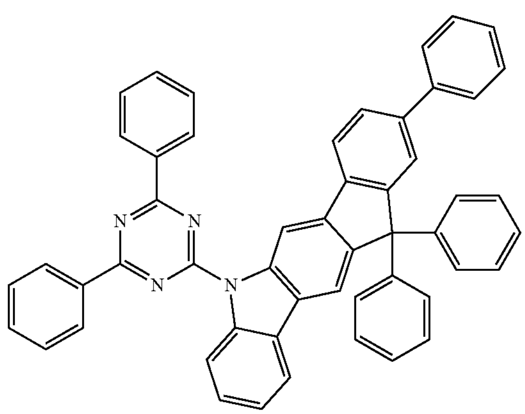

-continued
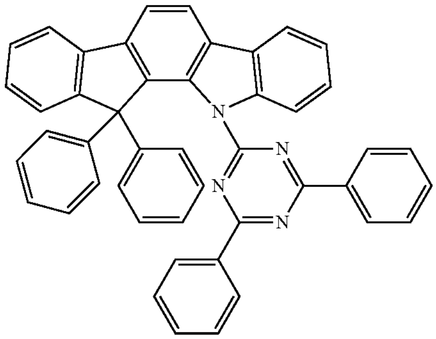
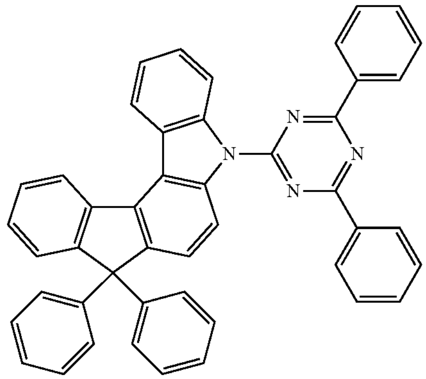
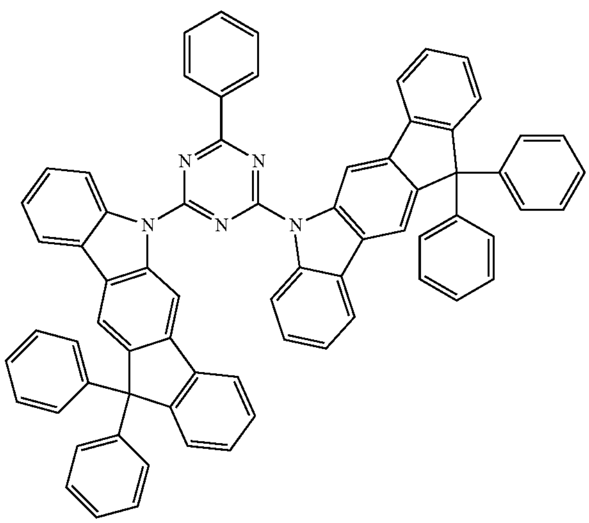
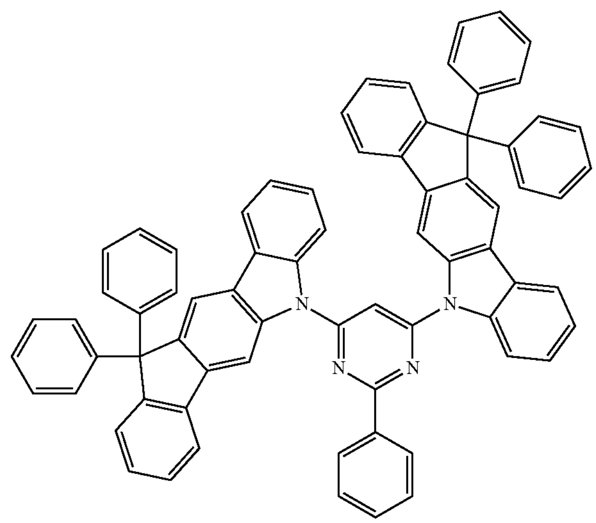
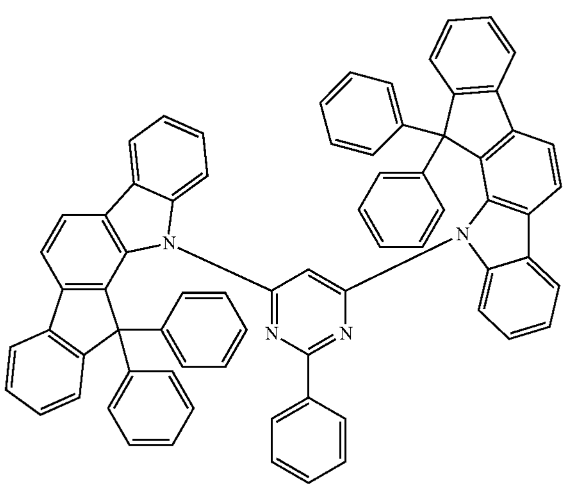
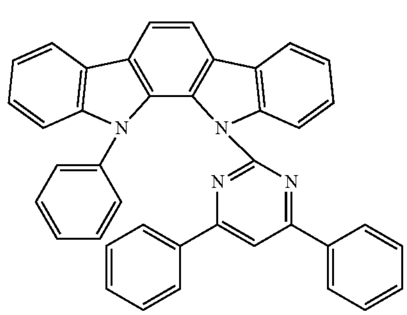

-continued
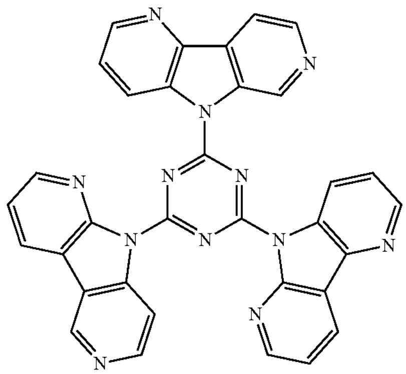
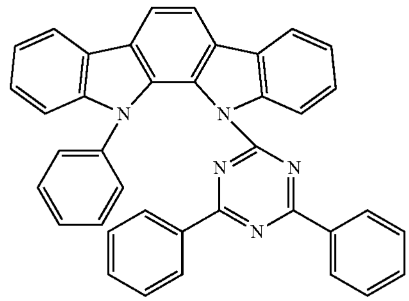
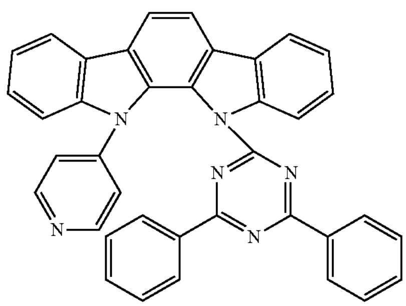
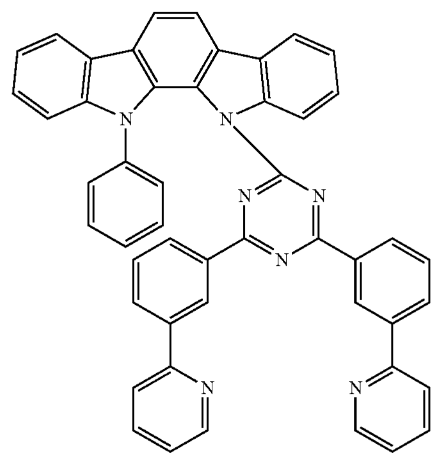
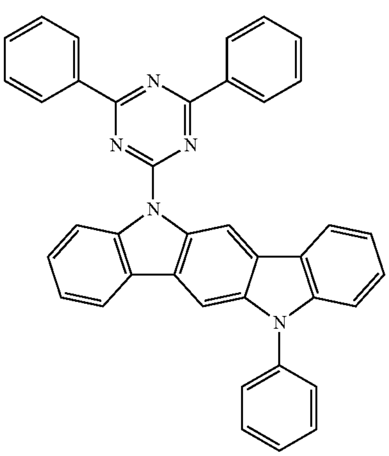
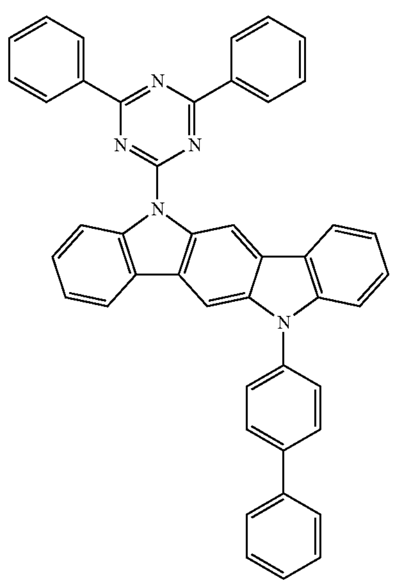

-continued
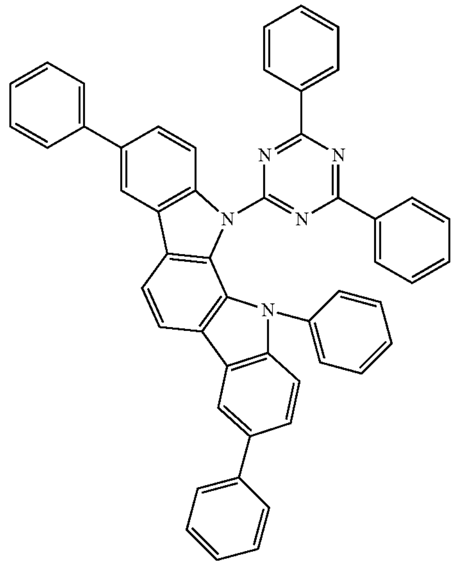
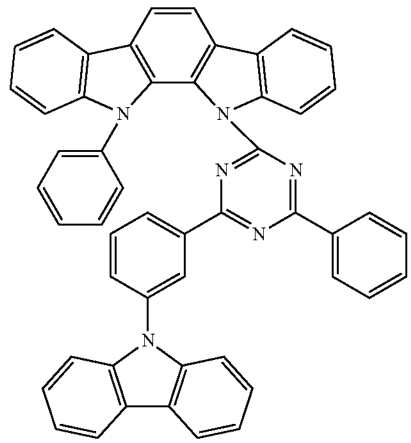
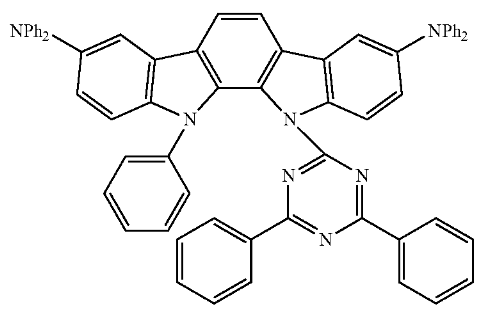
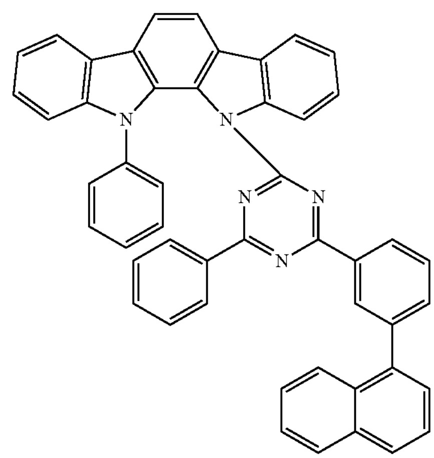
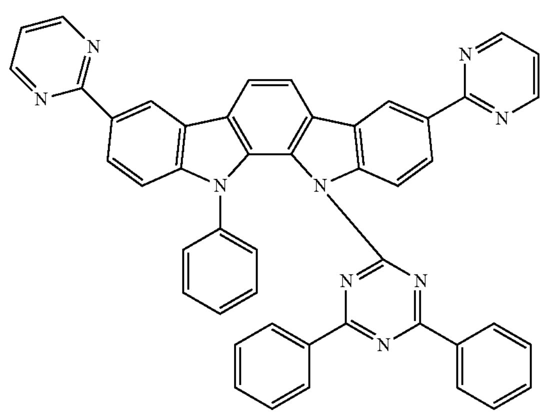
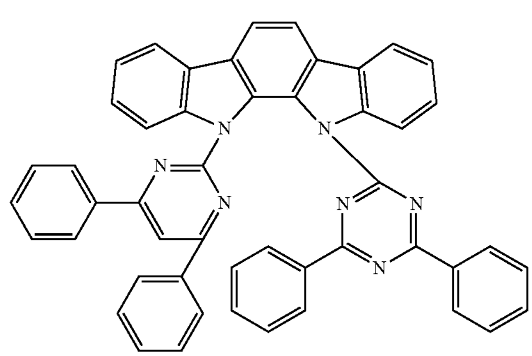

-continued
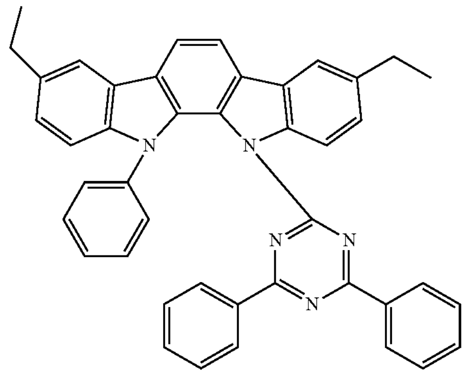
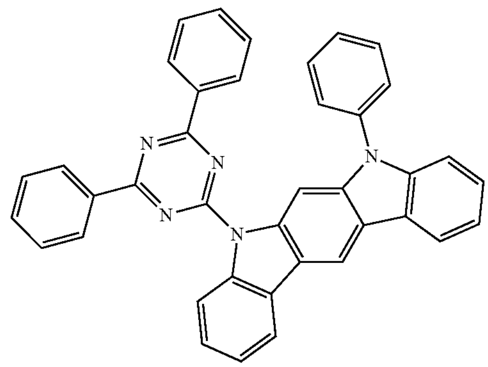
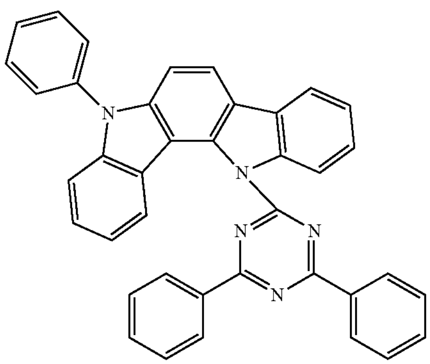
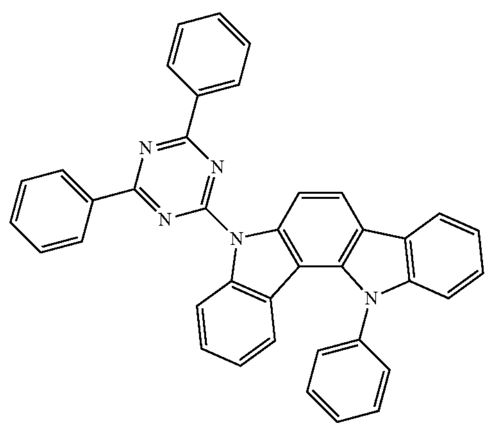
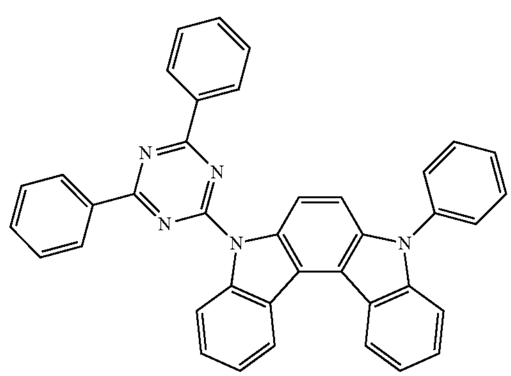
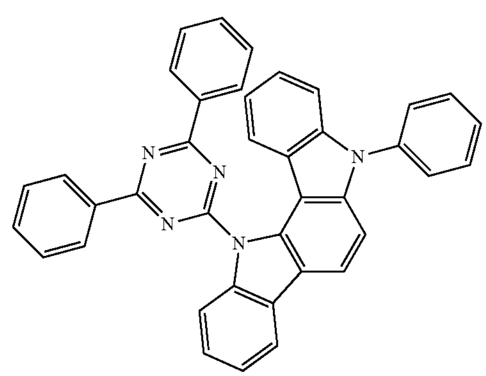
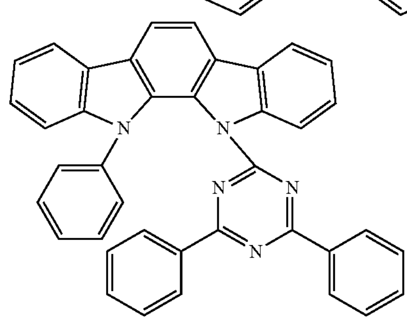
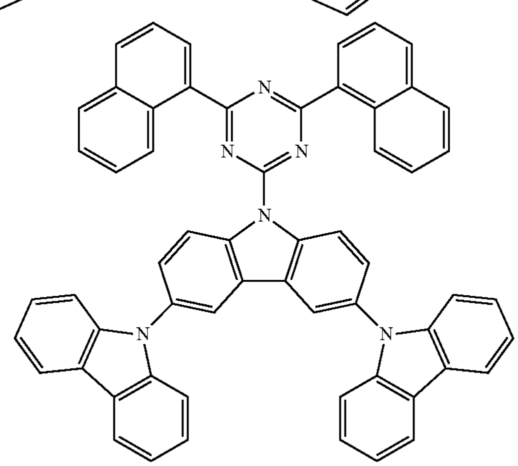

-continued
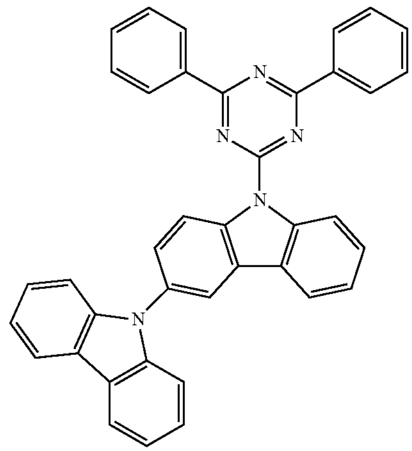
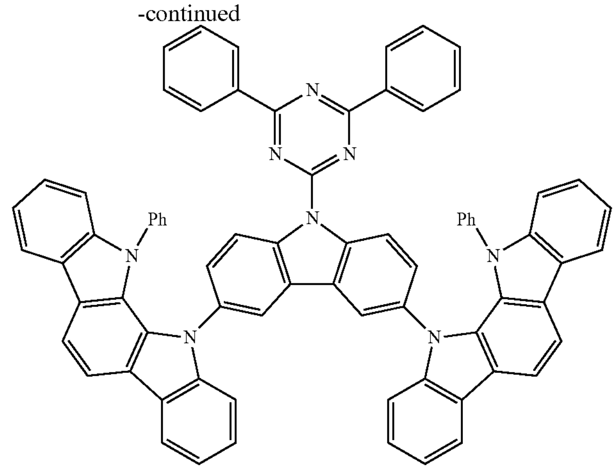
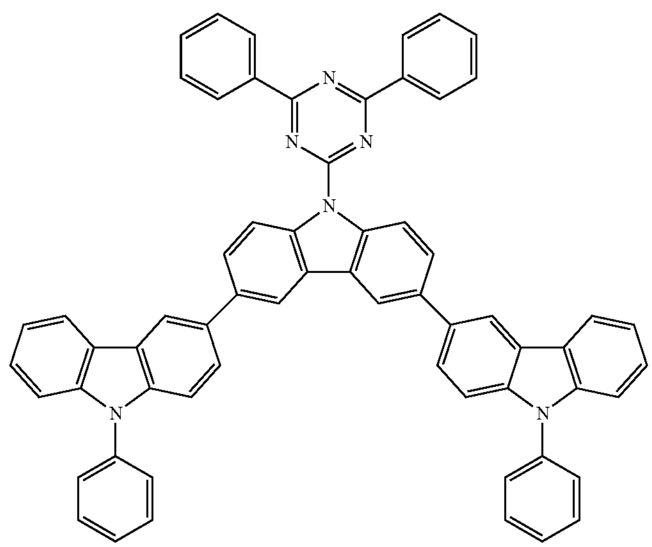
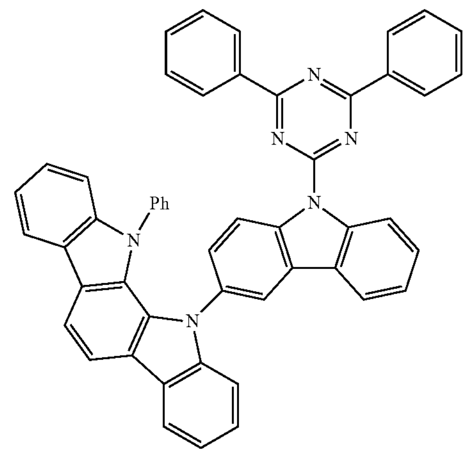
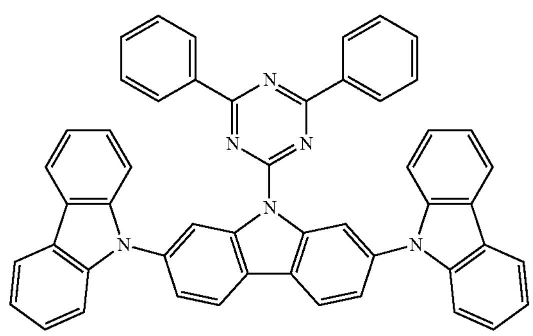
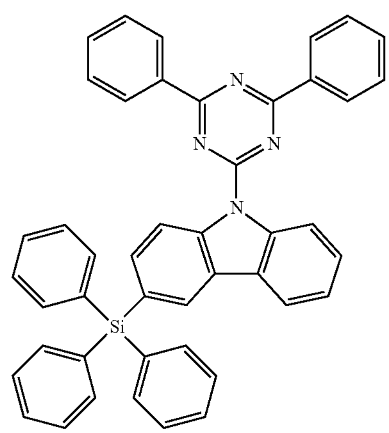

-continued
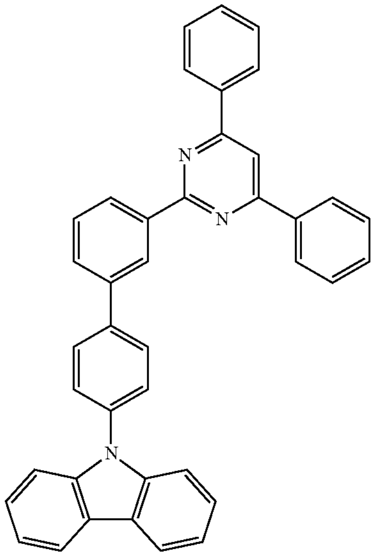
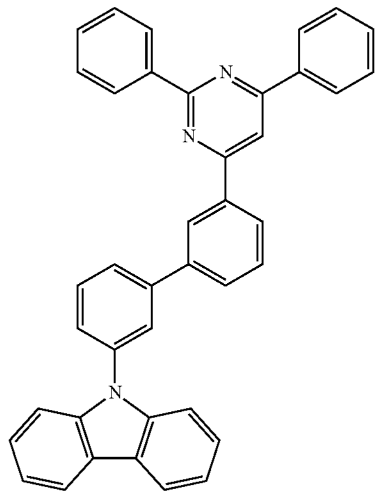
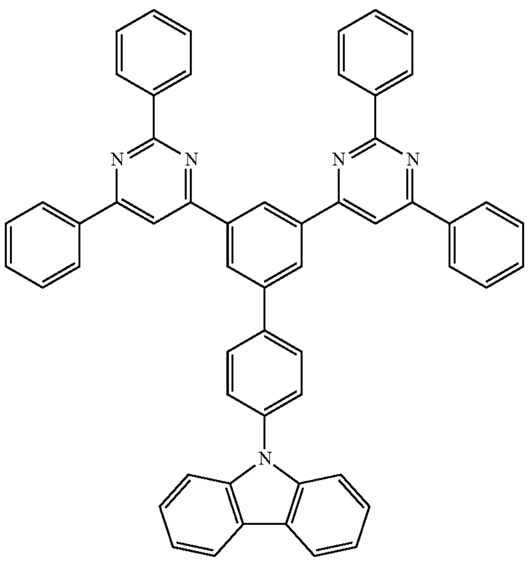
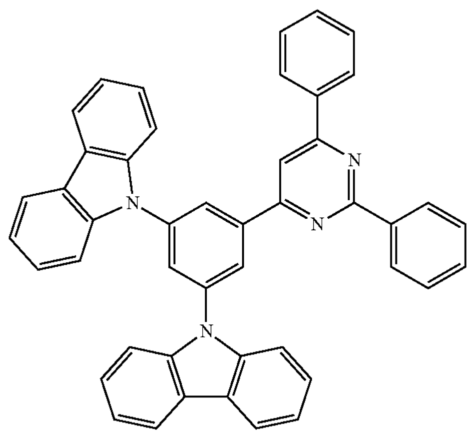
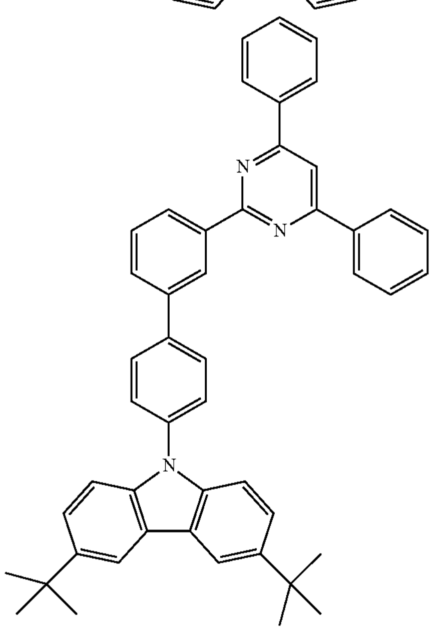
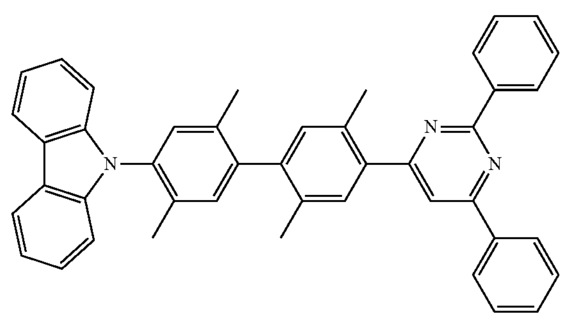

-continued
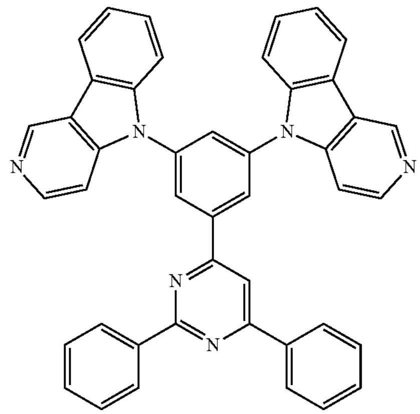
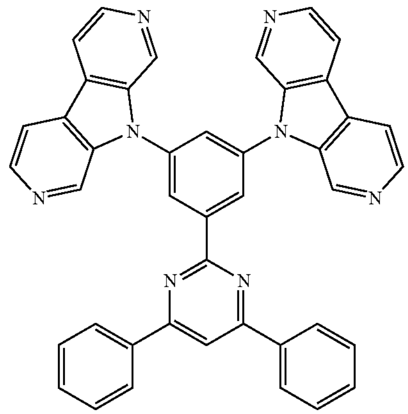
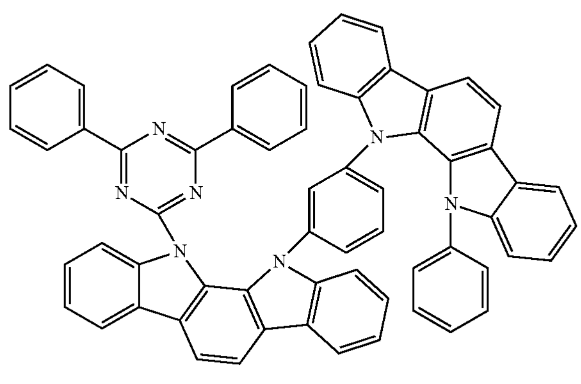
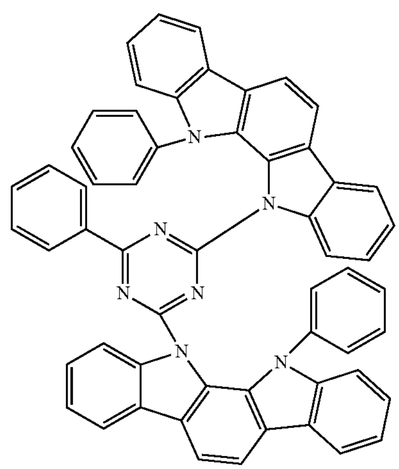
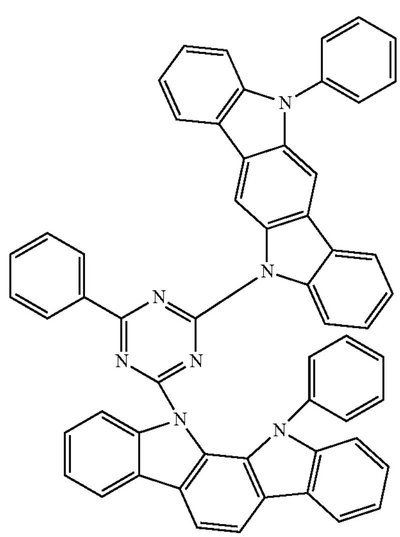
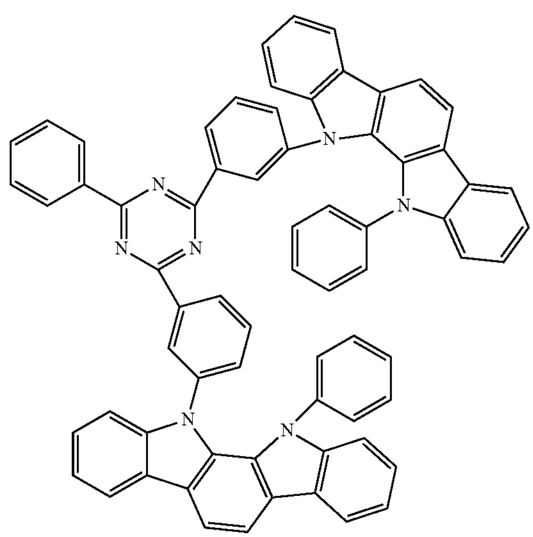

-continued
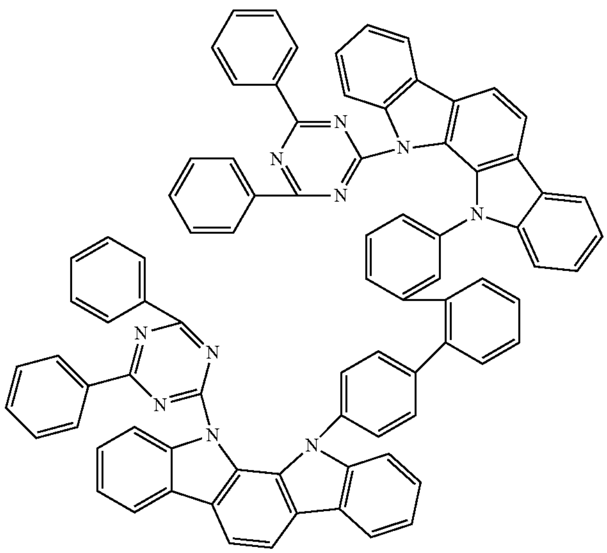
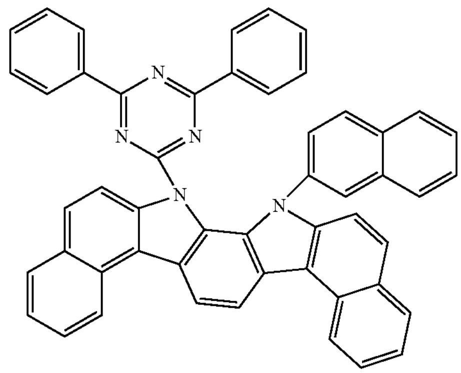
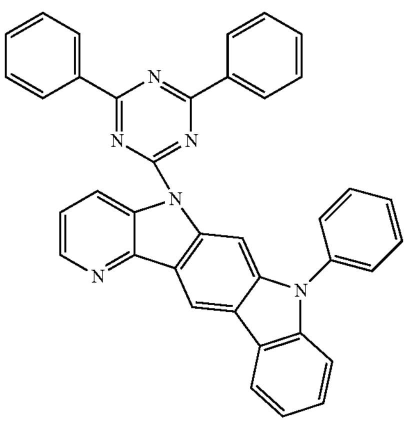
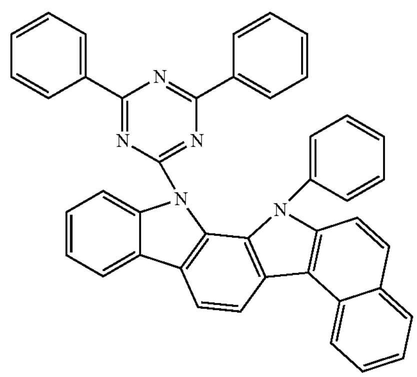
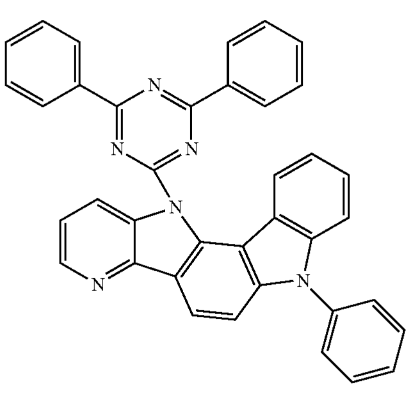
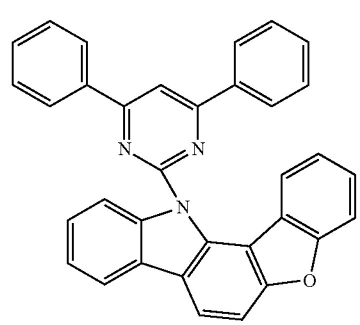
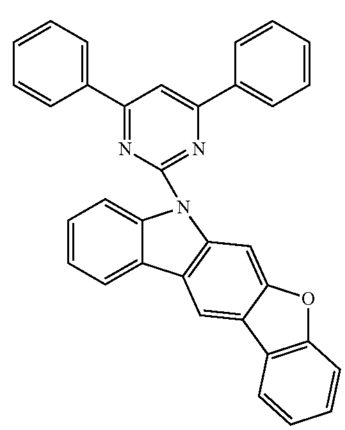

-continued
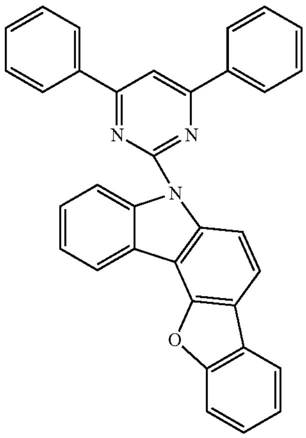
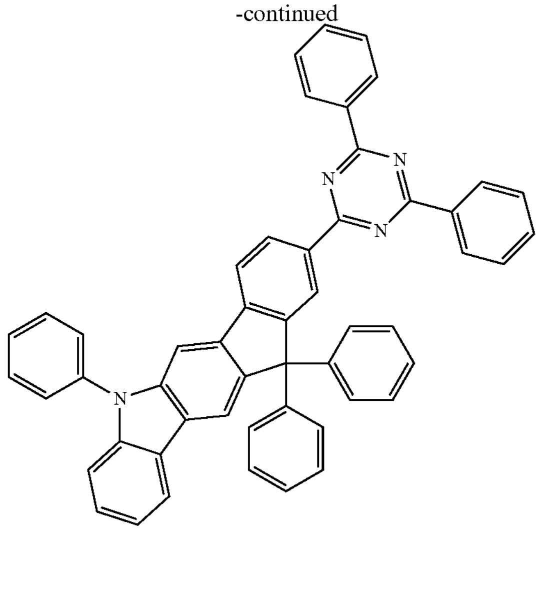
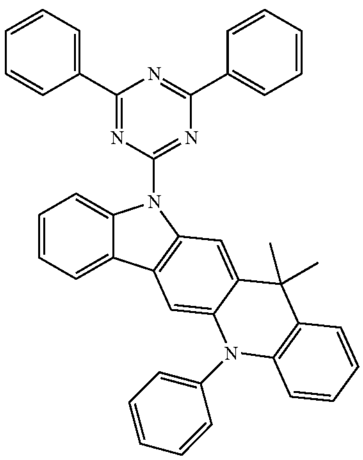
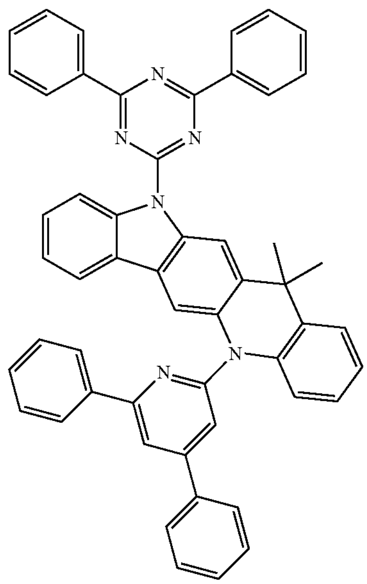
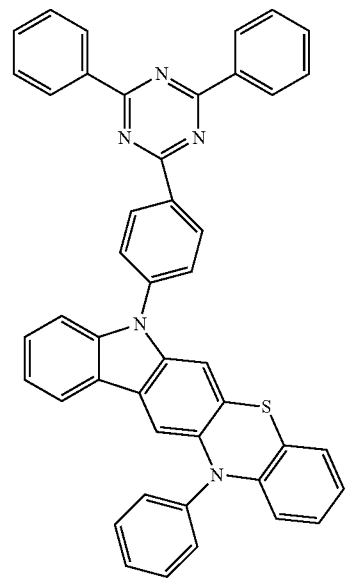
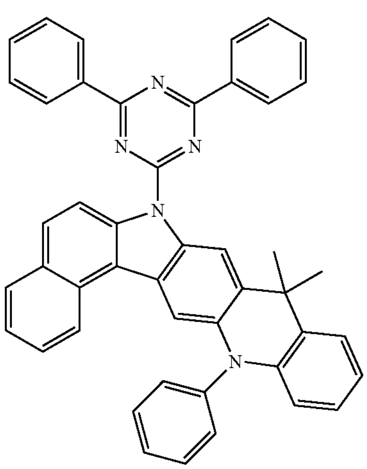
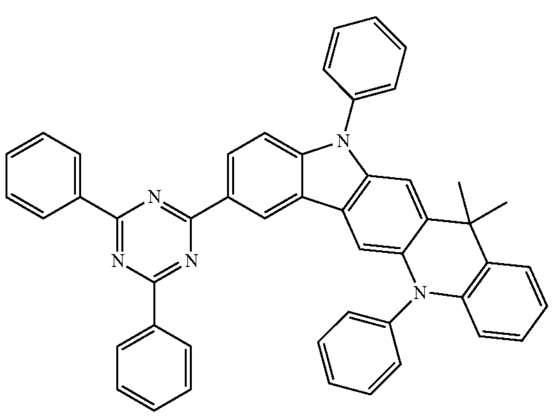

-continued
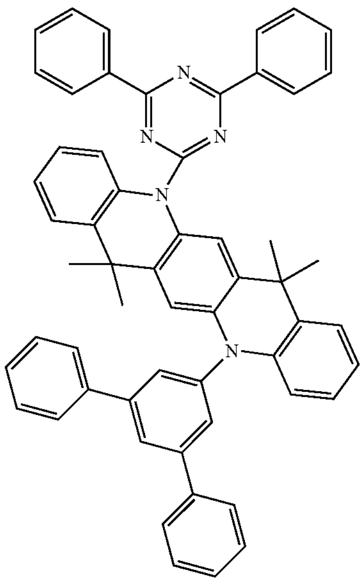
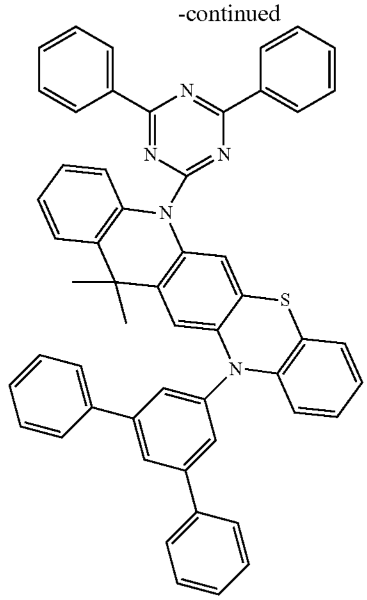
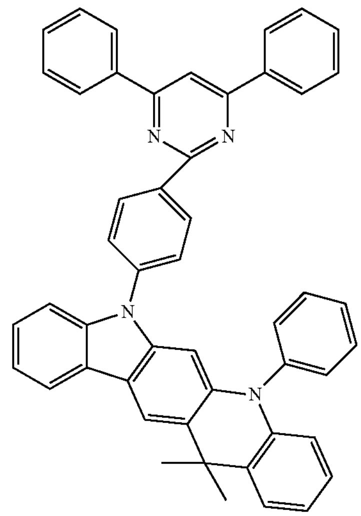
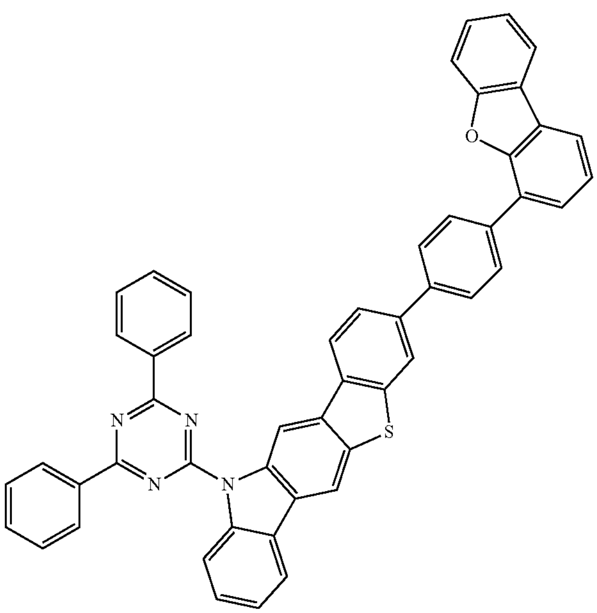
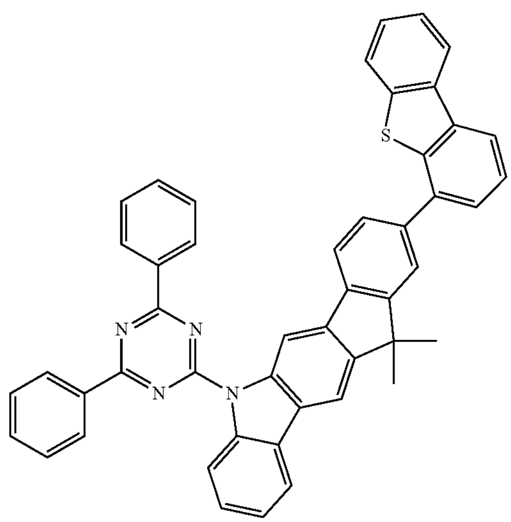
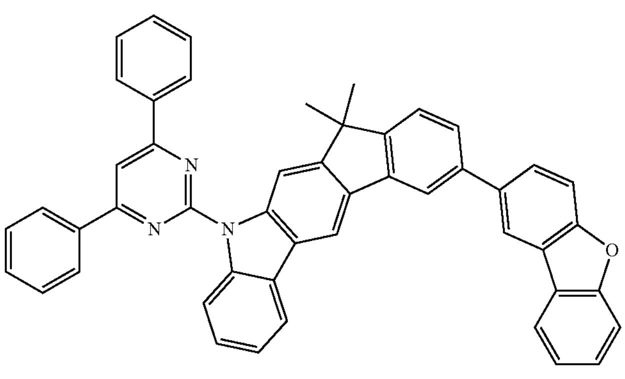

-continued
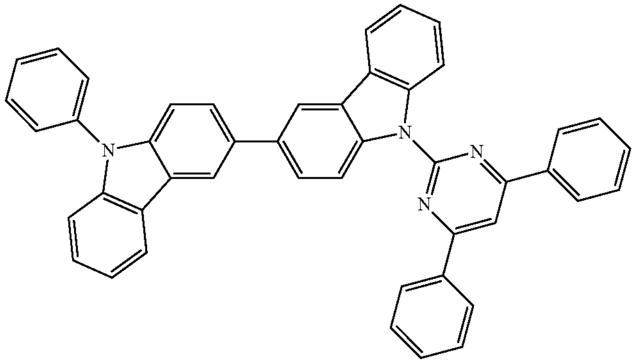
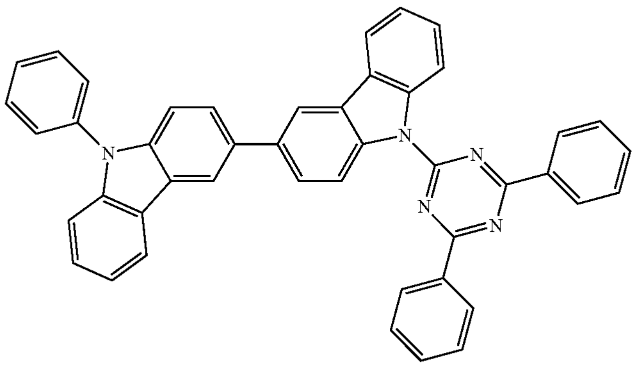
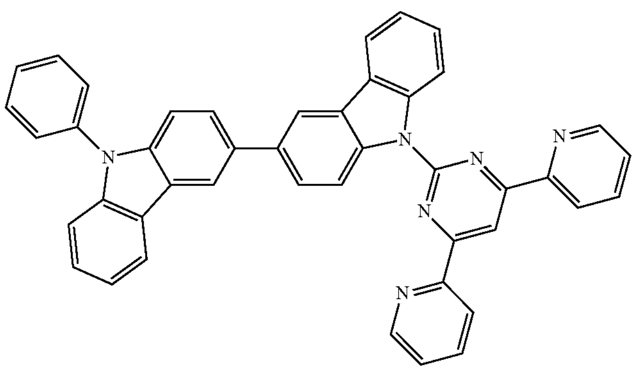
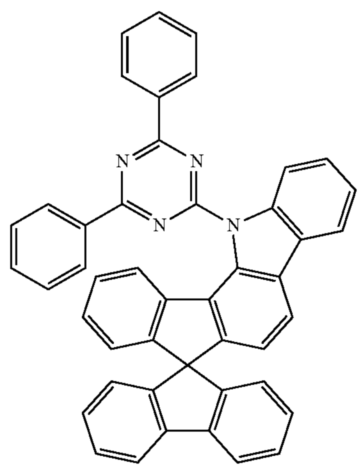
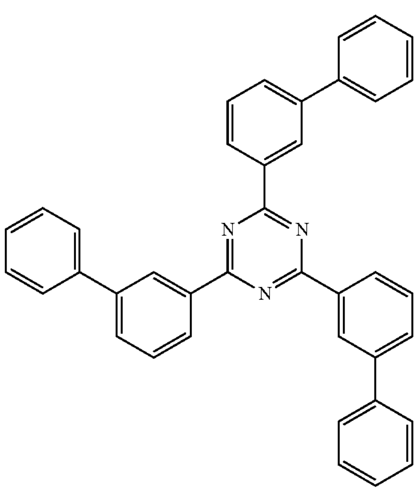
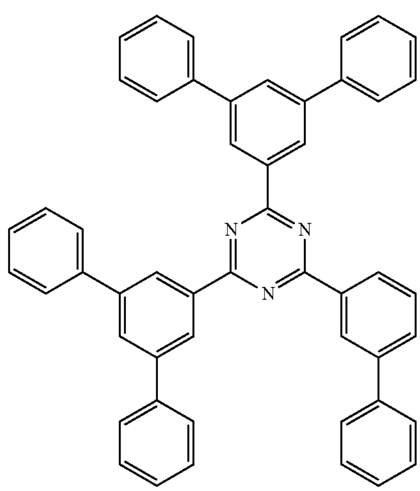

-continued
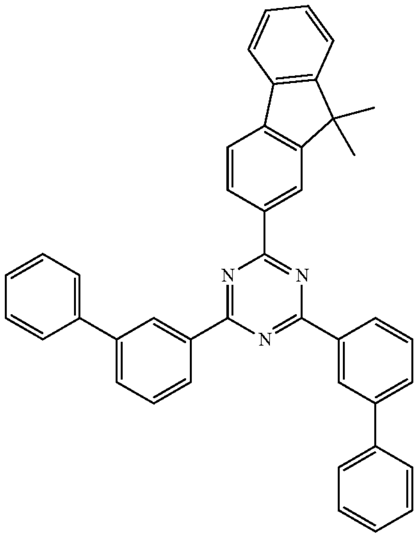
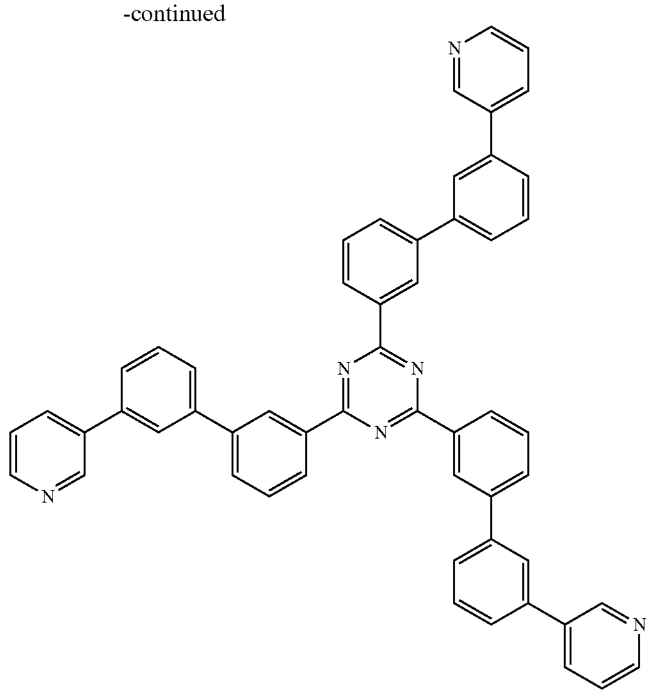
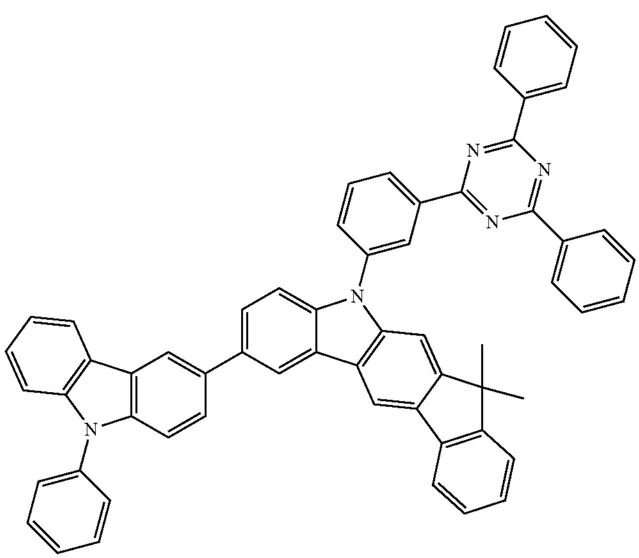

-continued
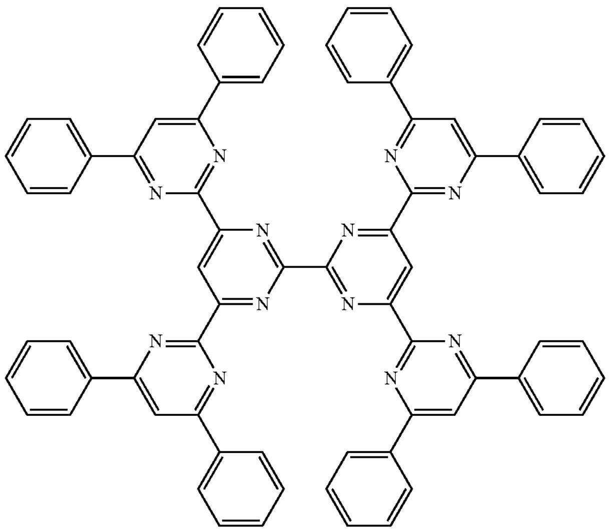
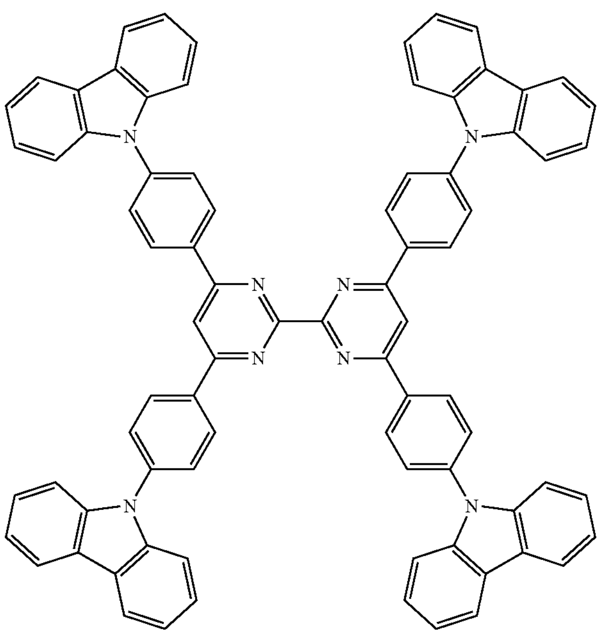
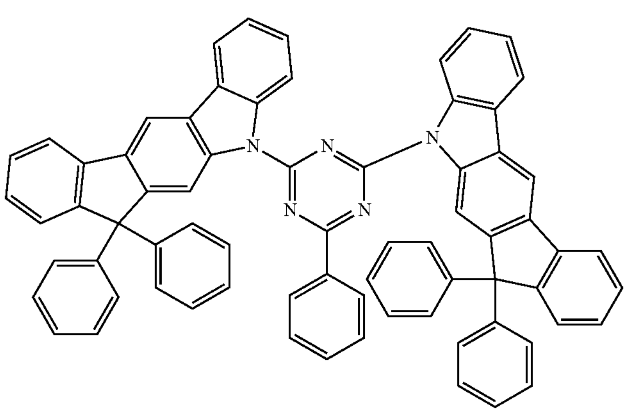

-continued
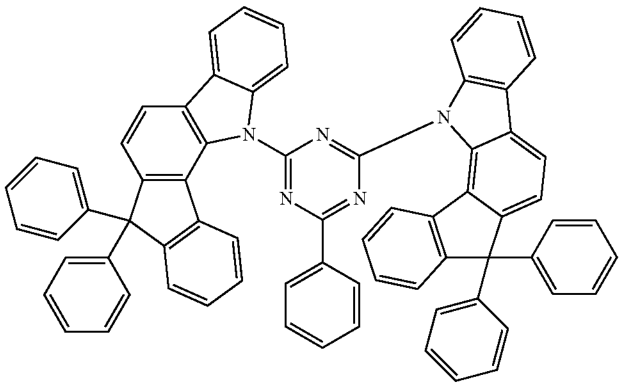
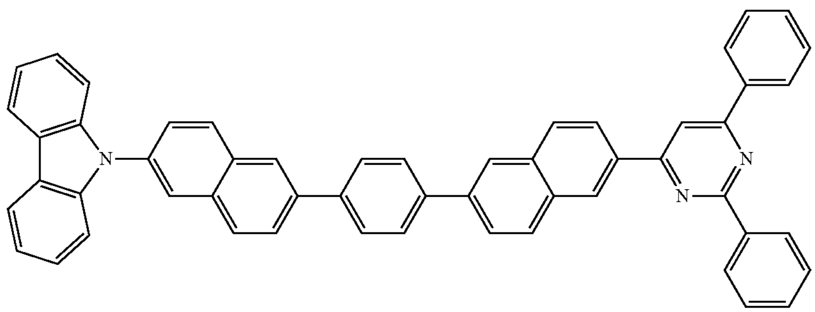
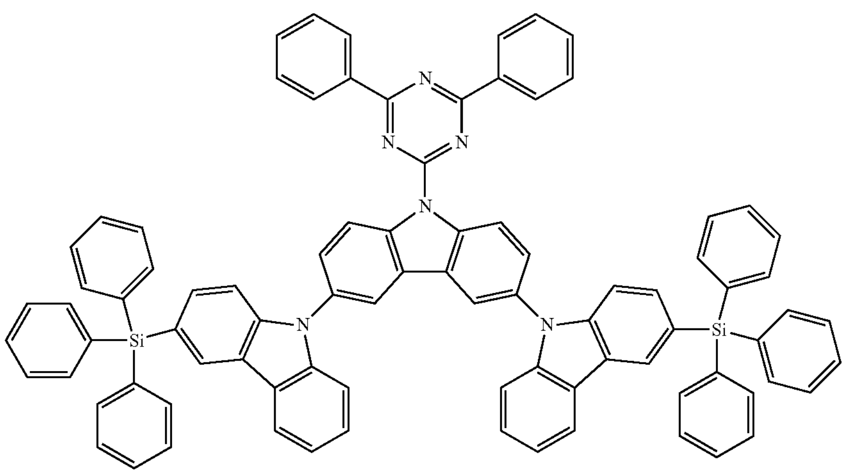
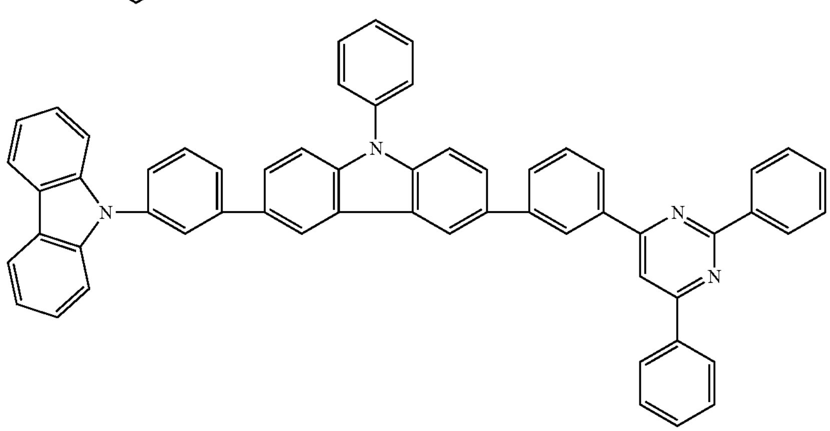

-continued
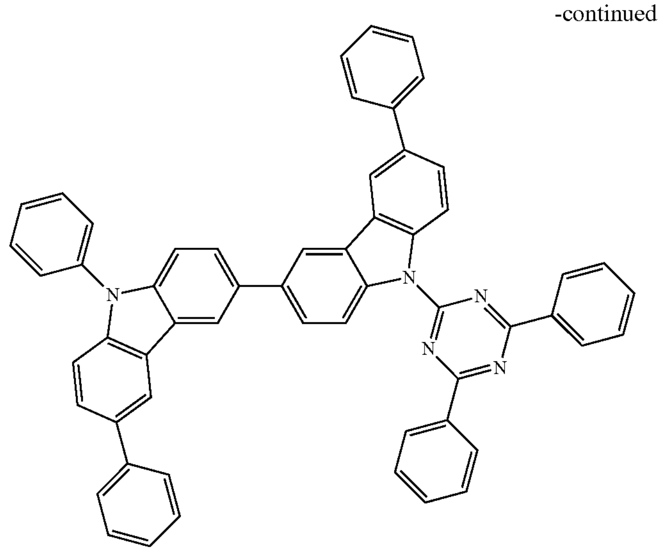
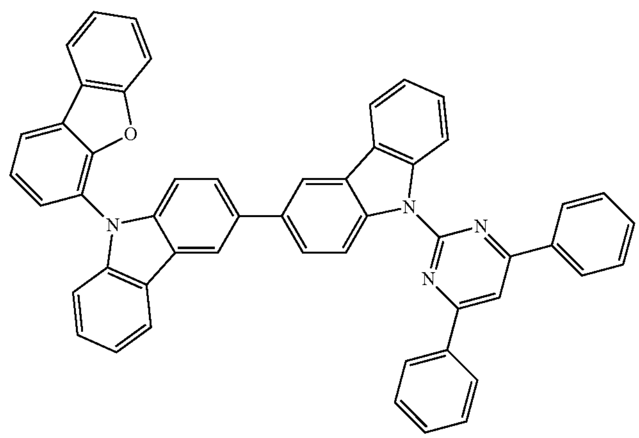
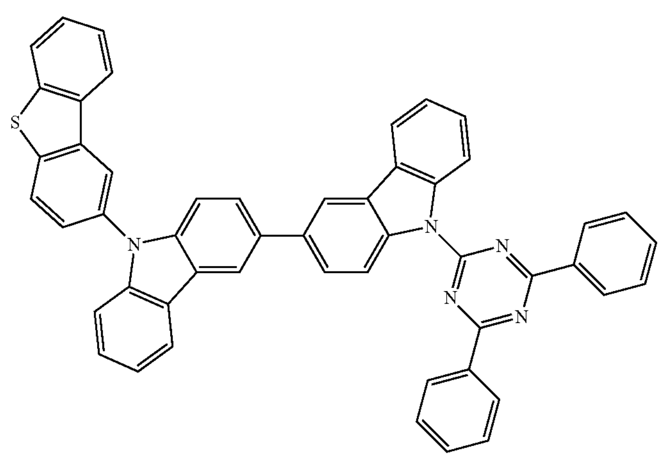

-continued
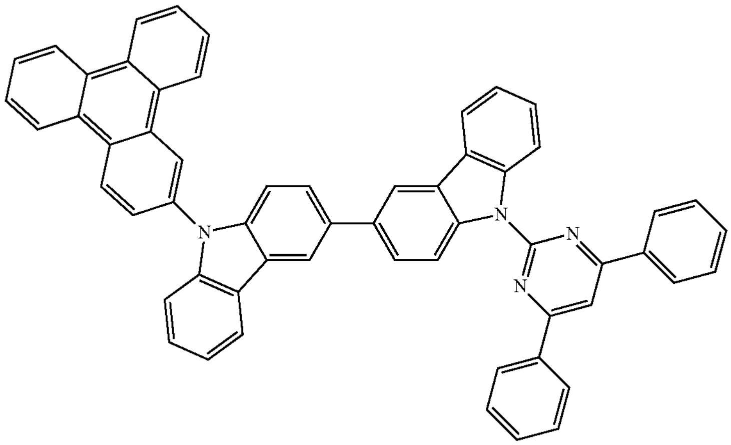
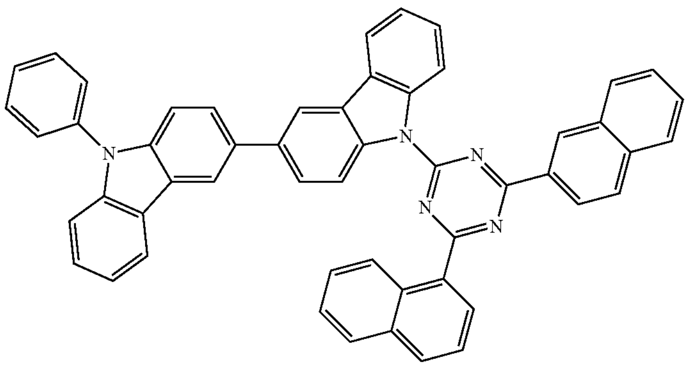
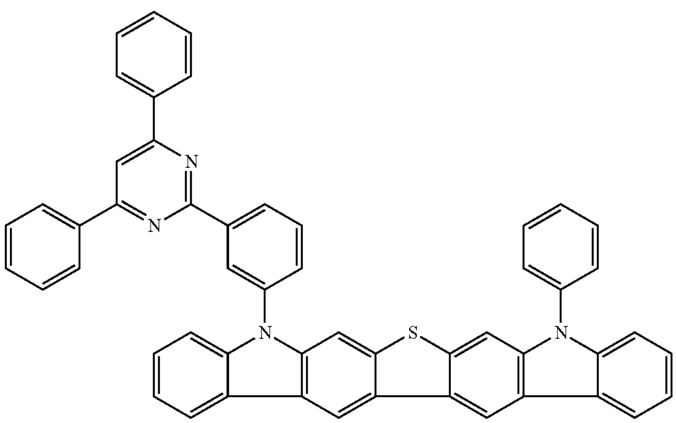
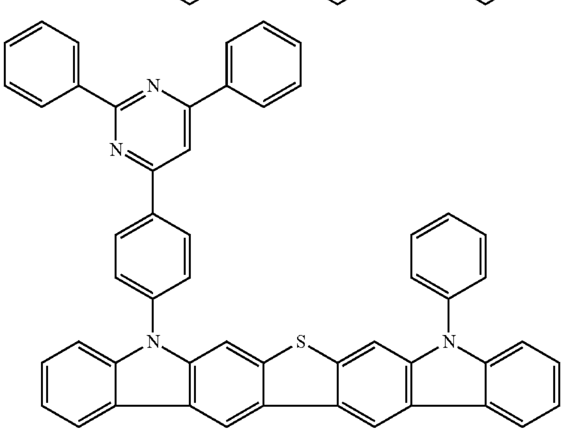

-continued
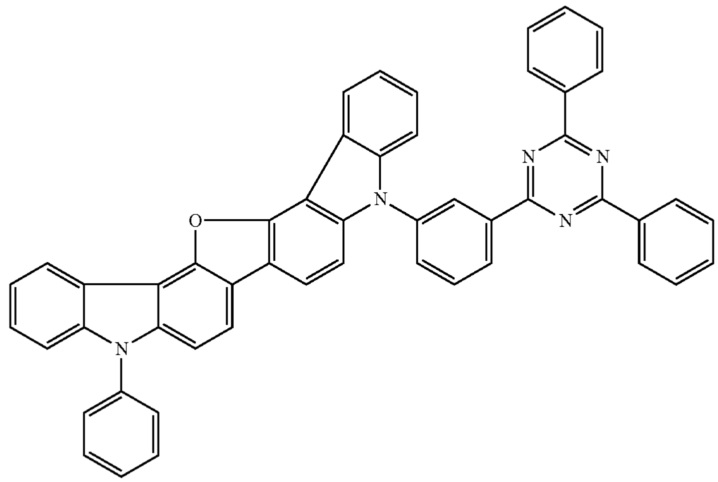
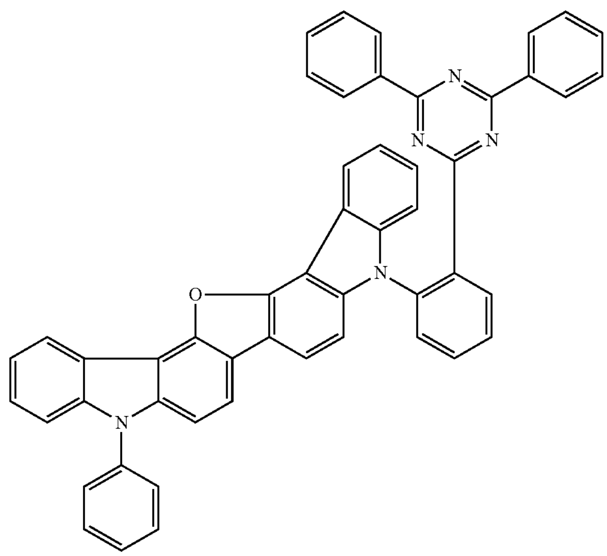
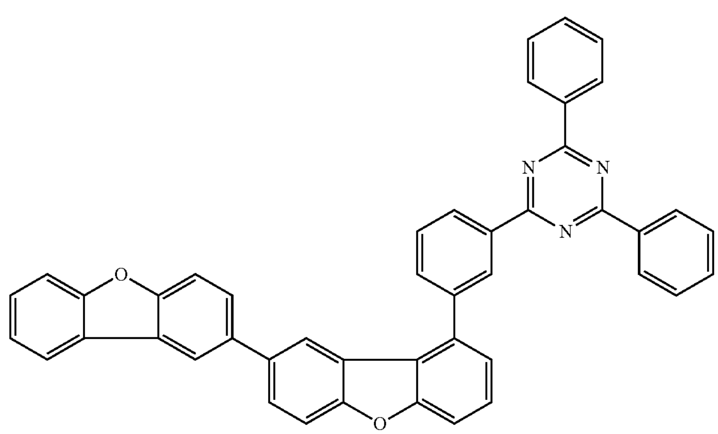

-continued
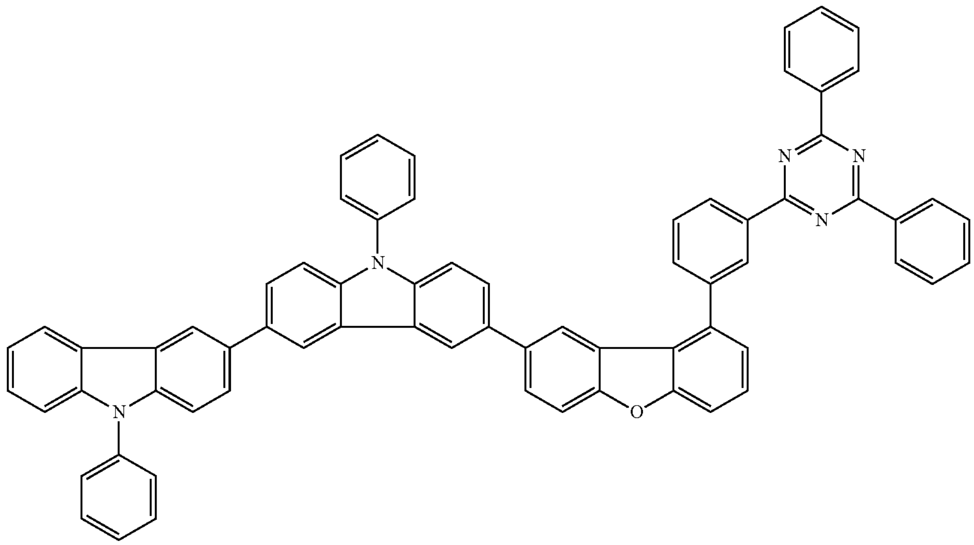
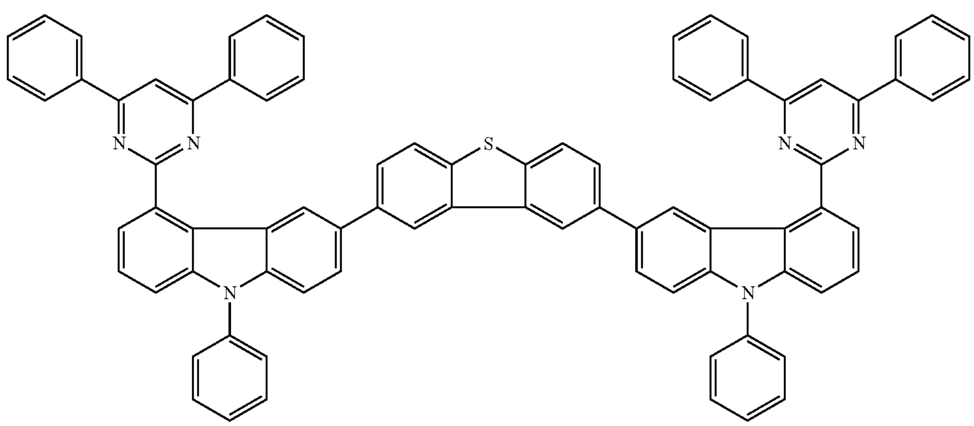
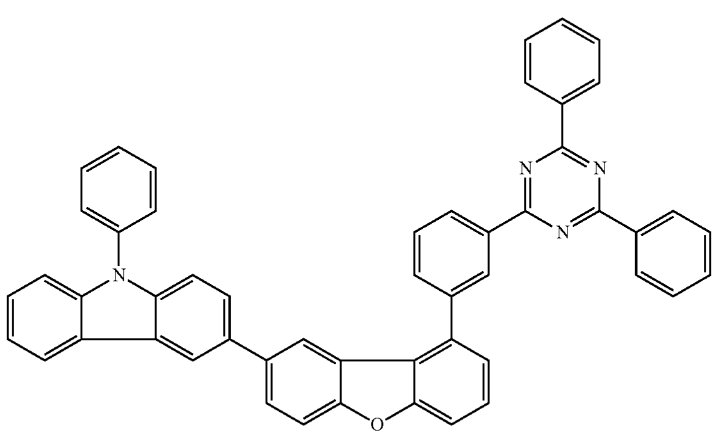

-continued
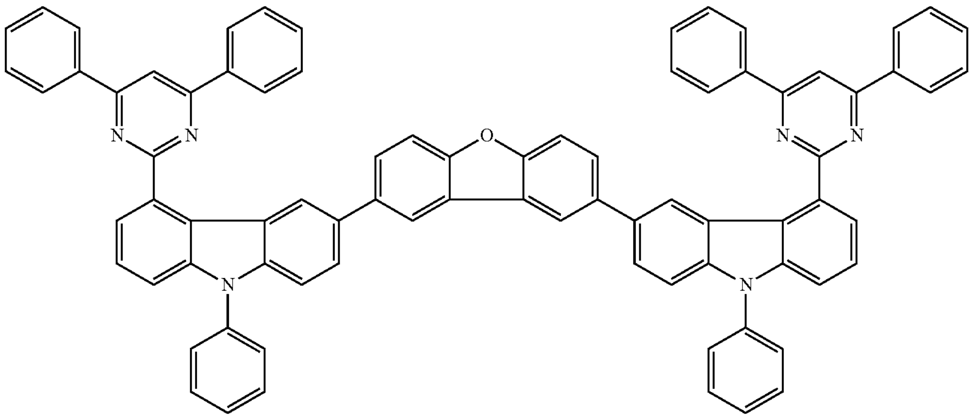
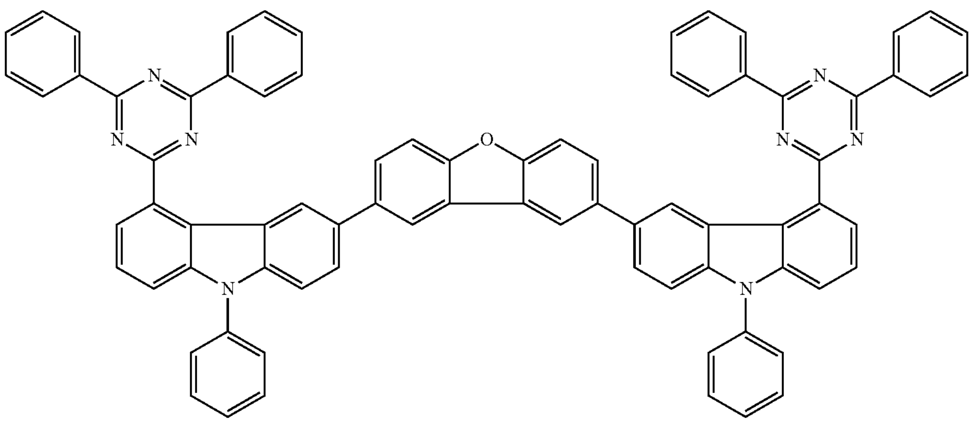
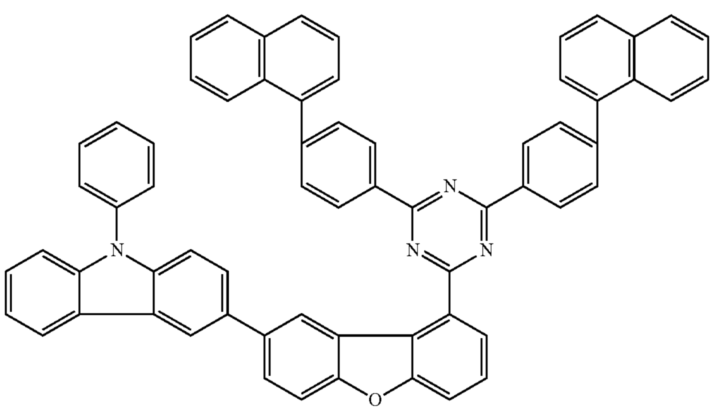
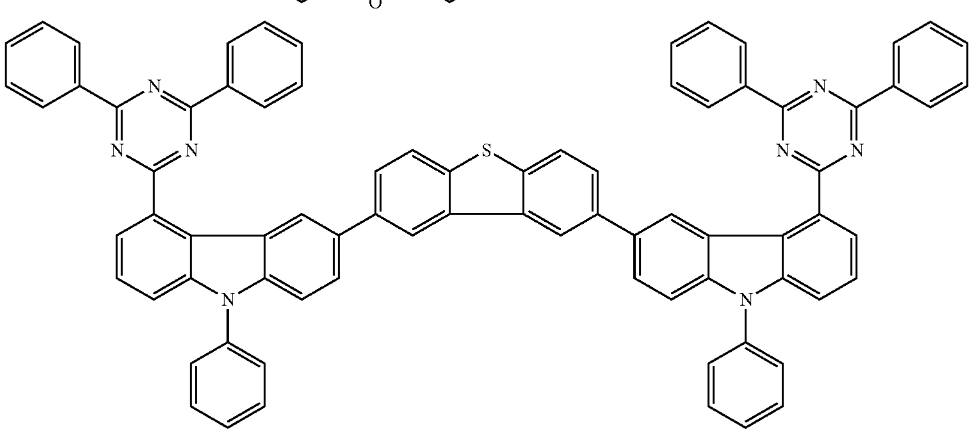

-continued
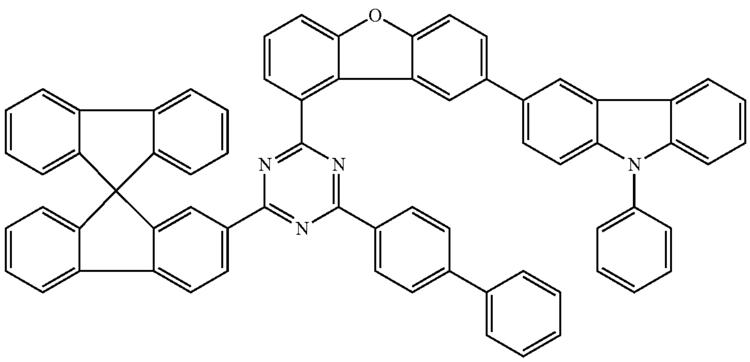
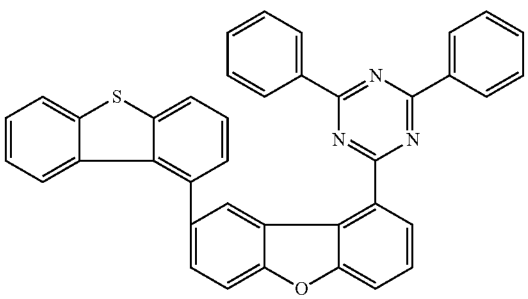
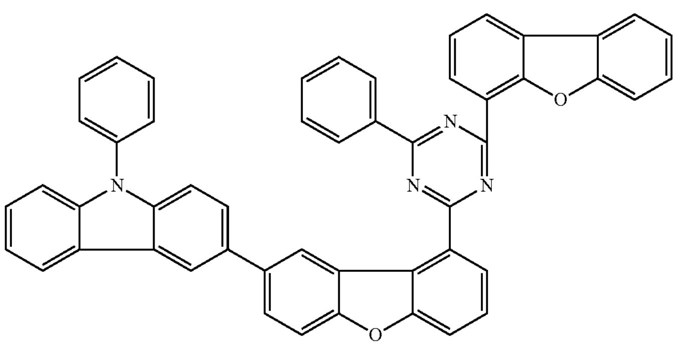
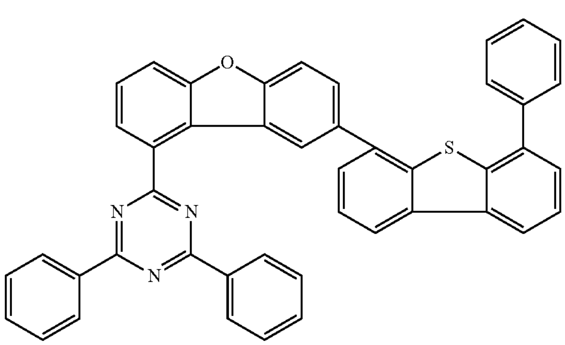

-continued
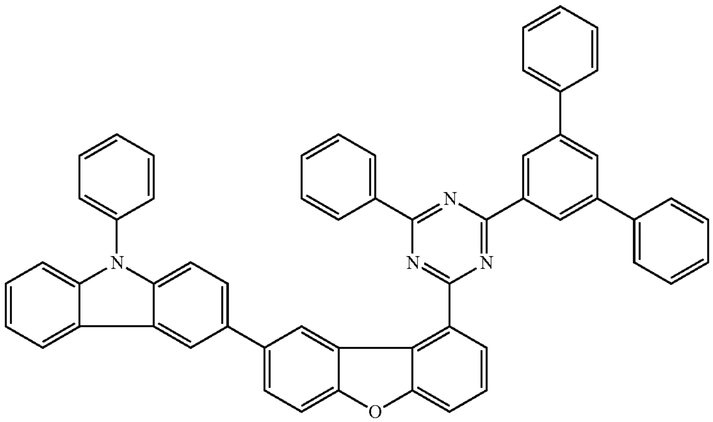
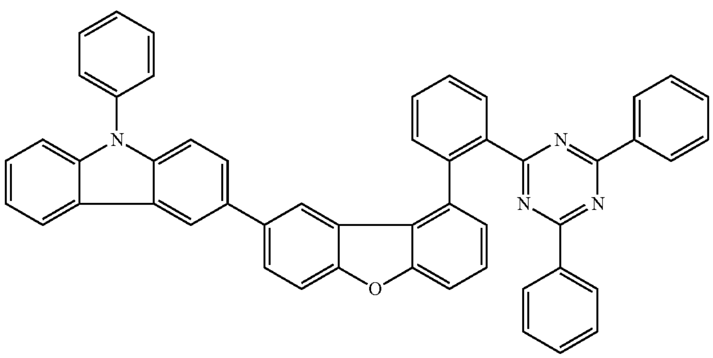
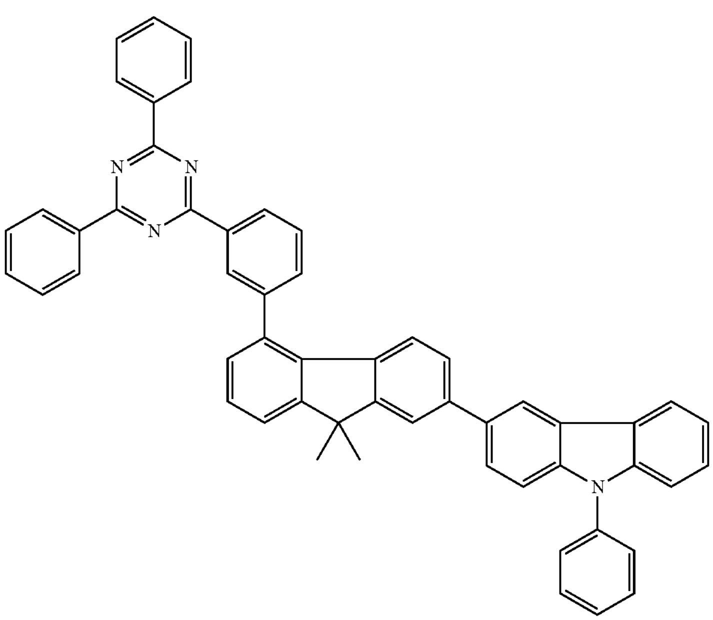

-continued
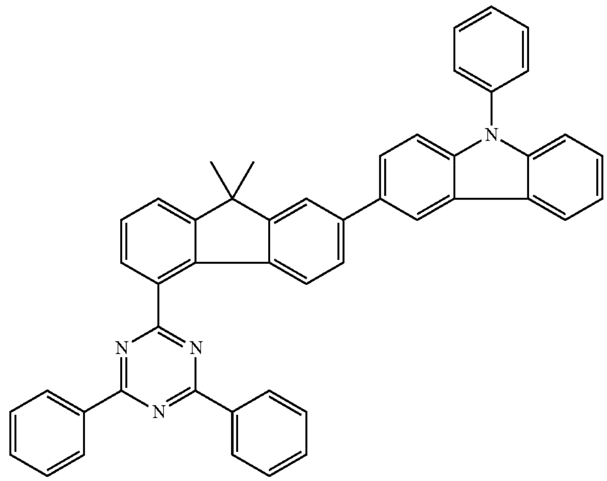
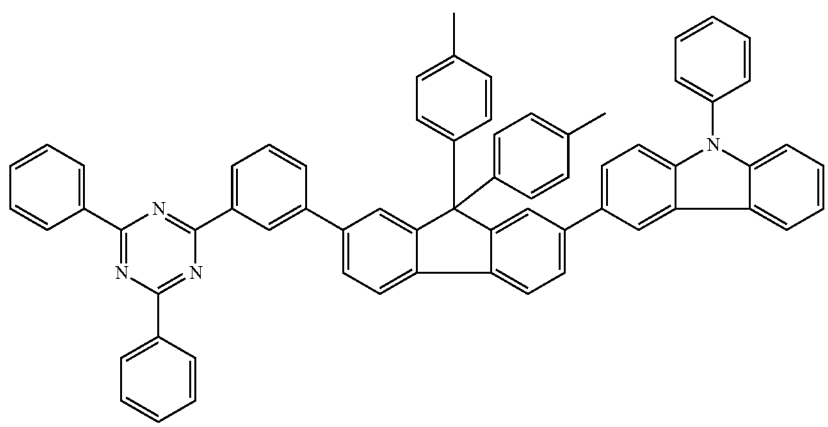
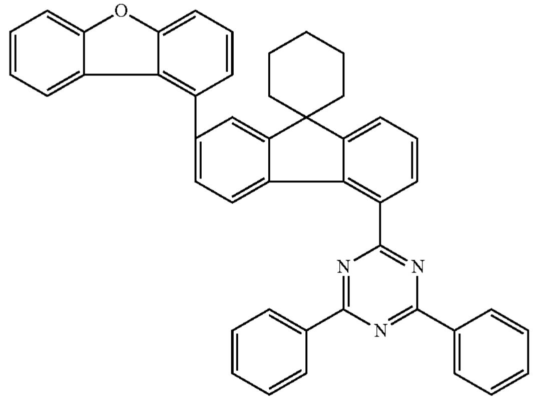
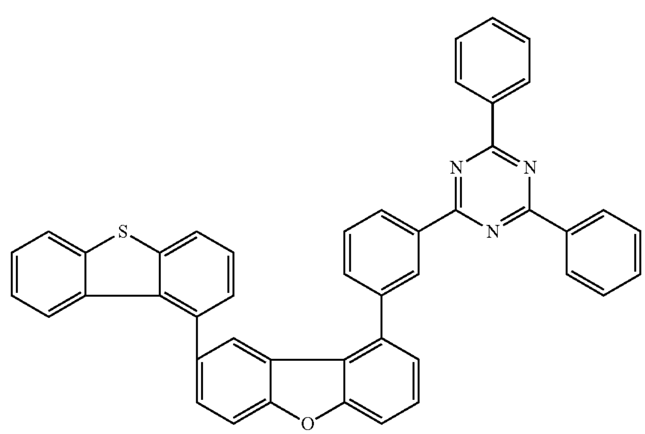

-continued
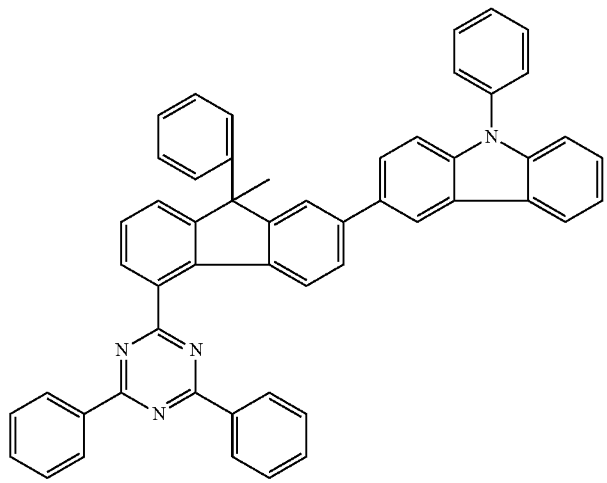
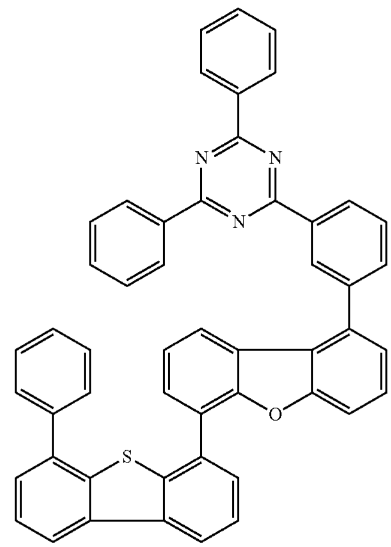
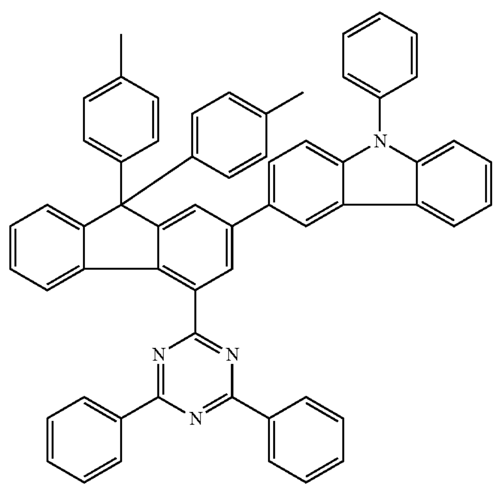
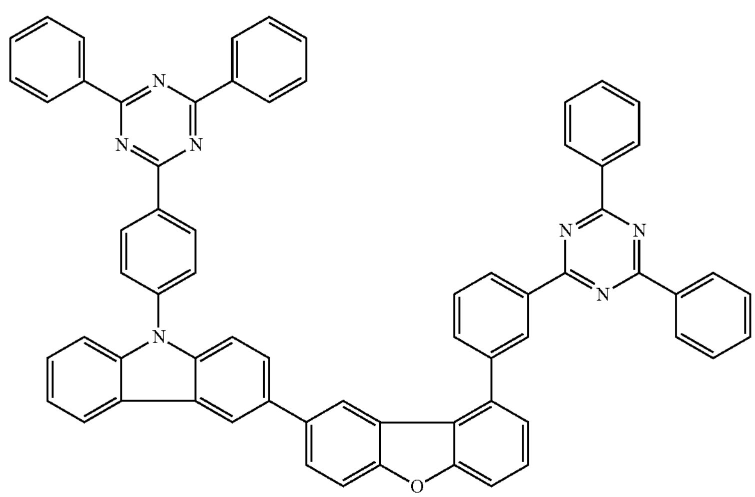

-continued
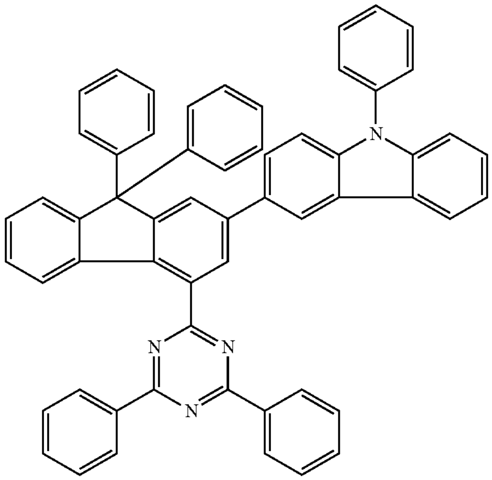
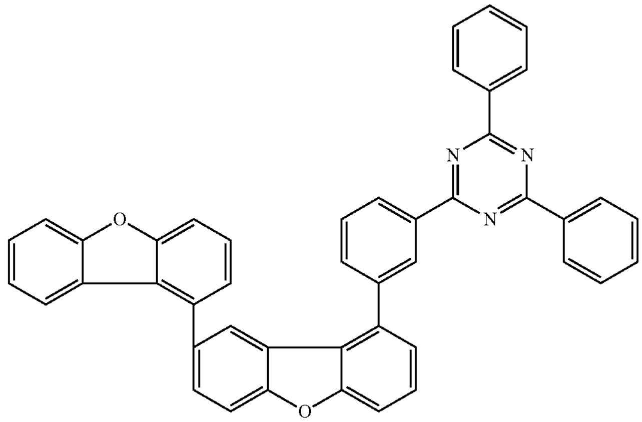
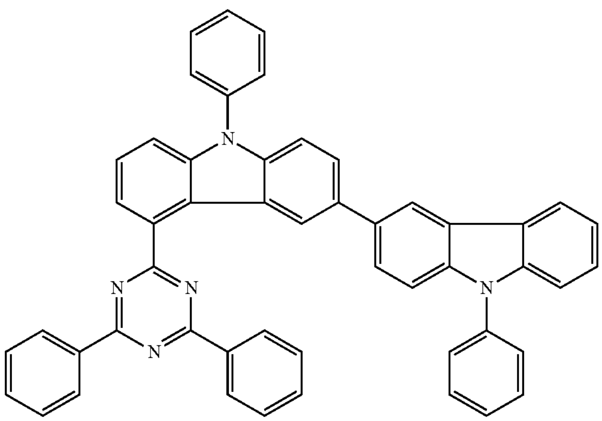
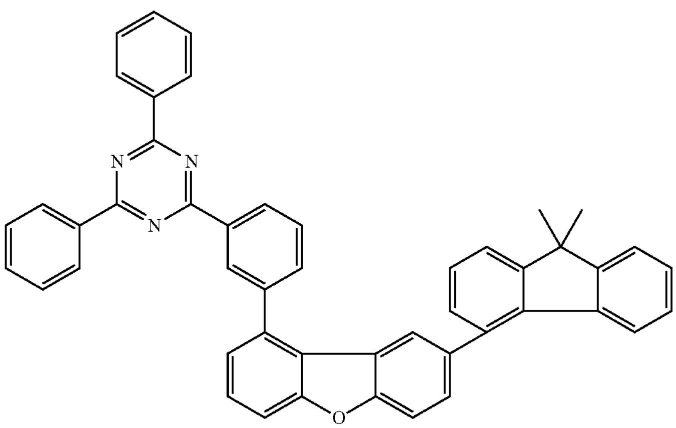
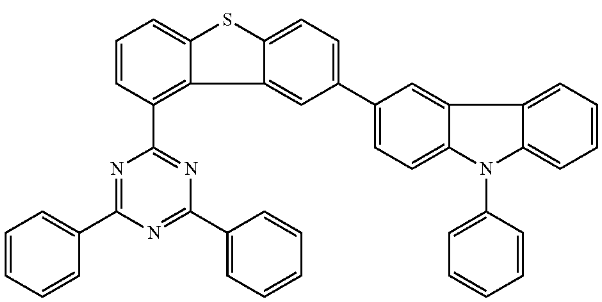

-continued
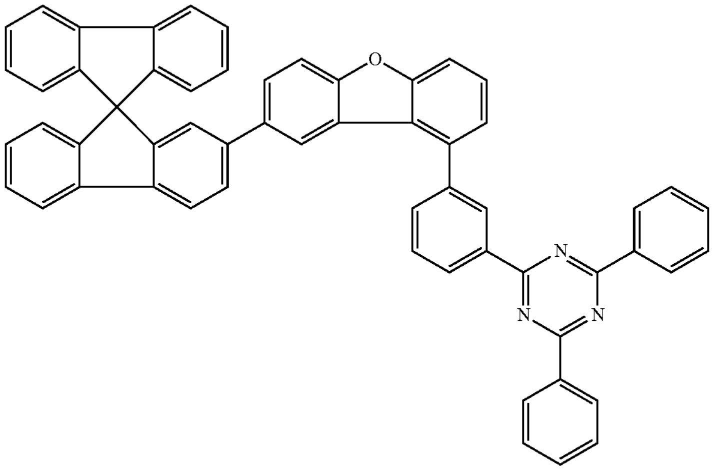
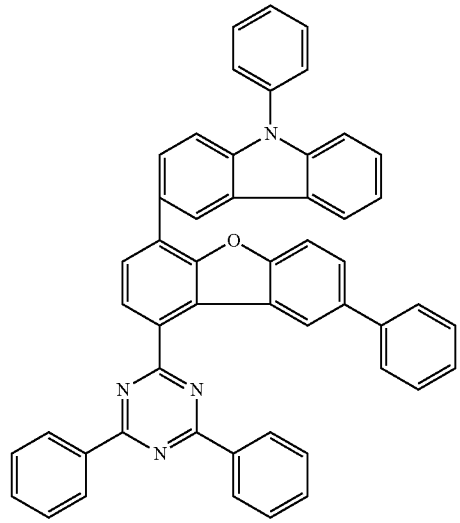
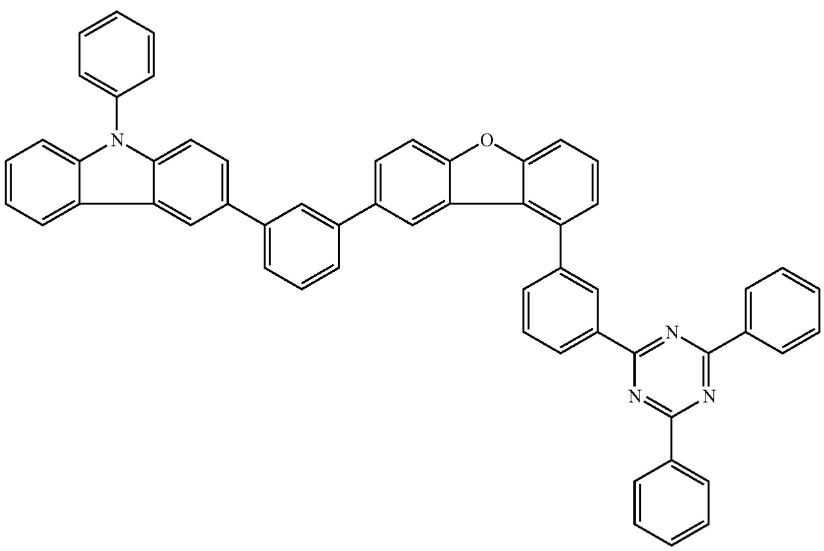
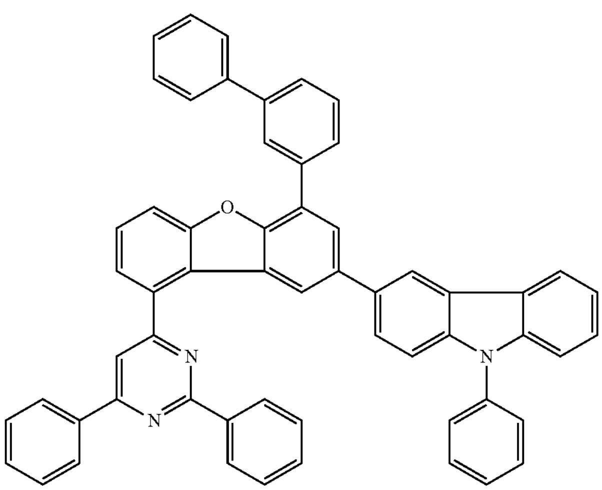

-continued
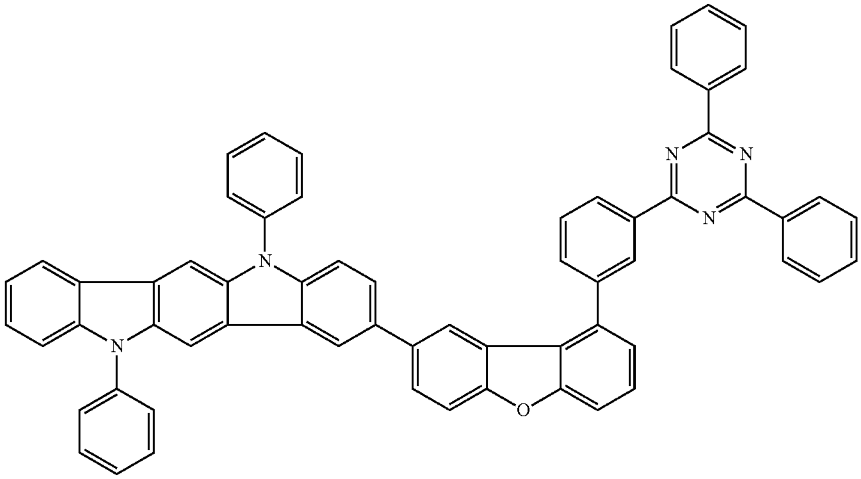
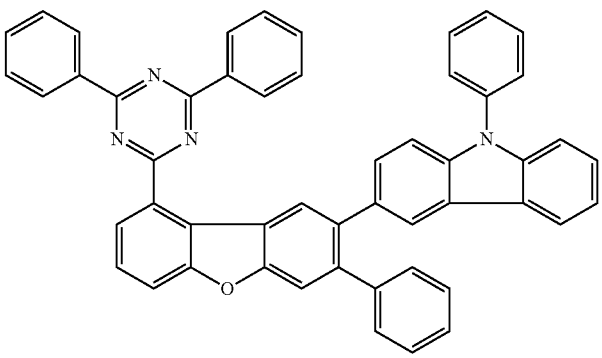
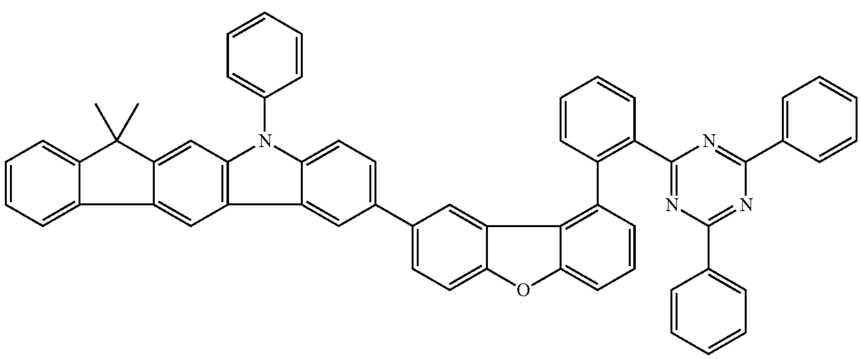
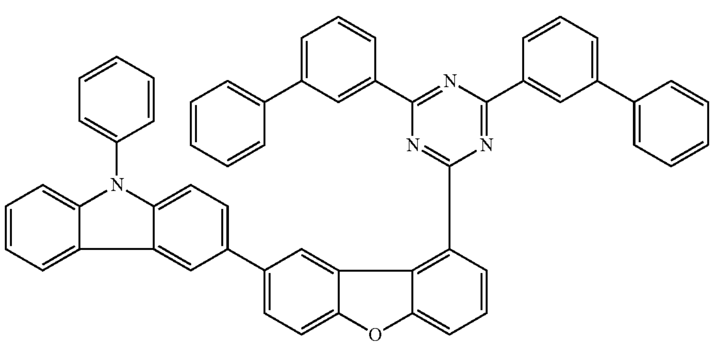

-continued
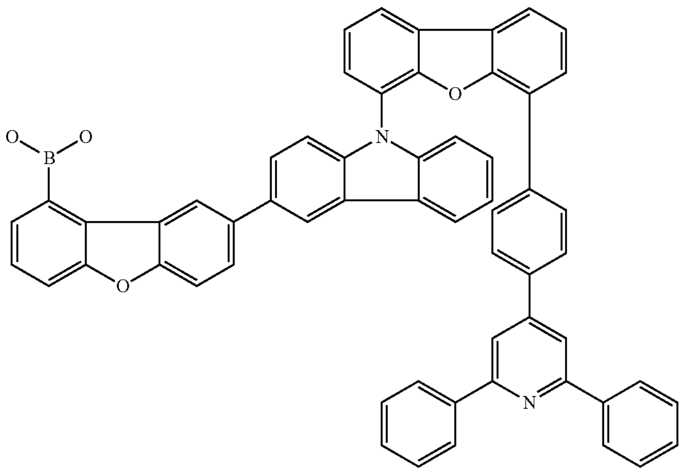
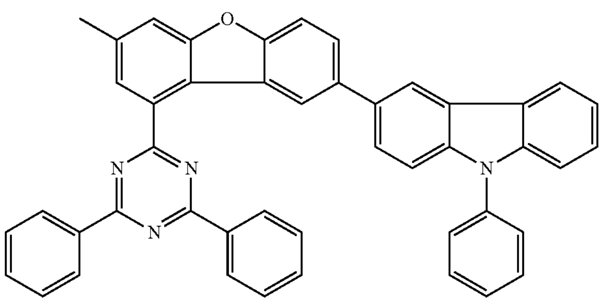
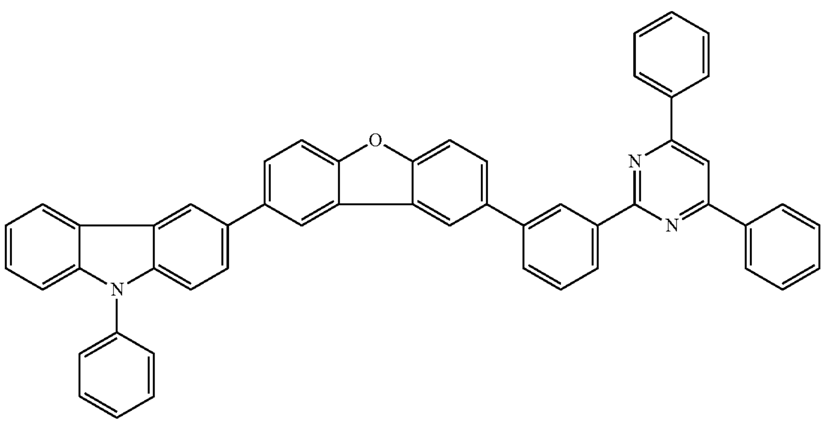
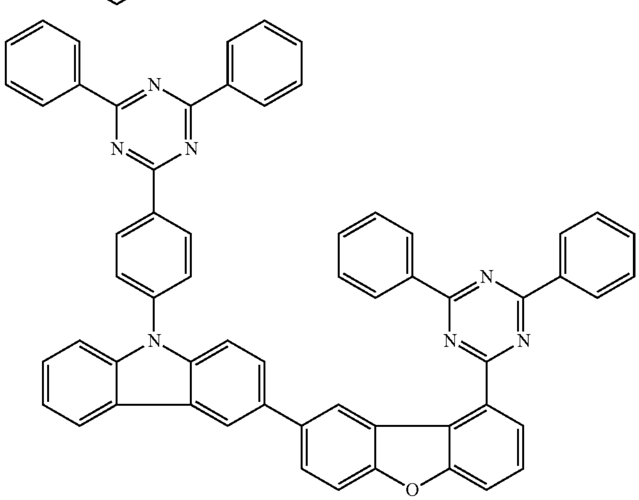

-continued
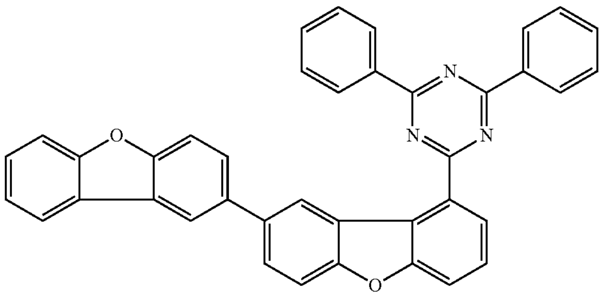
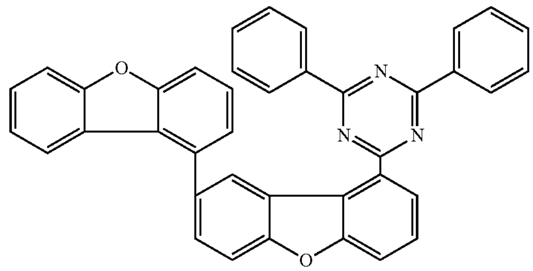
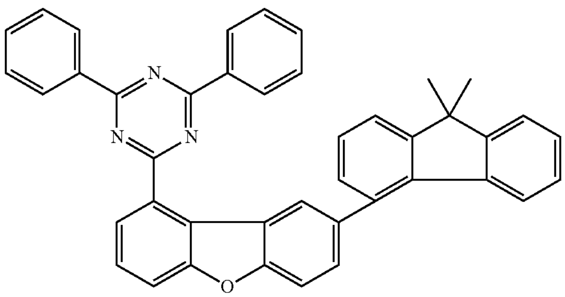
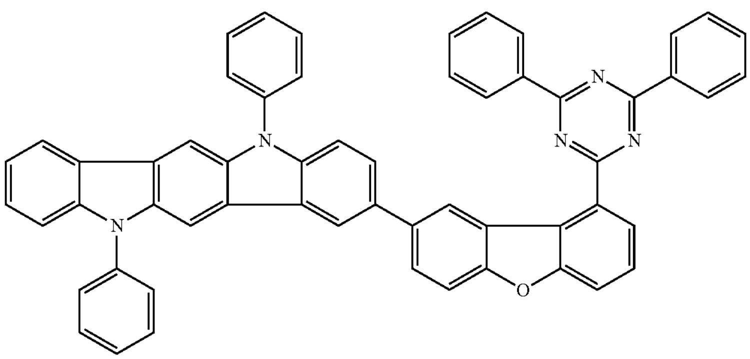
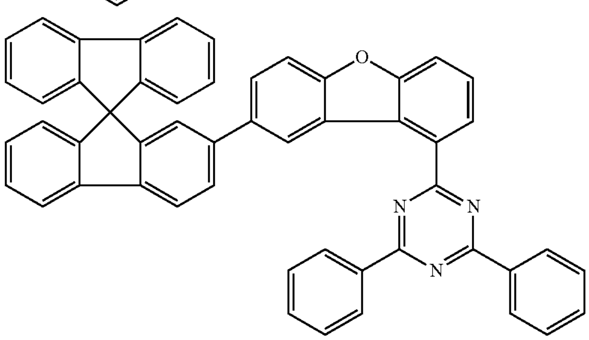
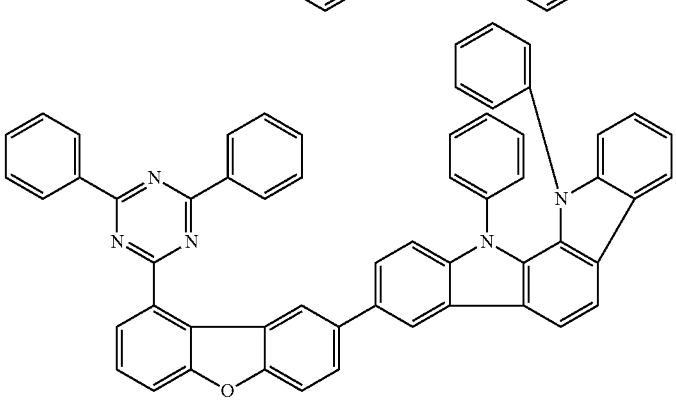

-continued
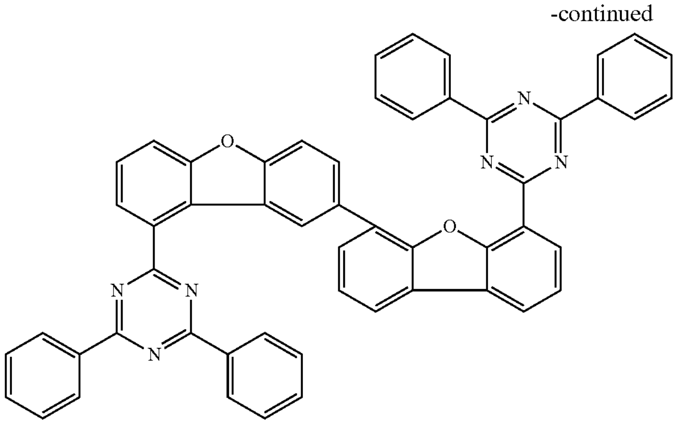
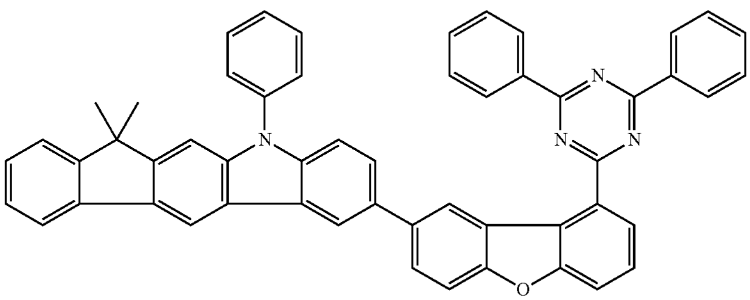
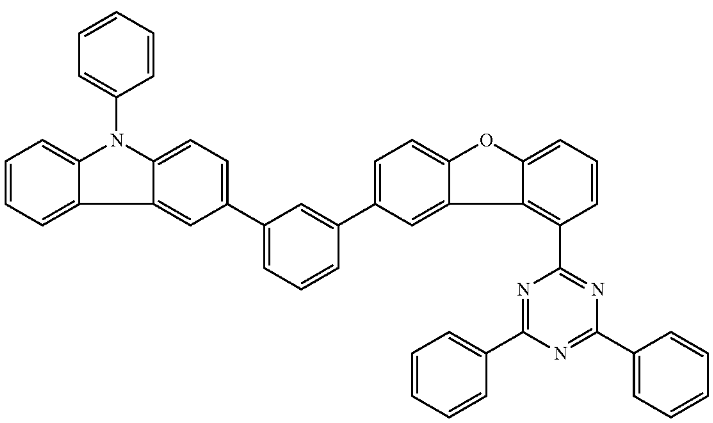
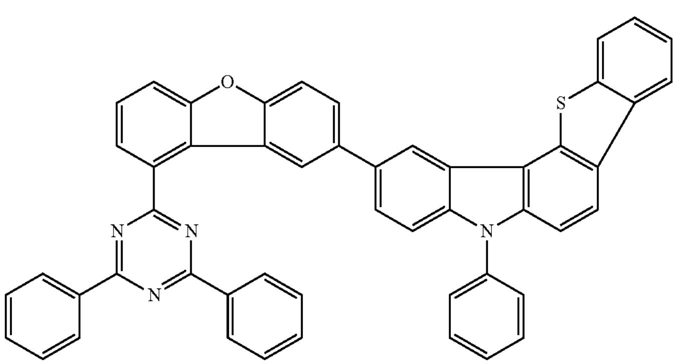

-continued
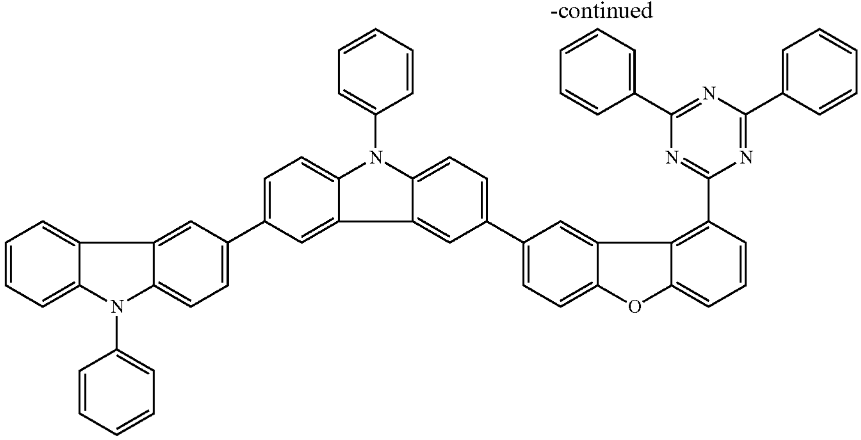
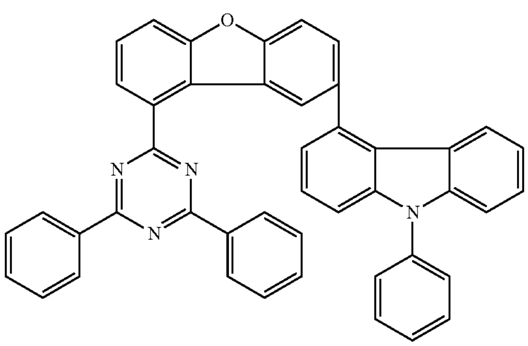
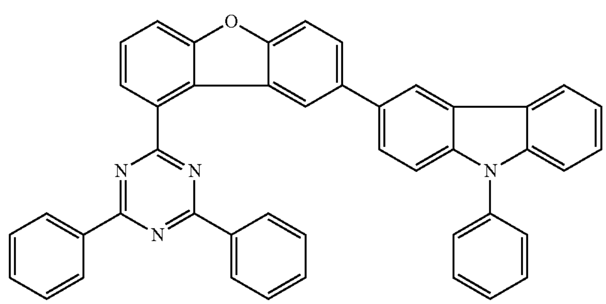
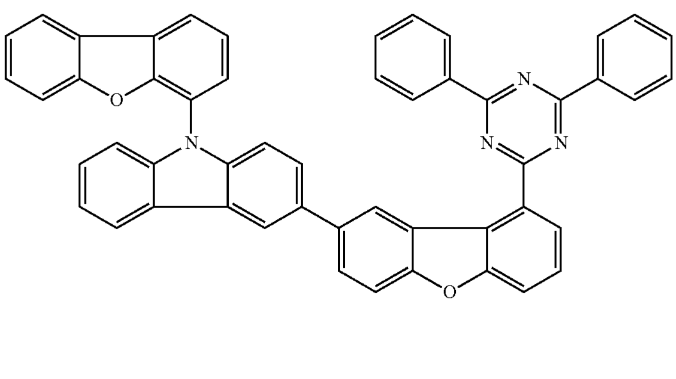
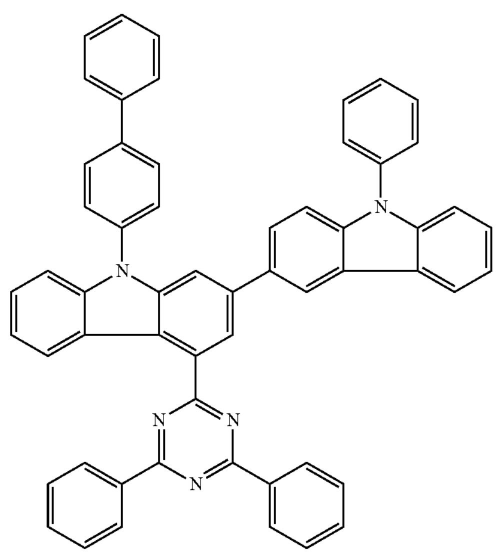

-continued
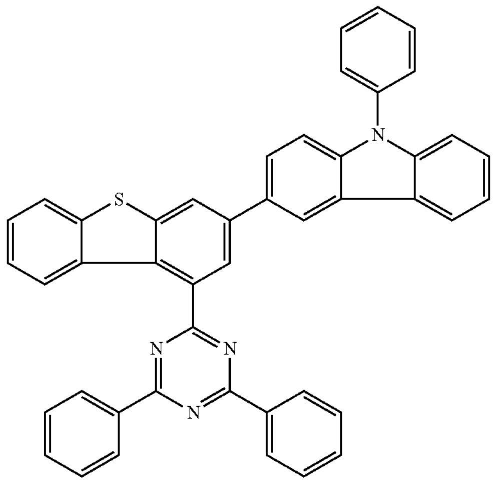
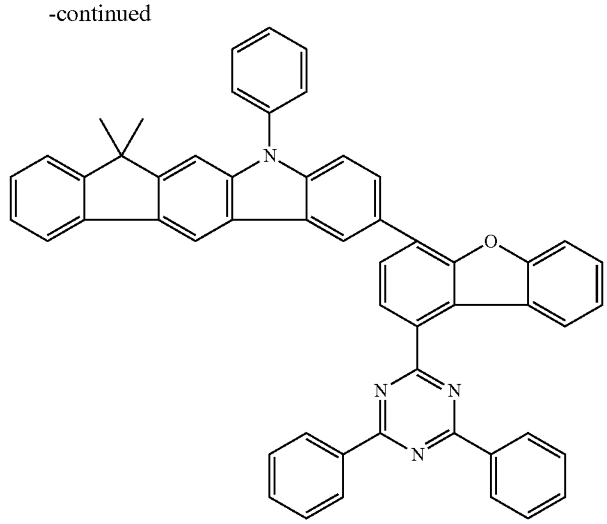
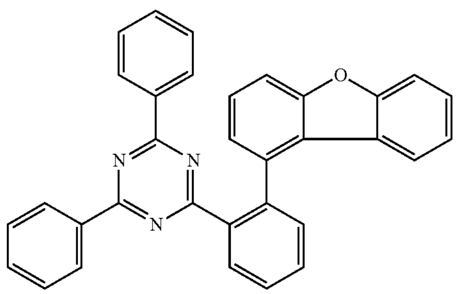
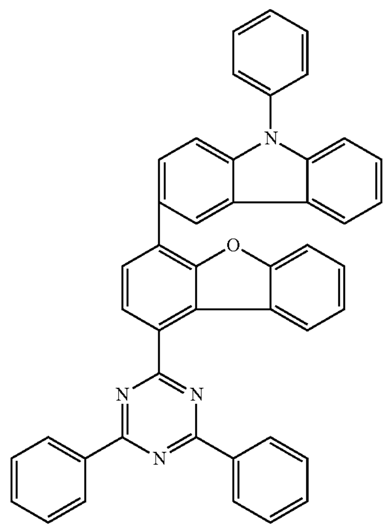
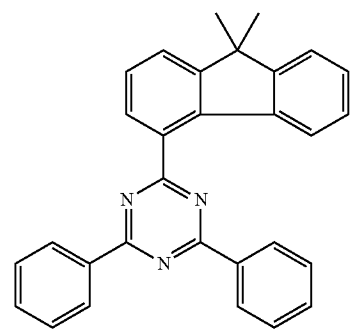
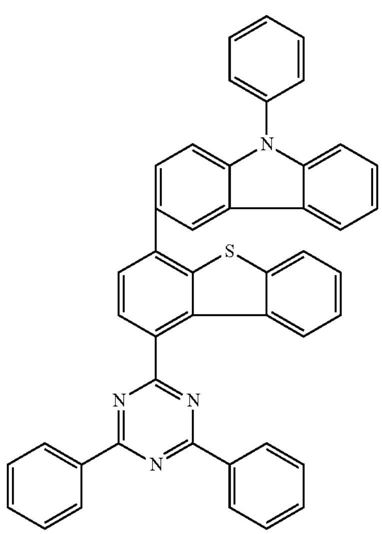
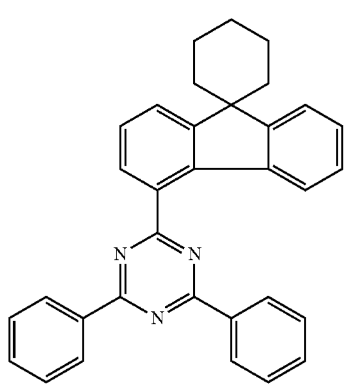
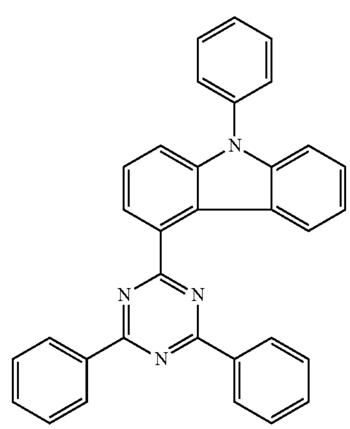

-continued
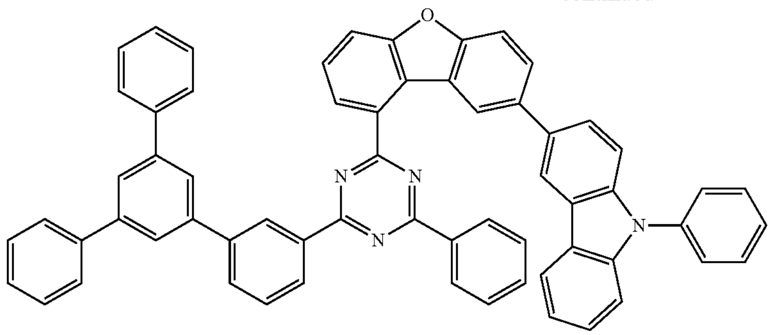
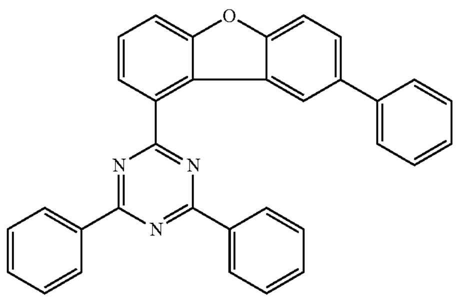
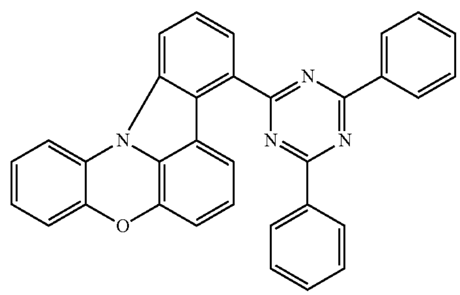
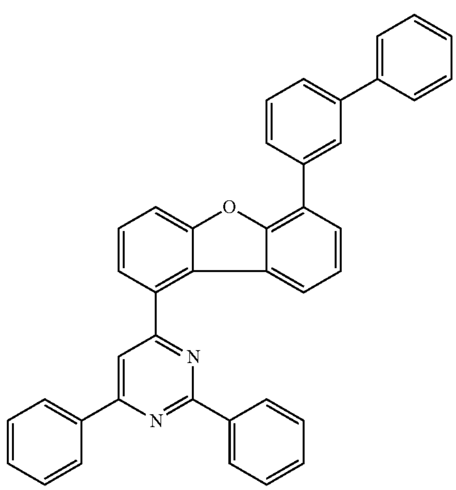
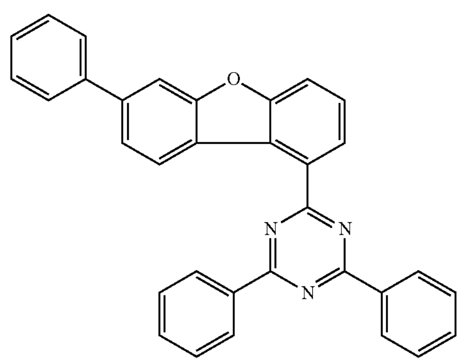
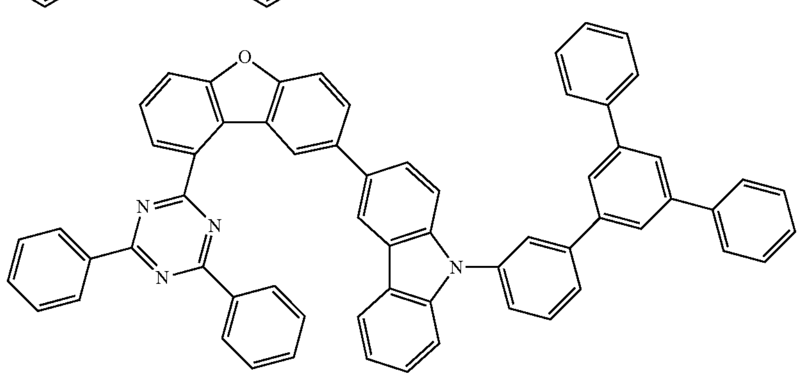
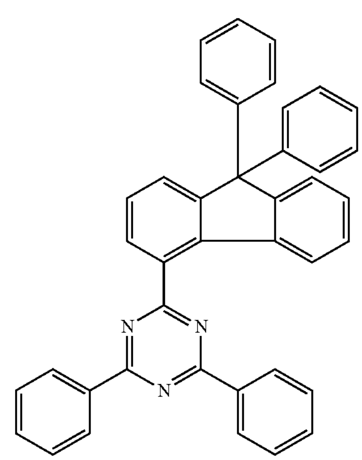

Examples of lactams which can be used as electron-transporting matrix materials are the following structures:
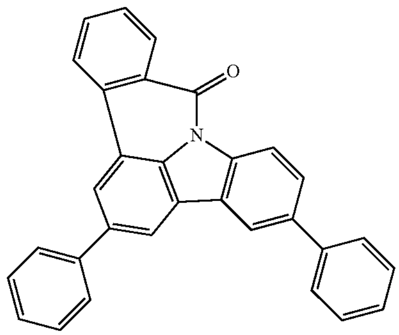
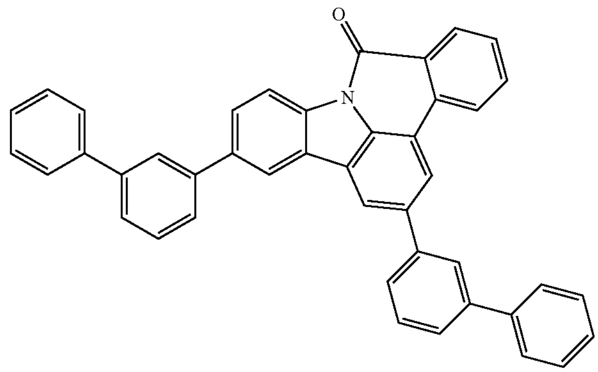
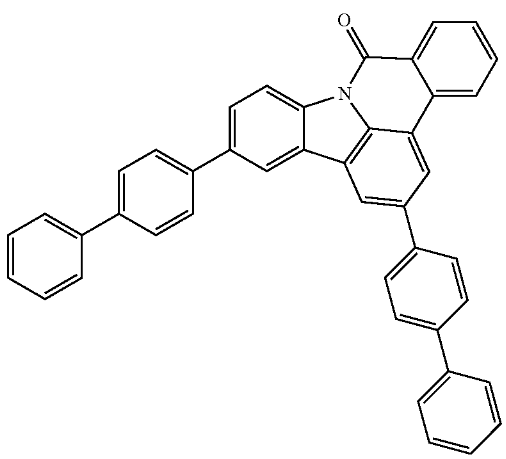
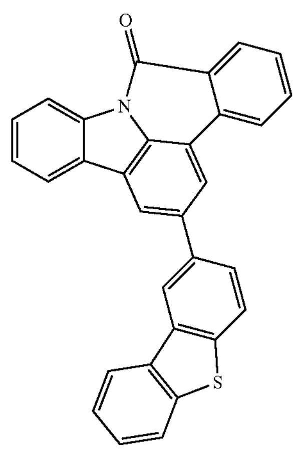
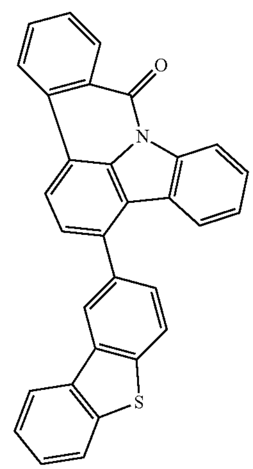
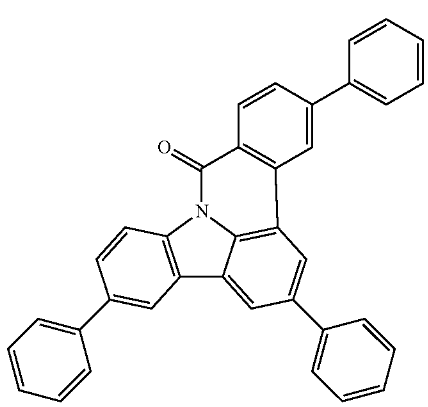
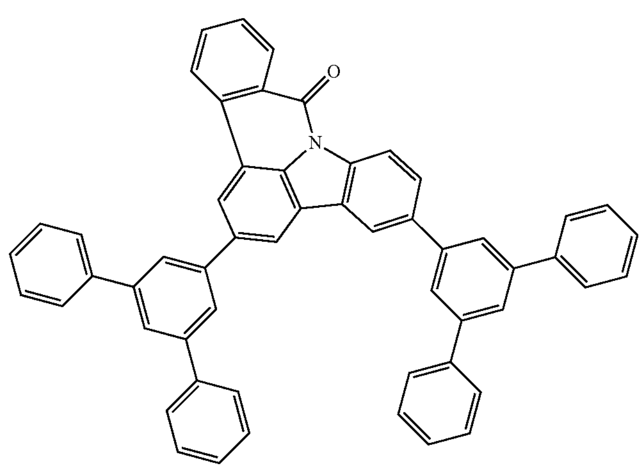

-continued
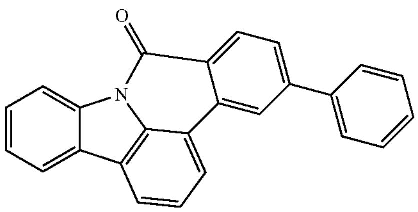
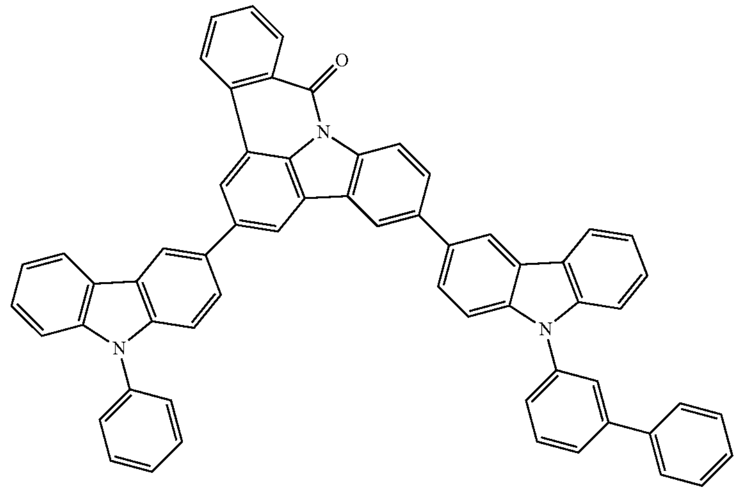
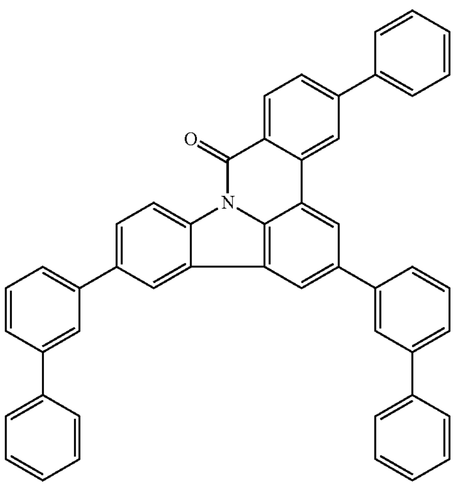
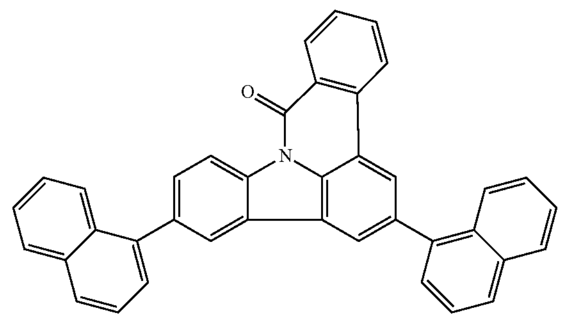
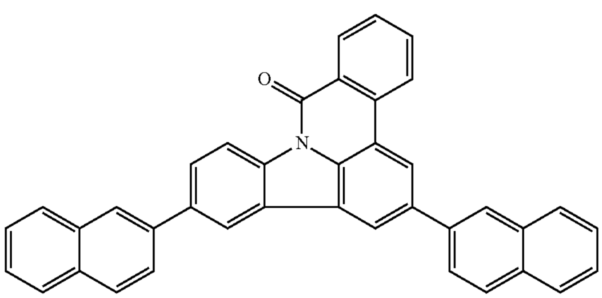
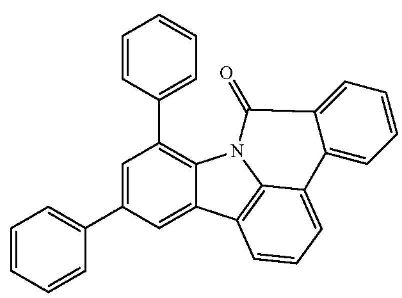
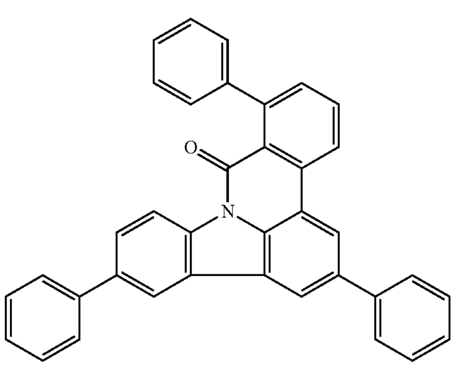
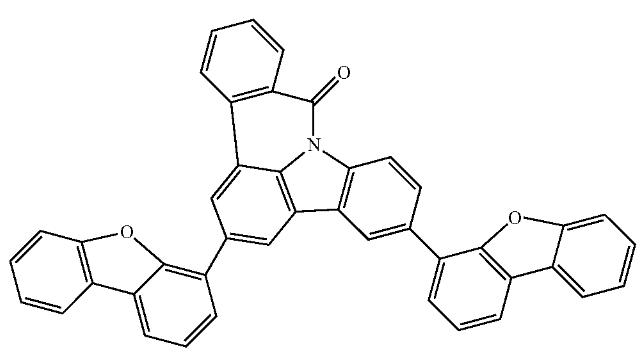

-continued
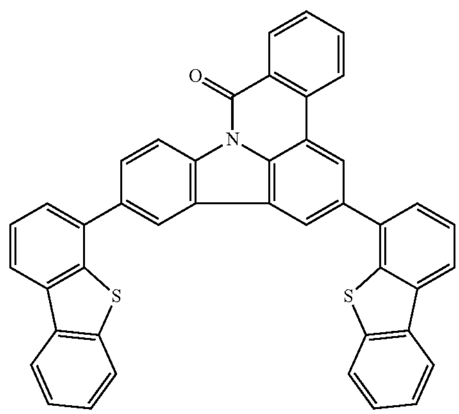
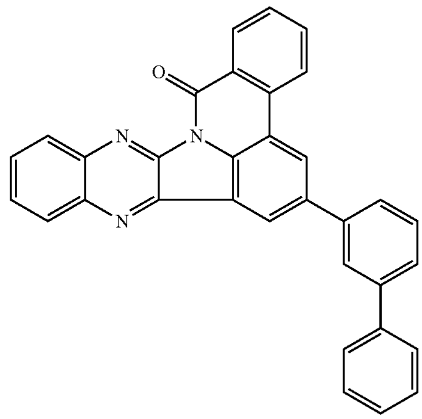
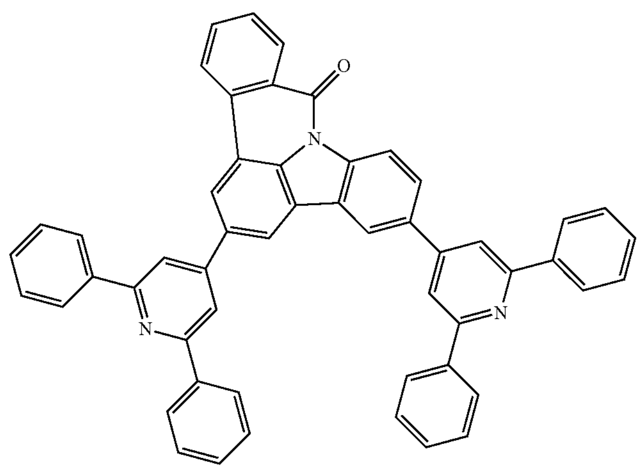
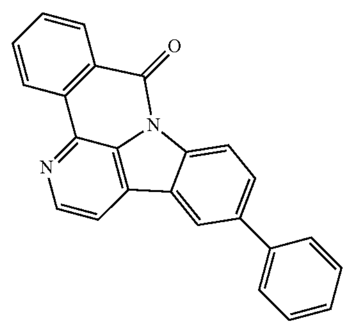
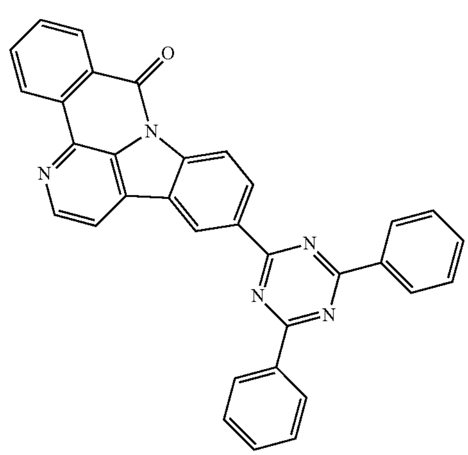
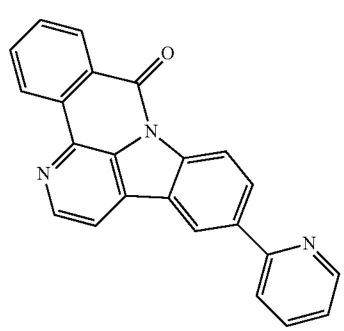

-continued
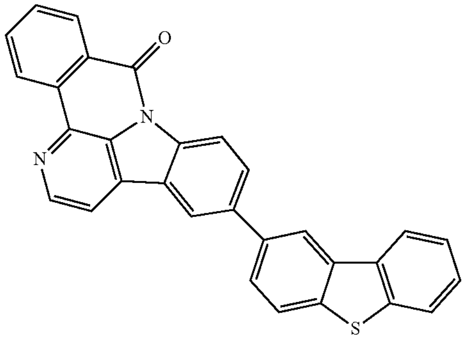
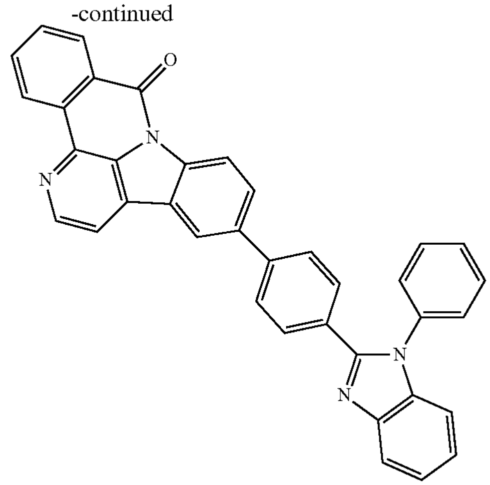
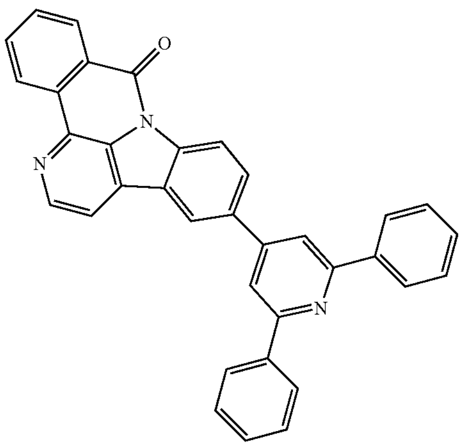
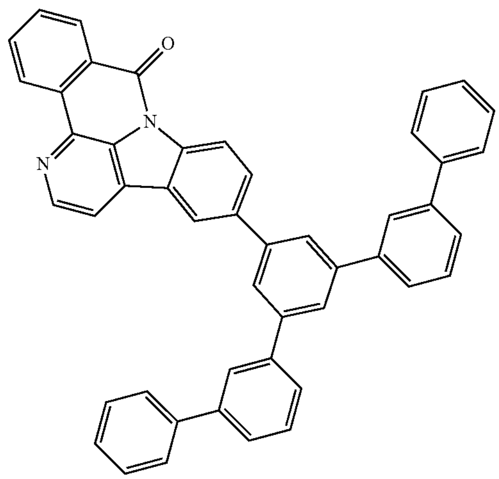
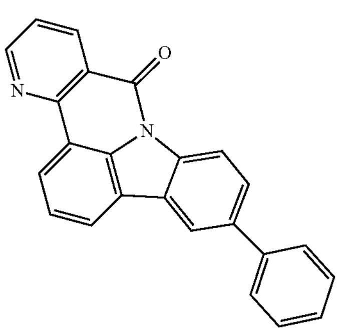
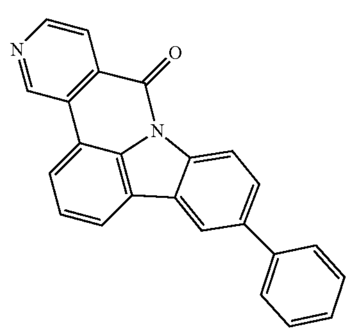
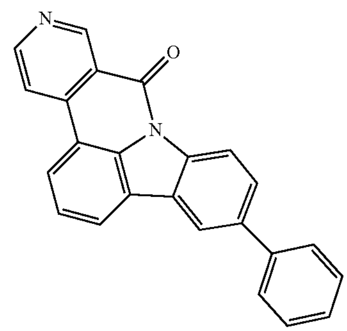
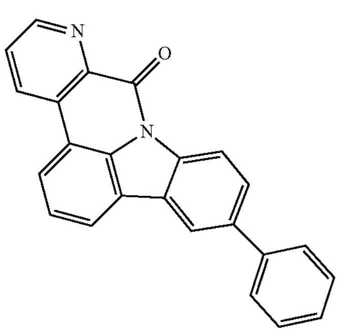
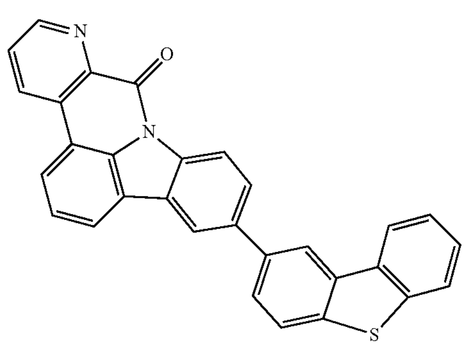
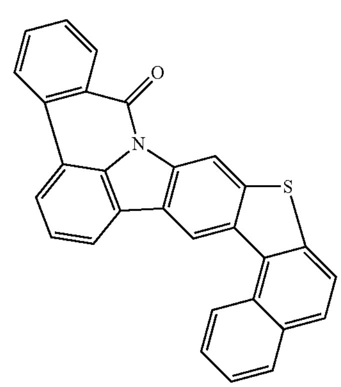

-continued
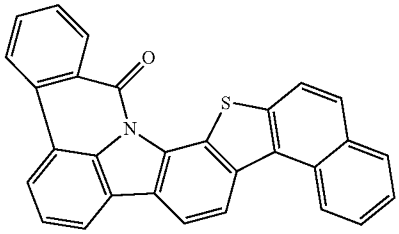
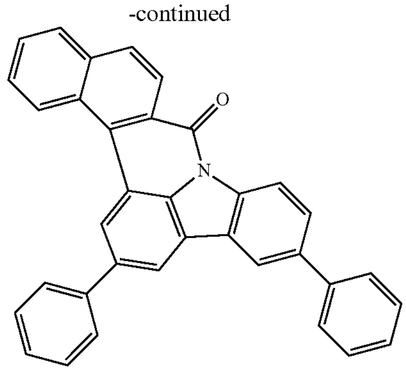
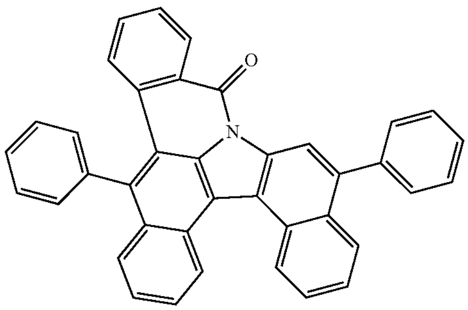
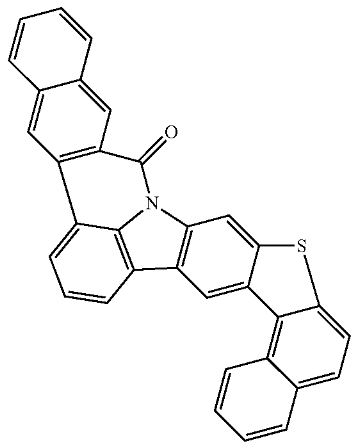
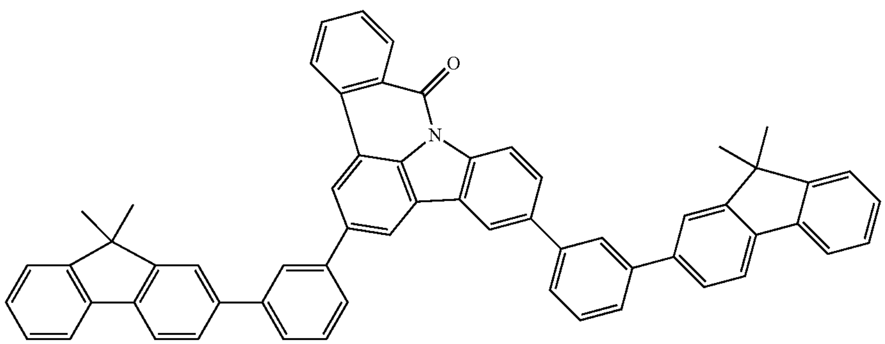
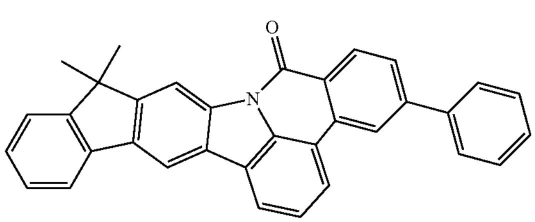
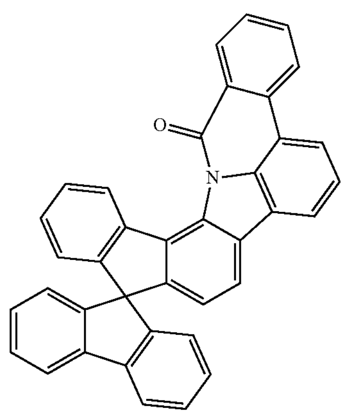

-continued
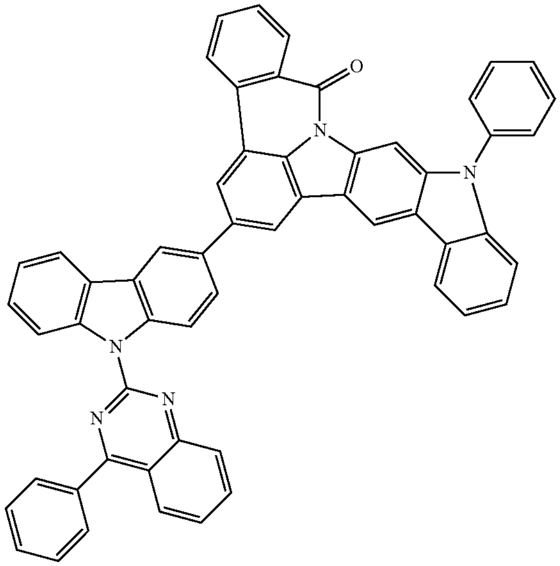
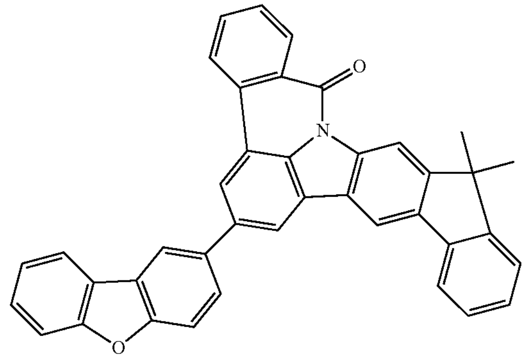
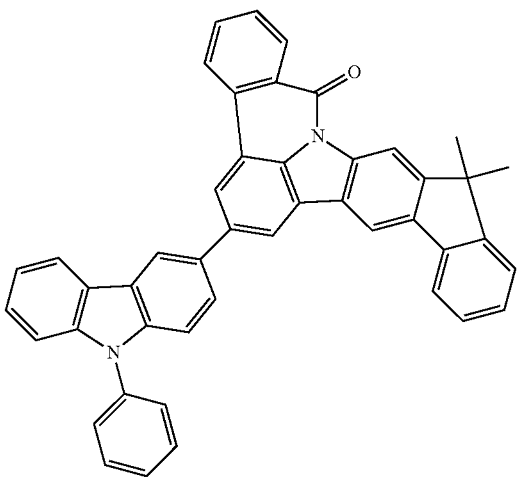
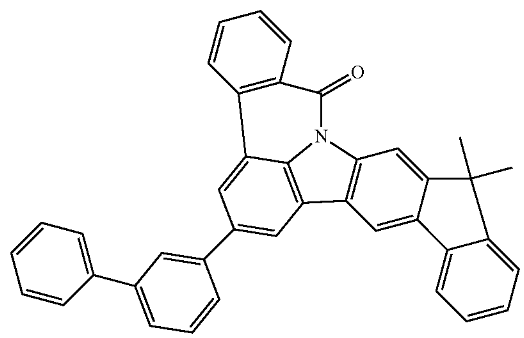
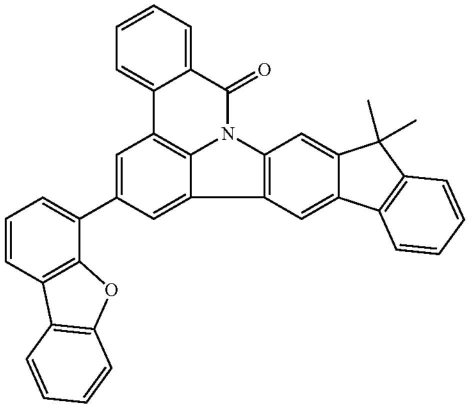

-continued
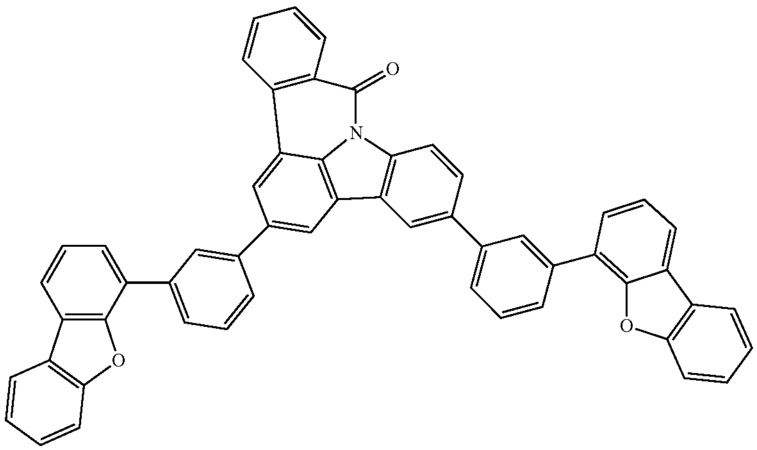
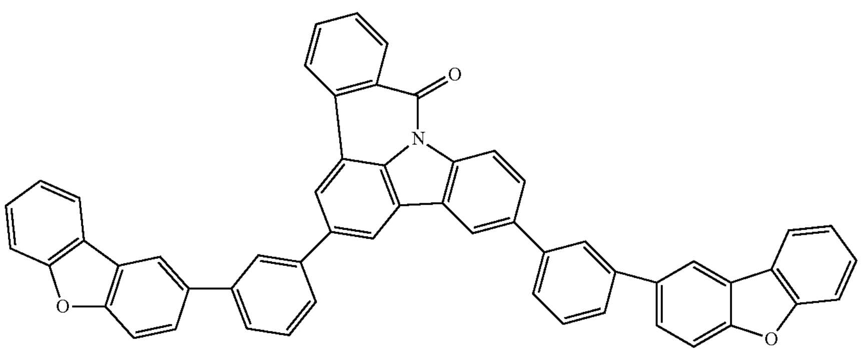
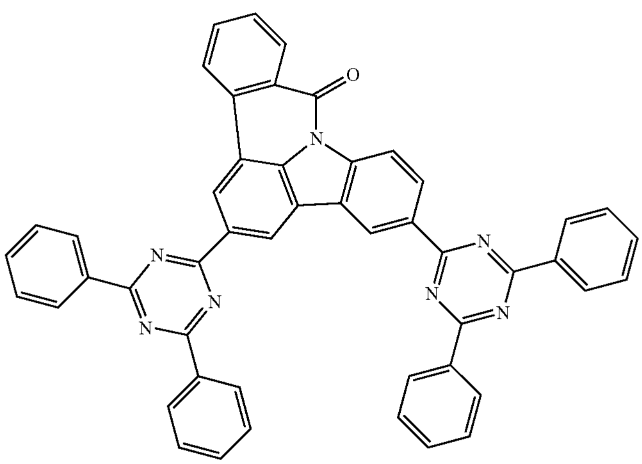
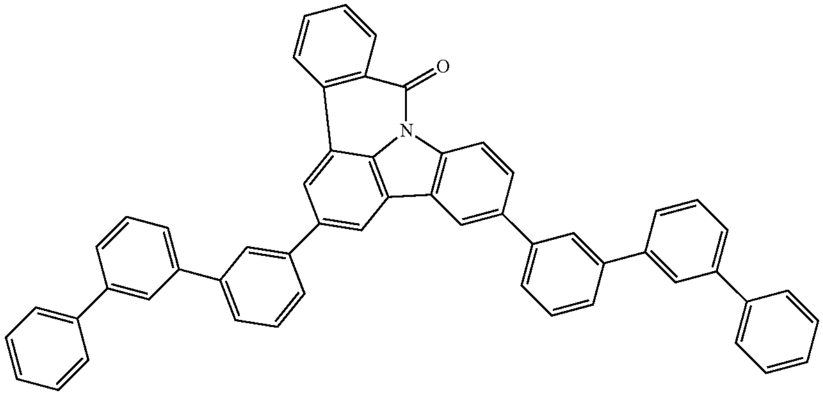

-continued
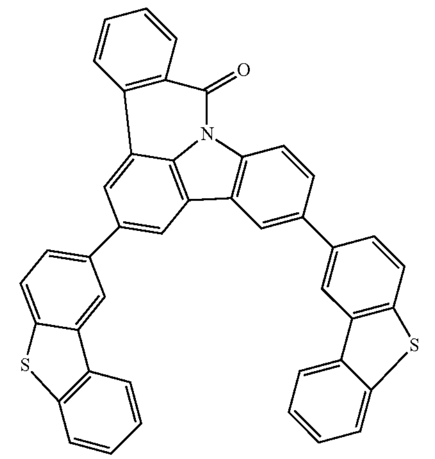
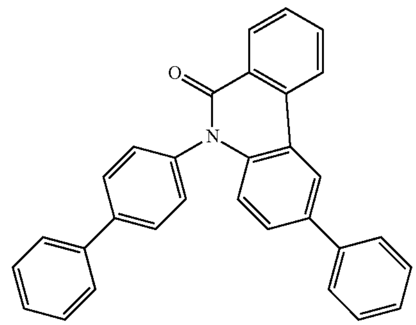
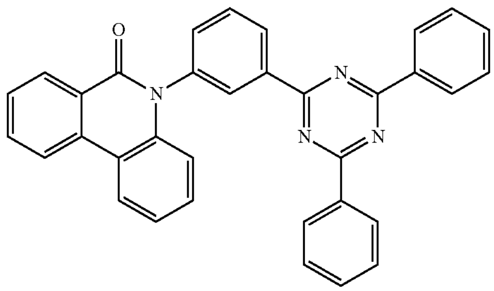
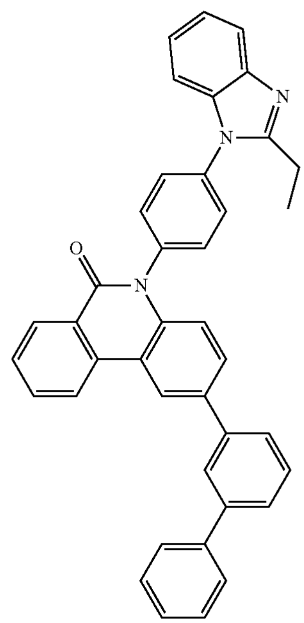
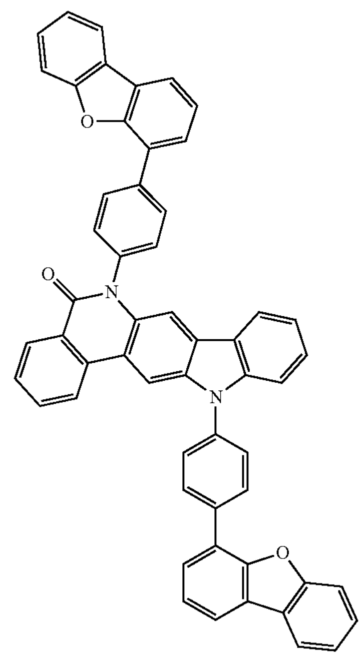
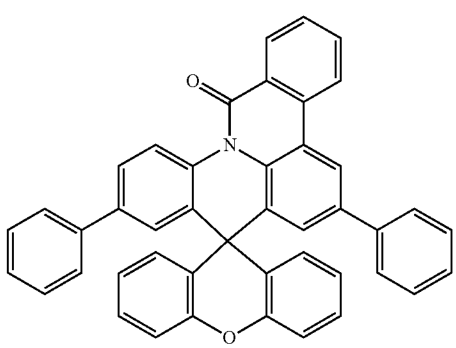
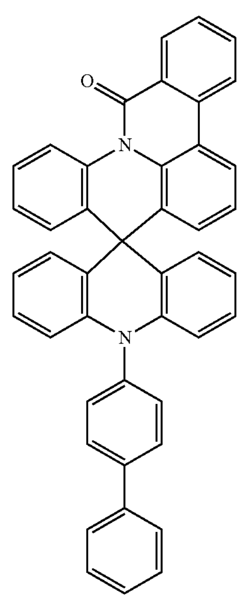
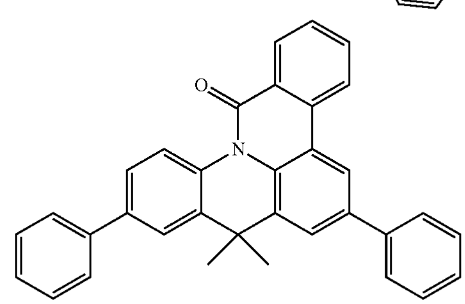

Examples of indolo- and indenocarbazole derivatives in the broadest sense which can be used as hole- or electron-transporting matrix materials according to the substitution pattern are the following structures:
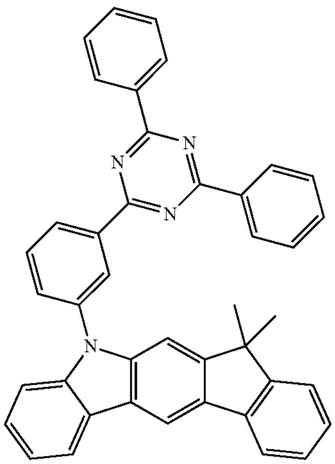
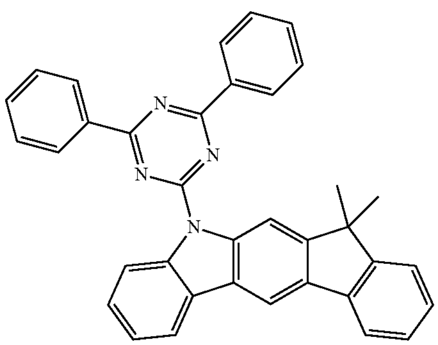
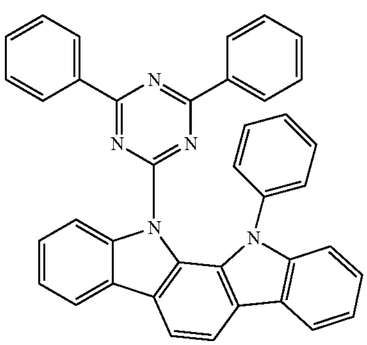
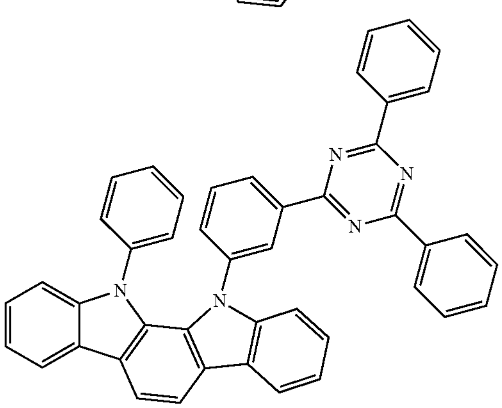
-continued
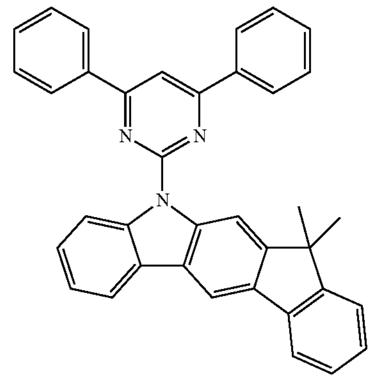
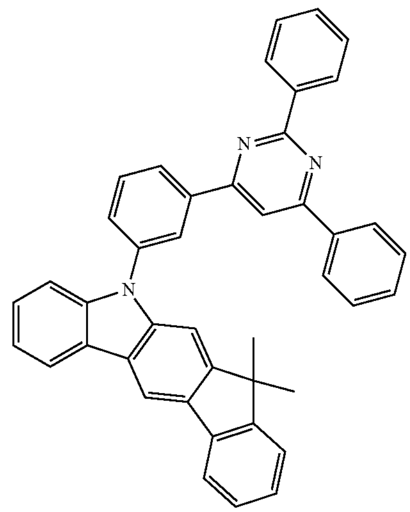
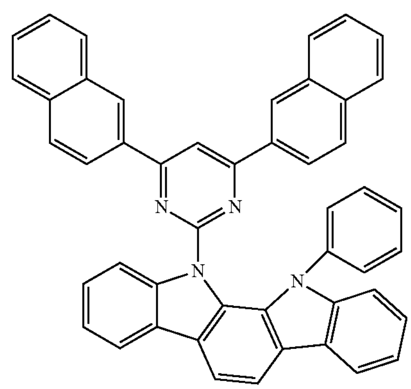
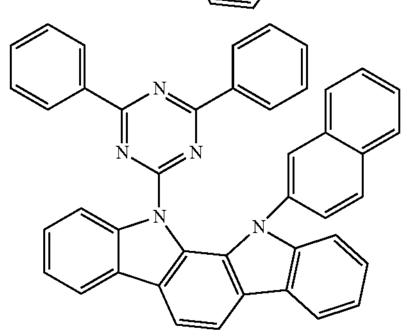

-continued
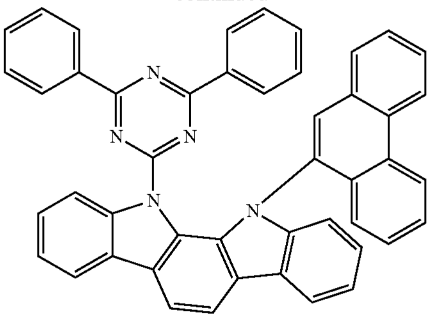
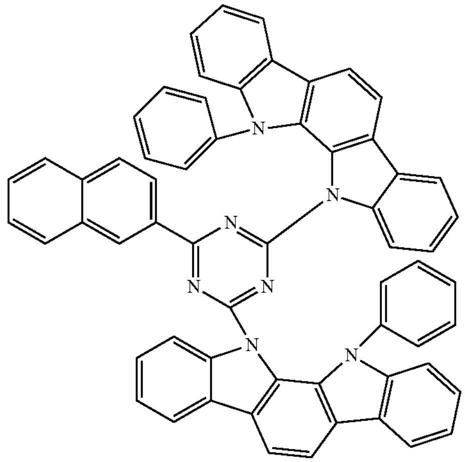
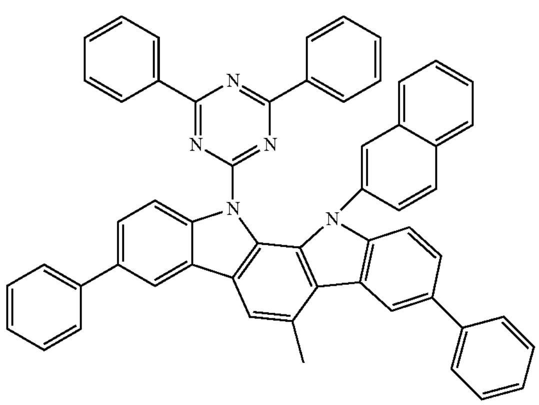
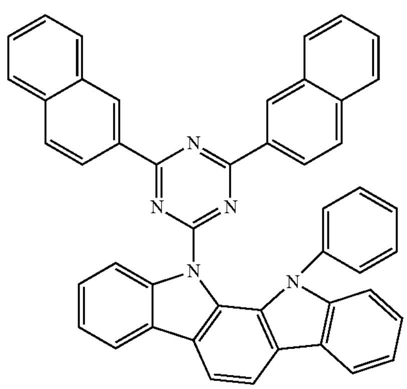
-continued
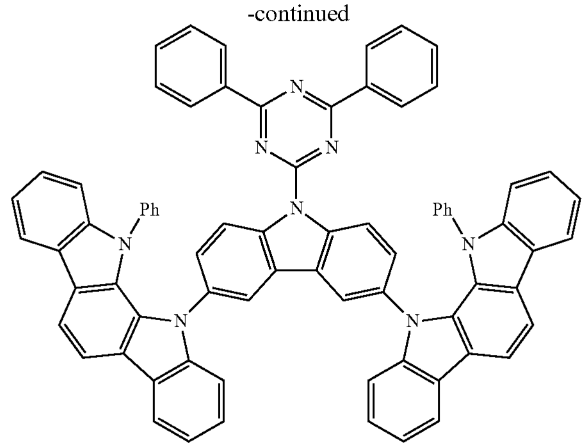
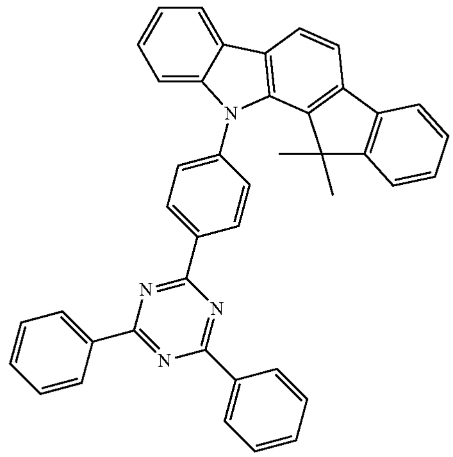
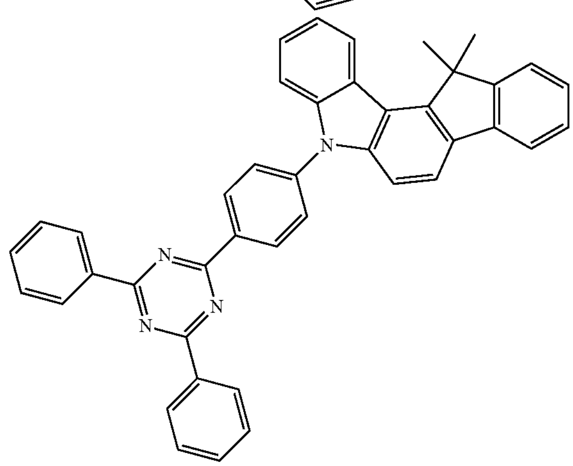
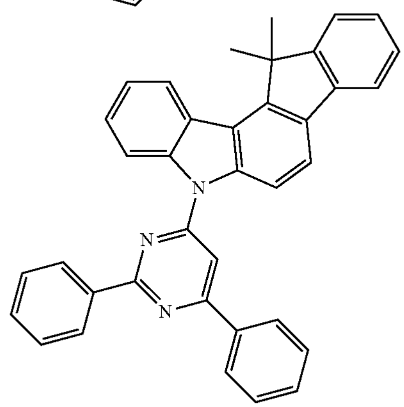

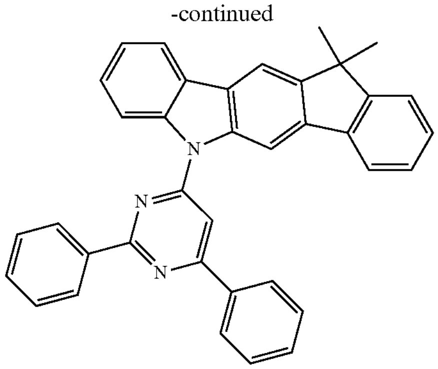
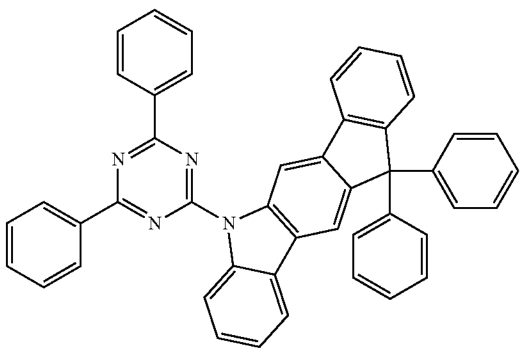
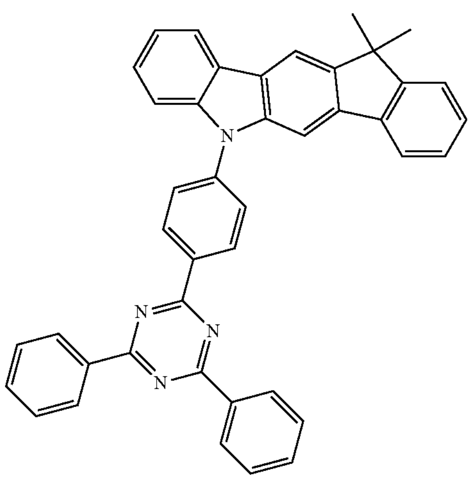
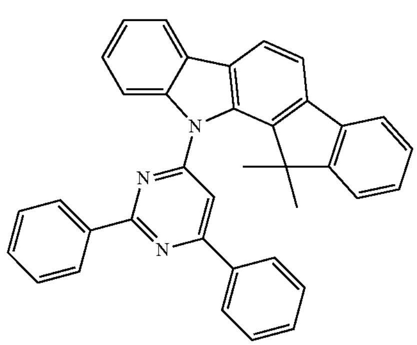
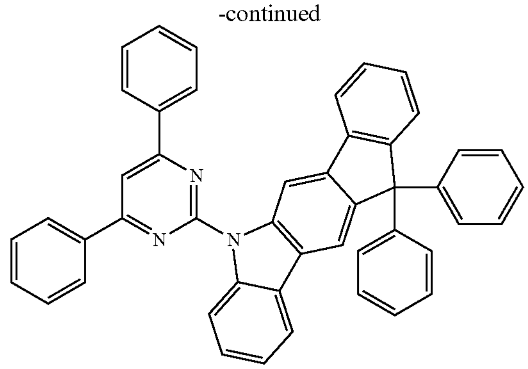
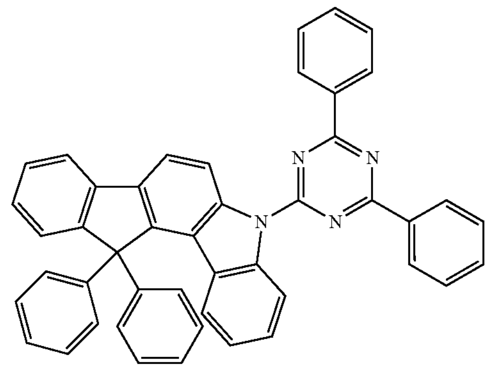
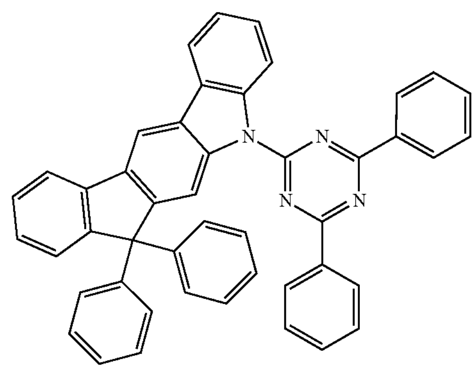
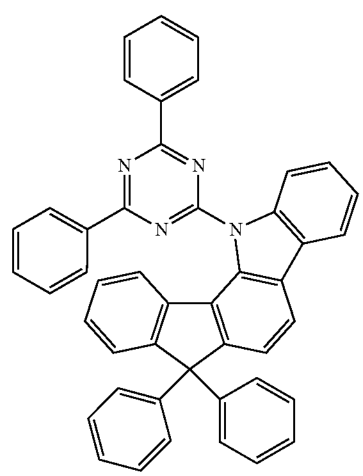

-continued
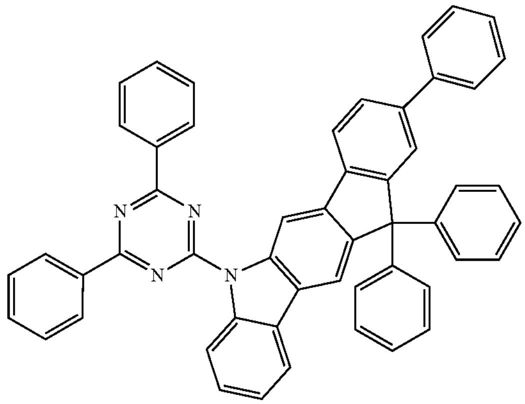
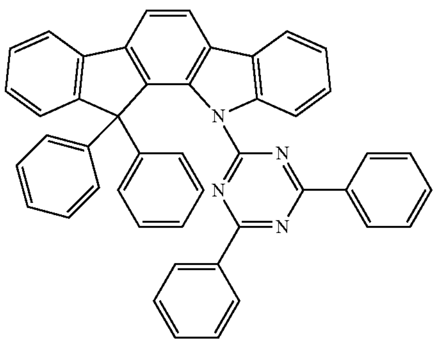
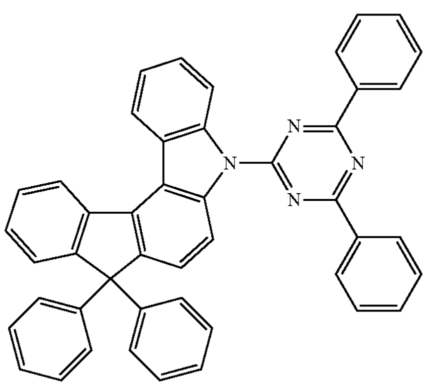
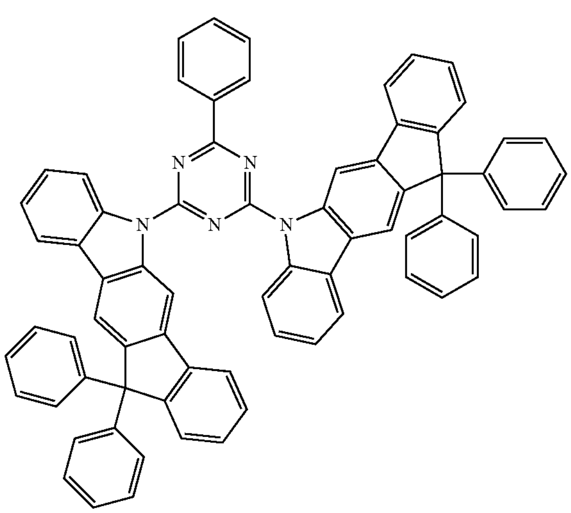
-continued
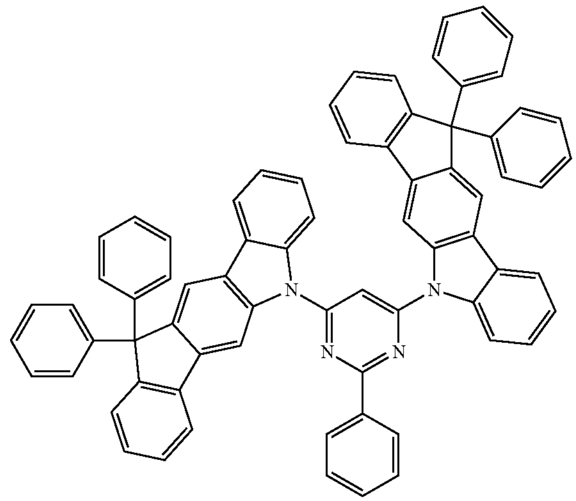
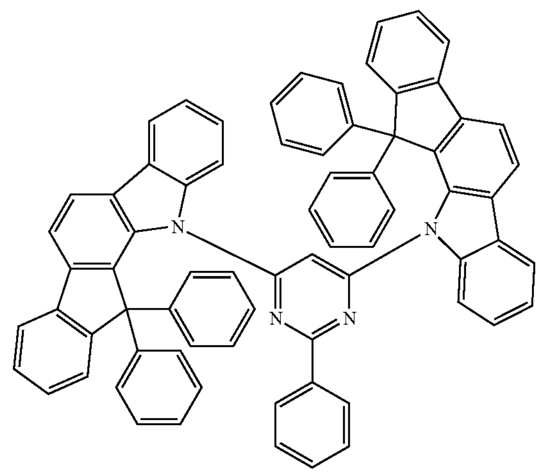
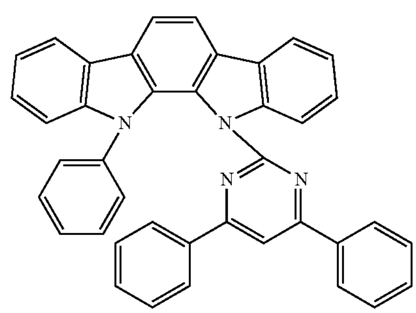
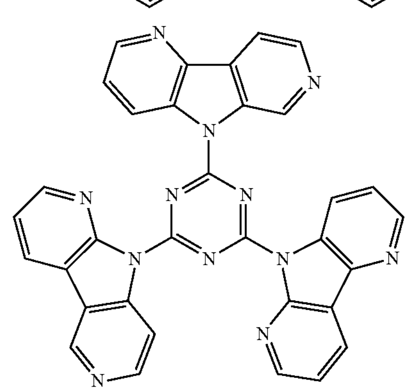

-continued
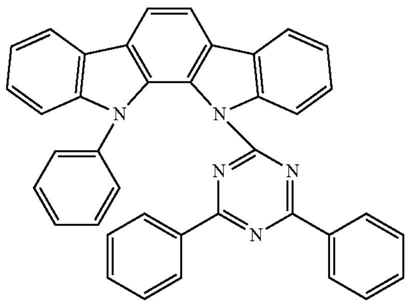
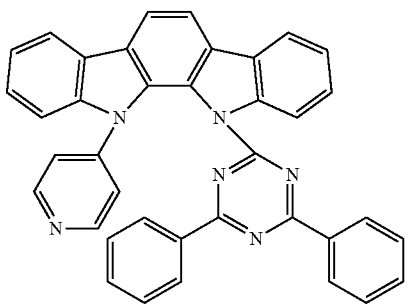
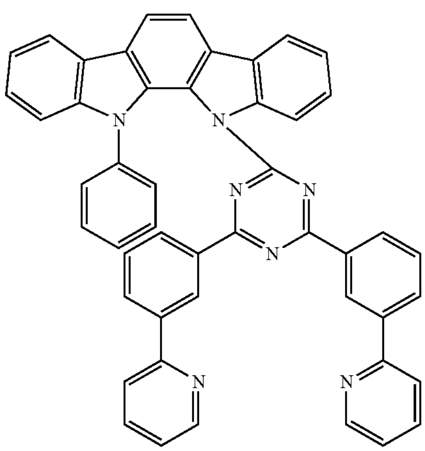
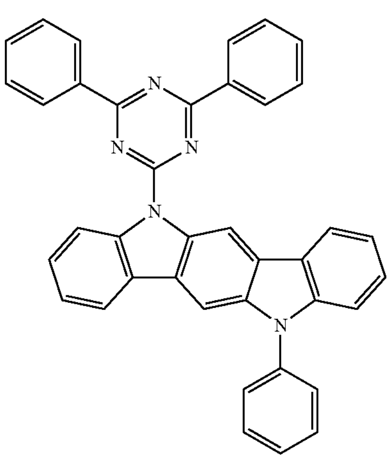
-continued
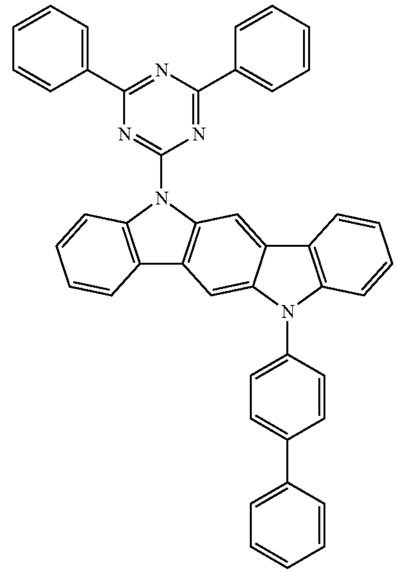
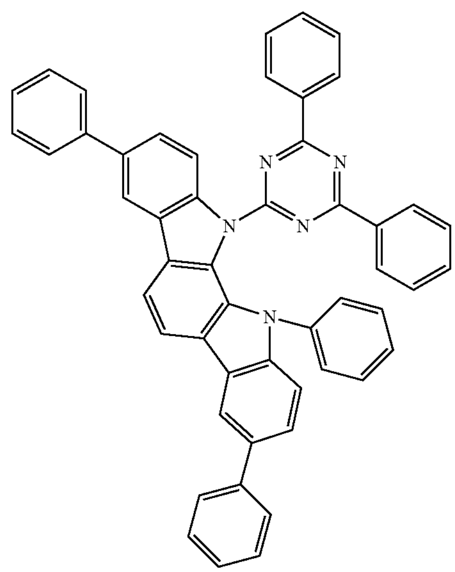
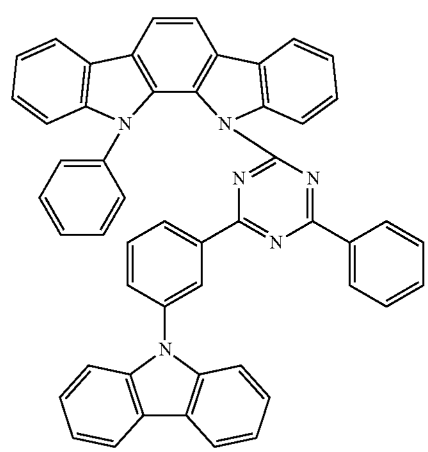

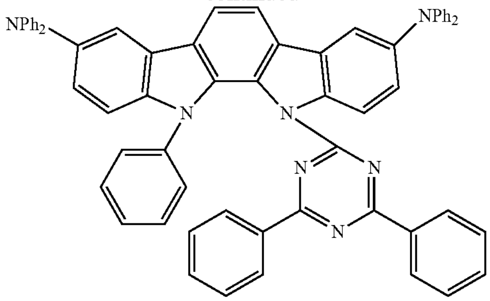
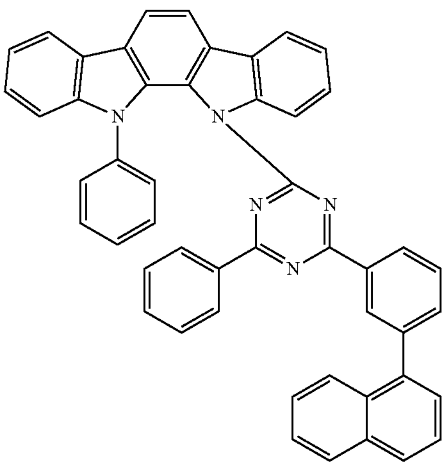
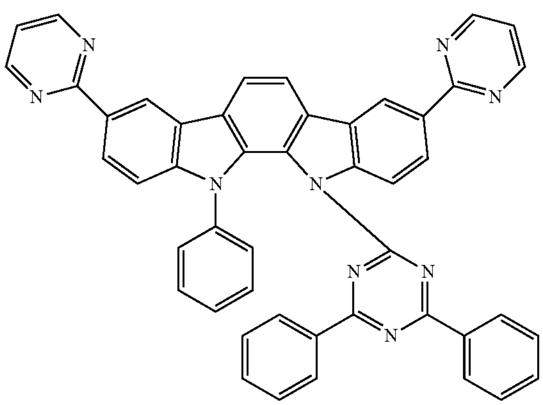
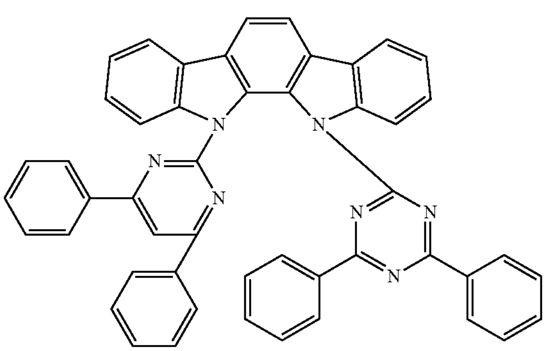
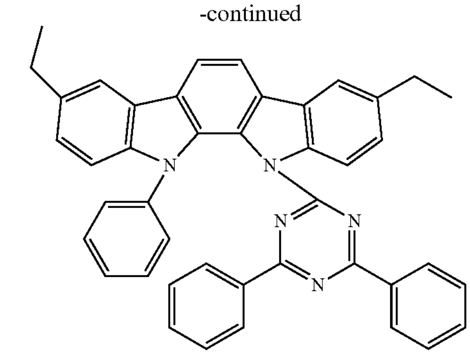
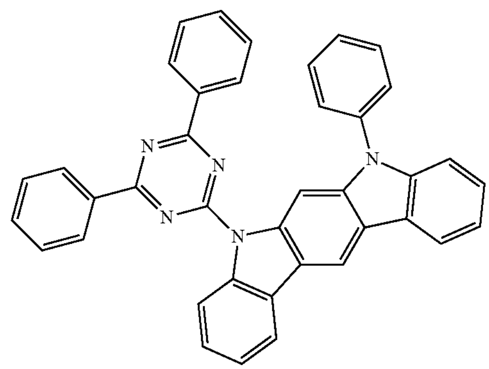
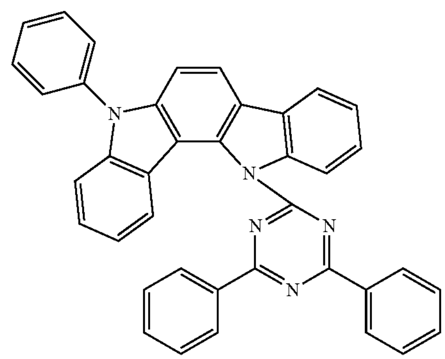
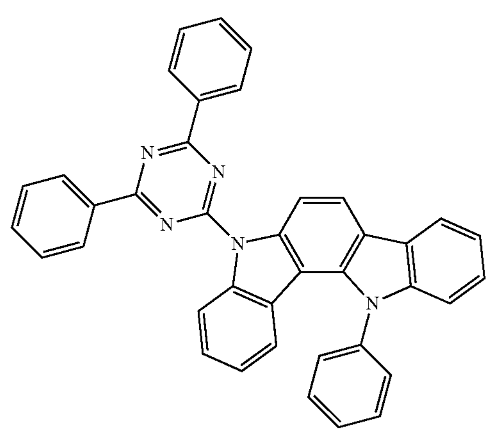

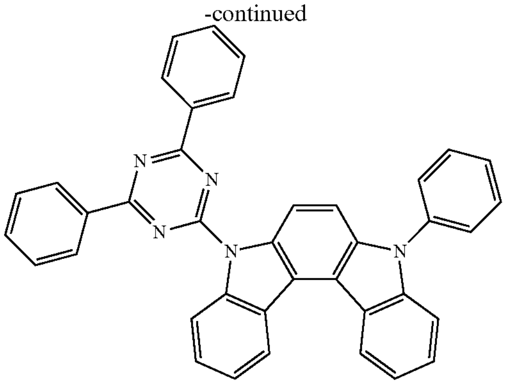
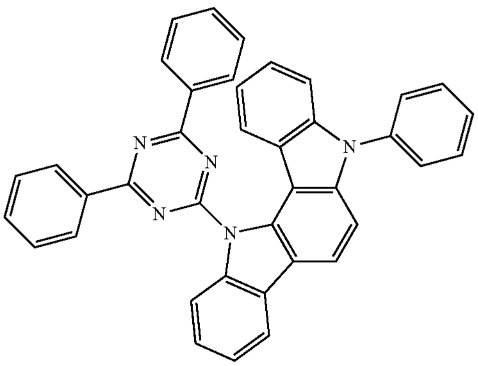
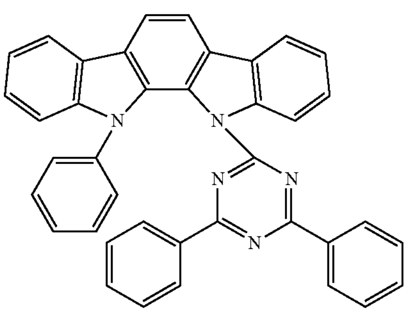
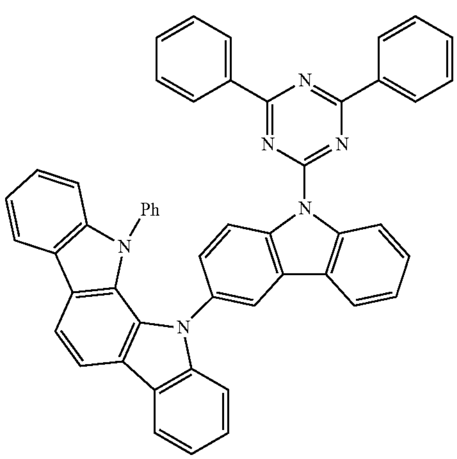
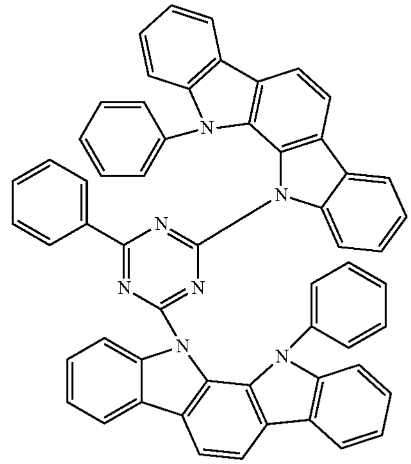
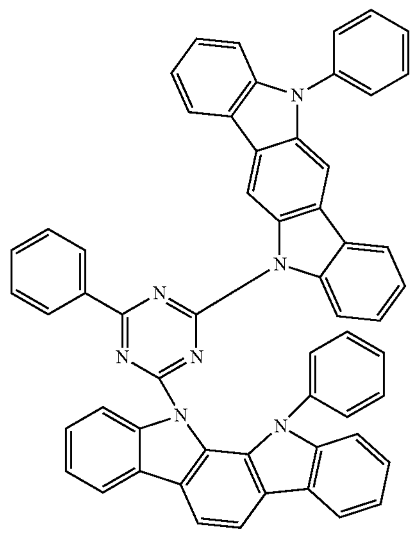
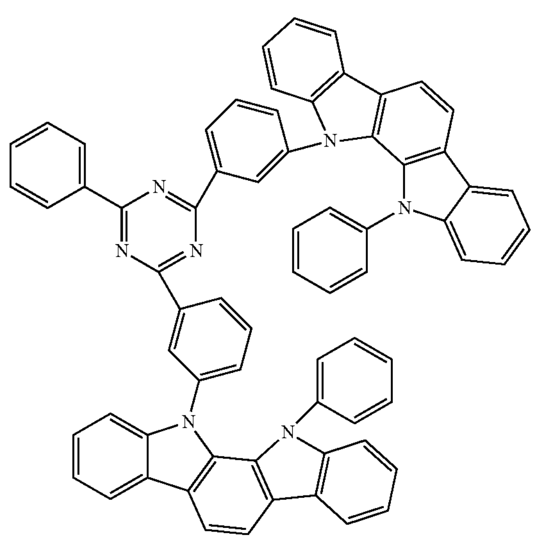

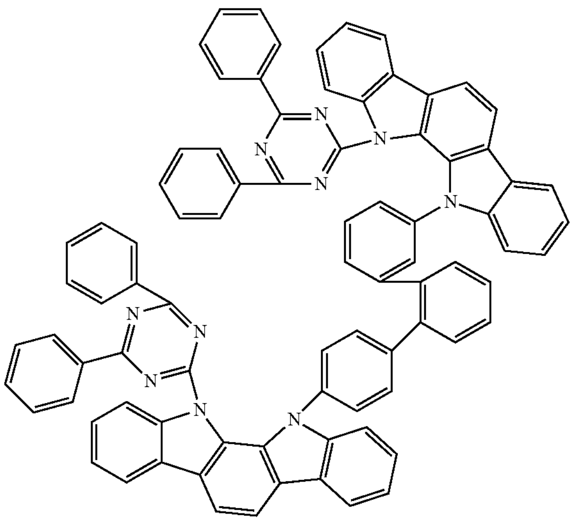
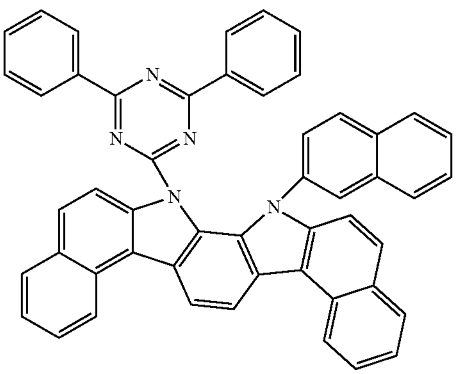
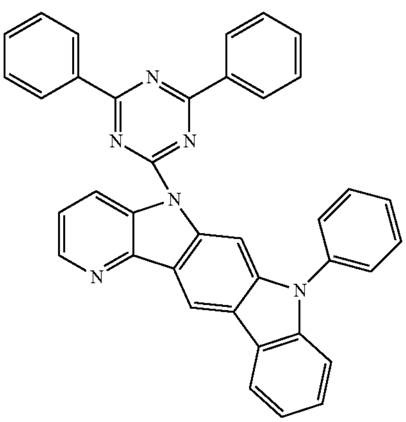
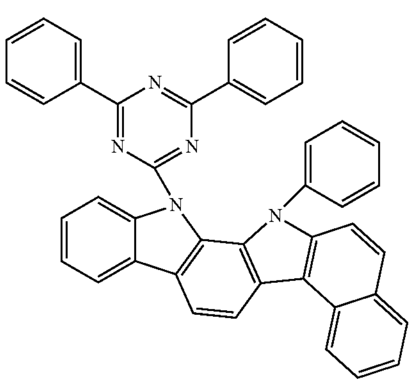
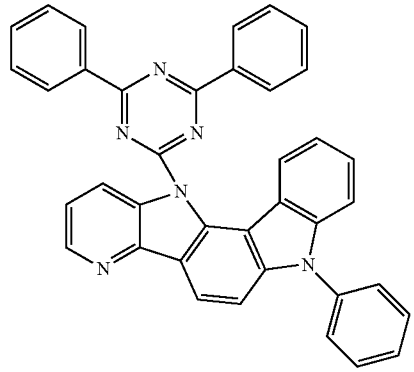
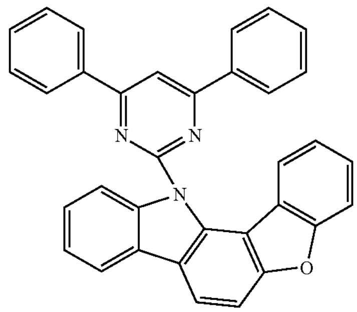
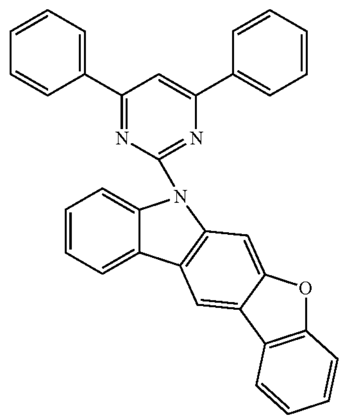
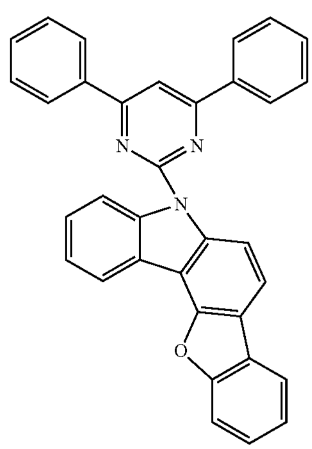

-continued
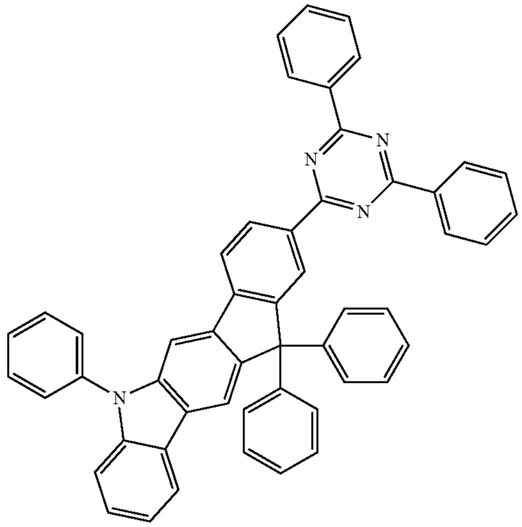
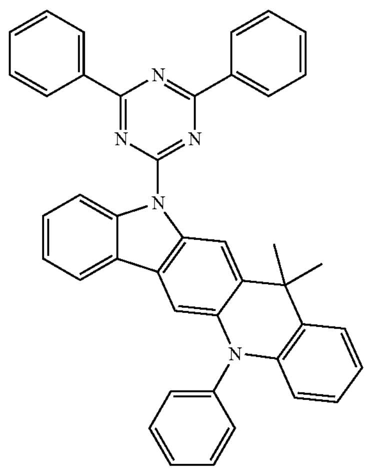
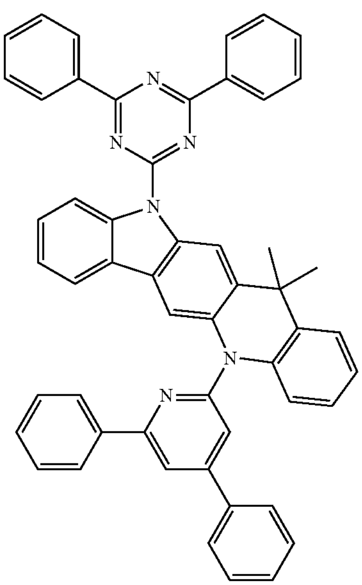
-continued
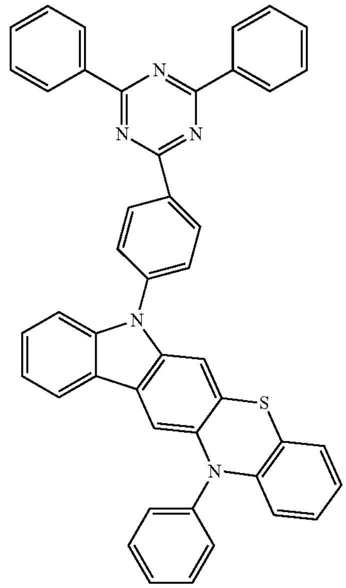
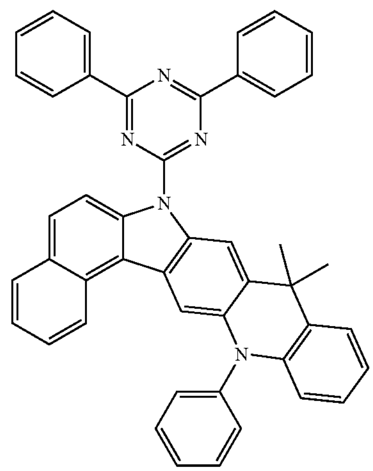
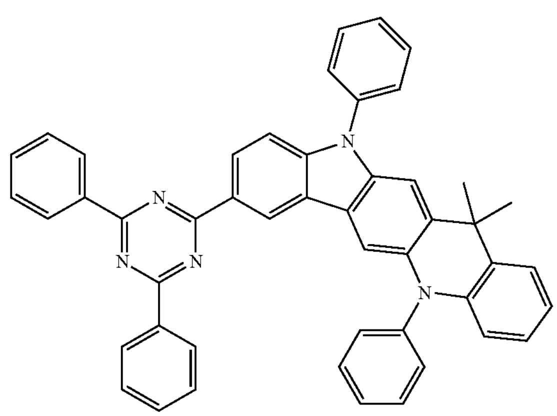

-continued
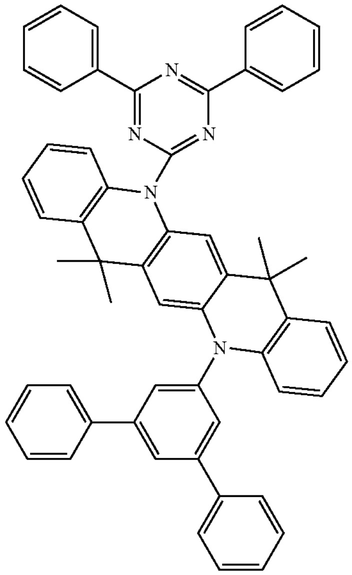
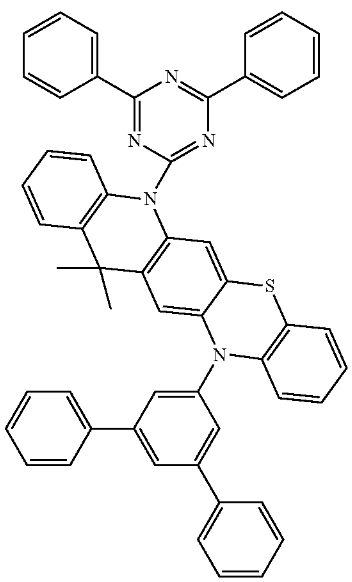
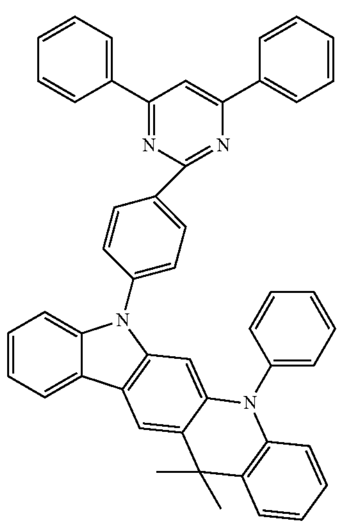
-continued
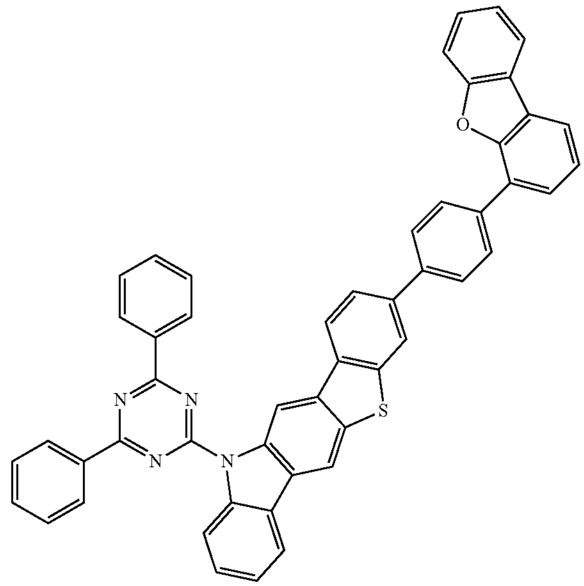
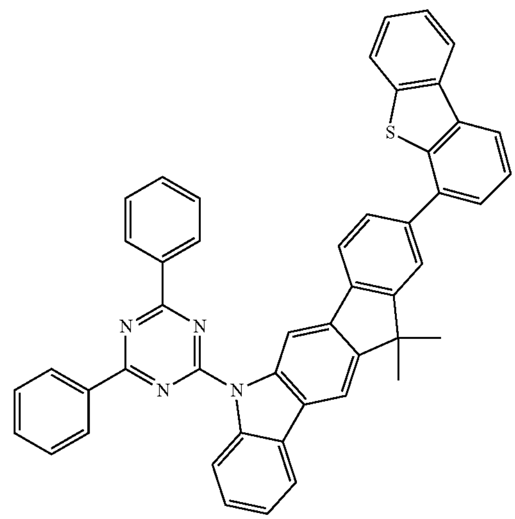
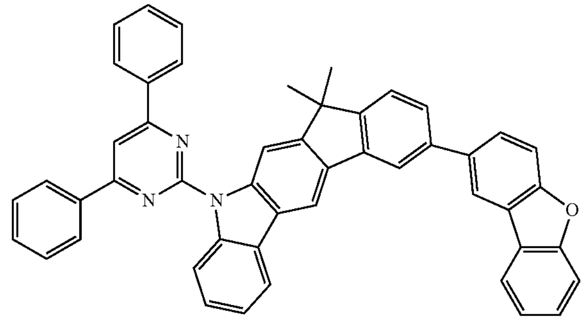

-continued
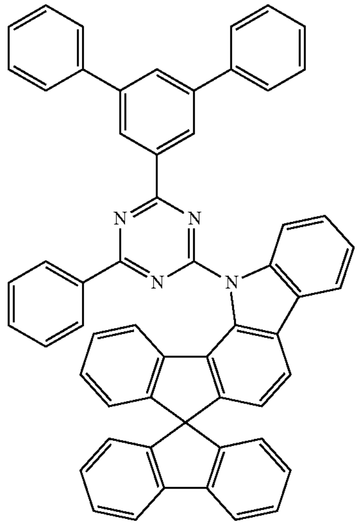
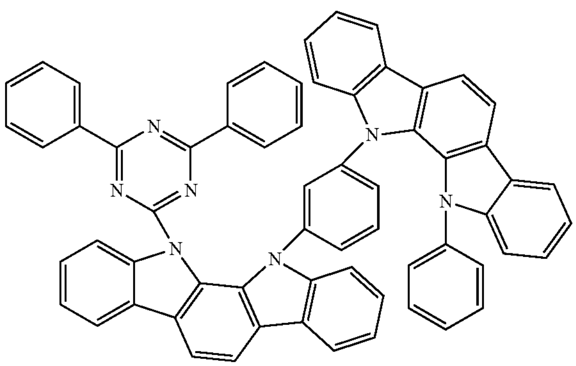
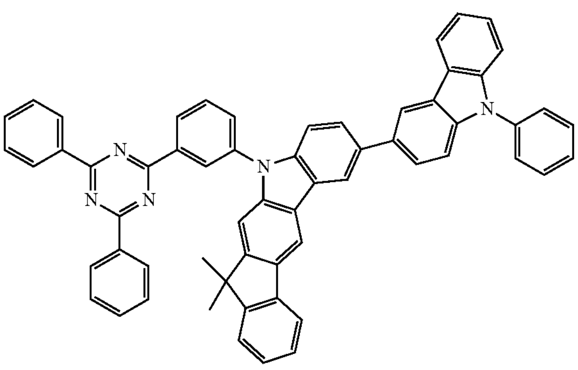
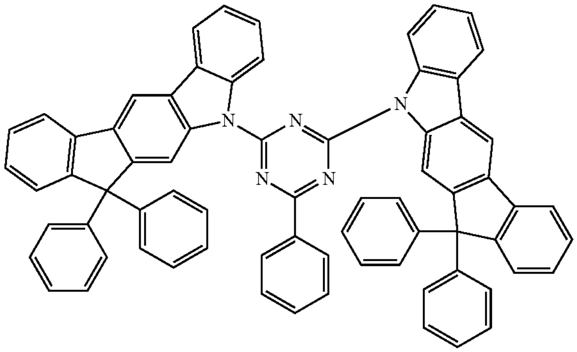
-continued
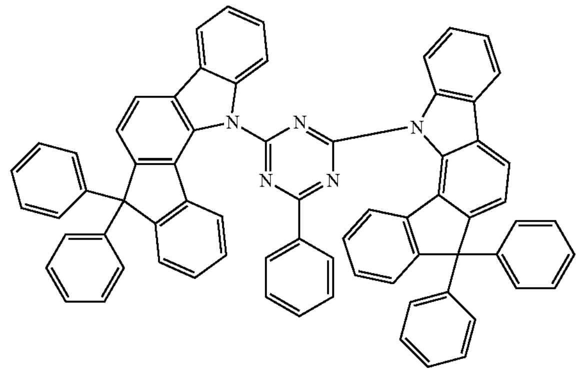
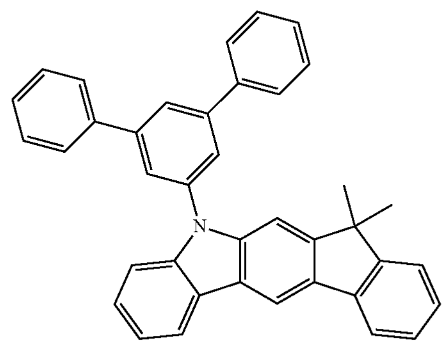
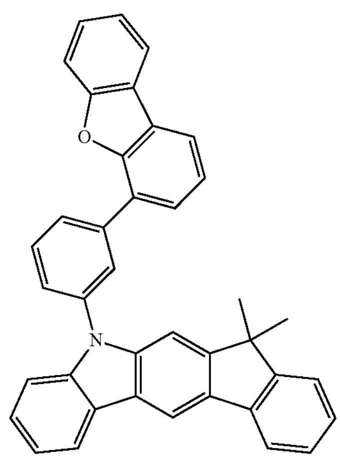
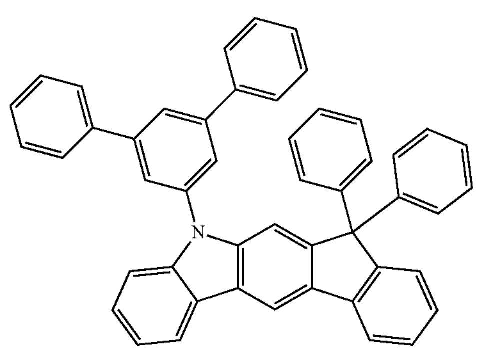

-continued
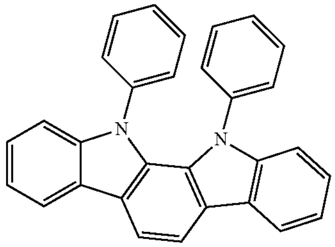
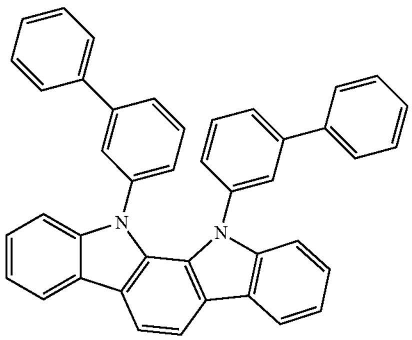
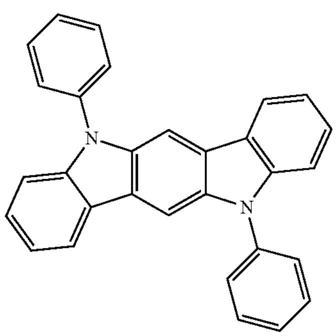
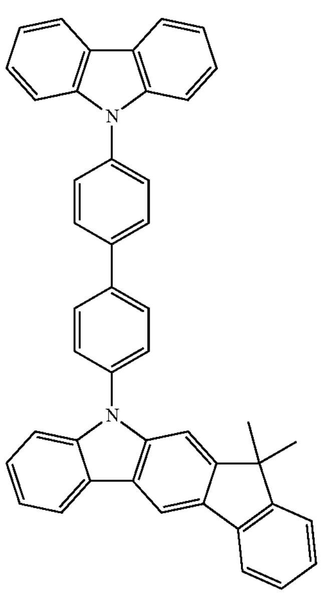
-continued
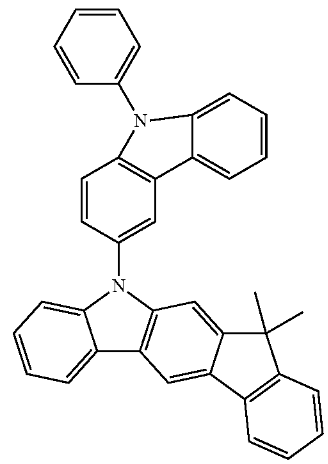
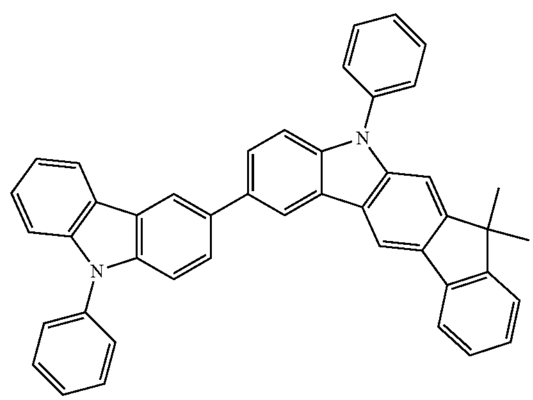
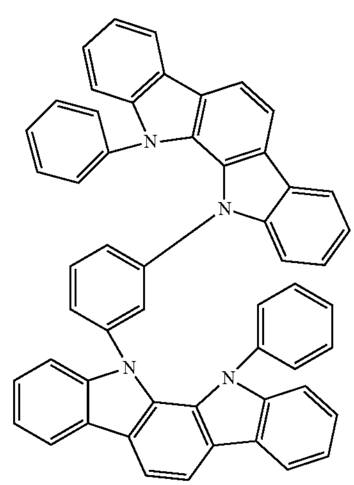

-continued
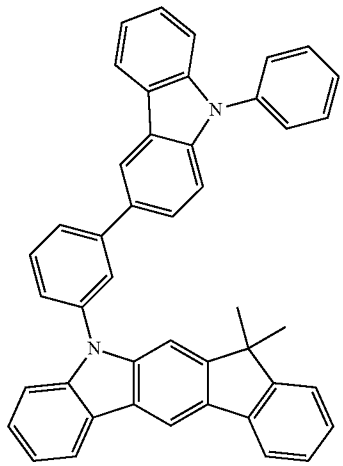
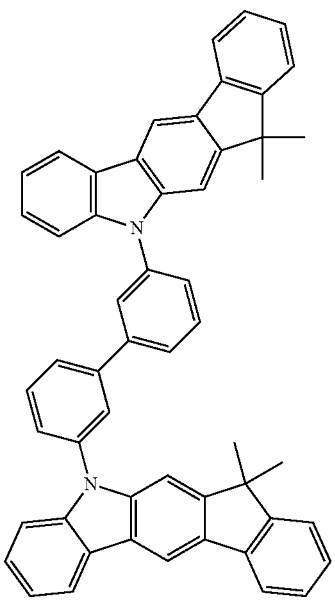
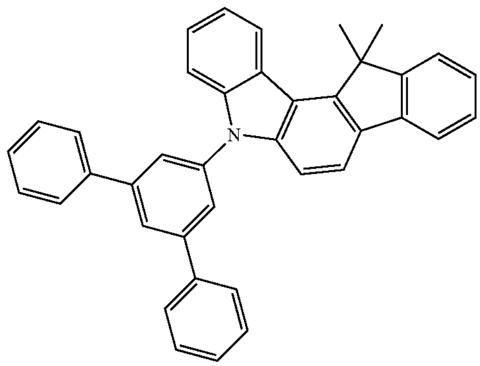
-continued
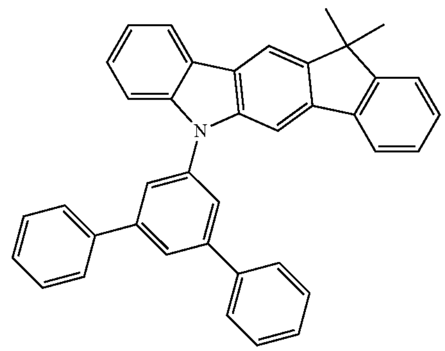
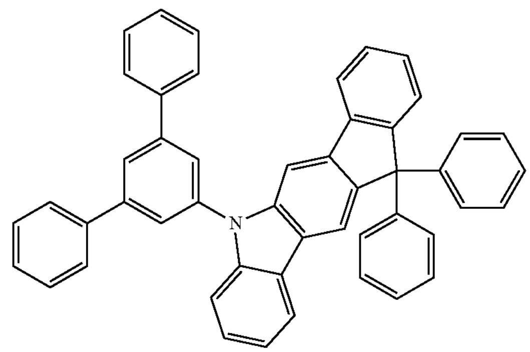
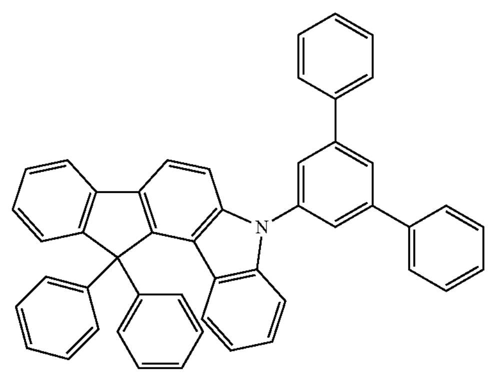
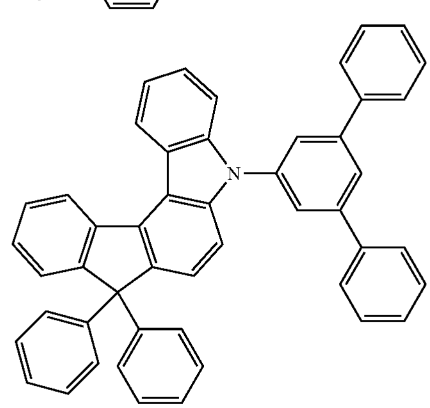

-continued
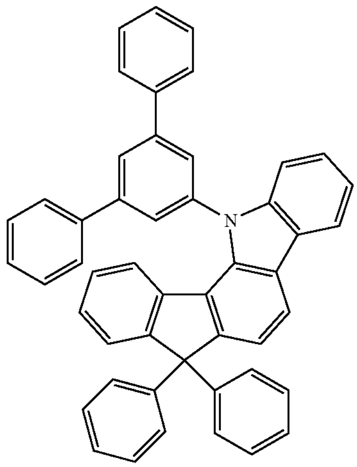
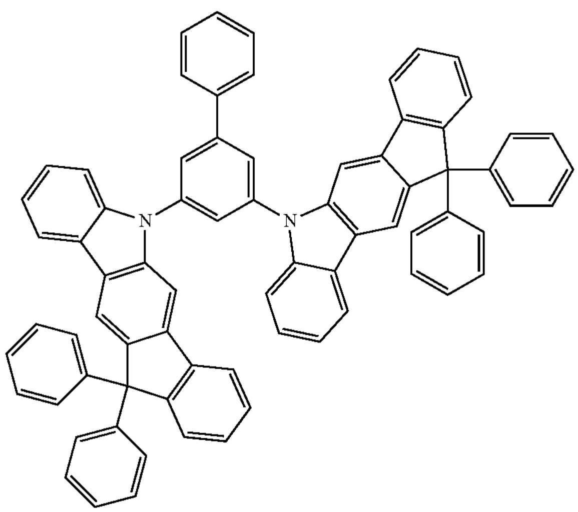
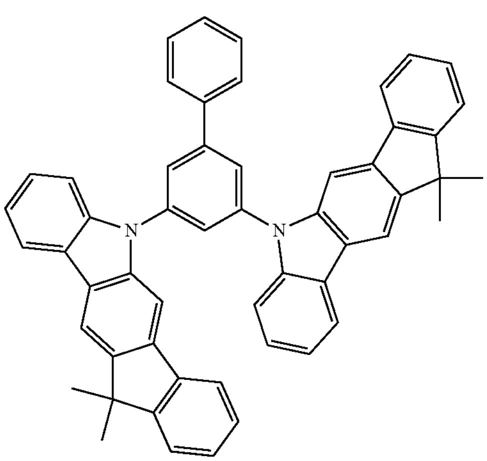
-continued
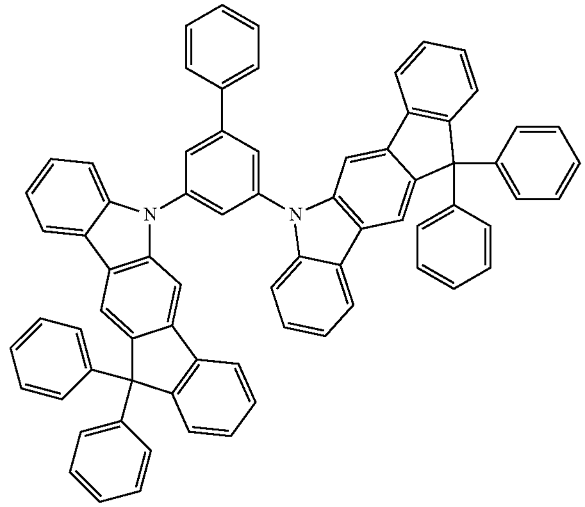
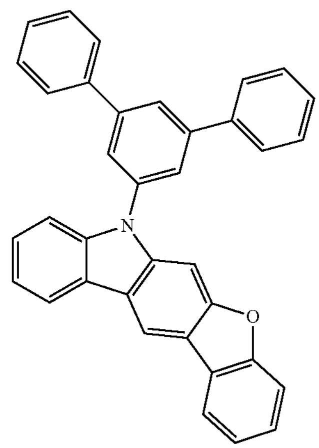
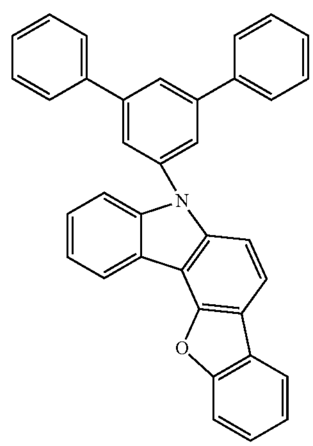
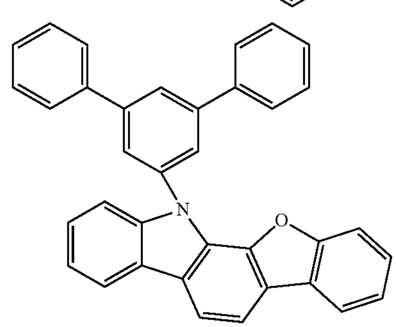

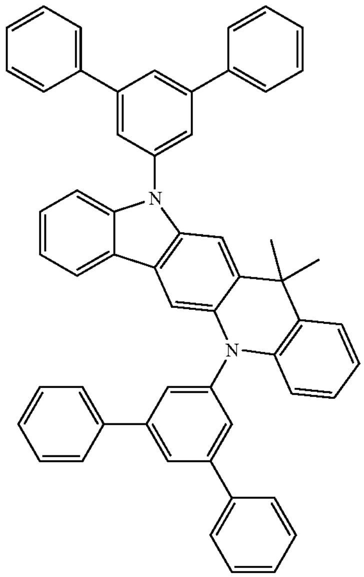
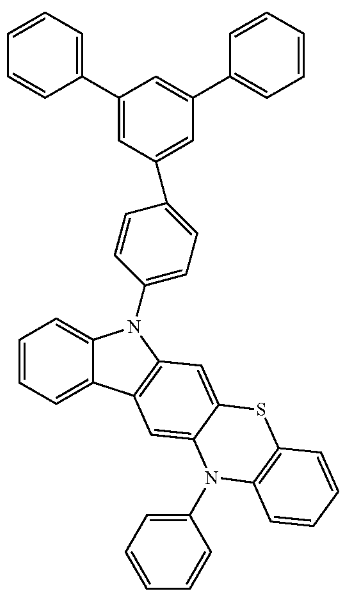
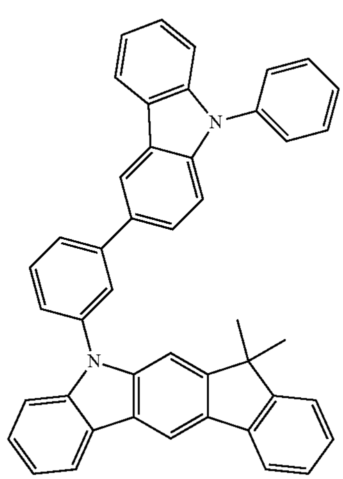
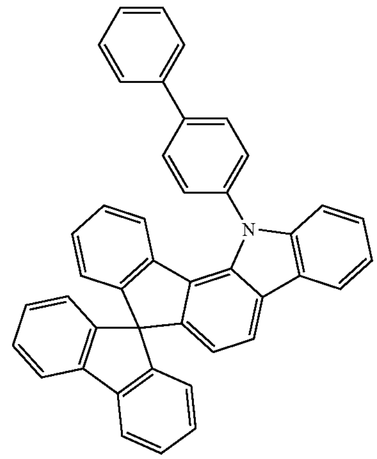
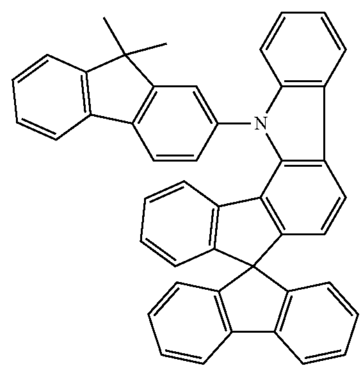
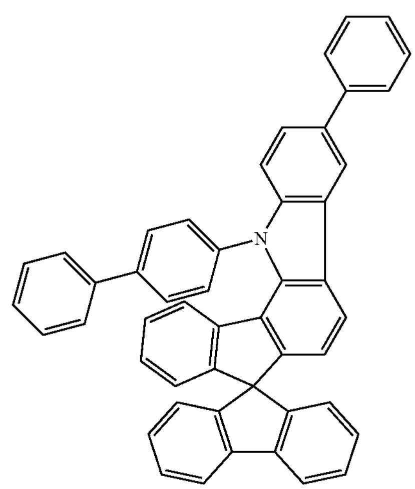
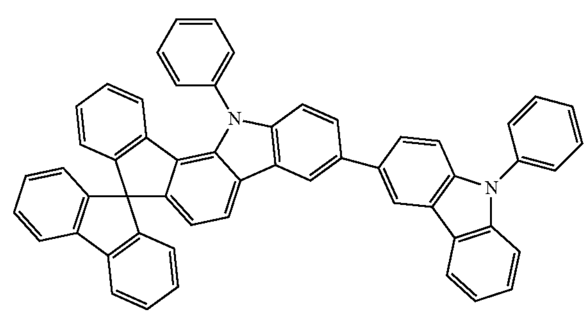

-continued
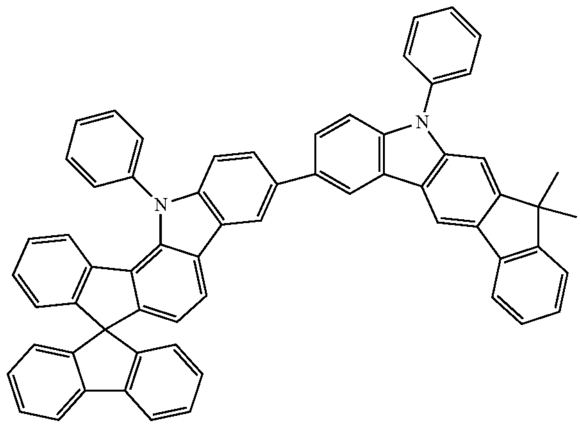
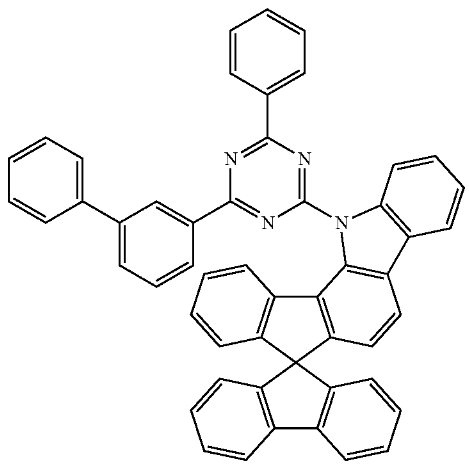
Examples of carbazole derivatives which can be used as hole- or electron-transporting matrix materials according to the substitution pattern are the following structures:
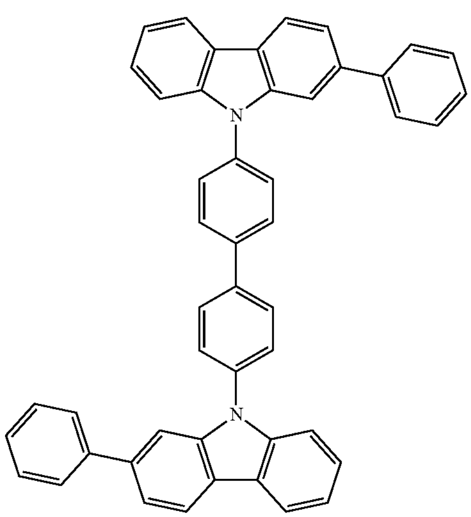
-continued
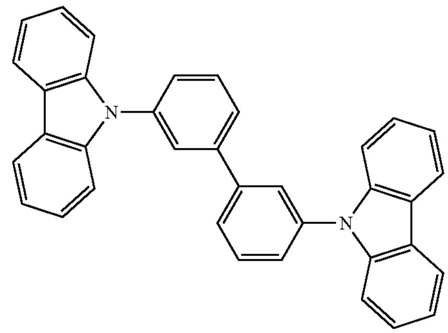
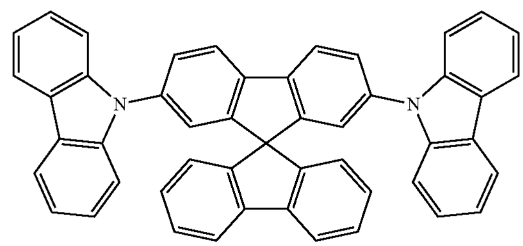
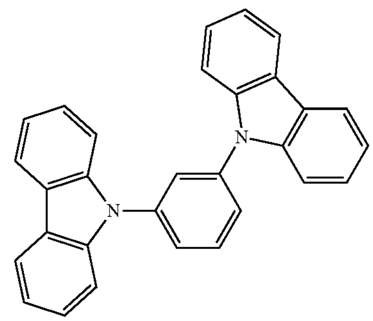
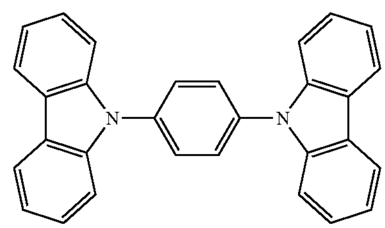
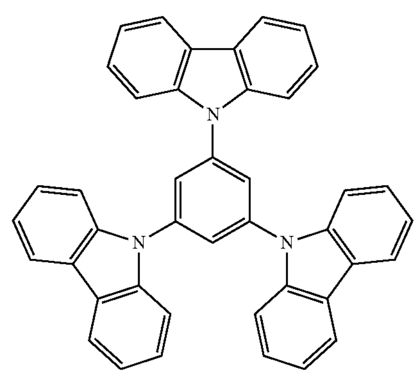
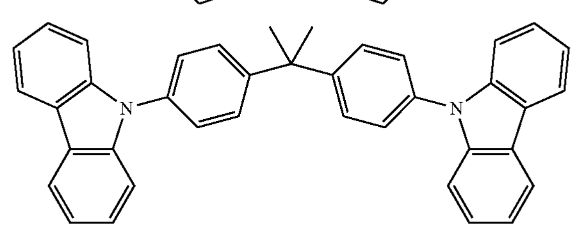

-continued
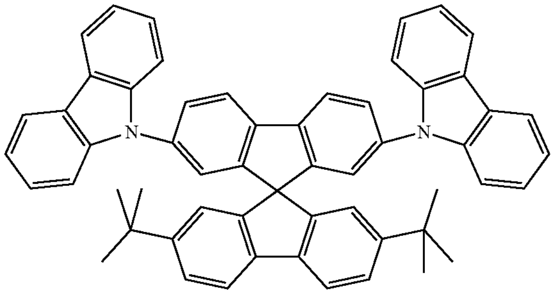
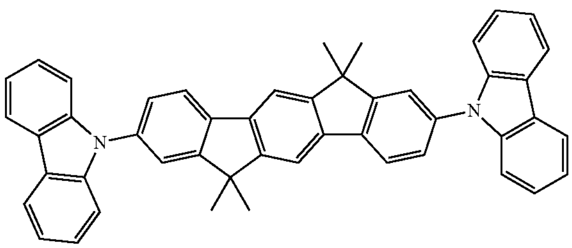
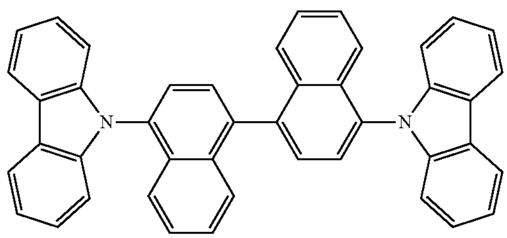
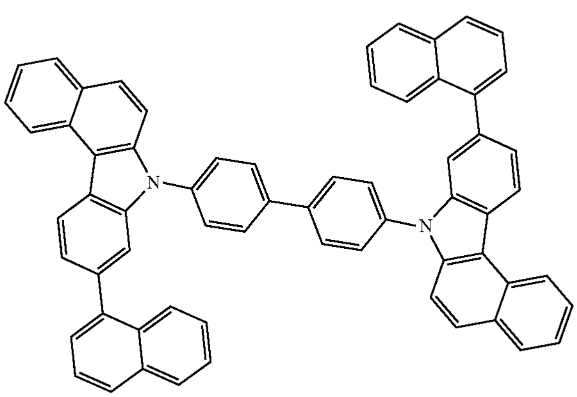
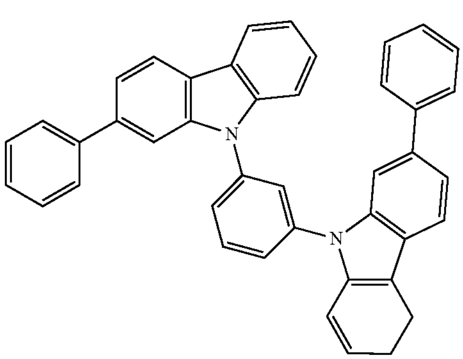
-continued
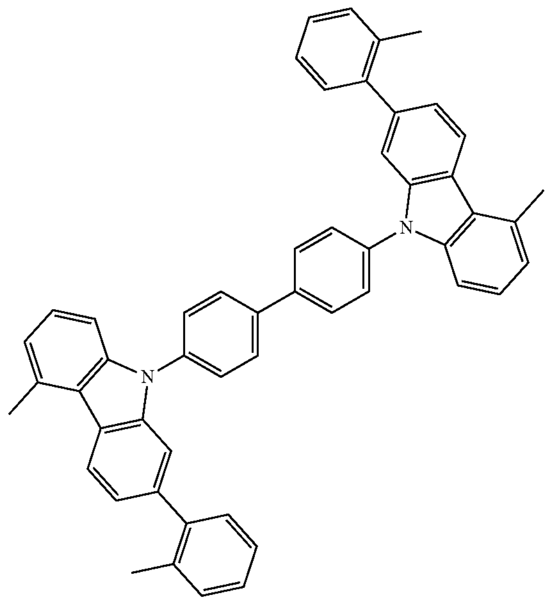
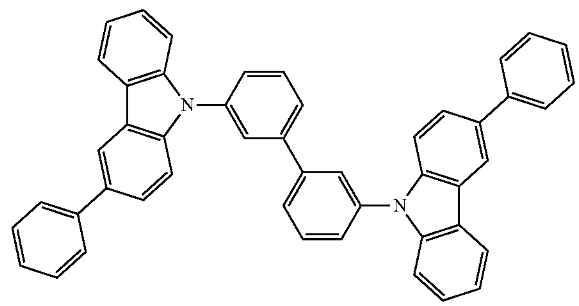
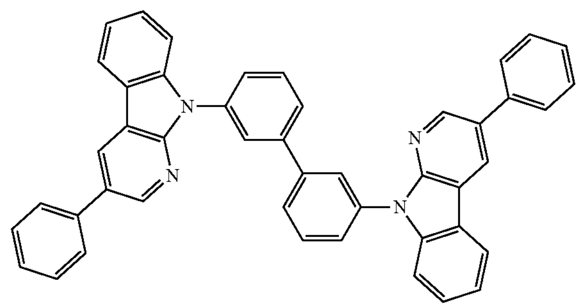
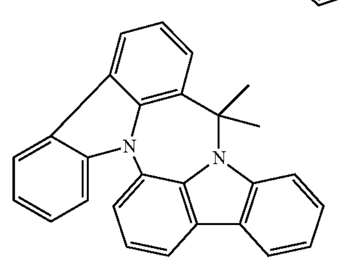
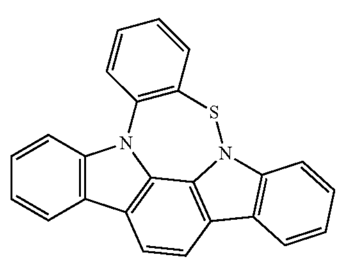

-continued
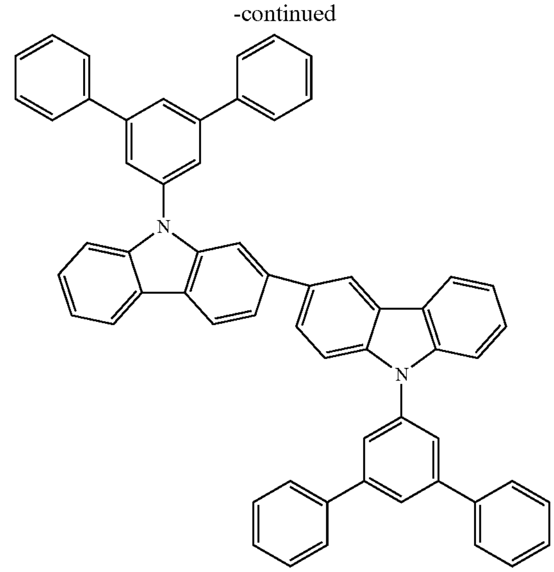
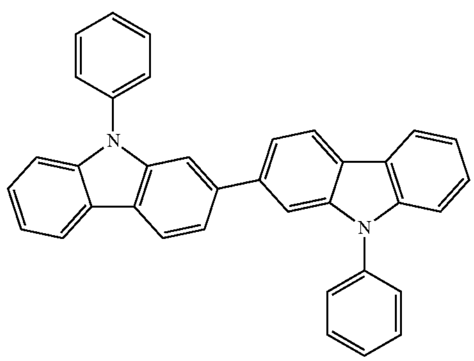
-continued
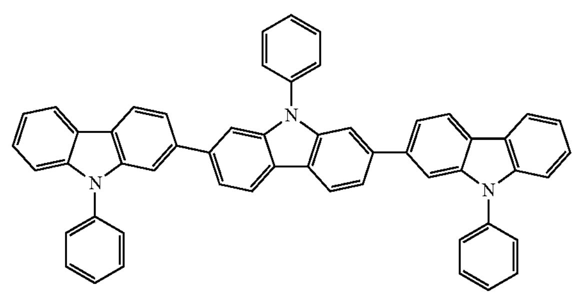
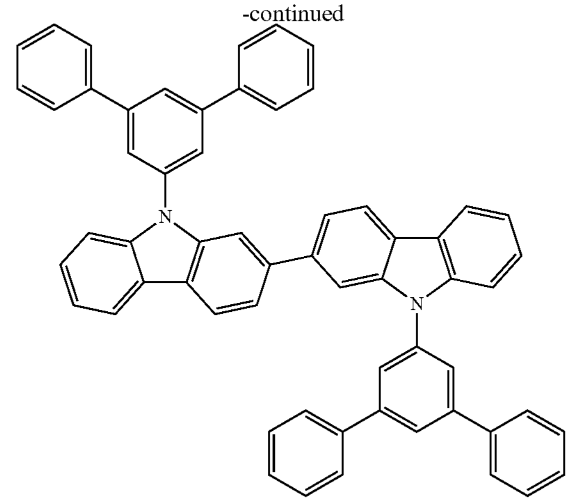
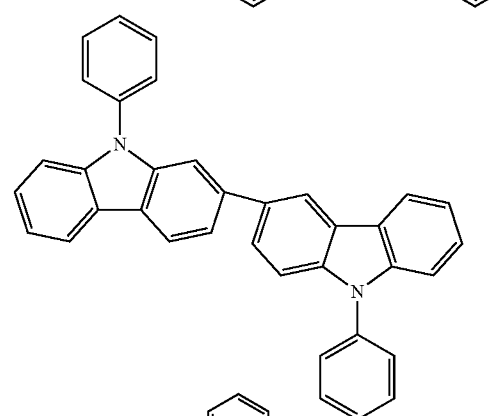
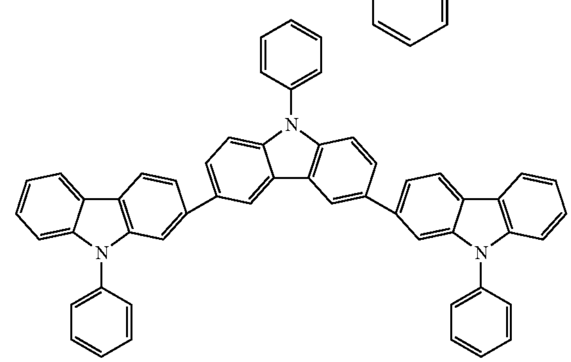
Examples of bridged carbazole derivatives which can be used as hole-transporting matrix materials:
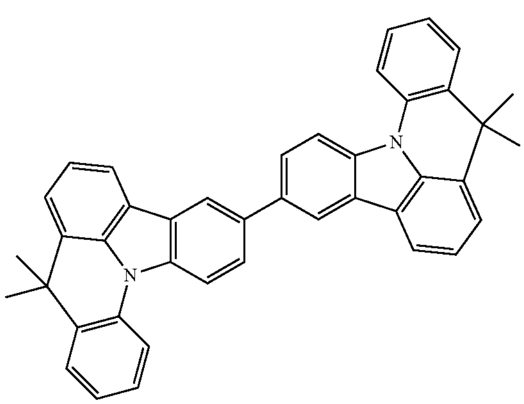
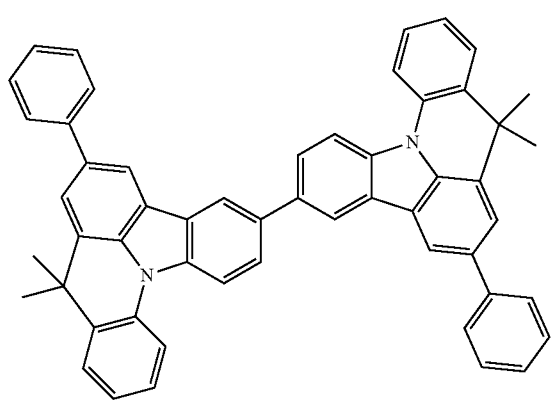

-continued
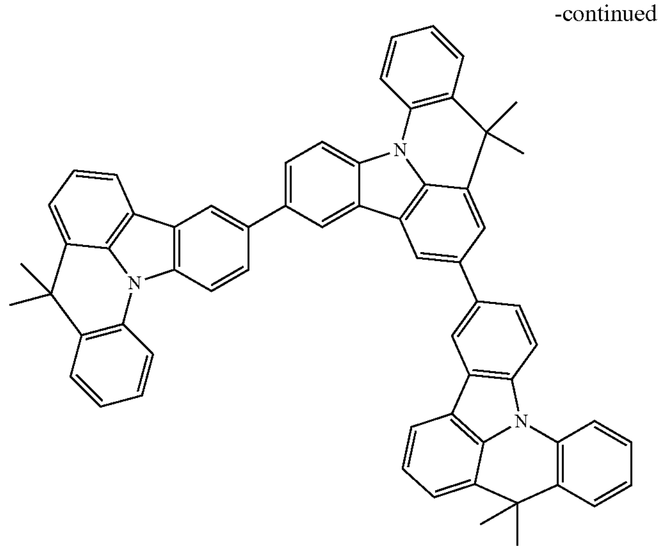
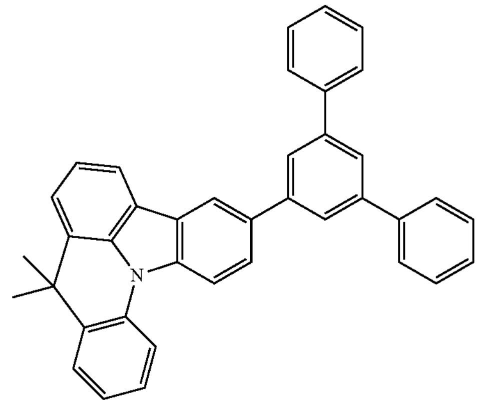
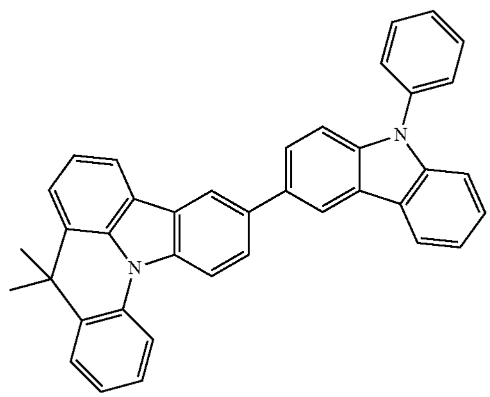
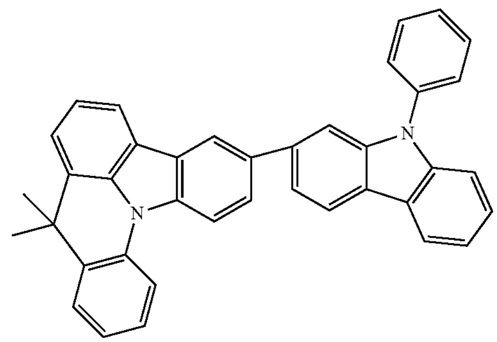
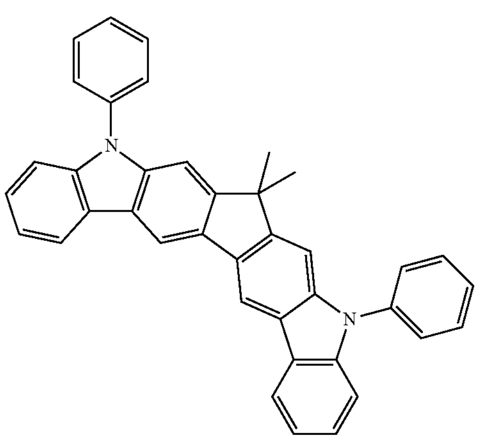
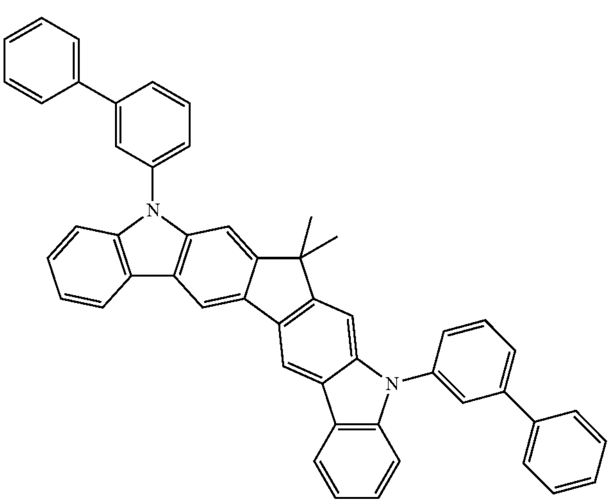

-continued
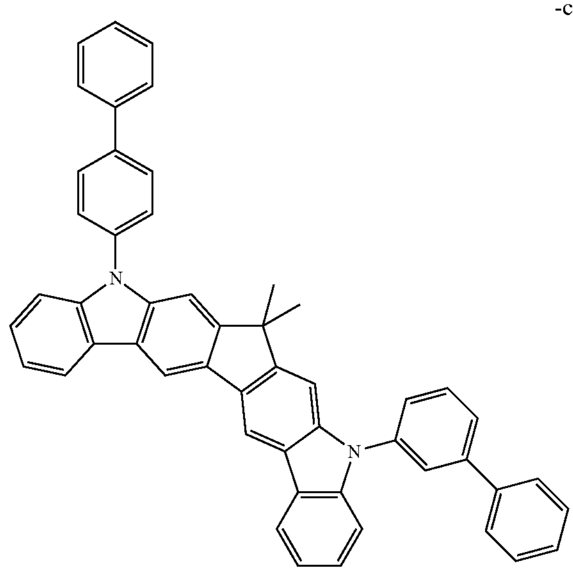
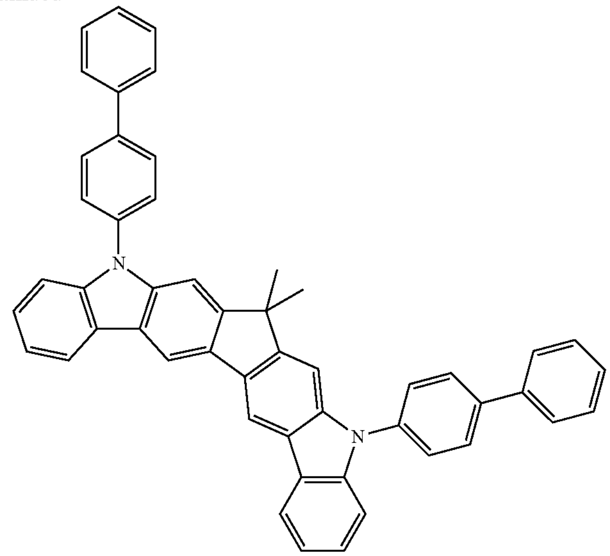
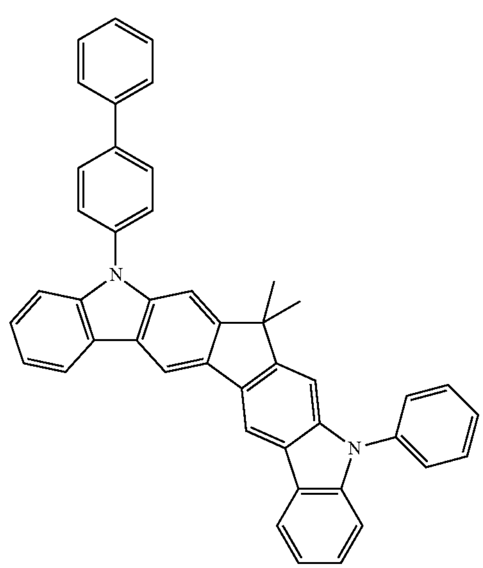
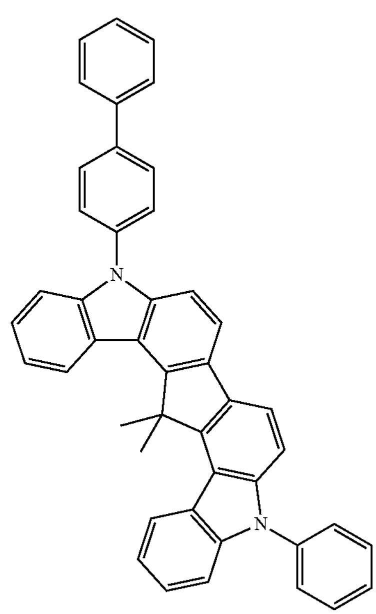

-continued
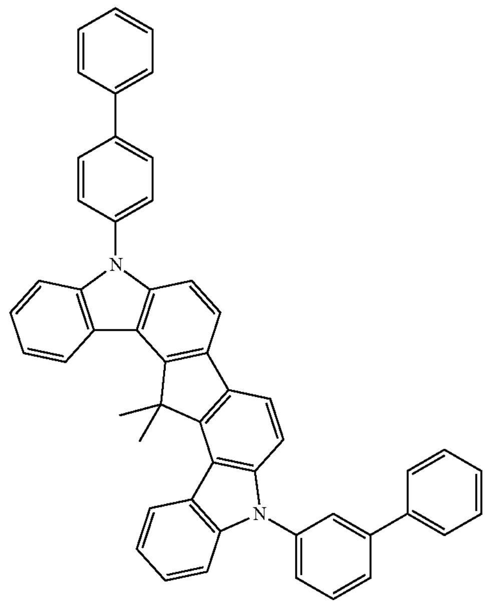
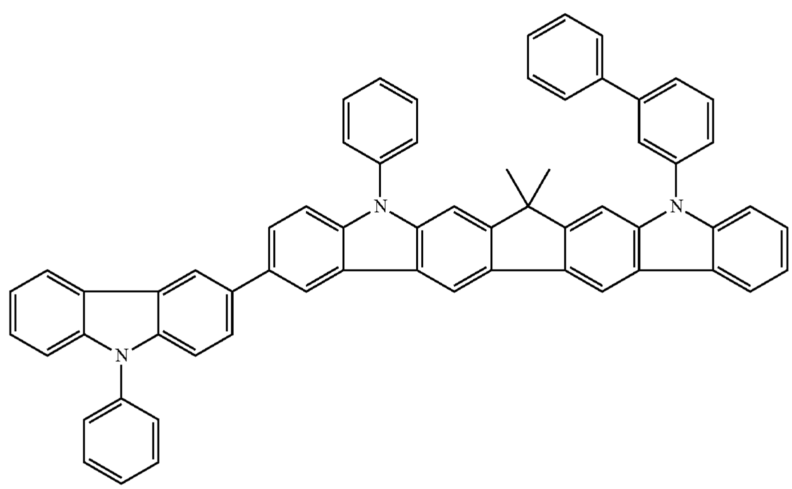
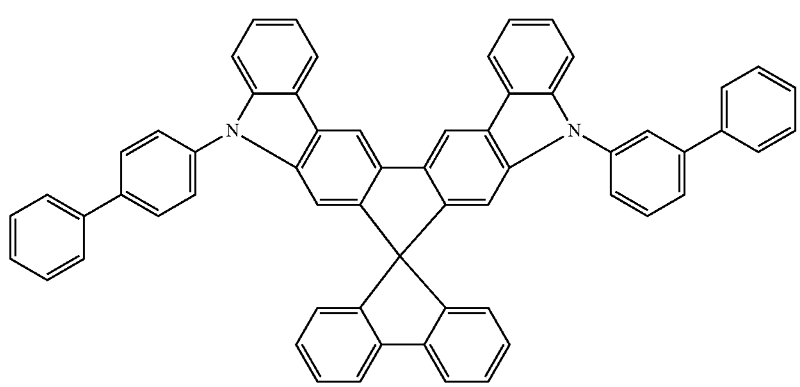

-continued
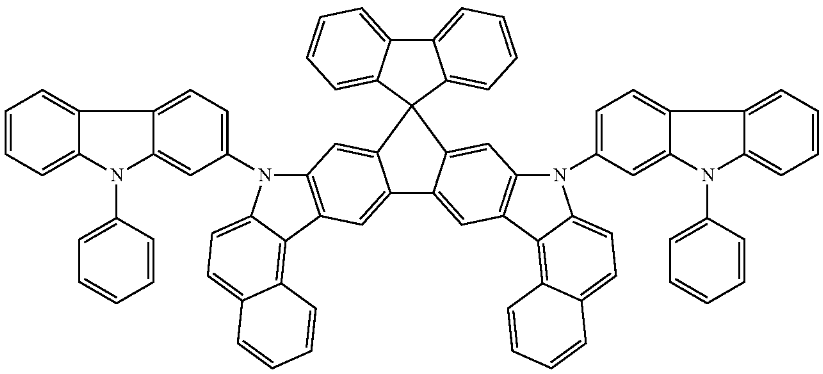
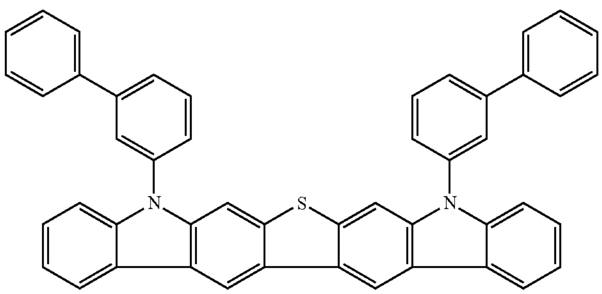
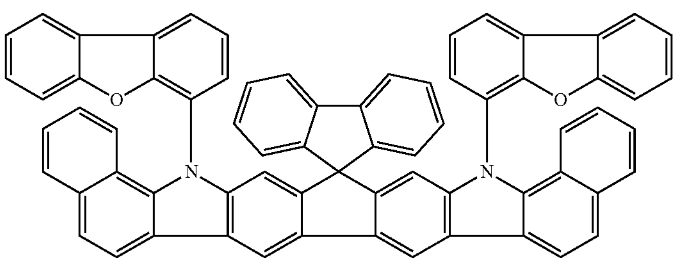
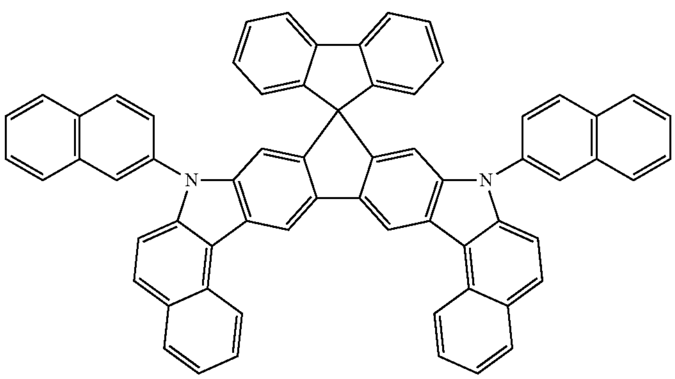
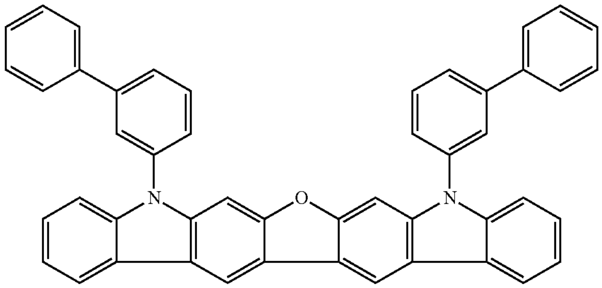

-continued
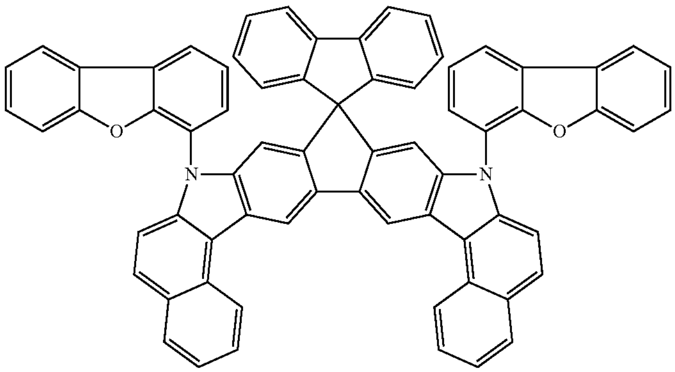
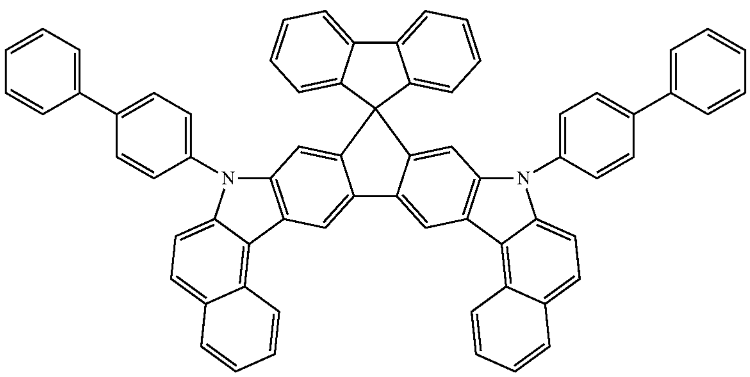
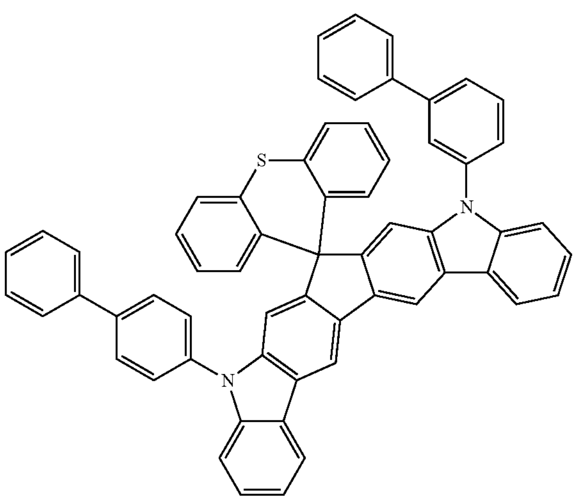
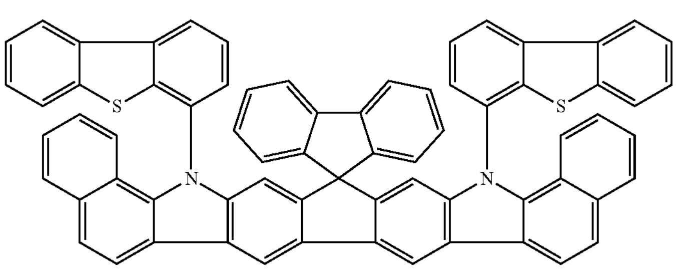

-continued
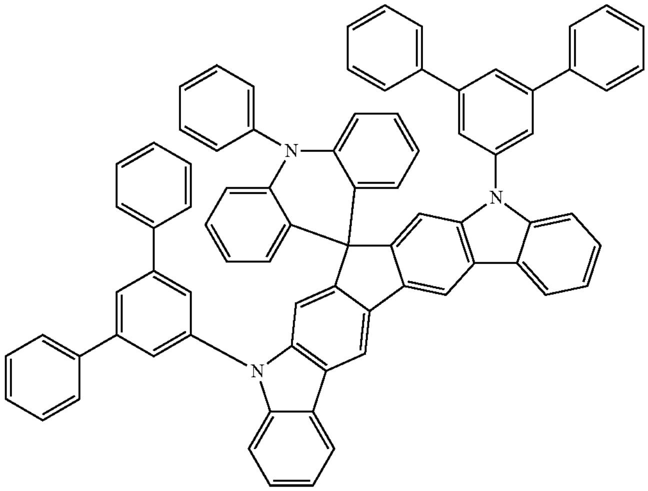
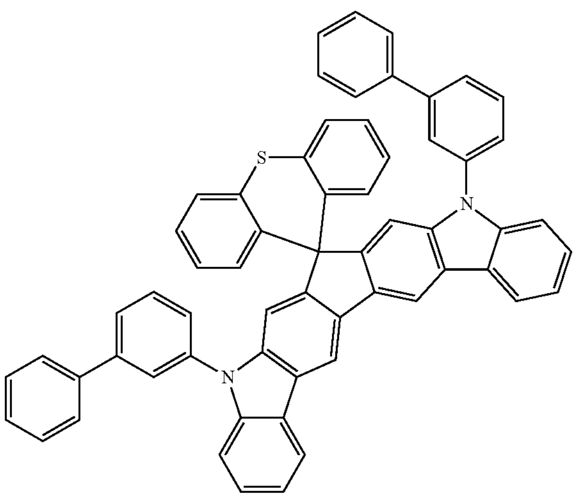
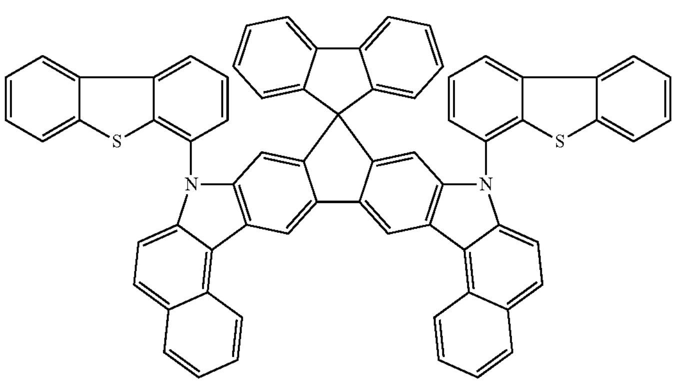

-continued
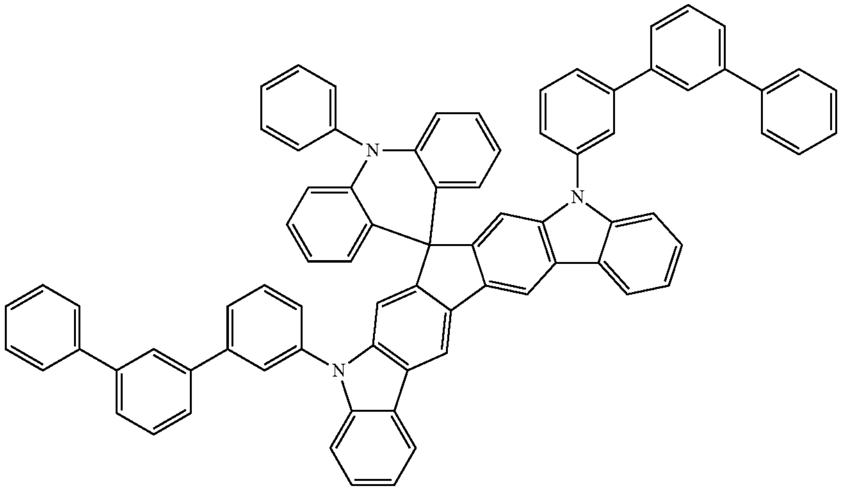
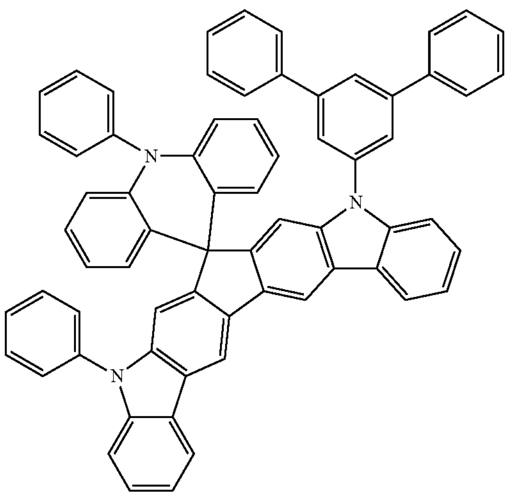
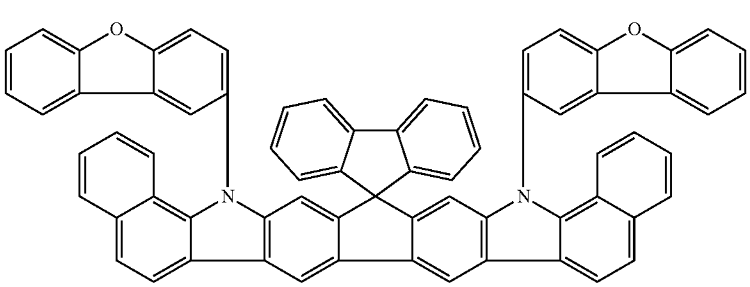

-continued
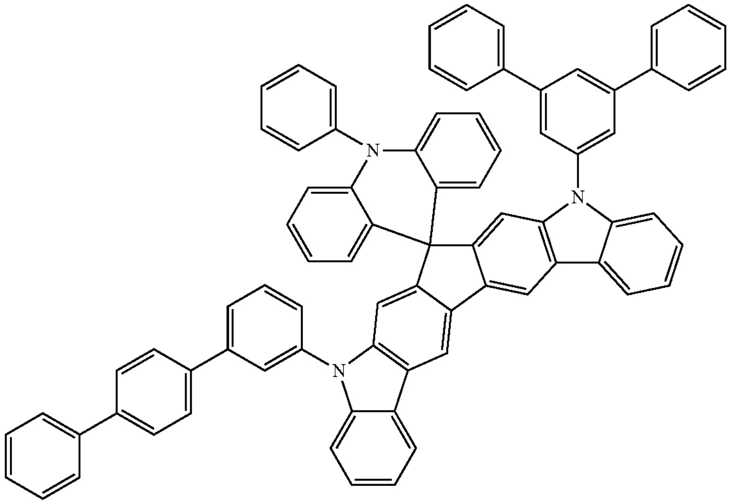
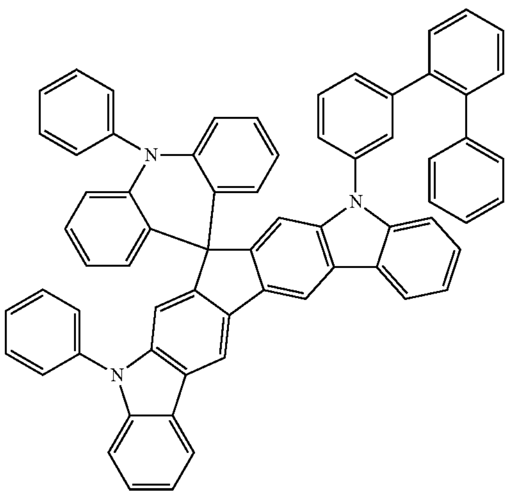
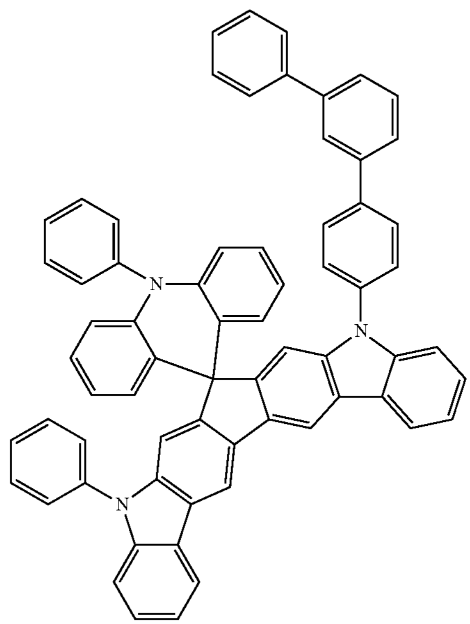
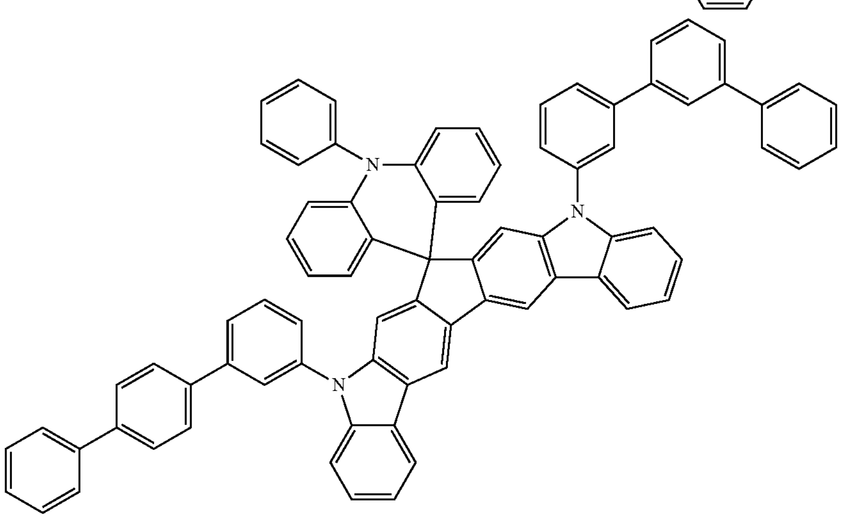

-continued
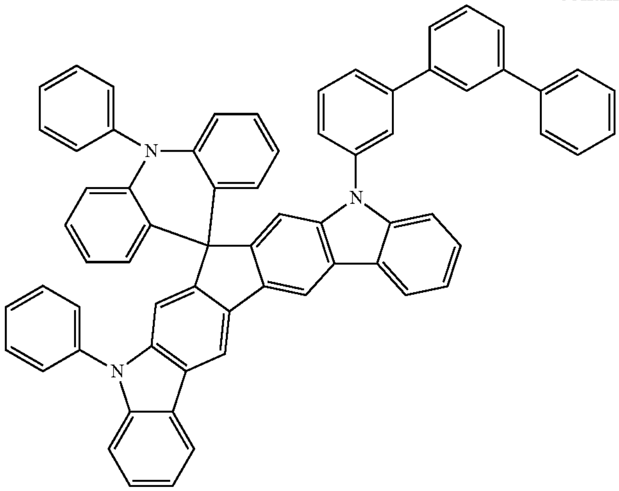
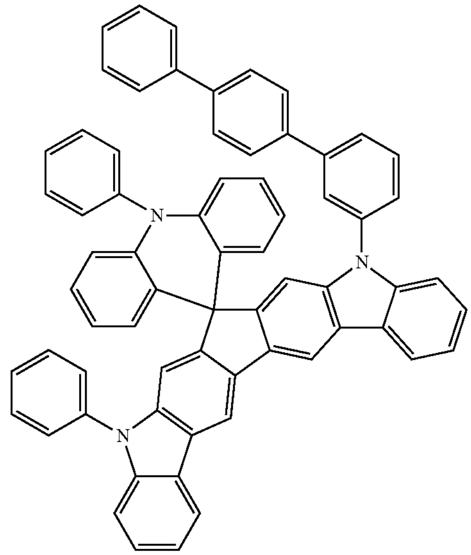
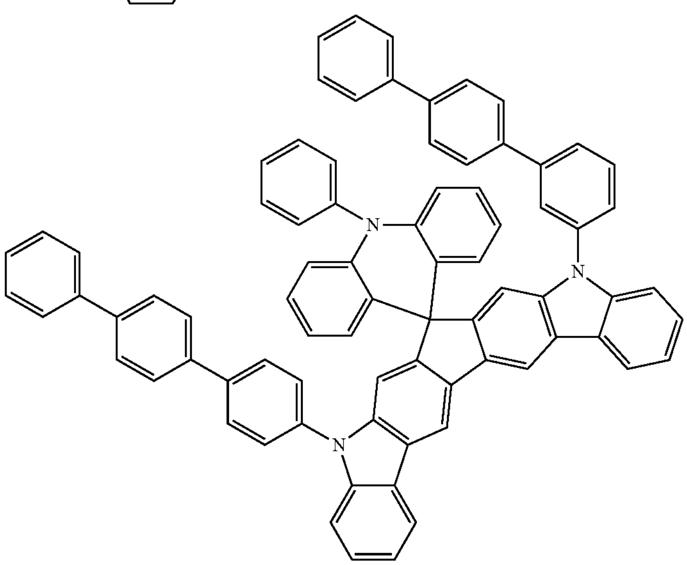
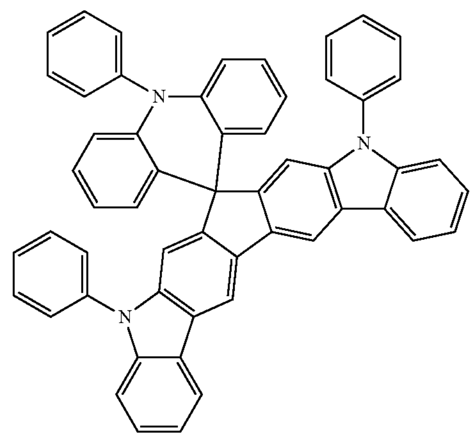
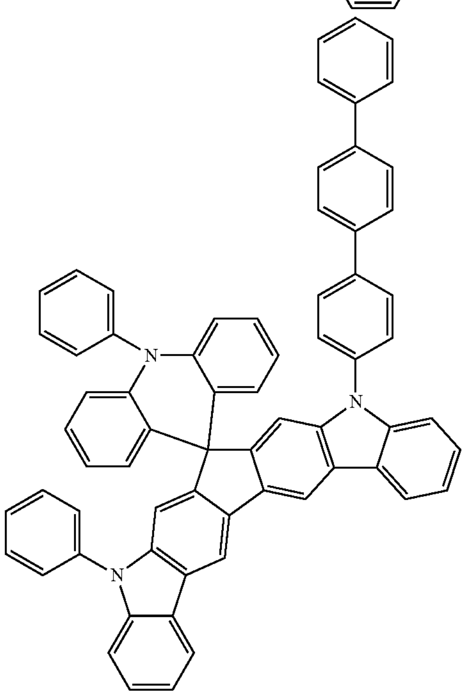
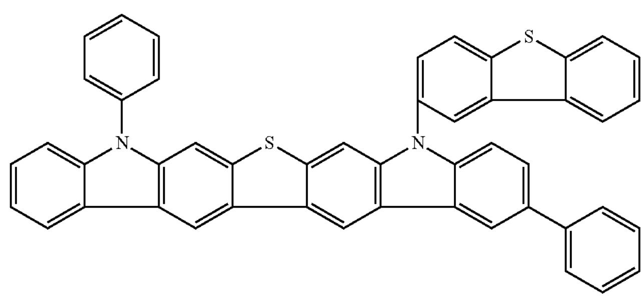

-continued
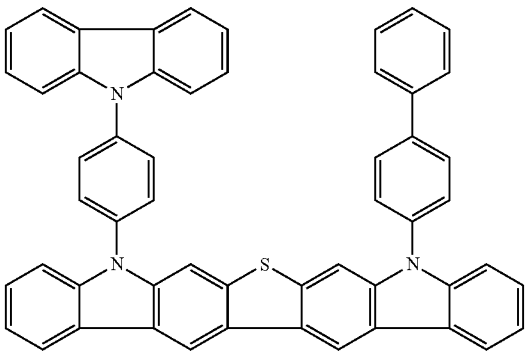
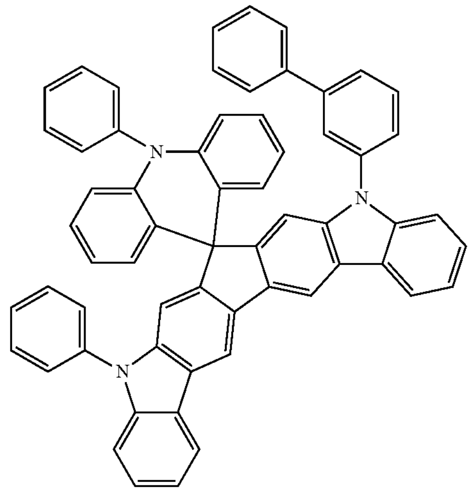
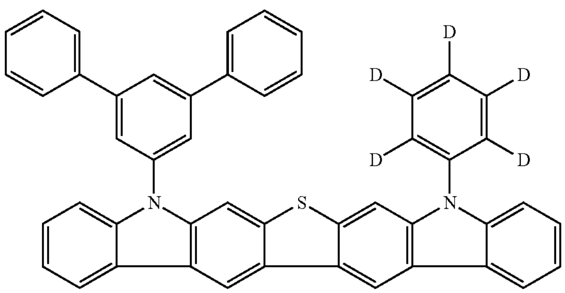
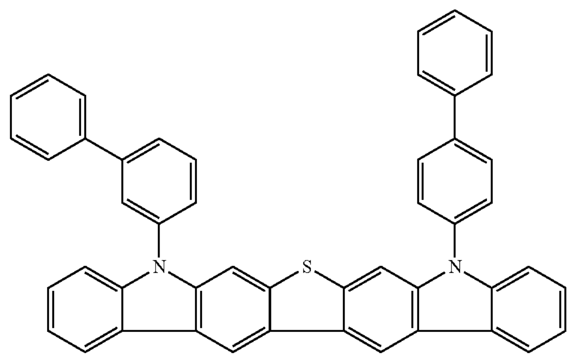
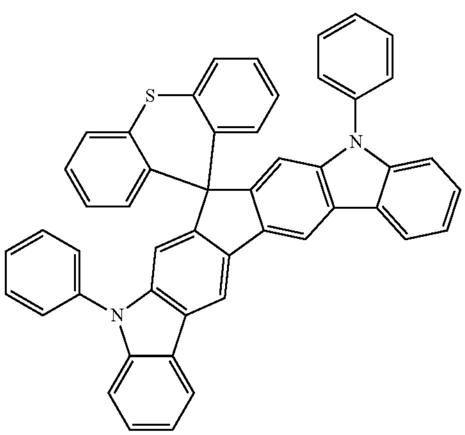
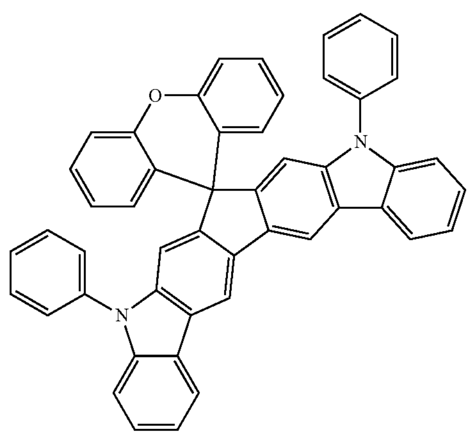
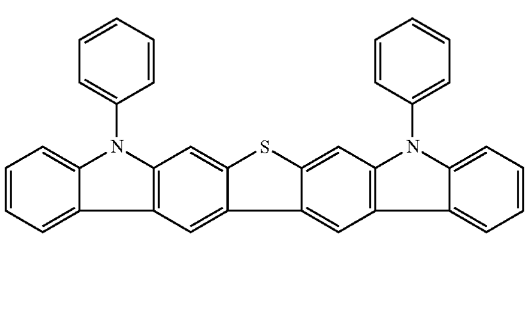
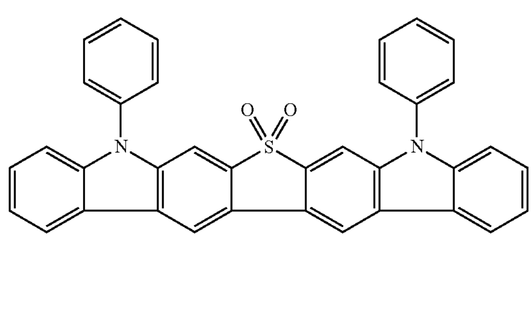

-continued
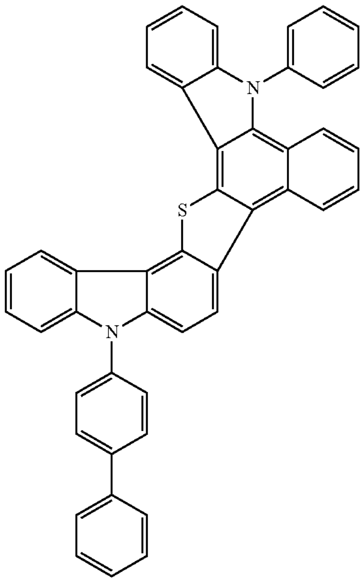
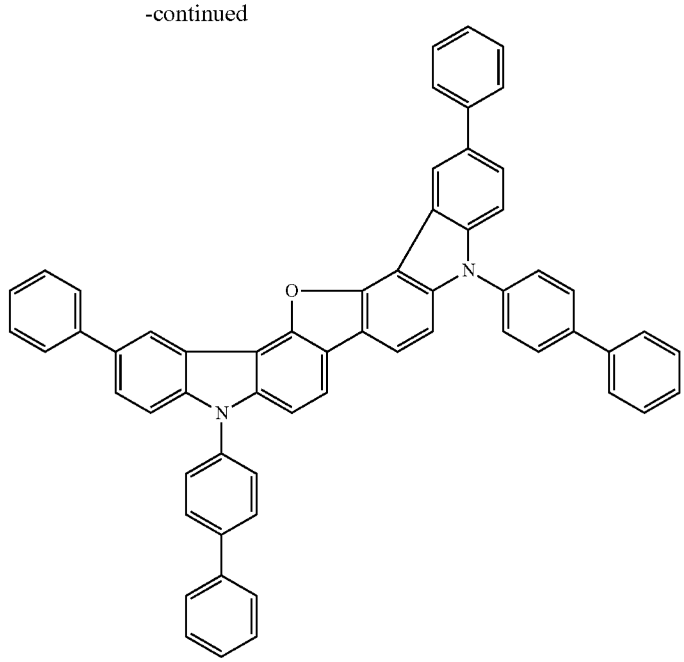
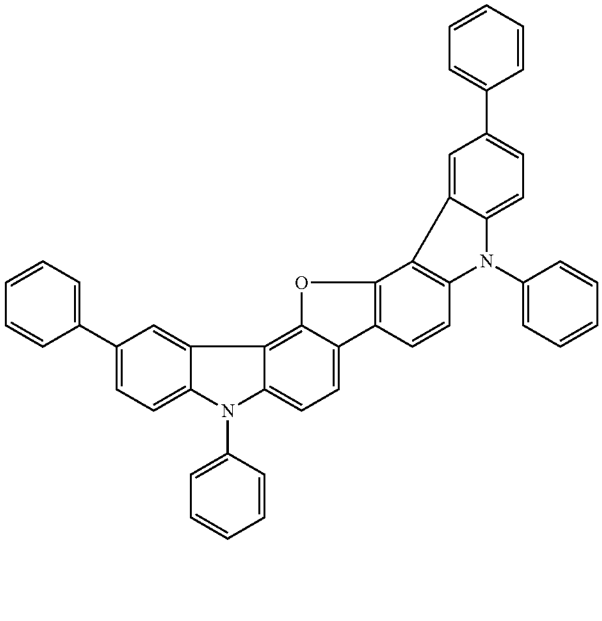
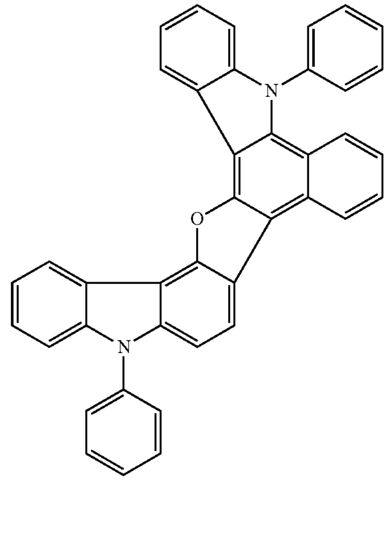

-continued
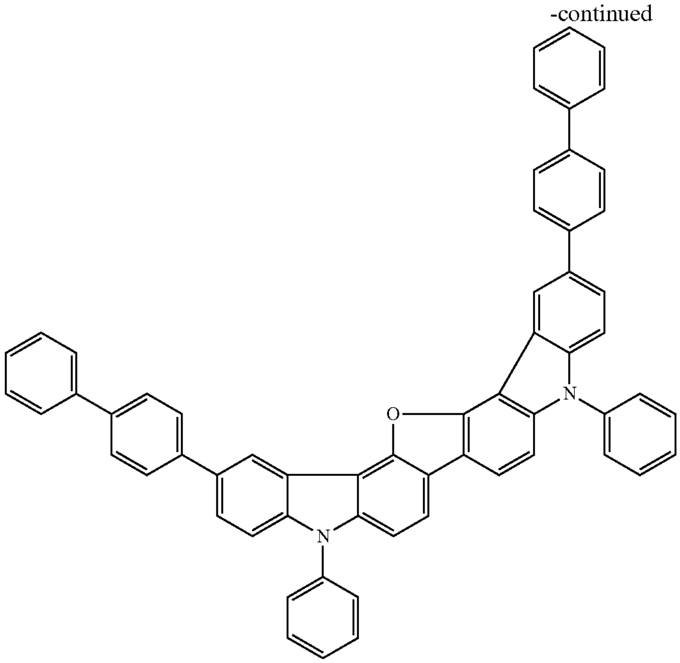
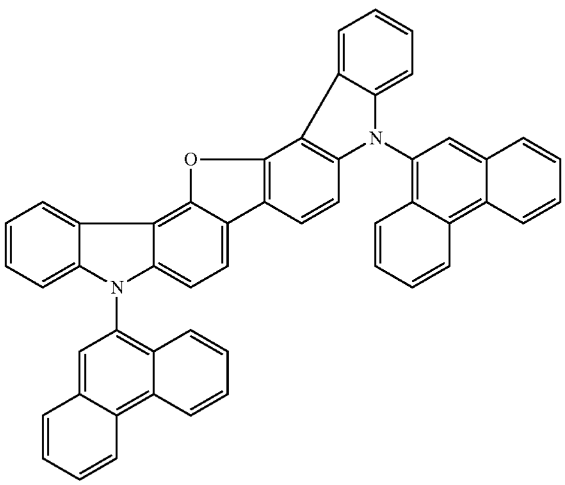
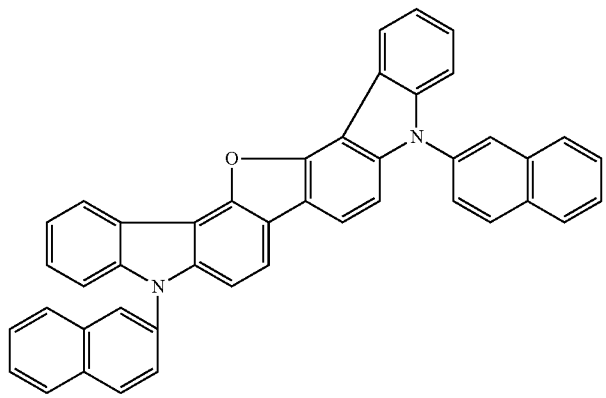
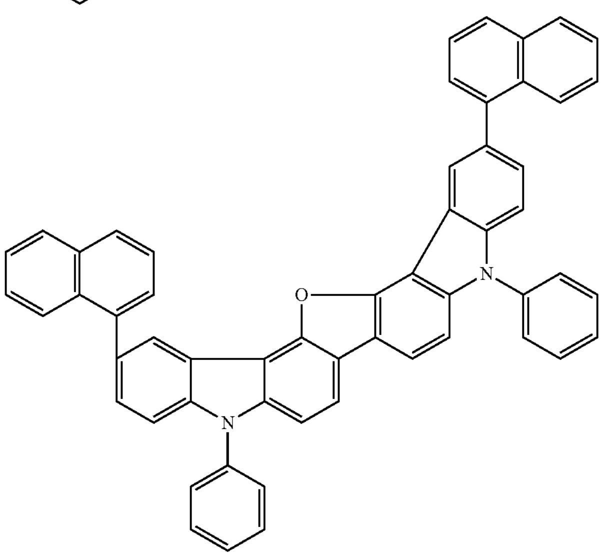

-continued
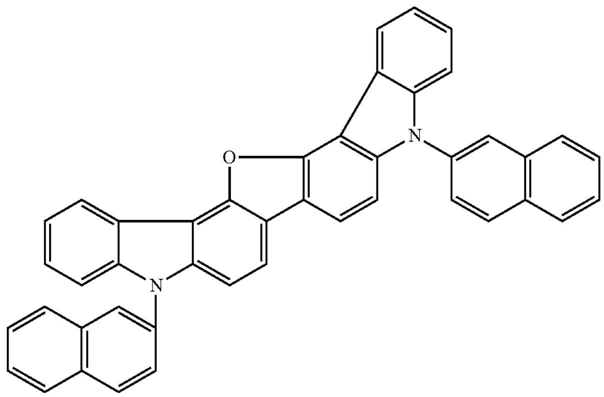
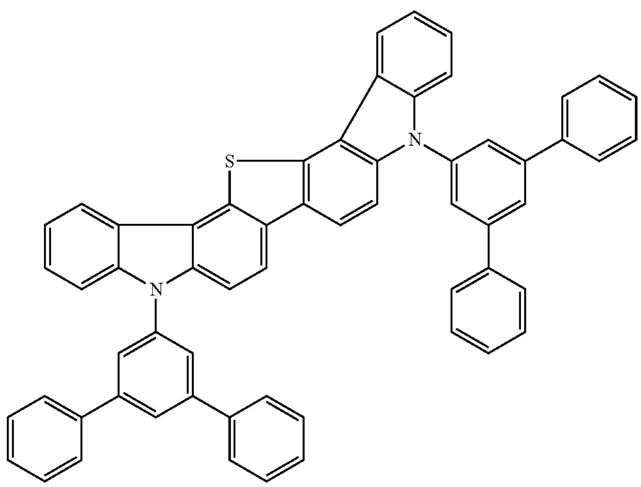
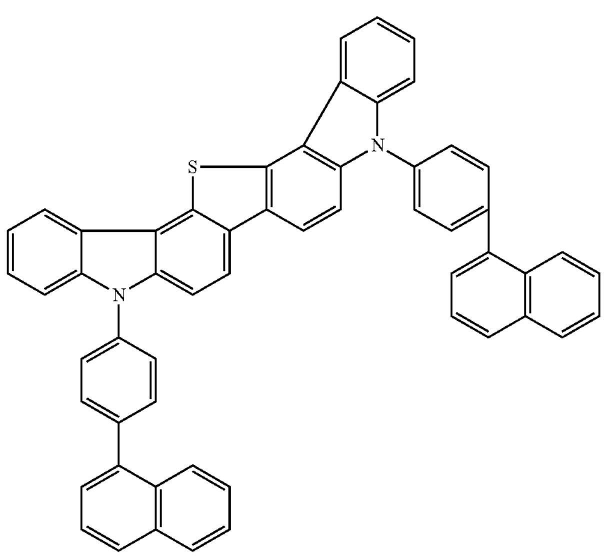
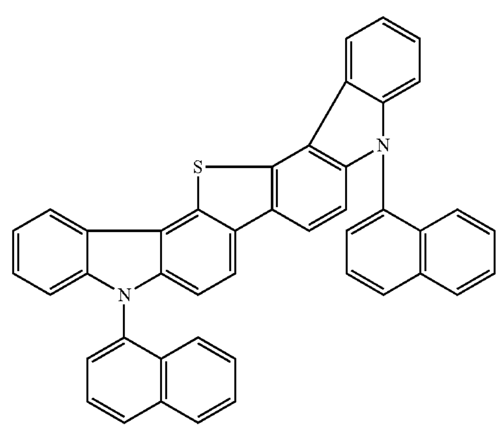

-continued
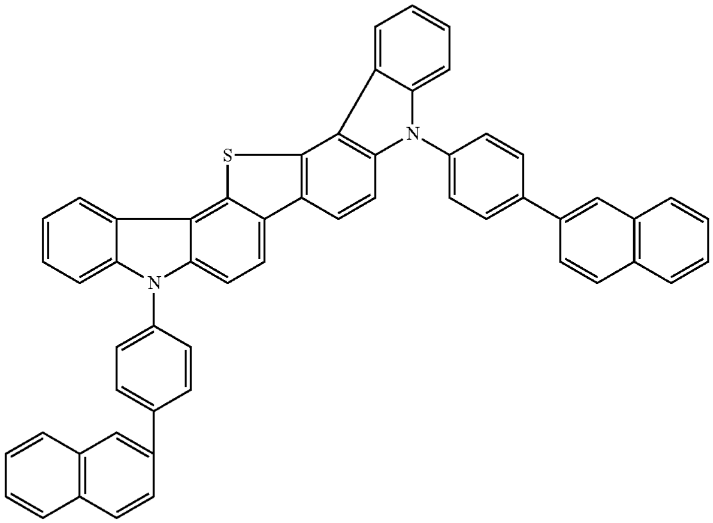
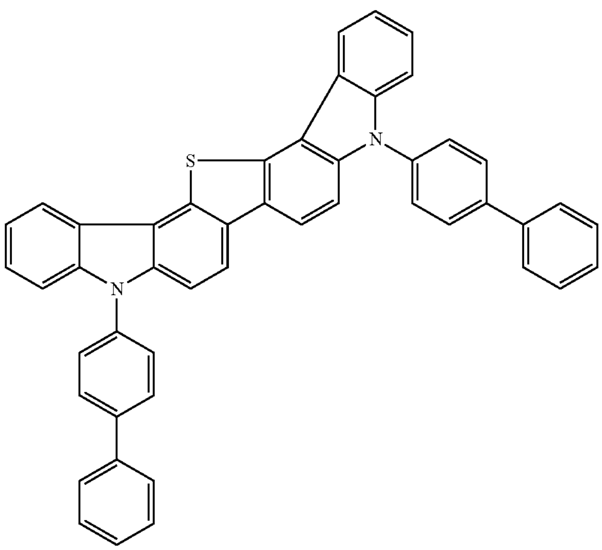
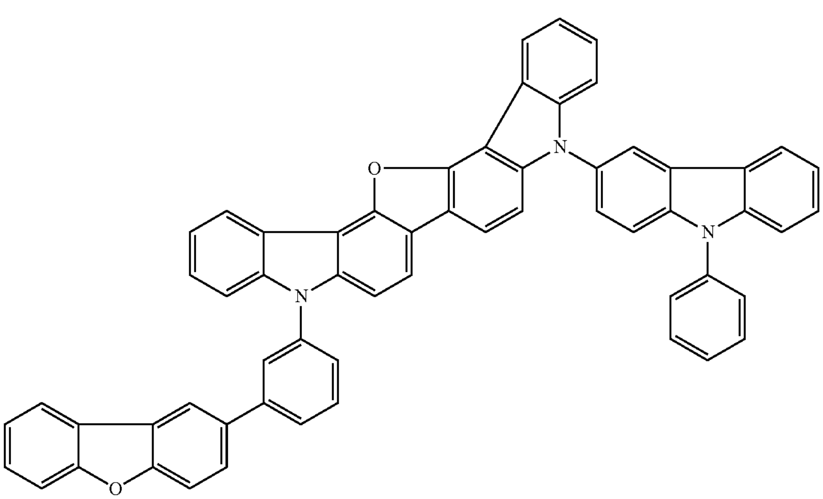

-continued
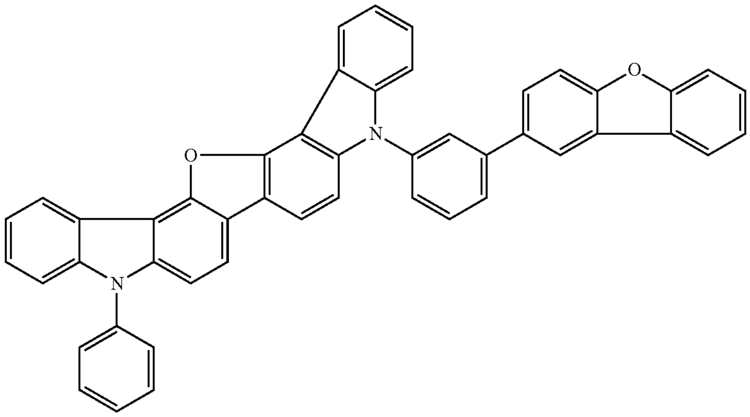
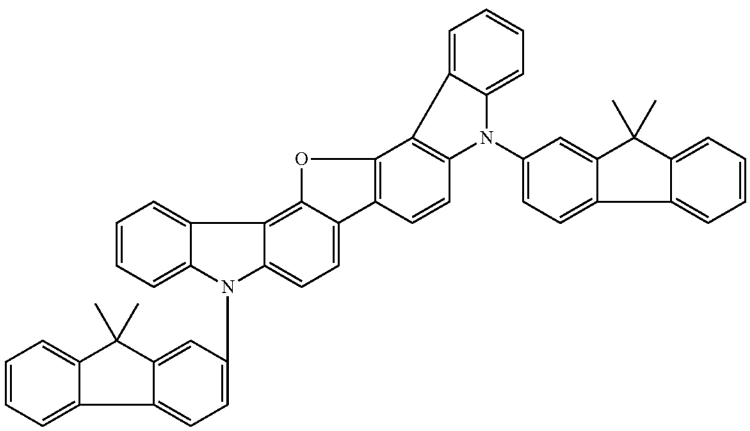
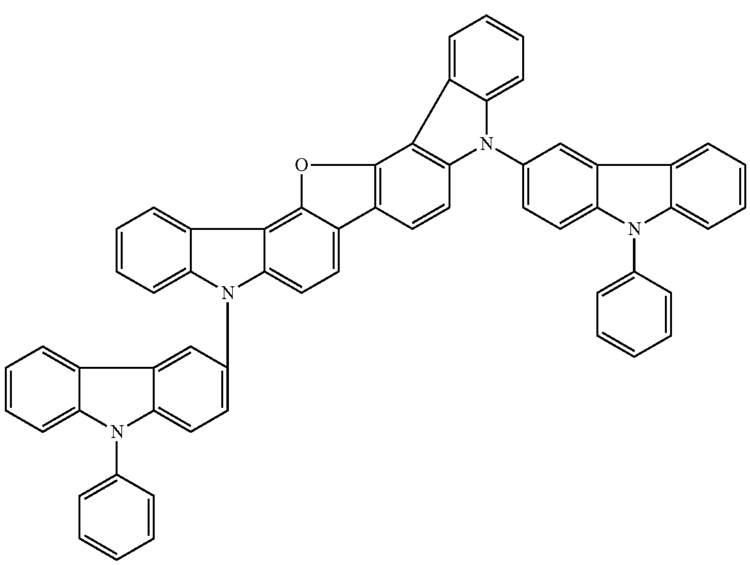

Examples of biscarbazole derivatives which can be used as hole-transporting matrix materials:
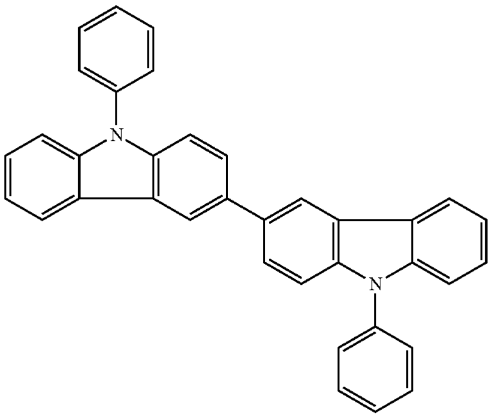
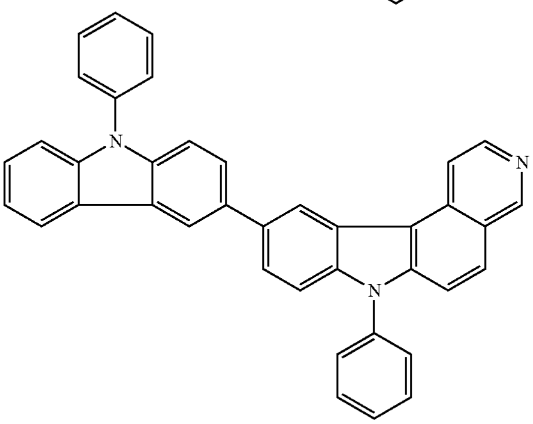
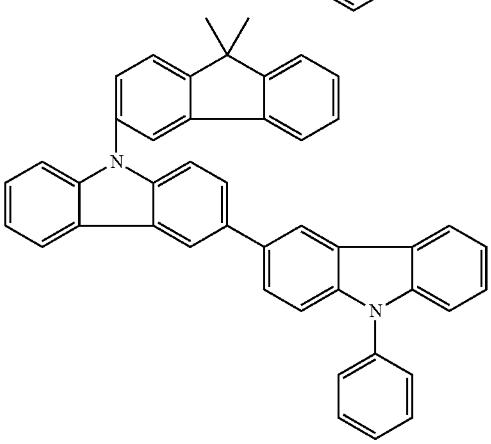
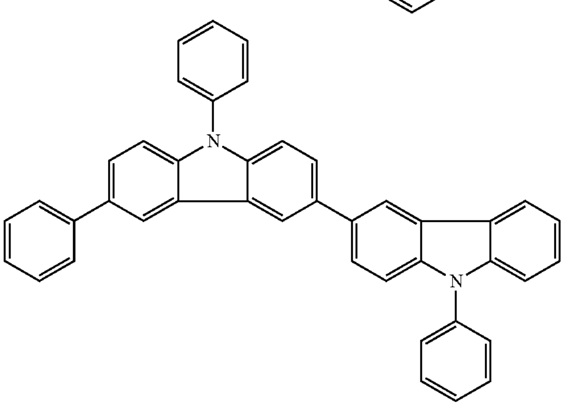
-continued
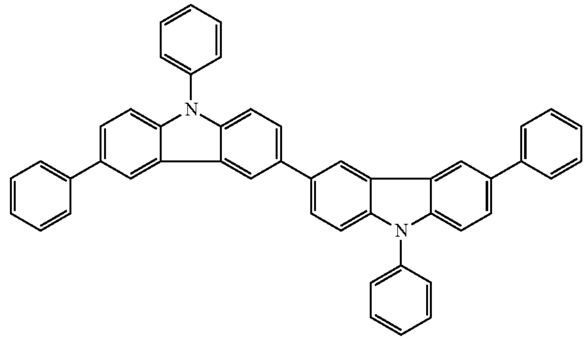
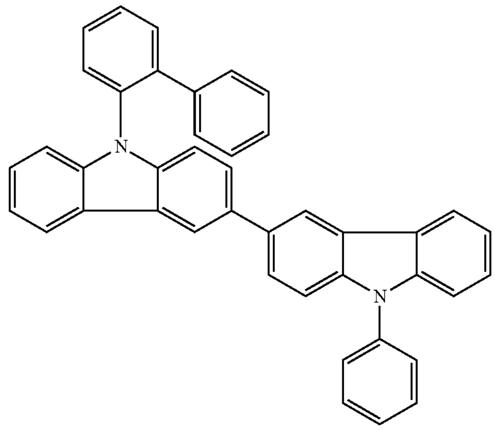
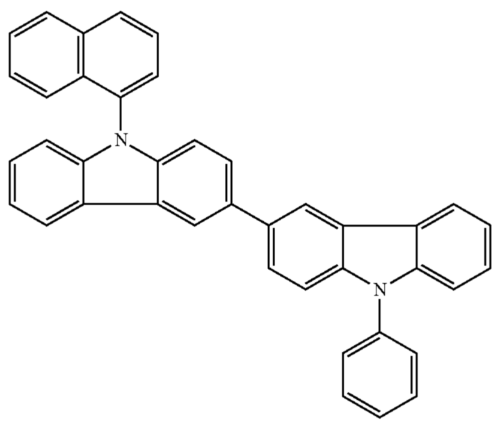
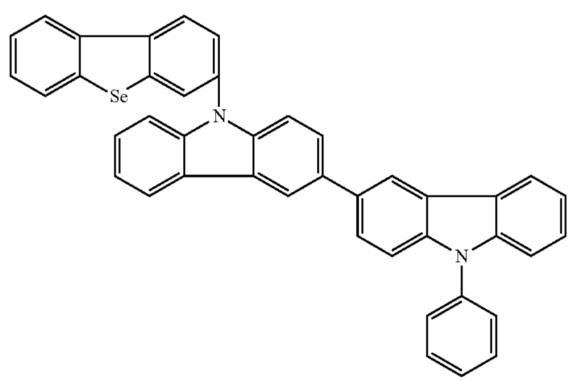

-continued
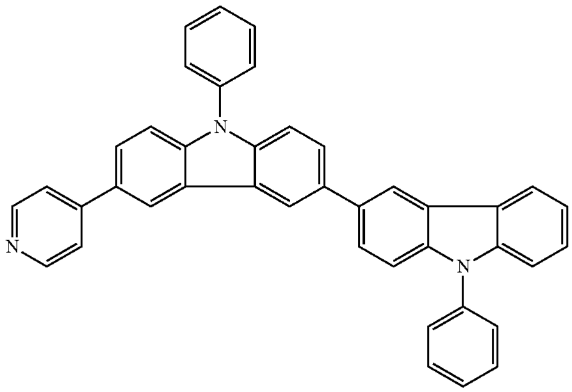
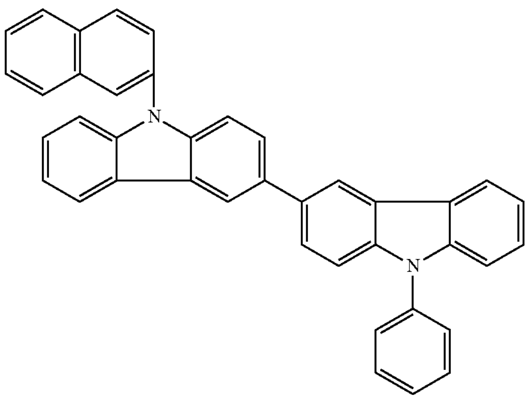
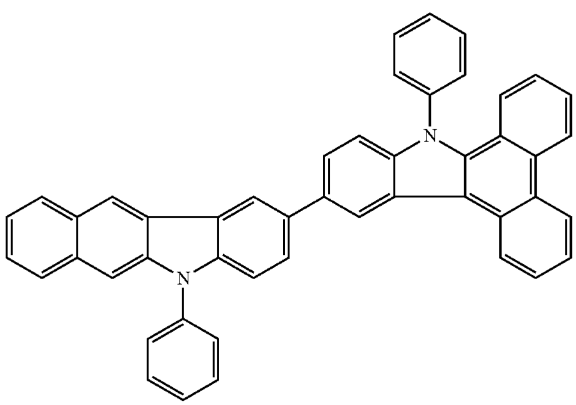
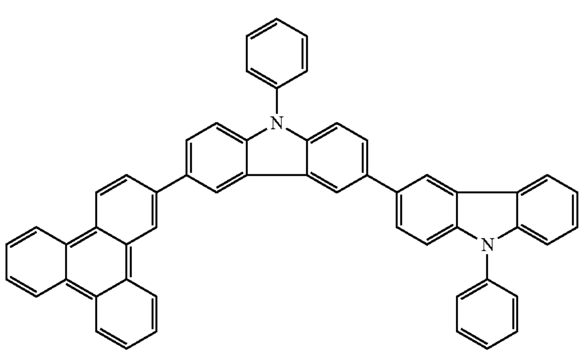
-continued
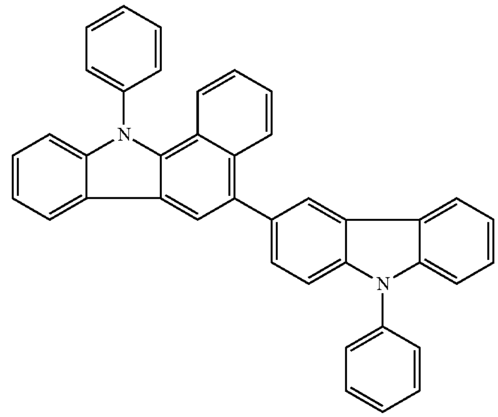
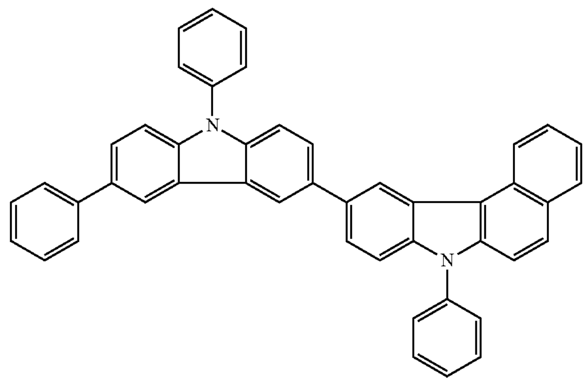
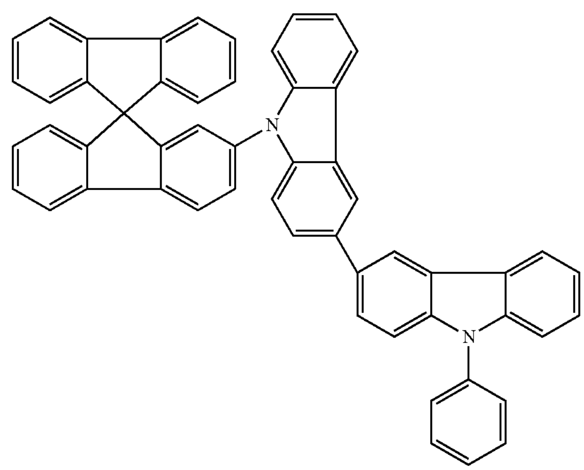
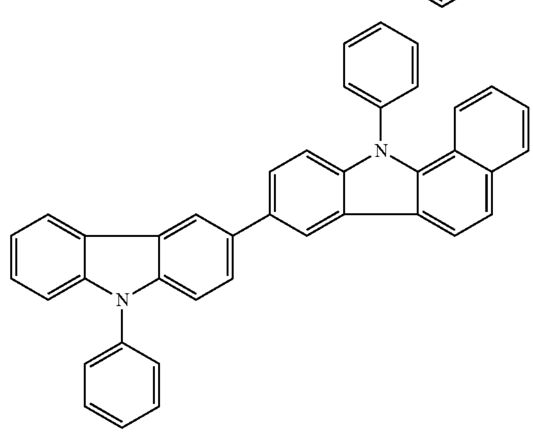

-continued
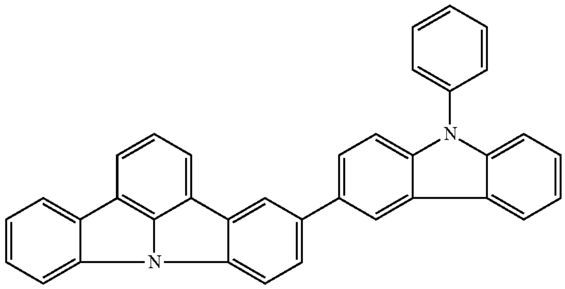
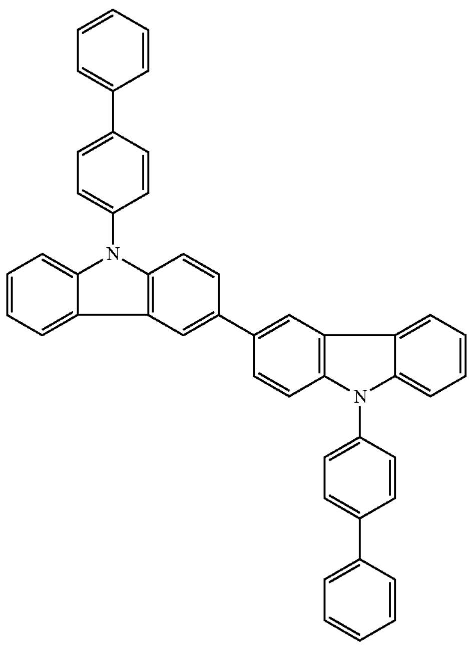
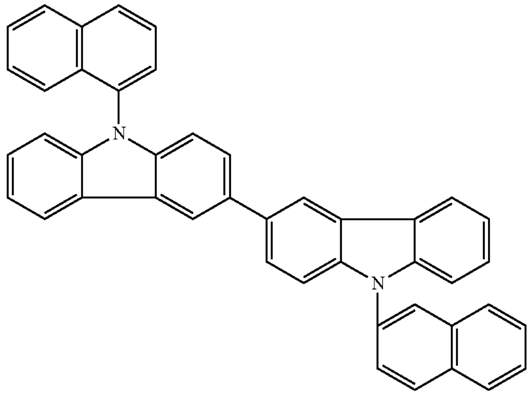
-continued
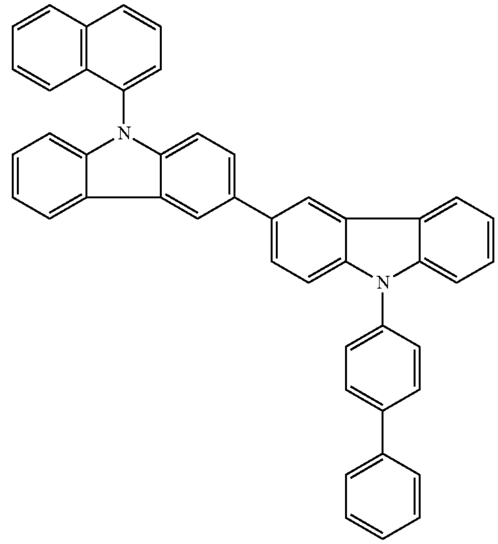
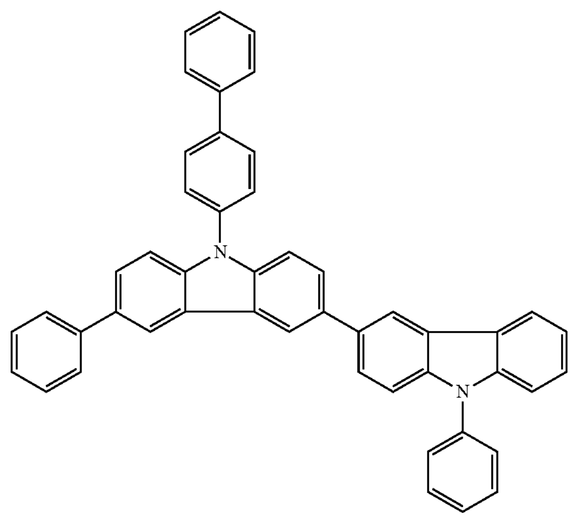
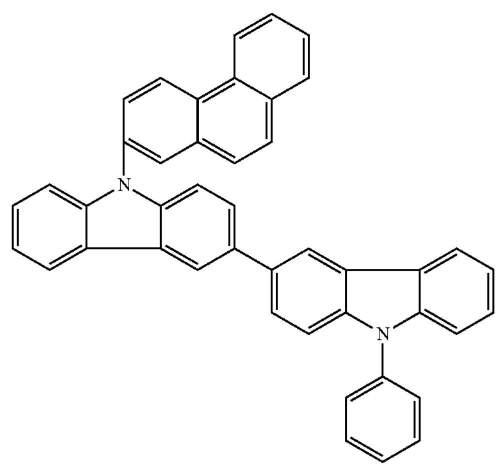

-continued
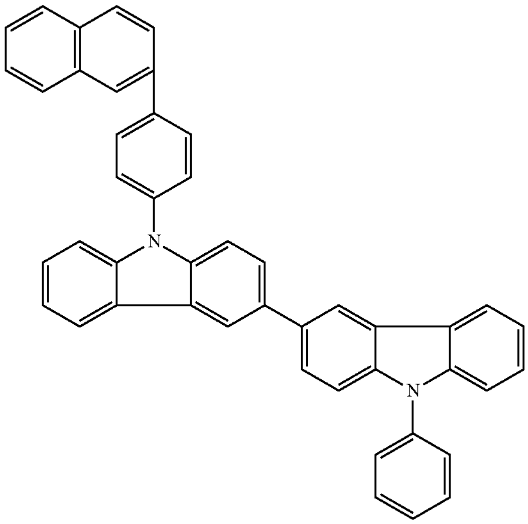
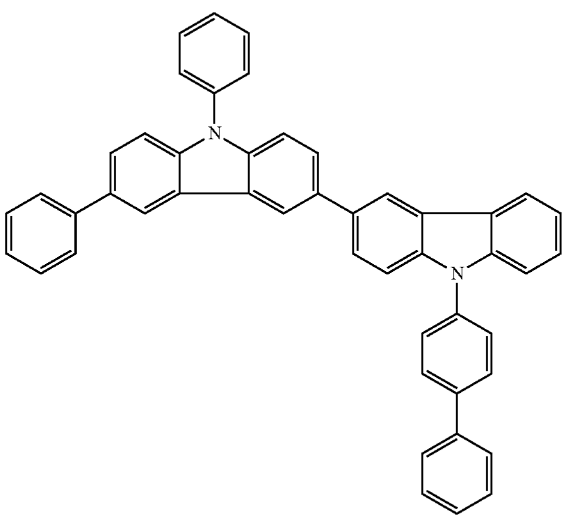
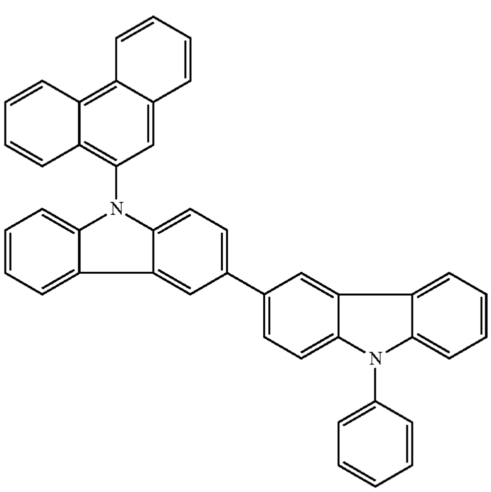
-continued
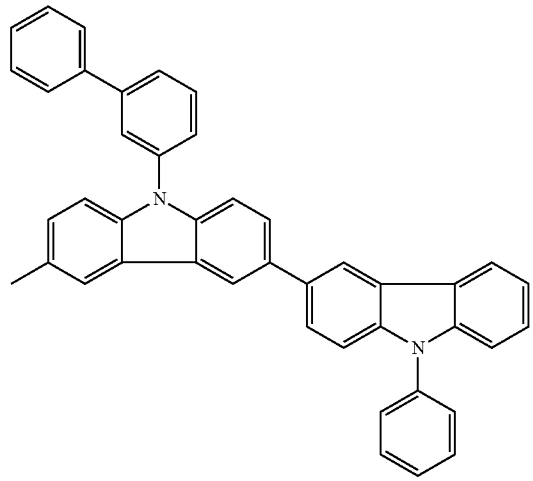
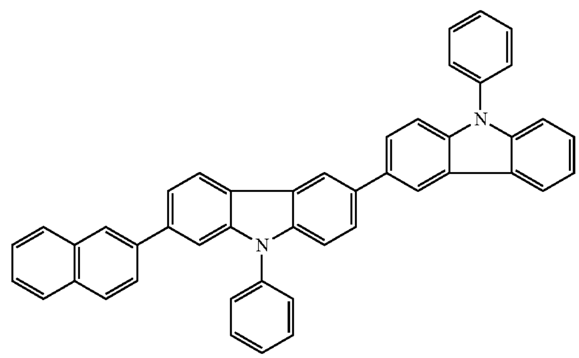
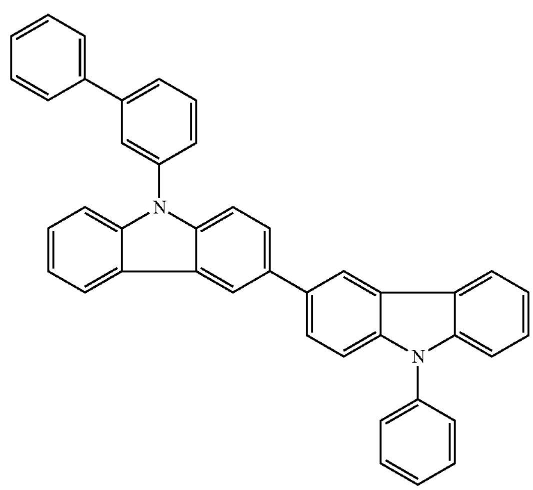

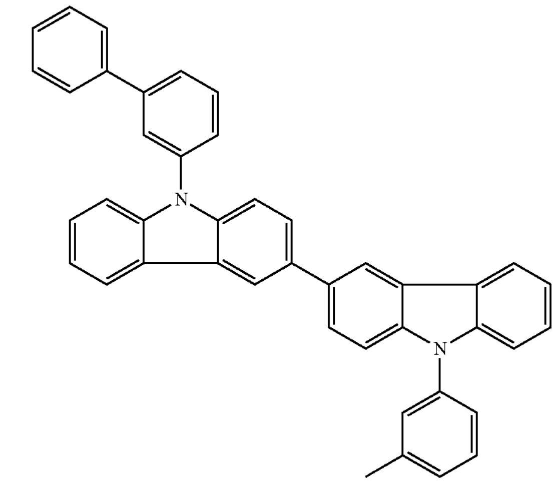
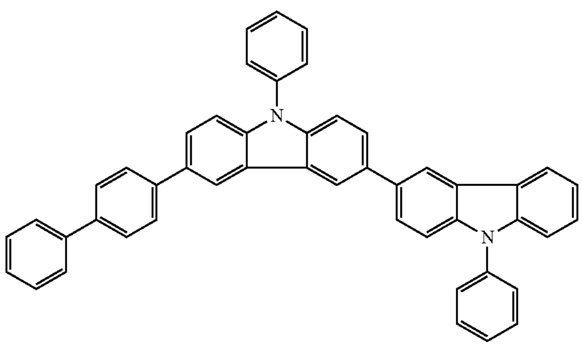
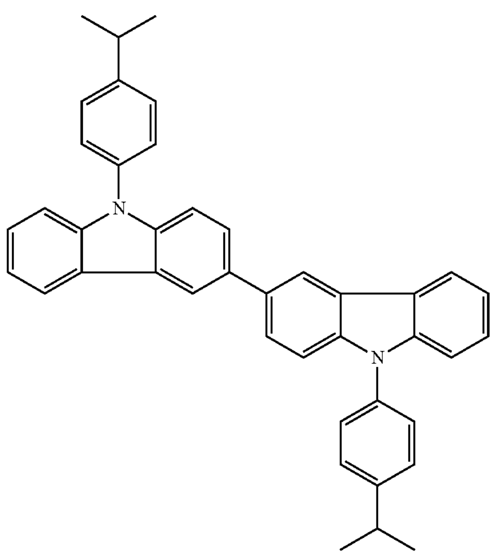
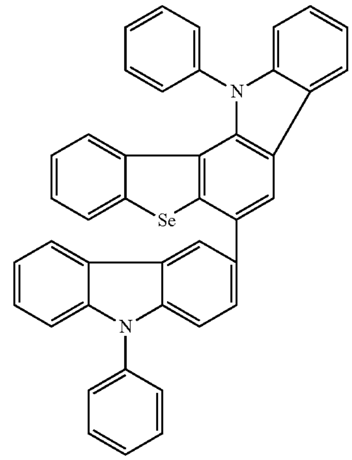
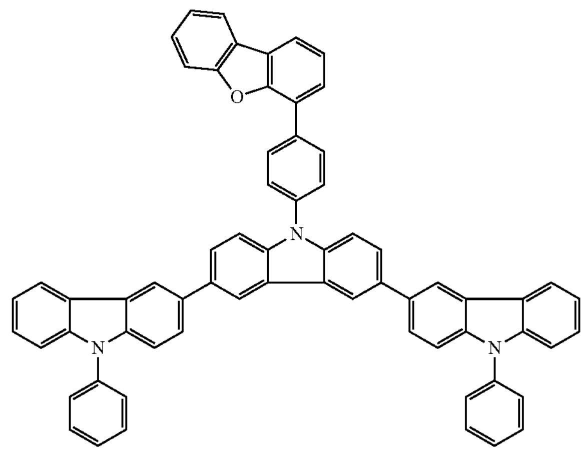
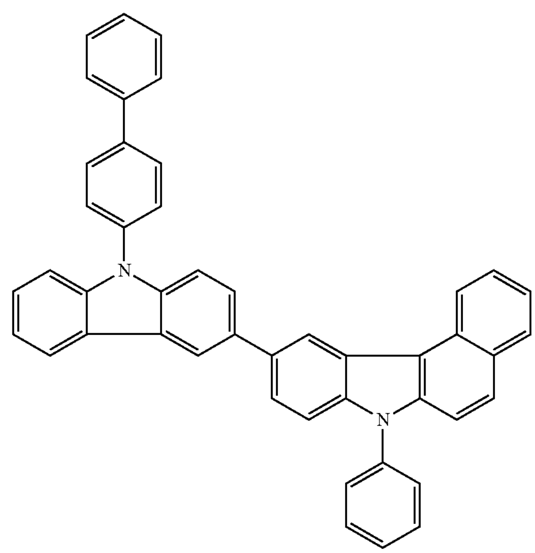

-continued
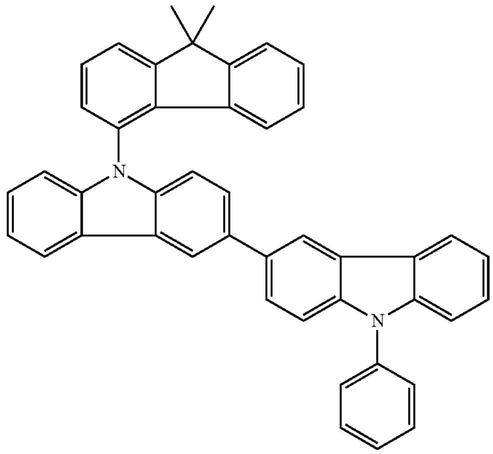
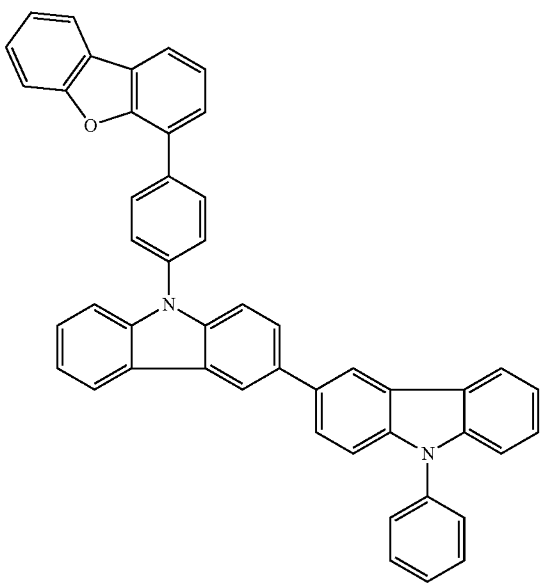
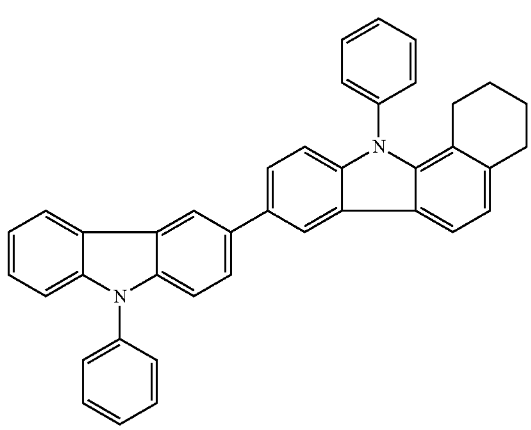
-continued
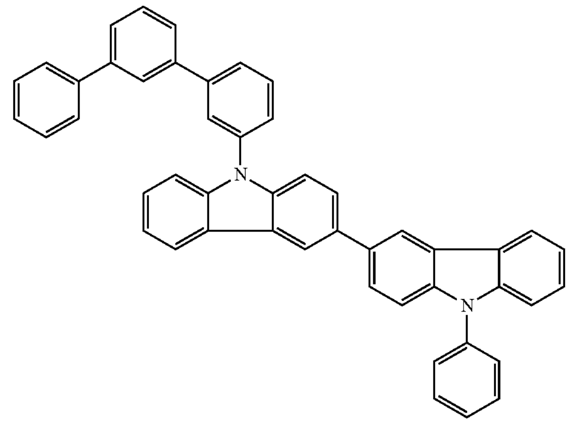
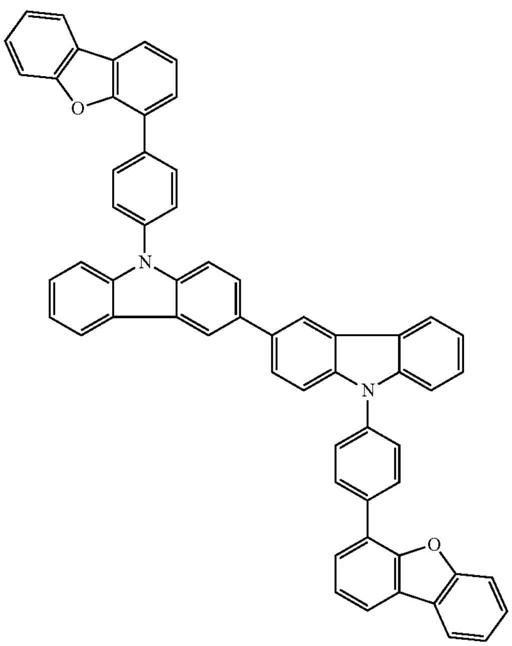
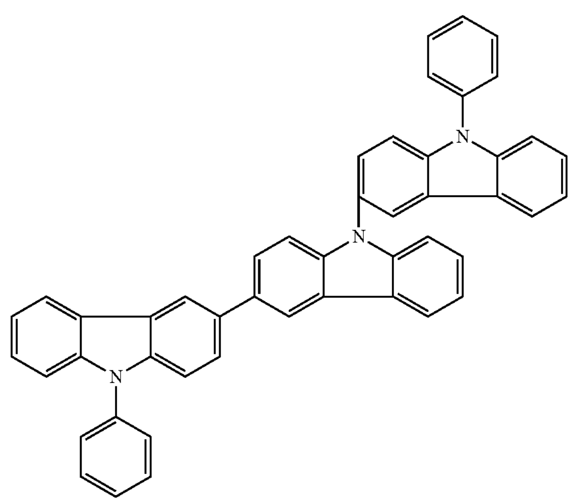

-continued
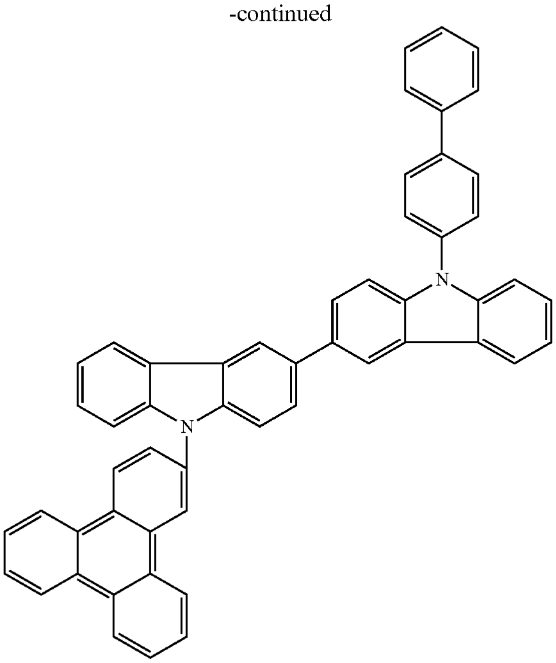
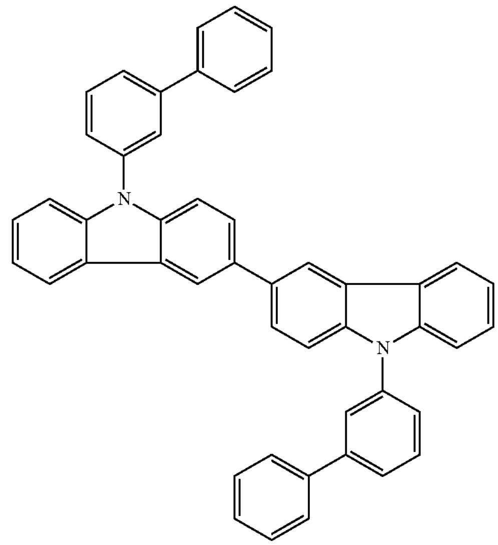
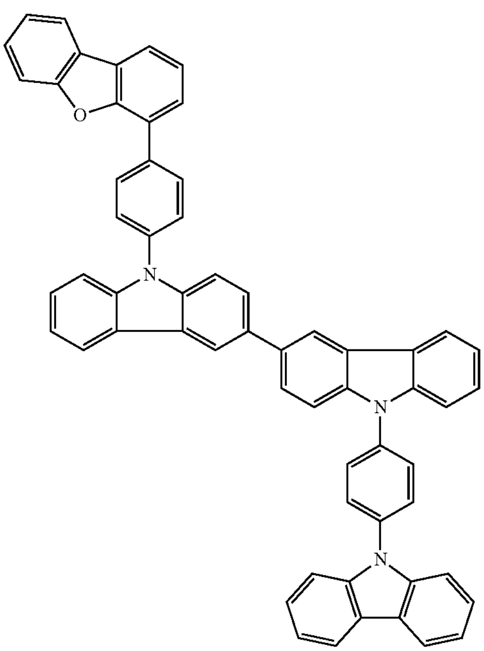
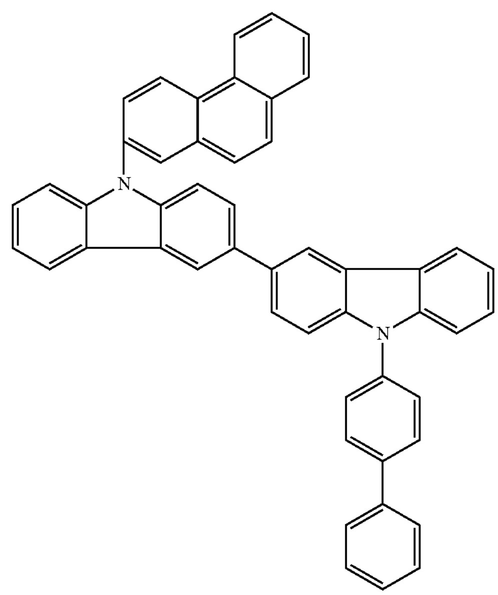
-continued

-continued
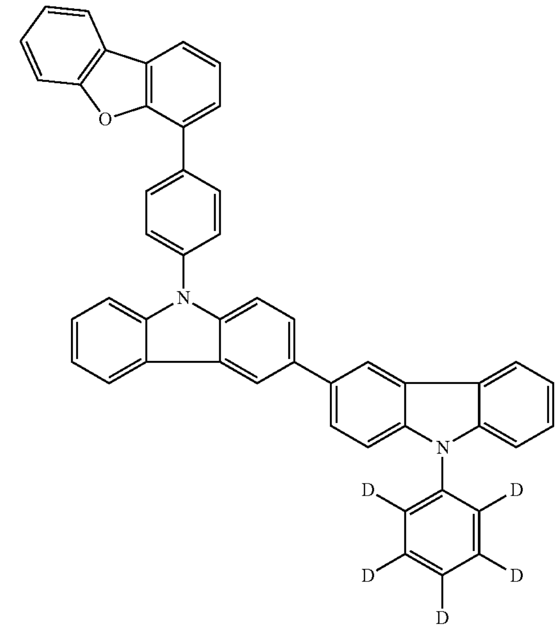
-continued
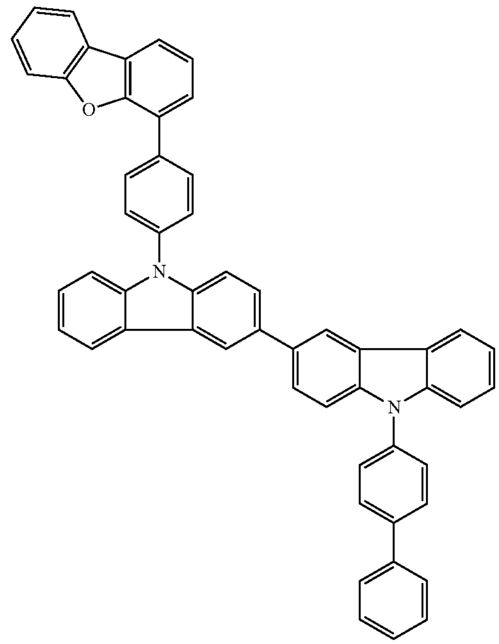
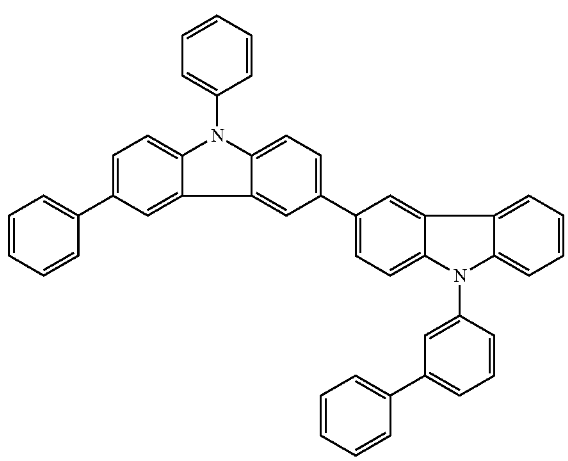
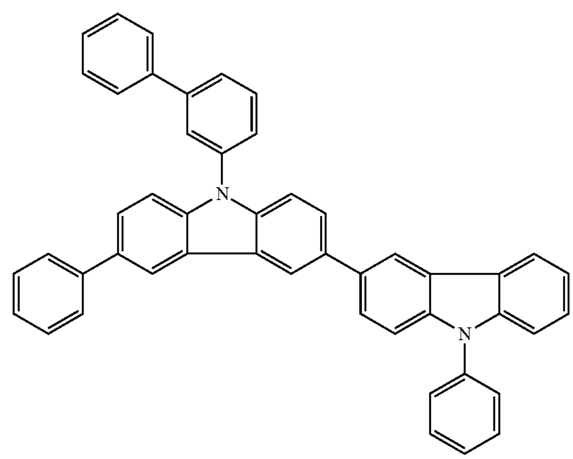
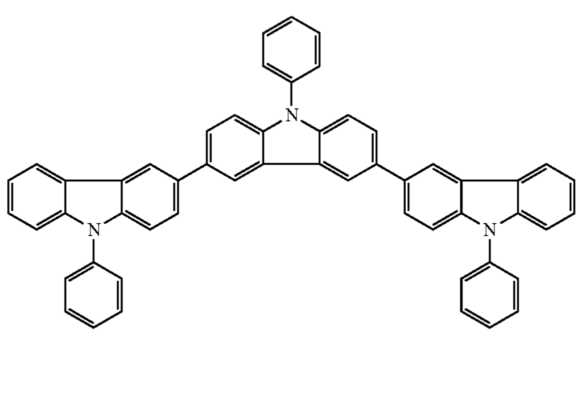
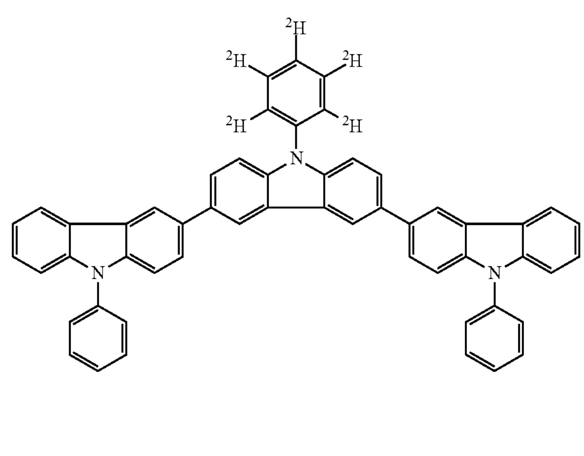

-continued
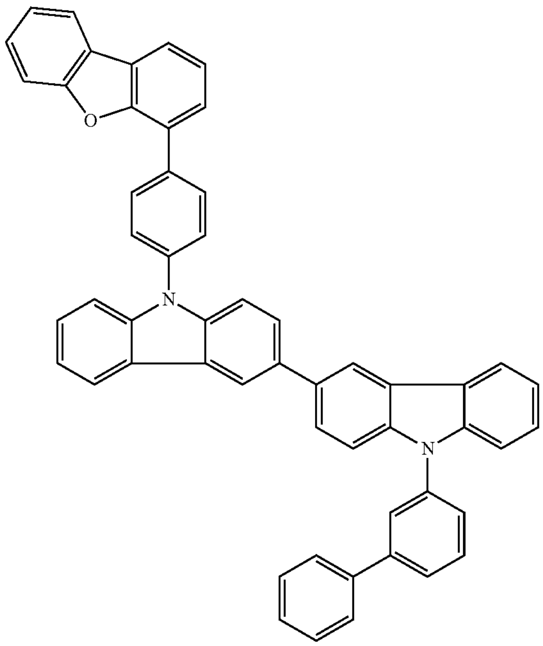
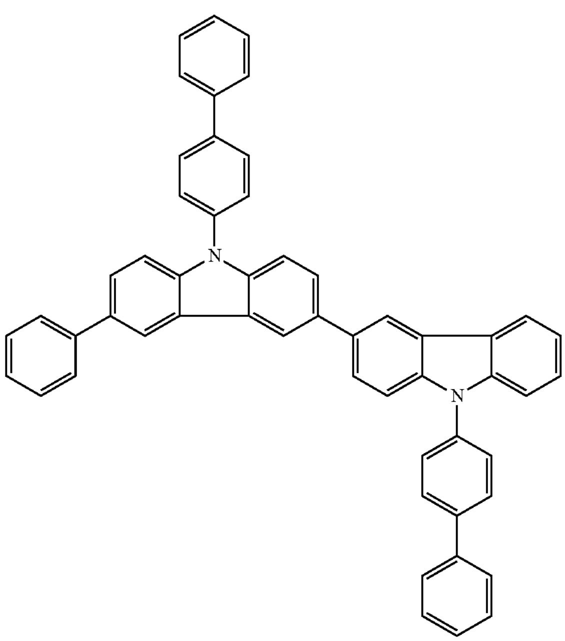
-continued
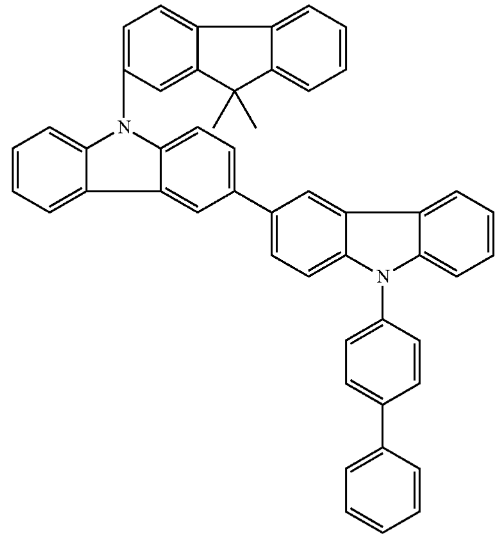
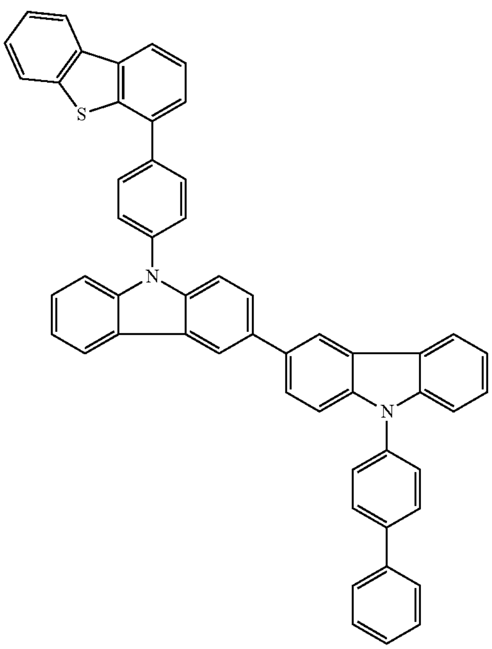
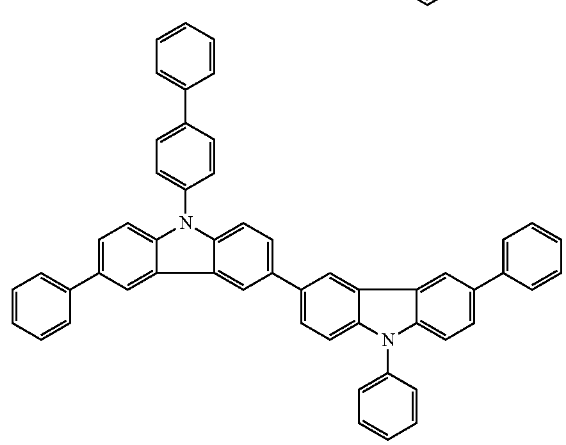

-continued
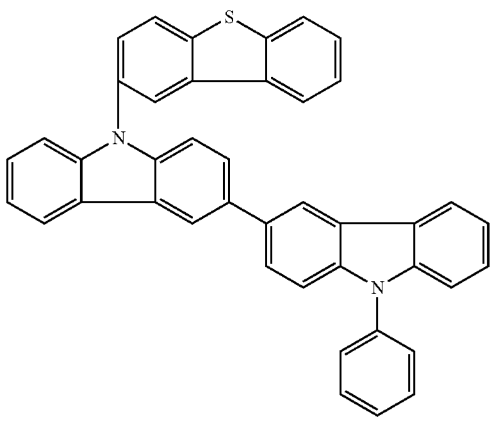
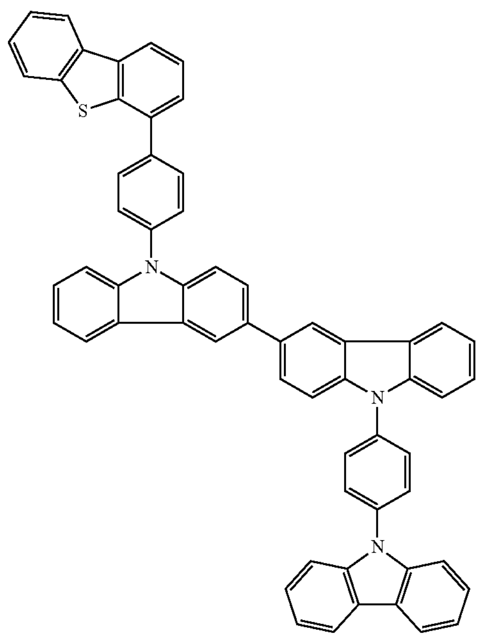
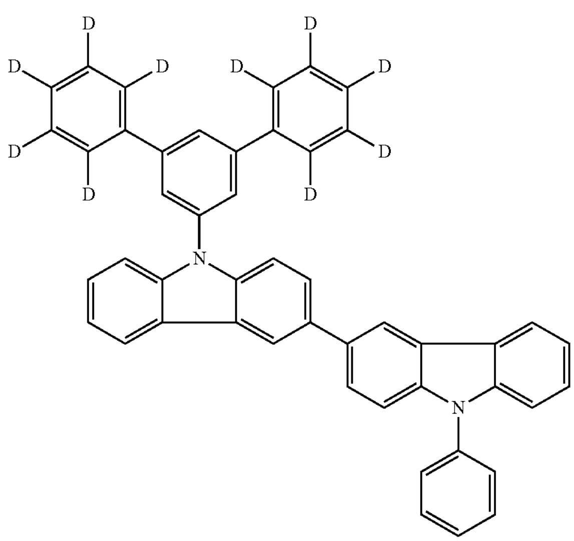
-continued
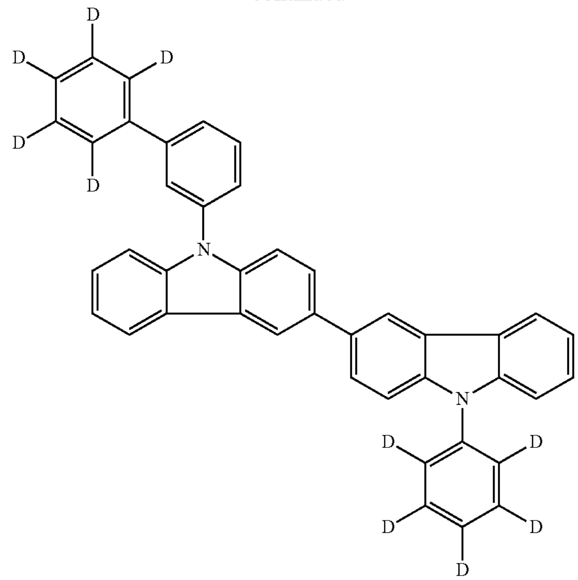
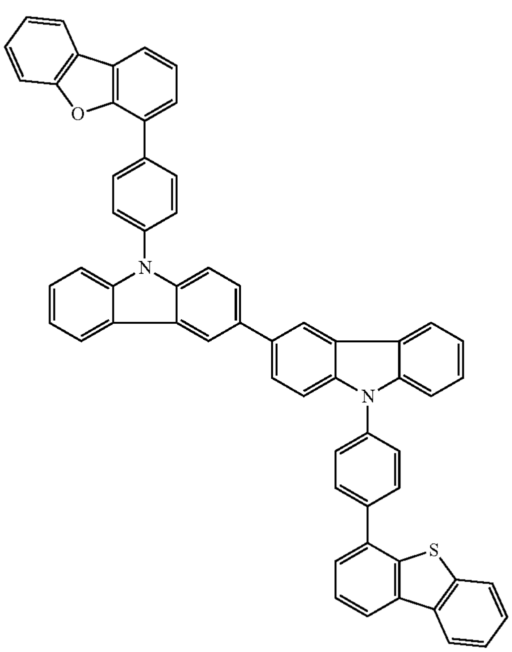

-continued
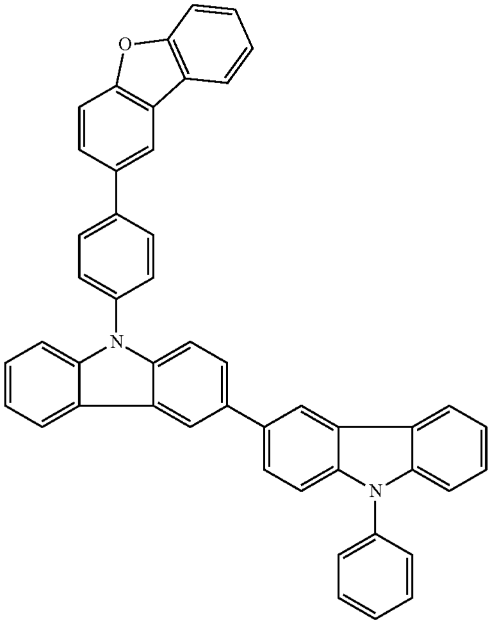
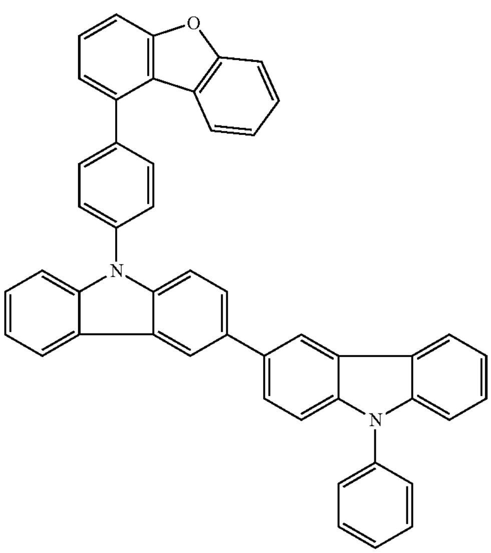
-continued
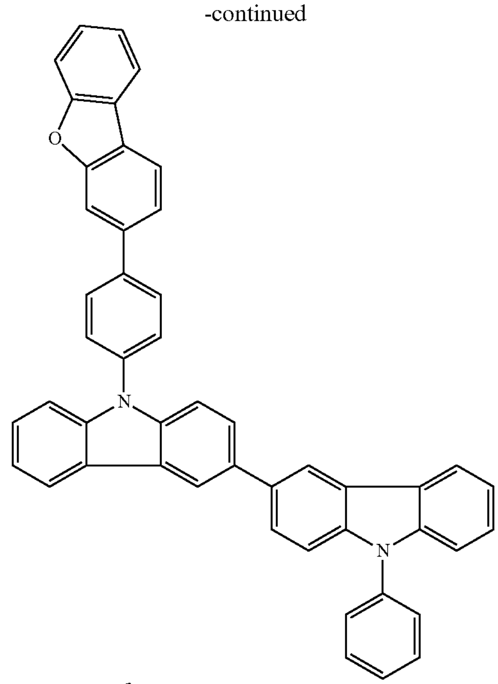
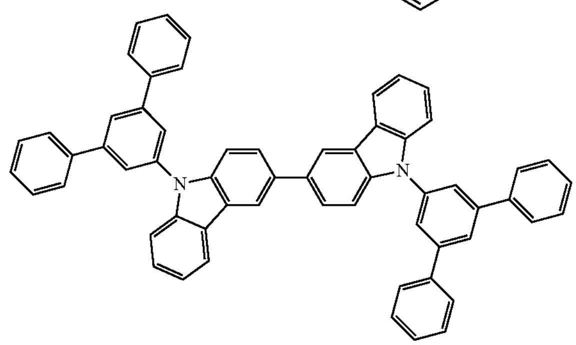
Examples of amines which can be used as hole-transporting matrix materials:
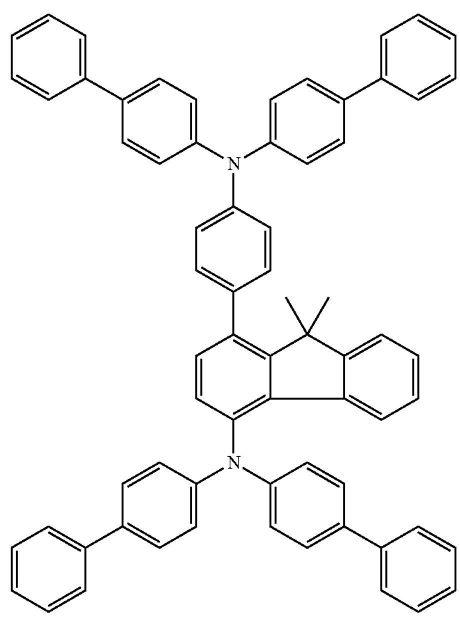

-continued
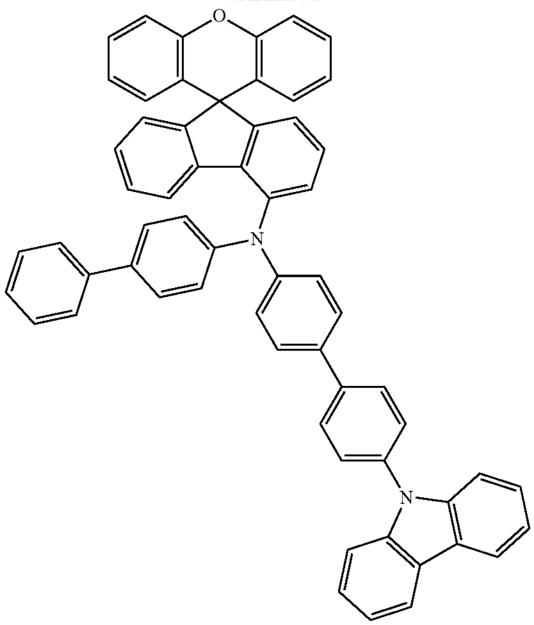
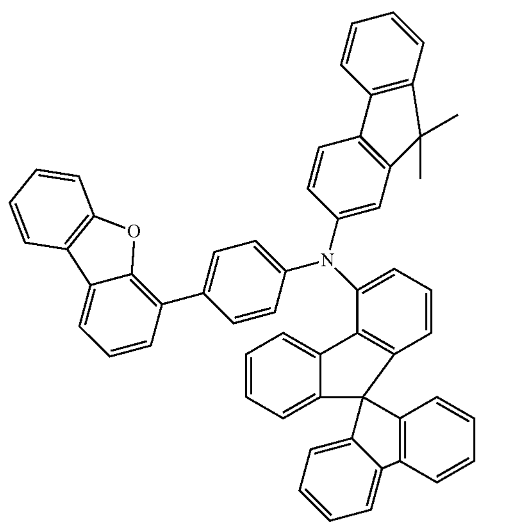
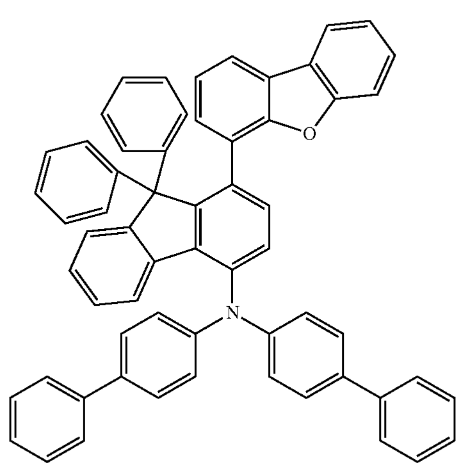
-continued
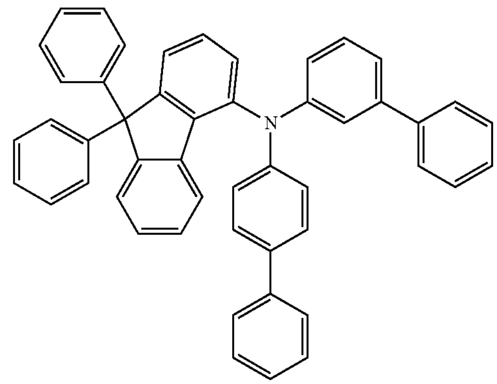
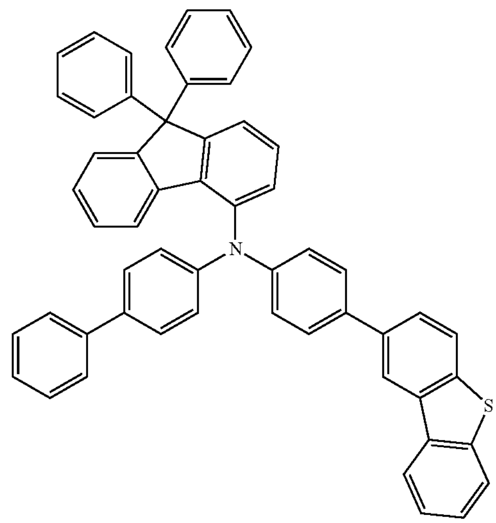
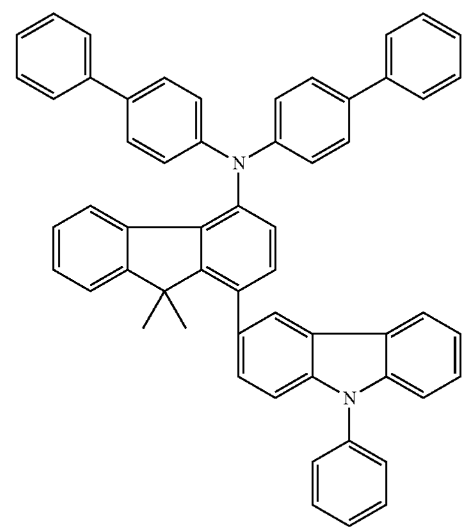
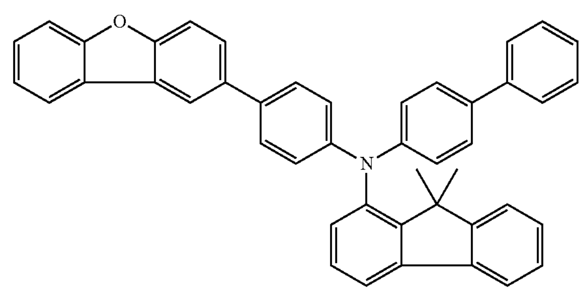

-continued
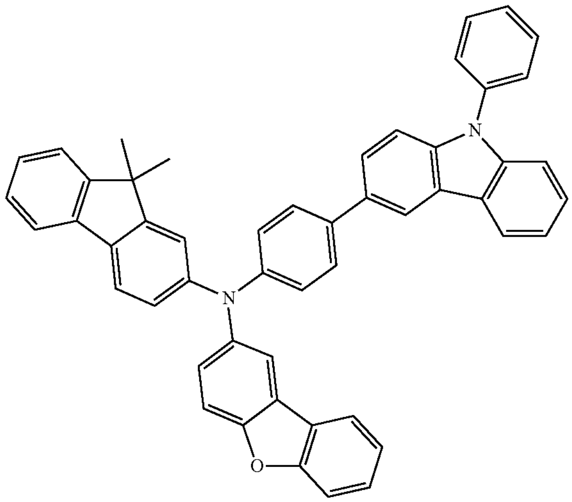
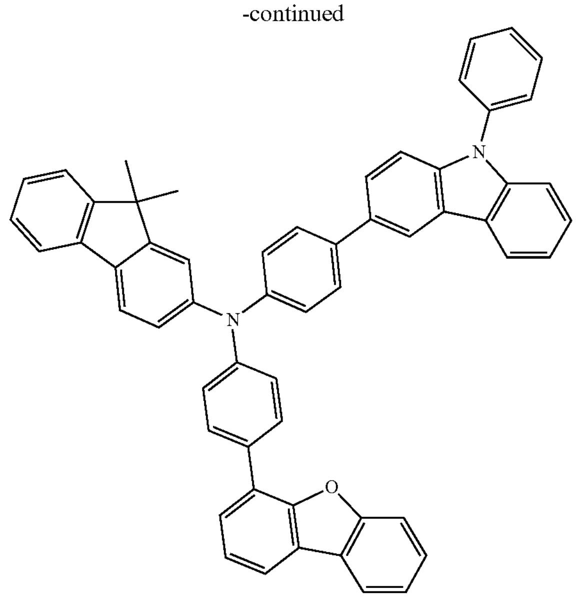
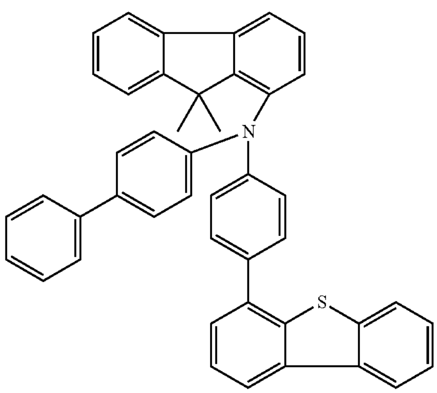
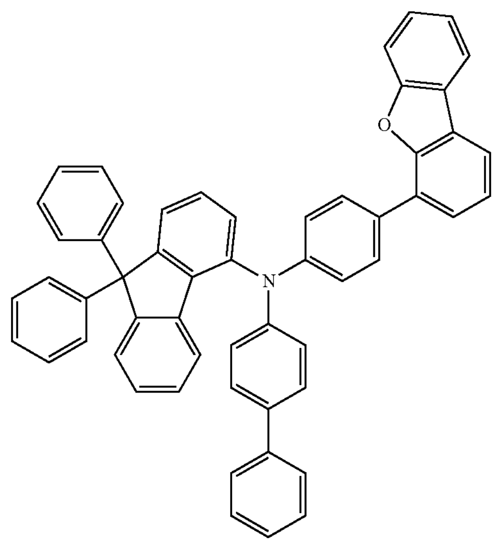
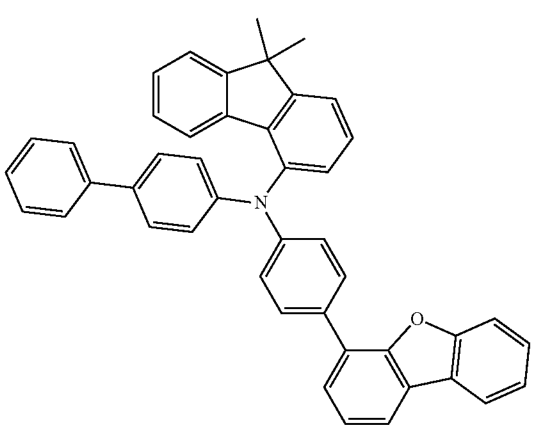
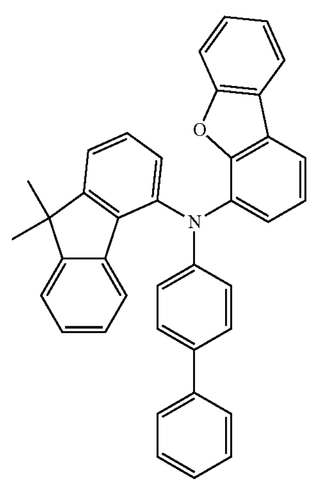
-continued -continued
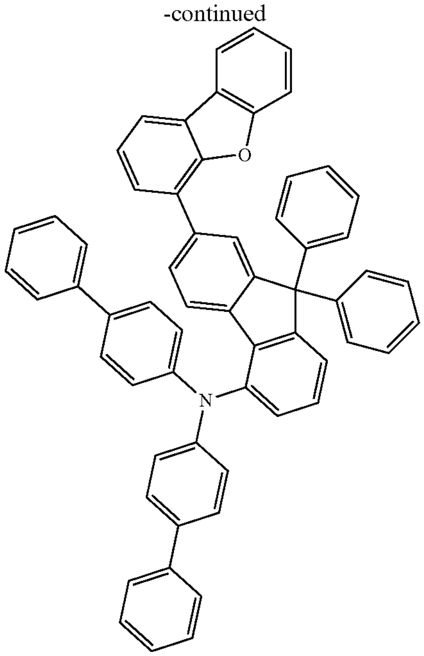
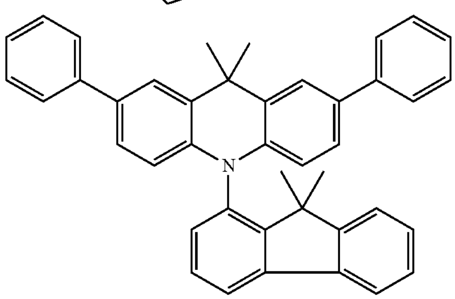
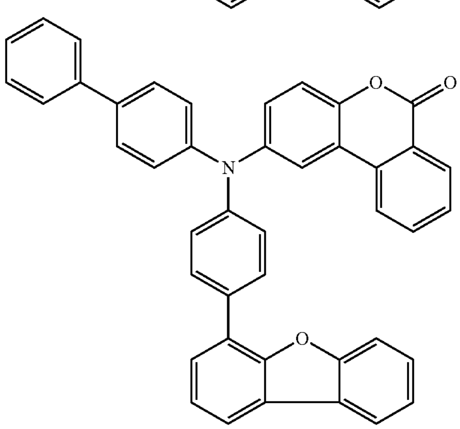
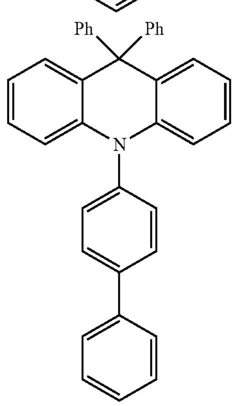
-continued
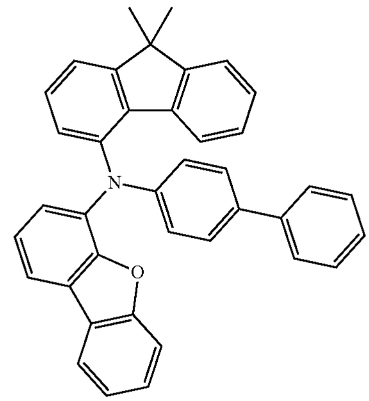
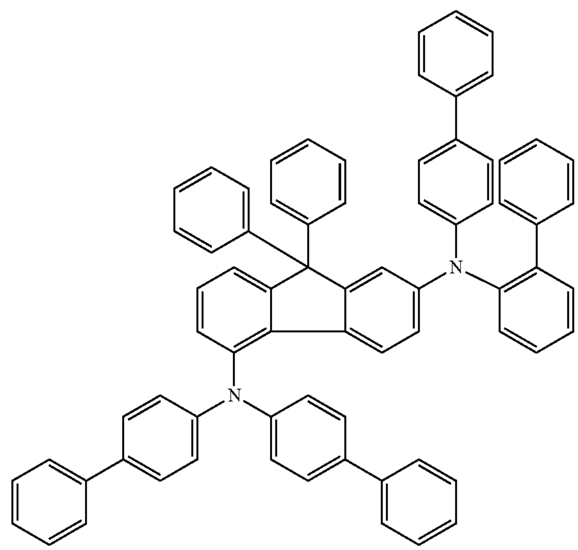
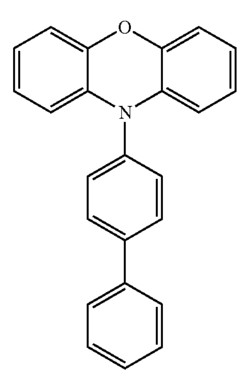

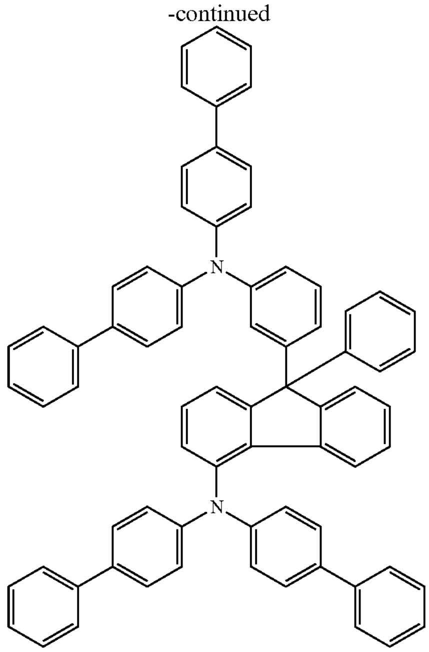
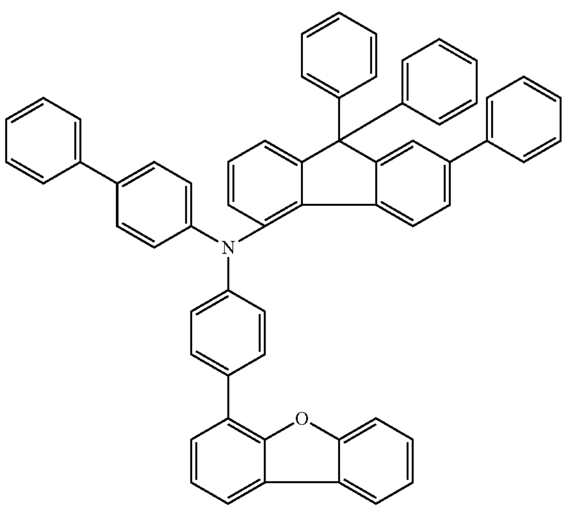
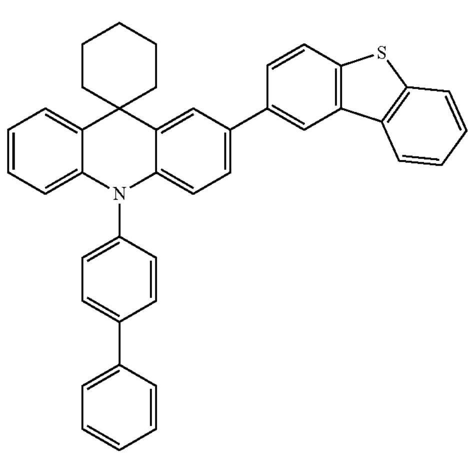
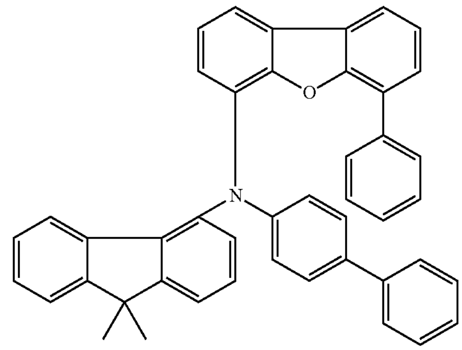
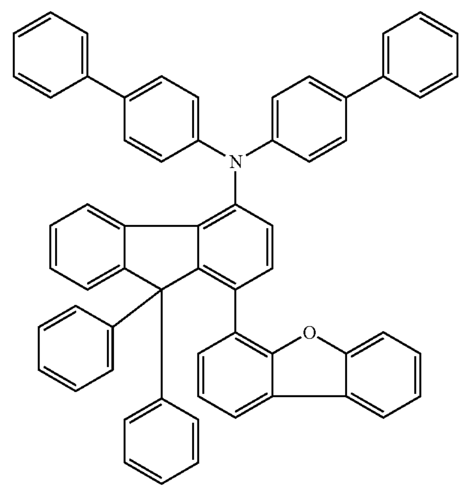
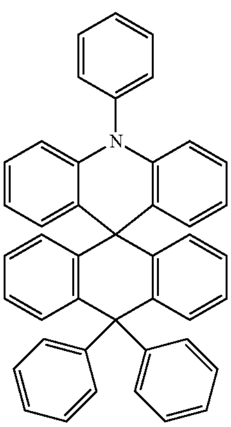
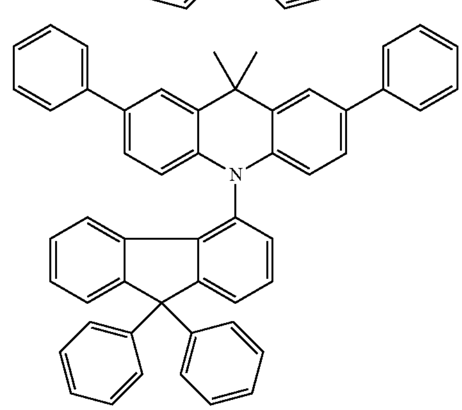

-continued
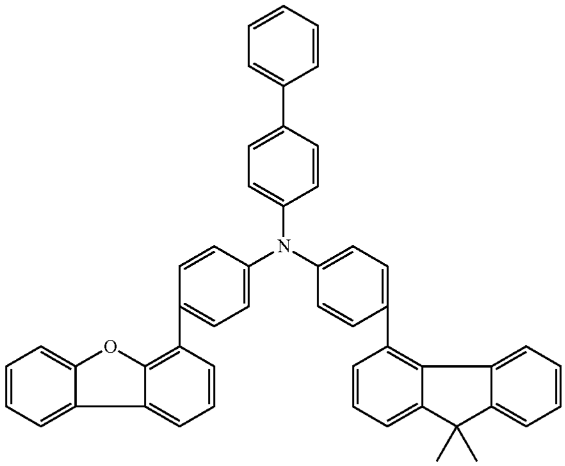
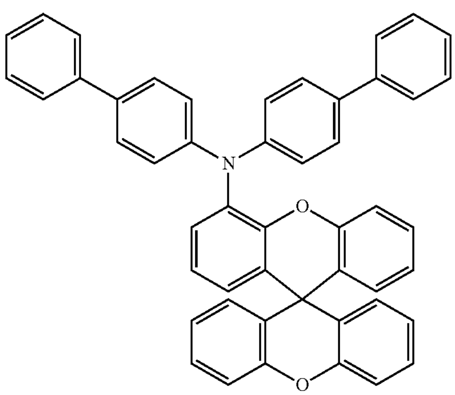
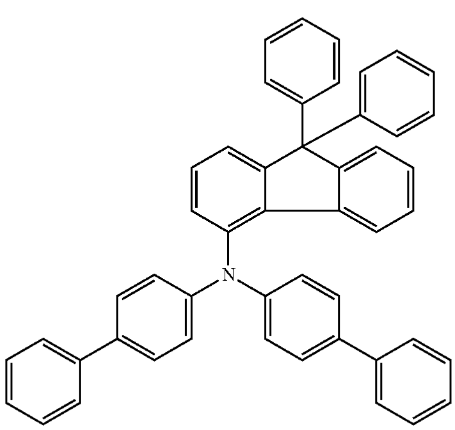
-continued
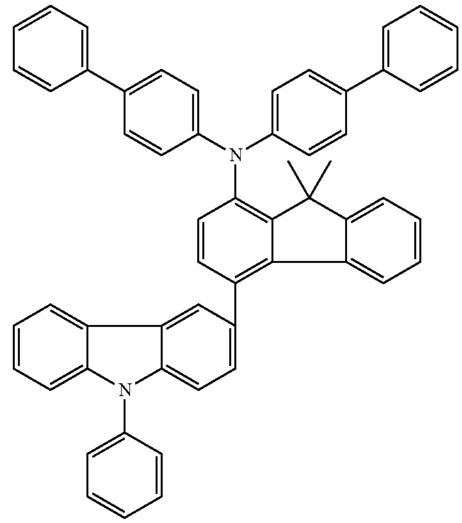
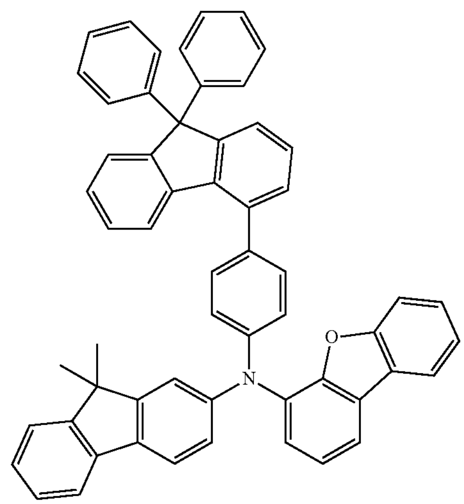
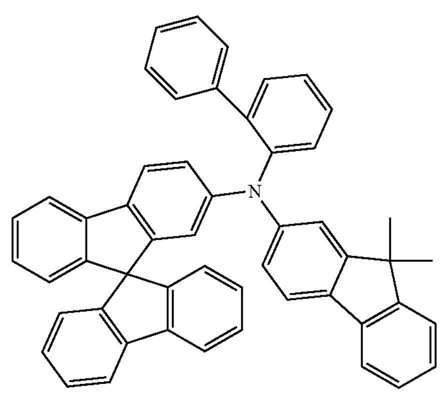

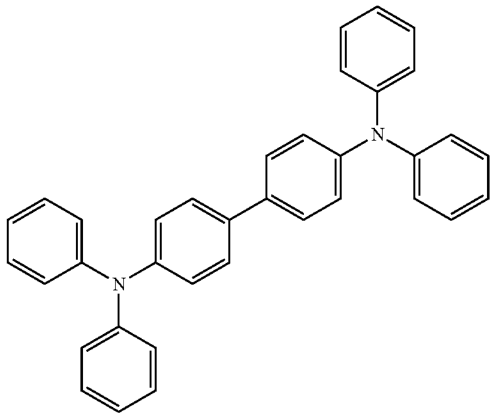
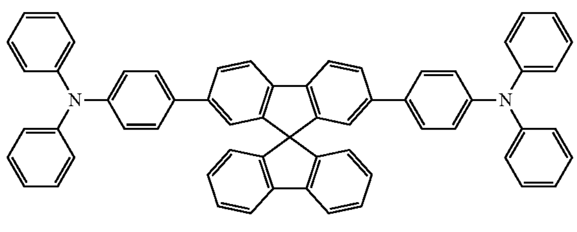
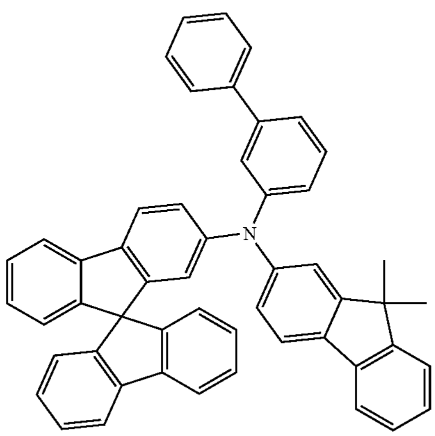
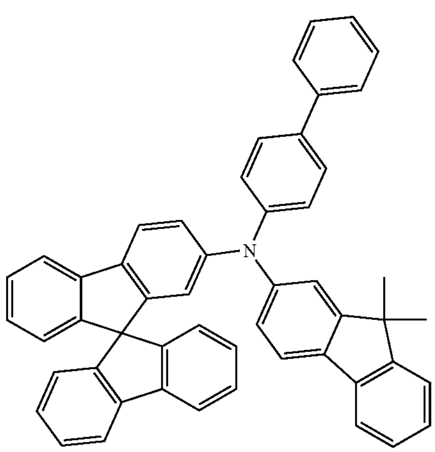
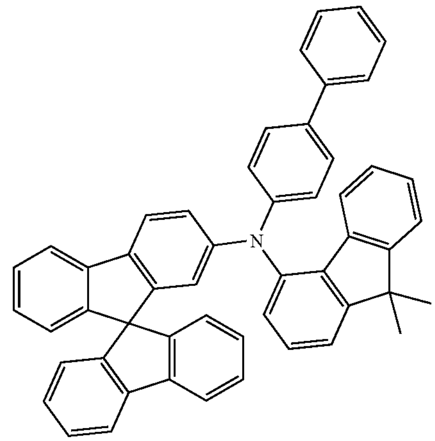
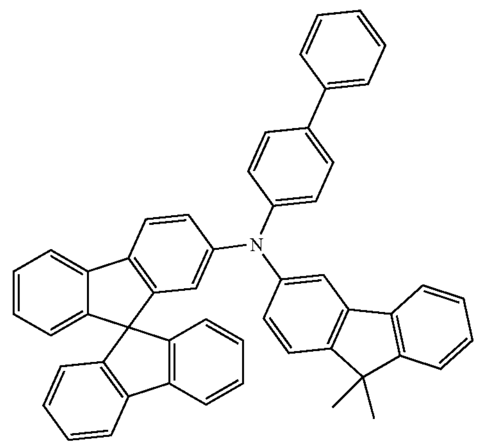
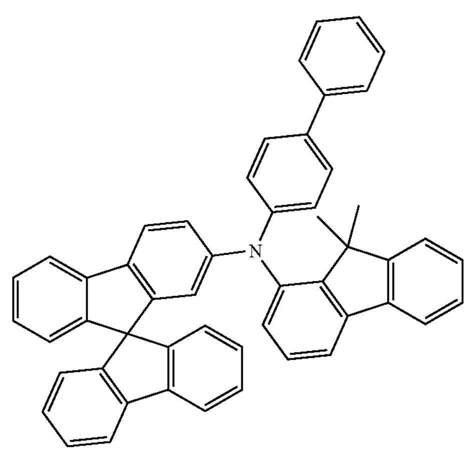

-continued
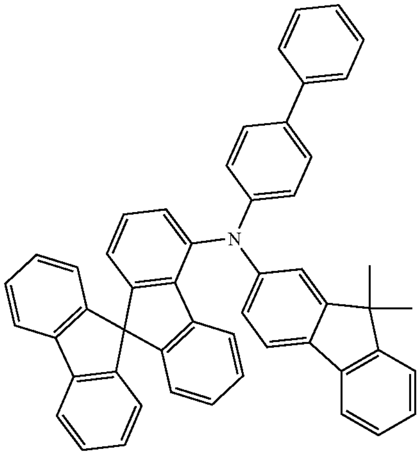
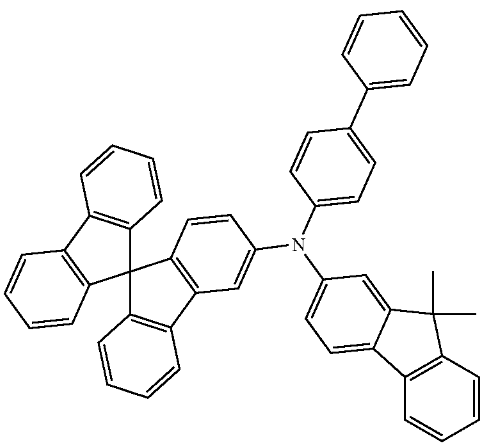
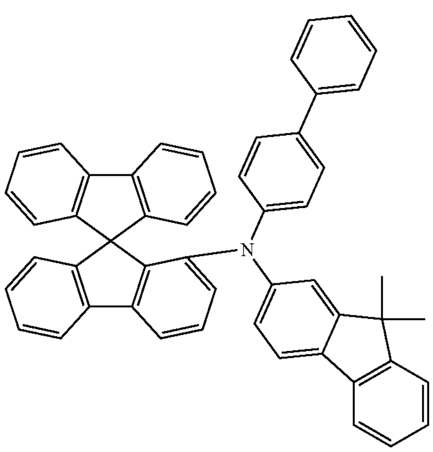
-continued
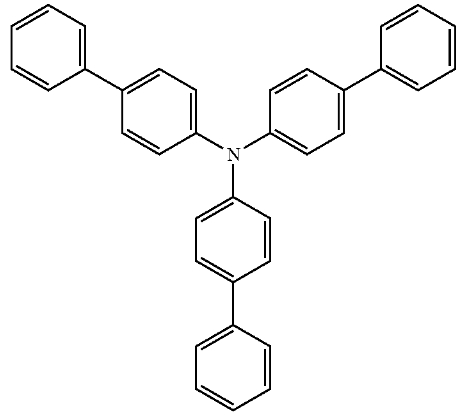
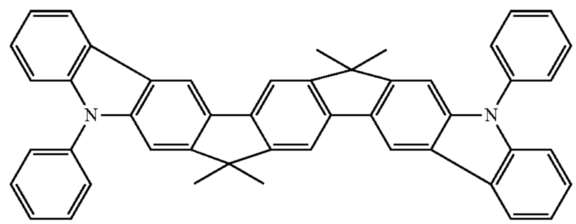
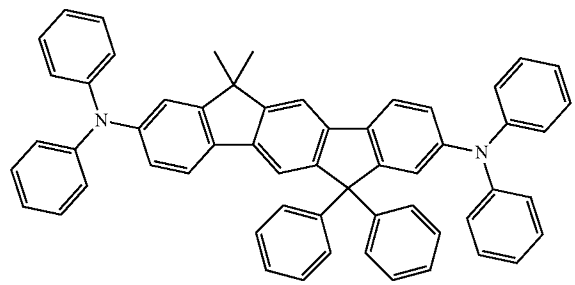
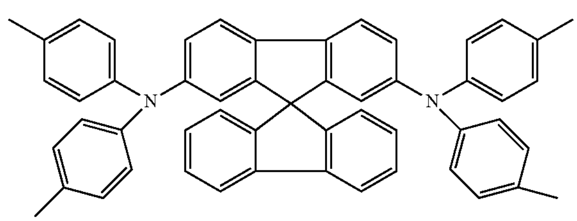
Examples of materials which can be used as wide band-gap matrix materials:

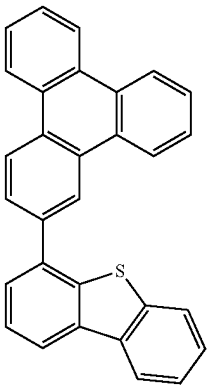
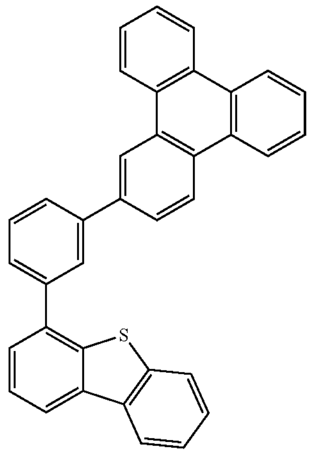
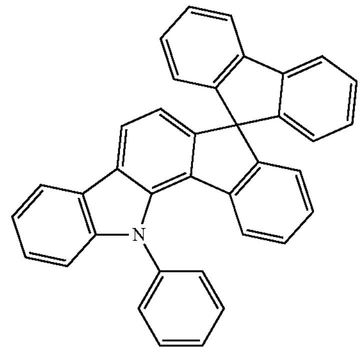
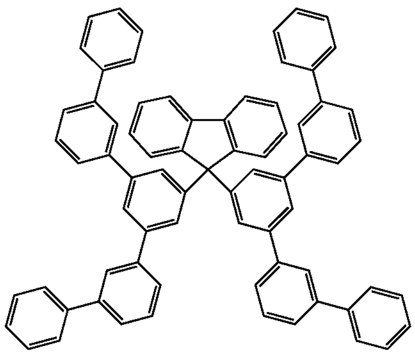
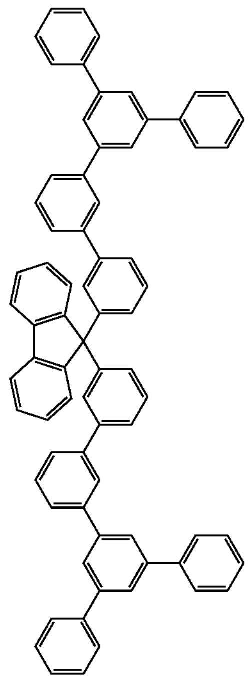
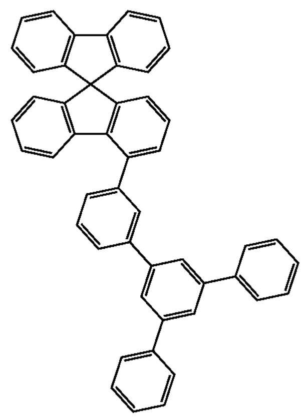
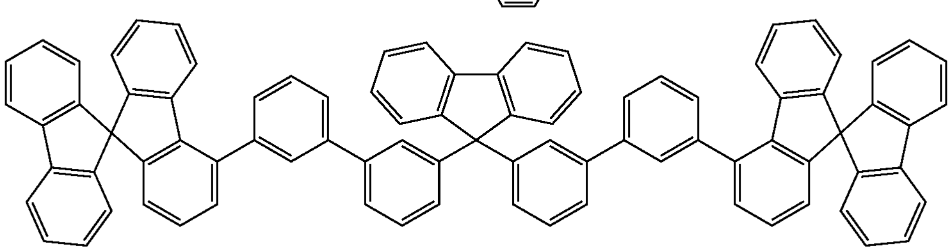
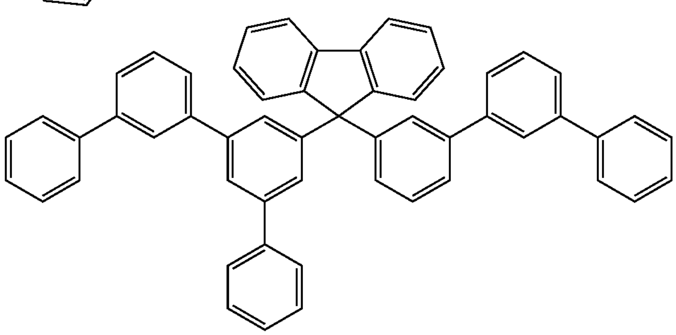
S -continued

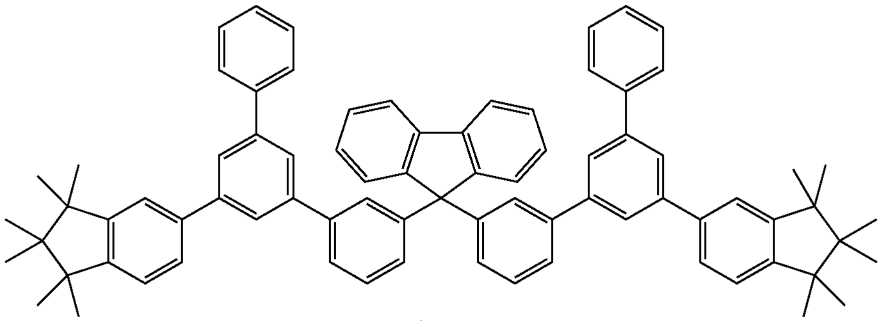

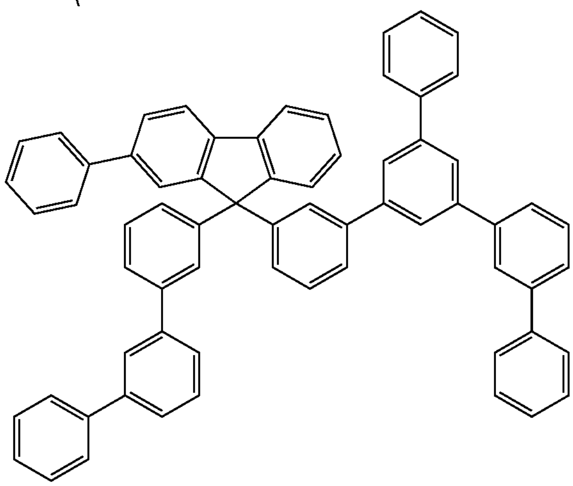

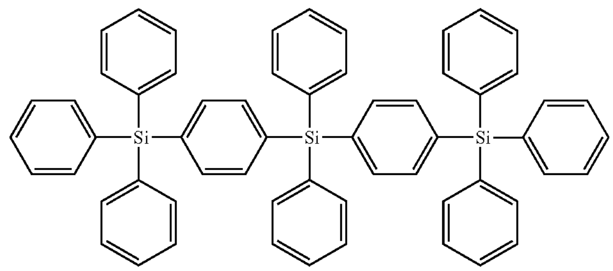

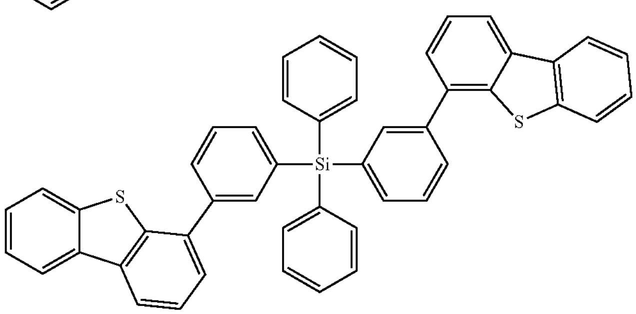

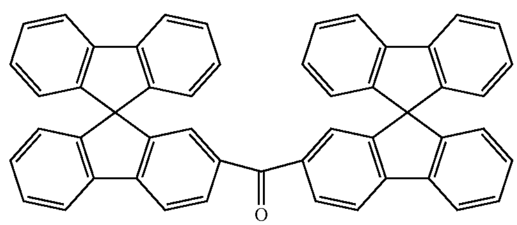

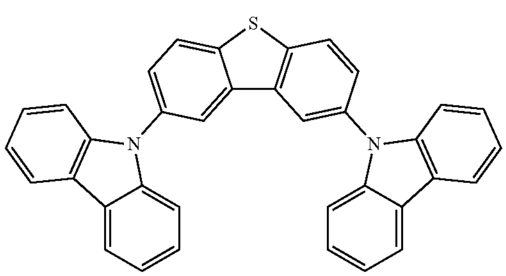

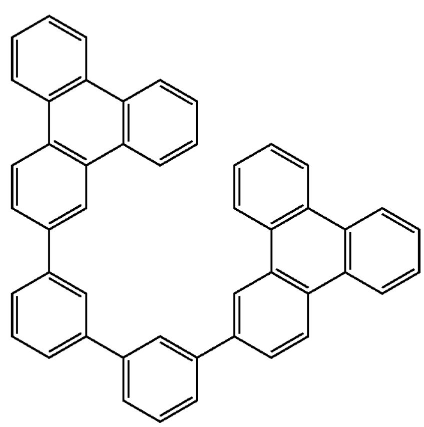

It is further preferable to use a mixture of two or more triplet emitters, especially two or three triplet emitters, together with one or more matrix materials. In this case, the triplet emitter having the shorter-wave emission spectrum serves as co-matrix for the triplet emitter having the longer-wave emission spectrum. For example, the metal complexes of the invention can be combined with a metal complex emitting at shorter wavelength, for example a blue-, green- or yellow-emitting metal complex, as co-matrix. For example, it is also possible to use the metal complexes of the invention as co-matrix for triplet emitters that emit at longer wavelength, for example for red-emitting triplet emitters. In this case, it may also be preferable when both the shorter-wave- and the longer-wave-emitting metal complexes are a compound of the invention. A preferred embodiment in the case of use of a mixture of three triplet emitters is when two are used as co-host and one as emitting material. These triplet emitters preferably have the emission colours of green, yellow and red or blue, green and orange.

A preferred mixture in the emitting layer comprises an electron-transporting host material, what is called a "wide bandgap" host material which, owing to its electronic properties, is not involved to a significant degree, if at all, in the charge transport in the layer, a co-dopant which is a triplet emitter which emits at a shorter wavelength than the compound of the invention, and a compound of the invention.

A further preferred mixture in the emitting layer comprises an electron-transporting host material, what is called a "wide bandgap" host material which, owing to its electronic properties, is not involved to a significant degree, if at all, in the charge transport in the layer, a hole-transporting host material, a co-dopant which is a triplet emitter which emits at a shorter wavelength than the compound of the invention, and a compound of the invention.

The compounds of the invention can also be used in other functions in the electronic device, for example as hole transport material in a hole injection or transport layer, as charge generation material, as electron blocker material, as hole blocker material or as electron transport material, for example in an electron transport layer. It is likewise possible to use the compounds of the invention as matrix material for other phosphorescent metal complexes in an emitting layer.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O-SC) or the emission of light (OLED/PLED, O-laser). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled. Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

Suitable charge transport materials as usable in the hole injection or hole transport layer or electron blocker layer or in the electron transport layer of the organic electroluminescent device of the invention are, for example, the compounds disclosed in Y. Shirota et al., Chem. Rev. 2007, 107(4), 953-1010, or other materials as used in these layers according to the prior art. Preferred hole transport materials which can be used in a hole transport, hole injection or electron blocker layer in the electroluminescent device of the invention are indenofluoreneamine derivatives (for example according to WO 06/122630 or WO 06/100896), the amine derivatives disclosed in EP 1661888, hexaazatriphenylene derivatives (for example according to WO 01/049806), amine derivatives having fused aromatic systems (for example according to U.S. Pat. No. 5,061,569), the amine derivatives disclosed in WO 95/09147, monobenzoindenofluoreneamines (for example according to WO 08/006449), dibenzoindenofluoreneamines (for example according to WO 07/140847), spirobifluoreneamines (for example according to WO 2012/034627, WO2014/056565), fluoreneamines (for example according to EP 2875092, EP 2875699 and EP 2875004), spirodibenzopyranamines (e.g. EP 2780325) and dihydroacridine derivatives (for example according to WO 2012/150001).

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapour deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured.

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution.

The organic electroluminescent device can also be produced as a hybrid system by applying one or more layers from solution and applying one or more other layers by vapour deposition. For example, it is possible to apply an emitting layer comprising a metal complex of the invention and a matrix material from solution, and to apply a hole blocker layer and/or an electron transport layer thereto by vapour deposition under reduced pressure.

These methods are known in general terms to those skilled in the art and can be applied by those skilled in the art without difficulty to organic electroluminescent devices comprising compounds of formula (1) or the above-detailed preferred embodiments.

The electronic devices of the invention, especially organic electroluminescent devices, are notable for one or more of the following surprising advantages over the prior art:

1. The metal complexes of the invention, when used as emitter in an organic electroluminescent device, have a very high EQE (external quantum efficiency) and a very high power efficiency, and exhibit oriented emission. More particularly, the efficiency is much higher compared to metal complexes that otherwise have the same ligand structure but do not have any substituents of the formula (3) or (4). The efficiency is likewise much higher compared to metal complexes that otherwise have the same ligand structure but have a substituent of the formula (3) or (4) on each of the three sub-ligands.
2. The metal complexes of the invention, when used as emitters in an organic electroluminescent device, have a very good lifetime. More particularly, the lifetime at constant luminance is higher compared to metal complexes that otherwise have the same ligand structure but do not have any substituents of the formula (3) or (4). The lifetime is likewise higher compared to metal complexes that otherwise have the same ligand structure but have a substituent of the formula (3) or (4) on each of the three sub-ligands.

These abovementioned advantages are not accompanied by a deterioration in the further electronic properties.

The invention is illustrated in more detail by the examples which follow, without any intention of restricting it thereby. The person skilled in the art will be able to use the details given, without exercising inventive skill, to produce further electronic devices of the invention and hence to execute the invention over the entire scope claimed.

The invention claimed is:

1. A compound of formula (I):

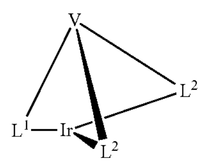

wherein $L^1$ is a sub-ligand of one of formula (2a') through (2d'):

(2a')

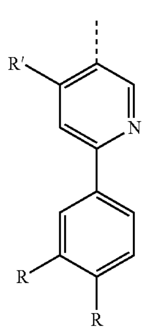

-continued (2b')

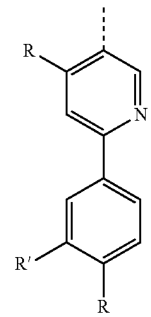

(2c')

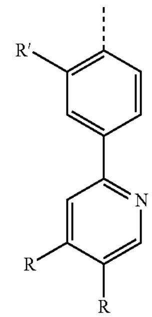

(2d')

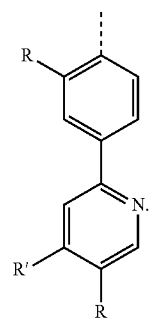

wherein the sub-ligand binds to the iridium via the nitrogen atom and the unsubstituted carbon atom;

R' is a group of formula (3a) through (3e), (3g), (3l) through (3n) or (4a):

(3a)

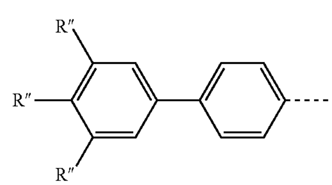

(3b)

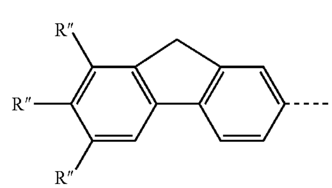

-continued (3c)

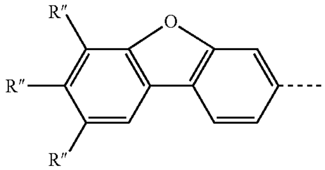

(3d)

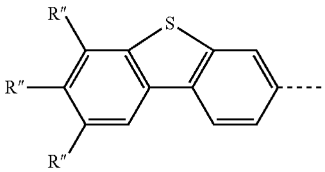

(3e)

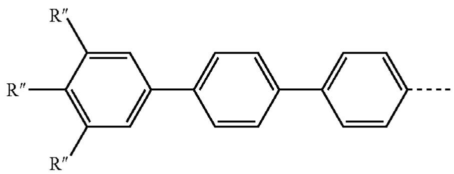

(3g)

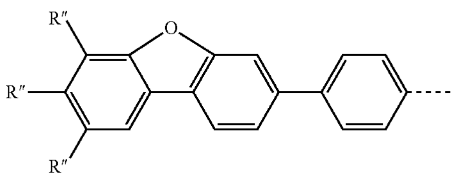

(3l)

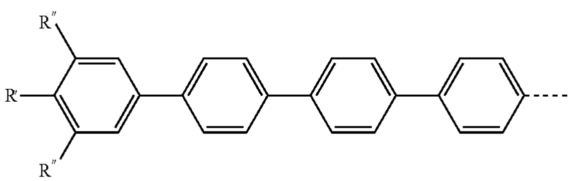

(3m)

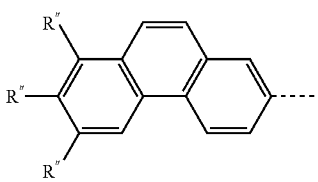

(3n)

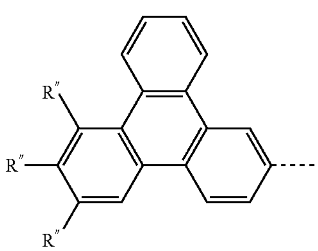

(4a)

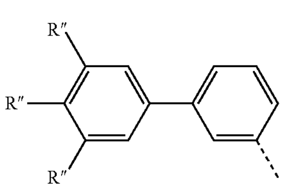

wherein the fluorene group in the 9 position is optionally substituted by one or two alkyl groups each having 1 to 6 carbon atoms;

where the dotted bond indicates the linkage of the group;

R" is the same or different in each instance and is H, D, F, CN, a straight chain alkyl group having 1 to 4 carbon atoms in which one or more hydrogen atoms is optionally replaced by D, or a branched or cyclic alkyl group having 3 to 4 carbon atoms in which one or more hydrogen atoms is optionally replaced by D;

n is 0, 1, 2, 3, 4, or 5;

$L^2$ is the same or different in each instance and is a bidentate monoanionic sub-ligand selected from the structures of formulae (L-1-1a) or (L-2-1a):

(L-1-1a)

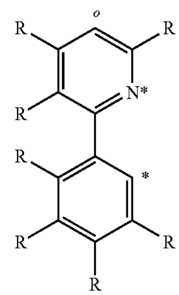

(L-2-1a)

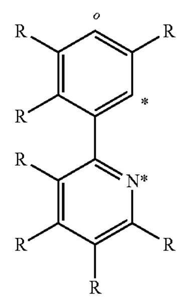

wherein the "o" denotes the position of the bond of the sub-ligand to V and * denotes the coordination to Ir;

V is a group of formula (6a), wherein the dotted bonds denote the position of the linkage of the sub-ligands $L^1$ and $L^2$, (6a)

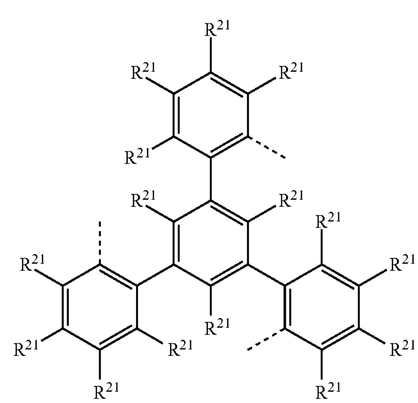

$R^{21}$ is the same or different at each instance and is H or D;

R is the same or different in each instance and is H, D, F, CN, a straight-chain alkyl group having 1 to 20 carbon atoms or an alkenyl group having 2 to 20 carbon atoms or a branched or cyclic alkyl group having 3 to 20 carbon atoms, where the alkyl or alkenyl group is in each case optionally substituted by one or more $R^1$ radicals, or an aryl or heteroaryl group which has 5 to 10 aromatic ring atoms and is optionally substituted in each case by one or more nonaromatic $R^1$ radicals; and wherein two R radicals together optionally define an aliphatic or heteroaliphatic ring system;

$R^1$ is the same or different in each instance and is H, D, F, CN, a straight-chain alkyl group having 1 to 20 carbon atoms or a branched or cyclic alkyl group having 3 to 20 carbon atoms, where the alkyl group is in each case optionally substituted by one or more $R^2$ radicals; and wherein two or more $R^1$ radicals together optionally define an aliphatic or heteroaliphatic ring system; and $R^2$ is the same or different in each instance and is H, D, F, or an aliphatic organic radical having 1 to 20 carbon atoms, in which one or more hydrogen atoms is optionally replaced by.

2. The compound of claim 1, wherein the V group is selected from the structures of formulae (6b):

(6b)

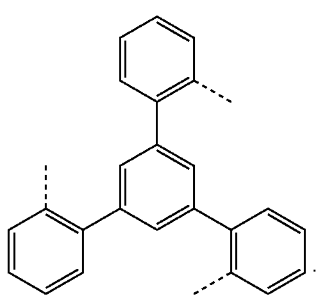

3. The compound of claim 1, wherein the substituents R" are the same or different in each instance and are selected from the group consisting of H, D, CN, and an alkyl group having 1 to 4 carbon atoms.

4. The compound of claim 1, wherein the structure fragment $Ir(L^2)$ has a higher triplet energy than the structure fragment $Ir(L^1)$.

5. The compound of claim 1, wherein the compound has two substituents R or two substituents $R^1$ which are bonded to adjacent carbon atoms and which together define a ring of formulae (27) through (33):

(27)

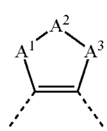

(28)

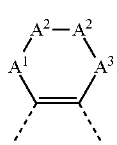

-continued (29)

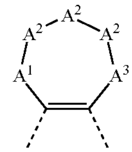

(30)

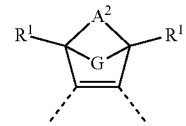

(31)

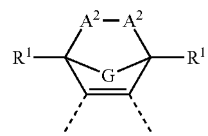

(32)

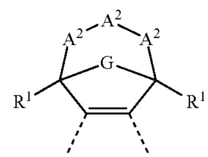

(33)

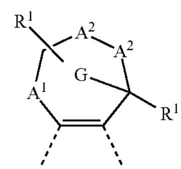

wherein the dotted bonds denote the linkage of the two carbon atoms in the ligand;

$A^1$ and $A^3$ is the same or different in each instance and is $C(R^3)_2$;

$A^2$ is $C(R^1)$;

G is an alkylene group which has 1, 2, or 3 carbon atoms and is optionally substituted by one or more $R^2$ radicals;

$R^3$ is the same or different in each instance and is H, a straight chain alkyl group having 1 to 10 carbon atoms, a branched or cyclic alkyl group having 3 to 10 carbon atoms, where the alkyl group in each case is optionally substituted by one or more $R^2$ radicals; and wherein two $R^3$ radicals which are bonded to the same carbon atom together optionally define an aliphatic ring system and so as to form a spiro system; and wherein $R^3$ with an adjacent R or $R^1$ radical optionally defines an aliphatic ring system.

6. The compound of claim 1, wherein $R^2$ is a hydrocarbyl radical having 1 to 20 carbon atoms, in which one or more hydrogen atoms is optionally replaced by F.

7. A process for preparing a compound of claim 1 comprising reacting a ligand with an iridium alkoxide of formula (34), an iridium ketoketonate of formula (35), an iridium halide of formula (36), an iridium carboxylate of formula (37), or an iridium compound bearing both alkoxide and/or halide and/or hydroxyl and ketoketonate radicals:

$Ir(OR_3)$ (34)

(35)

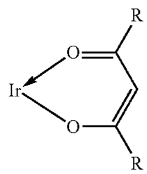

$IrHa_3I$ (36)

$Ir(OOCR_3)$ (37)

wherein

Hal is F, Cl, Br, or I; and the iridium reactant is optionally in the form of the corresponding hydrate.

8. A formulation comprising at least one compound of claim 1 and at least one solvent and/or a further organic or inorganic compound.

9. An electronic device comprising at least one compound of claim 1.

10. The electronic device of claim 9, wherein the device is an organic electroluminescent device and the compound is present together with a matrix material in one or more emitting layers.

* * * * *